US012029109B2

(12) United States Patent
Uno

(10) Patent No.: US 12,029,109 B2
(45) Date of Patent: Jul. 2, 2024

(54) LIGHT EMITTING DIODE AND AMINE COMPOUND FOR THE SAME

(71) Applicant: Samsung Display Co., Ltd., Yongin-si (KR)

(72) Inventor: Takuya Uno, Yokohama (JP)

(73) Assignee: Samsung Display Co., Ltd., Yongin-si (KR)

( * ) Notice: Subject to any disclaimer, the term of this patent is extended or adjusted under 35 U.S.C. 154(b) by 462 days.

(21) Appl. No.: 17/357,588

(22) Filed: Jun. 24, 2021

(65) Prior Publication Data

US 2022/0149302 A1 May 12, 2022

(30) Foreign Application Priority Data

Nov. 10, 2020 (KR) ........................ 10-2020-0149638

(51) Int. Cl.
*H01L 51/50* (2006.01)
*H10K 85/40* (2023.01)
*H10K 85/60* (2023.01)
*H10K 50/11* (2023.01)
*H10K 50/15* (2023.01)
(Continued)

(52) U.S. Cl.
CPC ........... *H10K 85/40* (2023.02); *H10K 85/615* (2023.02); *H10K 85/636* (2023.02); *H10K 85/6572* (2023.02); *H10K 85/6574* (2023.02); *H10K 85/6576* (2023.02); *H10K 50/11* (2023.02);
(Continued)

(58) Field of Classification Search
None
See application file for complete search history.

(56) References Cited

U.S. PATENT DOCUMENTS 7,927,719 B2 4/2011 Hwang et al.
9,172,045 B2 10/2015 Matsumoto et al.
(Continued)

FOREIGN PATENT DOCUMENTS

JP 6007467 B2 10/2016
KR 10-0846590 B1 7/2008
(Continued)

*Primary Examiner* — Gregory D Clark
(74) *Attorney, Agent, or Firm* — Lewis Roca Rothgerber Christie LLP

(57) ABSTRACT

A light emitting diode of an embodiment includes a first electrode, a second electrode, and at least one functional layer disposed between the first electrode and the second electrode and including an amine compound represented by Formula 1, thereby showing high emission efficiency properties and improved life characteristics.

Formula 1

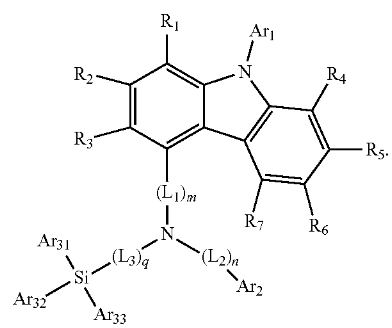

22 Claims, 6 Drawing Sheets

(51) Int. Cl.
*H10K 50/18* (2023.01)
*H10K 50/805* (2023.01)

(52) U.S. Cl.
CPC ............ *H10K 50/15* (2023.02); *H10K 50/18* (2023.02); *H10K 50/805* (2023.02)

(56) References Cited

U.S. PATENT DOCUMENTS

| | | | | |
|---|---|---|---|---|
| 9,293,714 | B2 | 3/2016 | Miyata | |
| 9,780,317 | B2 | 10/2017 | Fuchiwaki et al. | |
| 9,822,133 | B2 | 11/2017 | Kim et al. | |
| 9,843,005 | B2 | 12/2017 | Miyata | |
| 9,960,372 | B2 | 5/2018 | Ueno et al. | |
| 2015/0179950 | A1* | 6/2015 | Miyata .............. | H10K 85/6572 548/406 |
| 2015/0179956 | A1 | 6/2015 | Miyata et al. | |
| 2016/0190487 | A1 | 6/2016 | Akashi et al. | |
| 2019/0363263 | A1 | 11/2019 | Uno | |

FOREIGN PATENT DOCUMENTS

| | | | |
|---|---|---|---|
| KR | 10-1154185 | B1 | 6/2012 |
| KR | 10-1550429 | B1 | 9/2015 |
| KR | 10-2015-0131460 | A | 11/2015 |
| KR | 10-2017-0101350 | A | 9/2017 |
| KR | 10-2018-0042943 | A | 4/2018 |
| KR | 10-2018-0096458 | A | 8/2018 |
| KR | 10-2079834 | B1 | 2/2020 |
| WO | WO 2013/062043 | A1 | 5/2013 |
| WO | WO 2014/088047 | A1 | 6/2014 |

* cited by examiner

LIGHT EMITTING DIODE AND AMINE COMPOUND FOR THE SAME

CROSS-REFERENCE TO RELATED APPLICATION

This application claims priority to and the benefit of Korean Patent Application No. 10-2020-0149638, filed on Nov. 10, 2020, the entire content of which is hereby incorporated by reference.

BACKGROUND

One or more aspects of embodiments of the present disclosure relate to a light emitting diode and an amine compound utilized therein, and for example, to an amine compound utilized in a hole transport region and a light emitting diode including the same.

Recently, organic electroluminescence display devices are being actively developed as image display devices. An organic electroluminescence display device is a so-called self-luminescent display device, in which holes and electrons respectively injected from a first electrode and a second electrode recombine in an emission layer, and the light-emitting material of the emission layer emits light to achieve display.

In the application of a light emitting diode to a display device, a decrease in driving voltage and an increase of emission efficiency and/or life (e.g., life span) are desired, and materials for a light emitting diode stably achieving such benchmarks are being continuously developed.

In order to accomplish a light emitting diode with high efficiency, materials for a hole transport region to restrain or decrease diffusion of excitons (e.g., exciton energy), etc. of an emission layer, are being developed.

SUMMARY

One or more aspects of embodiments of the present disclosure are directed toward a light emitting diode showing excellent or suitable emission efficiency and/or long-life (e.g., lifespan) characteristics.

One or more aspects of embodiments of the present disclosure are directed toward an amine compound as a material for a light emitting diode having high efficiency and/or long life.

One or more embodiments of the present disclosure provide an amine compound represented by Formula 1.

Formula 1

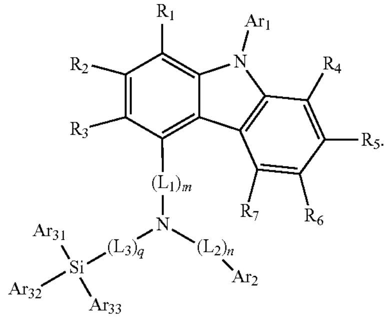

In Formula 1, $Ar_1$ may be a substituted or unsubstituted aryl group of 6 to 30 ring-forming carbon atoms, or a substituted or unsubstituted heteroaryl group of 2 to 30 ring-forming carbon atoms, $R_1$ to $R_7$ may each independently be a hydrogen atom, a deuterium atom, a halogen atom, a substituted or unsubstituted oxy group, a substituted or unsubstituted thiol group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, and/or may be combined (e.g., may be optionally combined) with an adjacent group to form a ring, "m" and "n" may each independently be an integer of 0 to 2, "q" may be an integer of 1 to 3, $L_1$ to $L_3$ may each independently be a direct linkage or a substituted or unsubstituted arylene group of 6 to 30 ring-forming carbon atoms, $Ar_{31}$ to $Ar_{33}$ may each independently be a substituted or unsubstituted aryl group of 6 to 30 ring-forming carbon atoms, Are may be a substituted or unsubstituted aryl group of 10 to 30 ring-forming carbon atoms, or a heteroaryl group of 2 to 30 ring-forming carbon atoms and including O or S as a ring-forming atom, where a case where $*\text{-}(L_2)_n\text{-}Ar_2$ is an unsubstituted biphenyl group is excluded.

In an embodiment, in Formula 1, $*\text{-}(L_2)_n\text{-}Ar_2$ may be represented by any one among Formula 2-1 to Formula 2-4:

Formula 2-1

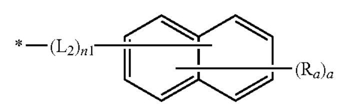

Formula 2-2

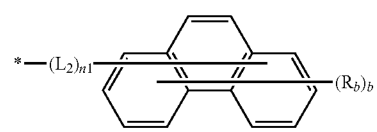

Formula 2-3

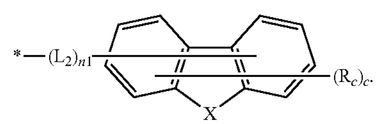

Formula 2-4

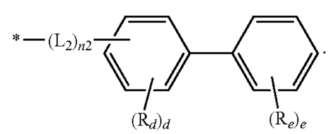

In Formula 2-1 to Formula 2-4, $R_a$ to $R_e$ may each independently be a hydrogen atom, a deuterium atom, a halogen atom, a substituted or unsubstituted oxy group, a substituted or unsubstituted thiol group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, and/or combined with an adjacent group to form a ring, "n1" may be an integer of 0 to 2, "n2" may be 1 or 2, "a" and "c" may be integers of 0 to 7, "b" may be an integer of 0 to 9, "d" may be an integer of 0 to 4, "e" may be an integer of 0 to 5, X may be O or S, and $L_2$ may be the same as defined in Formula 1.

In an embodiment, Formula 1 may be represented by Formula 1-1 or Formula 1-2:

Formula 1-1

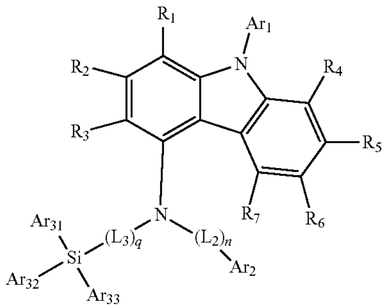

Formula 1-2

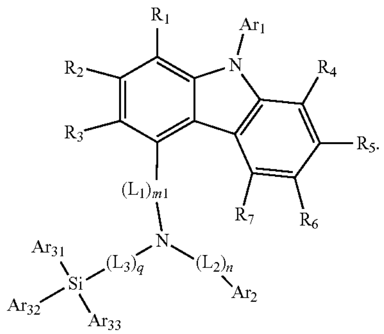

In Formula 1-2, "m1" may be 1 or 2, in Formula 1-1 and Formula 1-2, $Ar_1$, $Ar_2$, $Ar_{31}$ to $Ar_{33}$, $L_1$ to $L_3$, "n", "q", and $R_1$ to $R_7$ may each independently be the same as defined in Formula 1.

In an embodiment, in Formula 1-2, $L_1$ may include a substituted or unsubstituted phenylene group, a substituted or unsubstituted divalent biphenyl group, a substituted or unsubstituted naphthalene group, or a substituted or unsubstituted phenanthrene group.

In an embodiment, $Ar_{31}$ to $Ar_{33}$ may each independently be a substituted or unsubstituted phenyl group, or a substituted or unsubstituted naphthyl group.

In an embodiment, when "n" is an integer of 1 or more, $L_2$ may include a substituted or unsubstituted phenylene group, a substituted or unsubstituted divalent biphenyl group, a substituted or unsubstituted naphthalene group, or a substituted or unsubstituted phenanthrene group.

In an embodiment, $L_3$ may include a substituted or unsubstituted phenylene group, a substituted or unsubstituted divalent biphenyl group, a substituted or unsubstituted naphthalene group, or a substituted or unsubstituted phenanthrene group.

In an embodiment, $Ar_1$ may include a substituted or unsubstituted phenyl group, a substituted or unsubstituted naphthyl group, a substituted or unsubstituted phenanthrene group, a substituted or unsubstituted dibenzofuran group, or a substituted or unsubstituted dibenzothiophene group.

One or more embodiments of the present disclosure provide a light emitting diode including: a first electrode; a second electrode disposed on the first electrode; and at least one functional layer disposed between the first electrode and the second electrode and including the amine compound of an embodiment.

In an embodiment, the at least one functional layer may include an emission layer, a hole transport region disposed between the first electrode and the emission layer, and an electron transport region disposed between the emission layer and the second electrode, and the hole transport region may include the amine compound.

In an embodiment, the hole transport region may include at least one among a hole injection layer, a hole transport layer, and an electron blocking layer, and at least one among the hole injection layer, the hole transport layer, and the electron blocking layer may include the amine compound.

In an embodiment, a capping layer disposed on the second electrode may be further included, and a refractive index of the capping layer may be about 1.6 or more.

In an embodiment, the emission layer may include a compound represented by Formula E-1:

Formula E-1

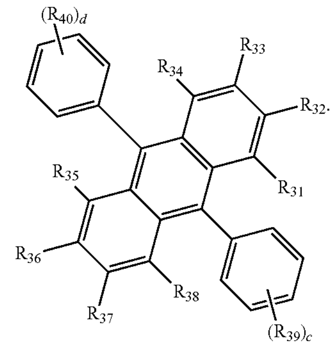

In Formula E-1, "c" and "d" may each independently be an integer of 0 to 5, $R_{31}$ to $R_{40}$ may each independently be a hydrogen atom, a deuterium atom, a halogen atom, a substituted or unsubstituted silyl group, a substituted or unsubstituted alkyl group of 1 to 20 carbon atoms, a substituted or unsubstituted alkenyl group of 2 to 20 carbon atoms, a substituted or unsubstituted oxy group, a substituted or unsubstituted thiol group, a substituted or unsubstituted aryl group of 6 to 30 ring-forming carbon atoms, or a substituted or unsubstituted heteroaryl group of 2 to 30 ring-forming carbon atoms, and/or may be combined with an adjacent group to form a ring.

BRIEF DESCRIPTION OF THE FIGURES

The accompanying drawings are included to provide a further understanding of the present disclosure, and are incorporated in and constitute a part of this specification. The drawings illustrate embodiments of the present disclosure and, together with the description, serve to explain principles of the present disclosure. In the drawings.

DETAILED DESCRIPTION

Figure 1:
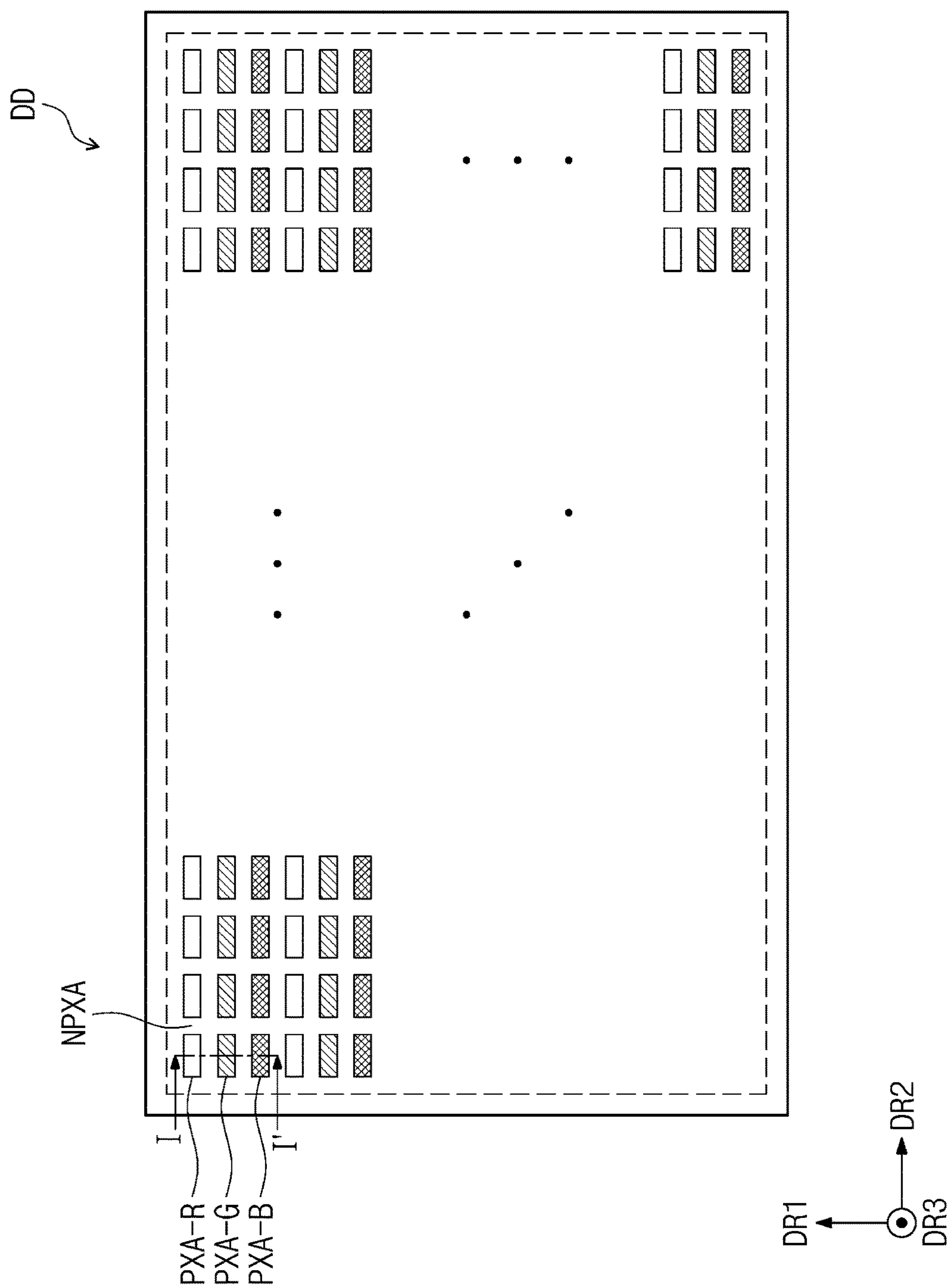
FIG. 1 is a plan view showing a display apparatus according to an embodiment.

The present disclosure may have various suitable modifications and may be embodied in different forms, and embodiments will be explained in more detail with reference to the accompanying drawings. The present disclosure may, however, be embodied in different forms and should not be construed as being limited to the embodiments set forth herein. Rather, all modifications, equivalents, and substituents that are within in the spirit and technical scope of the present disclosure should be included in the present disclosure.

Like reference numerals refer to like elements throughout, and duplicative descriptions thereof may not be provided. In the drawings, the dimensions of structures may be exaggerated for clarity of illustration. It will be understood that, although the terms first, second, etc. may be utilized herein to describe various elements, these elements should not be limited by these terms. These terms are only utilized to distinguish one element from another element. Thus, a first element could be termed a second element without departing from the teachings of the present disclosure. Similarly, a second element could be termed a first element. As utilized herein, the singular forms are intended to include the plural forms as well, unless the context clearly indicates otherwise.

As used herein, expressions such as "at least one of," "one of," and "selected from," when preceding a list of elements, modify the entire list of elements and do not modify the individual elements of the list. As used herein, the term "and/or" includes any and all combinations of one or more of the associated listed items. Further, the use of "may" when describing embodiments of the present disclosure refers to "one or more embodiments of the present disclosure".

In the description, it will be further understood that the terms "includes," "including," "comprises," and/or "comprising," when utilized in this specification, specify the presence of stated features, numerals, steps, operations, elements, parts, or the combination thereof, but do not preclude the presence or addition of one or more other features, numerals, steps, operations, elements, parts, or the combination thereof.

In the description, when a layer, a film, a region, a plate, etc. is referred to as being "on" or "above" another part, it can be "directly on" the other part, or intervening layers may also be present. When a layer, a film, a region, a plate, etc. is referred to as being "under" or "below" another part, it can be "directly under" the other part, or intervening layers may also be present. When an element is referred to as being "directly on," or "directly under" another element, there are no intervening layers present. Also, when an element is referred to as being disposed "on" another element, it can be disposed under the other element.

In the description, the term "substituted or unsubstituted" refers to being unsubstituted, or substituted with at least one substituent selected from the group consisting of a deuterium atom, a halogen atom, a cyano group, a nitro group, an amino group, a silyl group, an oxy group, a thio group, a sulfinyl group, a sulfonyl group, a carbonyl group, a boron group, a phosphine oxide group, a phosphine sulfide group, an alkyl group, an alkenyl group, an alkynyl group, an alkoxy group, a hydrocarbon ring group, an aryl group, and a heterocyclic group. In some embodiments, each of the substituents may be further substituted or unsubstituted. For example, a biphenyl group may be interpreted as an aryl group or a phenyl group substituted with a phenyl group.

In the description, the term "forming a ring via combination with an adjacent group" may refer to forming a substituted or unsubstituted hydrocarbon ring, or a substituted or unsubstituted heterocycle via combination with an adjacent group. The hydrocarbon ring includes an aliphatic hydrocarbon ring and an aromatic hydrocarbon ring. The heterocycle includes an aliphatic heterocycle and an aromatic heterocycle. The hydrocarbon ring and the heterocycle may each independently be monocyclic or polycyclic. In some embodiments, the ring formed via combination with an adjacent group may be combined with another ring to form a spiro structure.

In the description, the term "adjacent group" may refer to a substituent on the same atom or point, a substituent on an atom that is directly connected to the base atom or point, or a substituent sterically positioned (e.g., within intramolecular bonding distance) to the corresponding substituent. For example, in 1,2-dimethylbenzene, two methyl groups may be interpreted as "adjacent groups" to each other, and in 1,1-diethylcyclopentane, two ethyl groups may be interpreted as "adjacent groups" to each other.

In the description, the halogen atom may be a fluorine atom, a chlorine atom, a bromine atom or an iodine atom.

In the description, the alkyl group may be a linear, branched or cyclic alkyl group. The carbon number of the alkyl group may be 1 to 50, 1 to 30, 1 to 20, 1 to 10, or 1 to 6. Examples of the alkyl group may include methyl, ethyl, n-propyl, isopropyl, n-butyl, s-butyl, t-butyl, i-butyl, 2-ethylbutyl, 3,3-dimethylbutyl, n-pentyl, i-pentyl, neopentyl, t-pentyl, cyclopentyl, 1-methylpentyl, 3-methylpentyl, 2-ethylpentyl, 4-methyl-2-pentyl, n-hexyl, 1-methylhexyl, 2-ethylhexyl, 2-butylhexyl, cyclohexyl, 4-methylcyclohexyl, 4-t-butylcyclohexyl, n-heptyl, 1-methylheptyl, 2,2-dimethylheptyl, 2-ethylheptyl, 2-butylheptyl, n-octyl, t-octyl, 2-ethyloctyl, 2-butyloctyl, 2-hexyloctyl, 3,7-dimethyloctyl, cyclooctyl, n-nonyl, n-decyl, adamantyl, 2-ethyldecyl, 2-butyldecyl, 2-hexyldecyl, 2-octyldecyl, n-undecyl, n-dodecyl, 2-ethyldodecyl, 2-butyldodecyl, 2-hexyldocecyl, 2-octyldodecyl, n-tridecyl, n-tetradecyl, n-pentadecyl, n-hexadecyl, 2-ethylhexadecyl, 2-butylhexadecyl, 2-hexylhexadecyl, 2-octylhexadecyl, n-heptadecyl, n-octadecyl, n-nonadecyl, n-eicosyl, 2-ethyleicosyl, 2-butyleicosyl, 2-hexyleicosyl, 2-octyleicosyl, n-heneicosyl, n-docosyl, n-tricosyl, n-tetracosyl, n-pentacosyl, n-hexacosyl, n-heptacosyl, n-octacosyl, n-nonacosyl, n-triacontyl, etc., without limitation.

In the description, "hydrocarbon ring group" refers to an optional functional group or substituent derived from an aliphatic hydrocarbon ring. The hydrocarbon ring group may be a saturated hydrocarbon ring group of 5 to 20 ring-forming carbon atoms.

In the description, "aryl group" refers to an optional functional group or substituent derived from an aromatic hydrocarbon ring. The aryl group may be a monocyclic aryl group or a polycyclic aryl group. The carbon number for forming rings in the aryl group may be 6 to 30, 6 to 20, or 6 to 15. Examples of the aryl group may include phenyl, naphthyl, fluorenyl, anthracenyl, phenanthryl, biphenyl, terphenyl, quaterphenyl, quinquephenyl, sexiphenyl, triphenylenyl, pyrenyl, benzofluoranthenyl, chrysenyl, etc., without limitation.

In the description, the fluorenyl group may be substituted, and two substituents may be combined with each other to form a spiro structure. Examples of a substituted fluorenyl group may include the following, but embodiments of the present disclosure are not limited thereto:

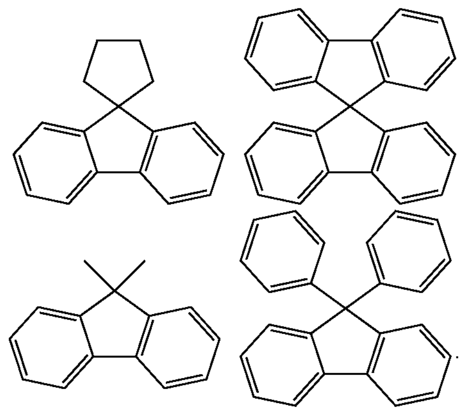

In the description, "heterocyclic group" refers to an optional functional group or substituent derived from a ring including one or more among boron (B), oxygen (O), nitrogen (N), phosphorus (P), silicon (Si) and sulfur (S) as heteroatoms. The heterocyclic group may be an aliphatic heterocyclic group or an aromatic heterocyclic group. The aromatic heterocyclic group may be a heteroaryl group. The aliphatic heterocyclic group and the aromatic heterocyclic group may each independently be a monocycle or a polycycle.

In the description, the heterocyclic group may include one or more among boron (B), oxygen (O), nitrogen (N), phosphorus (P), silicon (Si) and sulfur (S) as heteroatoms. When the heterocyclic group includes two or more heteroatoms, two or more heteroatoms may be the same or different. The heterocyclic group may be a monocyclic heterocyclic group or a polycyclic heterocyclic group, and in some embodiments may be a heteroaryl group. The carbon number for forming rings of the heteroaryl group may be 2 to 30, 2 to 20, 2 to 12, or 2 to 10.

In the description, the aliphatic heterocyclic group may include one or more among B, O, N, P, Si and S as heteroatoms. The number of ring-forming carbon atoms of the aliphatic heterocyclic group may be 2 to 30, 2 to 20, or 2 to 10. Examples of the aliphatic heterocyclic group may include an oxirane group, a thiirane group, a pyrrolidine group, a piperidine group, a tetrahydrofuran group, a tetrahydrothiophene group, a thiane group, a tetrahydropyran group, a 1,4-dioxane group, etc., without limitation.

In the description, the heteroaryl group may include one or more among B, O, N, P, Si and S as heteroatoms. When the heteroaryl group includes two or more heteroatoms, two or more heteroatoms may be the same or different. The heteroaryl group may be a monocyclic heterocyclic group or a polycyclic heterocyclic group. The carbon number for forming the rings of the heteroaryl group may be 2 to 30, 2 to 20, or 2 to 10. Examples of the heteroaryl group may include thiophene, furan, pyrrole, imidazole, triazole, pyridine, bipyridine, pyrimidine, triazine, triazole, acridyl, pyridazine, pyrazinyl, quinoline, quinazoline, quinoxaline, phenoxazine, phthalazine, pyrido pyrimidine, pyrido pyrazine, pyrazino pyrazine, isoquinoline, indole, carbazole, N-arylcarbazole, N-heteroarylcarbazole, N-alkylcarbazole, benzoxazole, benzimidazole, benzothiazole, benzocarbazole, benzothiophene, dibenzothiophene, thienothiophene, benzofuran, phenanthroline, thiazole, isooxazole, oxazole, oxadiazole, thiadiazole, phenothiazine, dibenzosilole, dibenzofuran, etc., without limitation.

In the description, the explanation of the aryl group may be applied to the arylene group, except that the arylene group is a divalent group. The explanation of the heteroaryl group may be applied to the heteroarylene group, except that the heteroarylene group is a divalent group.

In the description, the silyl group may be an alkyl silyl group or an aryl silyl group. Examples of the silyl group may include a trimethylsilyl group, a triethylsilyl group, a t-butyldimethylsilyl group, a propyldimethylsilyl group, a triphenylsilyl group, a diphenylsilyl group, a phenylsilyl group, etc., without limitation.

In the description, the carbon number of the amino group is not specifically limited, but may be 1 to 30. The amino group may be an alkyl amino group, an aryl amino group, or a heteroaryl amino group. Examples of the amino group may include a methylamino group, a dimethylamino group, a phenylamino group, a diphenylamino group, a naphthylamino group, a 9-methyl-anthracenylamino group, a triphenylamino group, etc., without limitation.

In the description, the carbon number of a carbonyl group is not specifically limited, but the carbon number may be 1 to 40, 1 to 30, or 1 to 20. For example, the carbonyl group may have the structures below, but is not limited thereto.

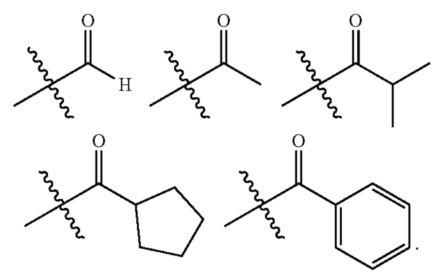

In the description, the carbon number of the sulfinyl group and sulfonyl group is not specifically limited, but may be 1 to 30. The sulfinyl group may include an alkyl sulfinyl group and an aryl sulfinyl group. The sulfonyl group may include an alkyl sulfonyl group and an aryl sulfonyl group.

In the description, the thiol (thio) group may be an alkyl thio group or an aryl thio group. For example, "thiol group" may refer to the above-defined alkyl group or aryl group combined with a sulfur atom. Examples of the thiol group may include a methylthio group, an ethylthio group, a propylthio group, a pentylthio group, a hexylthio group, an octylthio group, a dodecylthio group, a cyclopentylthio group, a cyclohexylthio group, a phenylthio group, a naphthylthio group, etc., without limitation.

In the description, "oxy group" may refer to the above-defined alkyl group or aryl group combined with an oxygen atom. The oxy group may include an alkoxy group and an aryl oxy group. The alkoxy group may include a linear, branched, or cyclic chain. The carbon number of the alkoxy group is not specifically limited but may be, for example, 1 to 20 or 1 to 10. Examples of the oxy group may include methoxy, ethoxy, n-propoxy, isopropoxy, butoxy, pentyloxy, hexyloxy, octyloxy, nonyloxy, decyloxy, benzyloxy, etc. However, embodiments of the present disclosure are not limited thereto.

In the description, "boron group" may refer to the above-defined alkyl group or aryl group which is combined with a boron atom. The boron group includes an alkyl boron group and an aryl boron group. Examples of the boron group may include a trimethylboron group, a triethylboron group, a t-butyldimethylboron group, a triphenylboron group, a diphenylboron group, a phenylboron group, etc., without limitation.

In the description, the alkenyl group may be a linear chain or a branched chain. The carbon number is not specifically limited but may be 2 to 30, 2 to 20, or 2 to 10. Examples of the alkenyl group may include a vinyl group, a 1-butenyl group, a 1-pentenyl group, a 1,3-butadienyl aryl group, a styrenyl group, a styrylvinyl group, etc., without limitation.

In the description, the carbon number of the amine group is not specifically limited, but may be 1 to 30. The amine group may be an alkyl amine group or an aryl amine group. Examples of the amine group may include a methylamine group, a dimethylamine group, a phenylamine group, a diphenylamine group, a naphthylamine group, a 9-methyl-anthracenylamine group, a triphenylamine group, etc., without limitation.

In the description, the alkyl group(s) in the alkylthio group, alkylsulfoxy group, alkylaryl group, alkylamino group, alkylboron group, alkyl silyl group, and alkyl amine group may each independently be the same as the examples of the above-described alkyl group.

In the description, the aryl group(s) in the aryloxy group, arylthio group, arylsulfoxy group, aryl amino group, arylboron group, and aryl silyl group may each independently be the same as the examples of the above-described aryl group.

In the description, "direct linkage" may refer to a single bond.

In the description,

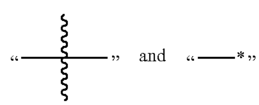

refer to positions to be connected.

Hereinafter, embodiments of the present disclosure will be explained by referring to the drawings.

Figure 2:
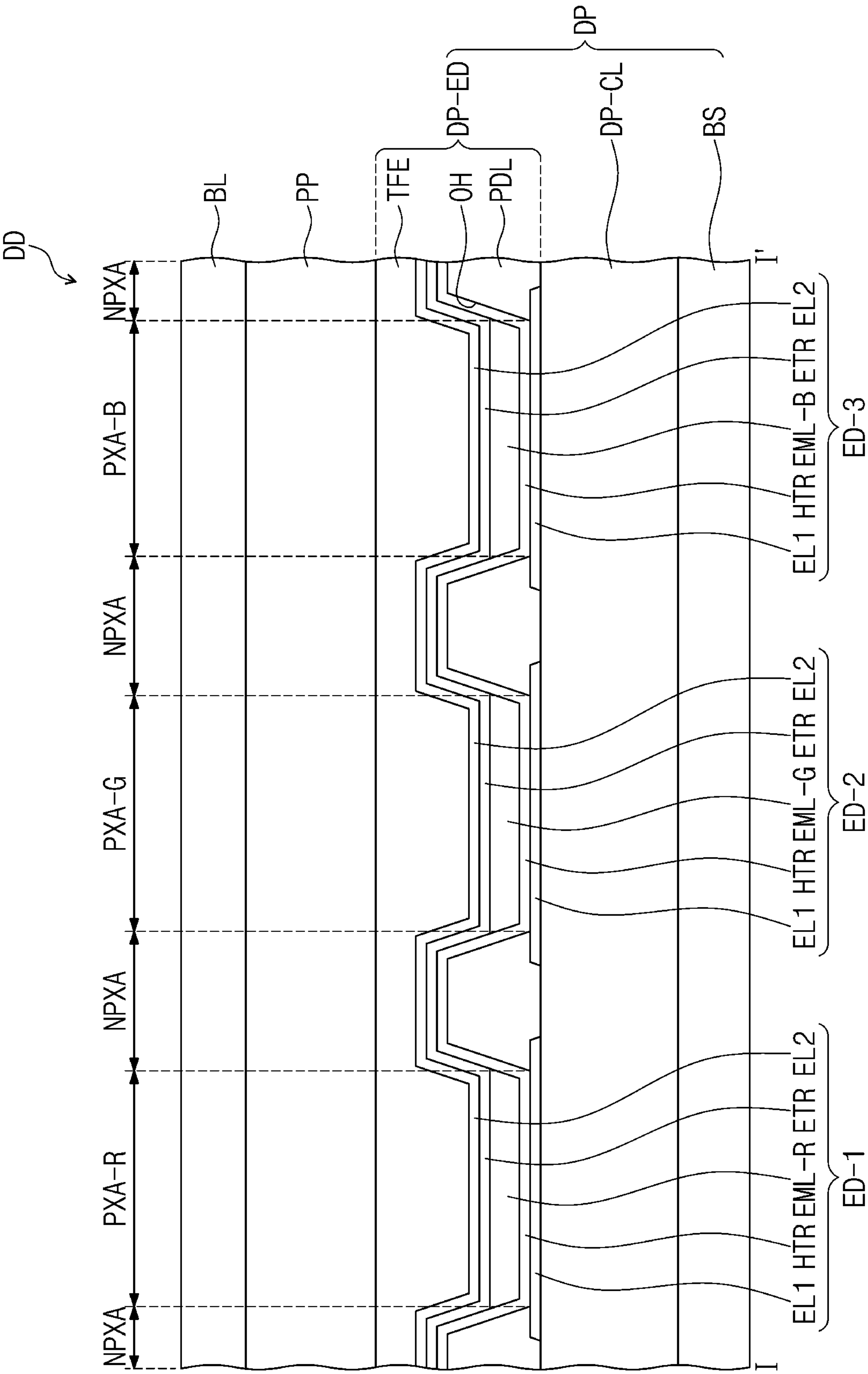
FIG. 2 is a cross-sectional view of a display apparatus according to an embodiment.

FIG. 1 is a plan view showing an embodiment of a display apparatus DD. FIG. 2 is a cross-sectional view of a display apparatus DD of an embodiment. FIG. 2 is a cross-sectional view corresponding to line I-I' in FIG. 1.

The display apparatus DD may include a display panel DP and an optical layer PP disposed on the display panel DP. The display panel DP includes light emitting diodes ED-1, ED-2 and ED-3. The display apparatus DD may include multiple (e.g., multiple sets of) light emitting diodes ED-1, ED-2 and ED-3. The optical layer PP may be disposed on the display panel DP and may control the reflection of external light by the display panel DP. The optical layer PP may include, for example, a polarization layer and/or a color filter layer. In some embodiments, the optical layer PP may not be provided in the display apparatus DD of an embodiment.

On the optical layer PP, a base substrate BL may be disposed. The base substrate BL may be a member providing a base surface where the optical layer PP is disposed. The base substrate BL may be a glass substrate, a metal substrate, a plastic substrate, etc. However, embodiments of the present disclosure are not limited thereto, and the base substrate BL may be an inorganic layer, an organic layer, or a composite material layer. In some embodiments, the base substrate BL may not be provided.

In some embodiments, the display apparatus DD may further include a filling layer. The filling layer may be disposed between a display element layer DP-ED and a base substrate BL. The filling layer may be an organic layer. The filling layer may include at least one among an acrylic resin, a silicon-based resin, and an epoxy-based resin.

The display panel DP may include a base layer BS, a circuit layer DP-CL provided on the base layer BS and a display element layer DP-ED. The display element layer DP-ED may include a pixel definition layer PDL, light emitting diodes ED-1, ED-2 and ED-3 disposed in the pixel definition layer PDL, and an encapsulating layer TFE disposed on the light emitting diodes ED-1, ED-2 and ED-3.

The base layer BS may be a member providing a base surface where (e.g., onto which) the display element layer DP-ED is disposed. The base layer BS may be a glass substrate, a metal substrate, a plastic substrate, etc. However, embodiments of the present disclosure are not limited thereto, and the base layer BS may be an inorganic layer, an organic layer or a composite material layer.

In an embodiment, the circuit layer DP-CL may be disposed on the base layer BS, and the circuit layer DP-CL may include multiple transistors. Each of the transistors may include a control electrode, an input electrode, and an output electrode. For example, the circuit layer DP-CL may include switching transistors and driving transistors for driving the light emitting diodes ED-1, ED-2 and/or ED-3 of the display element layer DP-ED.

Each of the light emitting diodes ED-1, ED-2 and ED-3 may have the structures of any of the light emitting diodes ED of embodiments according to FIG. 3 to FIG. 6, which will be explained later. Each of the light emitting diodes ED-1, ED-2 and ED-3 may include a first electrode EL1, a hole transport region HTR, emission layers EML-R, EML-G and EML-B, an electron transport region ETR, and a second electrode EL2.

FIG. 2 shows an embodiment where the emission layers EML-R, EML-G and EML-B of light emitting diodes ED-1, ED-2 and ED-3, which are in opening portions OH defined in a pixel definition layer PDL, are disposed, and a hole transport region HTR, an electron transport region ETR and a second electrode EL2 are provided as common layers in all light emitting diodes ED-1, ED-2 and ED-3. However, embodiments of the present disclosure are not limited thereto. In some embodiments, the hole transport region HTR and the electron transport region ETR may be patterned and provided in the opening portions OH defined in the pixel definition layer PDL. For example, in an embodiment, the hole transport region HTR, the emission layers EML-R, EML-G and EML-B, and the electron transport region ETR of the light emitting diodes ED-1, ED-2 and ED-3 may be patterned by an ink jet printing method and provided.

An encapsulating layer TFE may cover the light emitting diodes ED-1, ED-2 and ED-3. The encapsulating layer TFE may encapsulate the display element layer DP-ED. The encapsulating layer TFE may be a thin film encapsulating layer. The encapsulating layer TFE may be one layer or a stacked structure of multiple layers. The encapsulating layer TFE includes at least one insulating layer. The encapsulating layer TFE according to an embodiment may include at least one inorganic layer (hereinafter, encapsulating inorganic layer). In some embodiments, the encapsulating layer TFE according to an embodiment may include at least one organic layer (hereinafter, encapsulating organic layer) and at least one encapsulating inorganic layer.

The encapsulating inorganic layer protects the display element layer DP-ED from moisture/oxygen, and the encapsulating organic layer protects the display element layer DP-ED from foreign materials (such as dust particles). The encapsulating inorganic layer may include silicon nitride, silicon oxy nitride, silicon oxide, titanium oxide, and/or aluminum oxide, without specific limitation. The encapsulating organic layer may include an acrylic compound, an epoxy-based compound, etc. The encapsulating organic layer may include a photopolymerizable organic material, without specific limitation.

The encapsulating layer TFE may be disposed on the second electrode EL2 and may be disposed while filling the opening portion OH.

Referring to FIG. 1 and FIG. 2, the display apparatus DD may include a non-emitting area NPXA and emitting areas PXA-R, PXA-G and PXA-B. The emitting areas PXA-R, PXA-G and PXA-B may be areas to emit light produced from the light emitting diodes ED-1, ED-2 and ED-3, respectively. The emitting areas PXA-R, PXA-G and PXA-B may be separated from each other on a plane.

The emitting areas PXA-R, PXA-G and PXA-B may be areas separated by the pixel definition layer PDL. The non-emitting areas NPXA may be areas between neighboring emitting areas PXA-R, PXA-G and PXA-B, and may be areas corresponding to the pixel definition layer PDL. In some embodiments, each of the emitting areas PXA-R, PXA-G and PXA-B may correspond to respective pixels. The pixel definition layer PDL may divide the light emitting diodes ED-1, ED-2 and ED-3. The emission layers EML-R, EML-G and EML-B of the light emitting diodes ED-1, ED-2 and ED-3 may be disposed and divided in the opening portions OH defined in the pixel definition layer PDL.

The emitting areas PXA-R, PXA-G and PXA-B may be divided into multiple groups according to the color of light produced from the light emitting diodes ED-1, ED-2 and ED-3. In the display apparatus DD of an embodiment, shown in FIG. 1 and FIG. 2, three emitting areas PXA-R, PXA-G and PXA-B respectively emitting red light, green light and blue light are illustrated. For example, the display apparatus DD of an embodiment may include a red emitting area PXA-R, a green emitting area PXA-G and a blue emitting area PXA-B, which are separated from each other.

In the display apparatus DD according to an embodiment, multiple light emitting diodes ED-1, ED-2 and ED-3 may be to emit light having different wavelength regions. For example, in an embodiment, the display apparatus DD may include a first light emitting diode ED-1 to emit red light, a second light emitting diode ED-2 to emit green light, and a third light emitting diode ED-3 to emit blue light. For example, each of the red emitting area PXA-R, the green emitting area PXA-G, and the blue emitting area PXA-B of the display apparatus DD may correspond to the first light emitting diode ED-1, the second light emitting diode ED-2, and the third light emitting diode ED-3.

However, embodiments of the present disclosure are not limited thereto, and the first to third light emitting diodes ED-1, ED-2 and ED-3 may be to emit light in the same wavelength region, or at least one thereof may be to emit light in a different wavelength region. For example, all the first to third light emitting diodes ED-1, ED-2 and ED-3 may be to emit blue light.

The emitting areas PXA-R, PXA-G and PXA-B in the display apparatus DD according to an embodiment may be arranged in a stripe shape or layout. Referring to FIG. 1, multiple red emitting areas PXA-R, multiple green emitting areas PXA-G and multiple blue emitting areas PXA-B may be arranged along a second directional axis DR2. In some embodiments, the red emitting area PXA-R, the green emitting area PXA-G and the blue emitting area PXA-B may be arranged by turns along a first directional axis DR1.

In FIG. 1 and FIG. 2, the areas of the emitting areas PXA-R, PXA-G and PXA-B are shown as being similar (e.g., substantially equivalent), but embodiments of the present disclosure are not limited thereto. For example, the areas of the emitting areas PXA-R, PXA-G and PXA-B may be different from each other and may be selected to correspond with the wavelength region of light emitted. The referenced areas of the emitting areas PXA-R, PXA-G and PXA-B may be areas on a plane defined by the first directional axis DR1 and the second directional axis DR2.

The arrangement of the emitting areas PXA-R, PXA-G and PXA-B is not limited to the configuration shown in FIG. 1, and the arrangement order of the red emitting areas PXA-R, the green emitting areas PXA-G and the blue emitting areas PXA-B may be provided in various suitable combinations according to the properties of display quality required for the display apparatus DD. For example, the arrangement of the emitting areas PXA-R, PXA-G and PXA-B may be a PENTILE® arrangement, or a diamond arrangement.

In some embodiments, the areas of the emitting areas PXA-R, PXA-G and PXA-B may be different from each other. For example, in an embodiment, the area of the green emitting area PXA-G may be smaller than the area of the blue emitting area PXA-B, but embodiments of the present disclosure are not limited thereto.

FIG. 3 to FIG. 6 are cross-sectional views schematically showing light emitting diodes according to embodiments. The light emitting diode ED according to an embodiment may include a first electrode EL1, a second electrode EL2 opposite to the first electrode EL1, and at least one functional layer disposed between the first electrode EL1 and the second electrode EL2. The at least one functional layer may include a hole transport region HTR, an emission layer EML, and an electron transport region ETR, stacked in order. For example, the light emitting diode ED of an embodiment may include a first electrode EL1, a hole transport region HTR, an emission layer EML, an electron transport region ETR, and a second electrode EL2, stacked in order.

Figure 3:
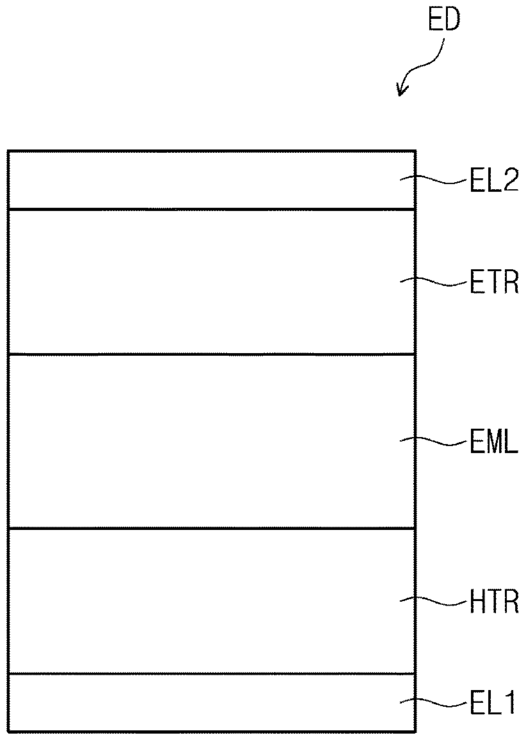
FIG. 3 is a cross-sectional view schematically showing a light emitting diode according to an embodiment.
Figure 4:
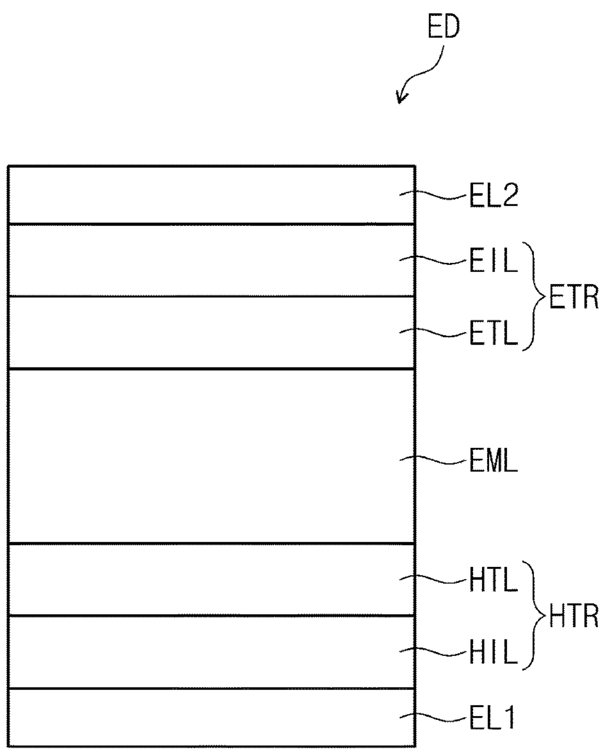
FIG. 4 is a cross-sectional view schematically showing a light emitting diode according to an embodiment.
Figure 5:
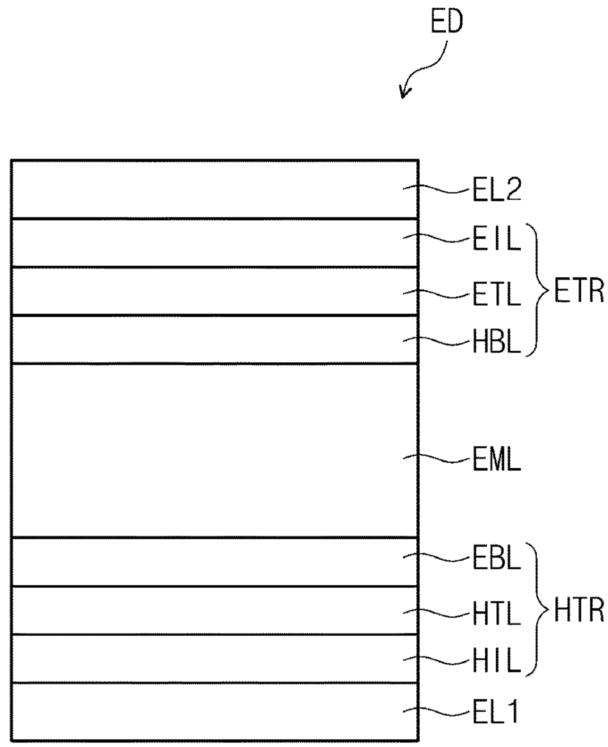
FIG. 5 is a cross-sectional view schematically showing a light emitting diode according to an embodiment.
Figure 6:
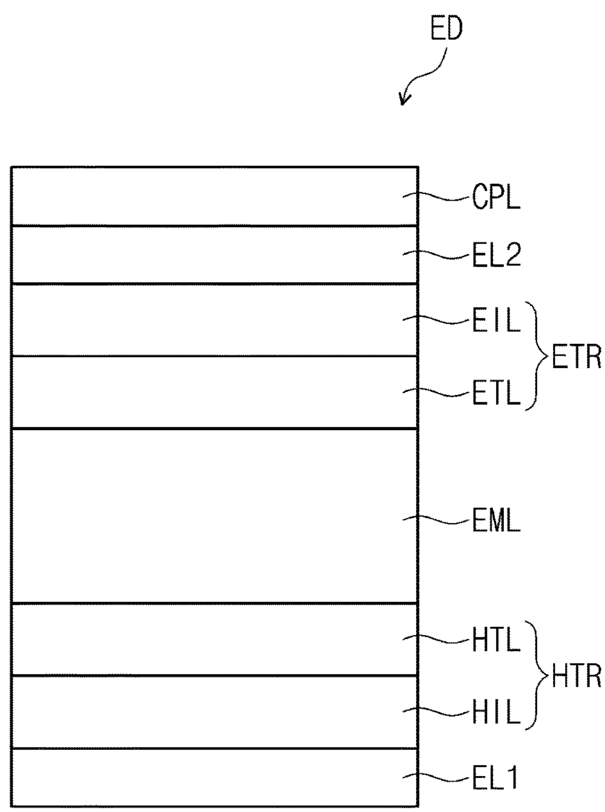
FIG. 6 is a cross-sectional view schematically showing a light emitting diode according to an embodiment.

When compared with FIG. 3, FIG. 4 shows the cross-sectional view of a light emitting diode ED of an embodiment, wherein the hole transport region HTR includes a hole injection layer HIL and a hole transport layer HTL, and the electron transport region ETR includes an electron injection layer EIL and an electron transport layer ETL. When compared with FIG. 3, FIG. 5 shows the cross-sectional view of a light emitting diode ED of an embodiment, wherein the hole transport region HTR includes a hole injection layer HIL, a hole transport layer HTL, and an electron blocking layer EBL, and the electron transport region ETR includes an electron injection layer EIL, an electron transport layer ETL, and a hole blocking layer HBL. When compared with FIG. 4, FIG. 6 shows the cross-sectional view of a light emitting diode ED of an embodiment, including a capping layer CPL disposed on the second electrode EL2.

The light emitting diode ED of an embodiment may include an amine compound of an embodiment, which will be explained later, in at least one functional layer (such as a hole transport region HTR, an emission layer EML, and/or an electron transport region ETR).

In the light emitting diode ED according to an embodiment, the first electrode EL1 may have conductivity (e.g., may be conductive). The first electrode EL1 may be formed utilizing a metal material, a metal alloy and/or a conductive compound. The first electrode EL1 may be an anode or a cathode. However, embodiments of the present disclosure are not limited thereto. In some embodiments, the first electrode EL1 may be a pixel electrode. The first electrode EL1 may be a transmissive electrode, a transflective electrode, or a reflective electrode. When the first electrode EL1 is a transmissive electrode, the first electrode EL1 may include a transparent metal oxide (such as indium tin oxide (ITO), indium zinc oxide (IZO), zinc oxide (ZnO), and/or indium tin zinc oxide (ITZO)). When the first electrode EL1 is a transflective electrode or a reflective electrode, the first electrode EL1 may include silver (Ag), magnesium (Mg), copper (Cu), aluminum (Al), platinum (Pt), palladium (Pd), gold (Au), nickel (Ni), neodymium (Nd), iridium (Ir), chromium (Cr), lithium (Li), calcium (Ca), LiF/calcium (Ca), LiF/aluminum (Al), molybdenum (Mo), titanium (Ti), tungsten (W), one or more compounds thereof, or one or more mixtures thereof (for example, a mixture of Ag and Mg). Also, the first electrode EL1 may have a structure including multiple layers including a reflective layer or a transflective layer formed utilizing the above materials, and a transmissive conductive layer formed utilizing ITO, IZO, ZnO, or ITZO. For example, the first electrode EL1 may include a three-layer structure of ITO/Ag/ITO. However, embodiments of the present disclosure are not limited thereto. The first electrode EL1 may include the above-described metal materials, combinations of two or more metal materials selected from the above-described metal materials, or oxides of the above-described metal materials. The thickness of the first electrode EL1 may be about 700 Å to about 10,000 Å. For example, the thickness of the first electrode EL1 may be about 1,000 Å to about 3,000 Å.

The hole transport region HTR is provided on the first electrode EL1. The hole transport region HTR may include at least one of a hole injection layer HIL, a hole transport layer HTL, a buffer layer, an emission auxiliary layer or an electron blocking layer EBL. The thickness of the hole transport region HTR may be about 50 Å to about 15,000 Å.

The hole transport region HTR may have a single layer formed utilizing a single material, a single layer formed utilizing multiple different materials, or a multilayer structure including multiple layers formed utilizing multiple different materials.

For example, the hole transport region HTR may have the structure of a single layer of a hole injection layer HIL or a hole transport layer HTL, and may have a structure of a single layer formed utilizing a hole injection material and a hole transport material. In some embodiments, the hole transport region HTR may have a structure of a single layer formed utilizing multiple different materials, or a structure stacked from the first electrode EL1 of hole injection layer HIL/hole transport layer HTL, hole injection layer HIL/hole transport layer HTL/buffer layer, hole injection layer HIL/buffer layer, hole transport layer HTL/buffer layer, or hole injection layer HIL/hole transport layer HTL/electron blocking layer EBL, without limitation.

The hole transport region HTR may be formed utilizing one or more suitable methods (such as a vacuum deposition method, a spin coating method, a cast method, a Langmuir-Blodgett (LB) method, an inkjet printing method, a laser printing method, and/or a laser induced thermal imaging (LITI) method).

In the light emitting diode ED of an embodiment, the hole transport region HTR may include an amine compound represented by Formula 1. In some embodiments, in the light emitting diode ED of an embodiment, a hole transport region HTR includes at least one among a hole injection layer HIL, a hole transport layer HTL, and an electron blocking layer EBL, and at least one among the hole injection layer HIL, the hole transport layer HTL, and the electron blocking layer EBL may include an amine compound of an embodiment, represented by Formula 1. For example, in the light emitting diode ED of an embodiment, the hole transport layer HTL may include an amine compound represented by Formula 1.

Formula 1

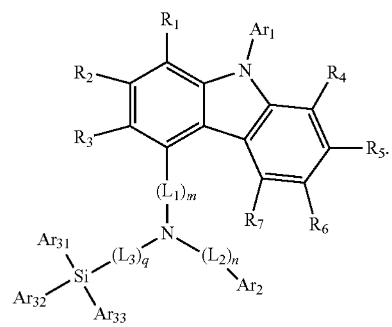

The amine compound represented by Formula 1 may include all of a 4-carbazole group

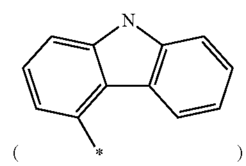 [SMILES: *c1cccc2[nH]c3ccccc3c12]

combined with an amine moiety (e.g., via position 4), a triarylsilyl group including $Ar_{31}$ to $Ar_{33}$ as substituents, and a polycyclic aromatic hydrocarbon ring group or heterocyclic group represented by $*\text{-}(L_2)_n\text{-}Ar_2$. The substitution position of the carbazole group in the present disclosure is defined as follows.

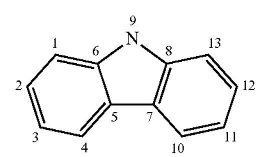

In Formula 1, An may be a substituted or unsubstituted aryl group of 6 to 30 ring-forming carbon atoms, or a substituted or unsubstituted heteroaryl group of 2 to 30 ring-forming carbon atoms. In some embodiments, $R_1$ to $R_7$ may each independently be a hydrogen atom, a deuterium atom, a halogen atom, a substituted or unsubstituted oxy group, a substituted or unsubstituted thiol group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, and/or may be combined with an adjacent group to form a ring.

When $R_1$ to $R_7$ are combined with an adjacent group to form a ring, neighboring substituents may be combined with each other to form a fused ring with the carbazole group. For example, adjacent groups of $R_1$ to $R_7$ may be combined to form a five-membered ring or a six-membered ring, and a heteroatom (such as 0, N, and/or S) may be included as a ring-forming atom in addition to a carbon atom. The ring formed by the combination of adjacent groups among $R_1$ to $R_7$ may be a monocycle or a polycycle.

In Formula 1, "m" may be an integer of 0 to 2, and $L_1$ may be a direct linkage, or a substituted or unsubstituted arylene group of 6 to 30 ring-forming carbon atoms. In Formula 1, when "m" is 0, $L_1$ is a direct linkage, and in this case, the carbazole group may make a direct linkage with the nitrogen atom of the amine at position 4. When "m" is 2, two $L_1$ groups may be the same or different.

In Formula 1, when "m" is 1 or more, $L_1$ may include a substituted or unsubstituted divalent phenyl group, a substituted or unsubstituted divalent biphenyl group, a substituted or unsubstituted divalent naphthalene group, or a substituted or unsubstituted divalent phenanthrene group. However, embodiments of the present disclosure are not limited thereto.

In Formula 1, $Ar_1$ may be a substituted or unsubstituted phenyl group, a substituted or unsubstituted naphthyl group, a substituted or unsubstituted phenanthrene group, a substituted or unsubstituted dibenzofuran group, or a substituted or unsubstituted dibenzothiophene group. For example, in Formula 1, $Ar_1$ may be an unsubstituted phenyl group, a phenyl group substituted with deuterium, a phenyl group substituted with a phenyl group, an unsubstituted naphthyl group, an unsubstituted biphenyl group, an unsubstituted phenanthrene group, an unsubstituted dibenzofuran group, or an unsubstituted dibenzothiophene group. However, embodiments of the present disclosure are not limited thereto.

In Formula 1, $Ar_{31}$ to $Ar_{33}$ may each independently be a substituted or unsubstituted aryl group of 6 to 30 ring-forming carbon atoms. In an embodiment, Aral to $Ar_{33}$ may all (each) be the same, or at least one thereof may be a different aryl group from the remainder (e.g., the others).

For example, in an embodiment, $Ar_{31}$ to $Ar_{33}$ may each independently be a substituted or unsubstituted phenyl group, or a substituted or unsubstituted naphthyl group. However, embodiments of the present disclosure are not limited thereto.

In Formula 1, "q" may be an integer of 1 to 3, and $L_3$ may be a direct linkage, or a substituted or unsubstituted arylene group of 6 to 30 ring-forming carbon atoms. When "q" is 2 or more, multiple $L_3$ groups may be the same, or at least one thereof may be different from the remainder.

$L_3$ may be a substituted or unsubstituted phenylene group, a substituted or unsubstituted divalent biphenyl group, a substituted or unsubstituted naphthalene group, or a substituted or unsubstituted phenanthrene group. However, embodiments of the present disclosure are not limited thereto.

In Formula 1, Are may be a substituted or unsubstituted aryl group of 10 to 30 ring-forming carbon atoms, or a heteroaryl group of 2 to 30 ring-forming carbon atoms, including 0 or S as a ring-forming atom. In some embodiments, in the amine compound of an embodiment, a case where $*-(L_2)_n-Ar_2$ is a biphenyl group is excluded.

"n" may be an integer of 0 to 2, and $L_2$ may be a direct linkage, or a substituted or unsubstituted arylene group of 6 to 30 ring-forming carbon atoms. In some embodiments, in Formula 1, when "n" is 0, $L_2$ is a direct linkage, and in this case, $Ar_2$ may make a direct linkage with the nitrogen atom of the amine. In some embodiments, when "n" is 2, two $L_2$ groups may be the same of different.

In an embodiment, a case where $*-(L_2)_n-Ar_2$ is an unsubstituted biphenyl group is excluded, and if $Ar_2$ is a unsubstituted biphenyl group, "n" is 1 or more, and in this case, $L_2$ may be a substituted or unsubstituted arylene group of 6 to 30 ring-forming carbon atoms.

In Formula 1, $*-(L_2)_n-Ar_2$ may be represented by any one among Formula 2-1 to Formula 2-4:

Formula 2-1

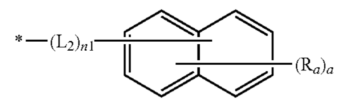

Formula 2-2

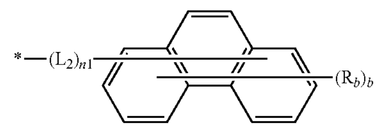

Formula 2-3

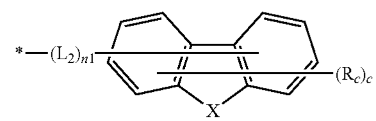

Formula 2-4

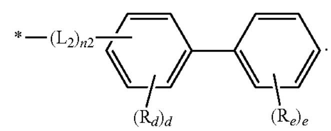

In Formula 2-1 to Formula 2-4, "a" and "c" may be integers of 0 to 7, "b" may be an integer of 0 to 9, "d" may be an integer of 0 to 4, and "e" may be an integer of 0 to 5. $R_a$ to $R_e$ may each independently be a hydrogen atom, a deuterium atom, a halogen atom, a substituted or unsubstituted oxy group, a substituted or unsubstituted thiol group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, and/or may be combined with an adjacent group to form a ring.

When "a" is 2 or more, multiple $R_a$ may be the same, or at least one thereof may be different from the remainder. The same explanations of "a" and $R_a$ may be applied to "b" to "e" and $R_b$ to $R_e$ represented in Formula 2-2 to Formula 2-4.

When $R_a$ to $R_e$ are combined with an adjacent group to form a ring, multiple $R_a$ to $R_e$ may be combined with each other to form a five-member ring or a six-member ring, or may form a fused ring with a naphthyl group, a phenanthrene group, a dibenzoheterole group, or a phenyl group shown in Formula 2-1 to Formula 2-4.

In Formula 2-1 to Formula 2-3, "n1" may be an integer of 0 to 2, and $L_2$ may be a direct linkage, or a substituted or unsubstituted arylene group of 6 to 30 ring-forming carbon atoms as described above. In Formula 2-1 to Formula 2-3, when "n1" is 0, $L_2$ may be a direct linkage, and in Formula 2-1 to Formula 2-3, when "n1" is 1 or more, $L_2$ may include a substituted or unsubstituted phenylene group, a substituted or unsubstituted divalent biphenyl group, a substituted or unsubstituted naphthalene group, or a substituted or unsubstituted phenanthrene group. However, embodiments of the present disclosure are not limited thereto.

In some embodiments, in Formula 2-4, "n2" may be 1 or 2, and in this case, $L_2$ may include a substituted or unsubstituted phenylene group, a substituted or unsubstituted divalent biphenyl group, a substituted or unsubstituted naphthalene group, or a substituted or unsubstituted phenanthrene group.

In Formula 2-3, X may be 0 or S. For example, in an embodiment, the amine compound represented by Formula 1 may include dibenzofuran derivatives or dibenzothiophene derivatives in addition to carbazole derivatives and a triarylsilyl group.

Referring to Formula 2-1 to Formula 2-4, the amine compound of an embodiment, represented by Formula 1 may include a substituted or unsubstituted naphthyl group, a substituted or unsubstituted phenanthrene group, a substituted or unsubstituted dibenzofuran group, a substituted or unsubstituted dibenzothiophene group, or a polycyclic substituent including at least three or more six-member rings, in addition to the carbazole group and the triarylsilyl group as substituents combined with an amine moiety.

The amine compound of an embodiment, represented by Formula 1 may be represented by Formula 1-1 or Formula 1-2:

Formula 1-1

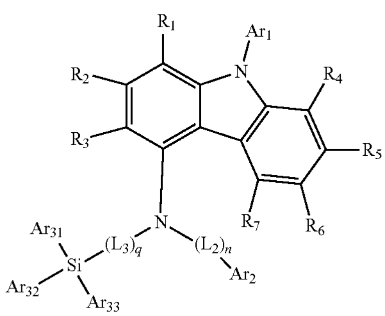

-continued

Formula 1-2

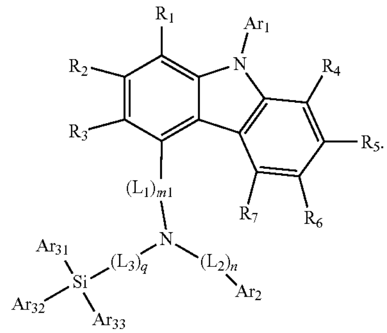

In Formula 1-2, "m1" may be 1 or 2, and $L_1$ may be a substituted or unsubstituted arylene group of 6 to 30 ring-forming group. When "m1" is 2, two $L_1$ groups may be the same or different.

In Formula 1-2, when "m1" is 1 or more, $L_1$ may be a substituted or unsubstituted phenylene group, a substituted or unsubstituted divalent biphenyl group, a substituted or unsubstituted naphthalene group, or a substituted or unsubstituted phenanthrene group. However, embodiments of the present disclosure are not limited thereto.

In some embodiments, in Formula 1-1 and Formula 1-2, $Ar_1$, $Ar_2$, $Ar_{31}$ to $Ar_{33}$, $L_1$ to $L_3$, "n", "q", and $R_1$ to $R_7$ may each independently be the same as described in connection with to Formula 1 and Formula 2-1 to Formula 2-4.

The amine compound represented by Formula 1 may be represented by any one among the compounds represented in Compound Group 1A or Compound Group 1B. The hole transport region HTR of the light emitting diode ED of an embodiment may include at least one among the amine compounds shown in Compound Group 1A and Compound Group 1B.

Compound Group 1A

A1

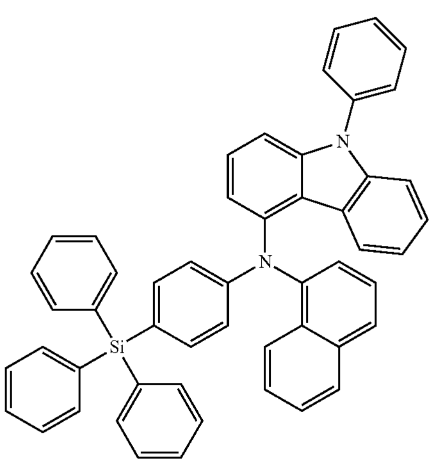

A2

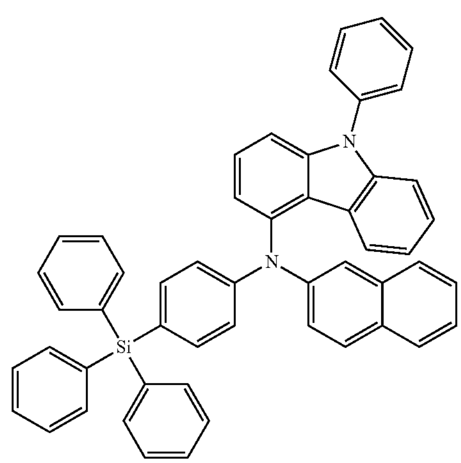

-continued
A3
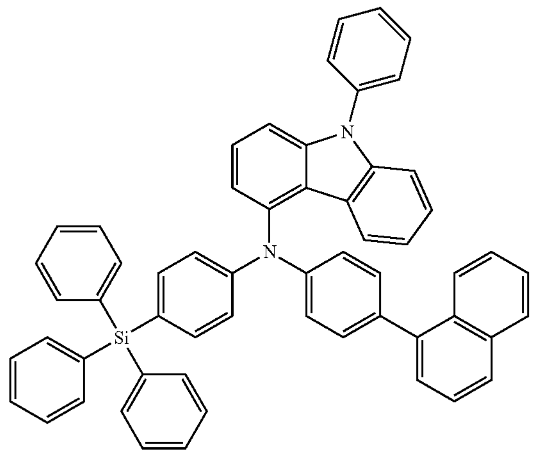
A4
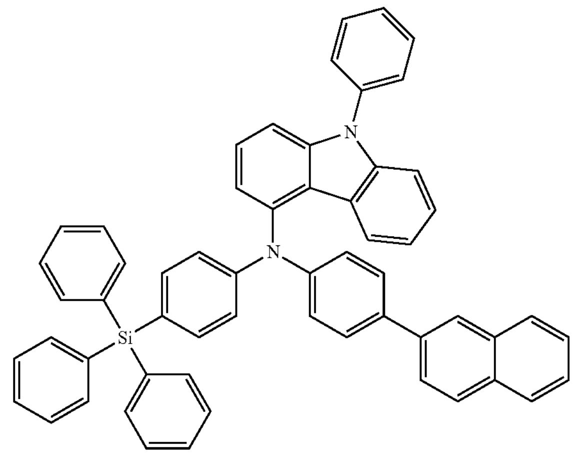
A5
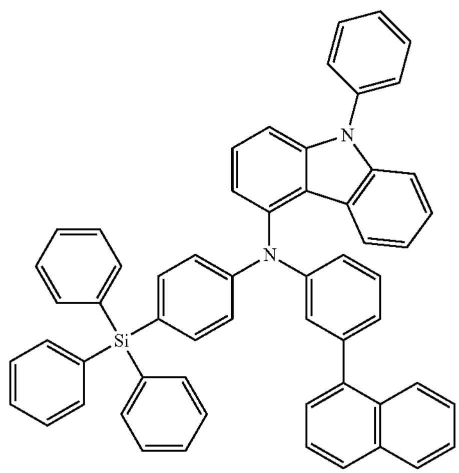
A6
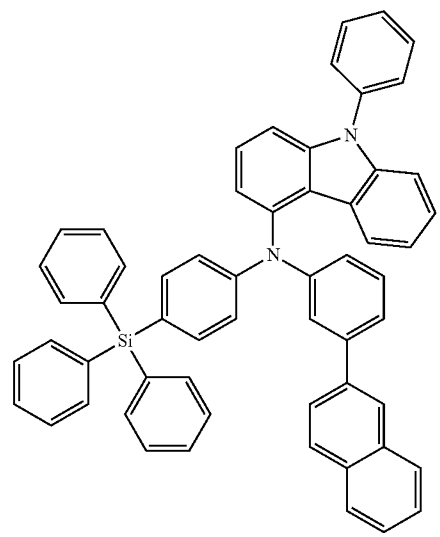
A7
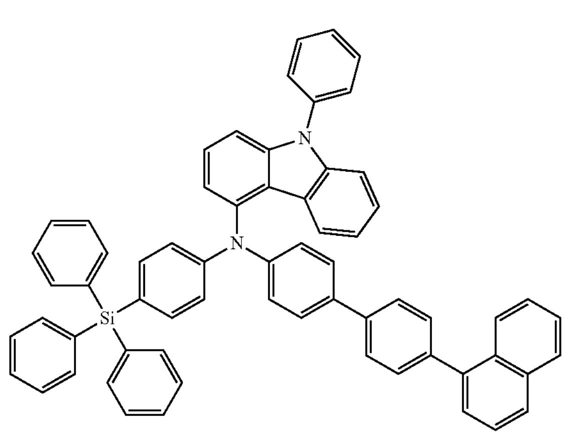
A8
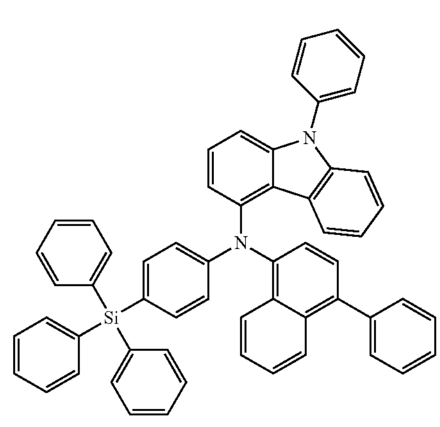

-continued
A9
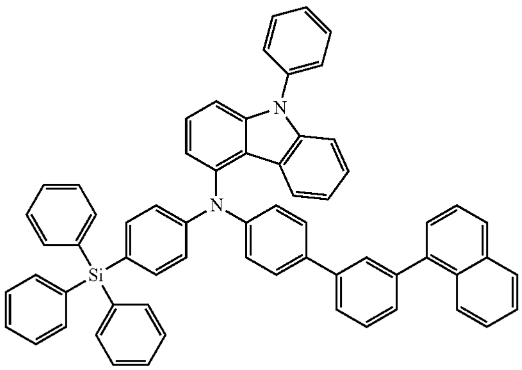
A10
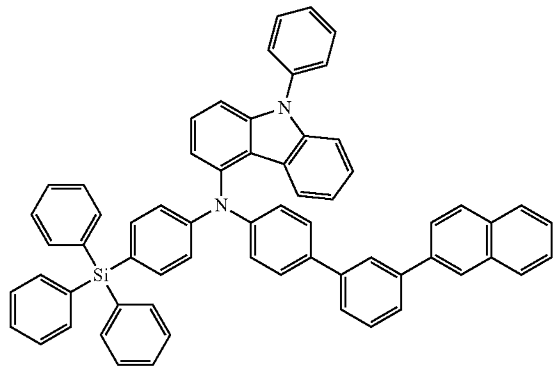
A11
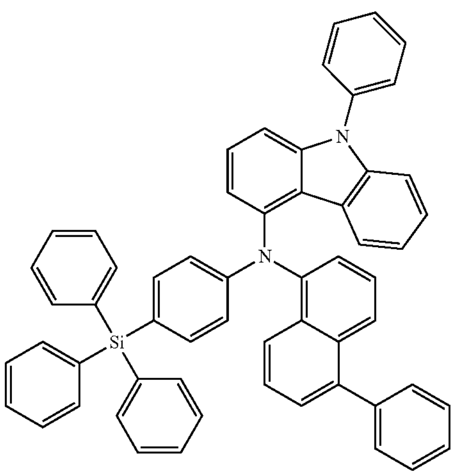
A12
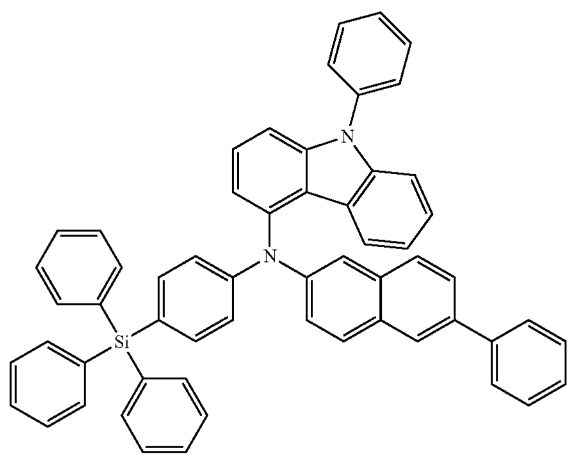
A13
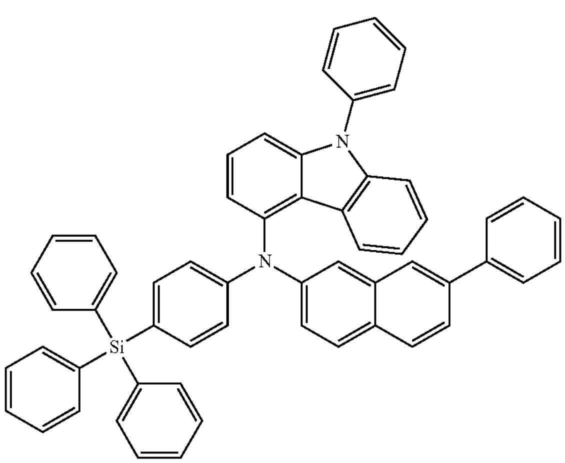
A14
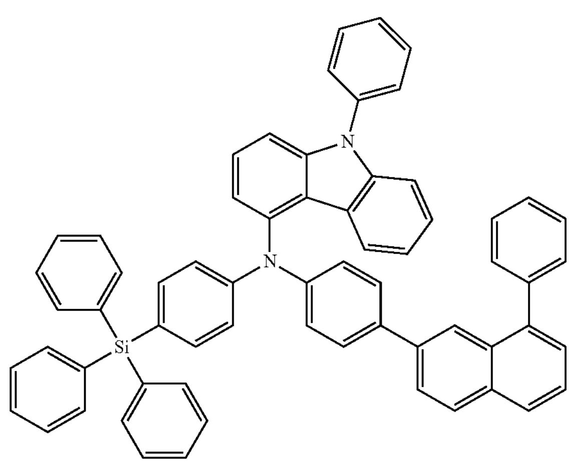

-continued
A15
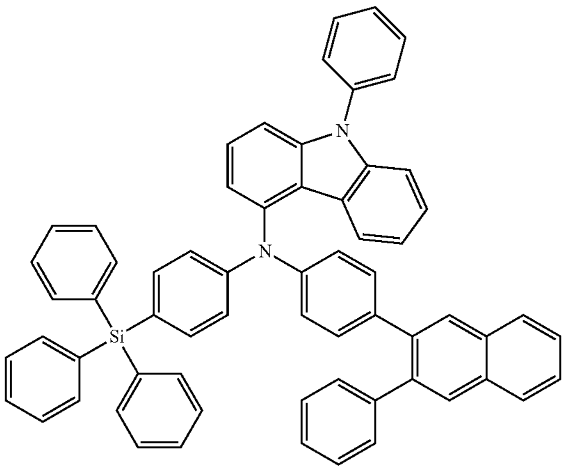
A16
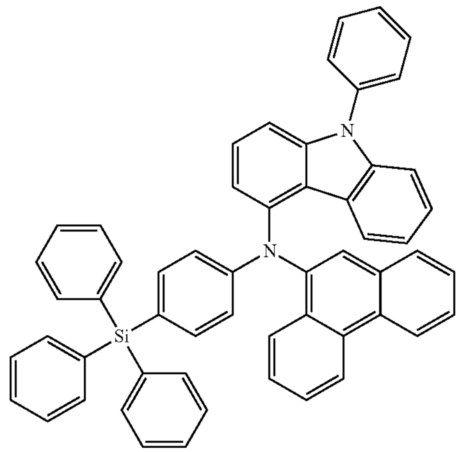
A17
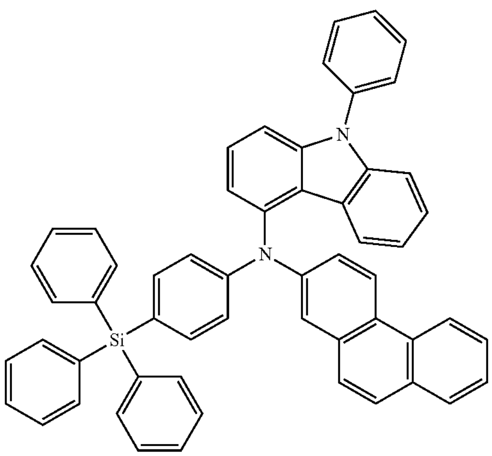
A18
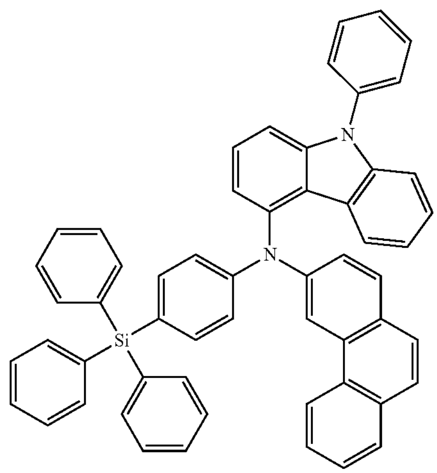
A19
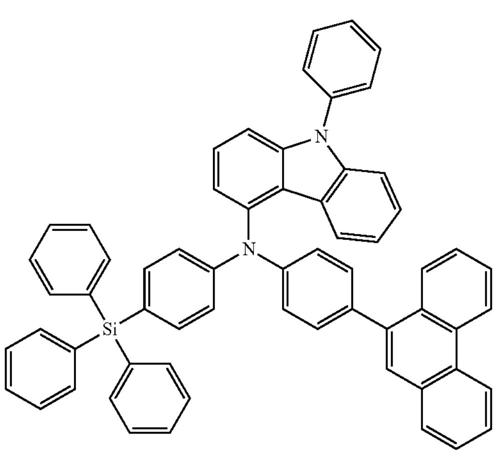
A20
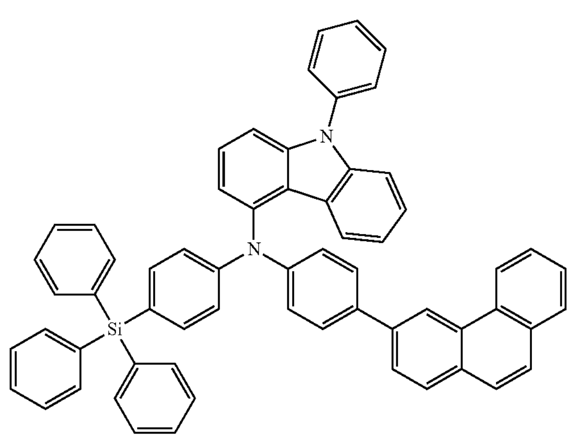

-continued
A21
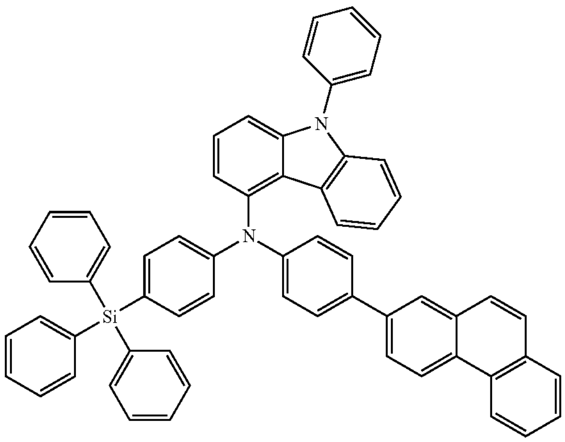
A22
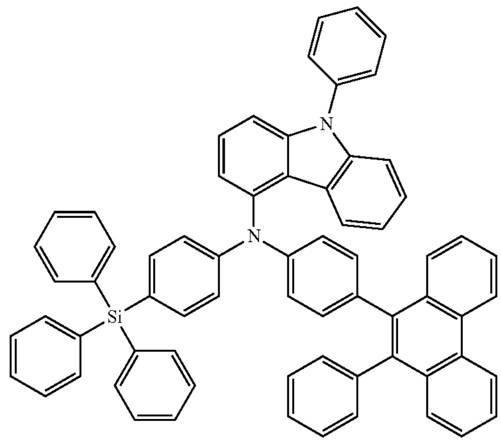
A23
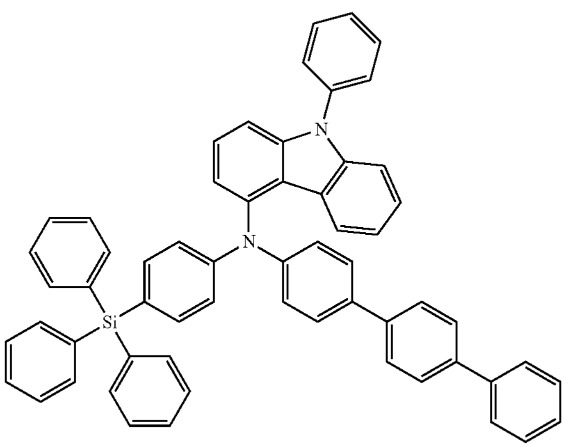
A24
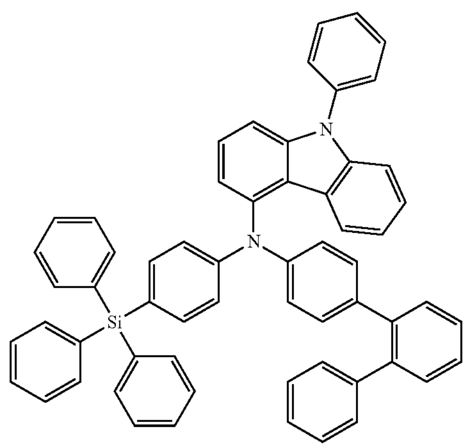
A25
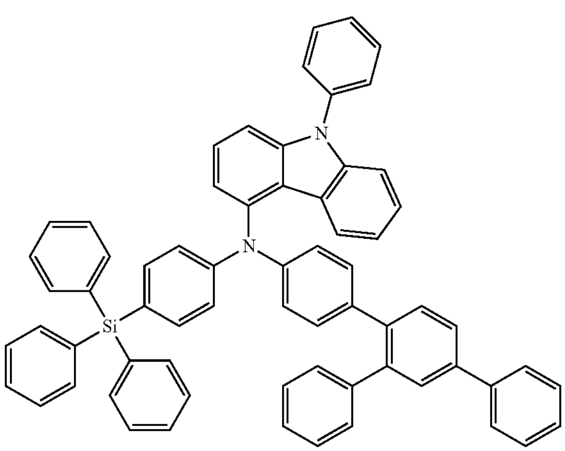
A26
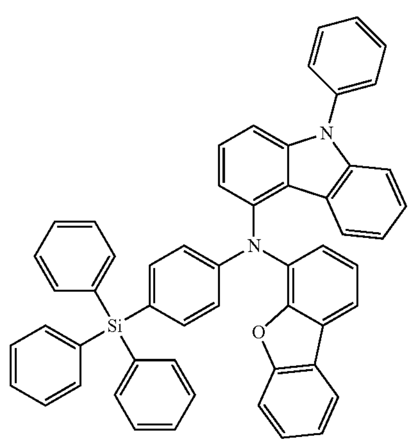

-continued
A27
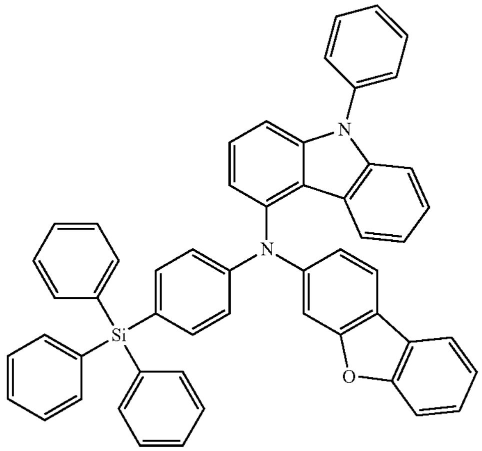
A28
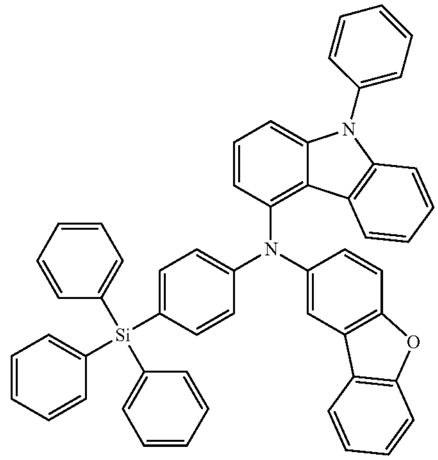
A29
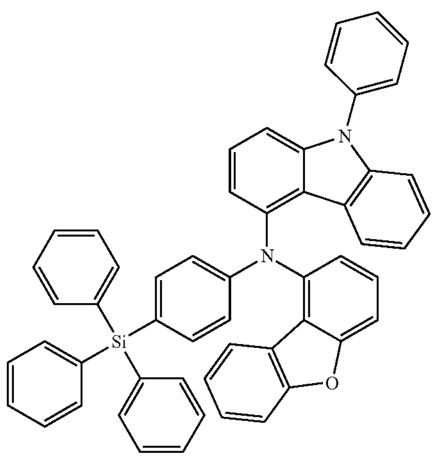
A30
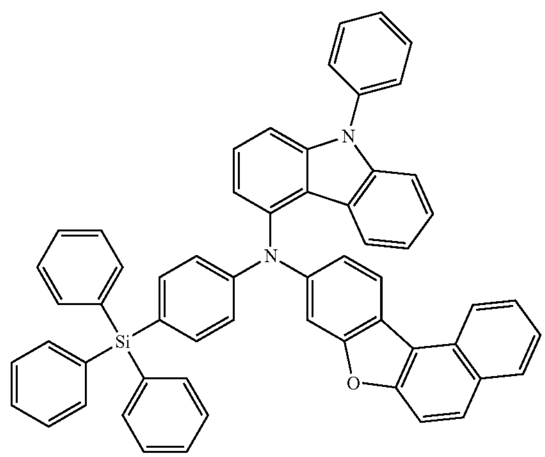
A31
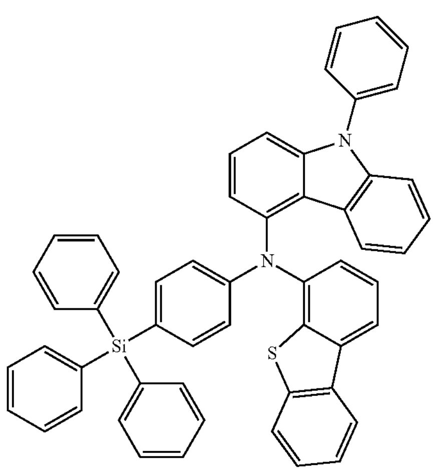
A32
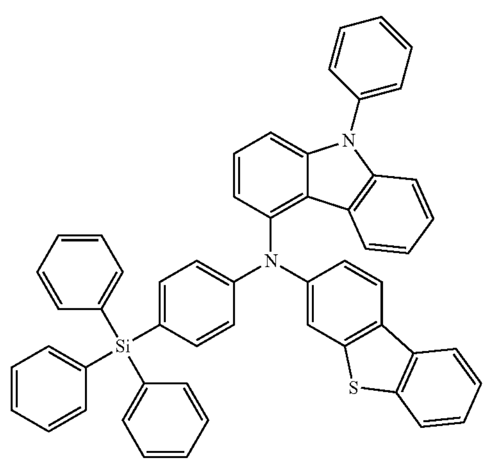

-continued
A33
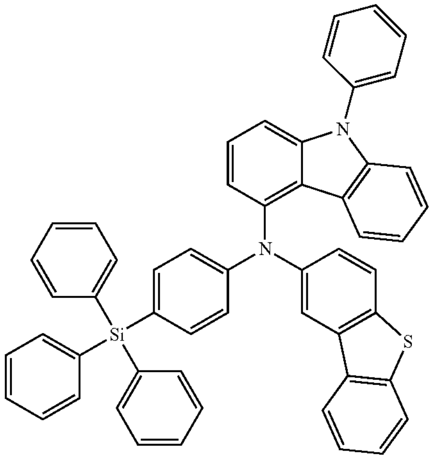
A34
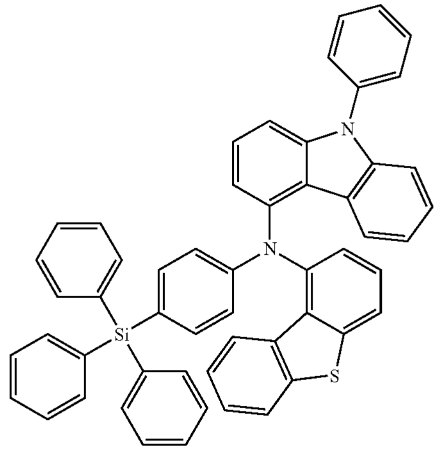
A35
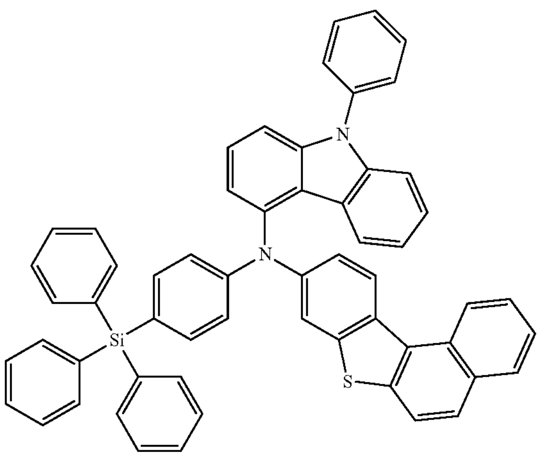
A36
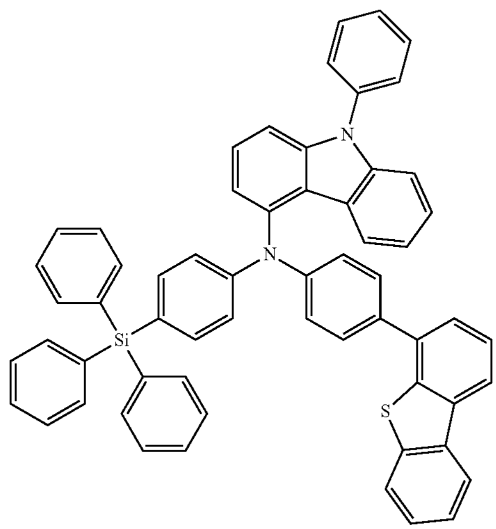
A37
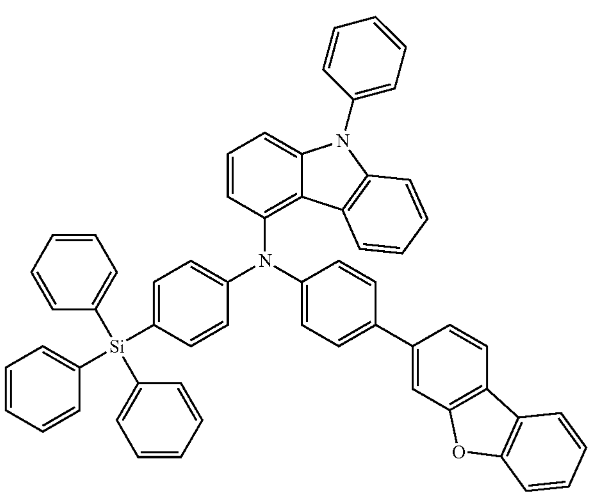
A38
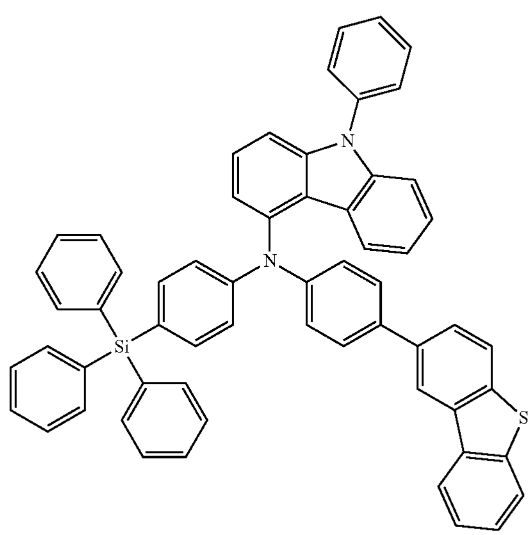

-continued
A39
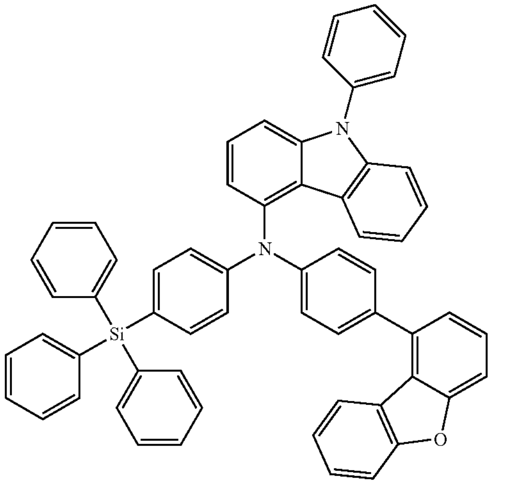
A40
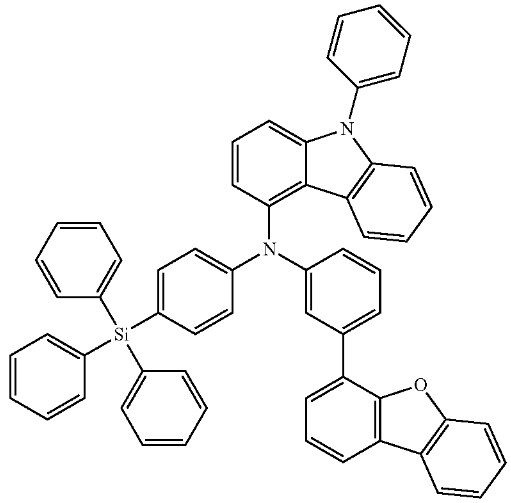
A41
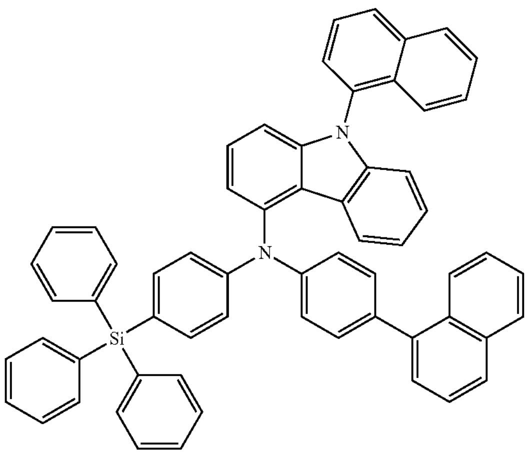
A42
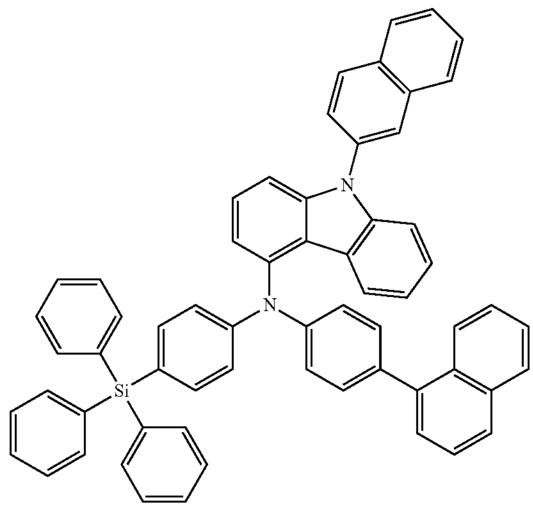
A43
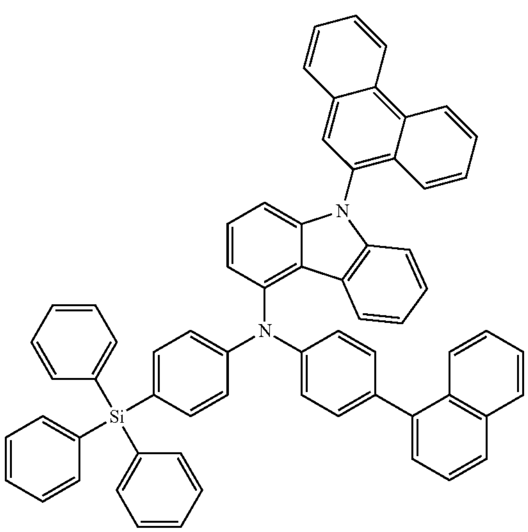
A44
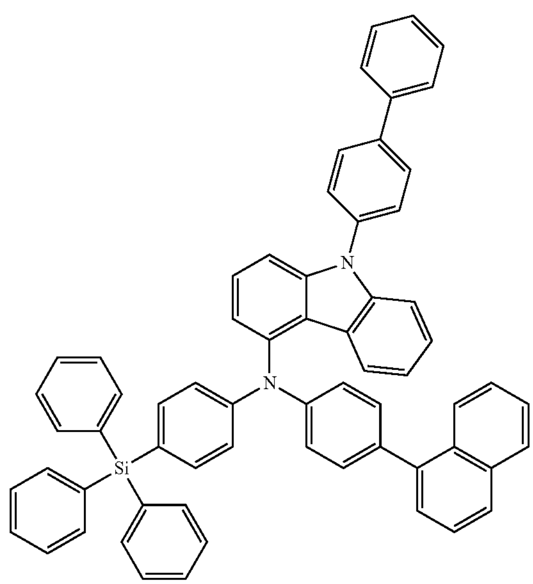

-continued
A45
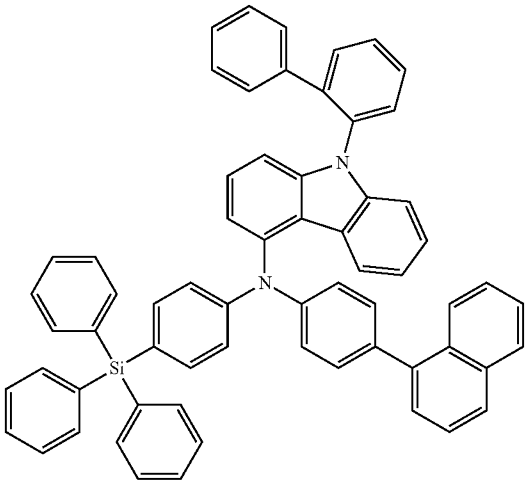
A46
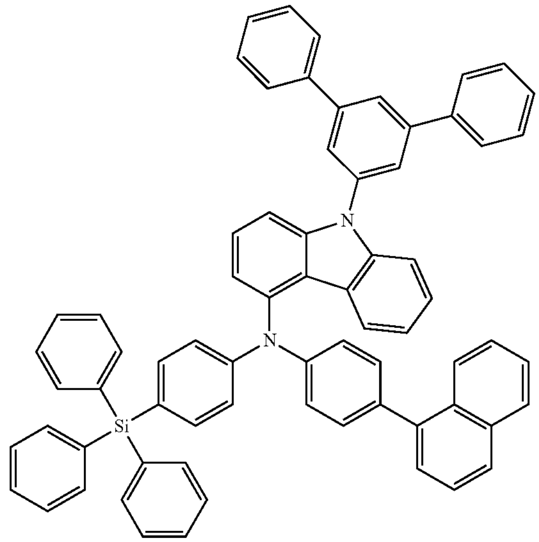
A47
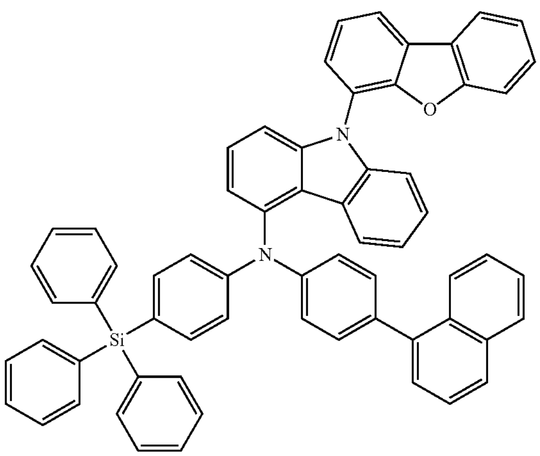
A48
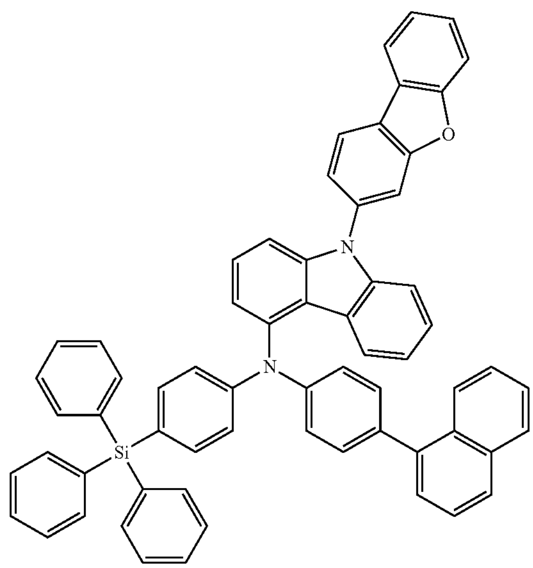
A49
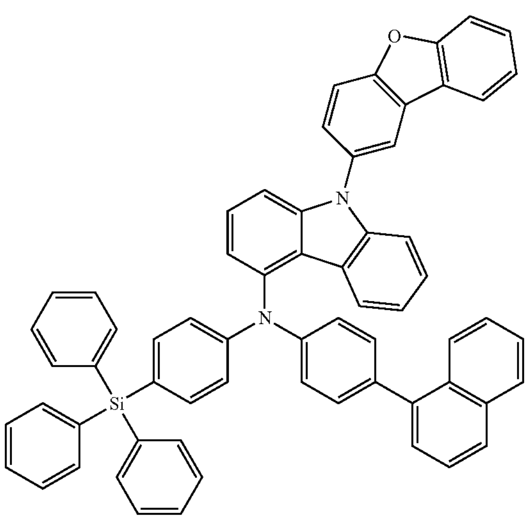
A50
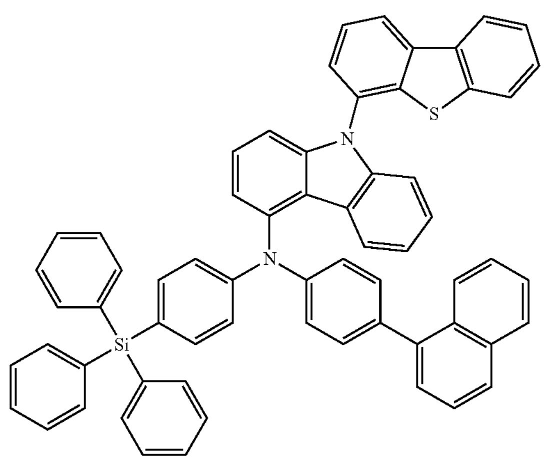

-continued
A51
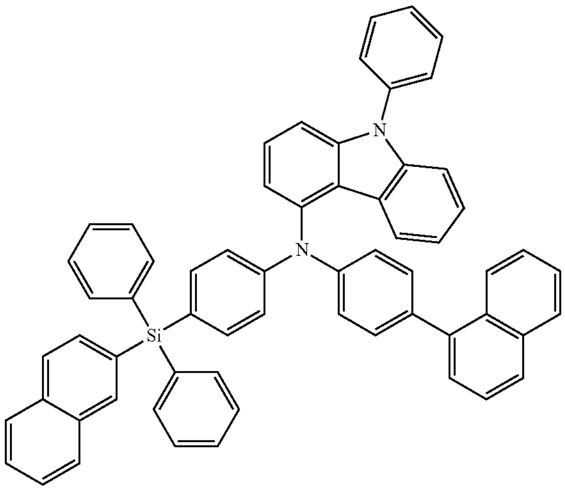
A52
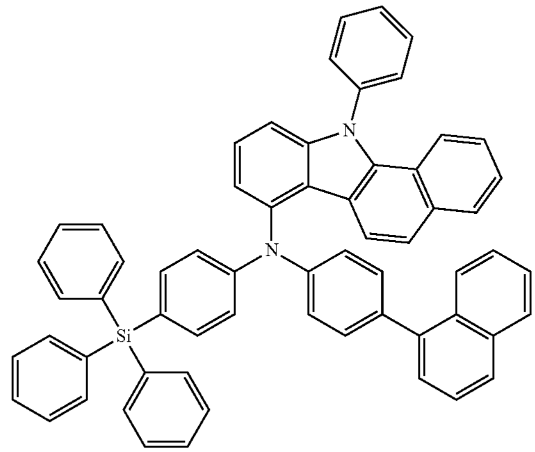
A53
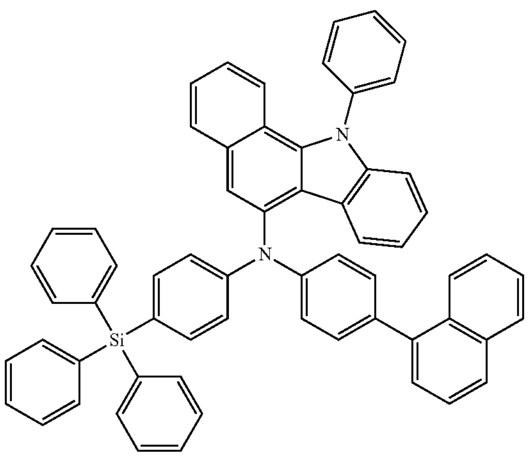
A54
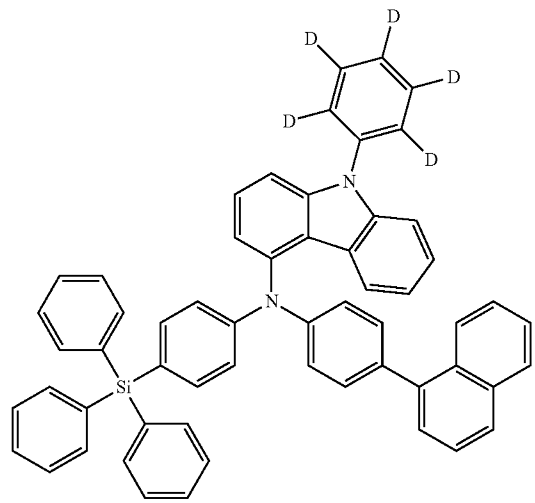
A55
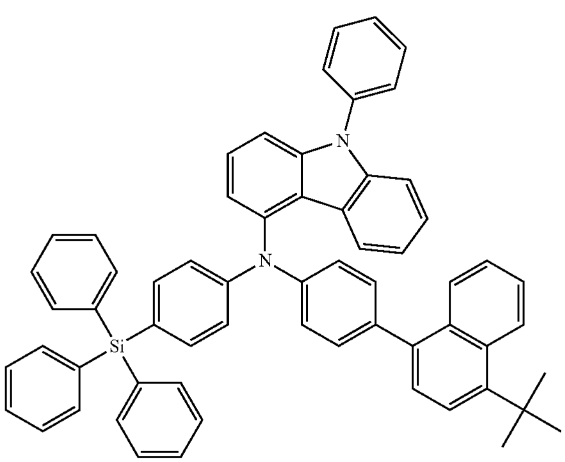
A56
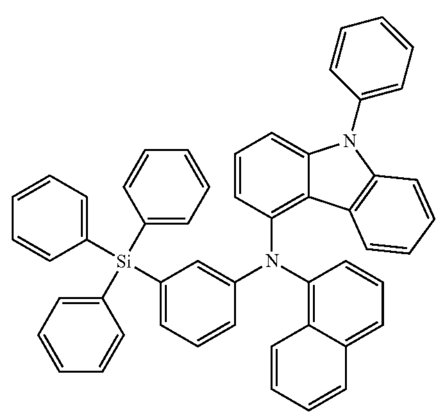

-continued
A57
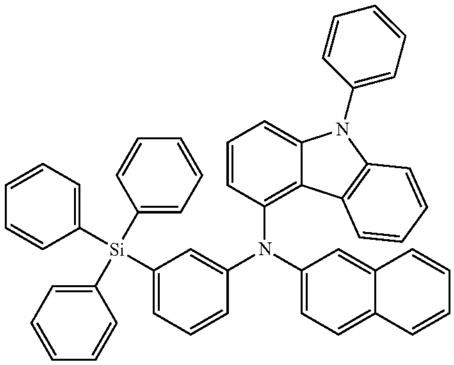
A58
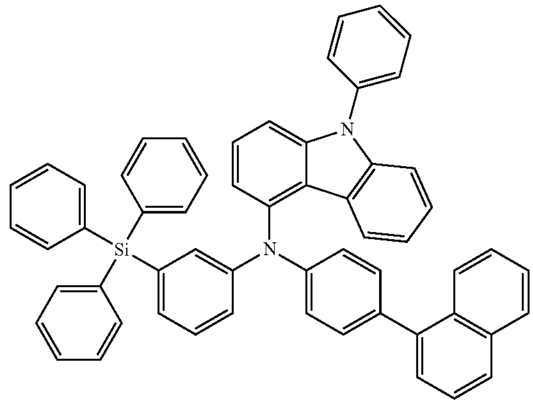
A59
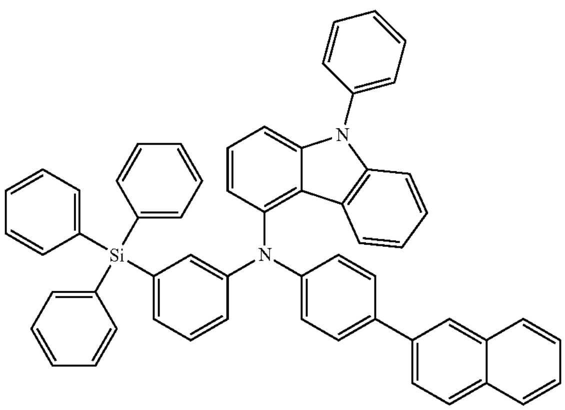
A60
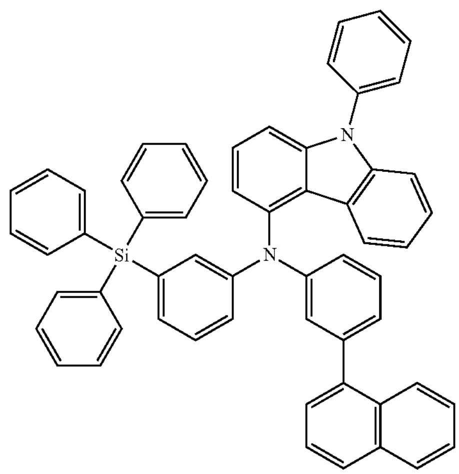
A61
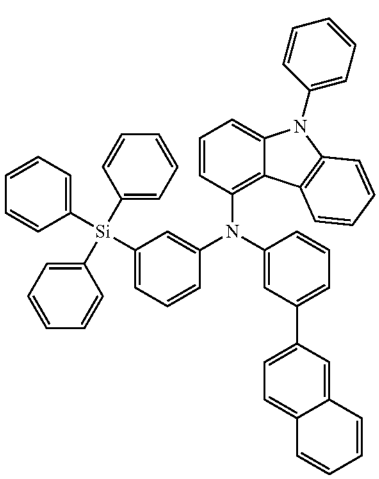
A62
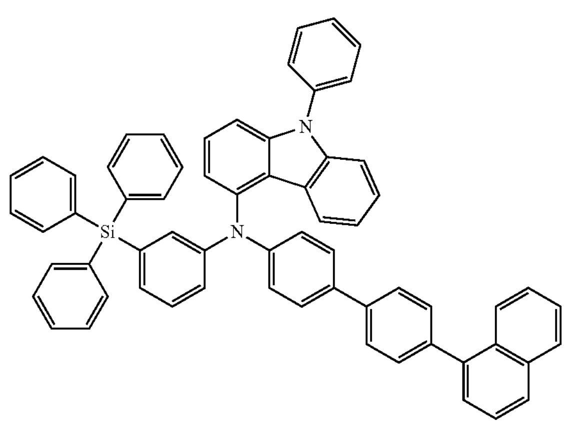

-continued
A63
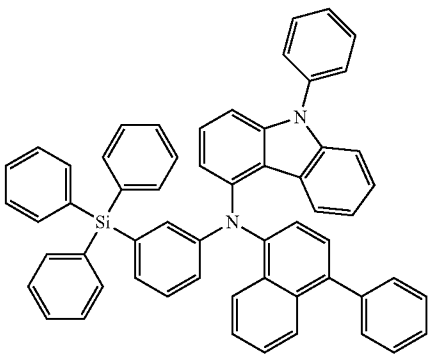
A64
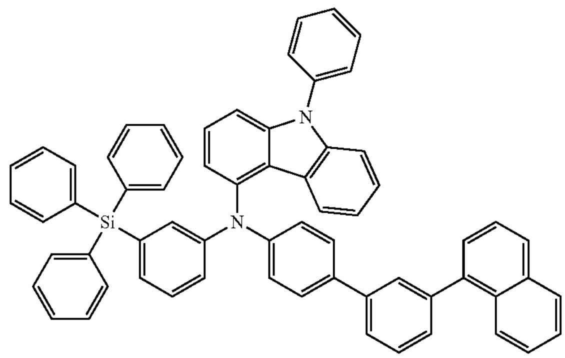
A65
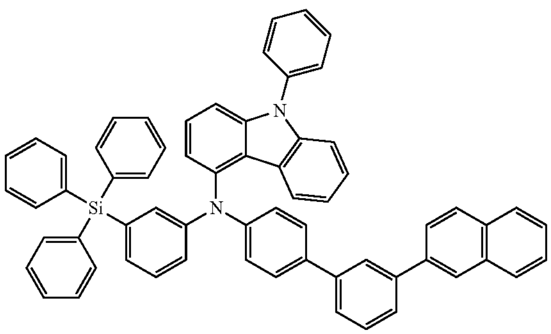
A66
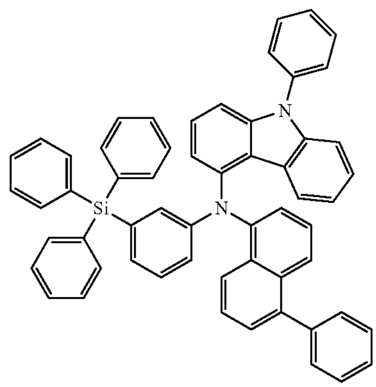
A67
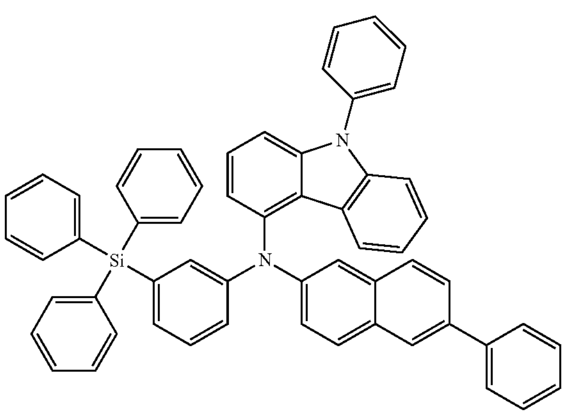
A68
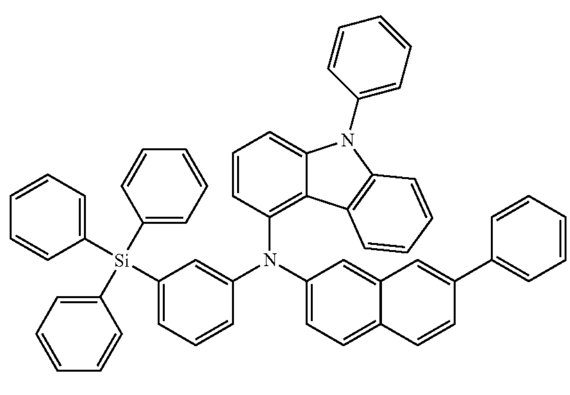

-continued
A69
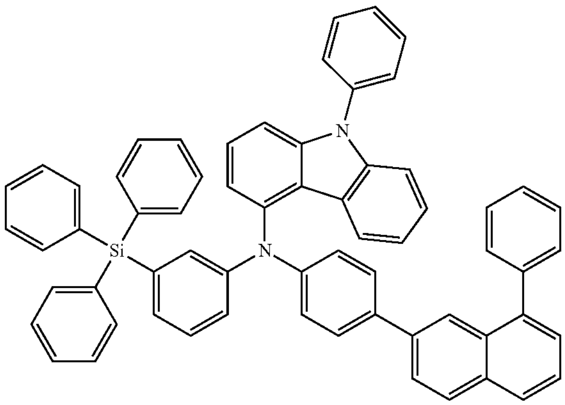
A70
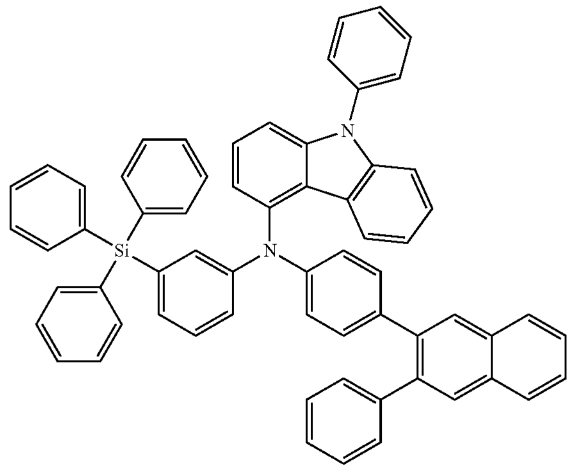
A71
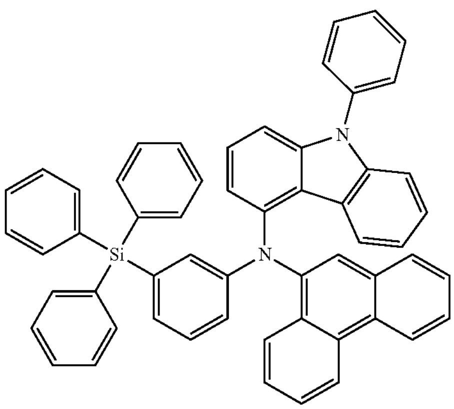
A72
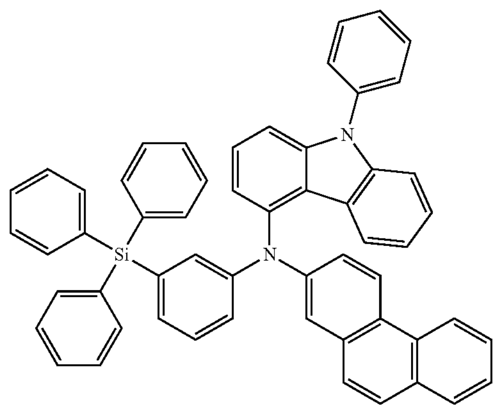
A73
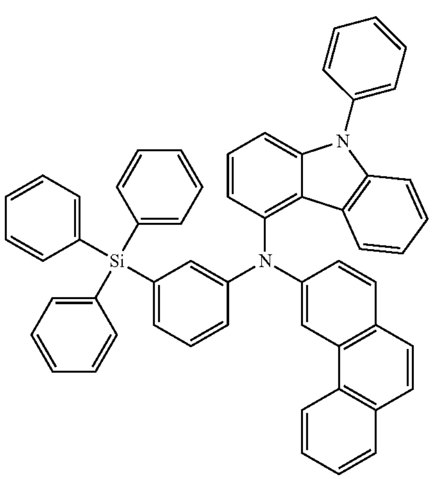
A74
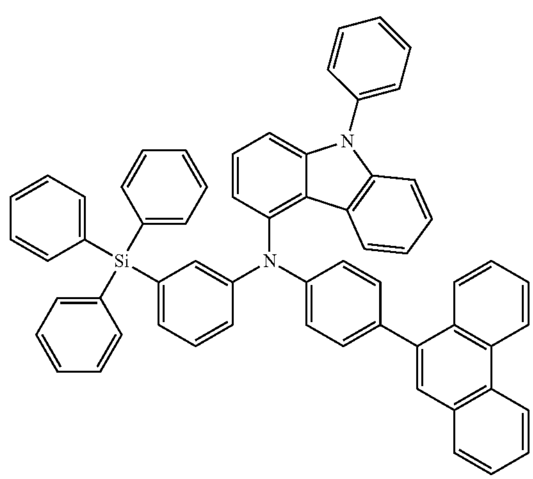

-continued
A75
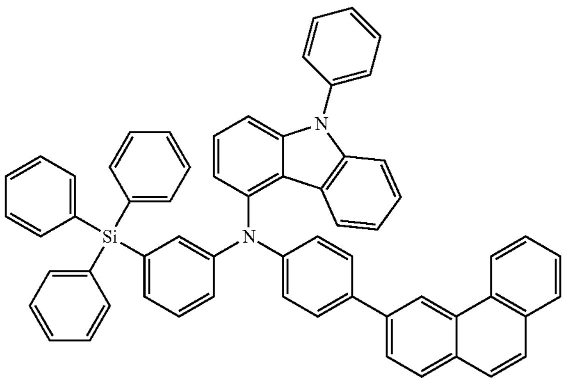
A76
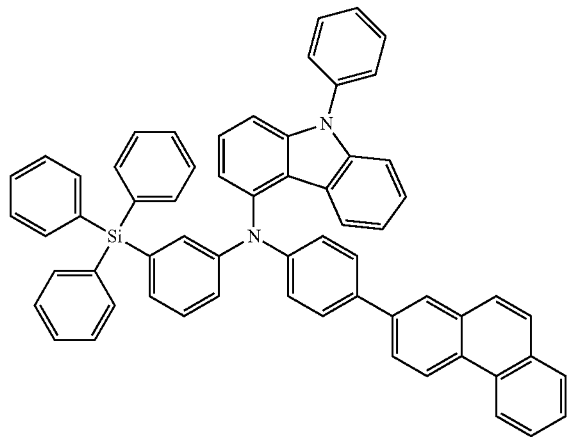
A77
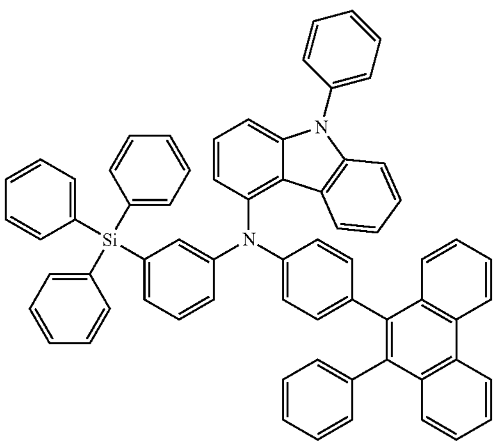
A78
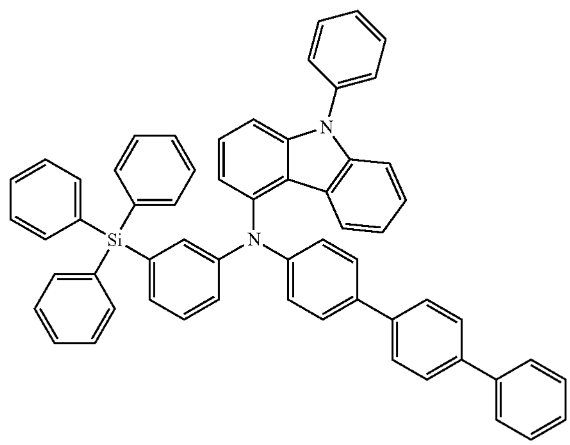
A79
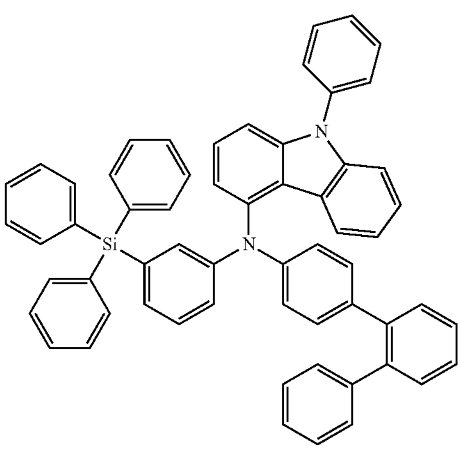
A80
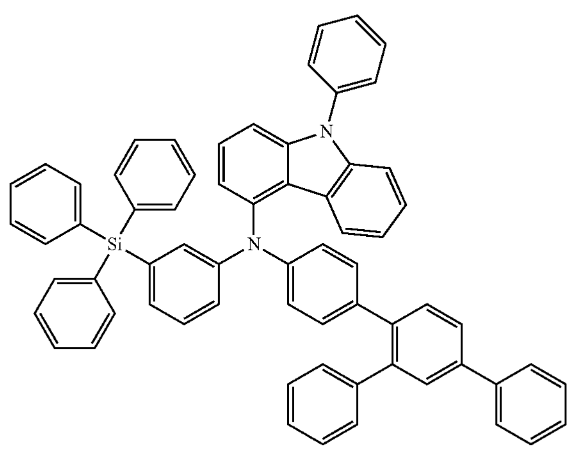

-continued
A81
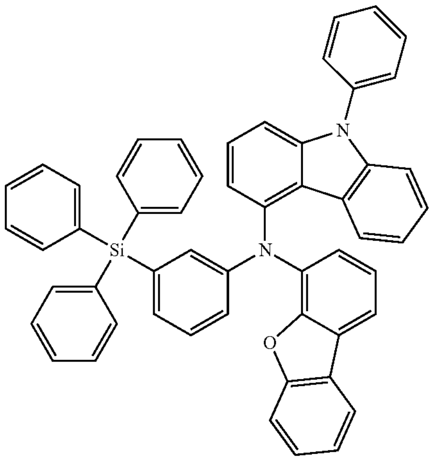
A82
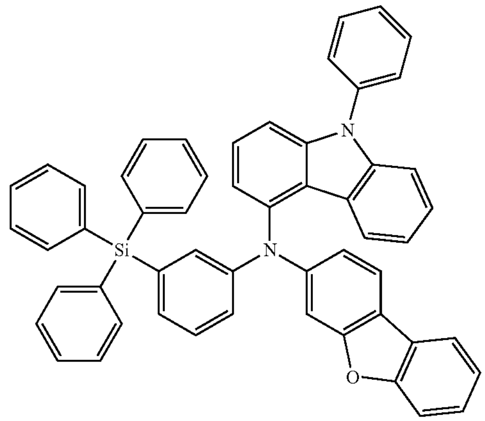
A83
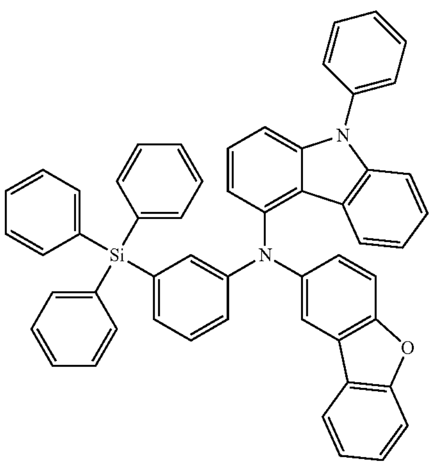
A84
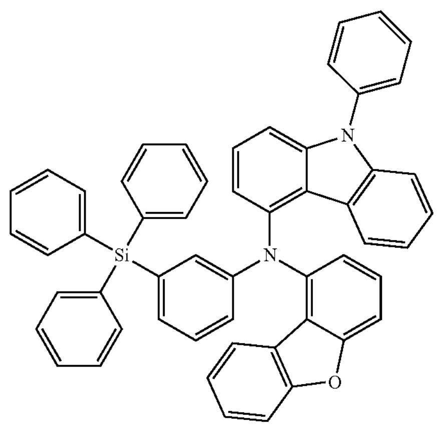
A85
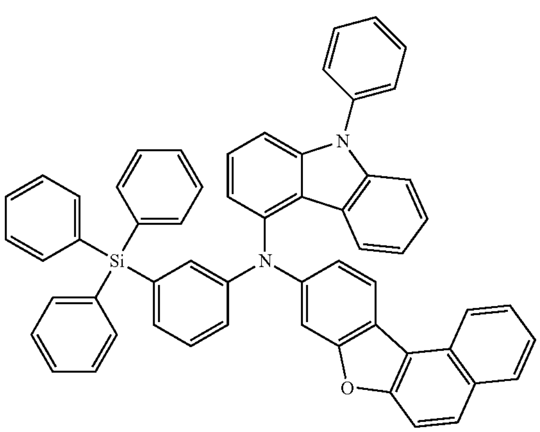
A86
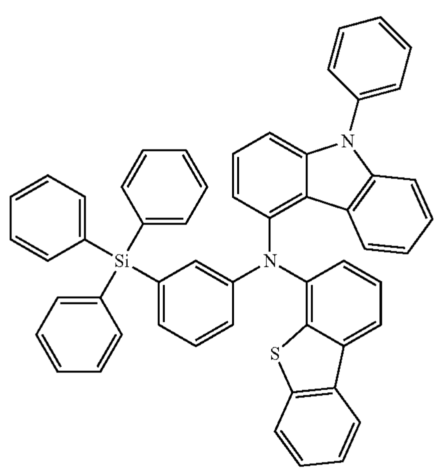

-continued
A87
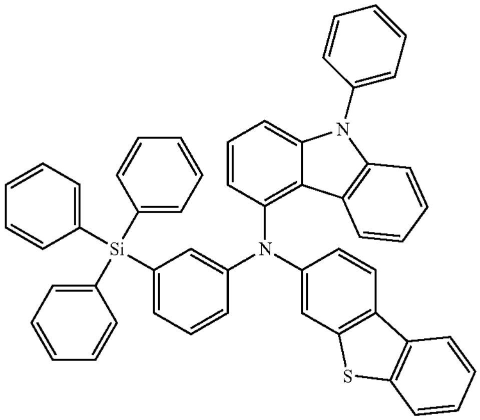
A88
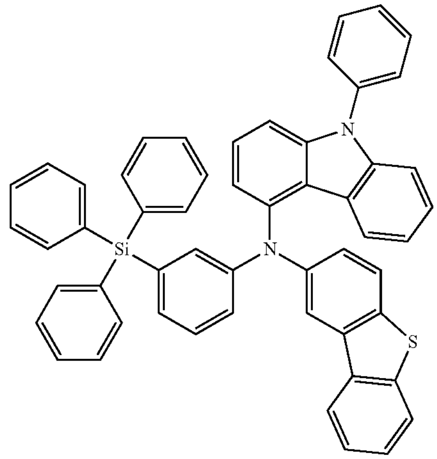
A89
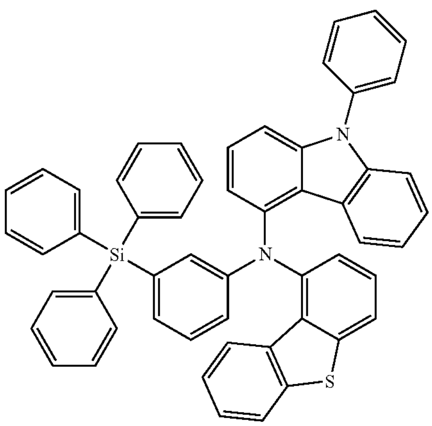
A90
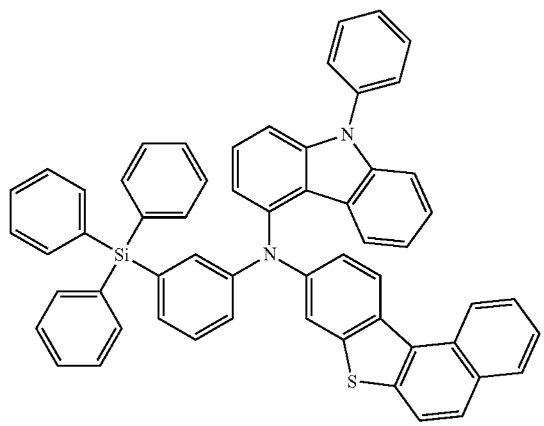
A91
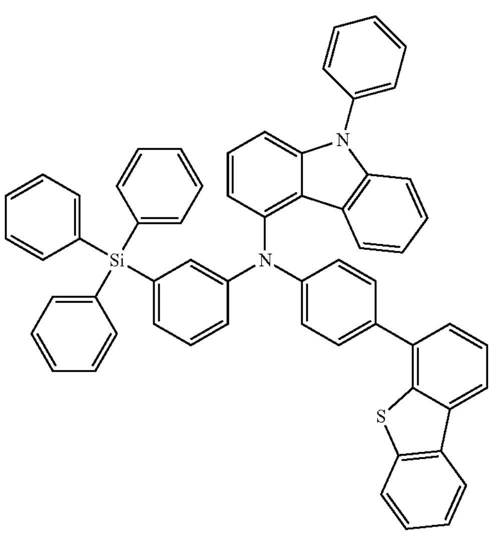
A92
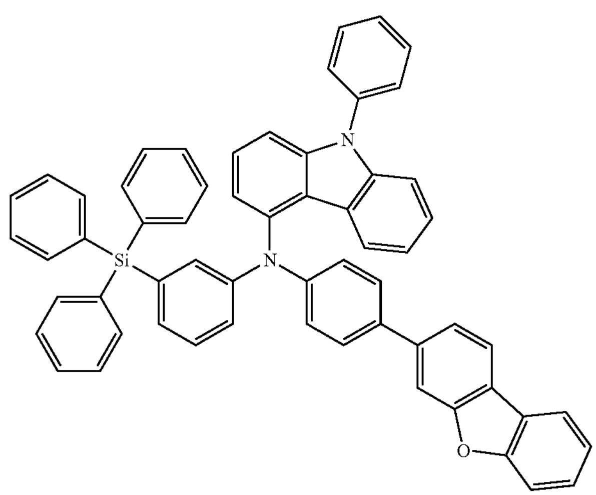

-continued
A93
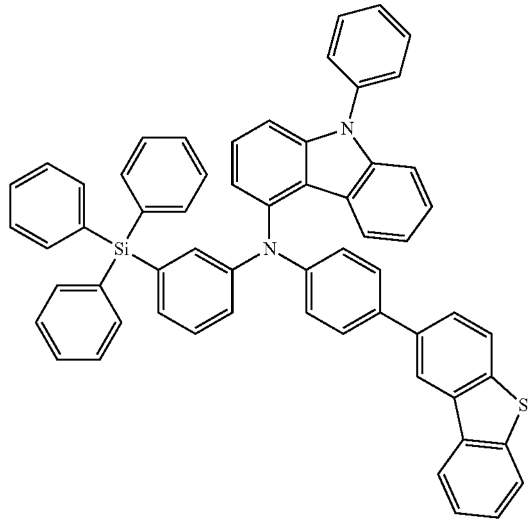
A94
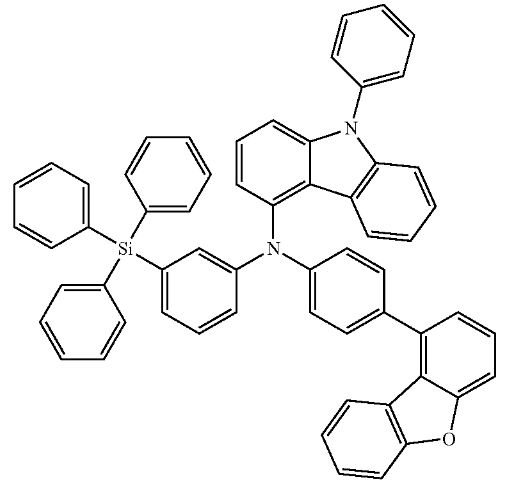
A95
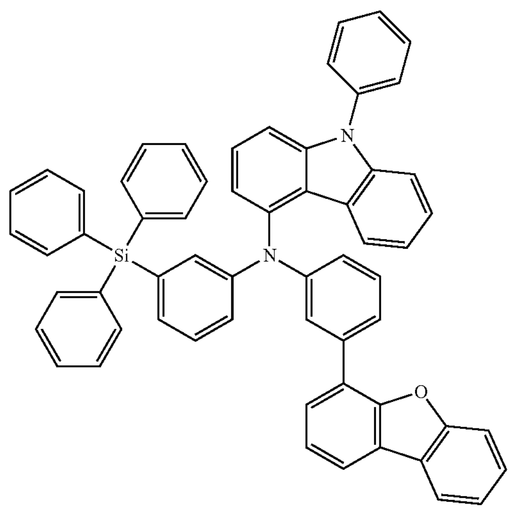
A96
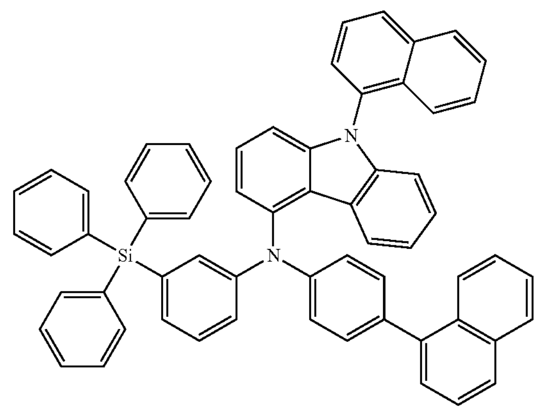
A97
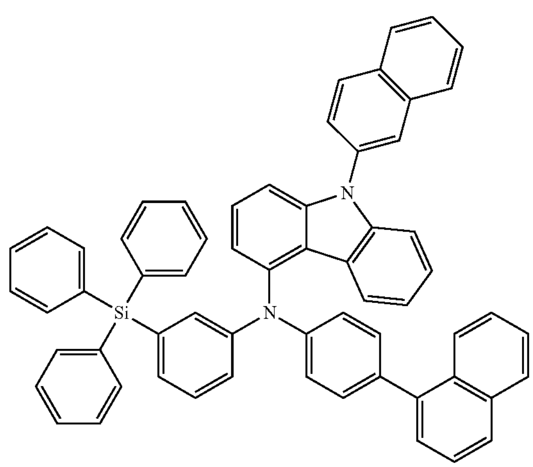
A98
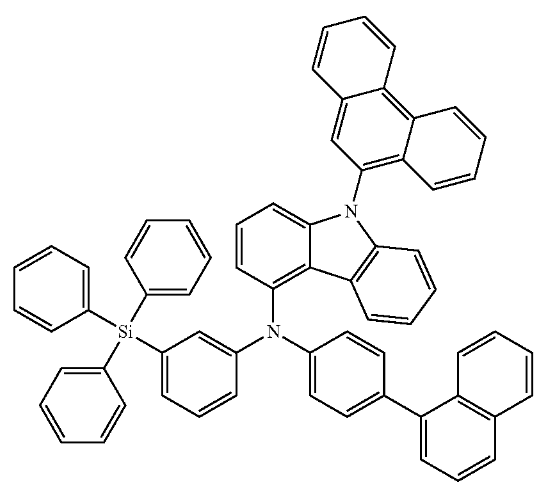

-continued
A99
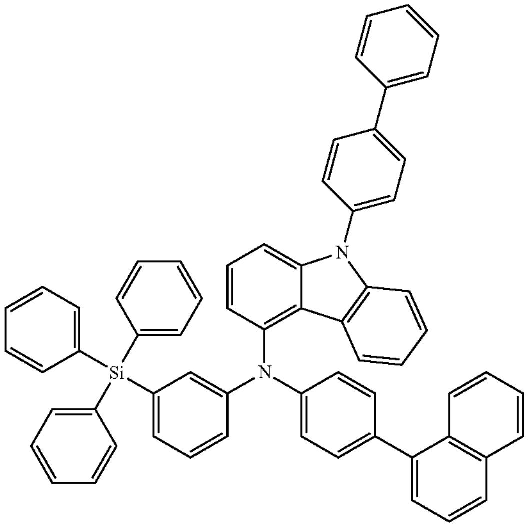
A100
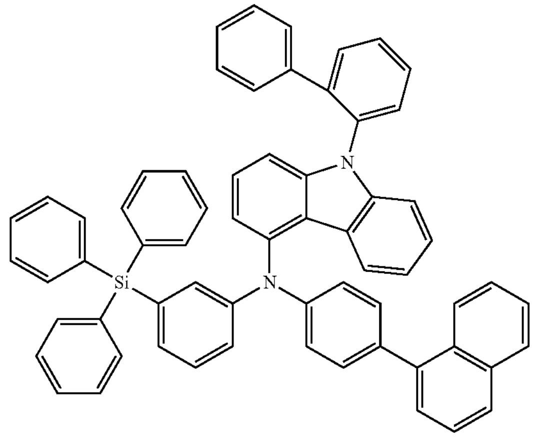
A101
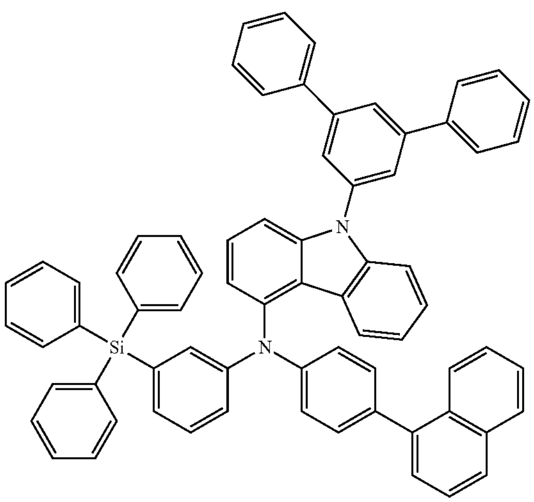
A102
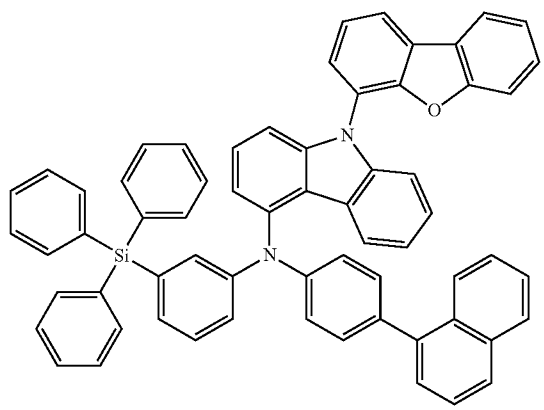
A103
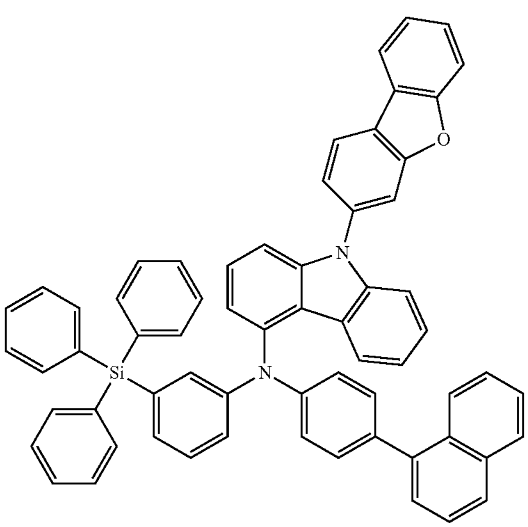
A103
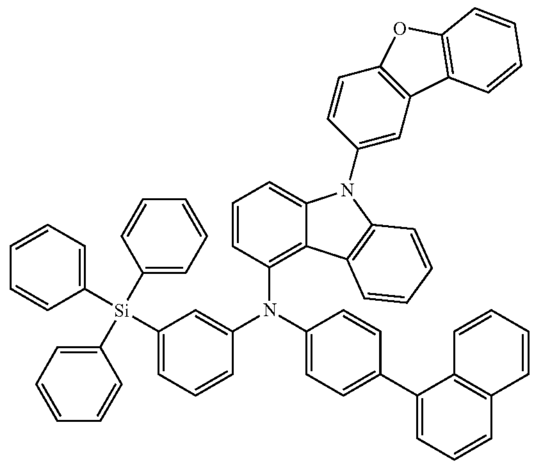

-continued
A105
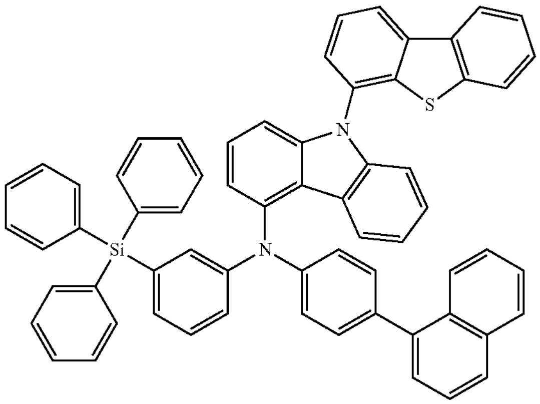
A106
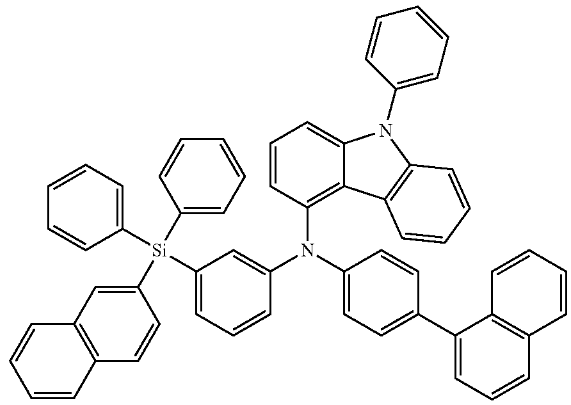
A107
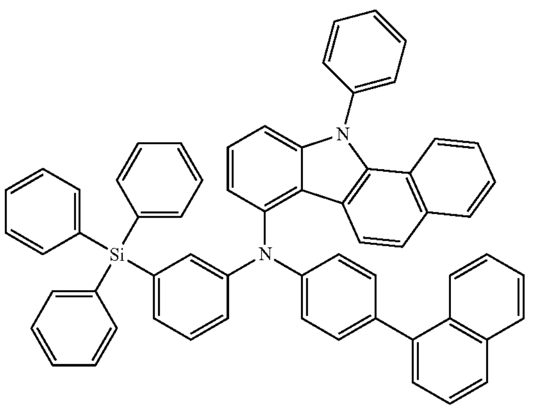
A108
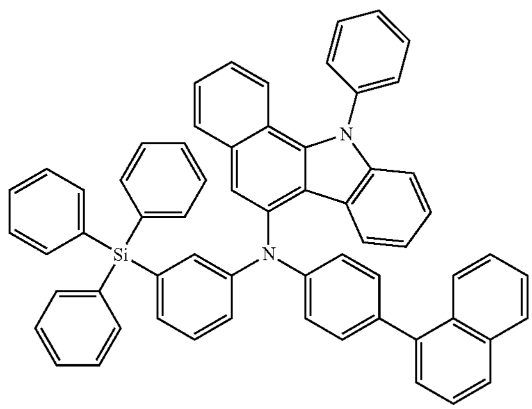
A109
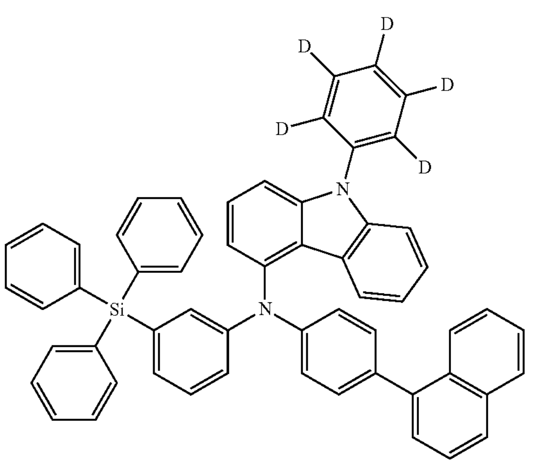
A110
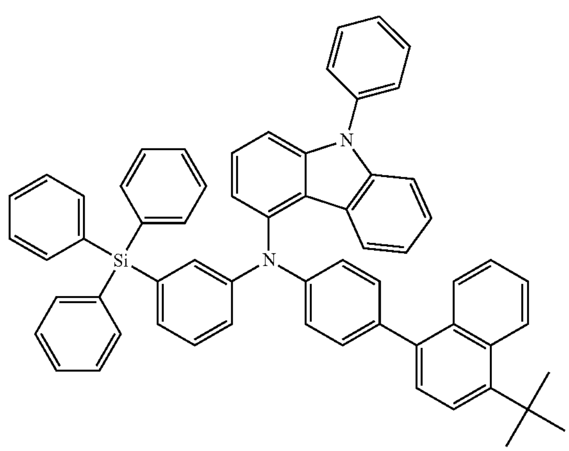

-continued
A111
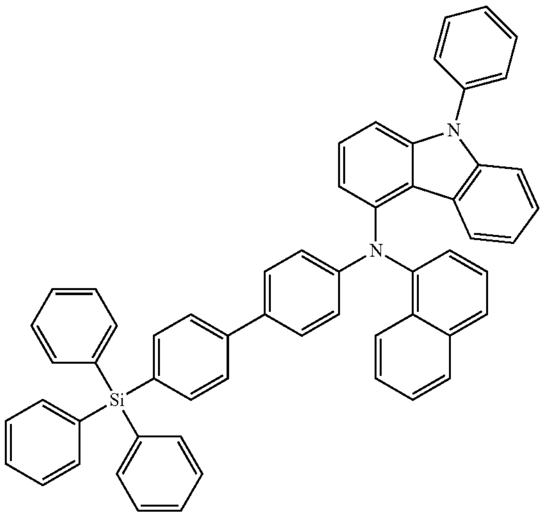
A112
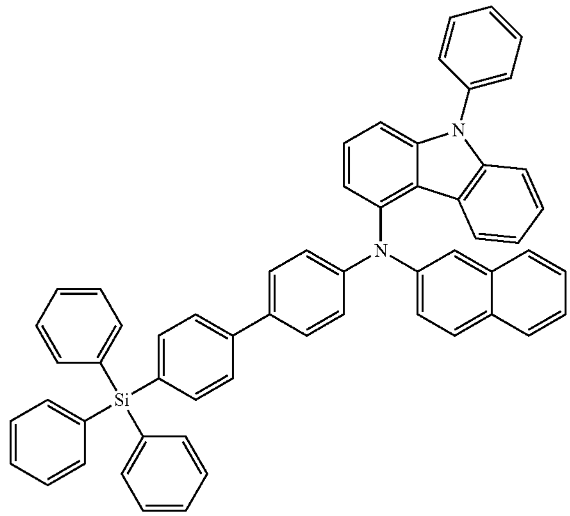
A113
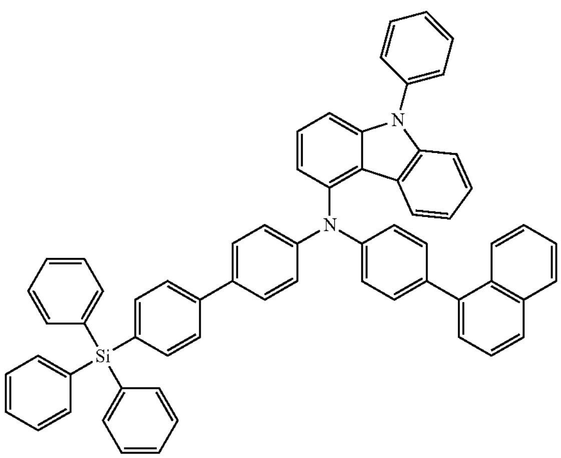
A114
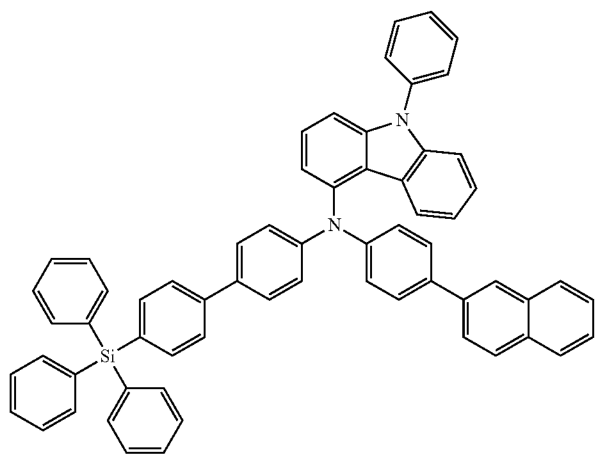
A115
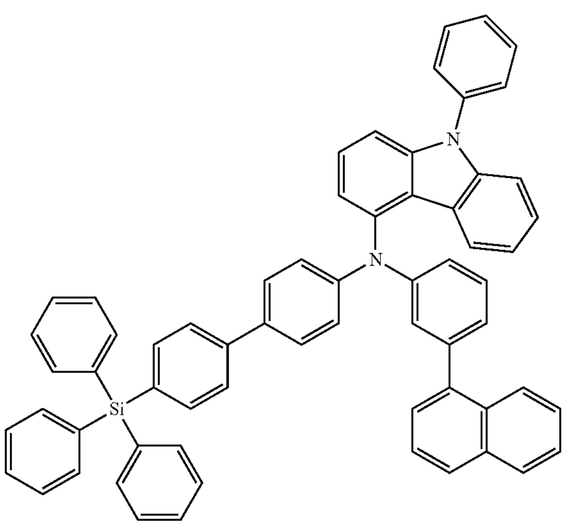
A116
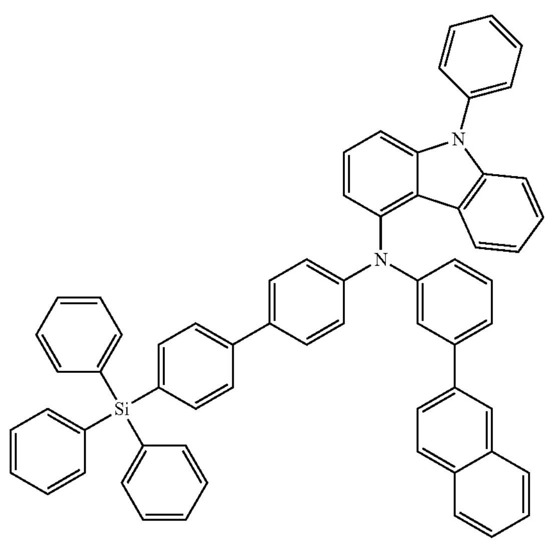

-continued
A117
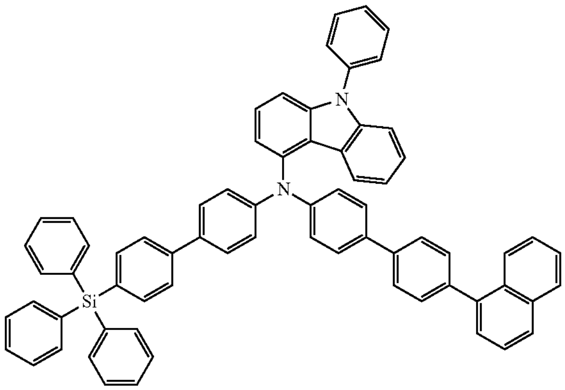
A118
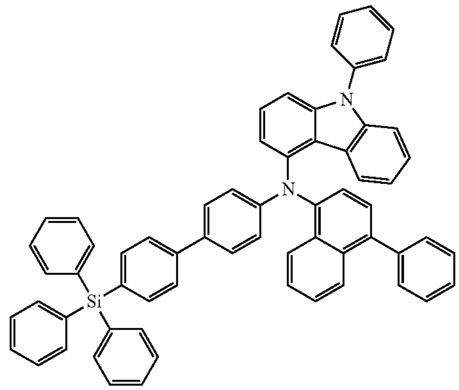
A119
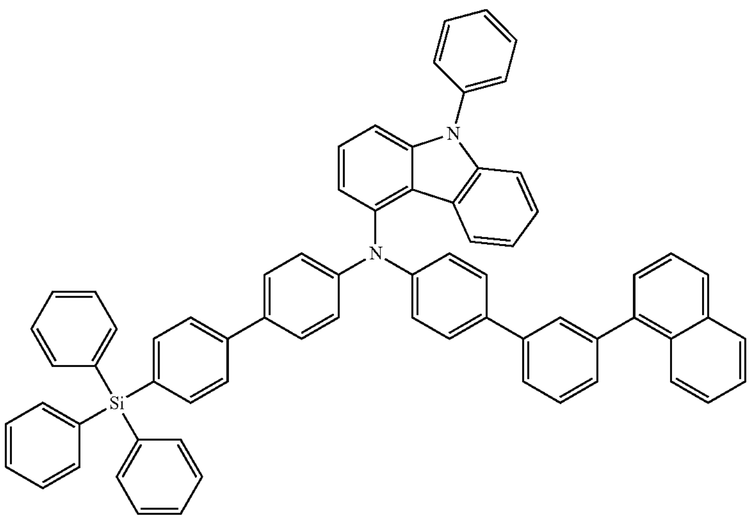
A120
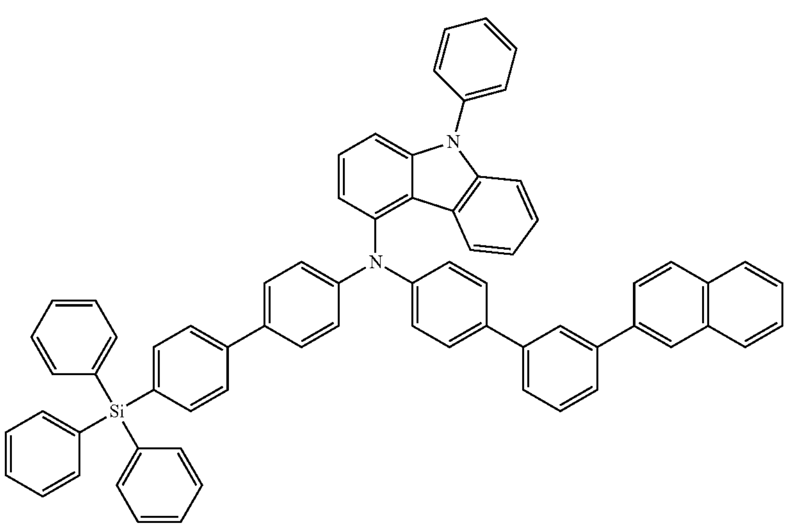

-continued
A121
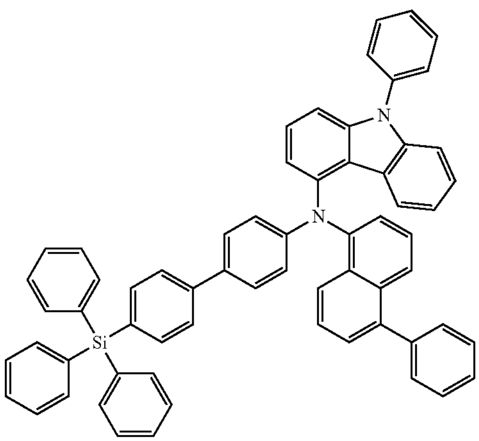
A122
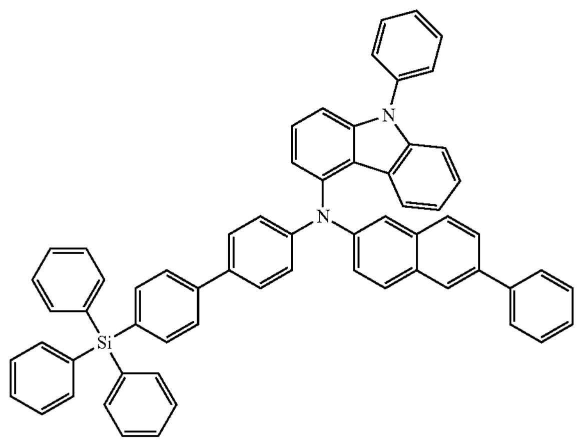
A123
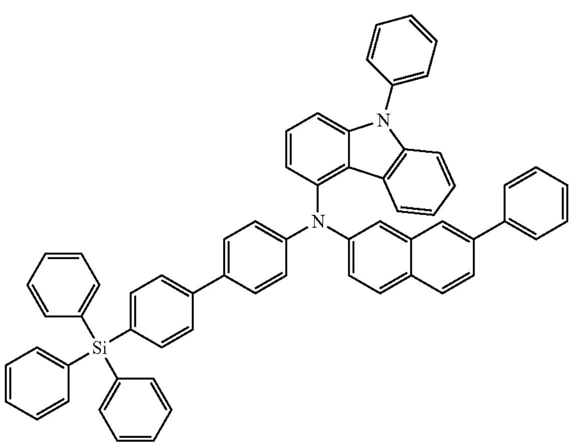
A124
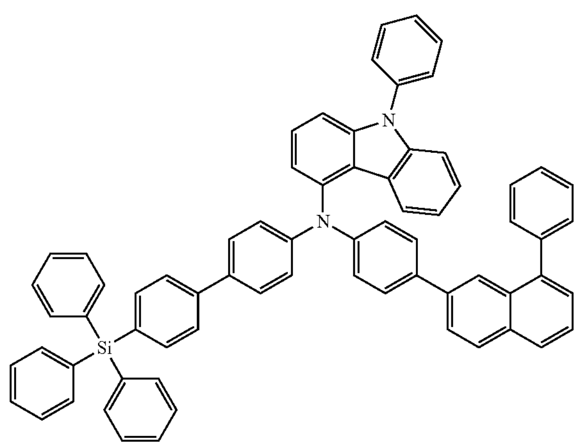
A125
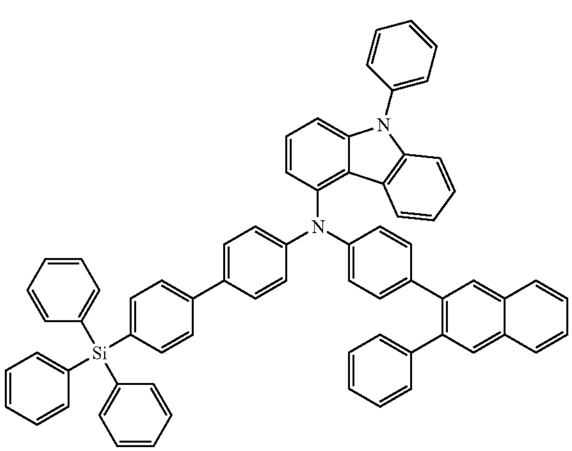
A126
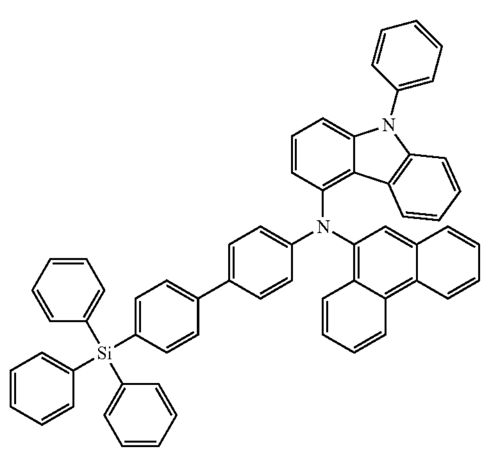

-continued
A127
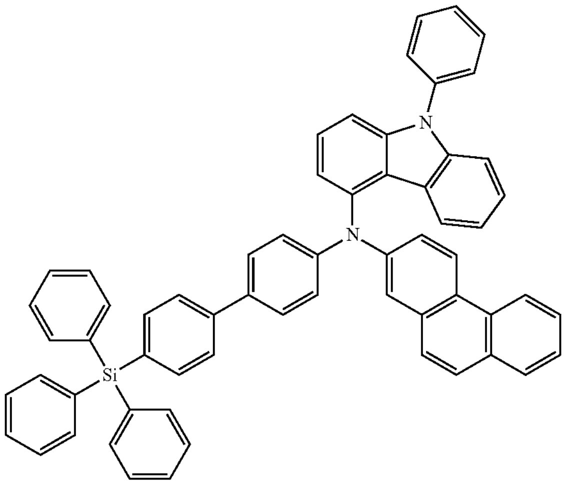
A128
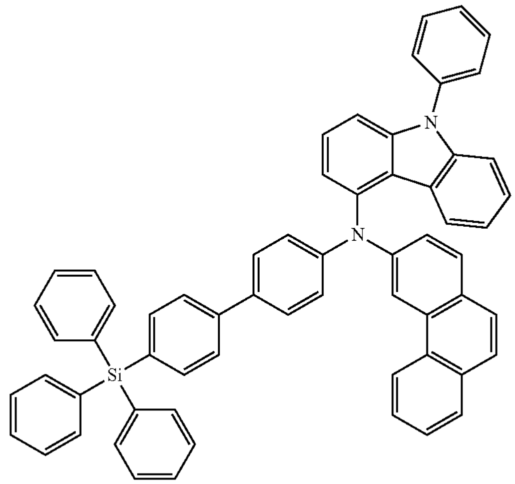
A129
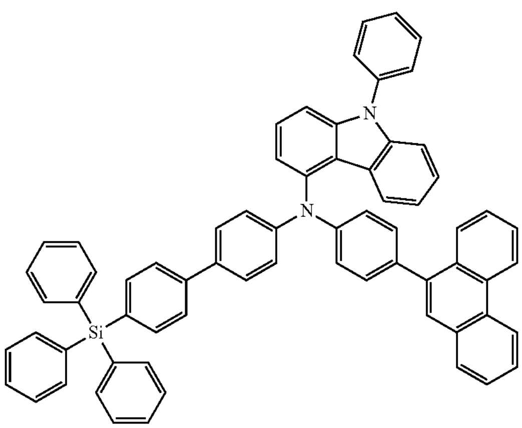
A130
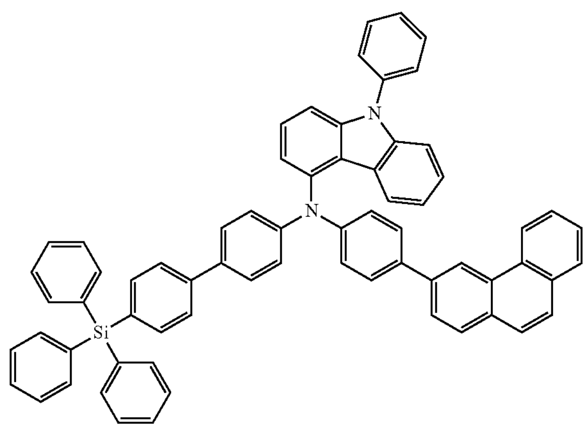
A131
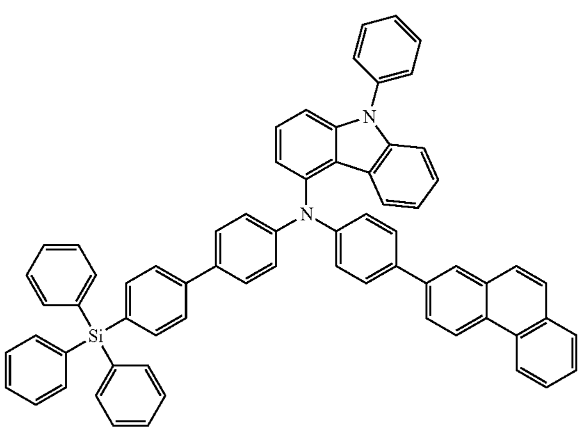
A132
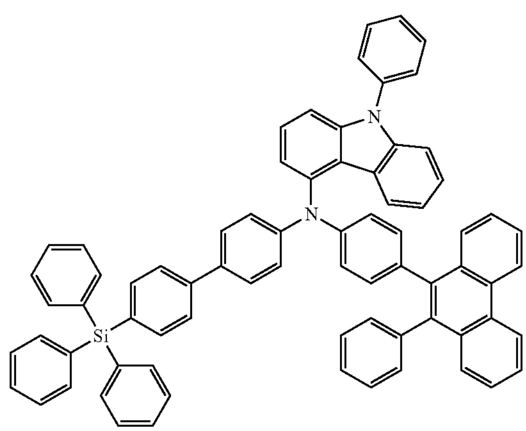

-continued
A133
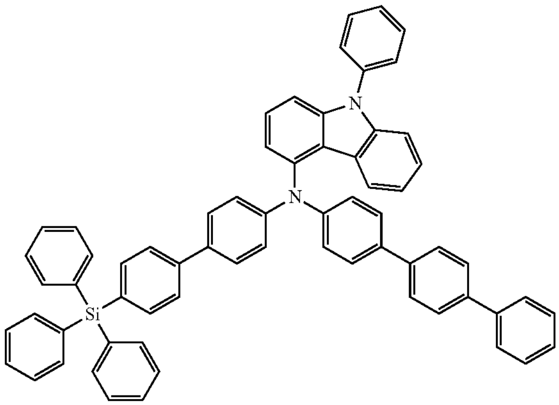
A134
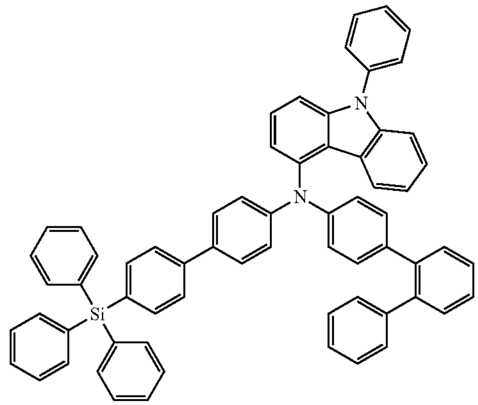
A135
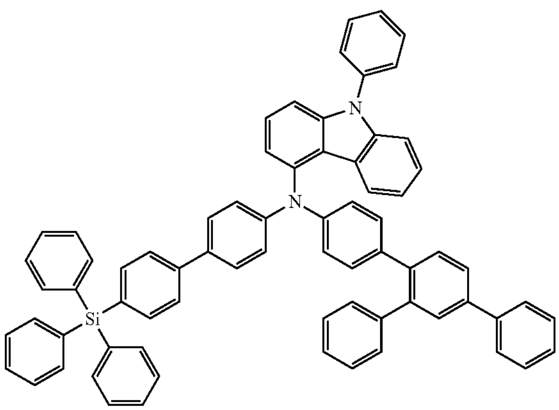
A136
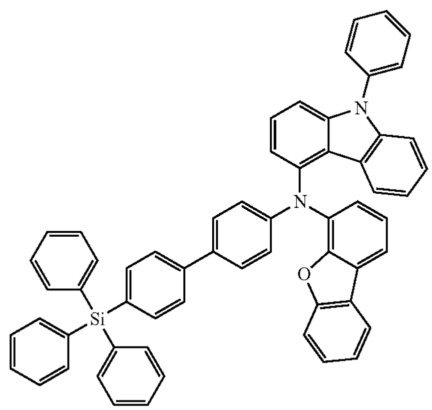
A137
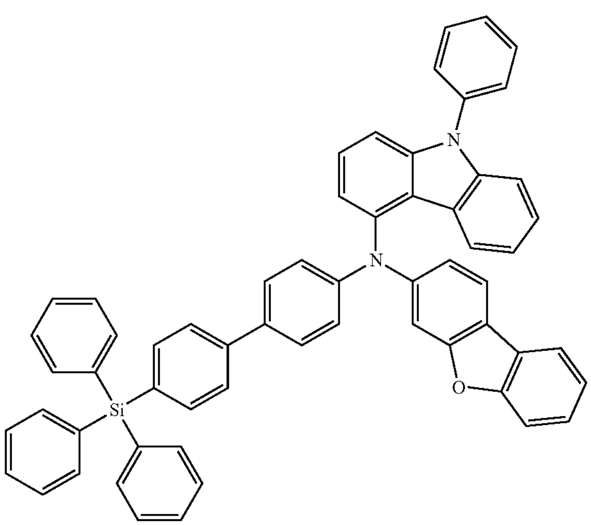
A138
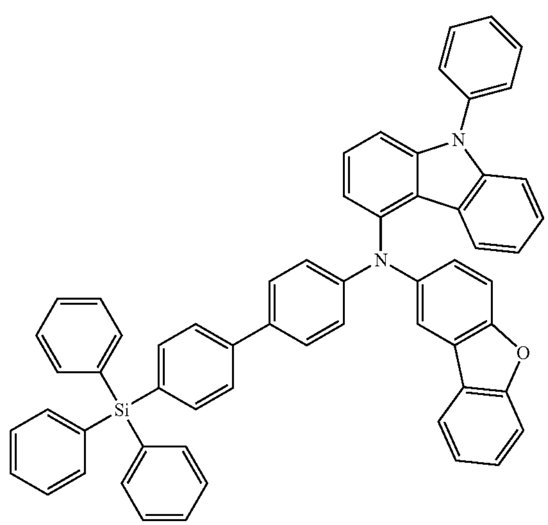

-continued
A139
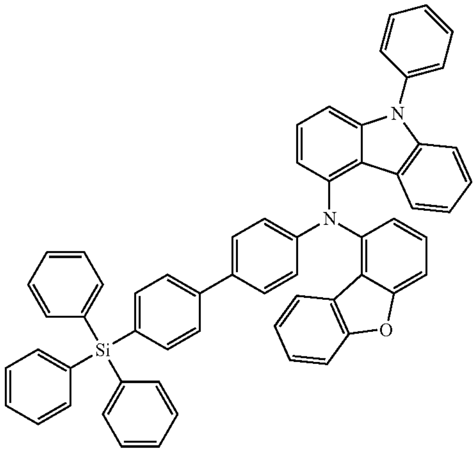
A140
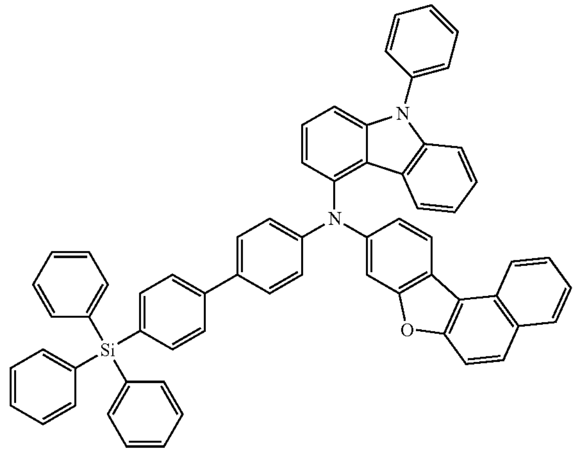
A141
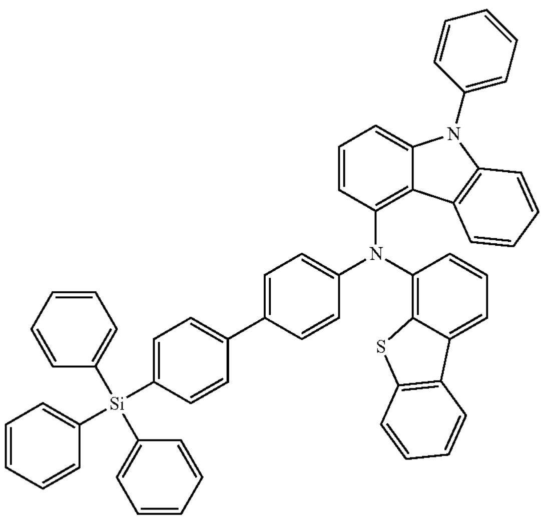
A142
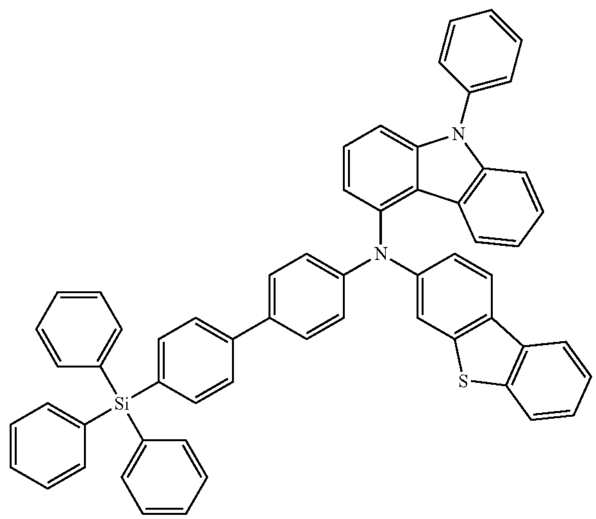
A143
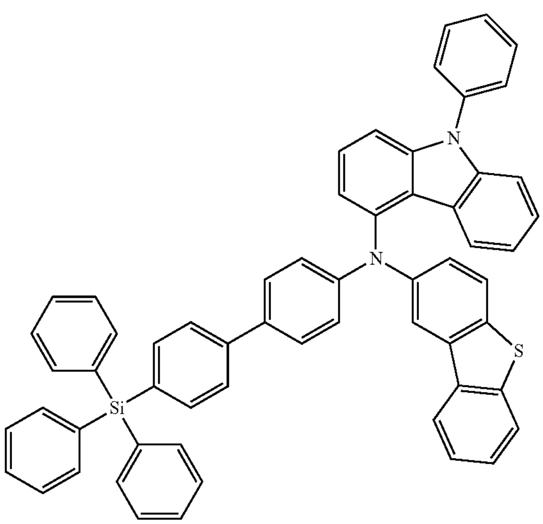
A144
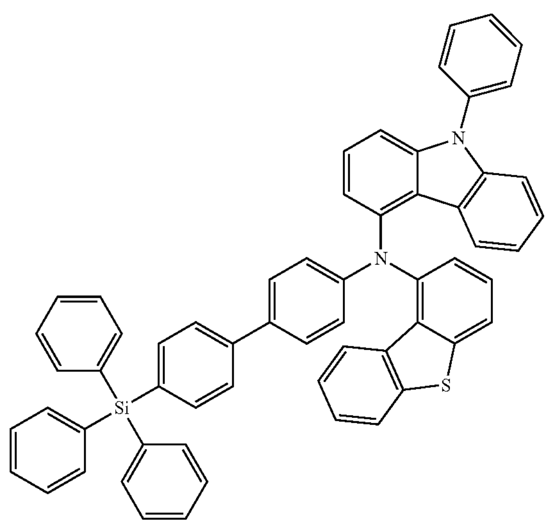

-continued
A145
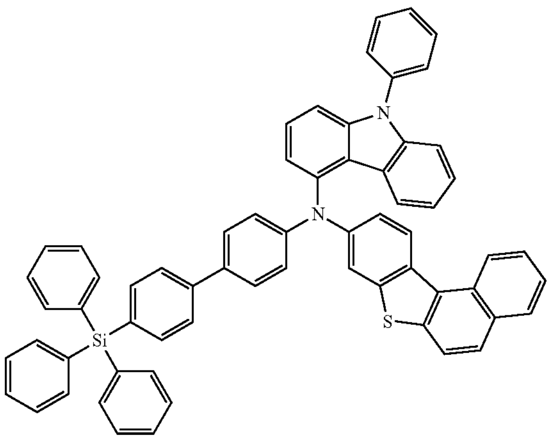
A146
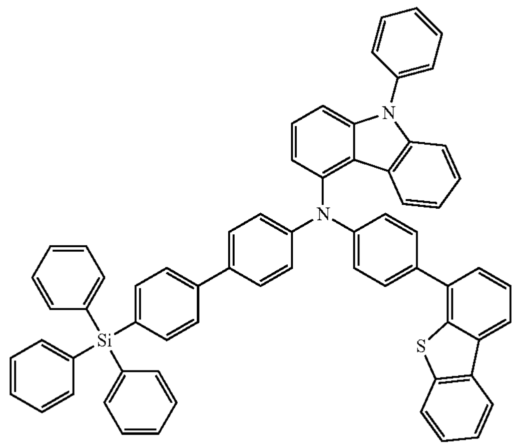
A147
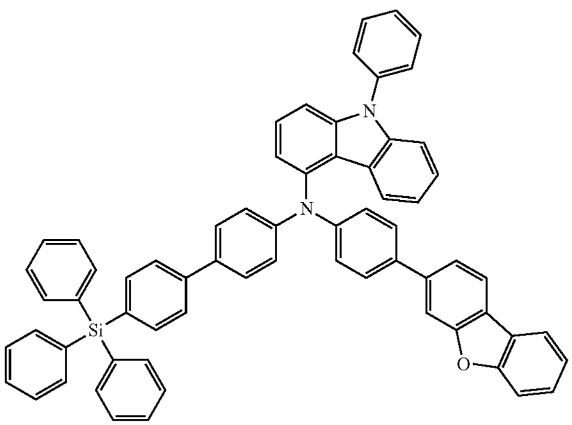
A148
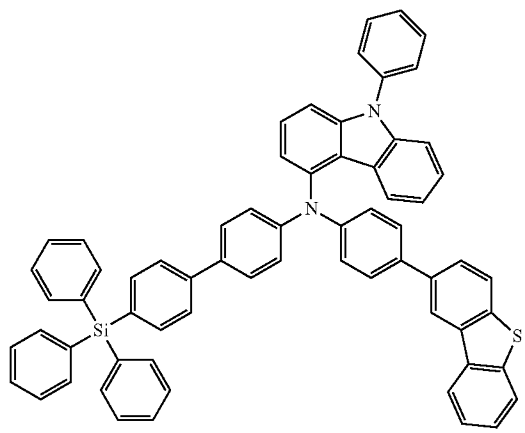
A149
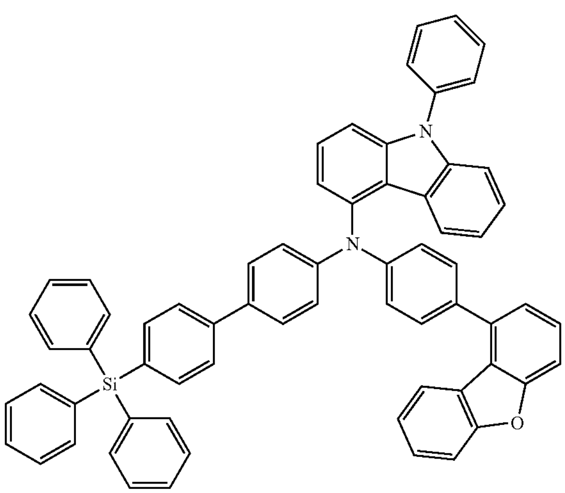
A150
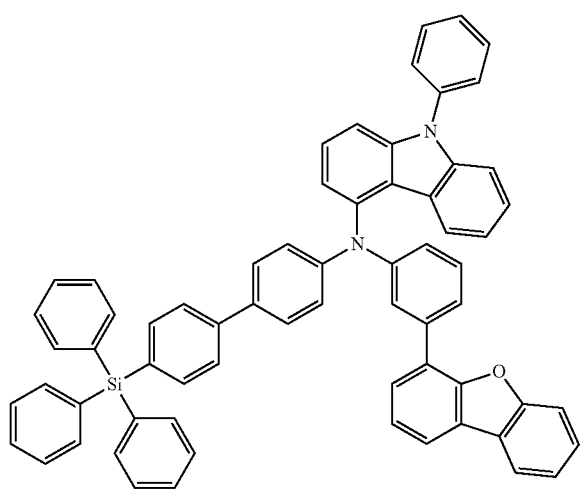

-continued
A151
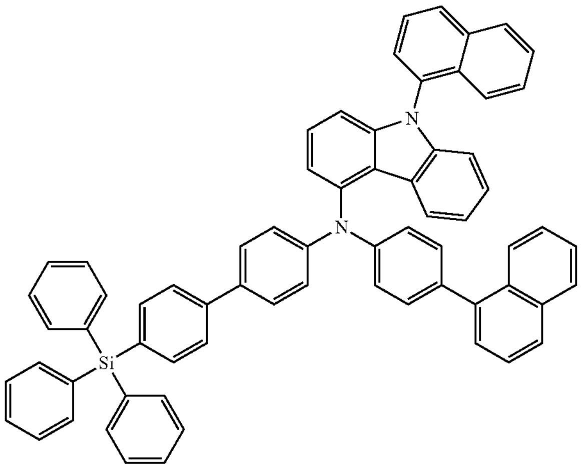
A152
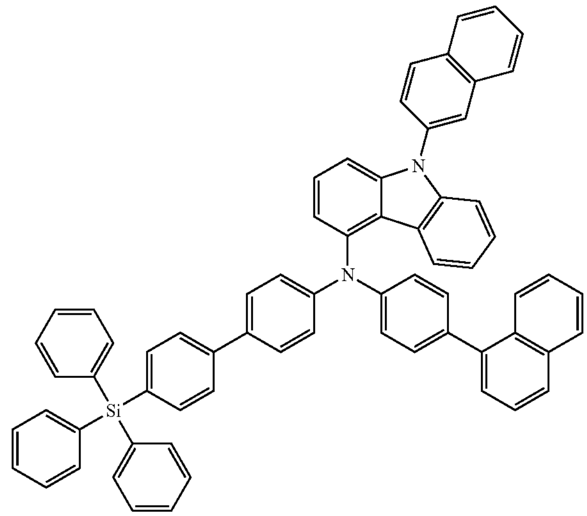
A153
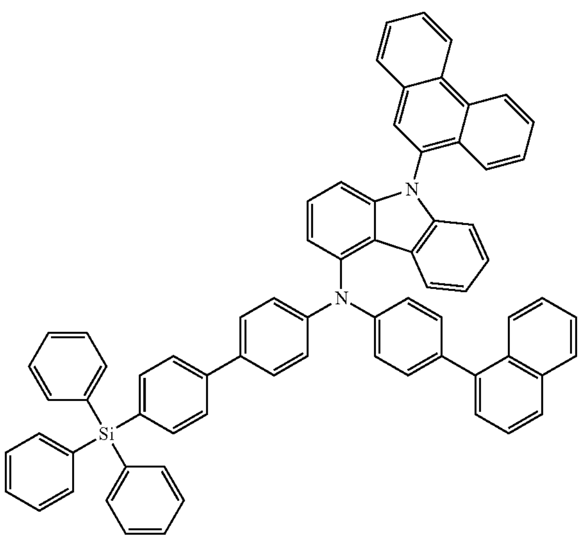
A154
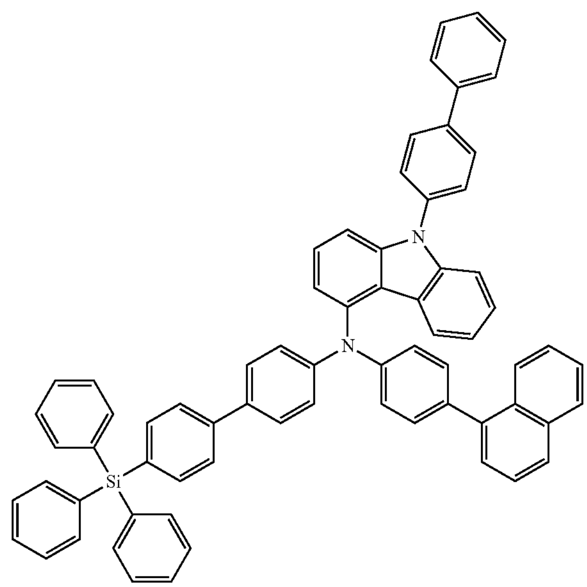
A155
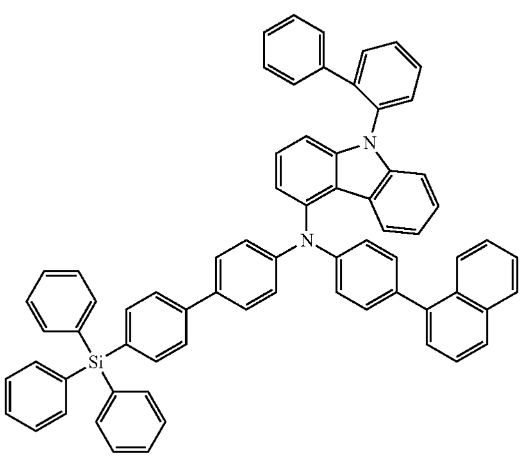
A156
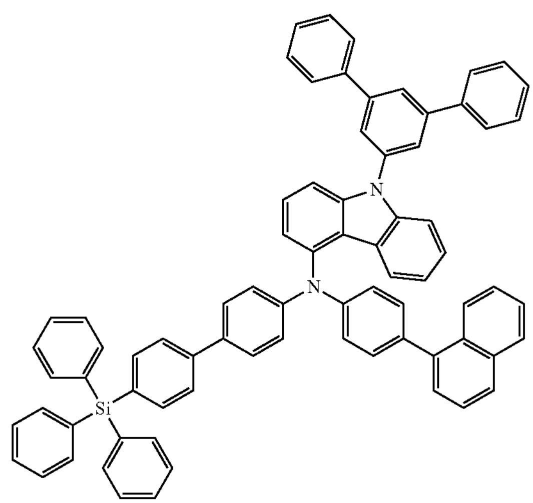

-continued
A157
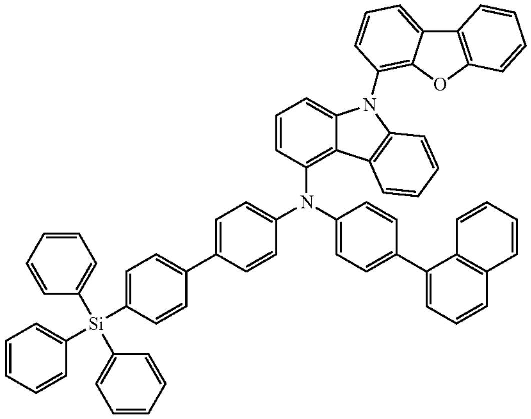
A158
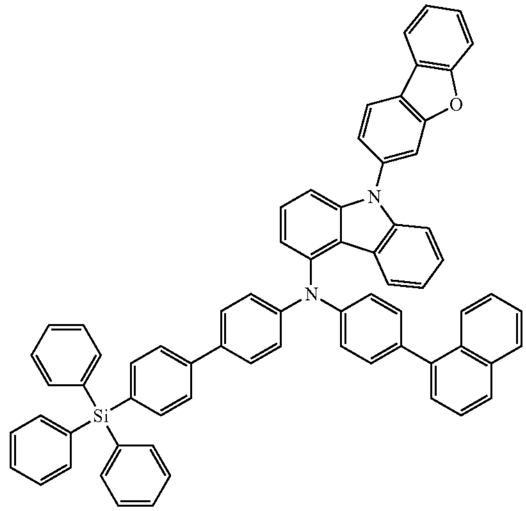
A159
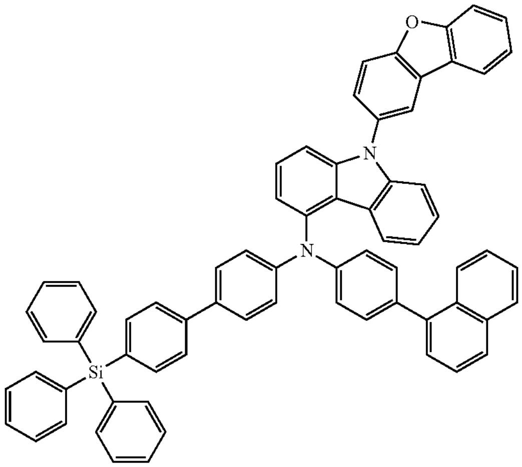
A160
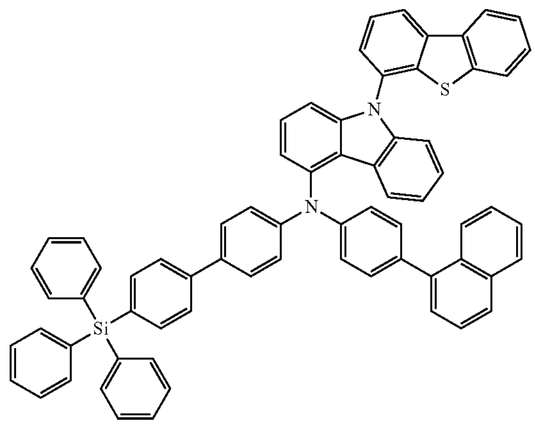
A161
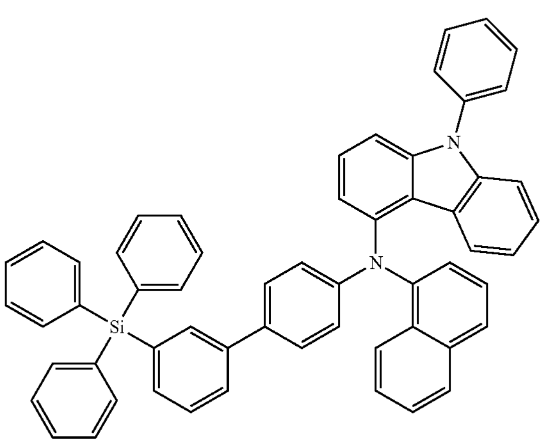
A162
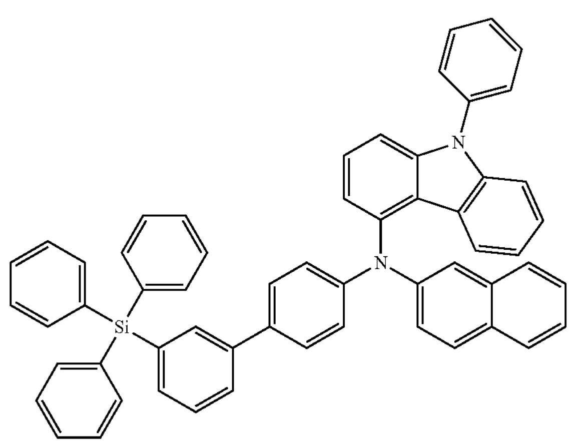

-continued
A163
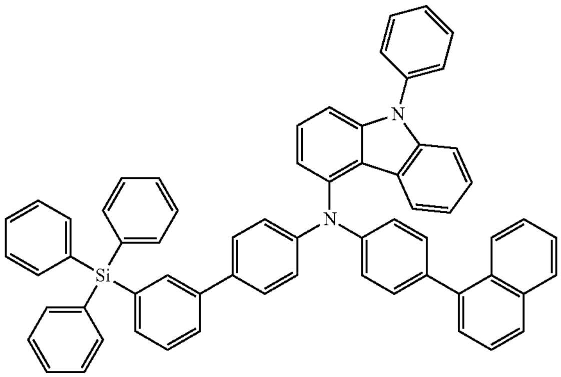
A164
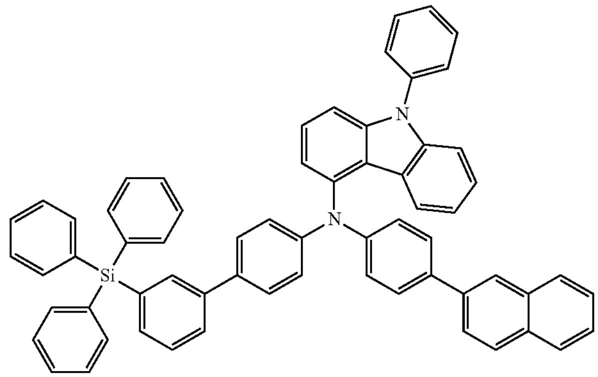
A165
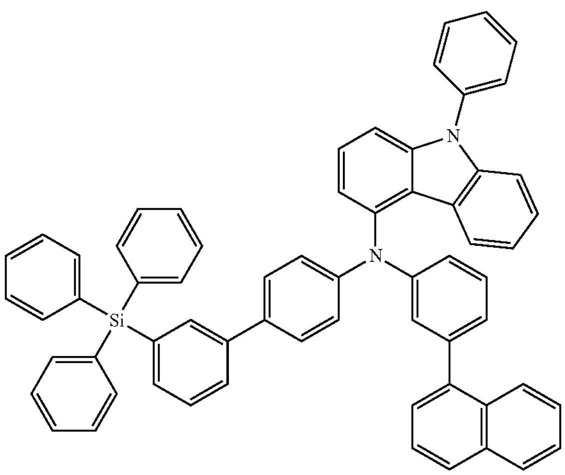
A166
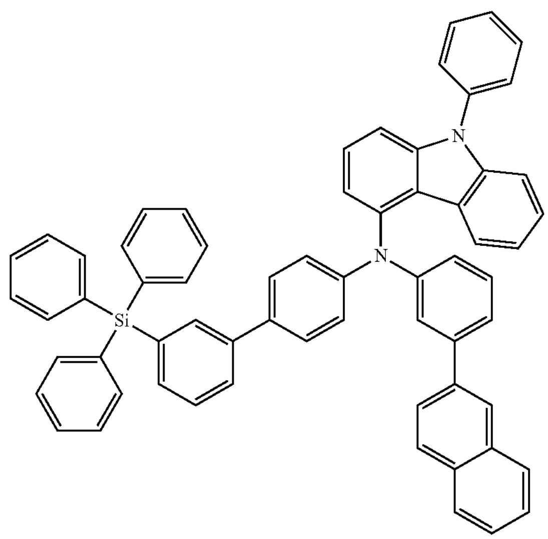
A167
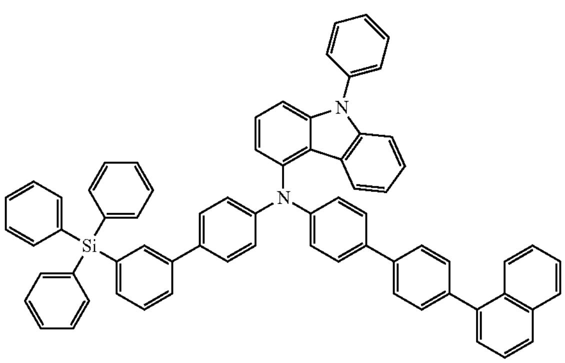
A168
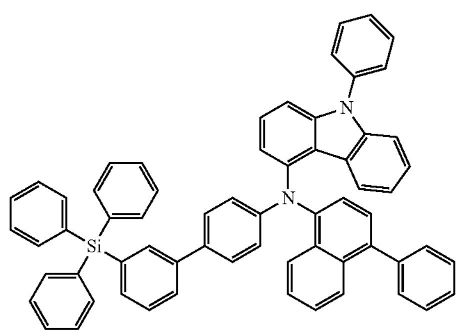

-continued
A169
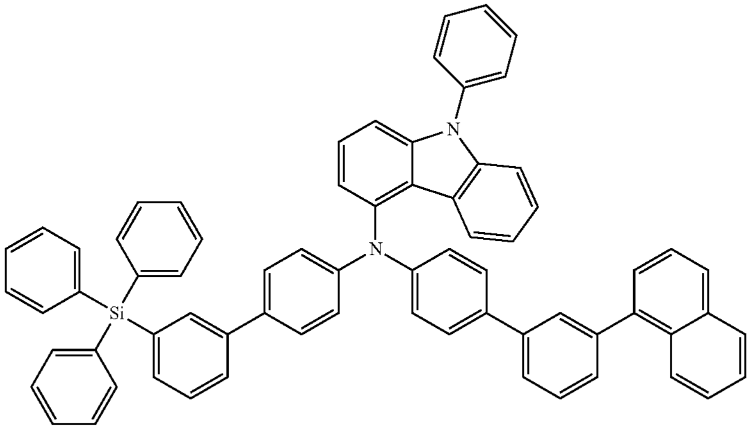
A170
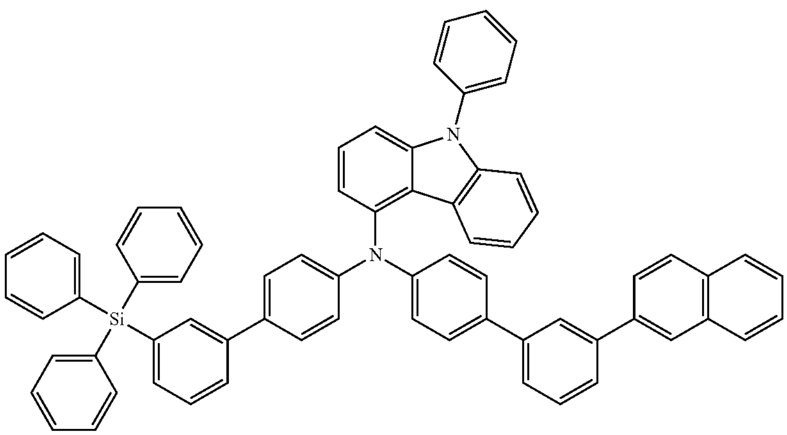
A171
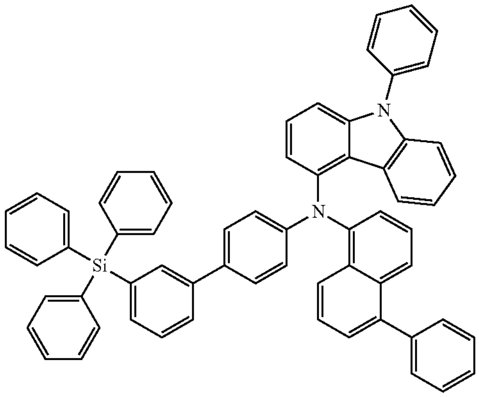
A172
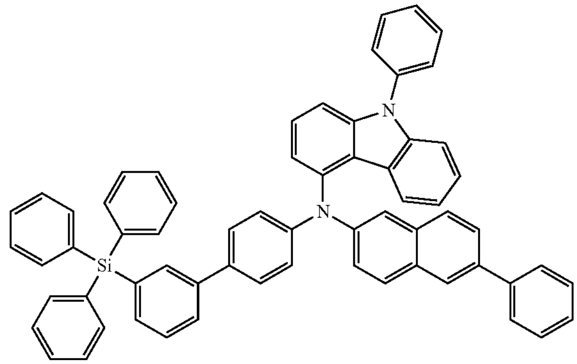

-continued
A173
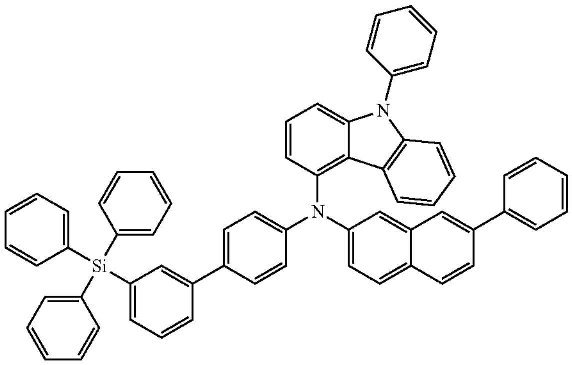
A174
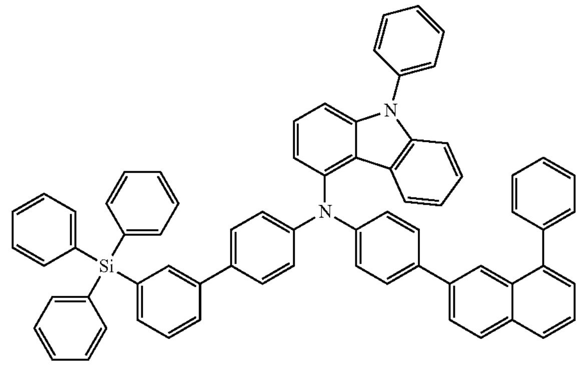
A175
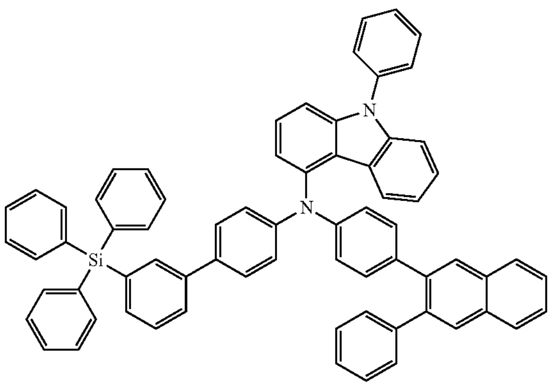
A176
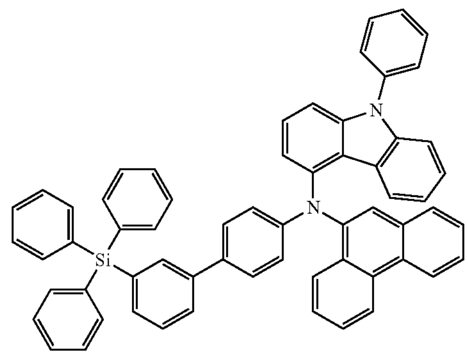
A177
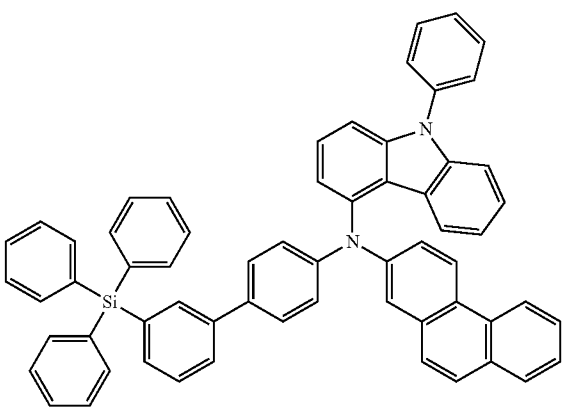
A178
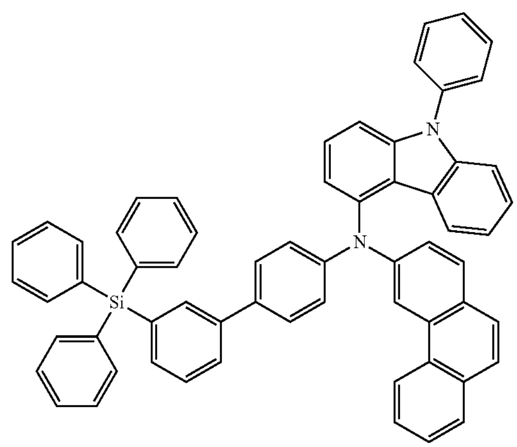
A179
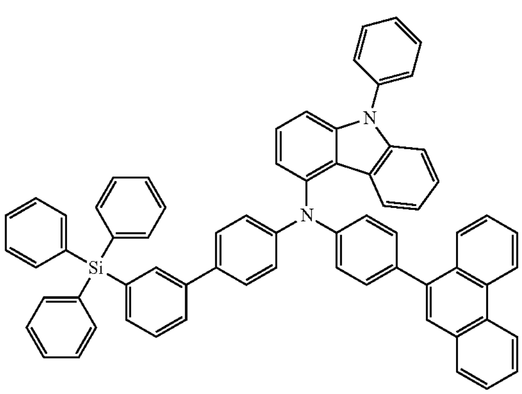
A180
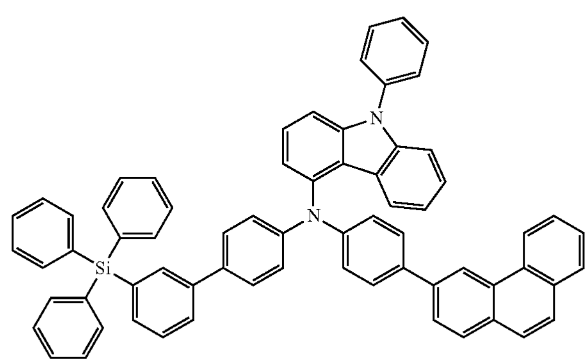

-continued
A181
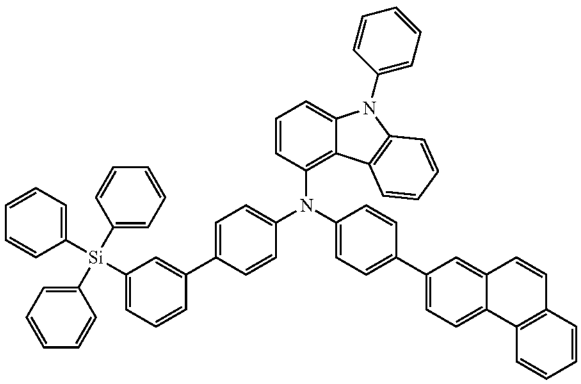
A182
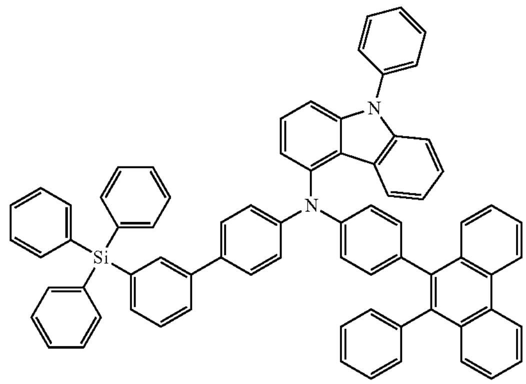
A183
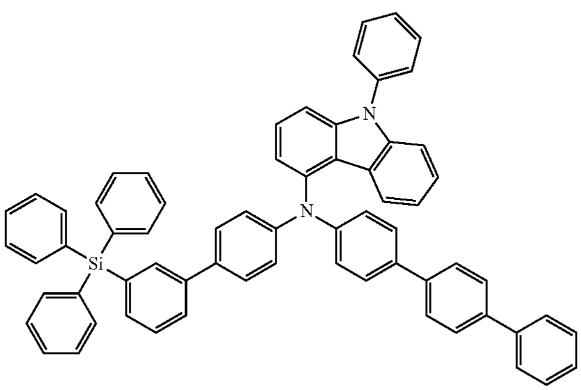
A184
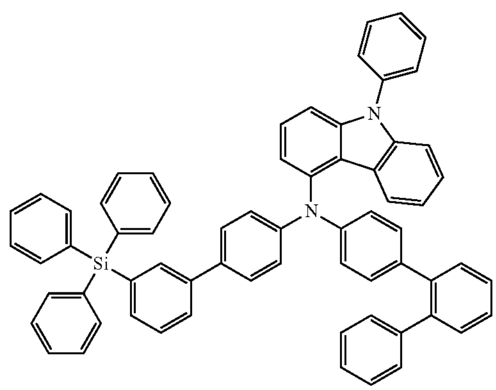
A185
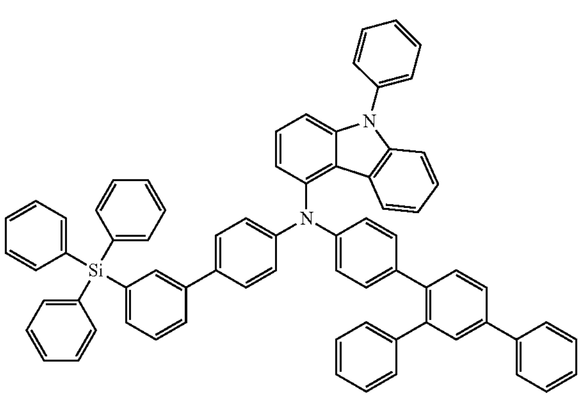
A186
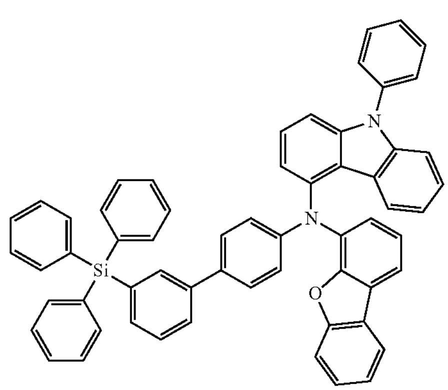

-continued
A187
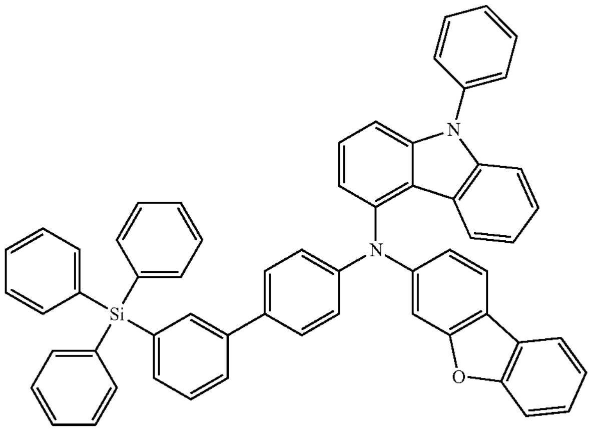
A188
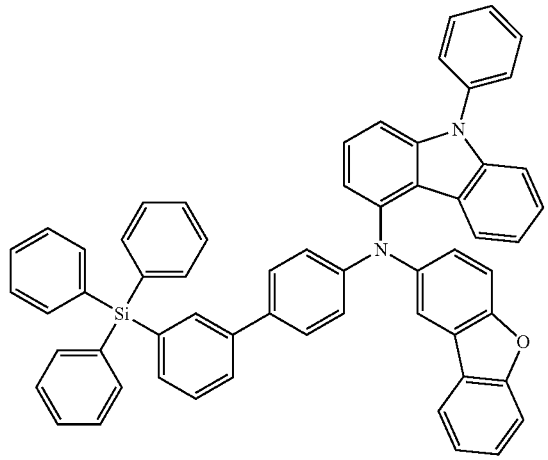
A189
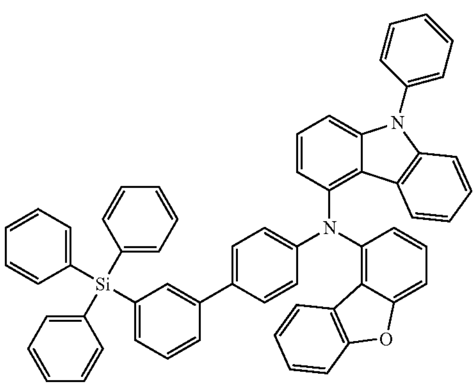
A190
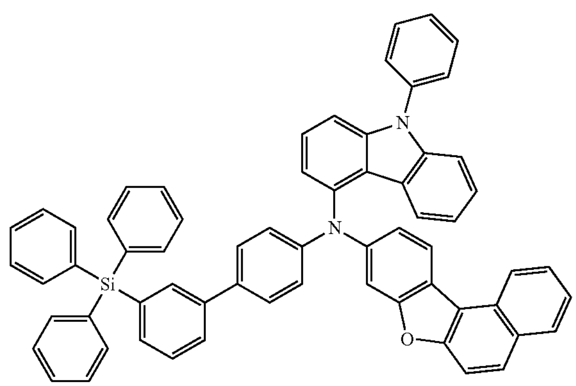
A191
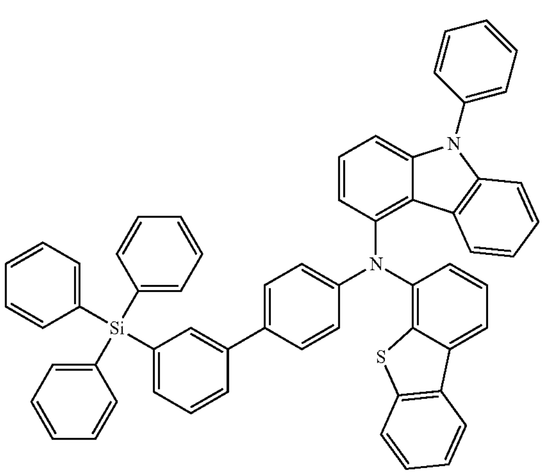
A192
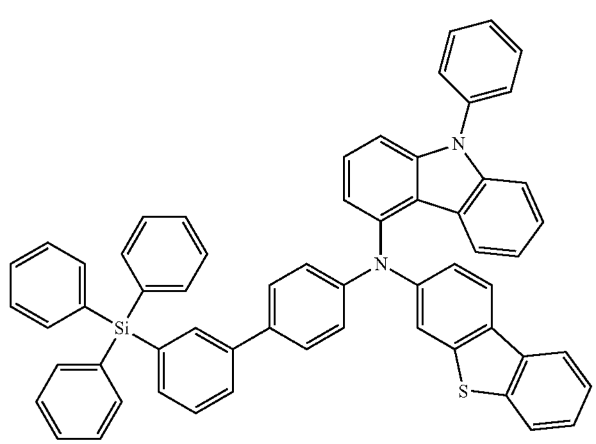

-continued
A193
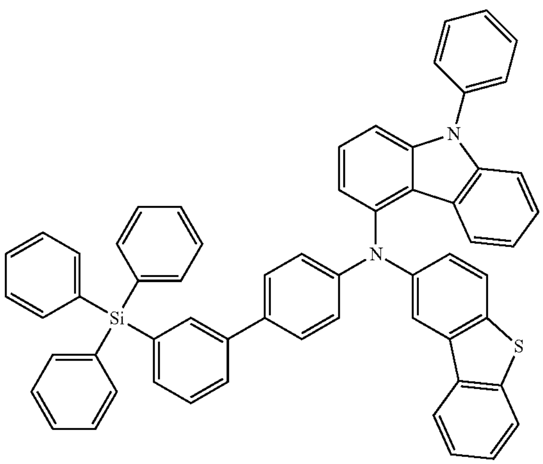
A194
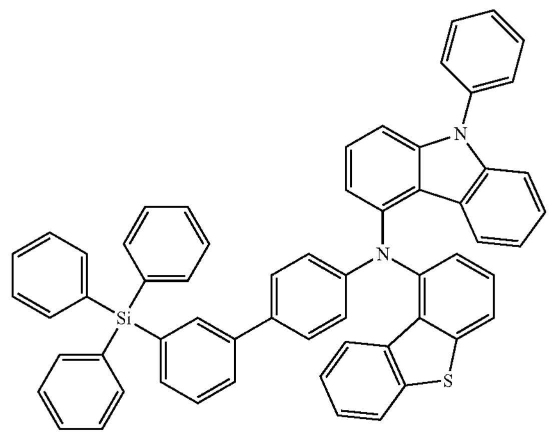
A195
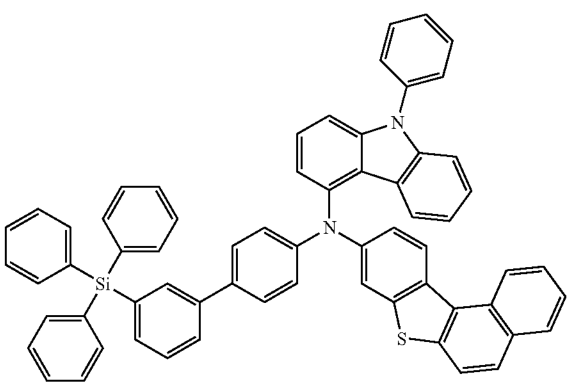
A196
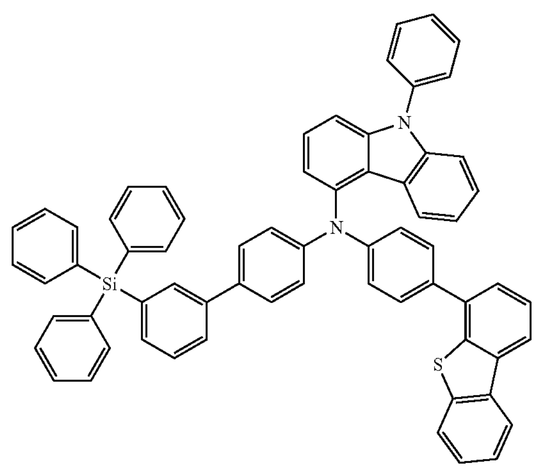
A197
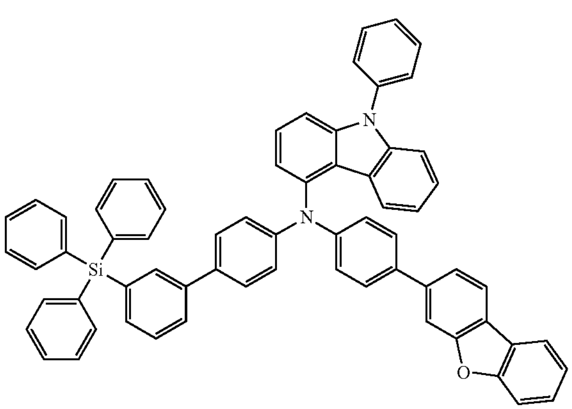
A198
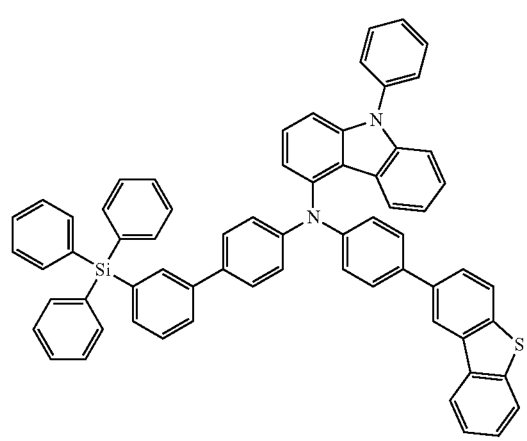

-continued
A199
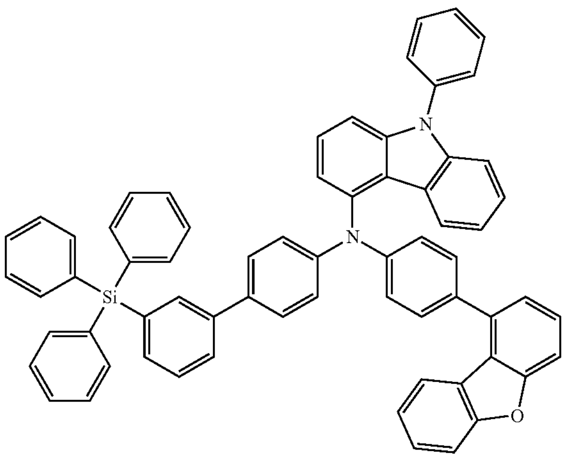
A200
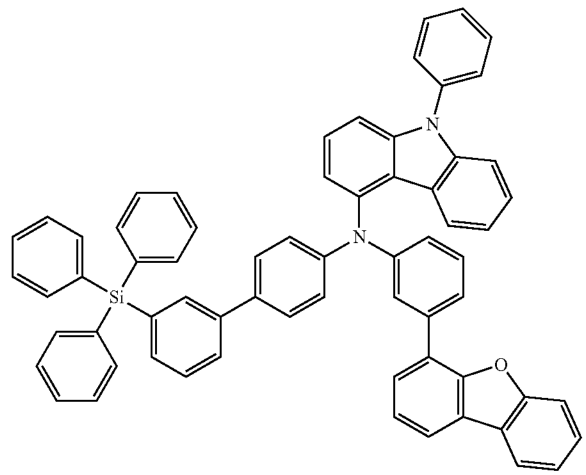
A201
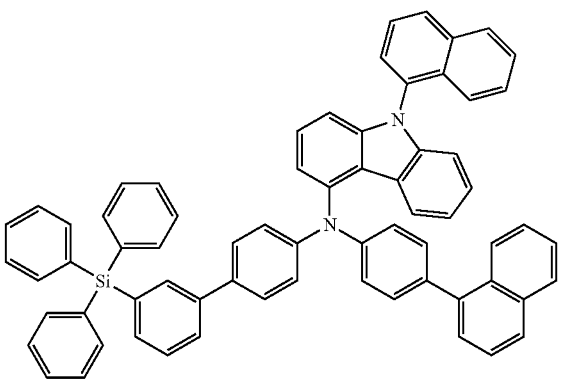
A202
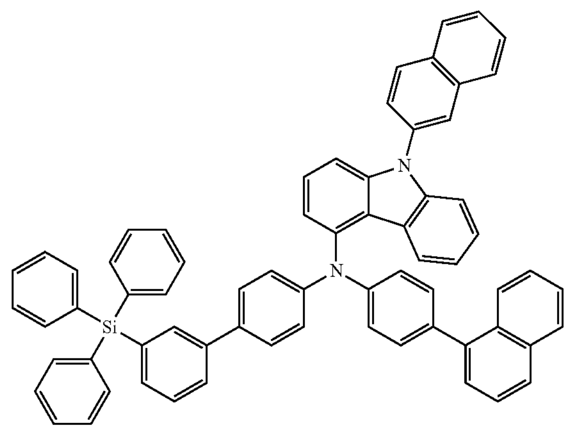
A203
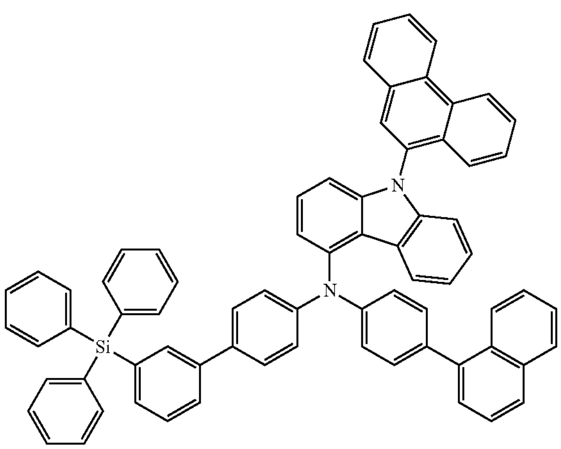
A204
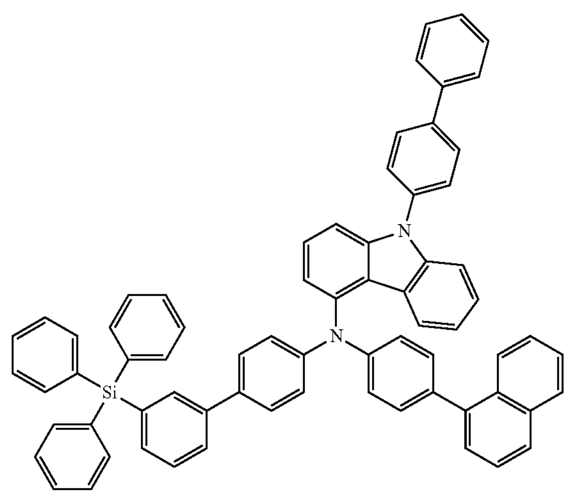

-continued
A205
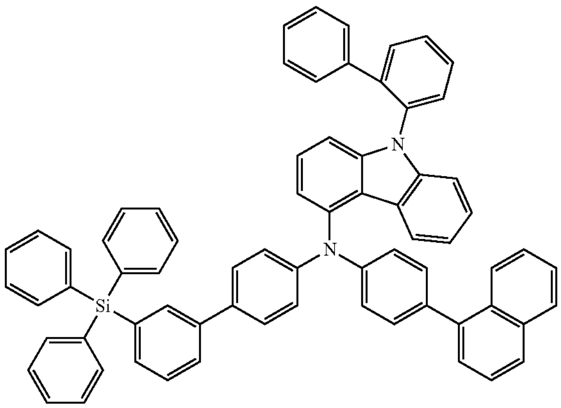
A206
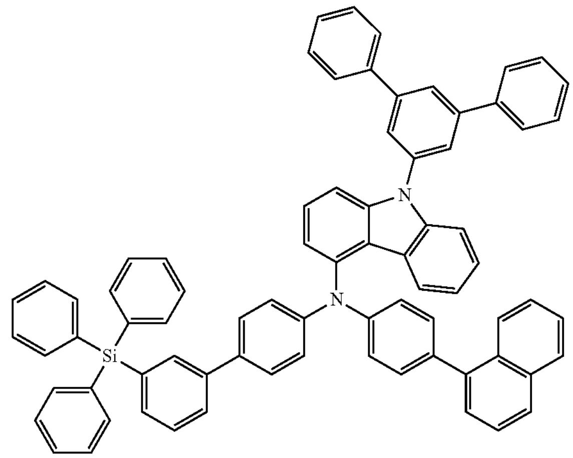
A207
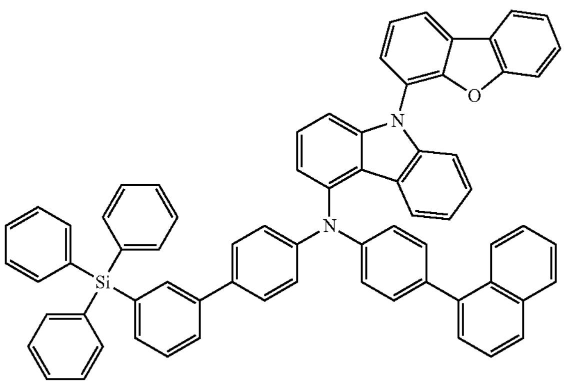
A208
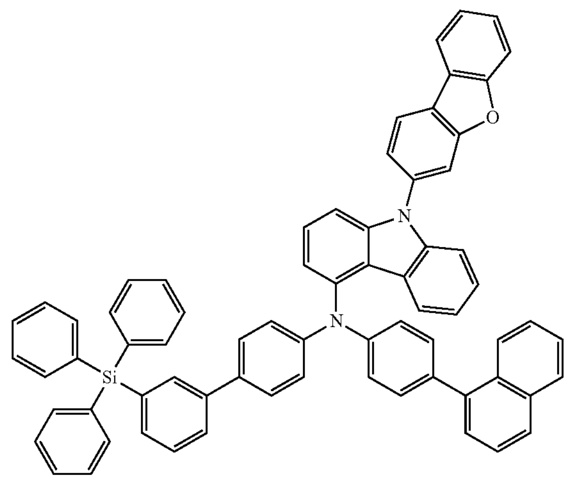
A209
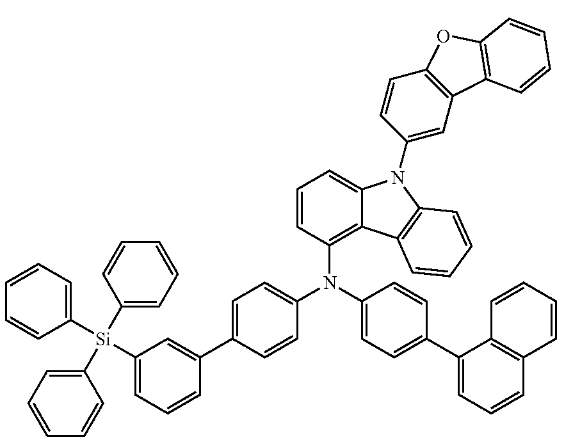
A210
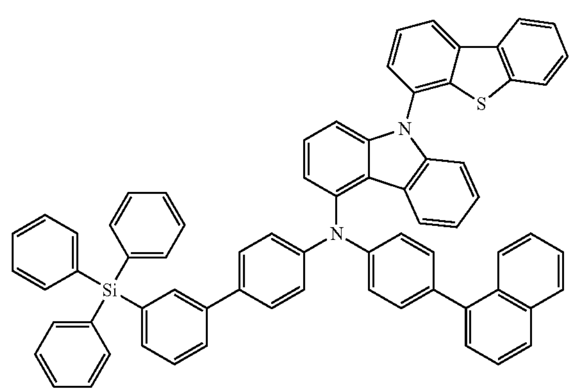

-continued
A211
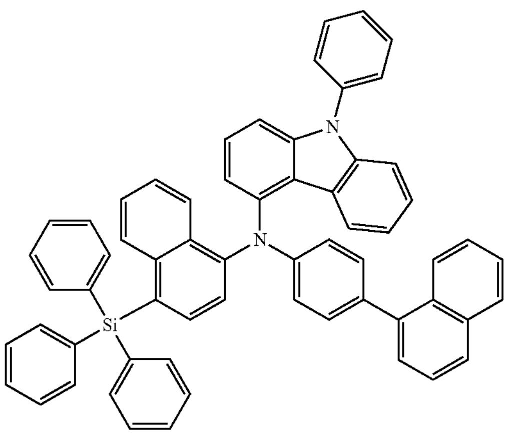
A212
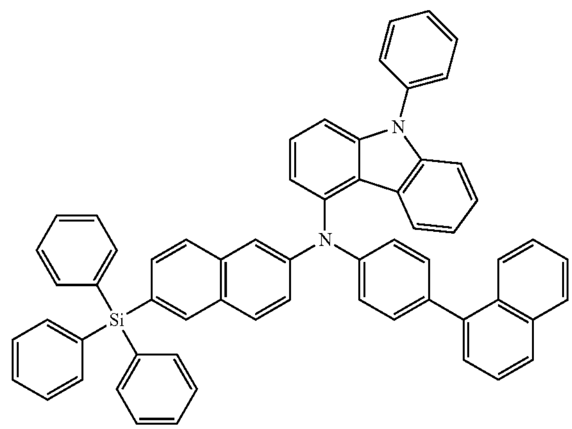
A213
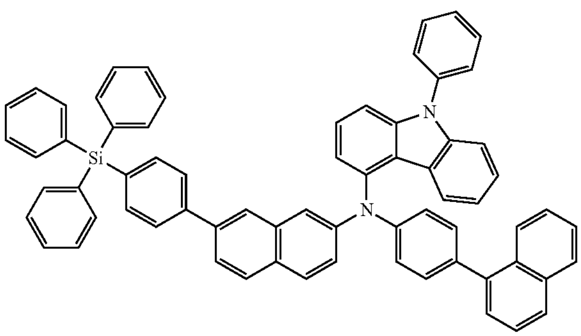
A214
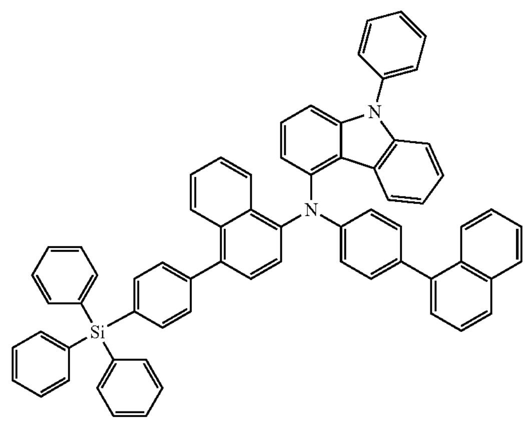
A215
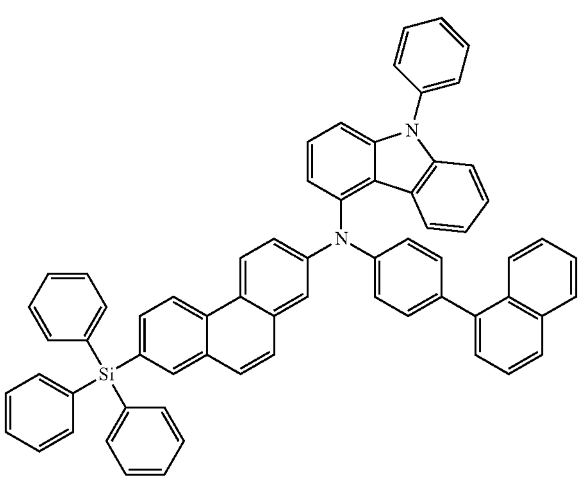
A216
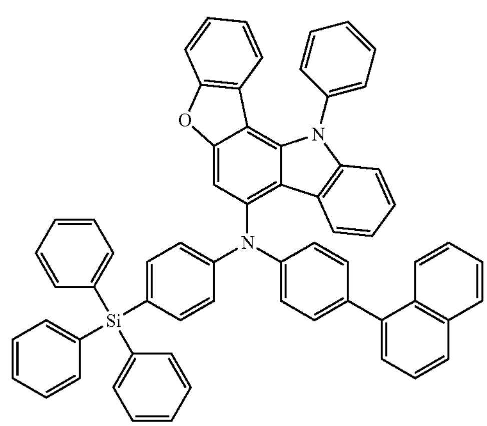

-continued
A217
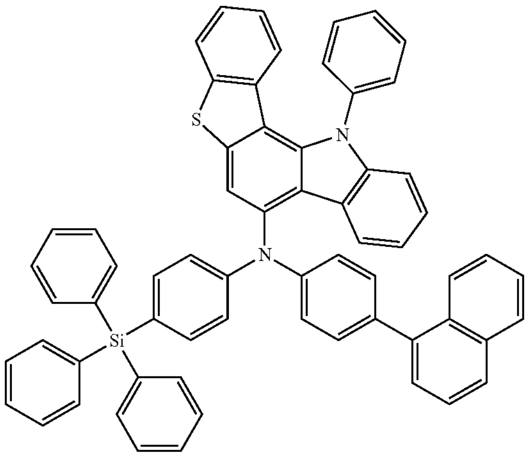
A218
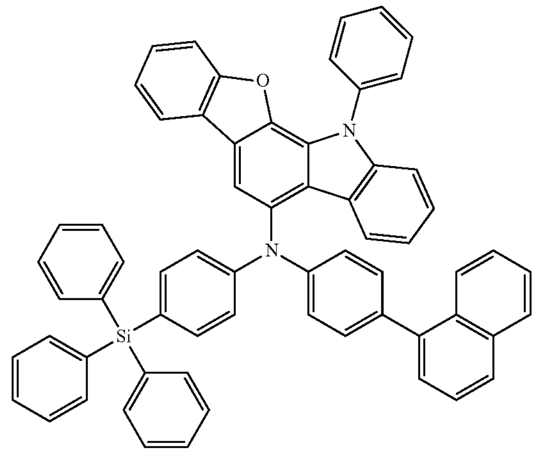
A219
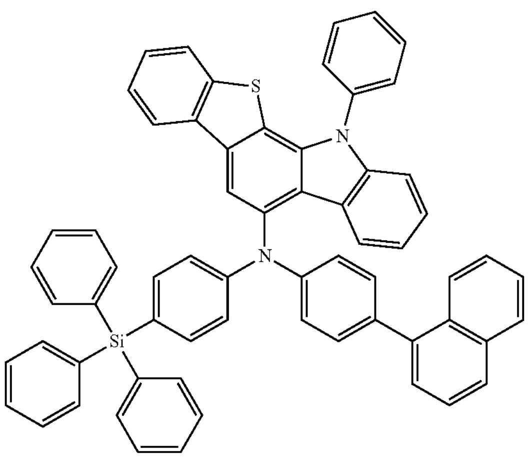
A220
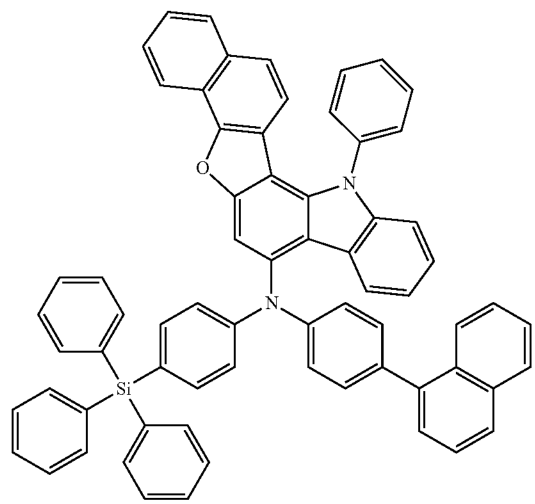
Compound Group 1B
B1
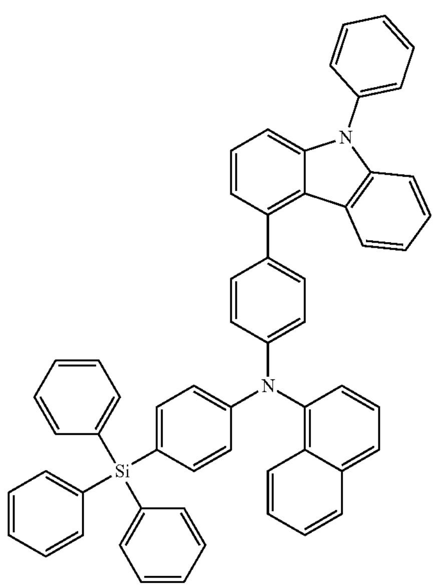
-continued
B2
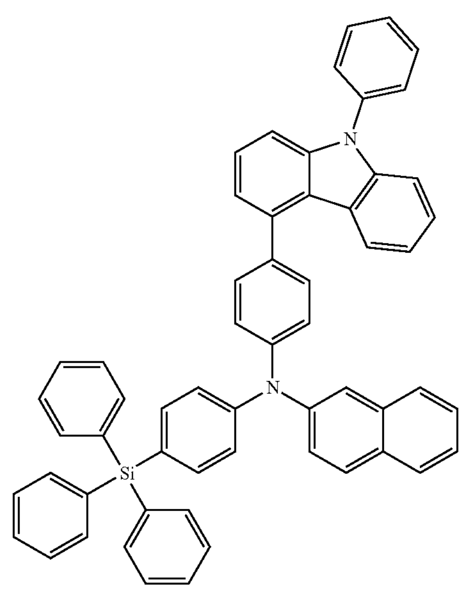

-continued
B3
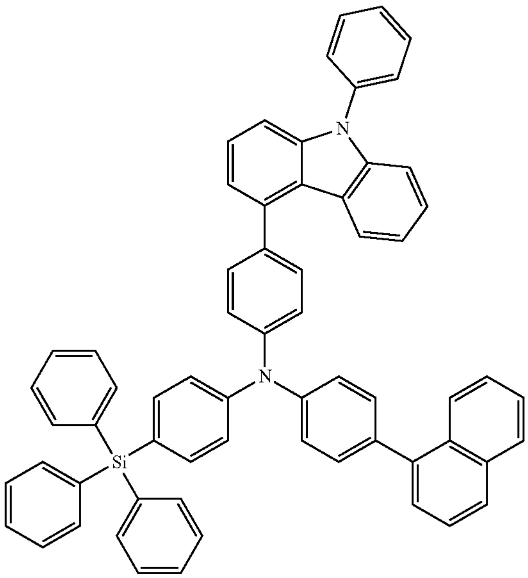
B4
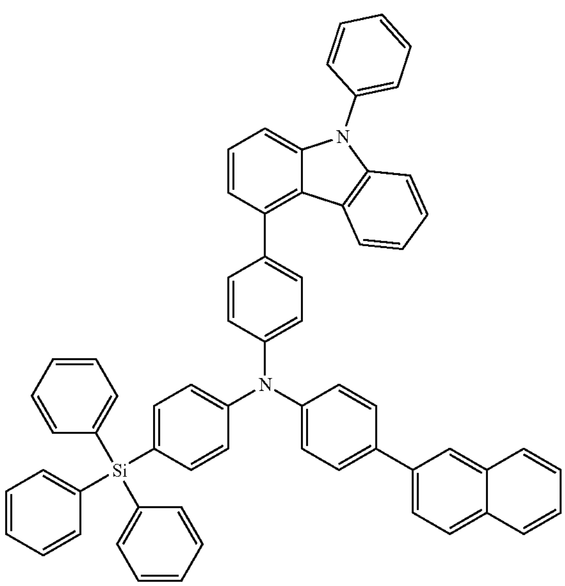
-continued
B5
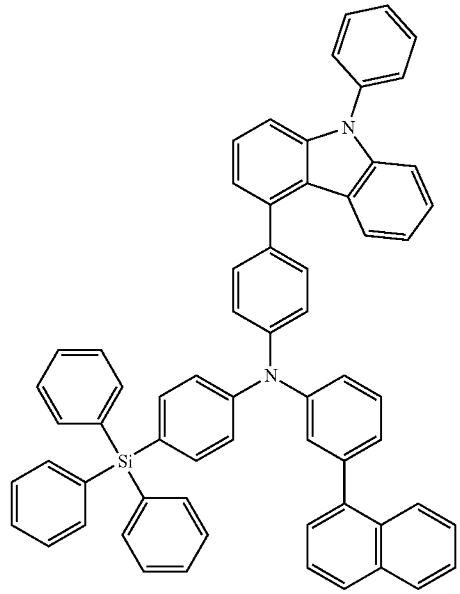
B6
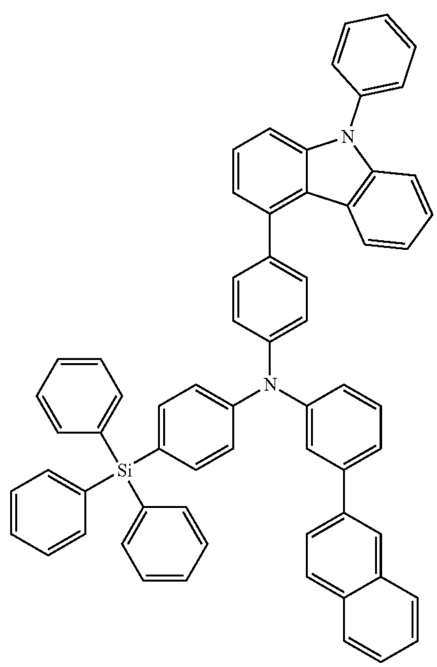

-continued
B7
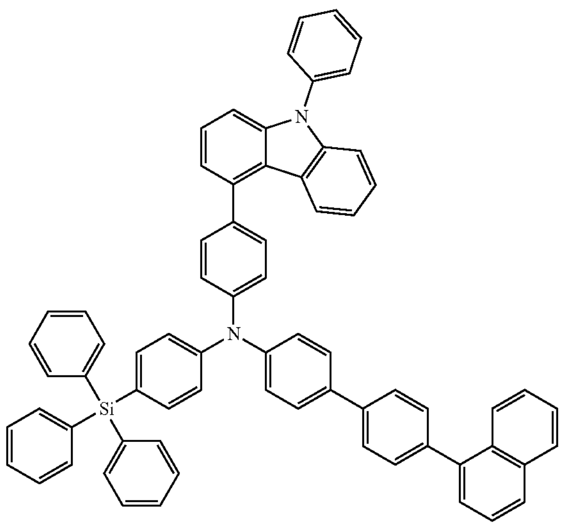
B8
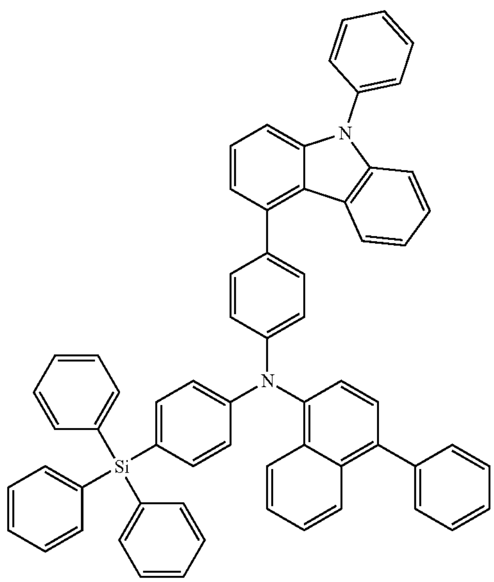
B9
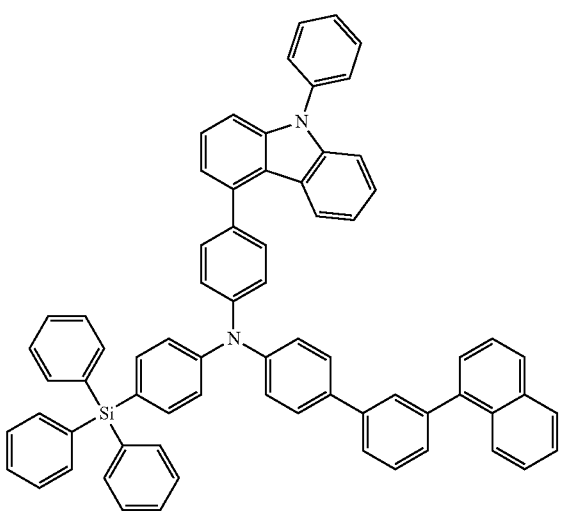
-continued
B10
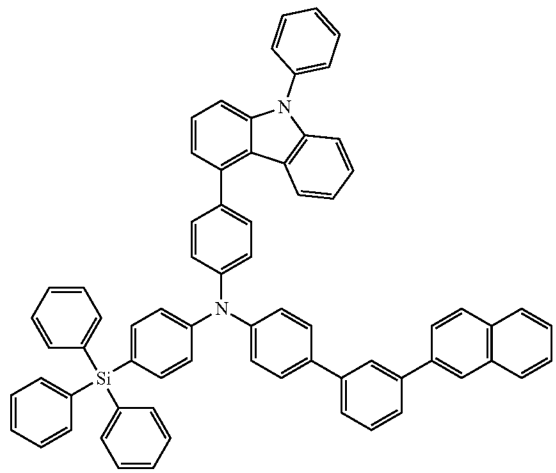
B11
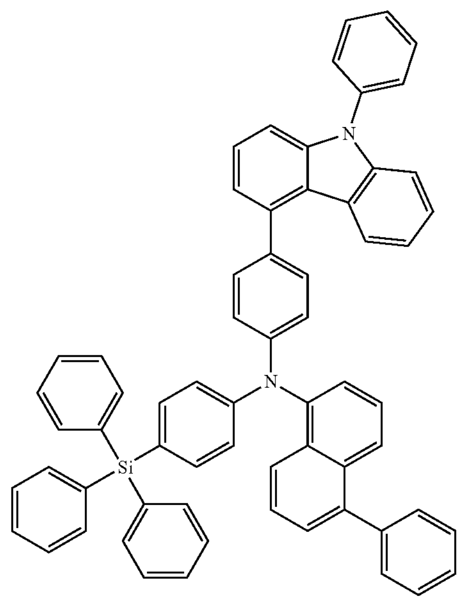
B12
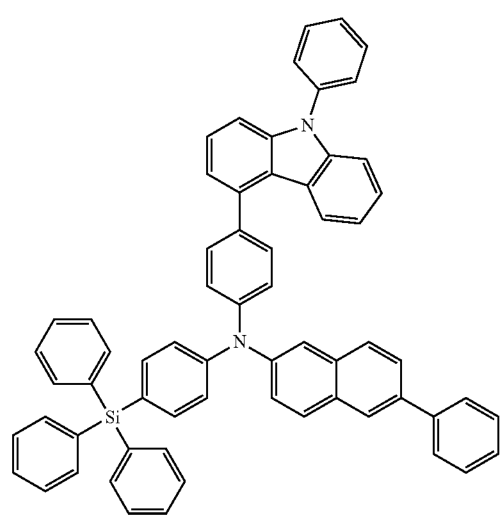

-continued
B13
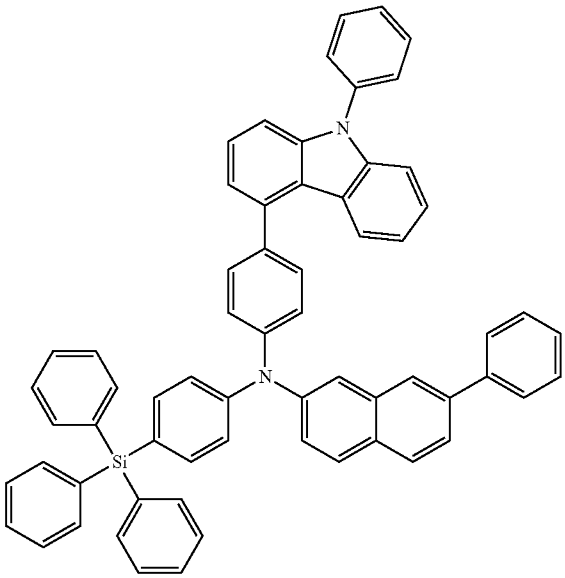
B14
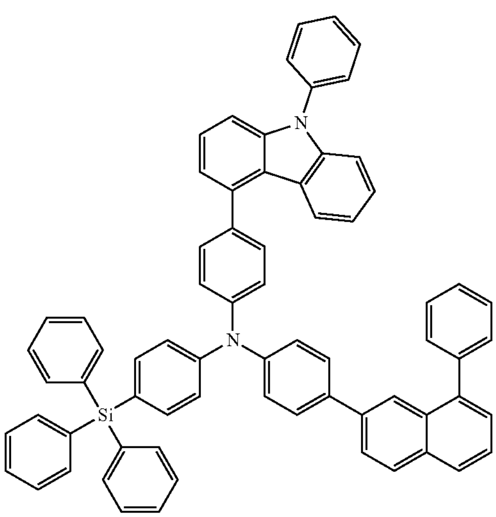
-continued
B15
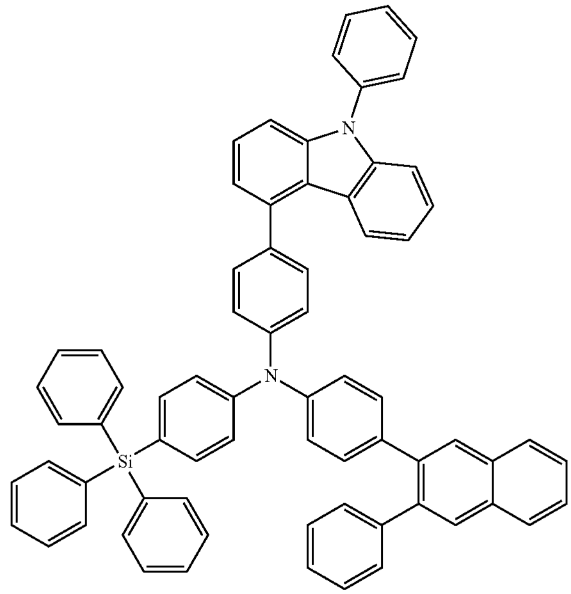
B16
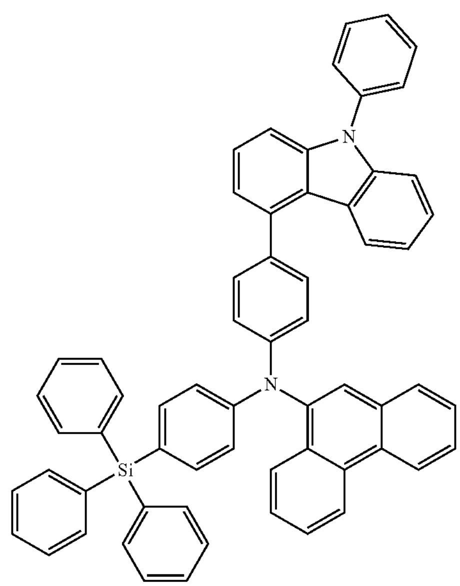

B17
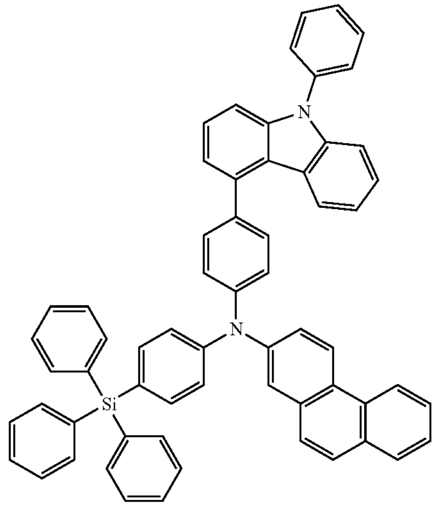
B18
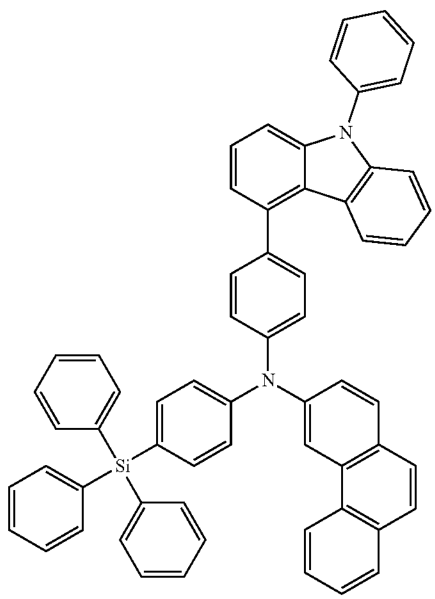
B19
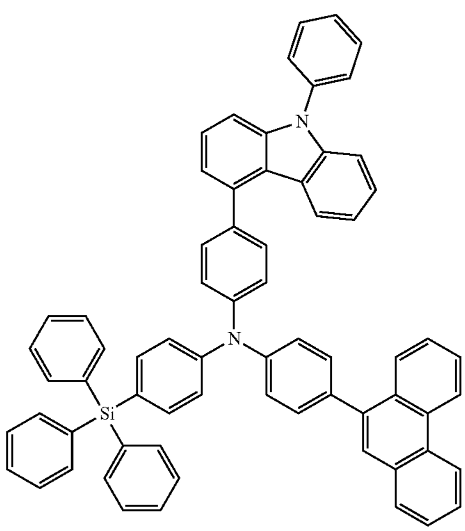
B20
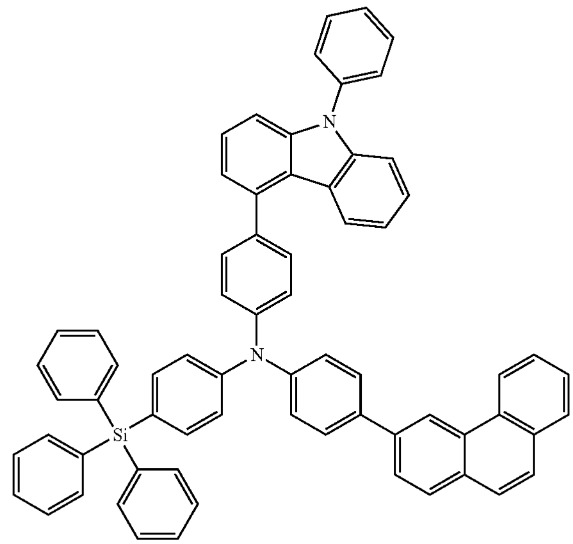
B21
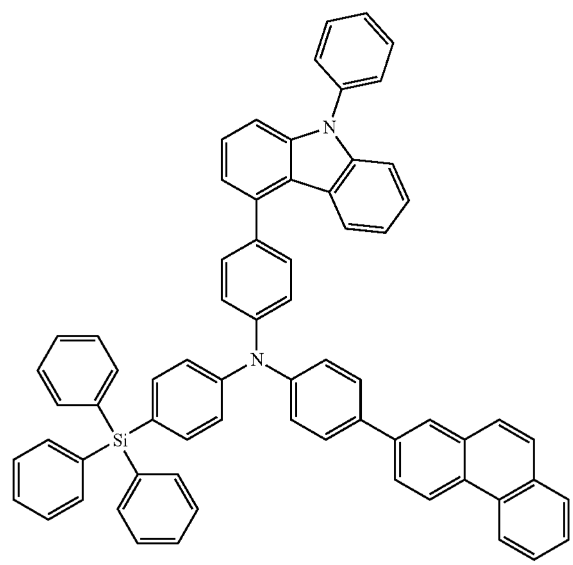
B22
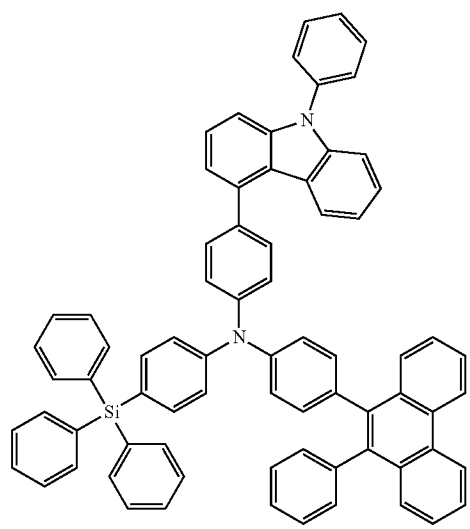

B23
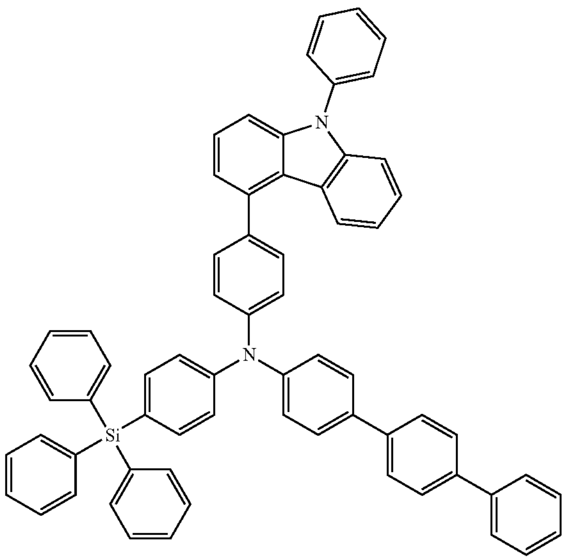
B24
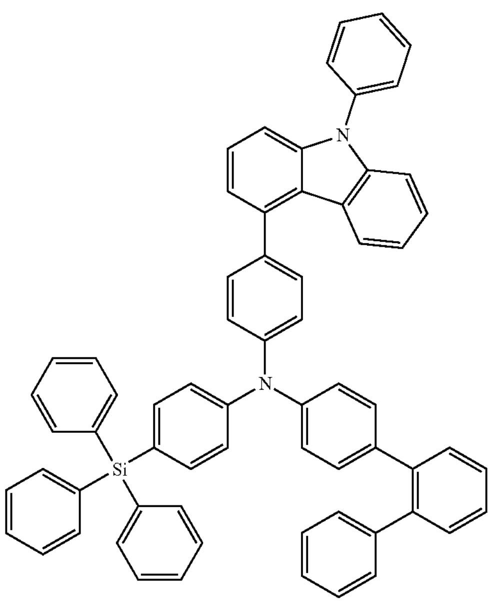
B25
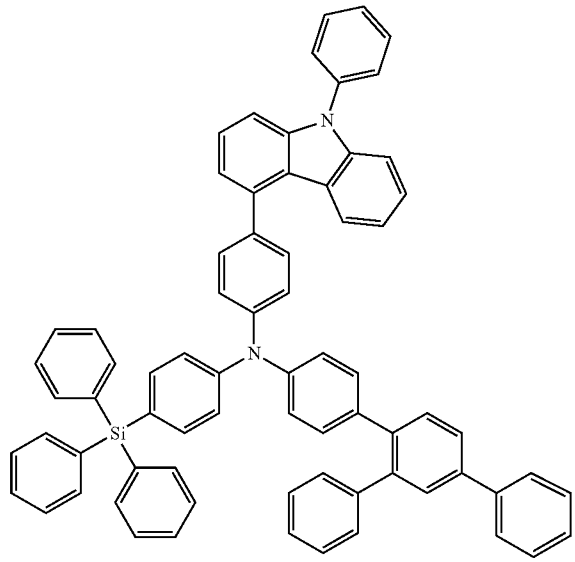
B26
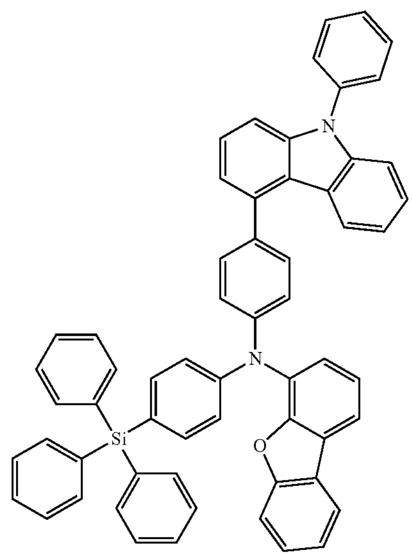
B27
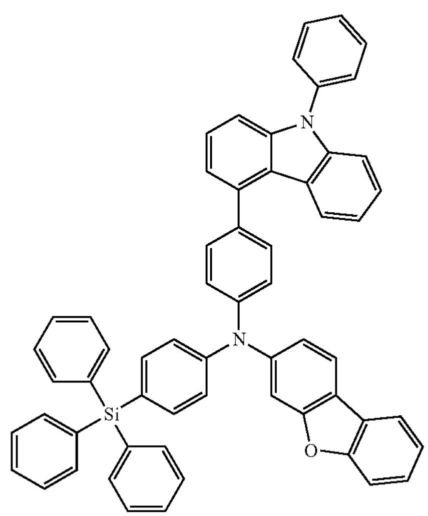

-continued
B28
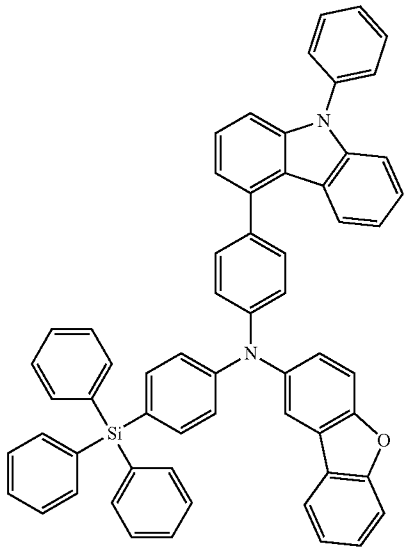
B29
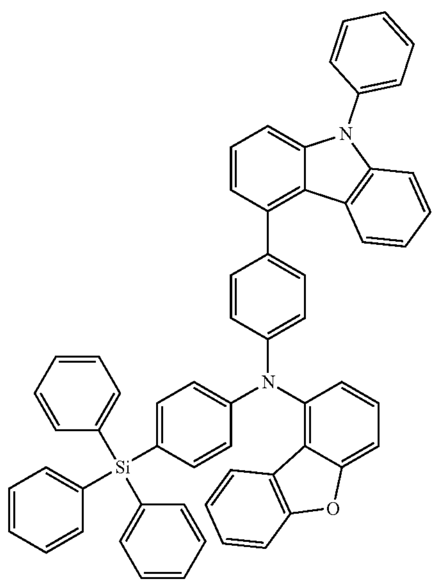
B30
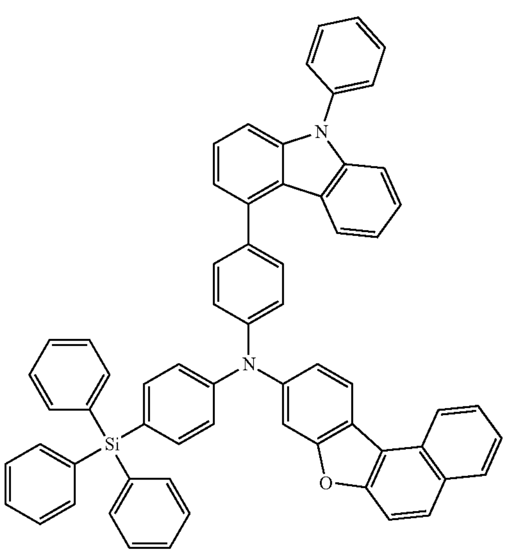
-continued
B31
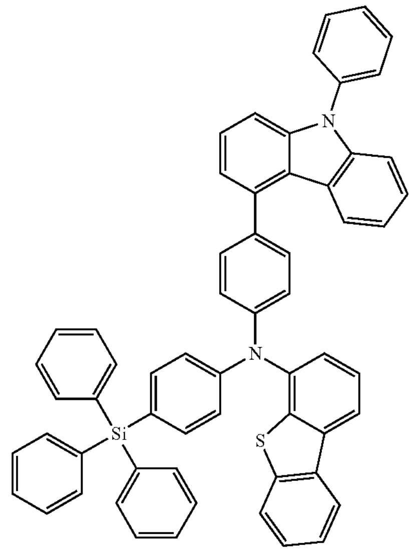
B32
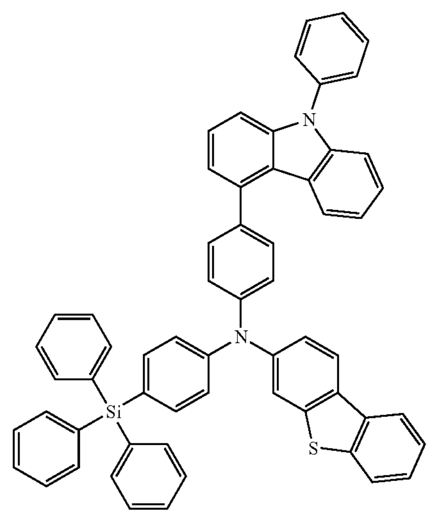
B33
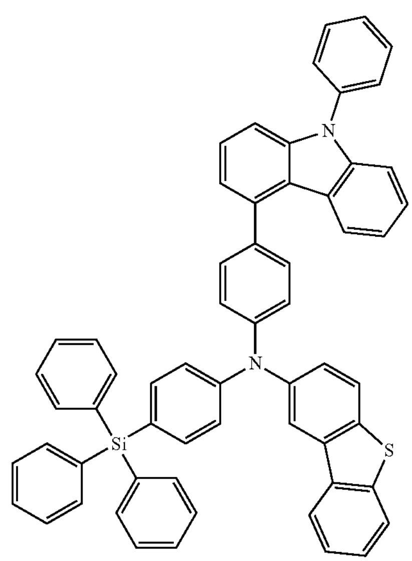

B34
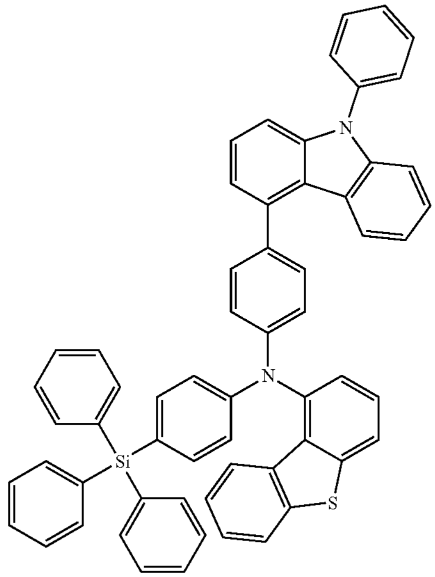
B35
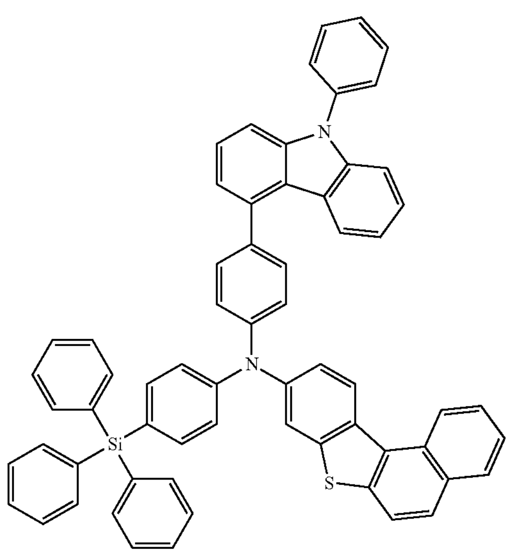
B36
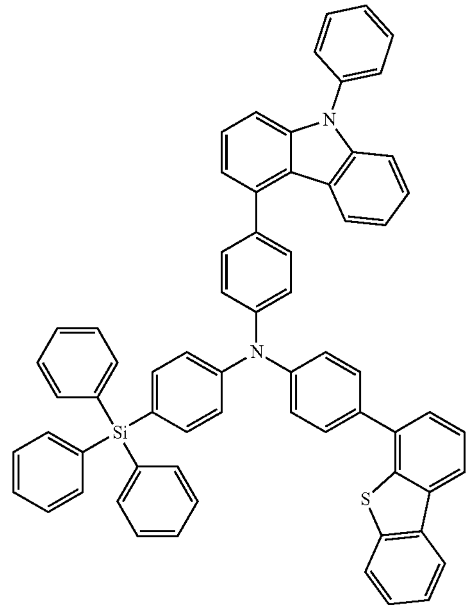
B37
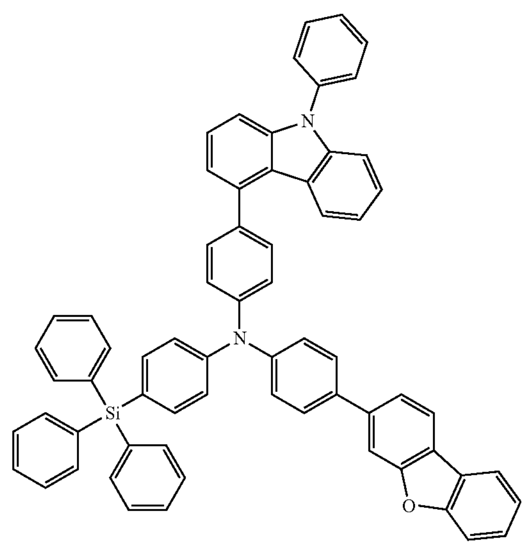

-continued
B38
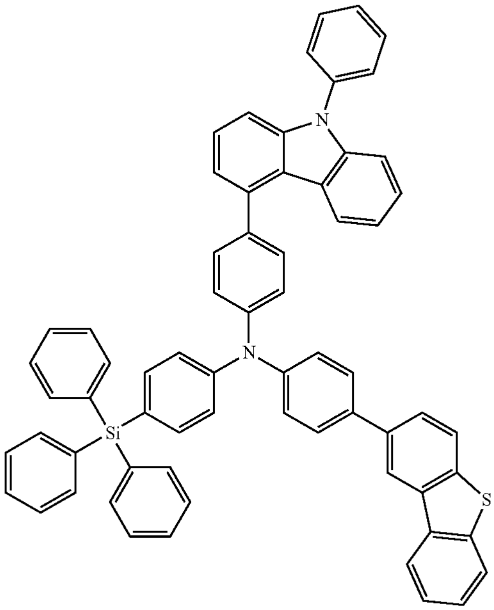
B39
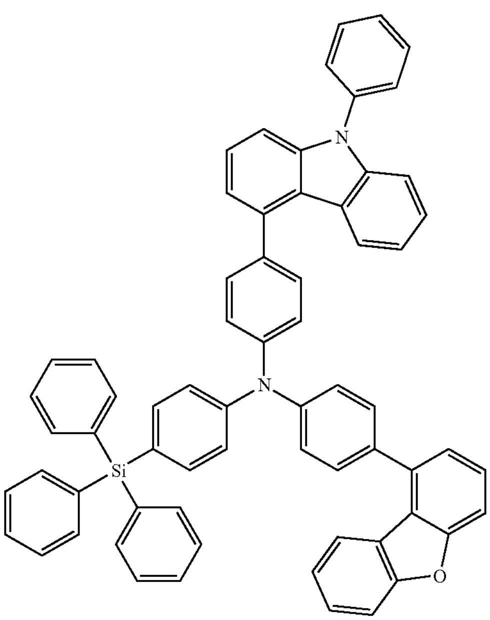
-continued
B40
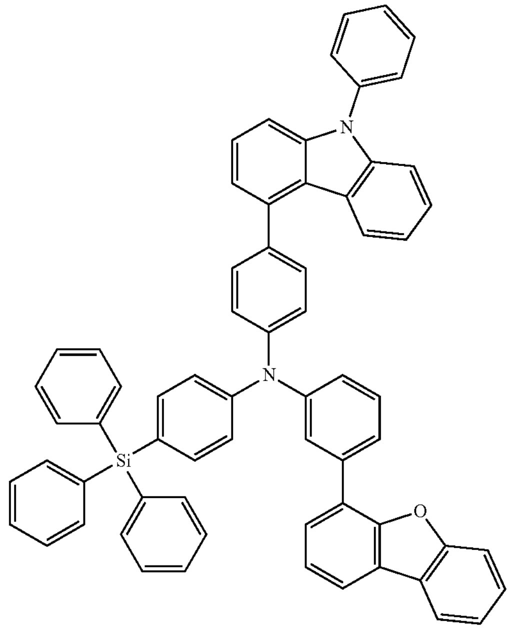
B41
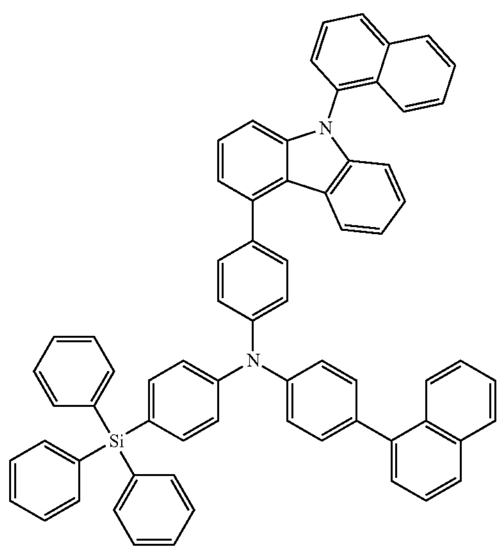

-continued
B42
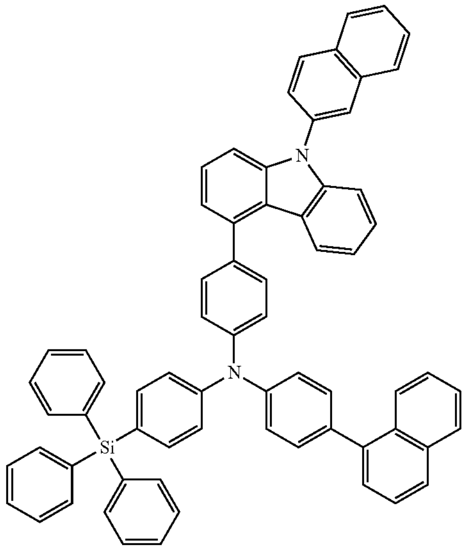
-continued
B44
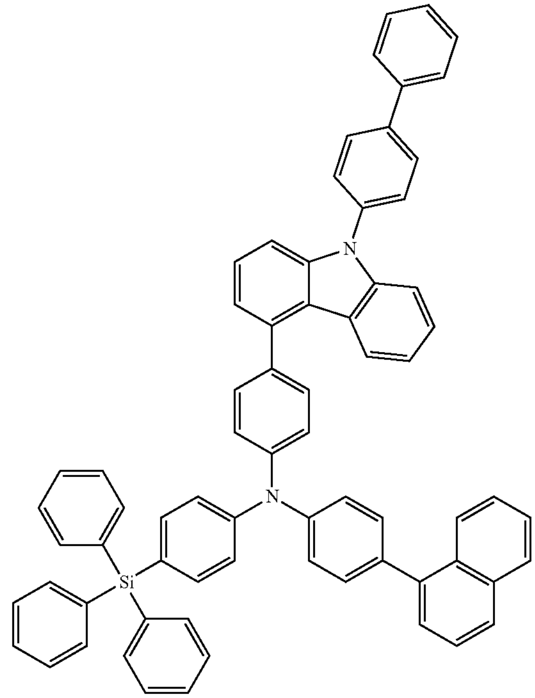
B43
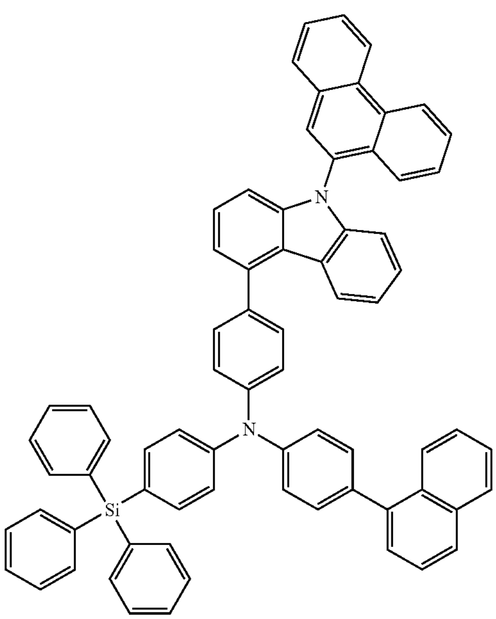
B45
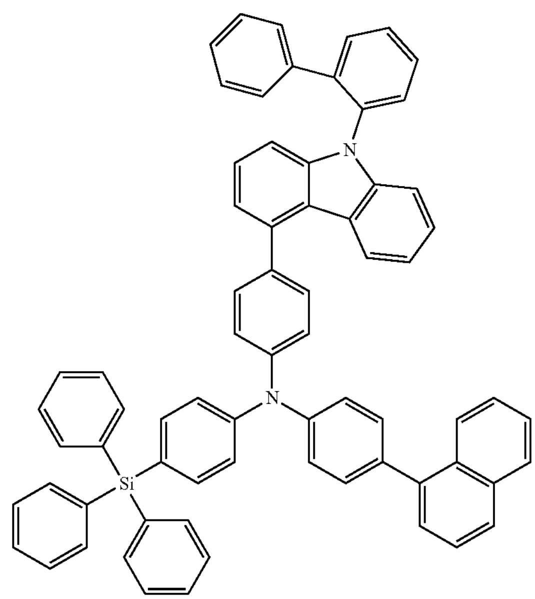

-continued
B46
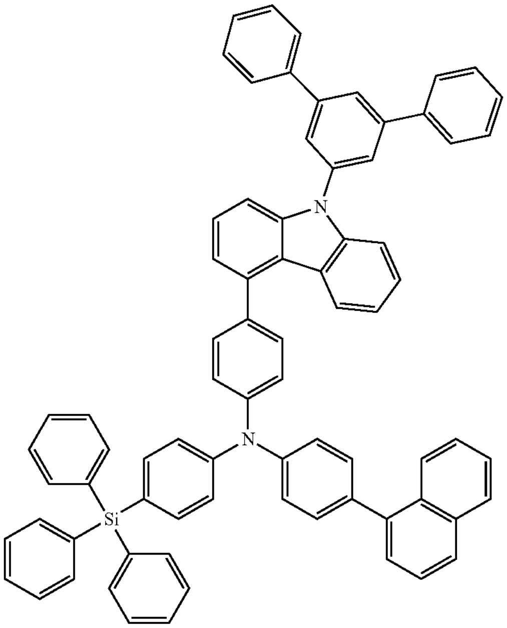
B47
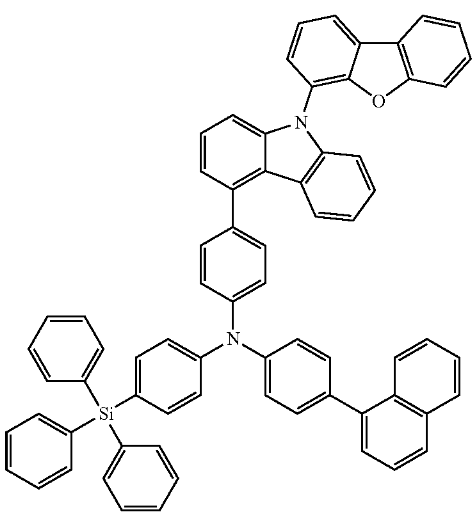
-continued
B48
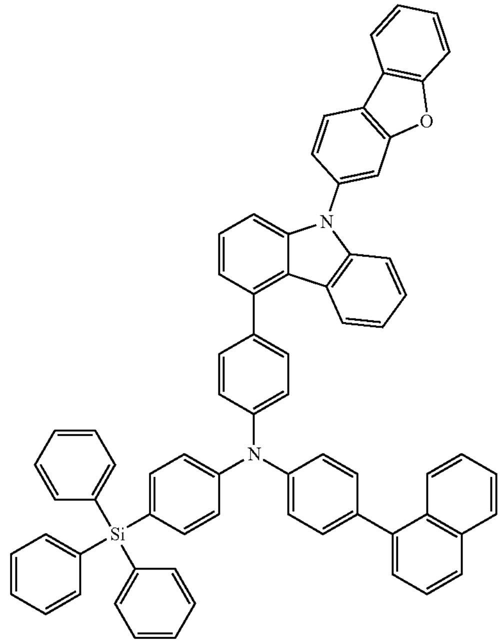
B49
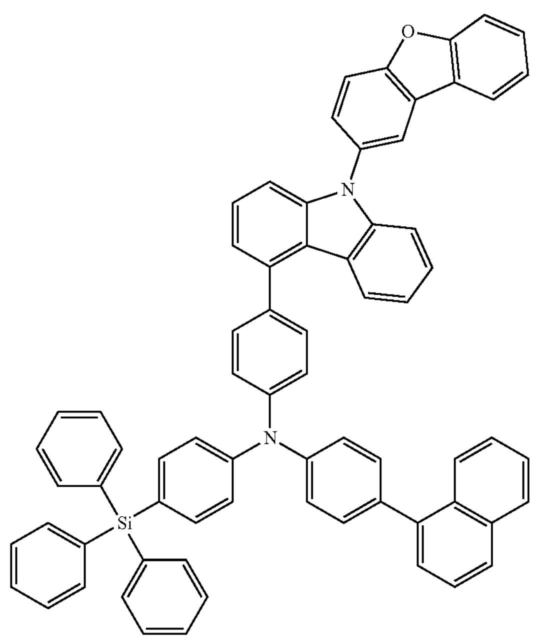

-continued
B50
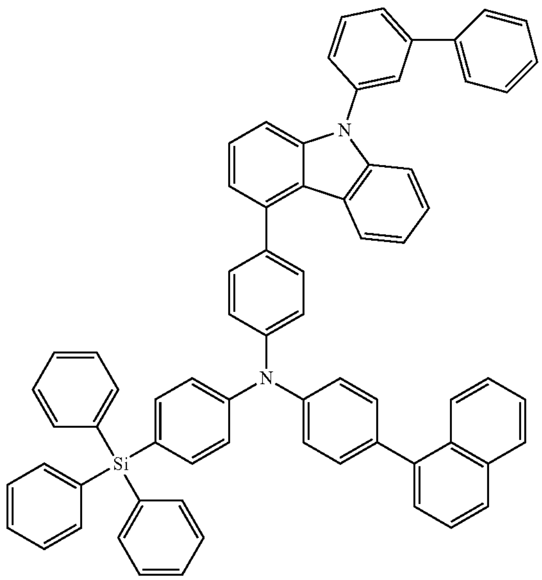
B51
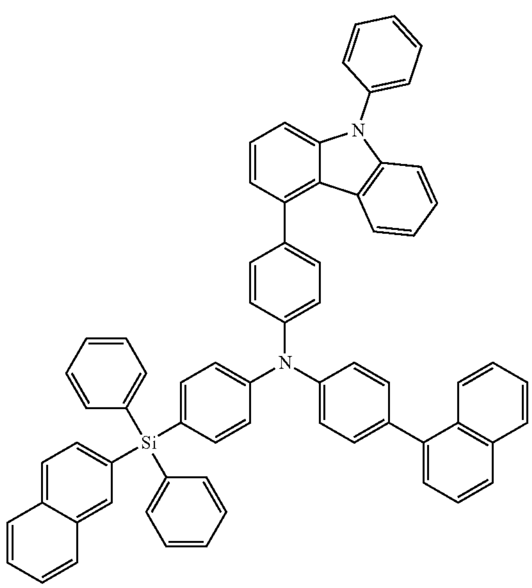
-continued
B52
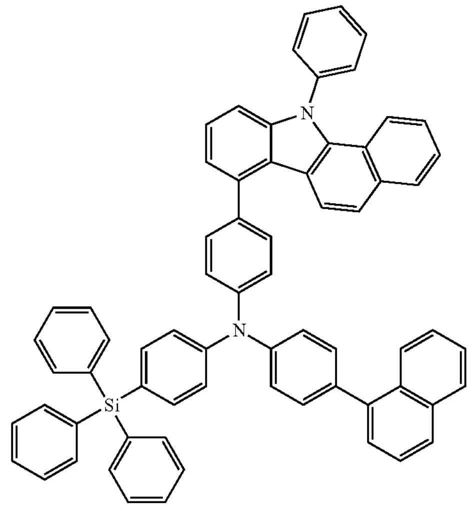
B53
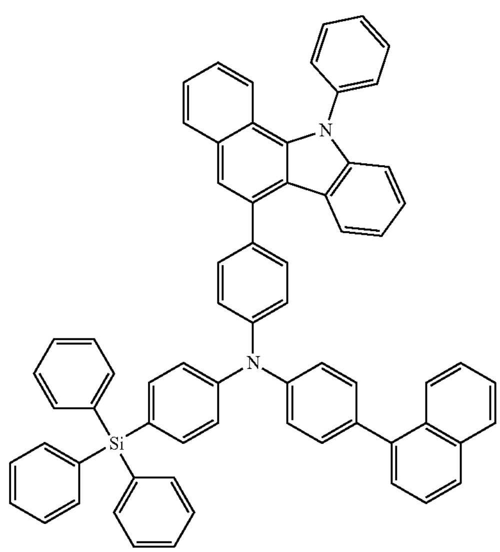

-continued
B54
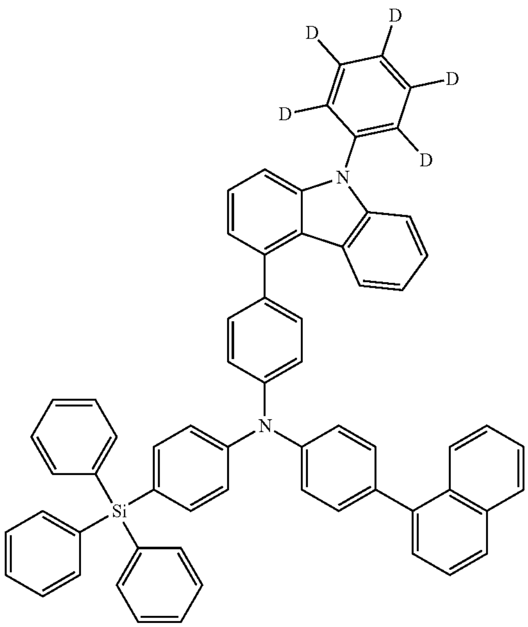
B55
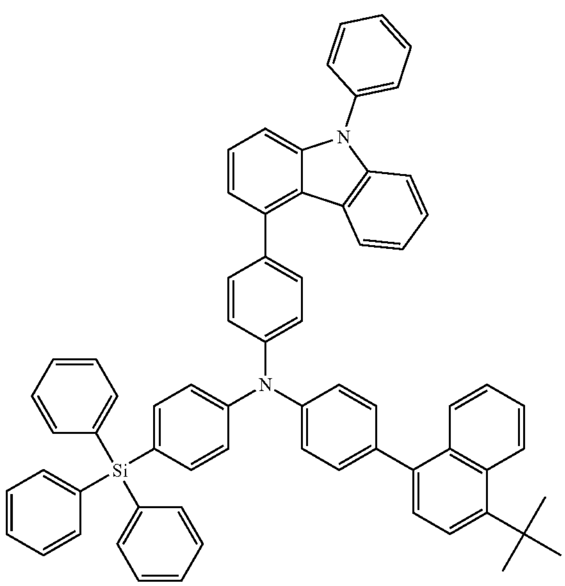
B56
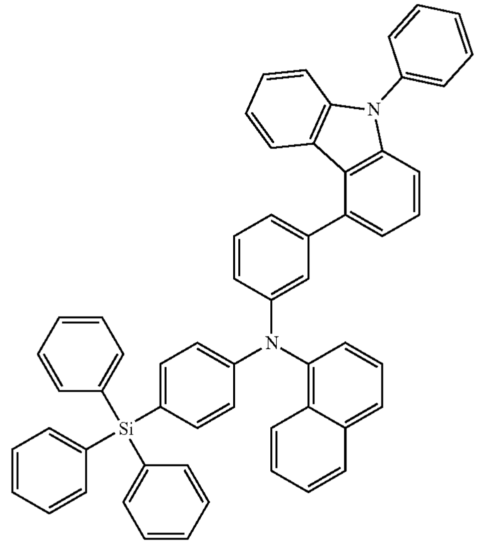
B57
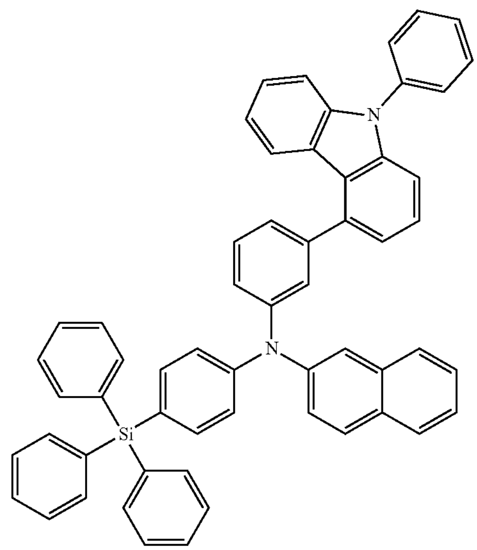
B58
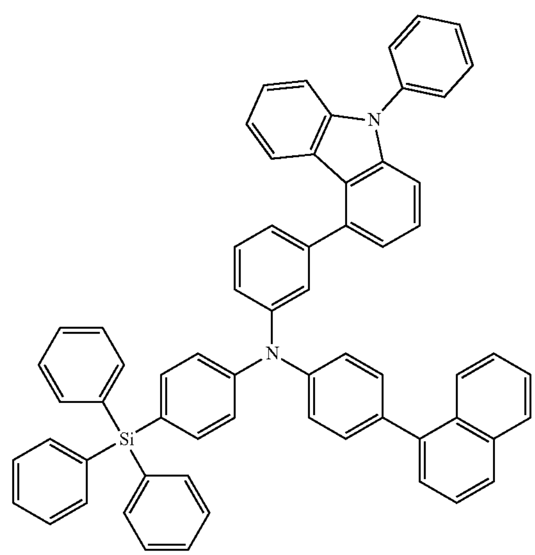

-continued
B59
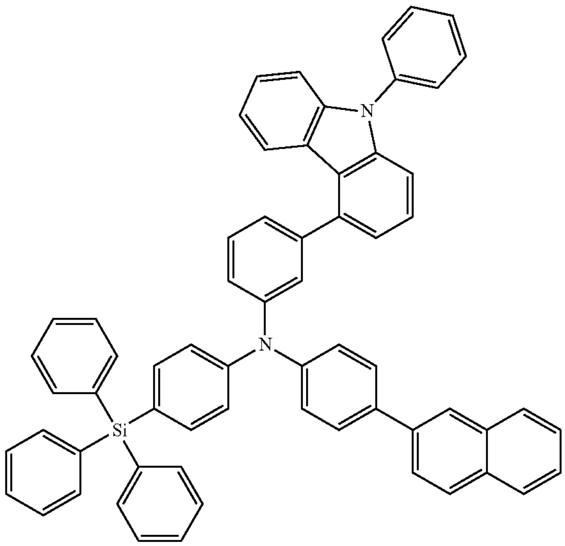
B60
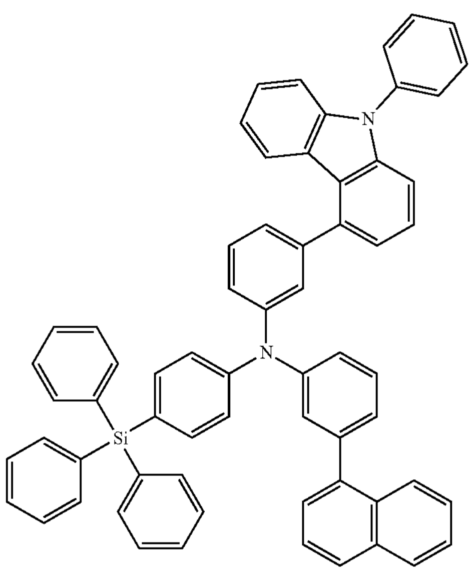
-continued
B61
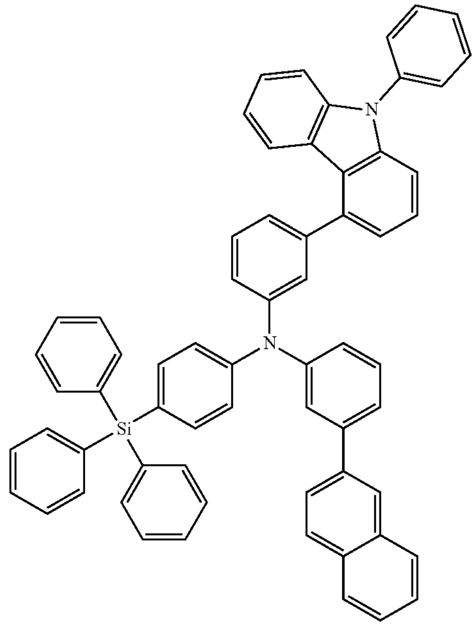
B62
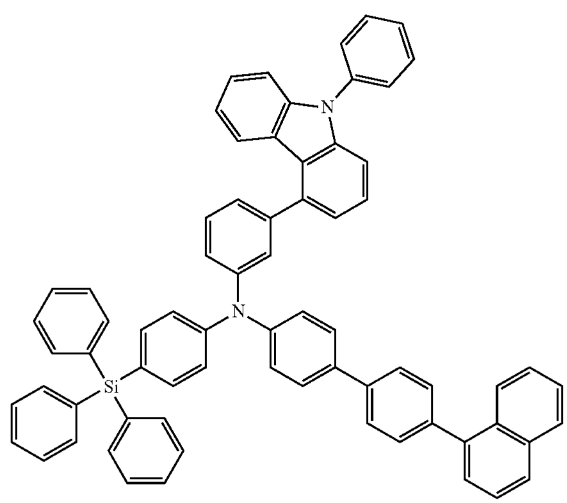

B63
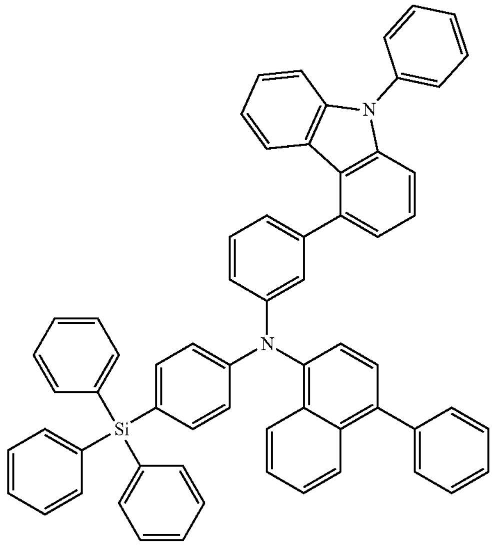
B64
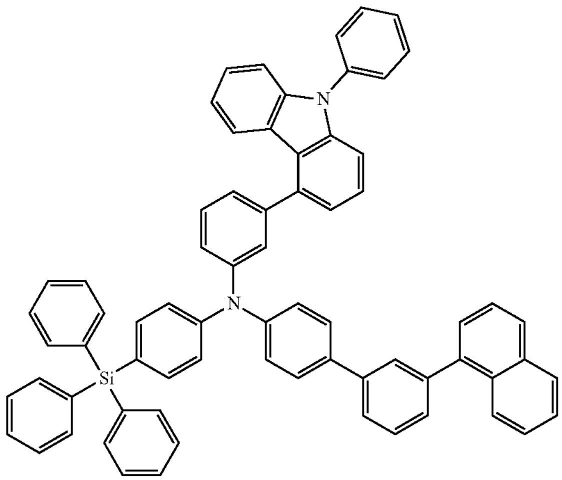
B65
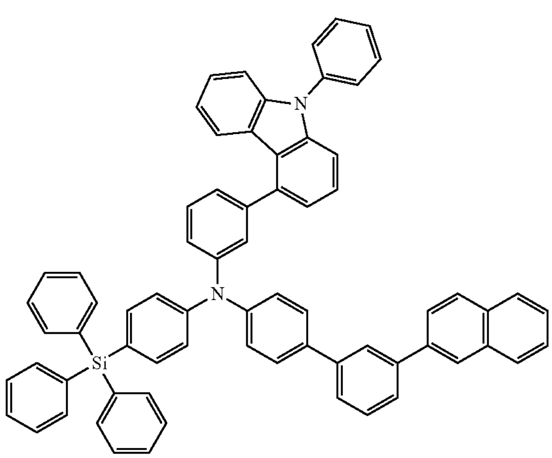
B66
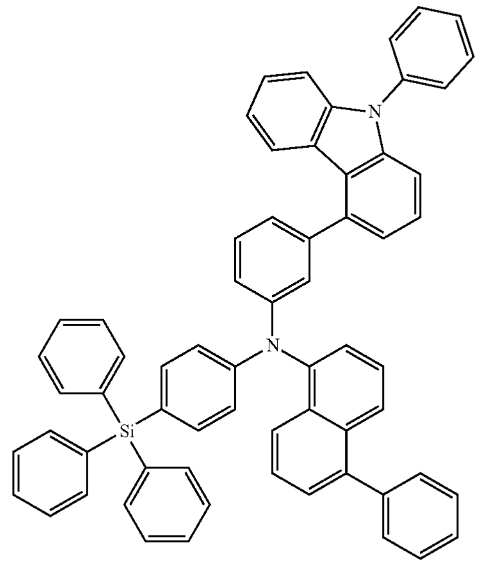
B67
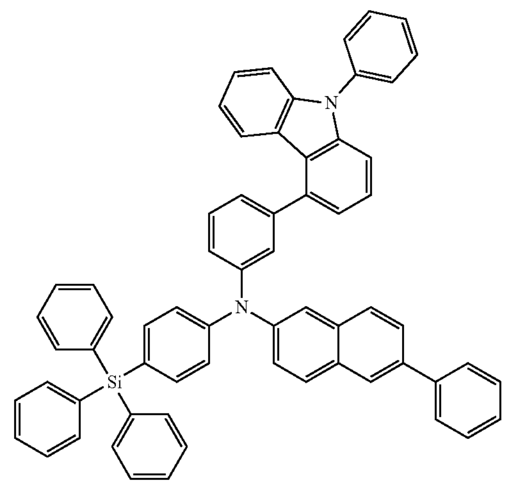
B68
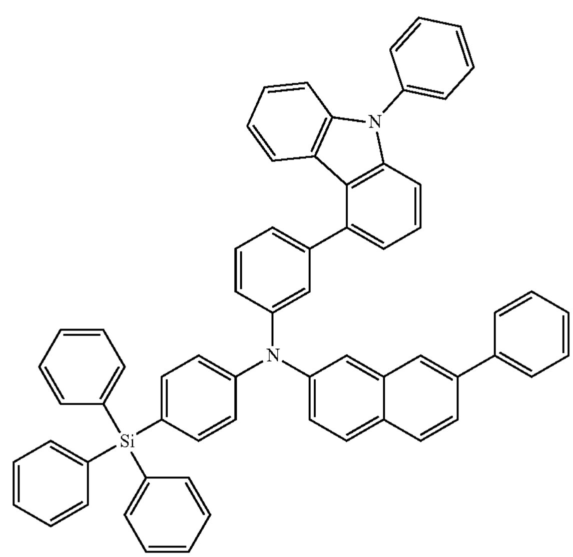

-continued
B69
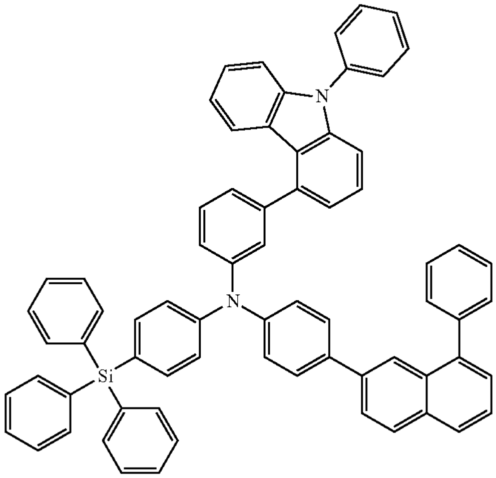
B70
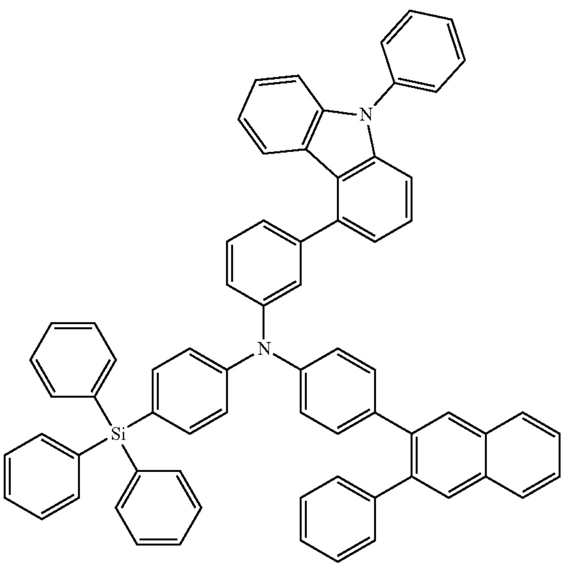
B71
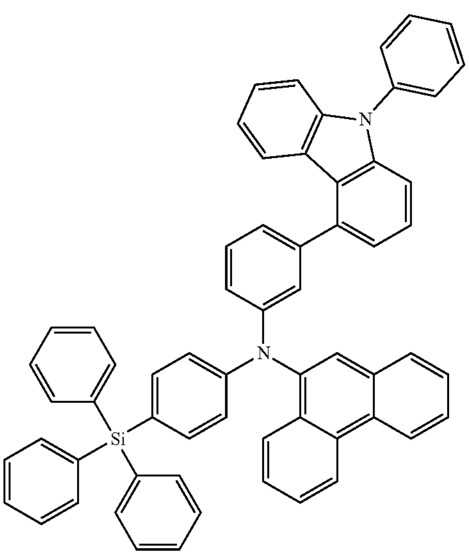
-continued
B72
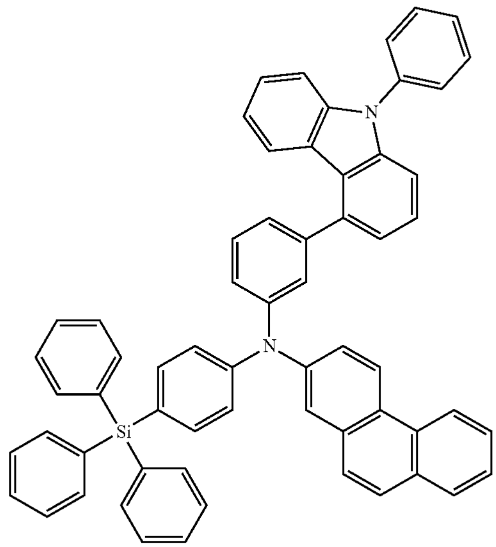
B73
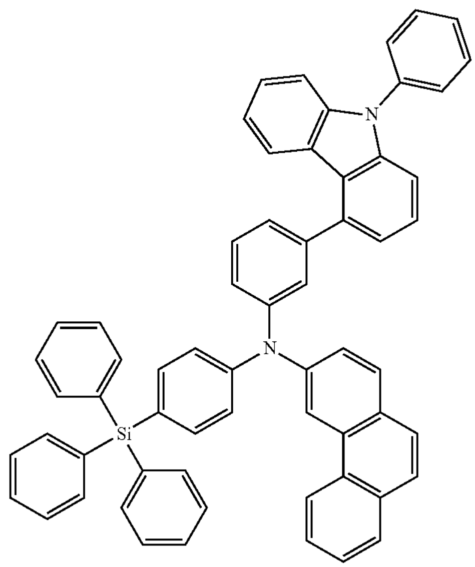
B74
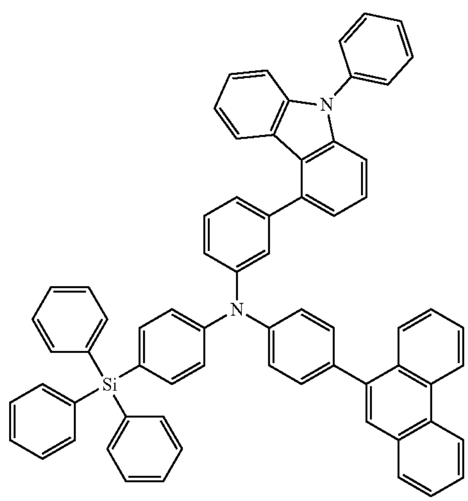

-continued
B75
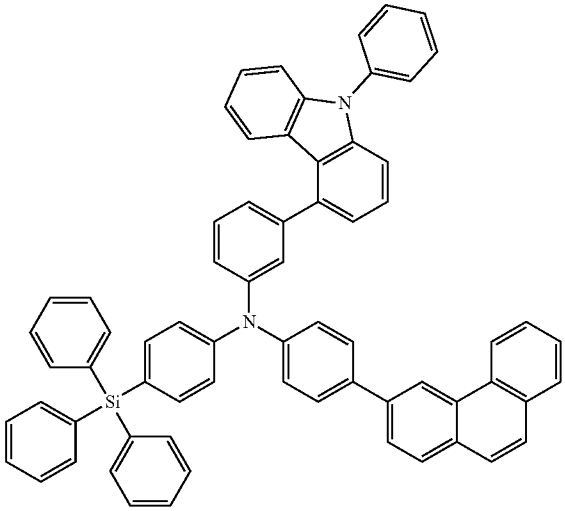
B76
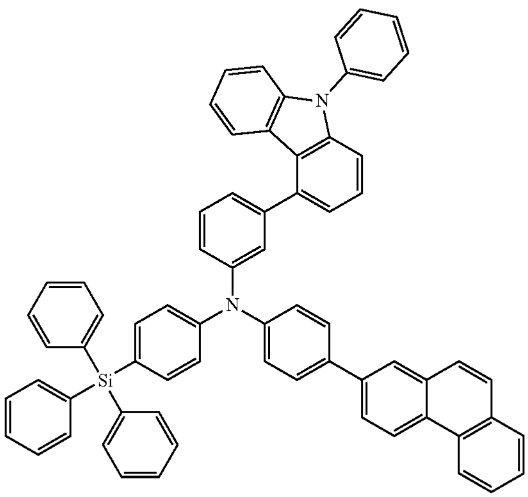
B77
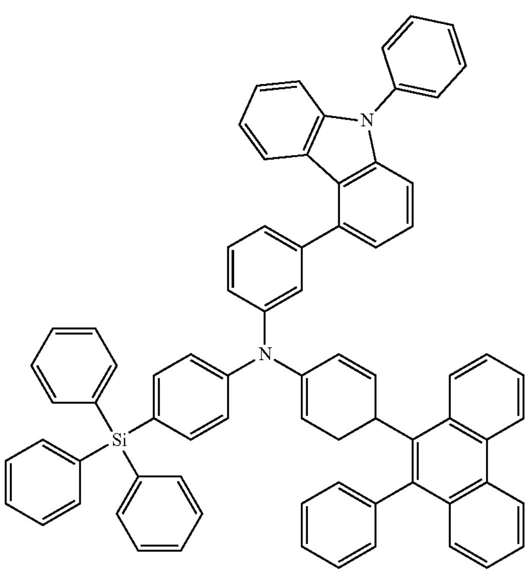
-continued
B78
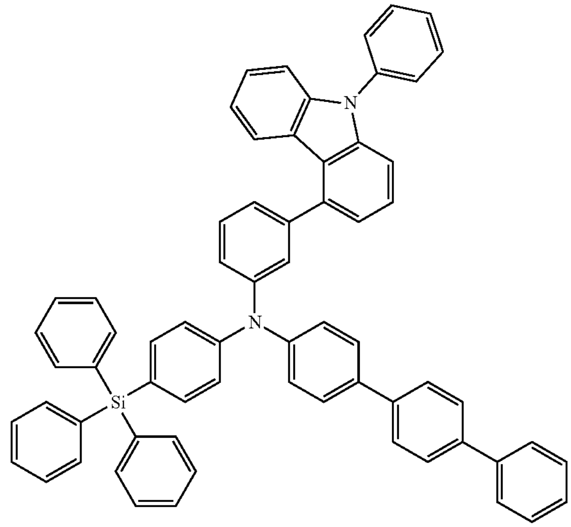
B79
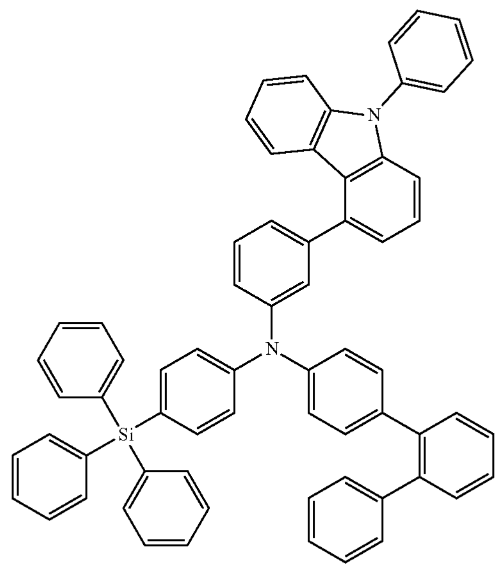
B80
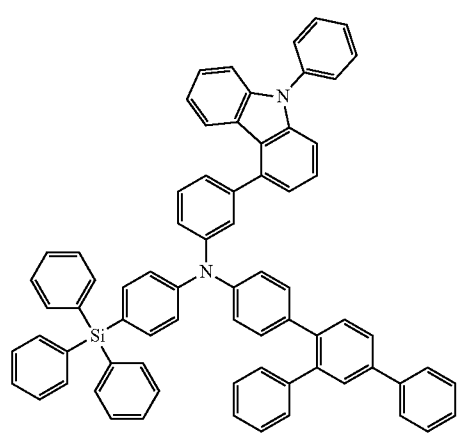

-continued
B81
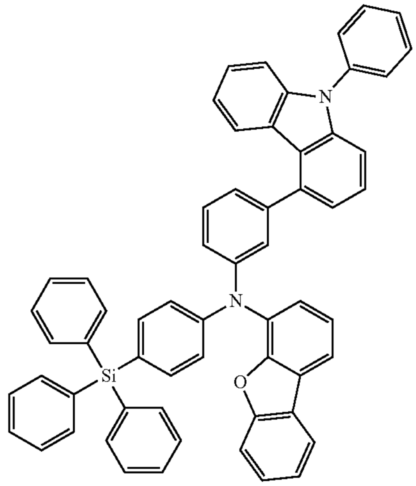
B82
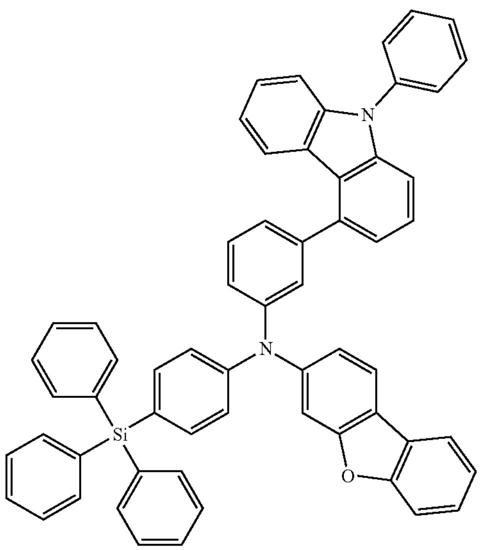
B83
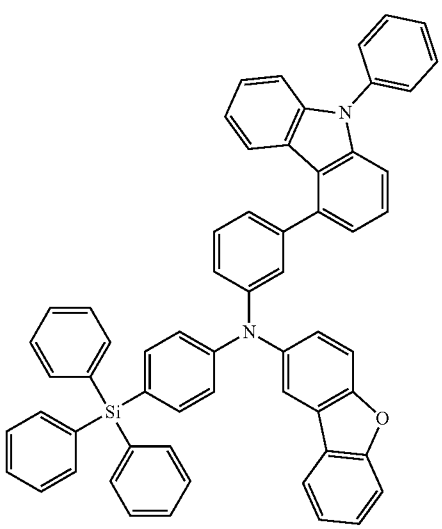
-continued
B84
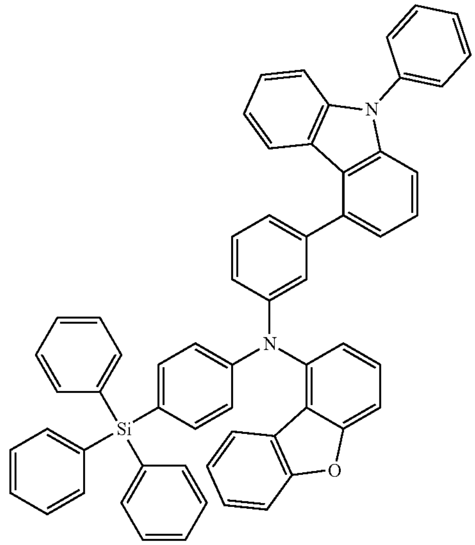
B85
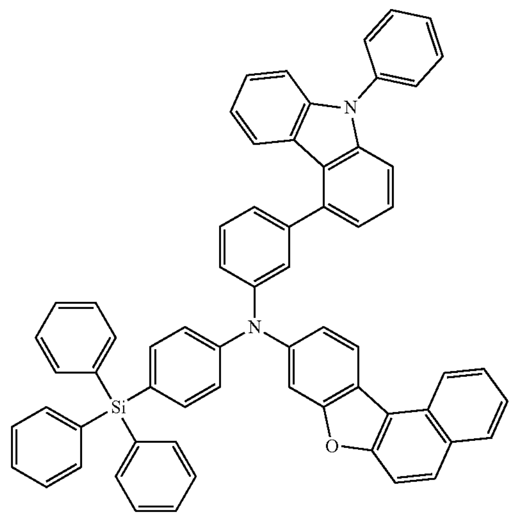
B86
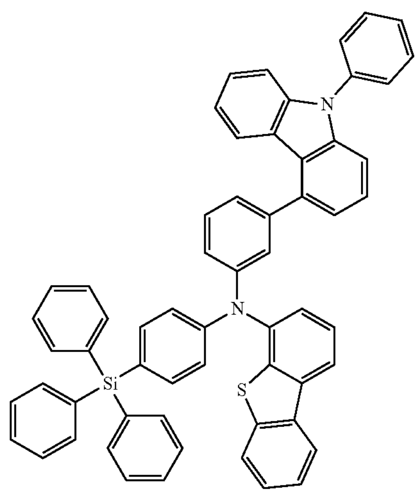

-continued
B87
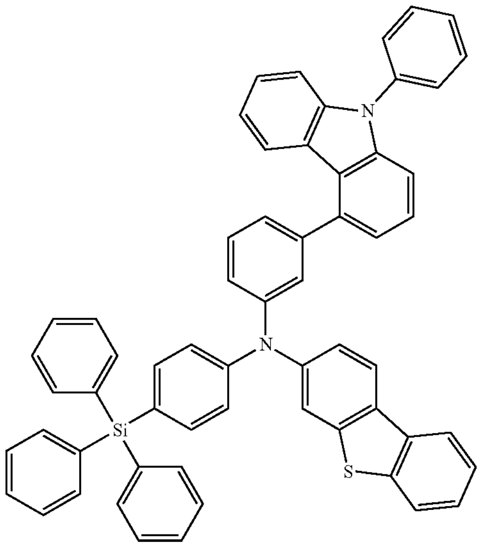
B88
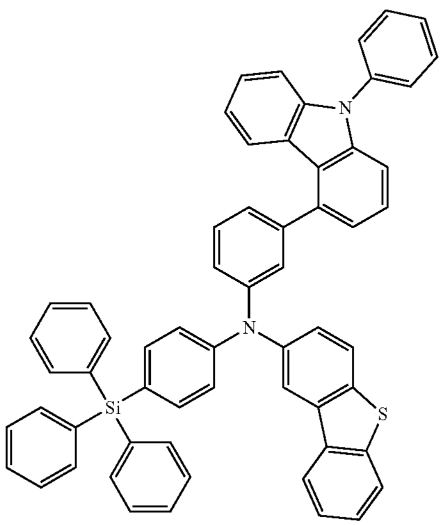
B89
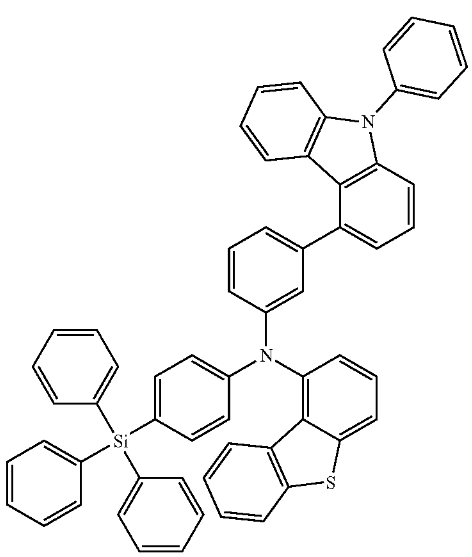
-continued
B90
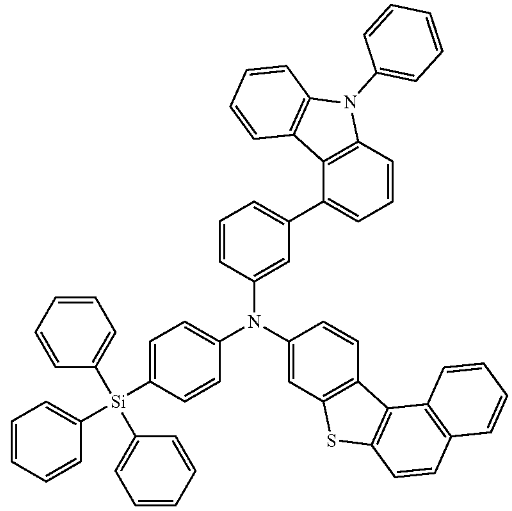
B91
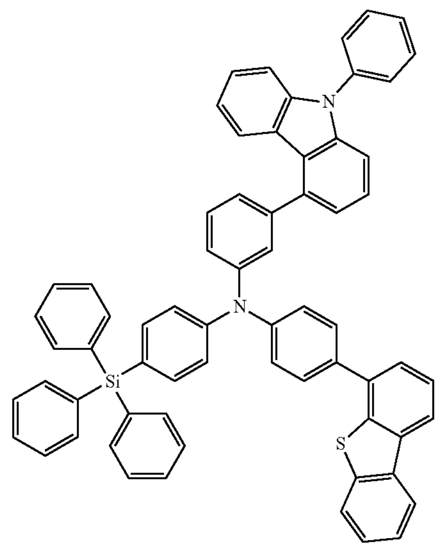
B92
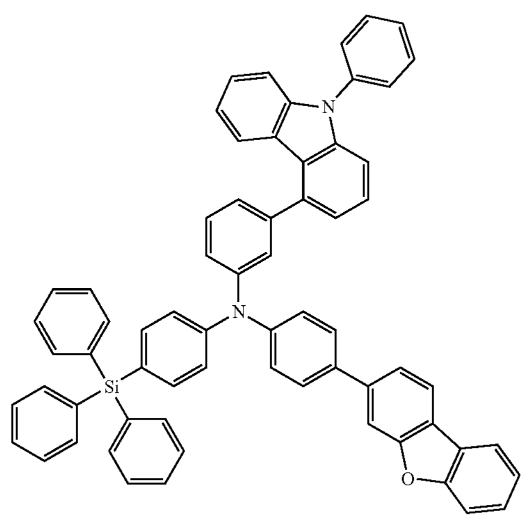

-continued
B93
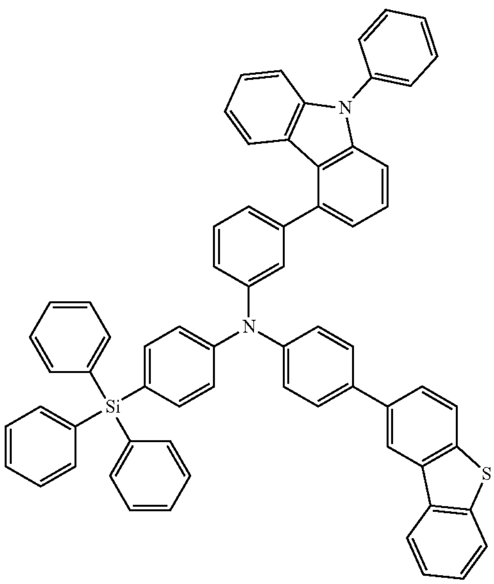
B94
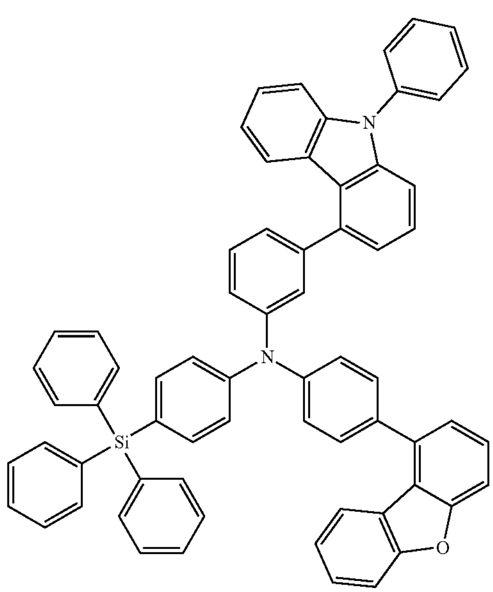
-continued
B95
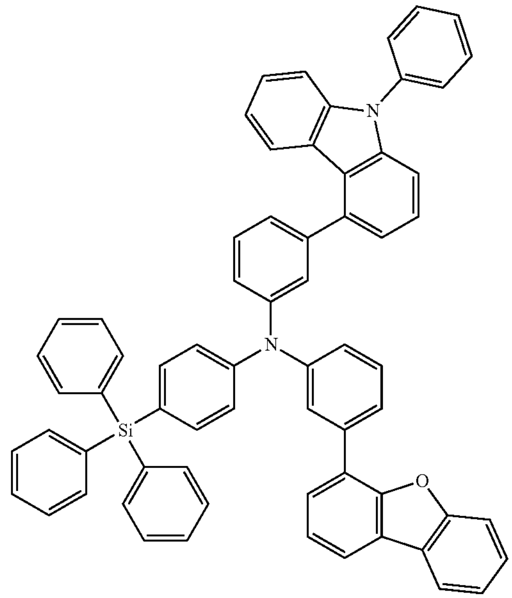
B96
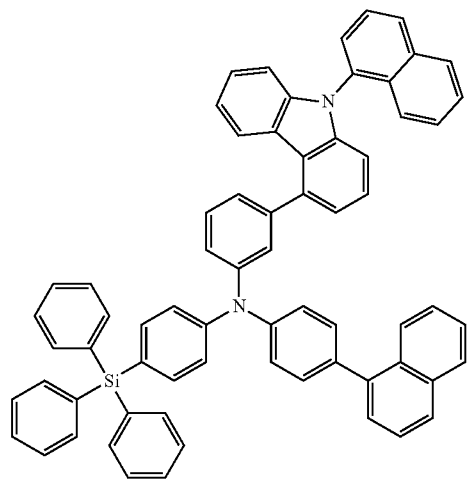
B97
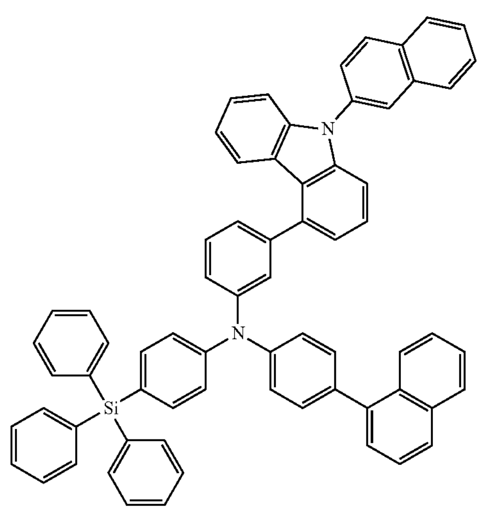

-continued
B98
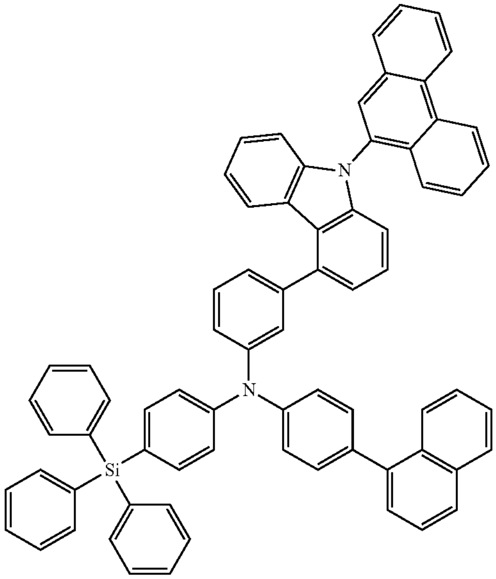
B99
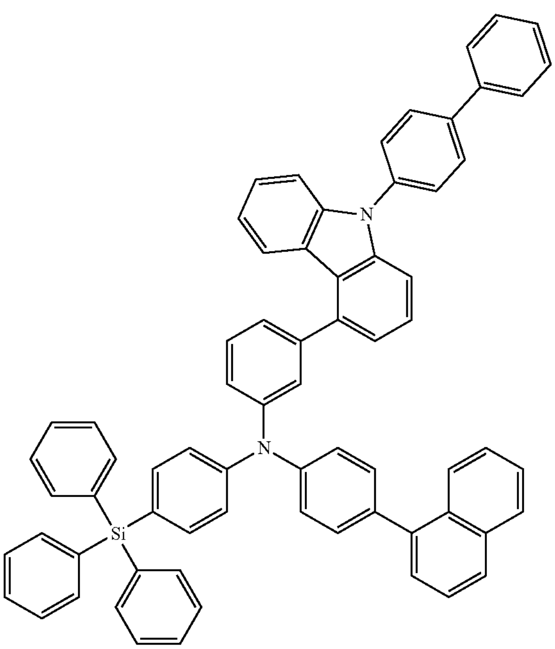
-continued
B100
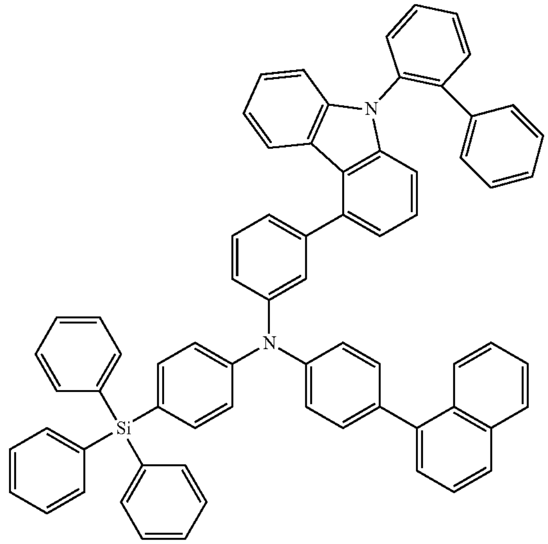
B101
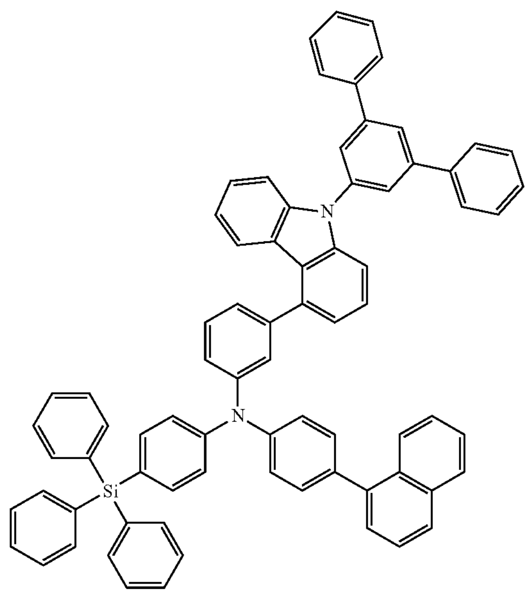
B102
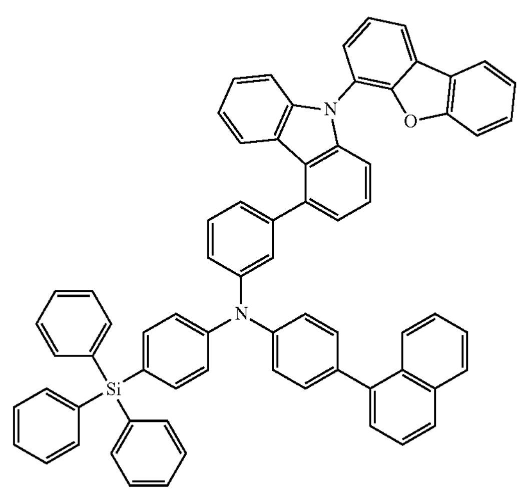

-continued
B103
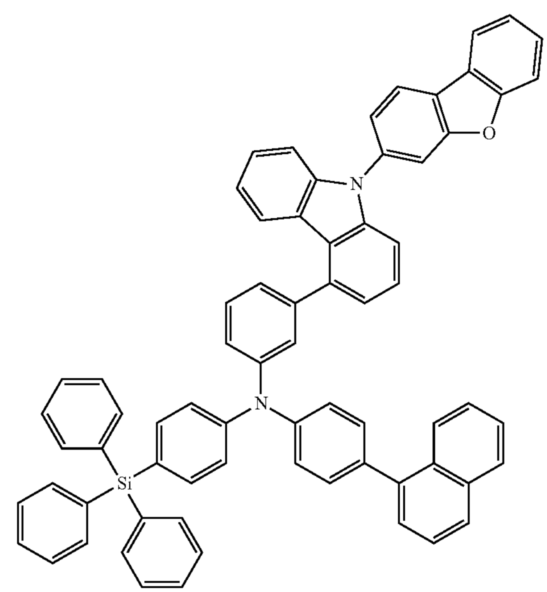
B104
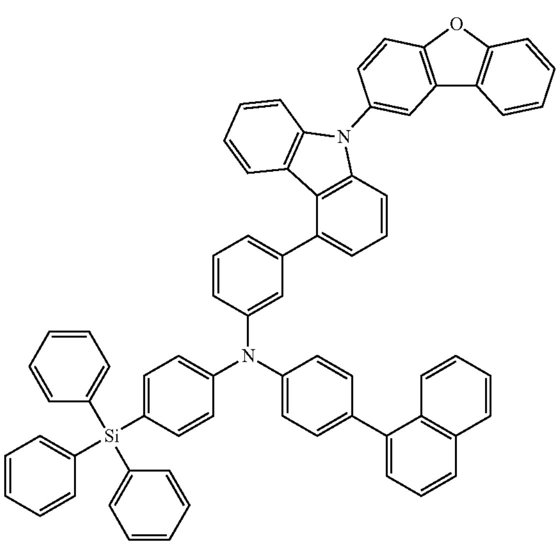
-continued
B105
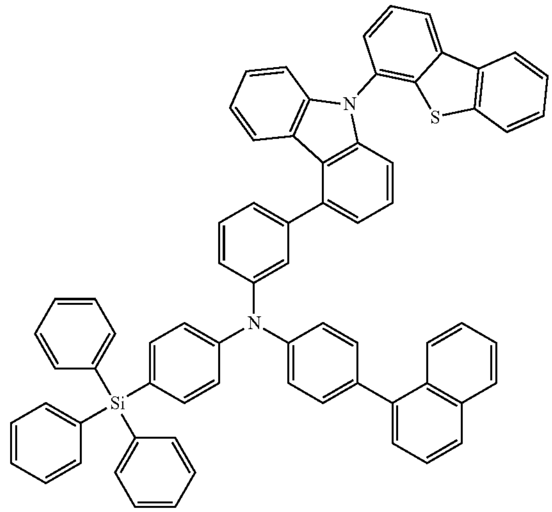
B106
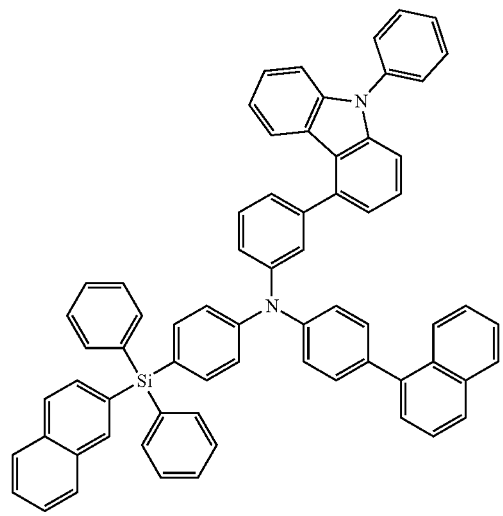
B107
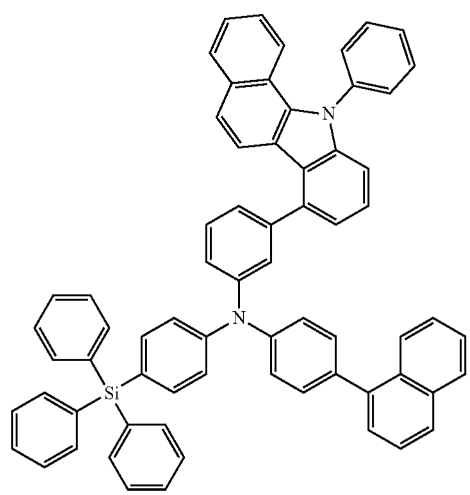

-continued
B108
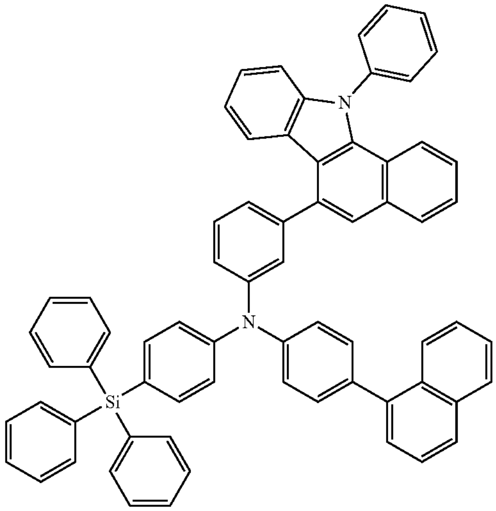
B109
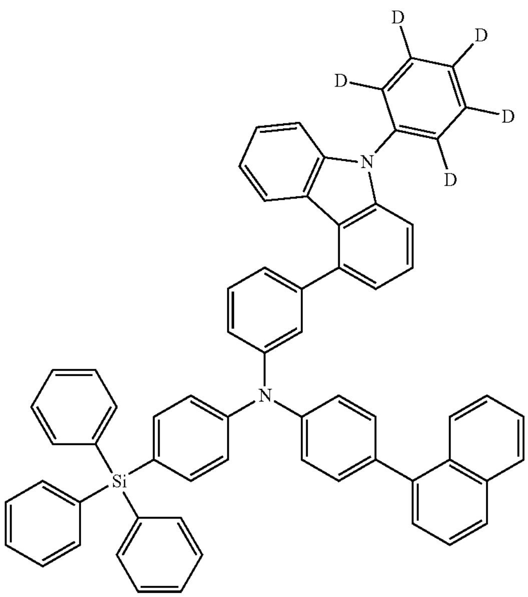
B110
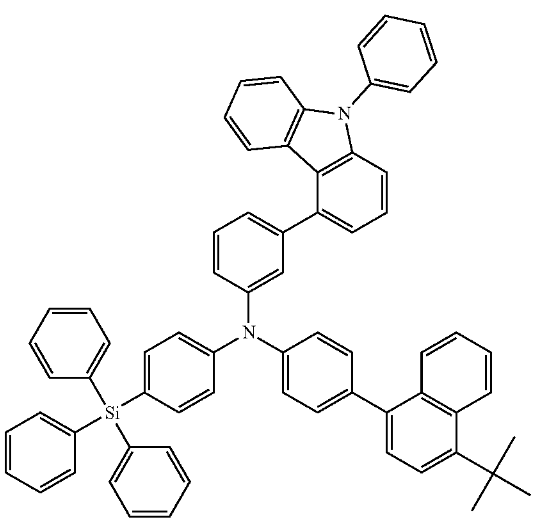
-continued
B111
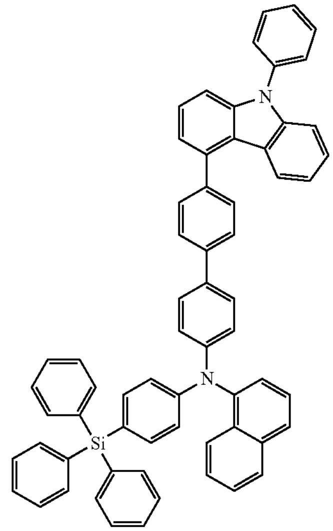
B112
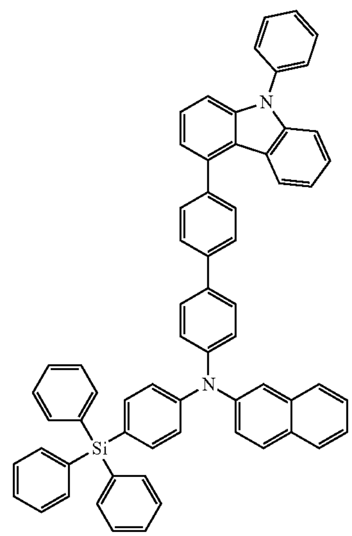
B113
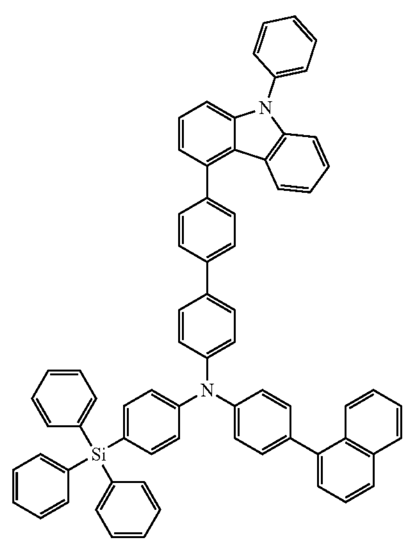

-continued
B114
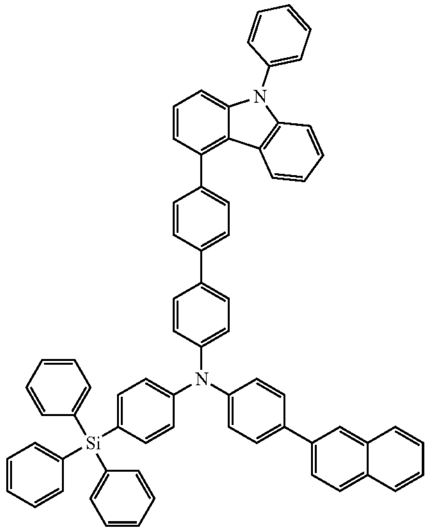
B115
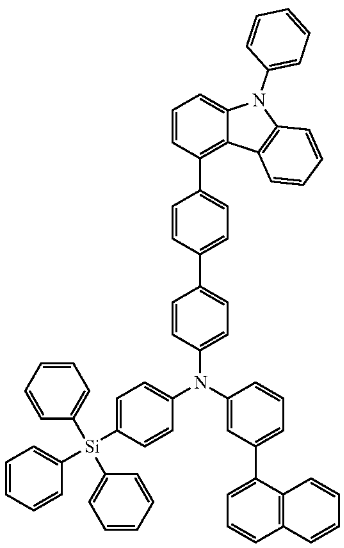
B116
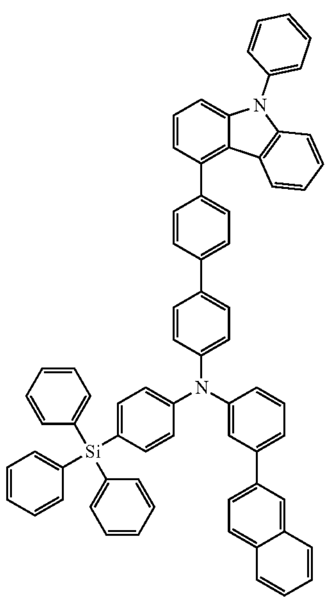
-continued
B117
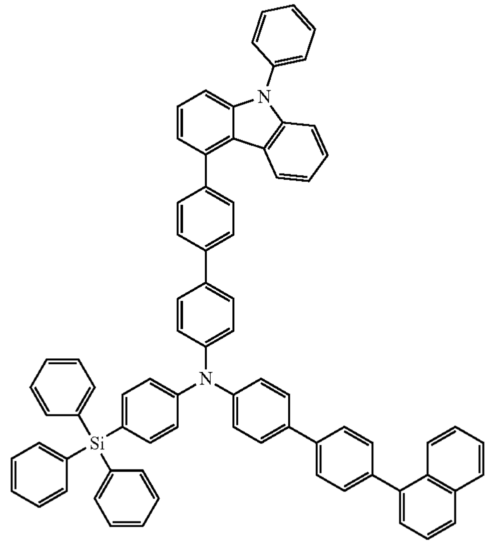
B118
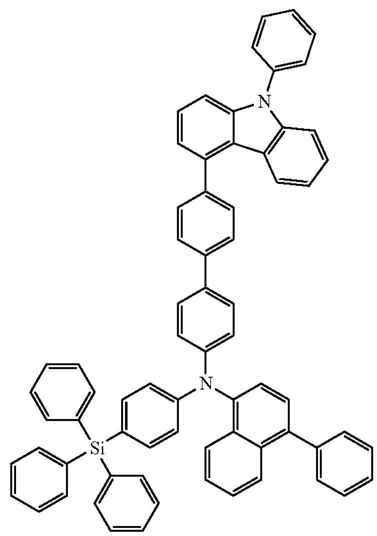
B119
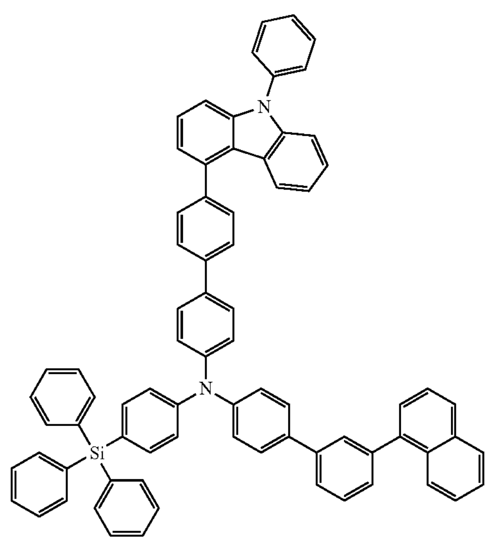

-continued
B120
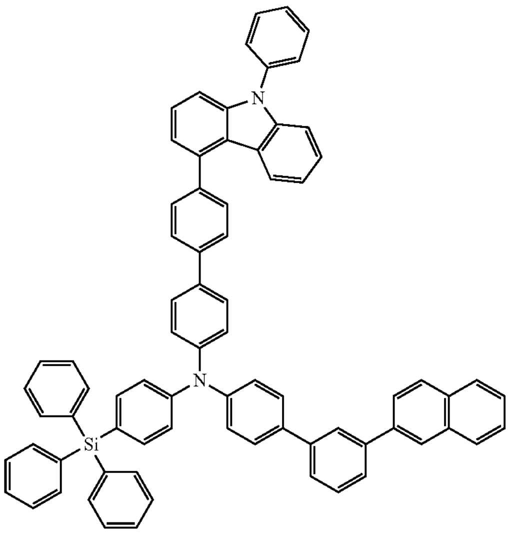
B121
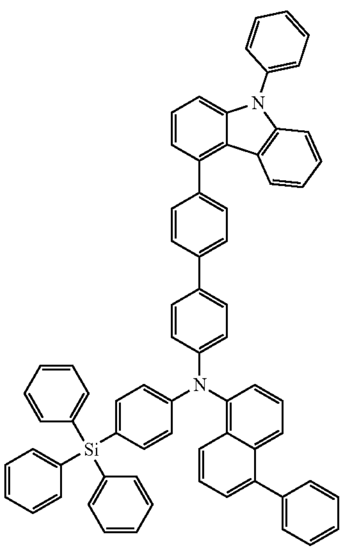
B122
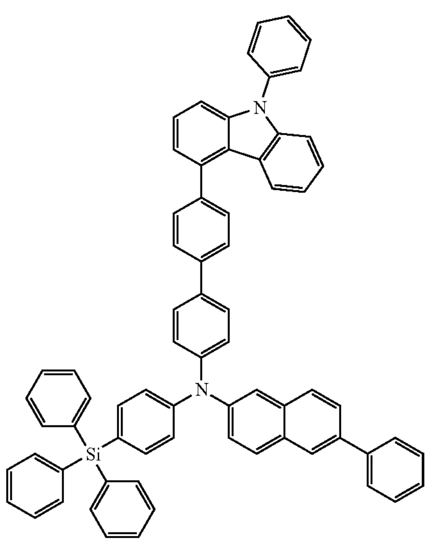
-continued
B123
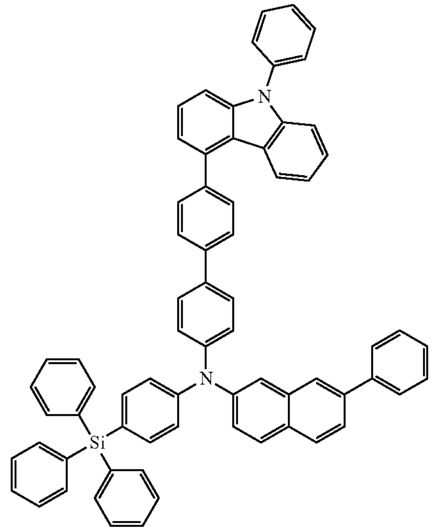
B124
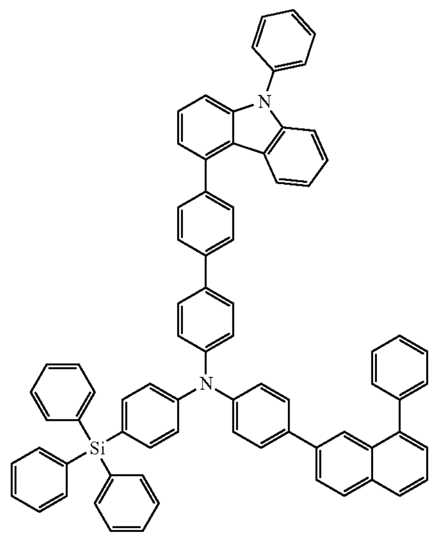
B125
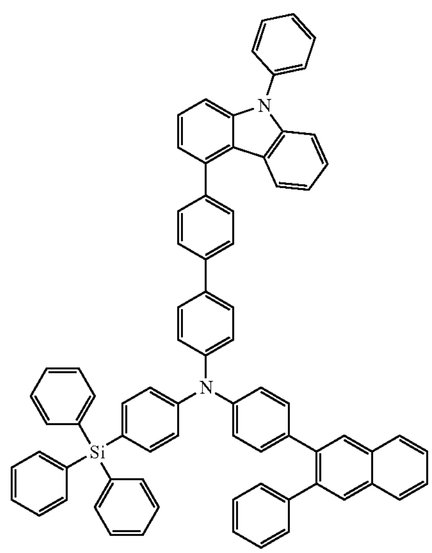

-continued
B126
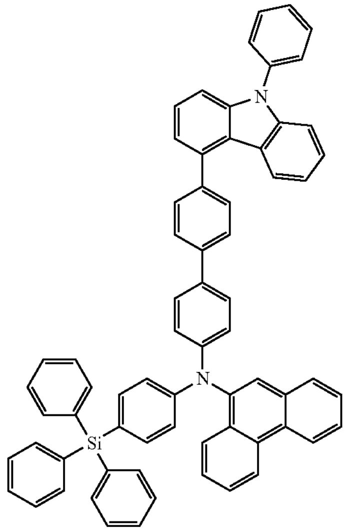
B127
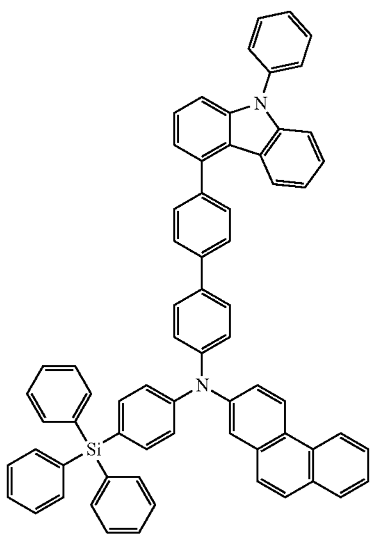
B128
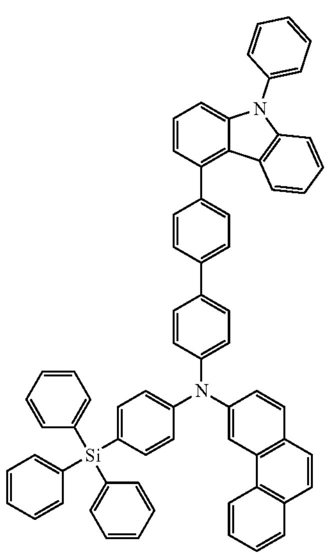
-continued
B129
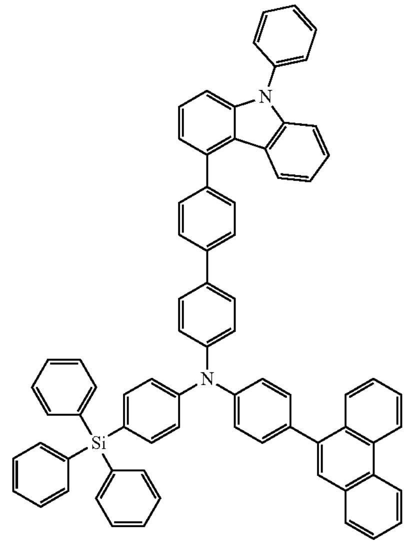
B130
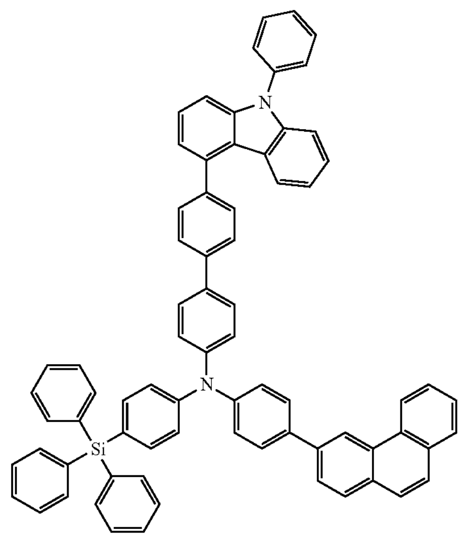
B131
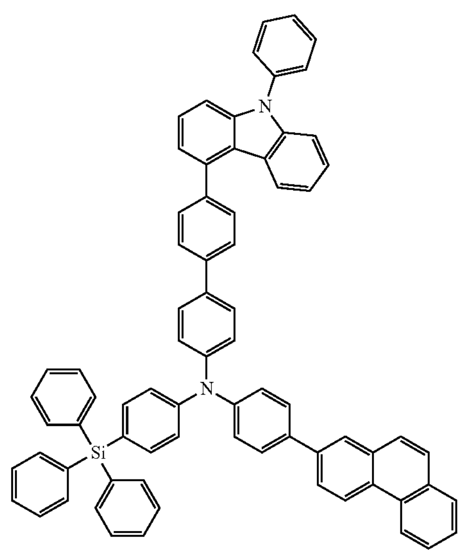

B132
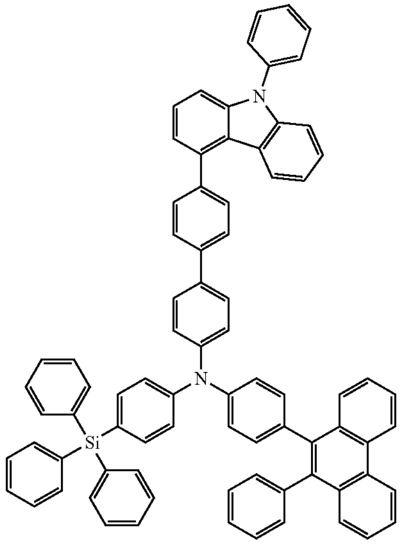
B133
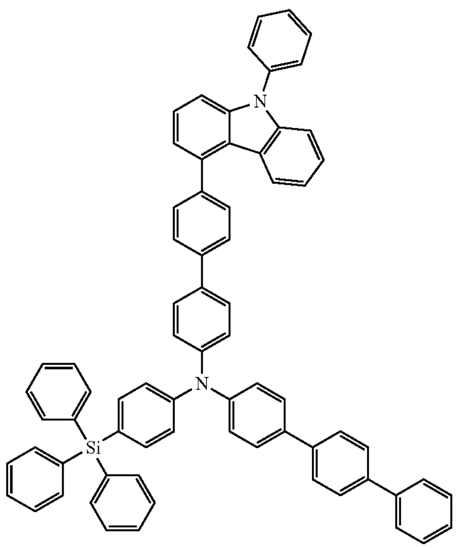
B134
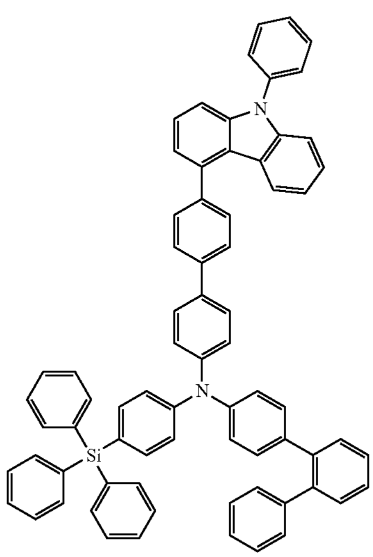
B135
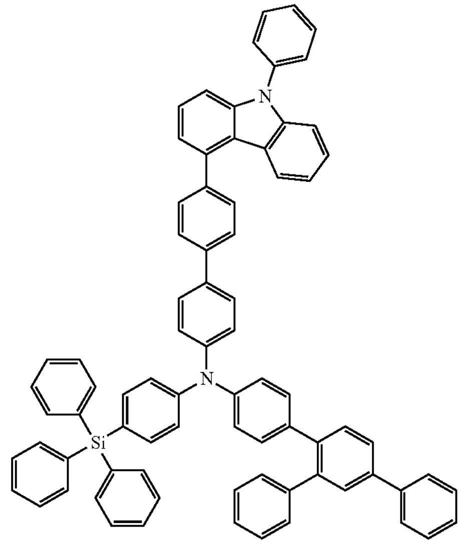
B136
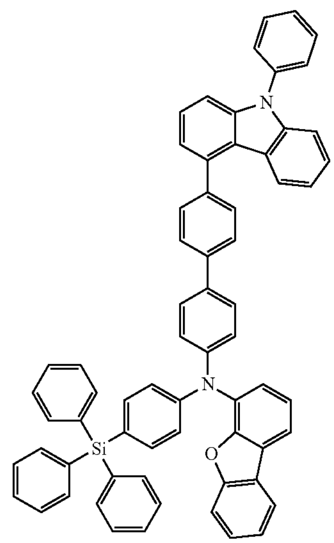
B137
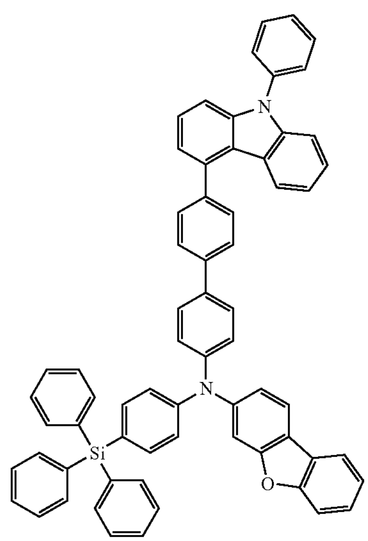

-continued
B138
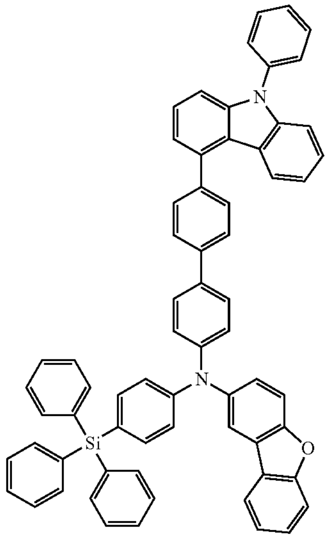
B139
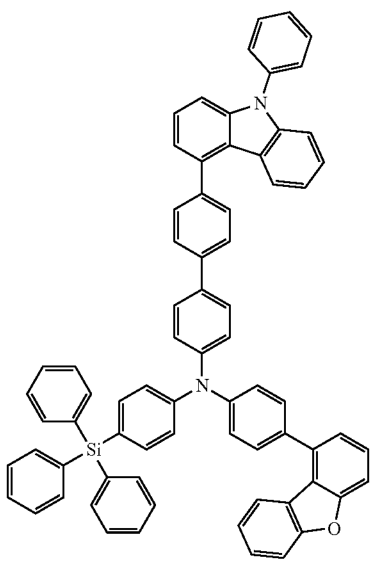
B140
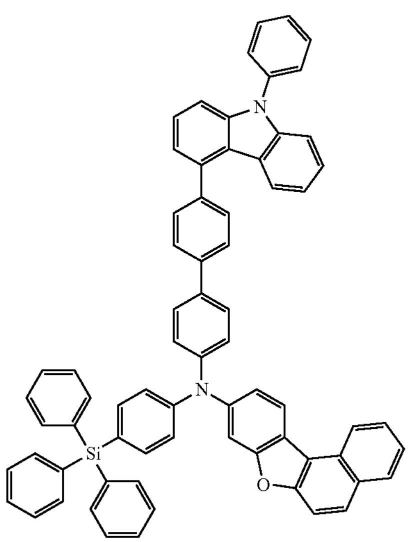
-continued
B141
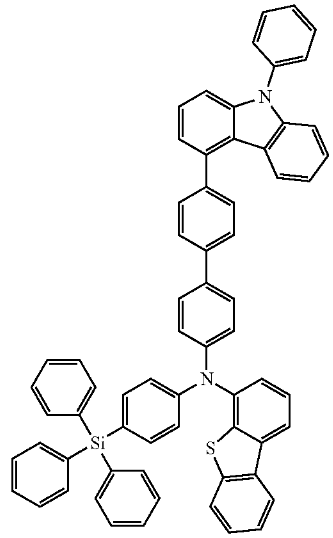
B142
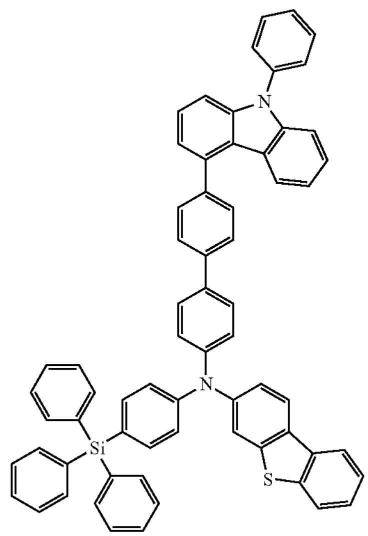
B143
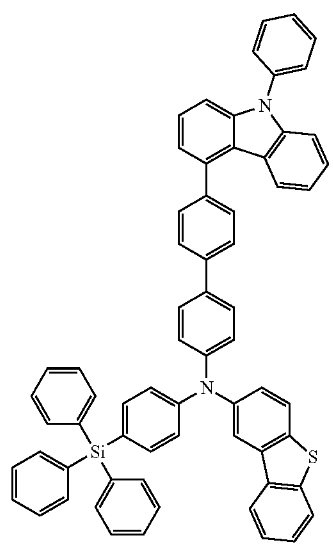

B144
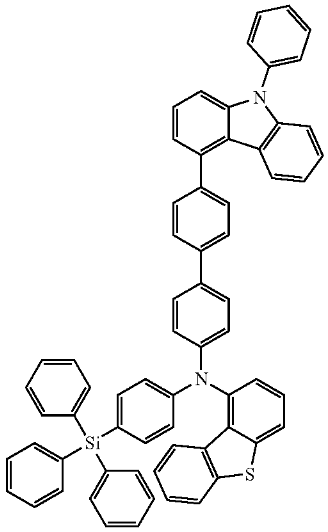
B145
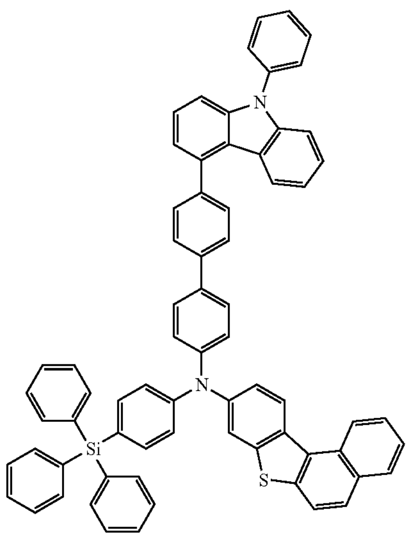
B146
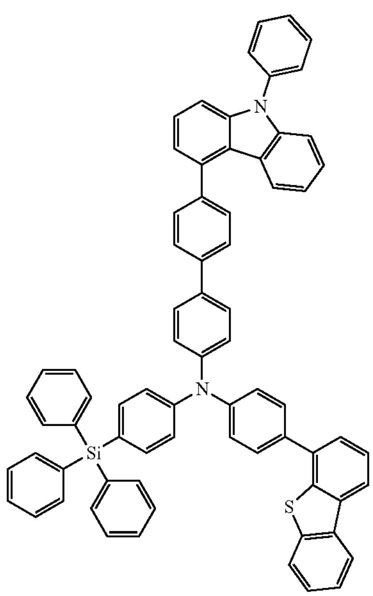
B147
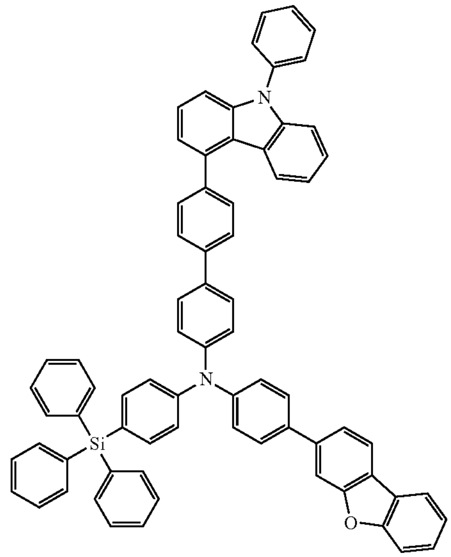
B148
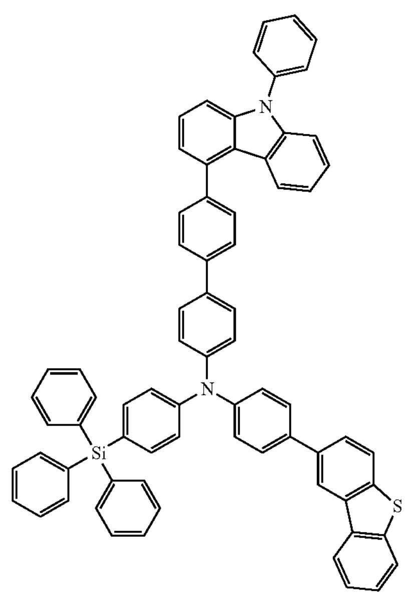

-continued
B149
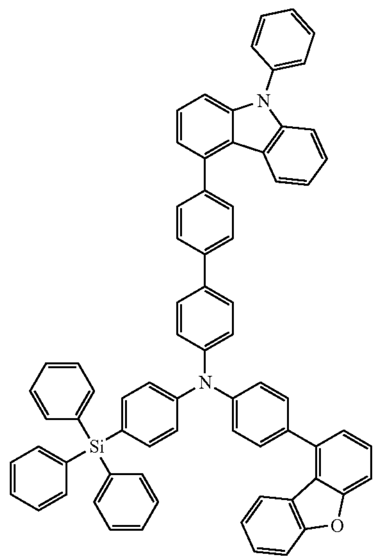
B150
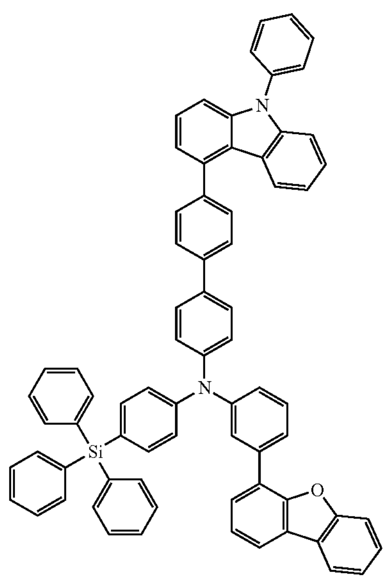
B151
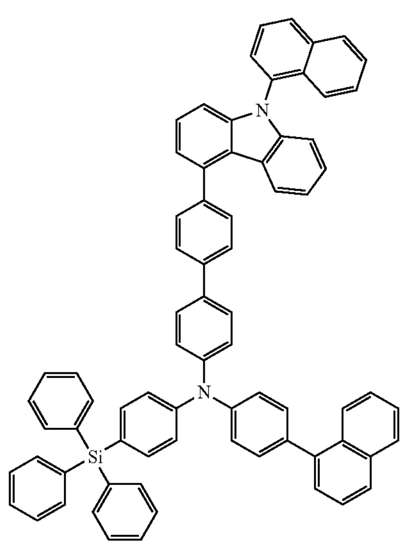
-continued
B152
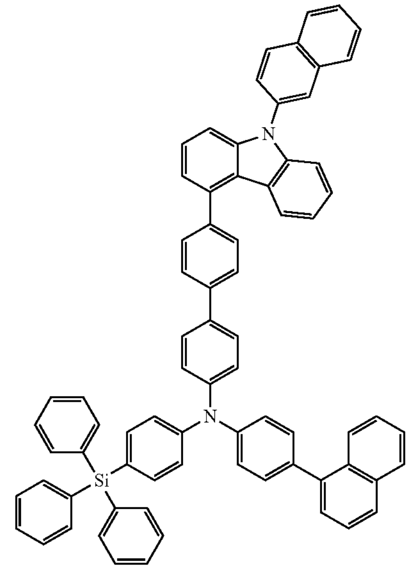
B153
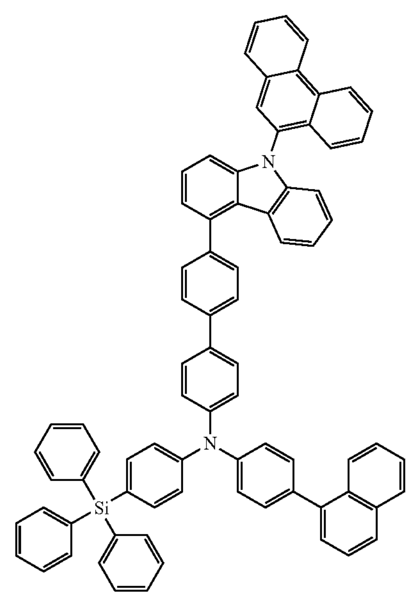

-continued
B154
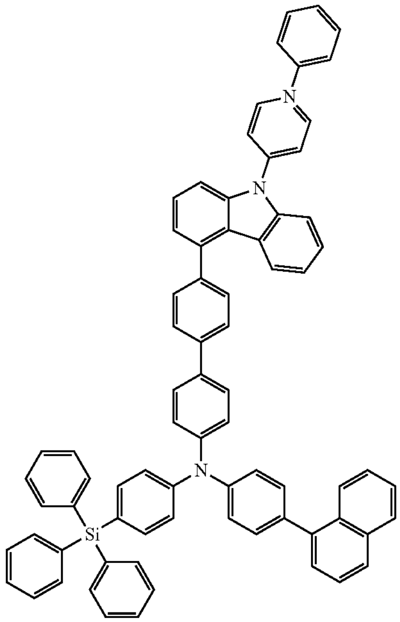
B155
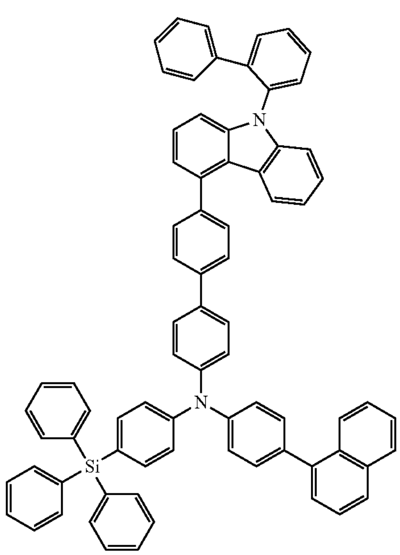
-continued
B156
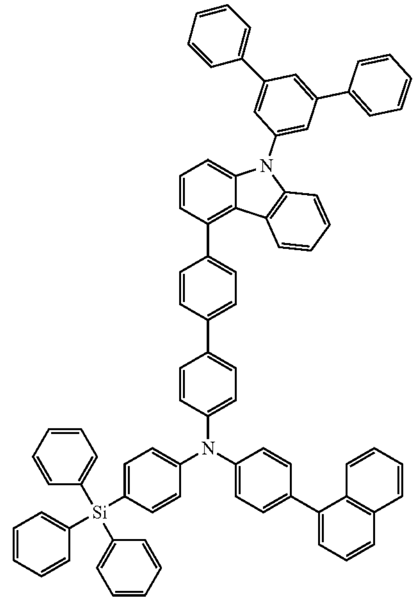
B157
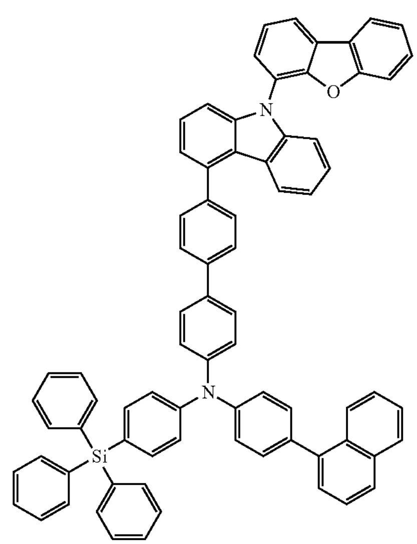

-continued
B158
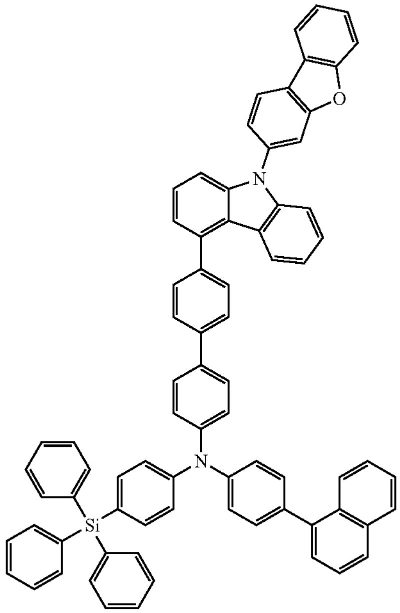
B159
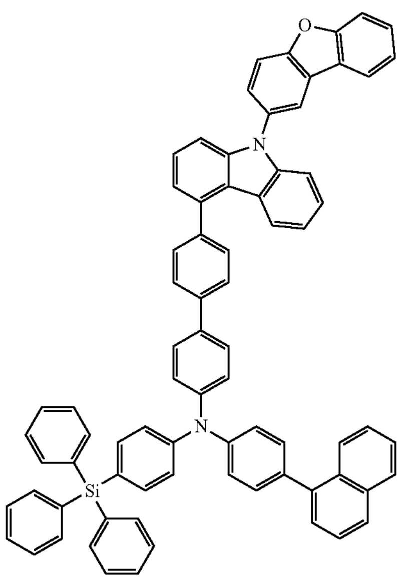
-continued
B160
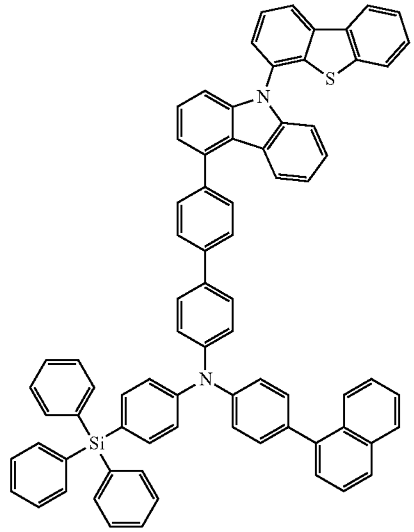
B161
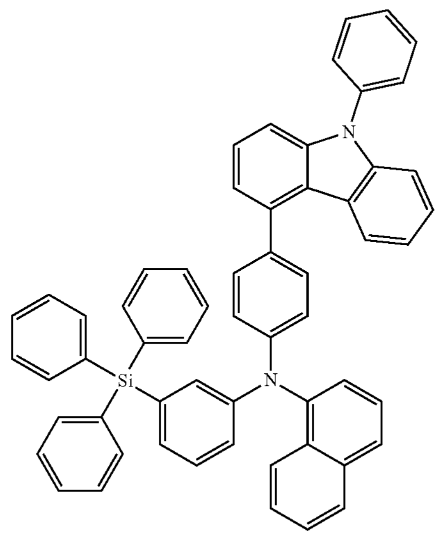
B162
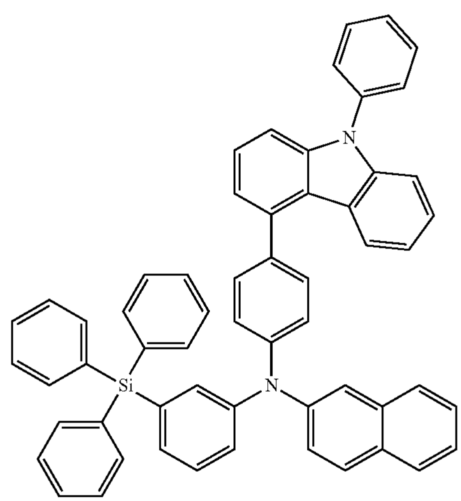

-continued
B163
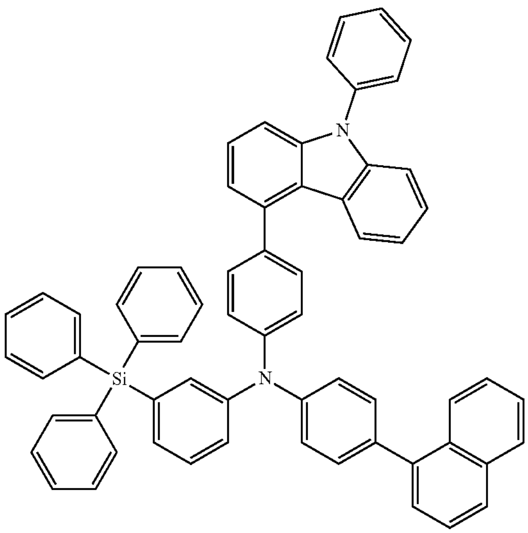
B165
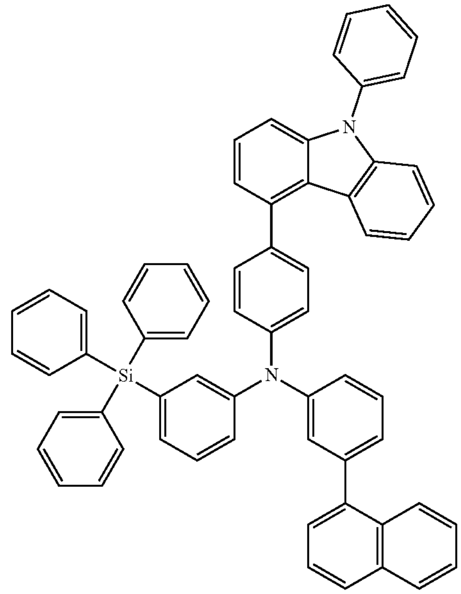
B164
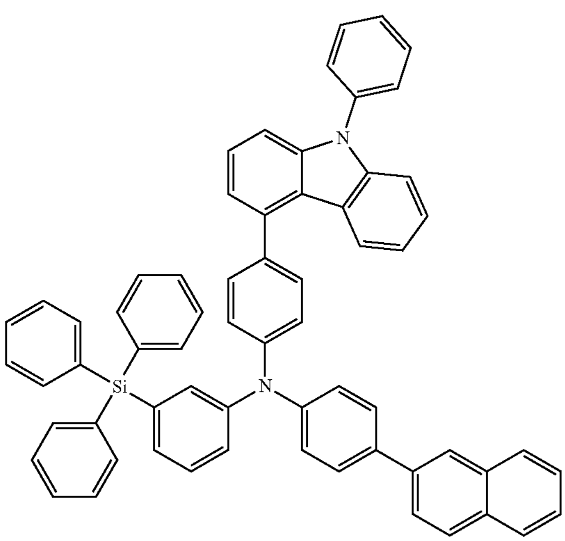
B166
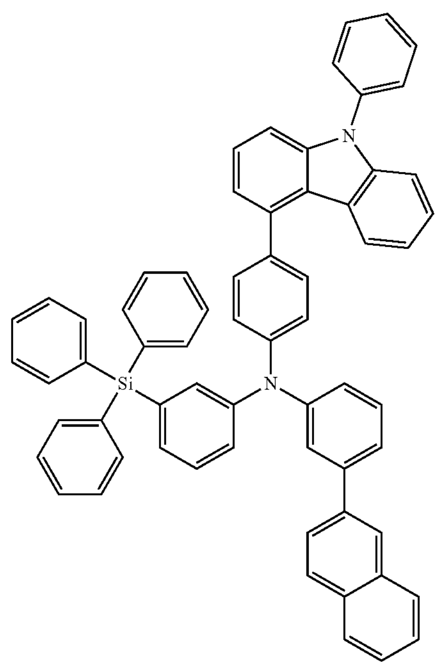

-continued
B167
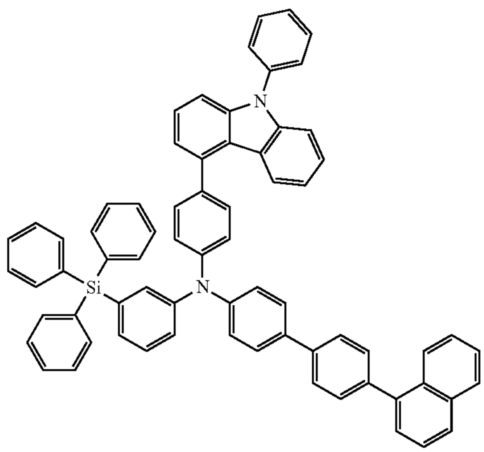
B168
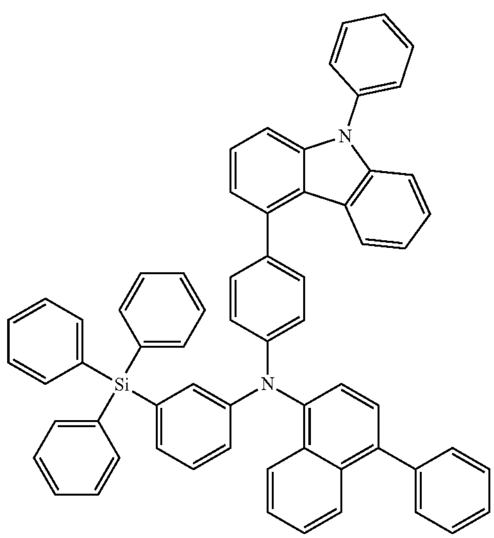
B169
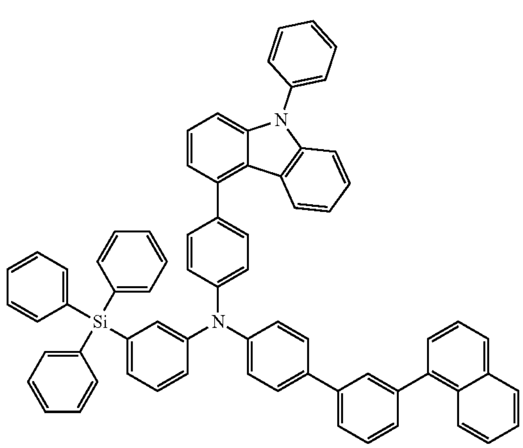
-continued
B170
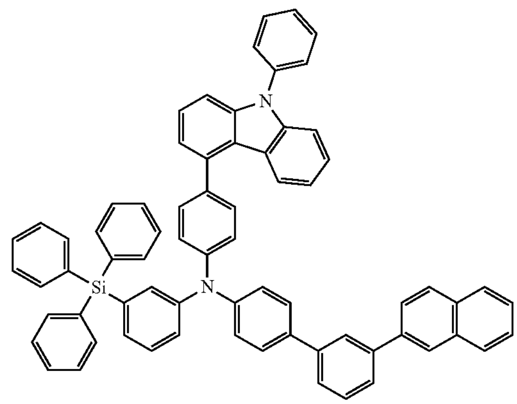
B171
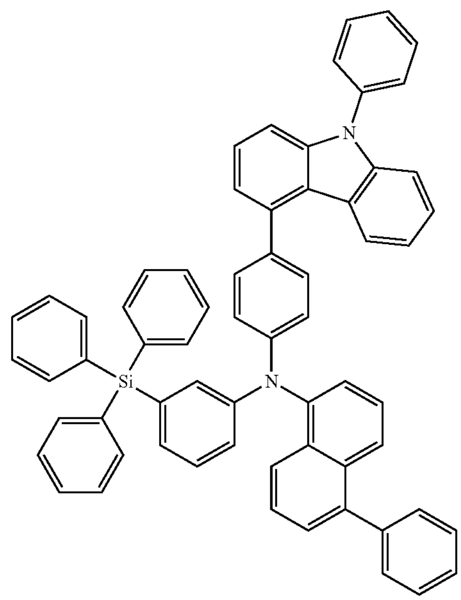
B172
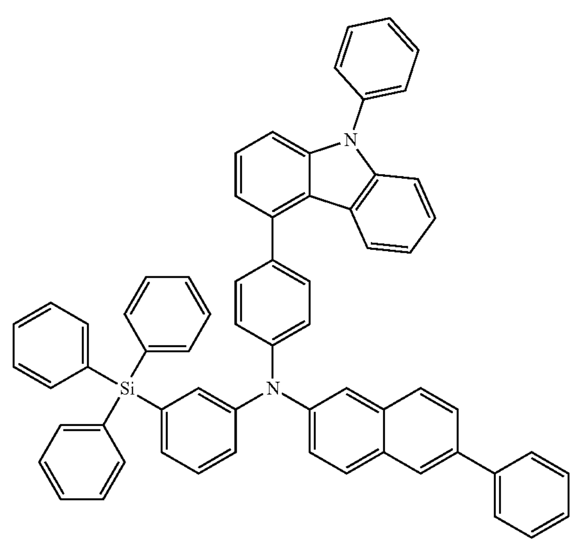

-continued
B173
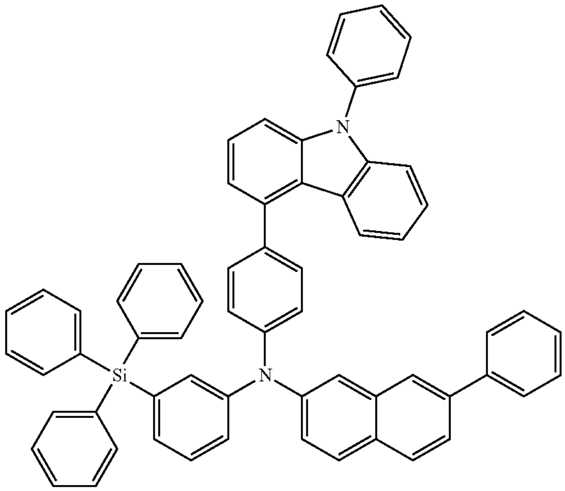
B174
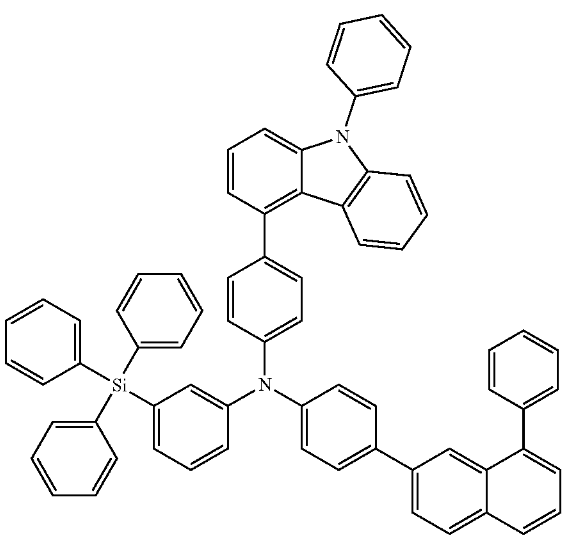
-continued
B175
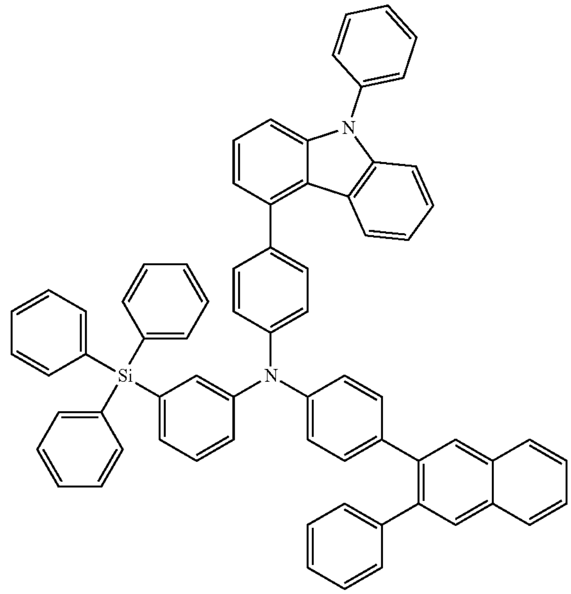
B176
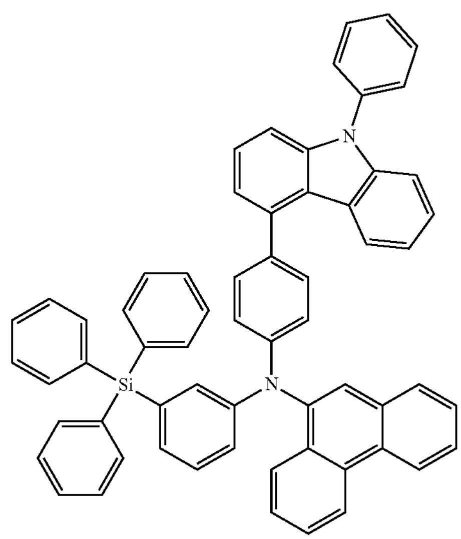

-continued
B177
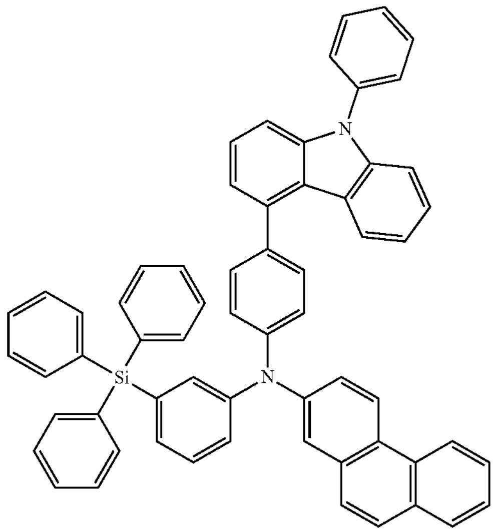
B178
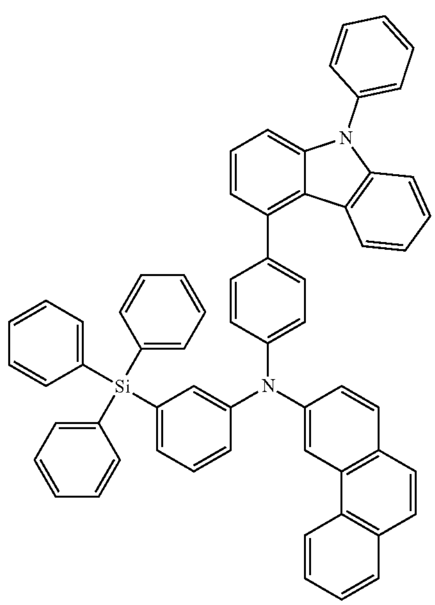
-continued
B179
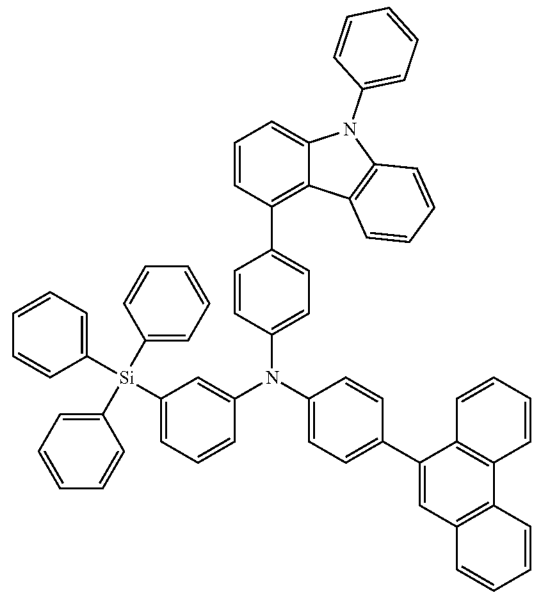
B180
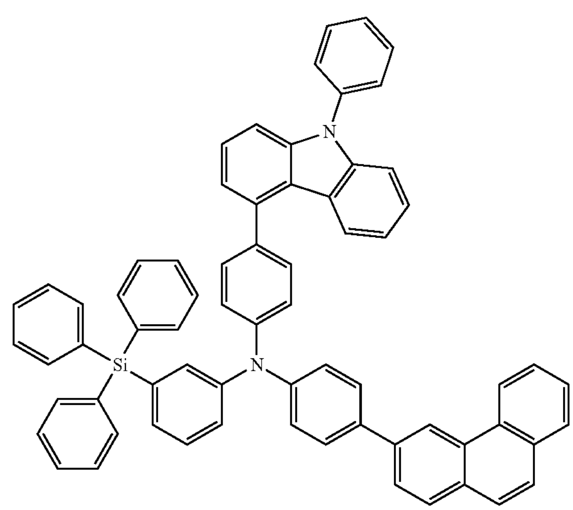

-continued
B181
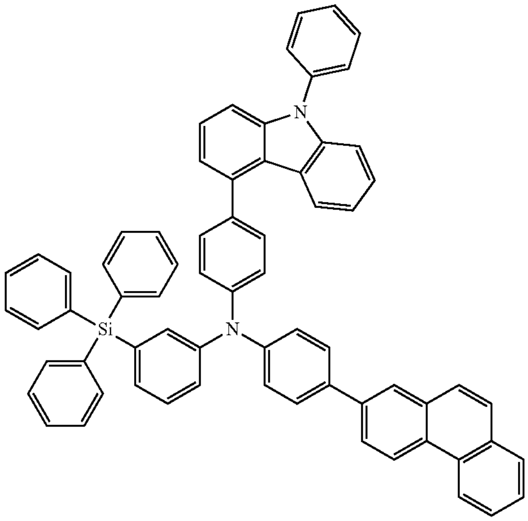
B182
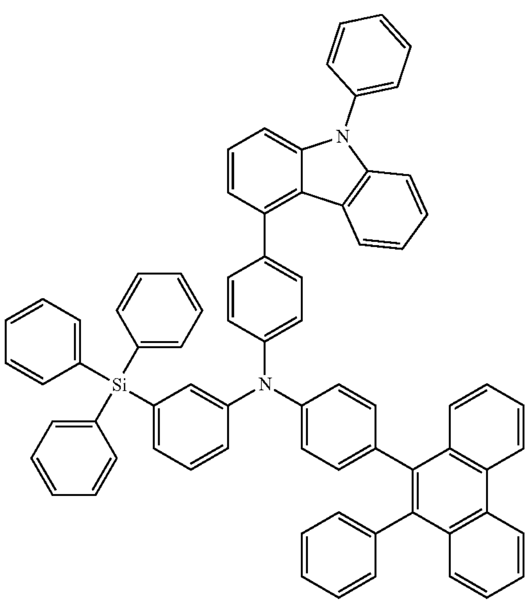
-continued
B183
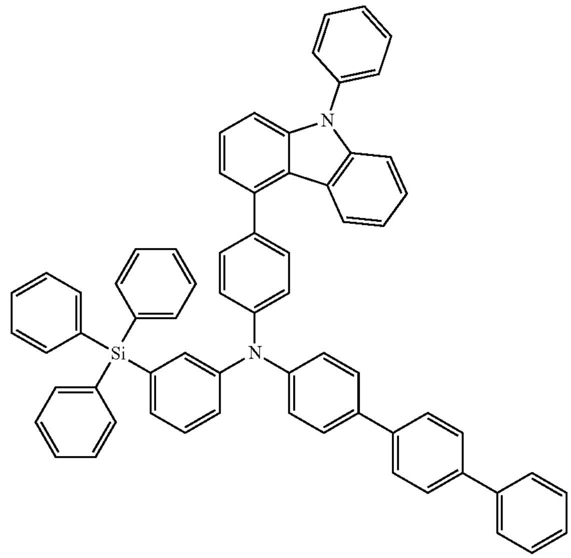
B184
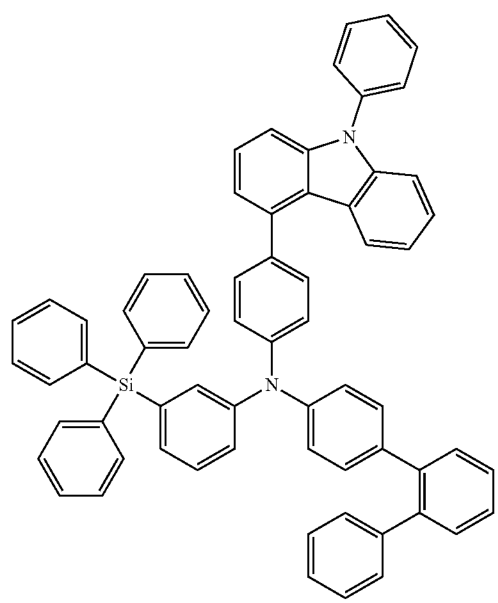

-continued
B185
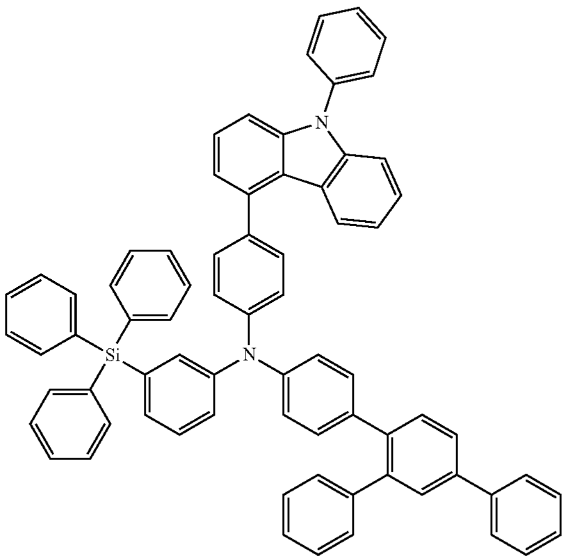
B186
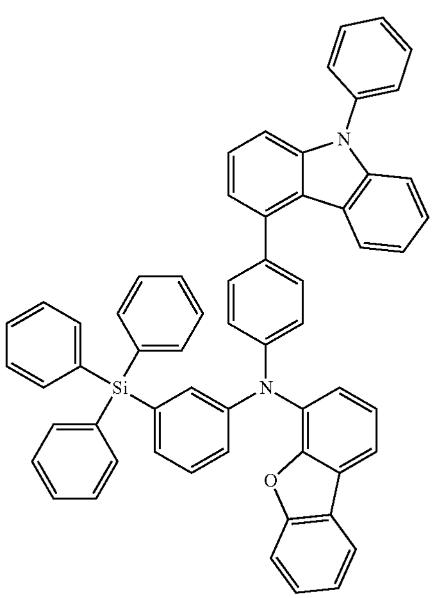
-continued
B187
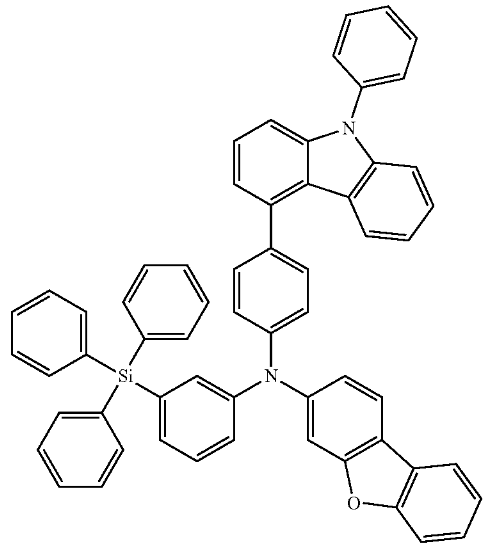
B188
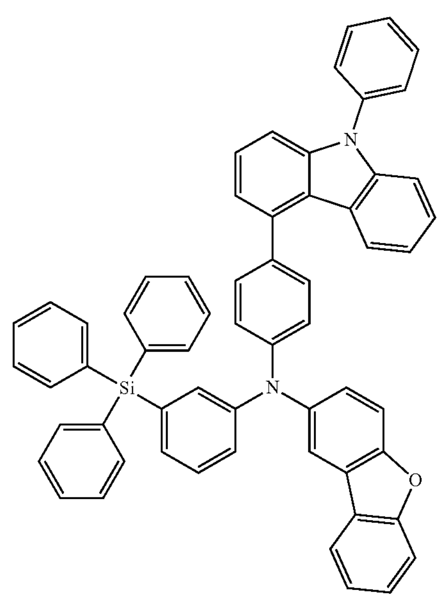

-continued
B189
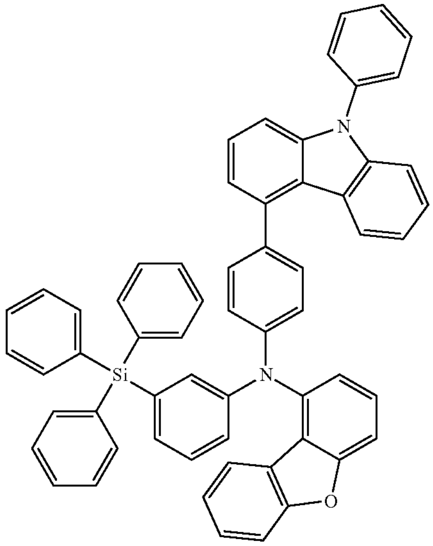
B190
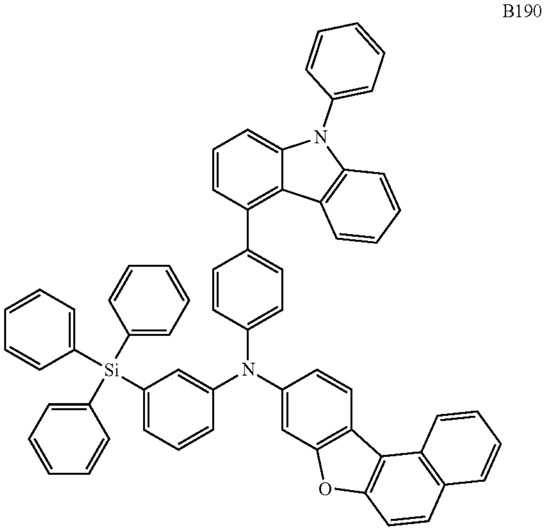
B191
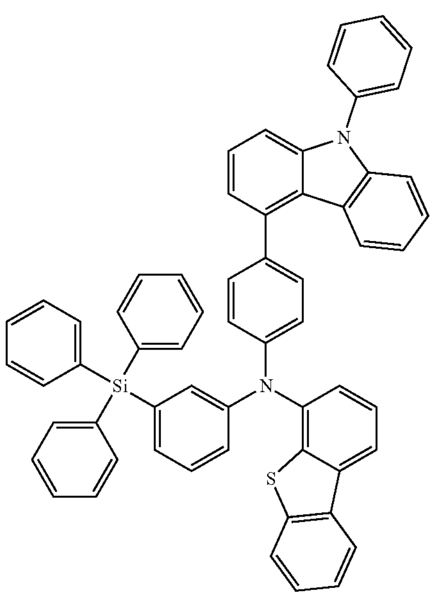
-continued
B192
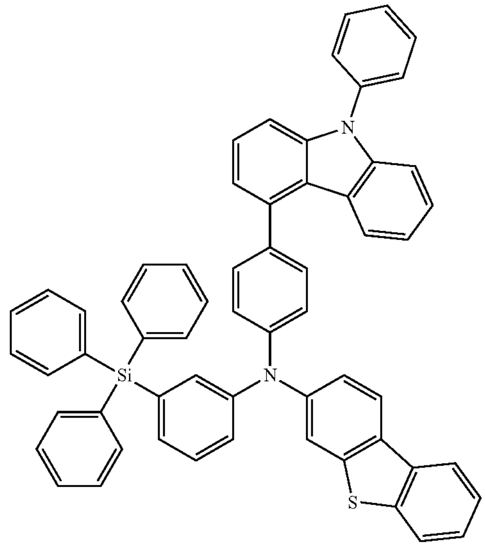
B193
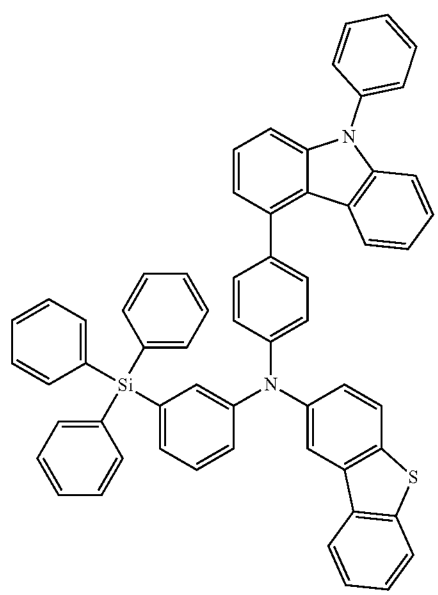

-continued
B194
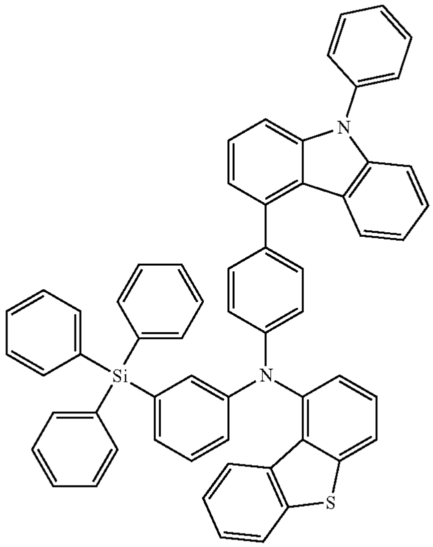
B195
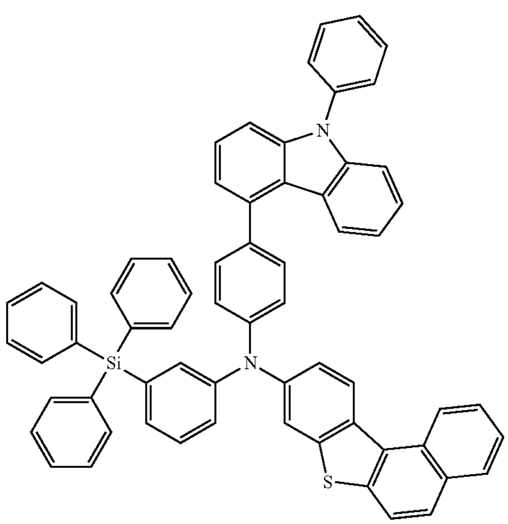
-continued
B196
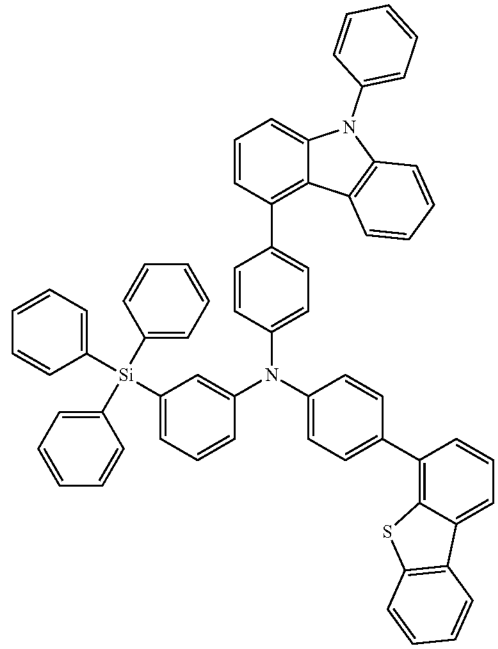
B197
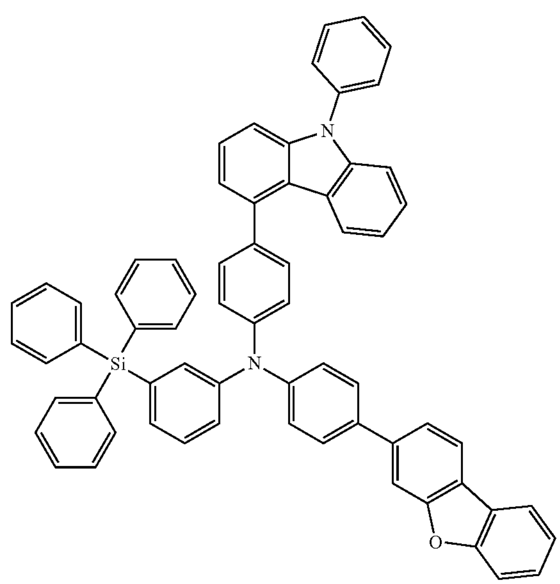

-continued
B198
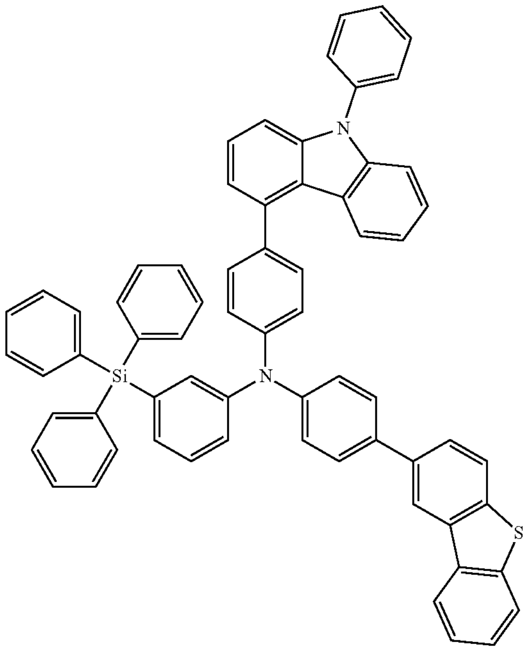
B199
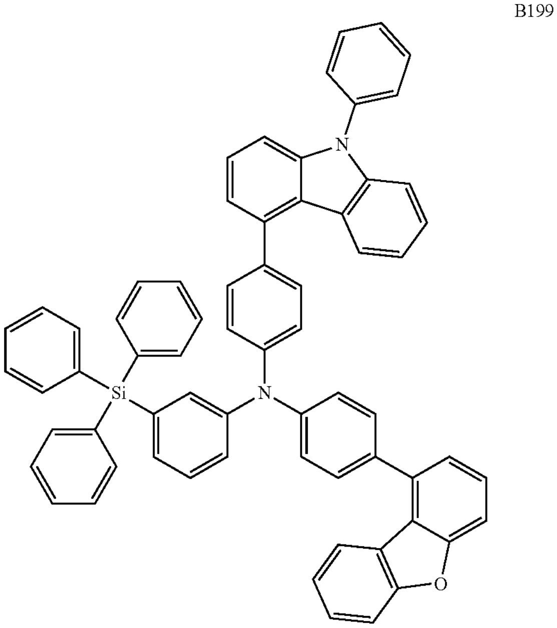
-continued
B200
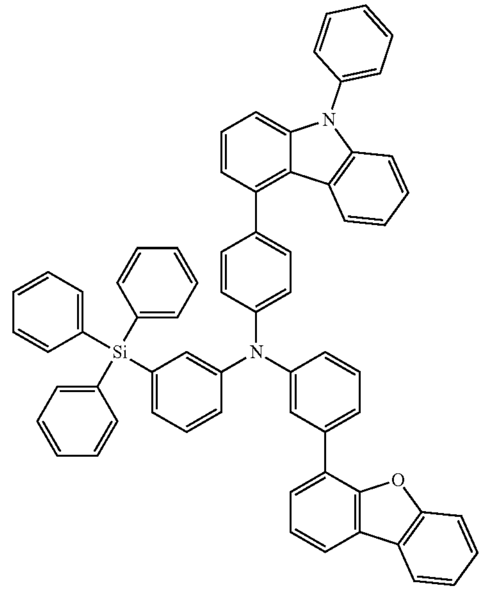
B201
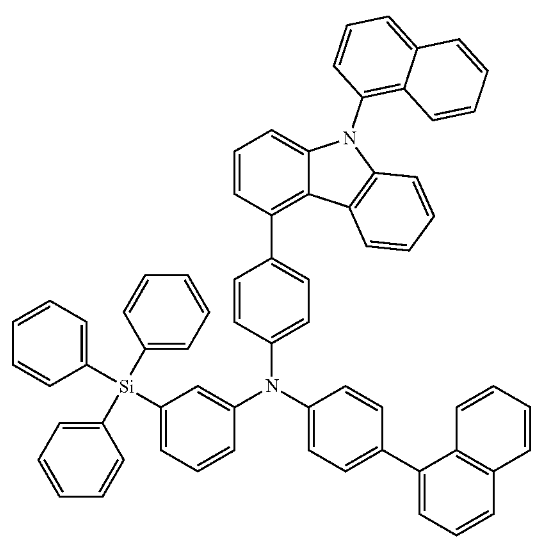

B202
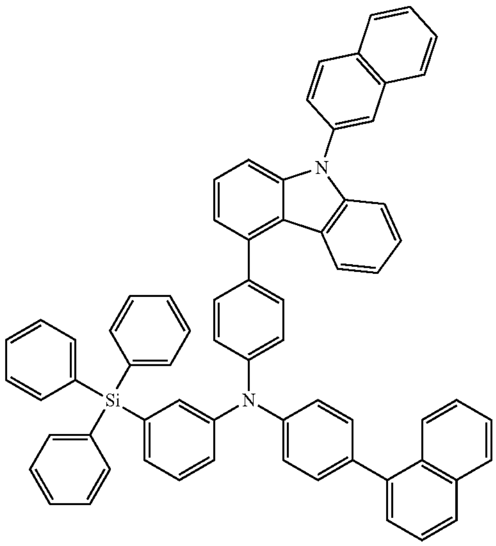
B203
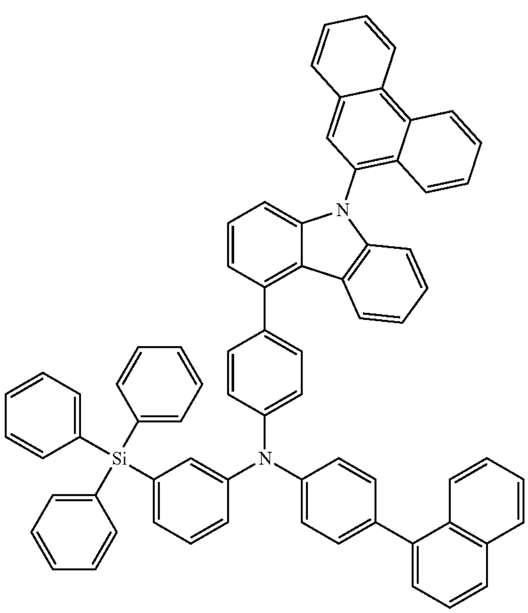
B204
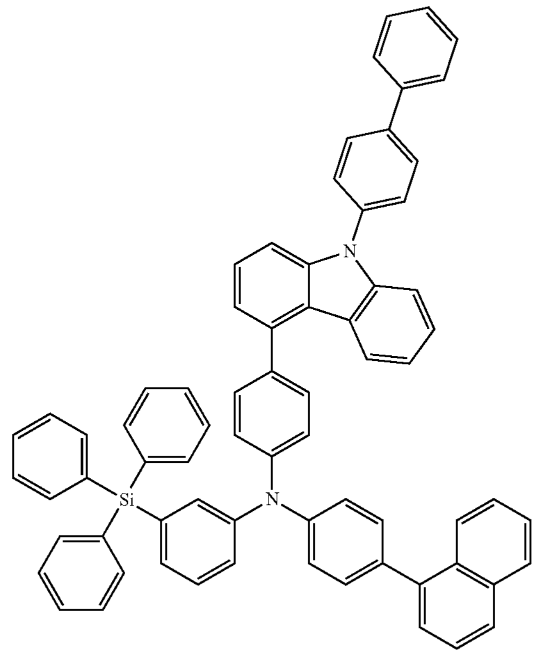
B205
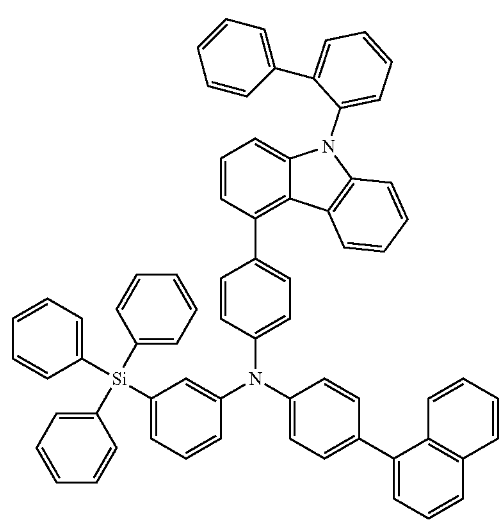

-continued
B206
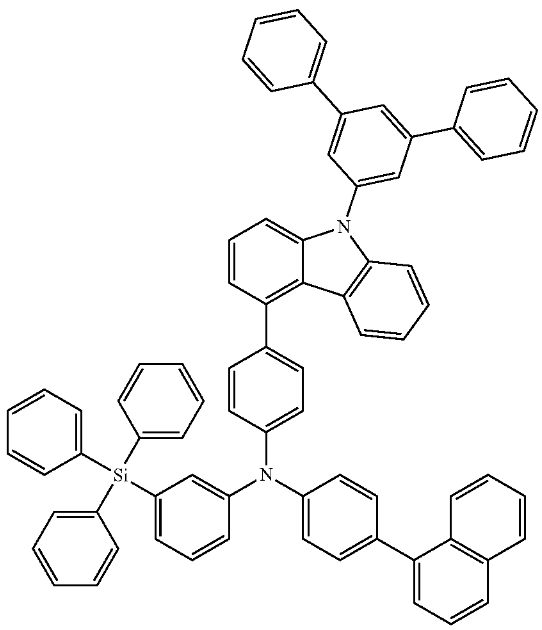
B207
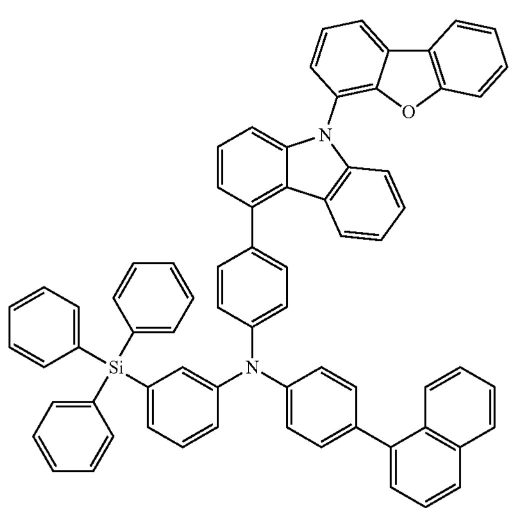
-continued
B208
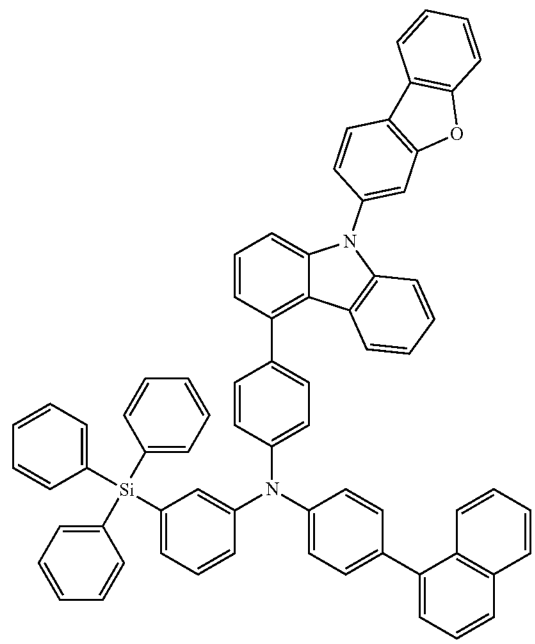
B209
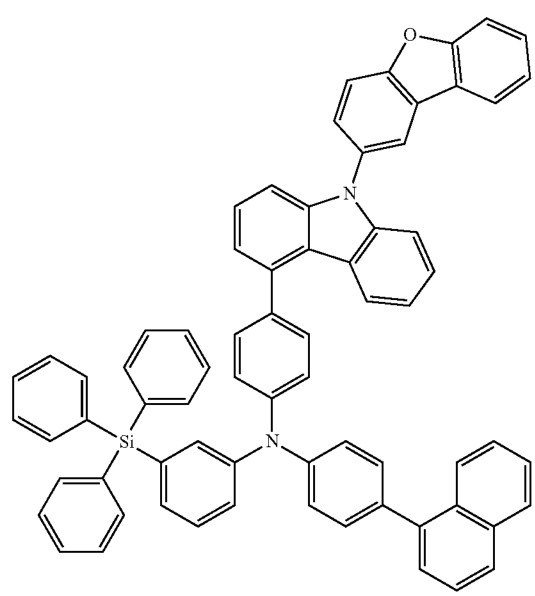

-continued
B210
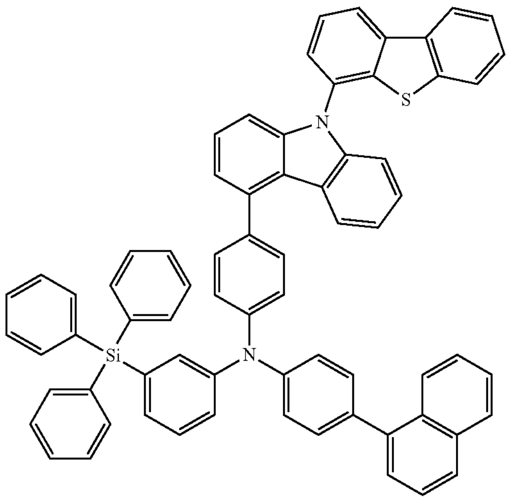
B211
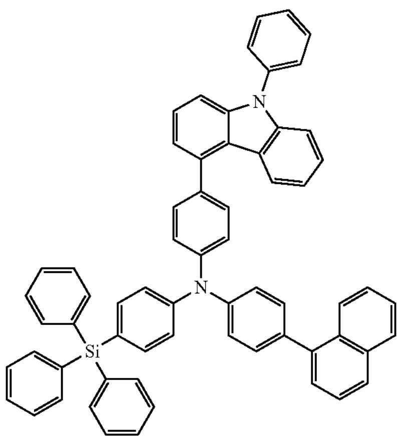
B212
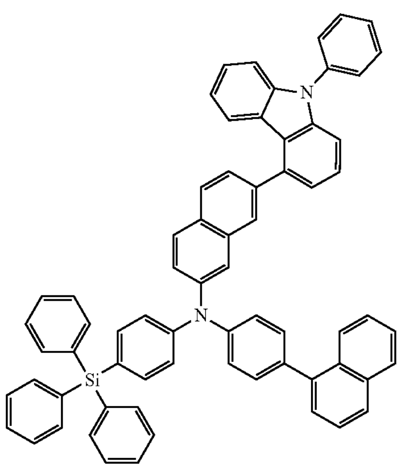
-continued
B213
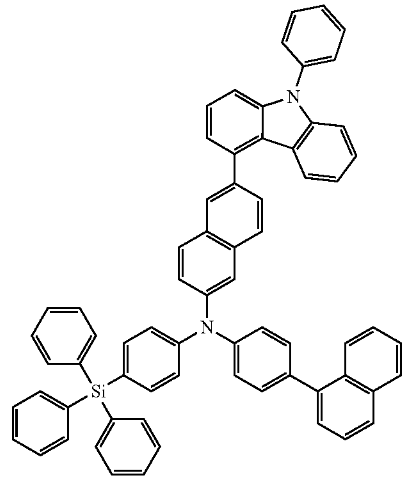
B214
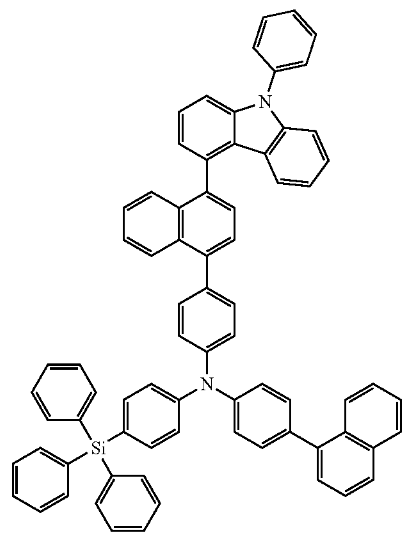
B215
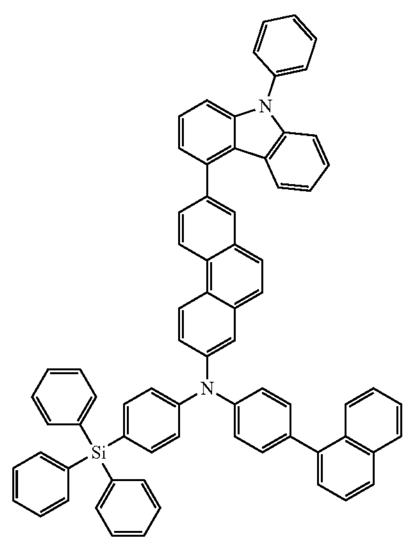

-continued

B216

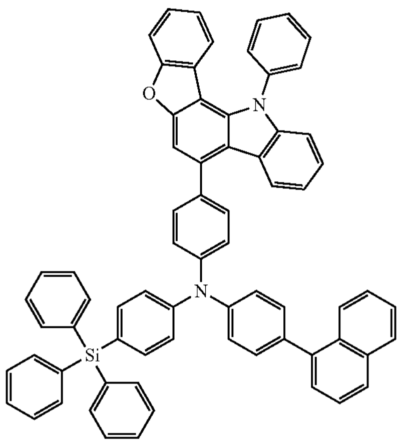

B217

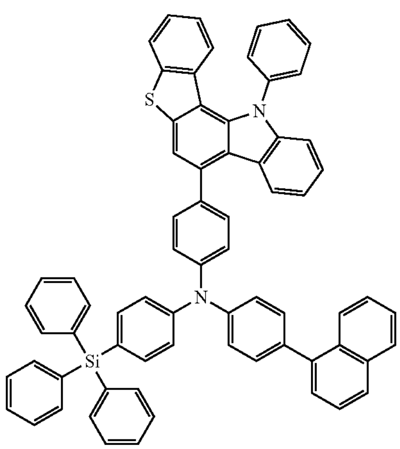

B218

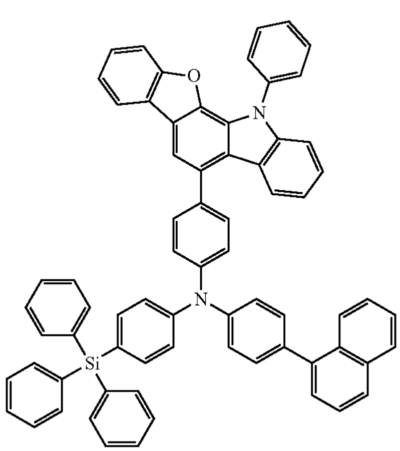

-continued

B219

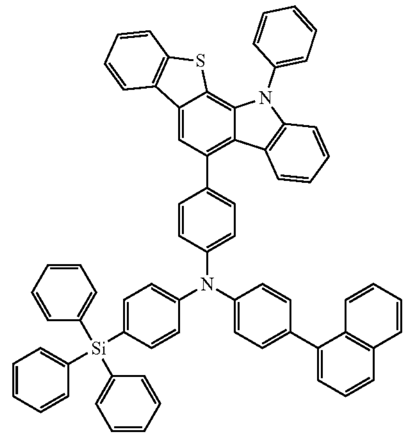

B220

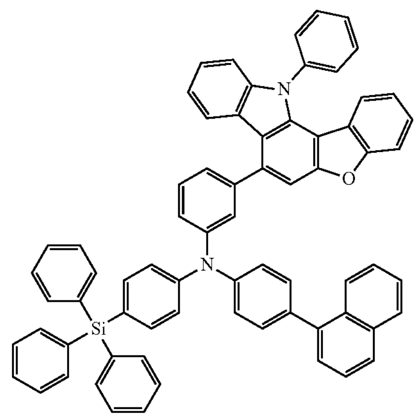

The amine compound represented by Formula 1 has a structure in which a carbazole derivative group, a triarylsilyl group, and a polycyclic aromatic hydrocarbon ring group or heterocyclic group are all (each) combined with an amine moiety (e.g., linked to a central N atom). The amine compound of an embodiment has a molecular structure in which a carbazole derivative is combined with an amine moiety at (via) a specific position, and the molecular structure may contribute to improvements in life span and/or efficiency of a light emitting diode.

The carbazole derivative of the amine compound according to an embodiment, represented by Formula 1 may have excellent or suitable hole transport capacity, and may have increased molecular volume due to the combination with the amine at position 4. Accordingly, the deposition temperature of the amine compound may be reduced, and the stability of an amine compound material may be improved. In some embodiments, when the amine compound is combined with the carbazole derivative, the energy band gap may increase, and inflow of excitons produced in an emission layer into a hole transport region may be prevented or reduced, and emission efficiency and/or the improvement of diode-life characteristics may be improved. In some embodiments, the triarylsilyl group of the amine compound of an embodiment may improve the electron tolerance of the compound, and accordingly, electron inflow from the emission layer may be reduced. In some embodiments, the amine compound of an embodiment additionally includes a polycyclic aromatic hydrocarbon ring or a polycyclic heterocycle combined with an amine moiety in addition to the carbazole derivative and the triarylsilyl group, to further improve electron tolerance and extend a π conjugation system, thereby improving hole transport properties and stabilizing the unstable (e.g., excited) state of radicals or radical cations.

Accordingly, because the amine compound of an embodiment has a structure including an additionally combined polycyclic aromatic hydrocarbon ring or polycyclic heterocycle in addition to the carbazole derivative combined with an amine moiety at a specific position and the triarylsilyl group, if utilized as a material for the functional layer of a light emitting diode, an increase of the efficiency and/or life (e.g., life span) of the light emitting diode may be achieved.

In some embodiments, the light emitting diode ED of an embodiment may further include a material for a hole transport region, which will be explained later, in addition to the above-described amine compound of an embodiment.

The hole transport region HTR may include a compound represented by Formula H-1:

Formula H-1

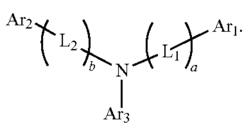

In Formula H-1 above, $L_1$ and $L_2$ may each independently be a direct linkage, a substituted or unsubstituted arylene group of 6 to 30 ring-forming carbon atoms, or a substituted or unsubstituted heteroarylene group of 2 to 30 ring-forming carbon atoms. "a" and "b" may each independently be an integer of 0 to 10. In some embodiments, when "a" or "b" is an integer of 2 or more, multiple $L_1$ and $L_2$ may each independently be a substituted or unsubstituted arylene group of 6 to 30 ring-forming carbon atoms, or a substituted or unsubstituted heteroarylene group of 2 to 30 ring-forming carbon atoms.

In Formula H-1, $Ar_1$ and $Ar_2$ may each independently be a substituted or unsubstituted aryl group of 6 to 30 ring-forming carbon atoms, or a substituted or unsubstituted heteroaryl group of 2 to 30 ring-forming carbon atoms. In some embodiments, in Formula H-1, $Ar_3$ may be a substituted or unsubstituted aryl group of 6 to 30 ring-forming carbon atoms, or a substituted or unsubstituted heteroaryl group of 2 to 30 ring-forming carbon atoms.

The compound represented by Formula H-1 may be a monoamine compound. Otherwise, the compound represented by Formula H-1 may be a diamine compound in which at least one among $Ar_1$ to $Ar_3$ includes an amine group as a substituent. In some embodiments, the compound represented by Formula H-1 may be a carbazole-based compound in which at least one among $Ar_1$ and $Ar_2$ includes a substituted or unsubstituted carbazole group, or a fluorene-based compound in which at least one among $Ar_1$ and $Ar_2$ includes a substituted or unsubstituted fluorene group.

The compound represented by Formula H-1 may be represented by any one among the compounds in Compound Group H. However, the compounds shown in Compound Group H are only illustrations, and the compound represented by Formula H-1 is not limited to the compounds represented in Compound Group H.

Compound Group H

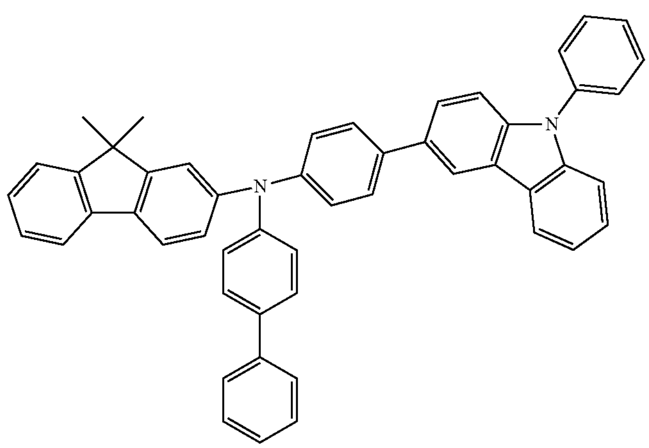

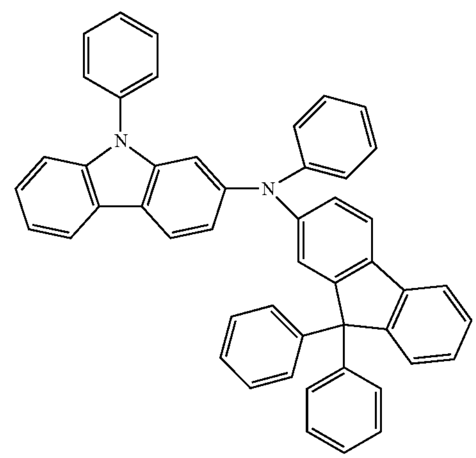

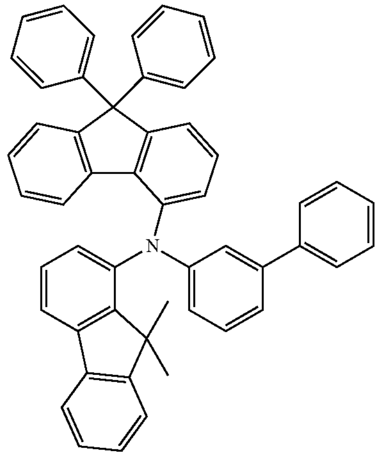

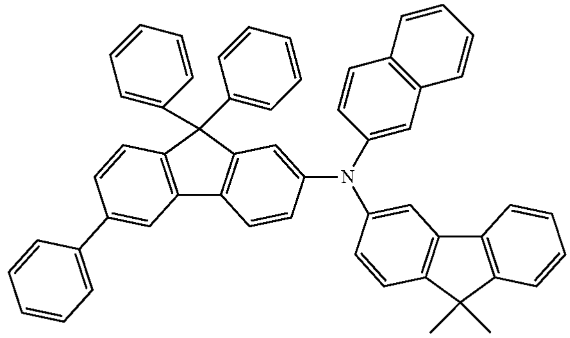

-continued
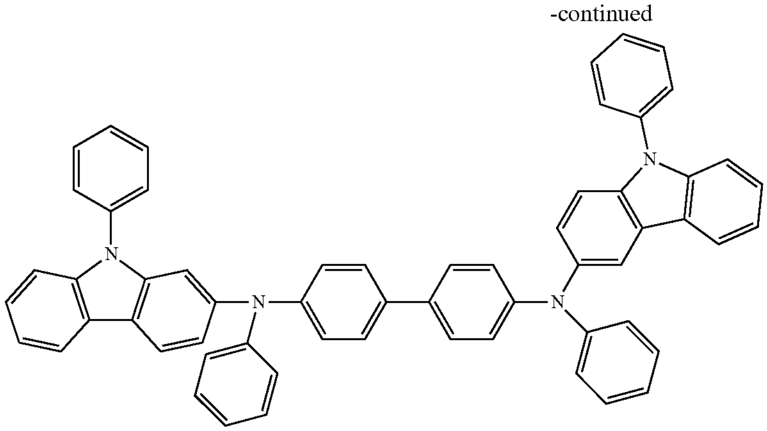
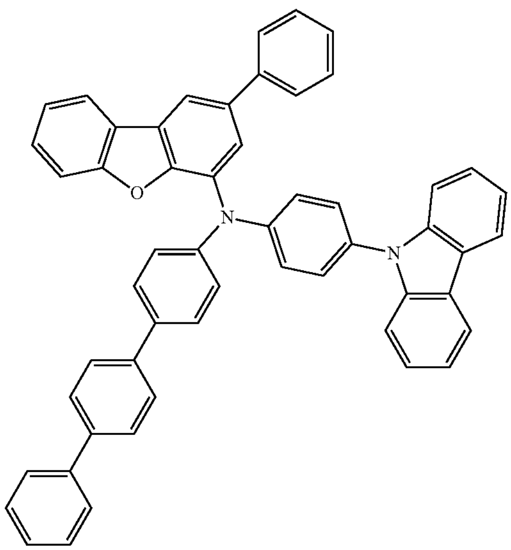
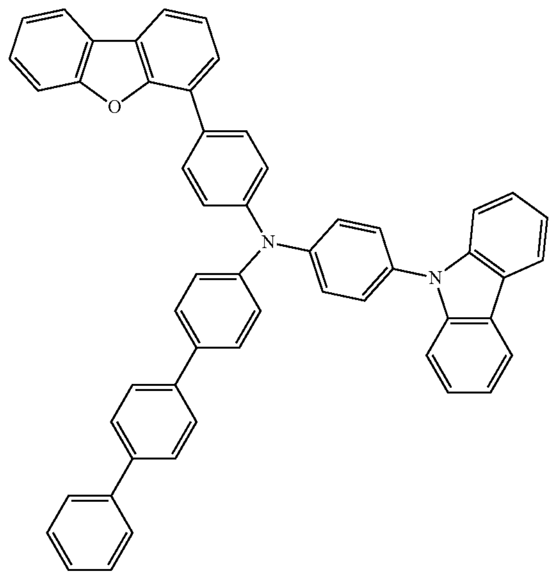
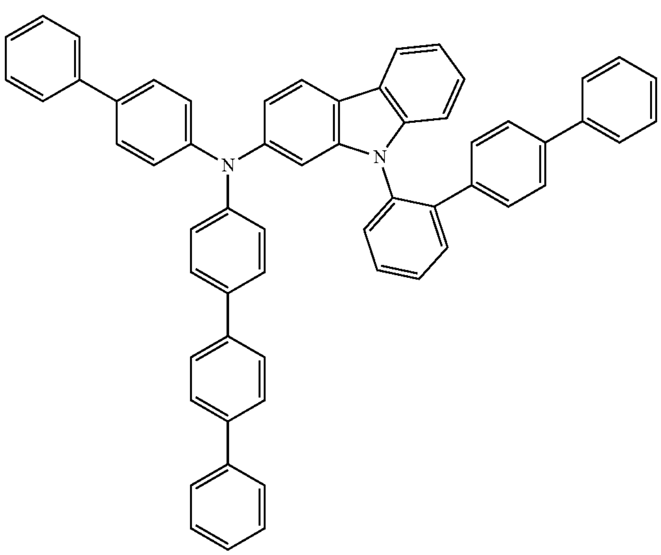

-continued
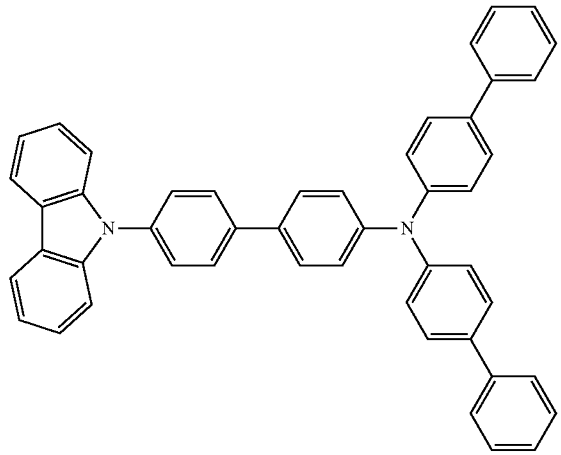
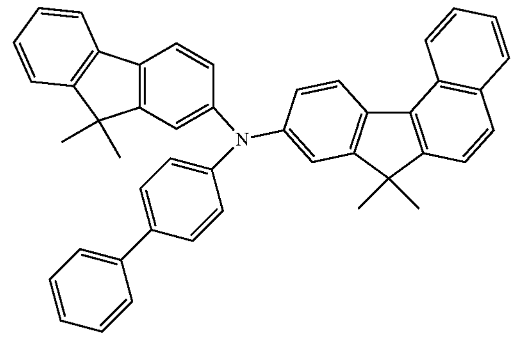
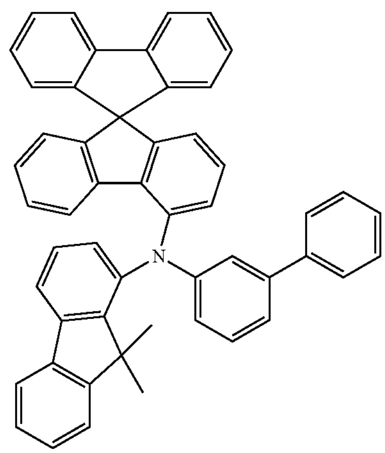
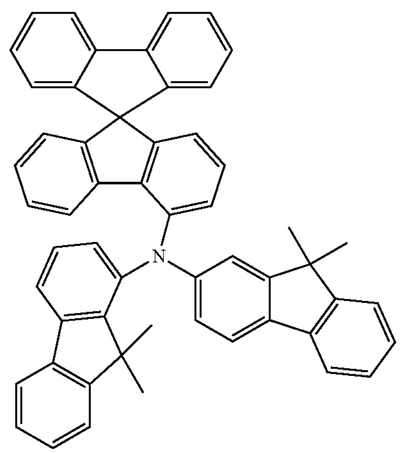
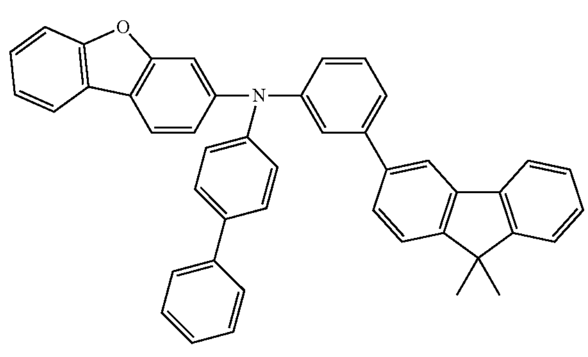
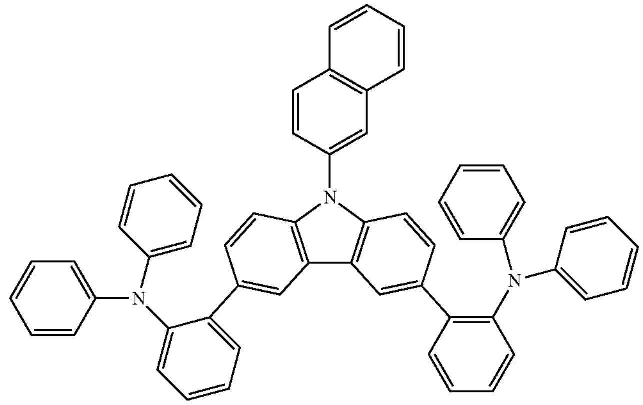

-continued
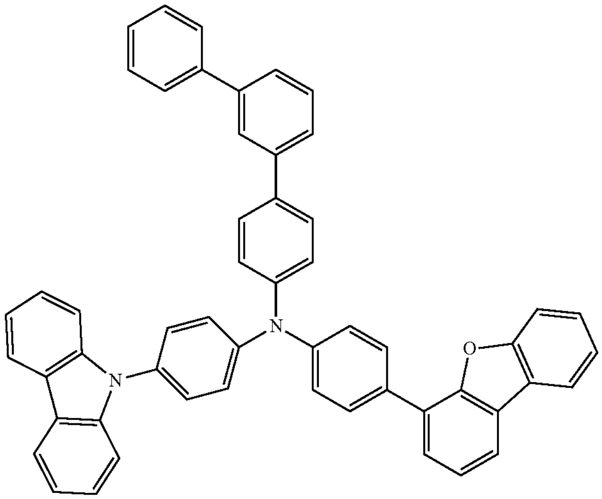
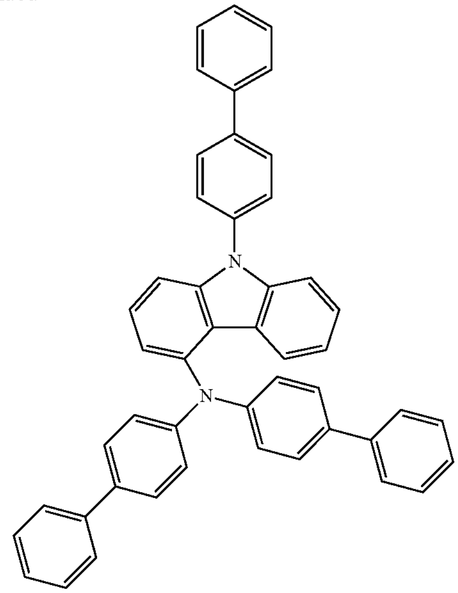
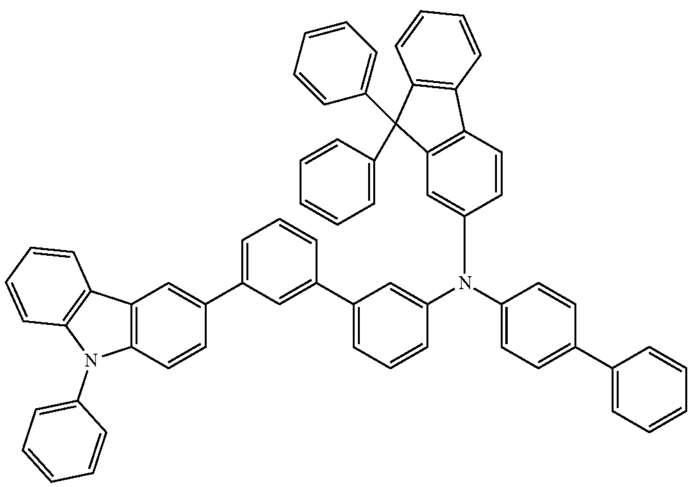
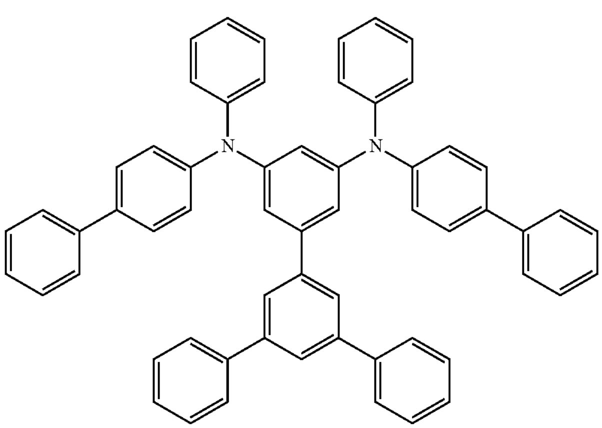
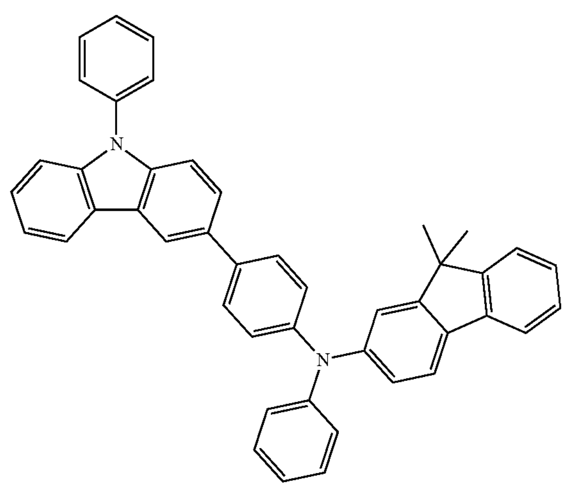

-continued
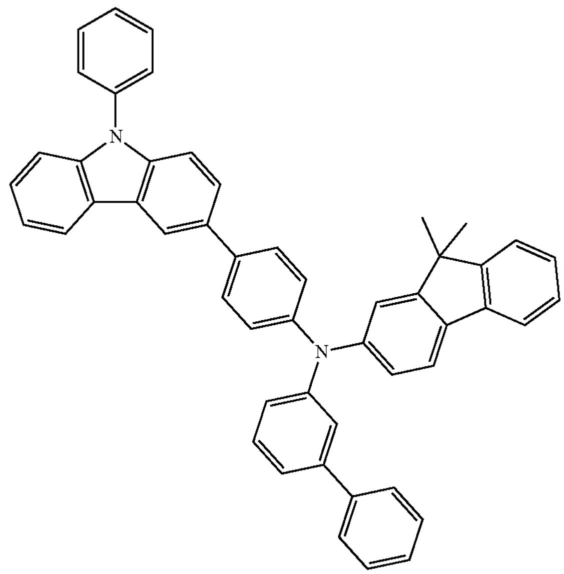
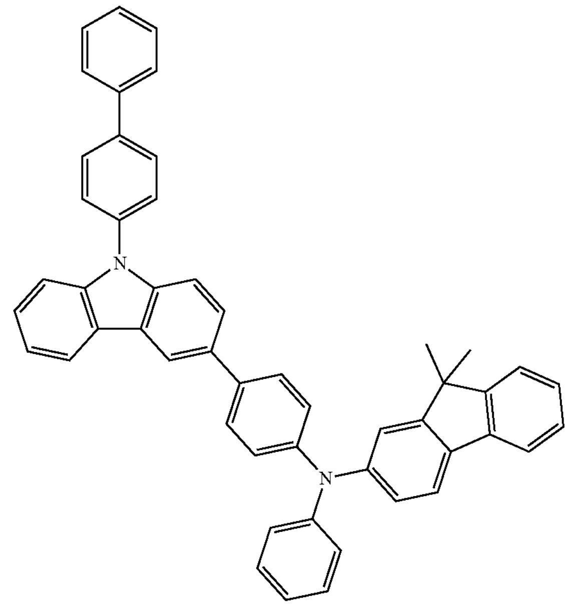
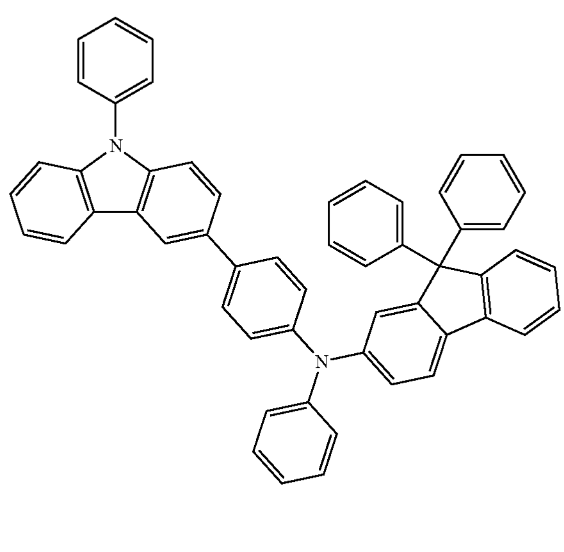
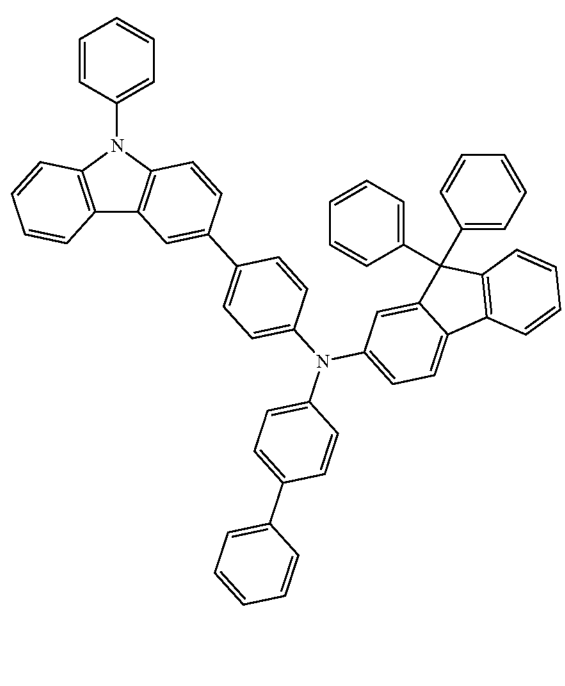

-continued
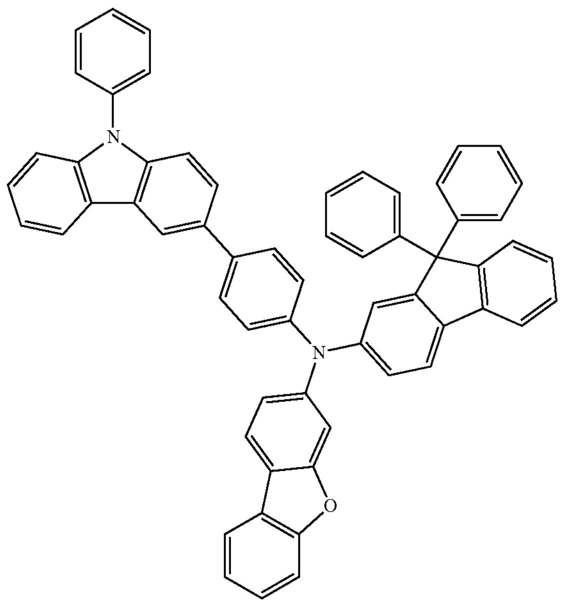
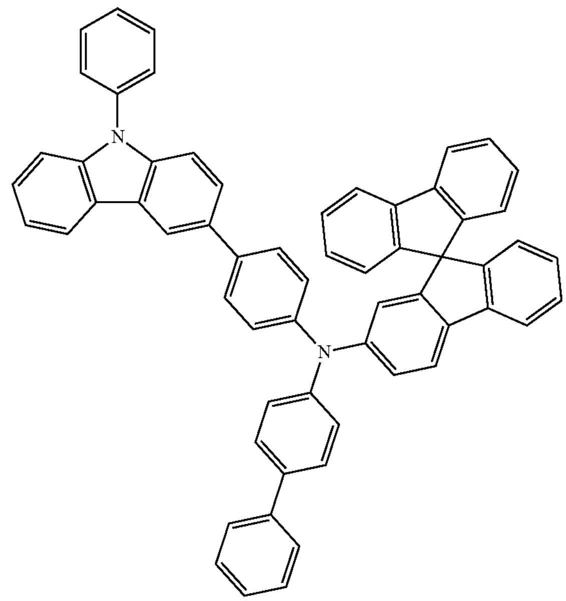
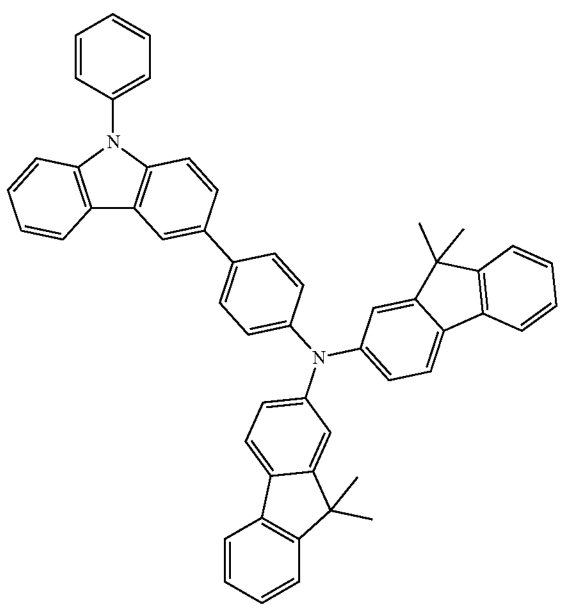
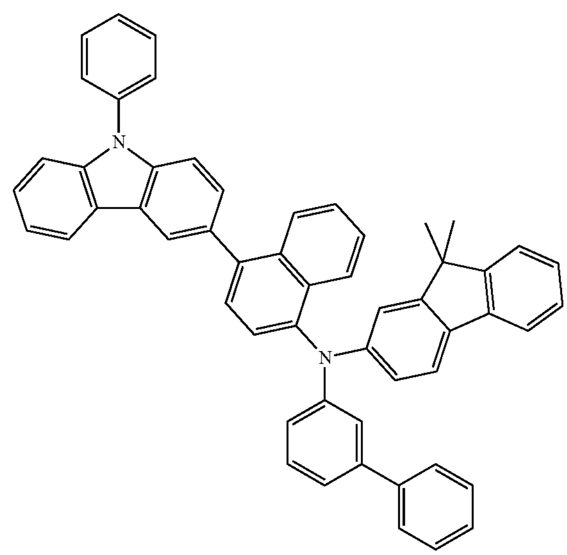
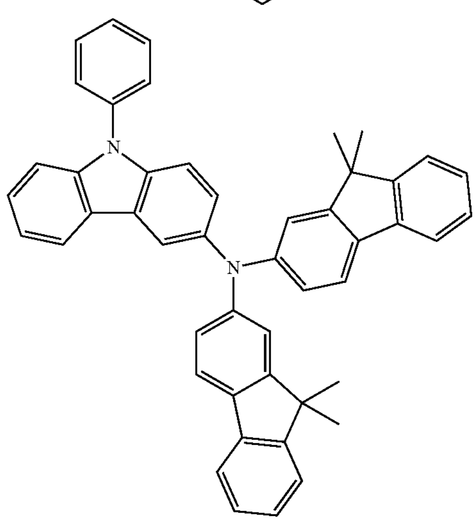
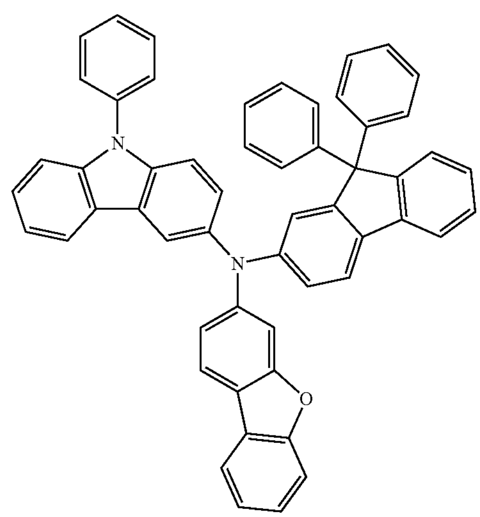

-continued
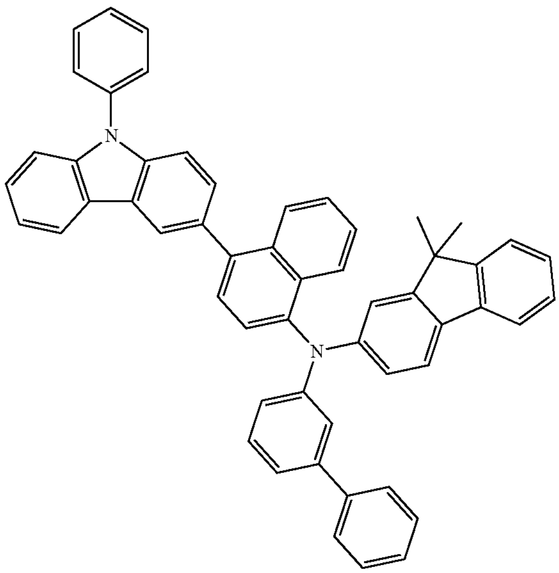
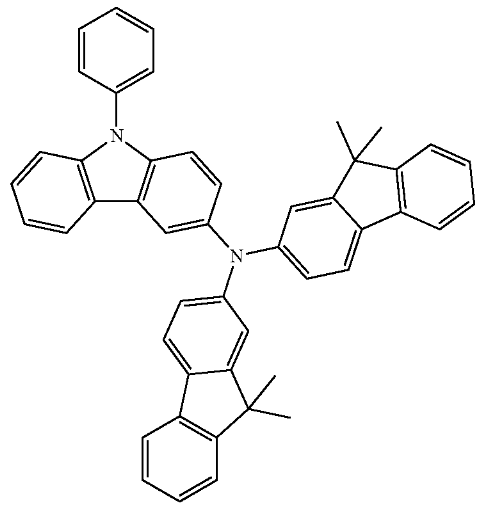
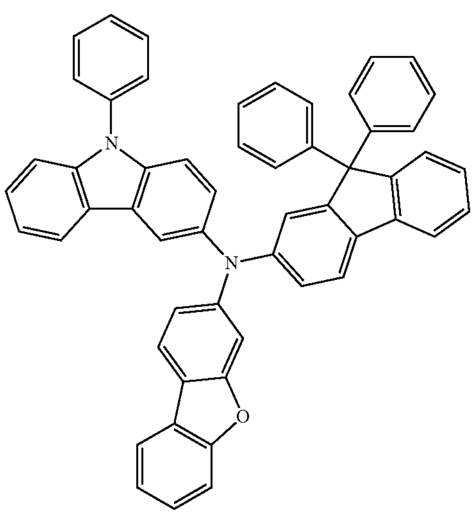
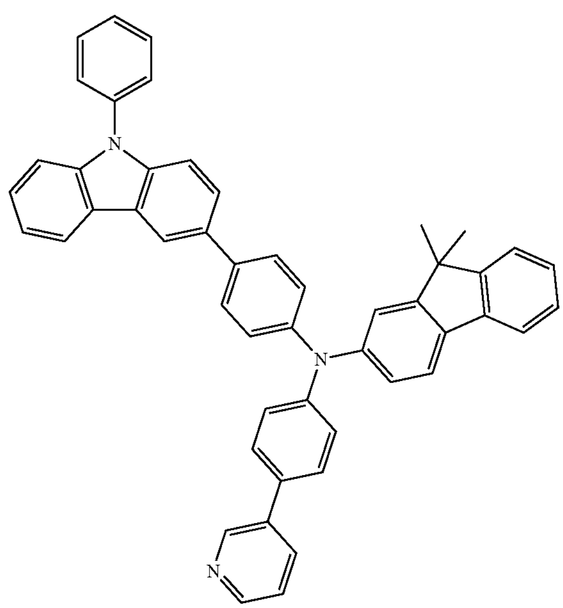

-continued
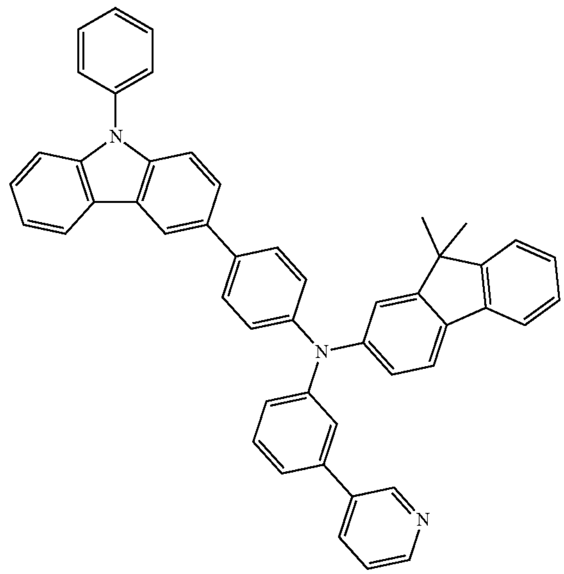
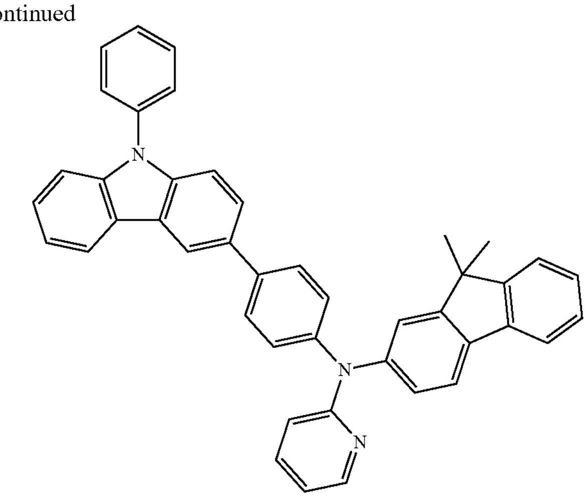
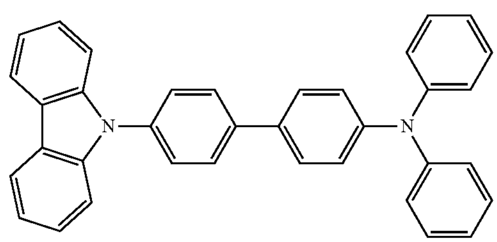
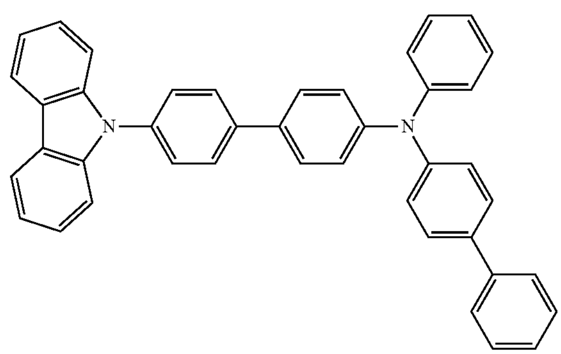
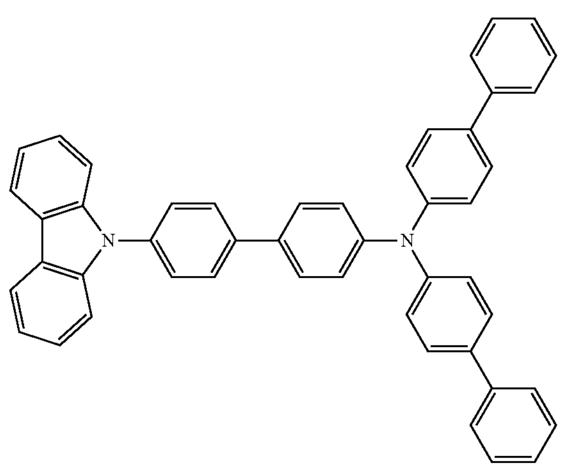
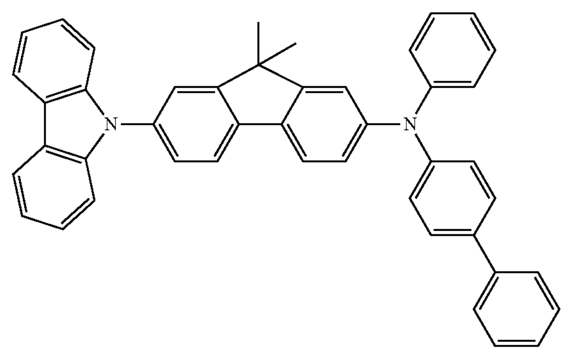

-continued
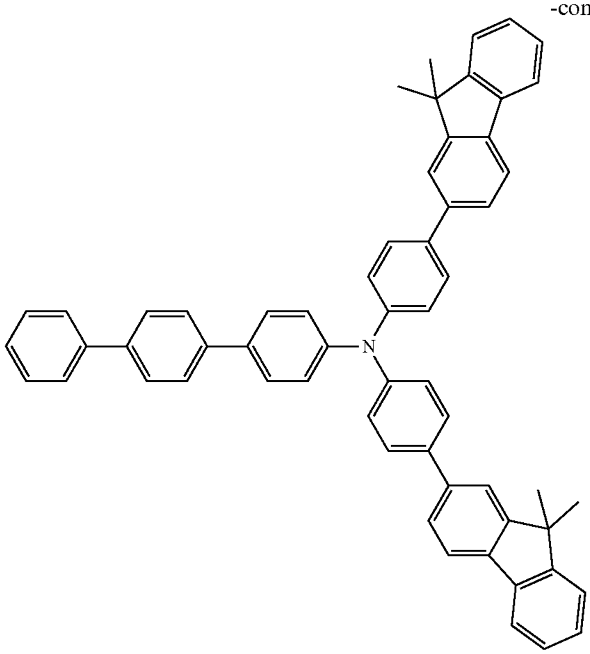
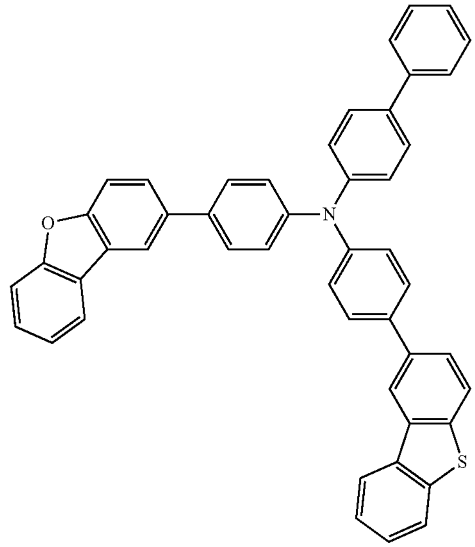
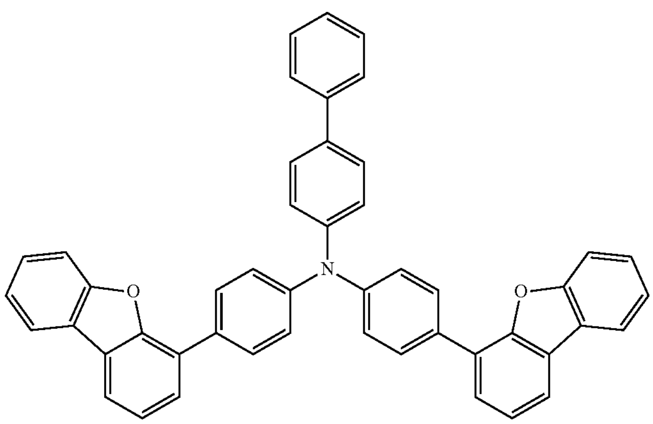
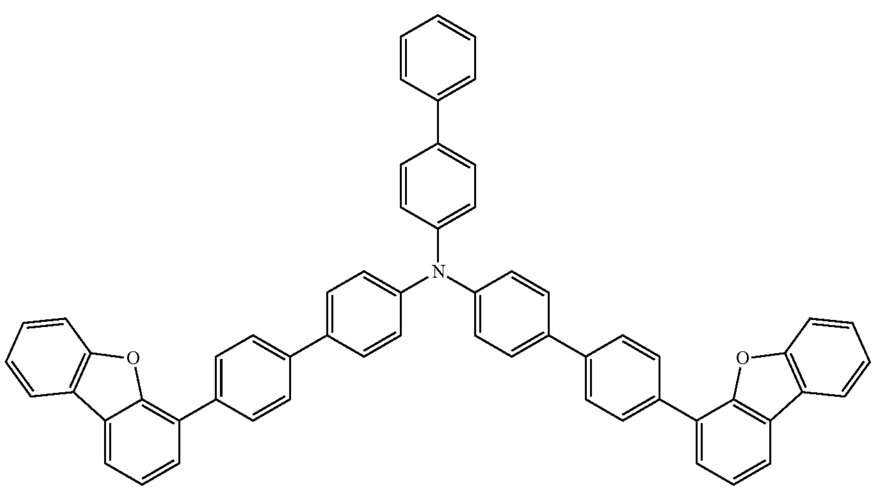

-continued
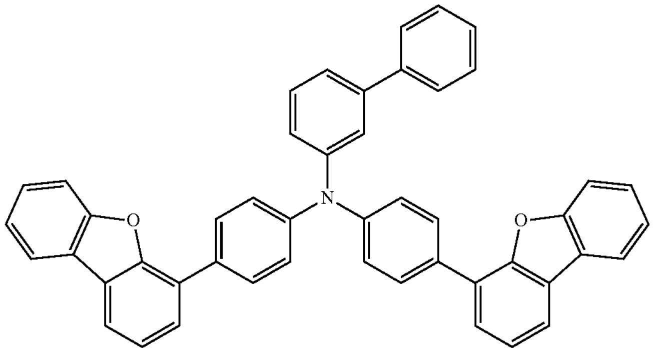
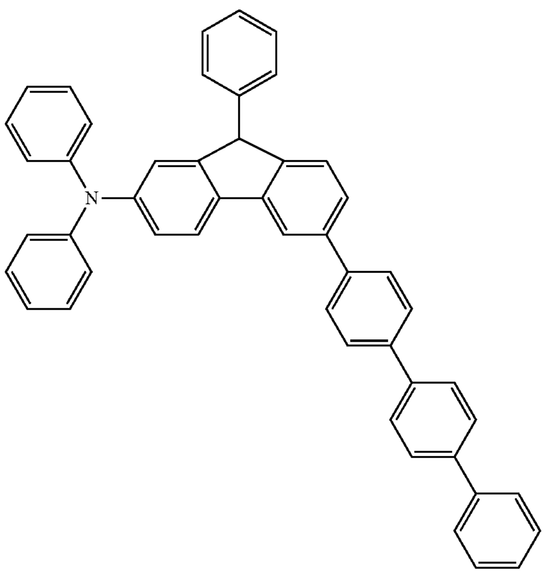
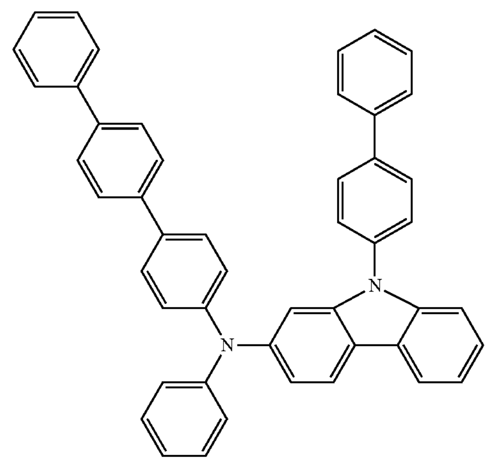
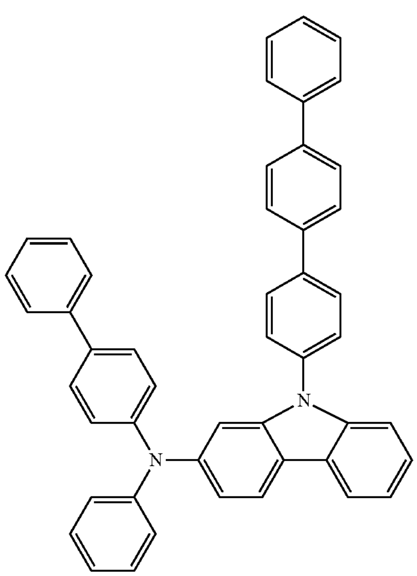
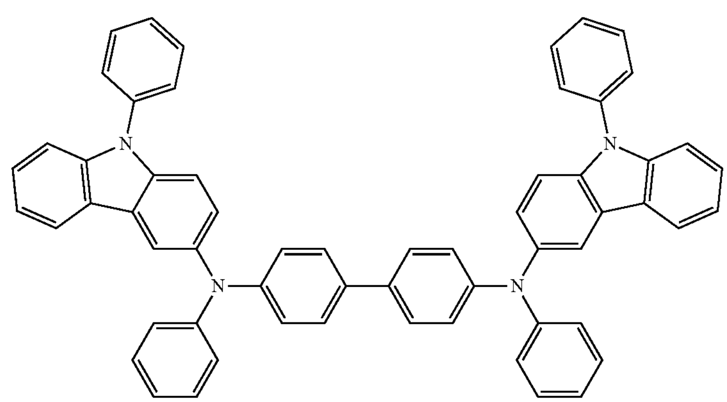

-continued
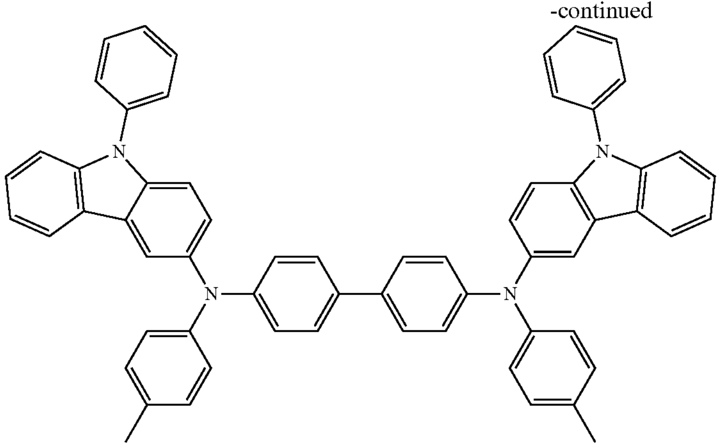
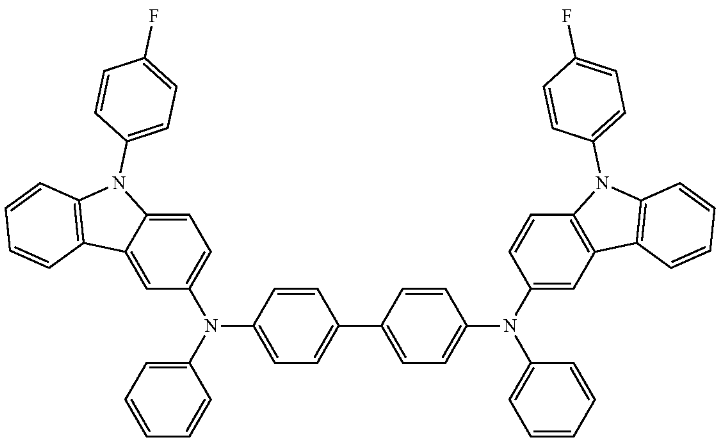
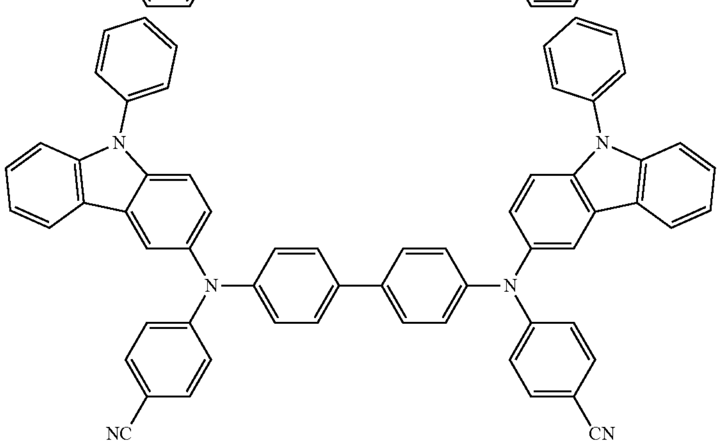
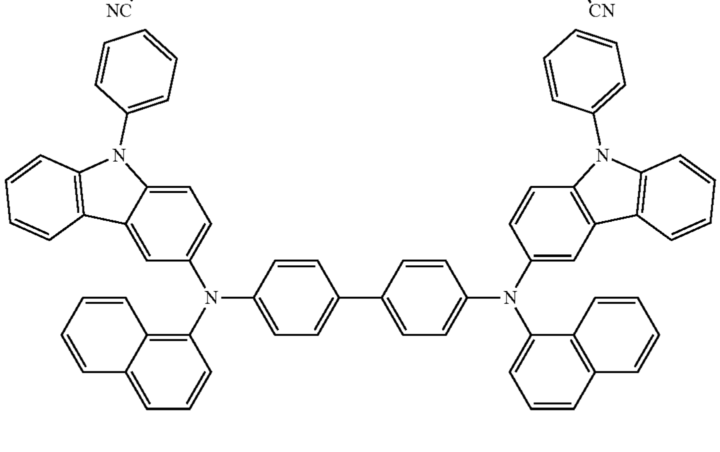

-continued
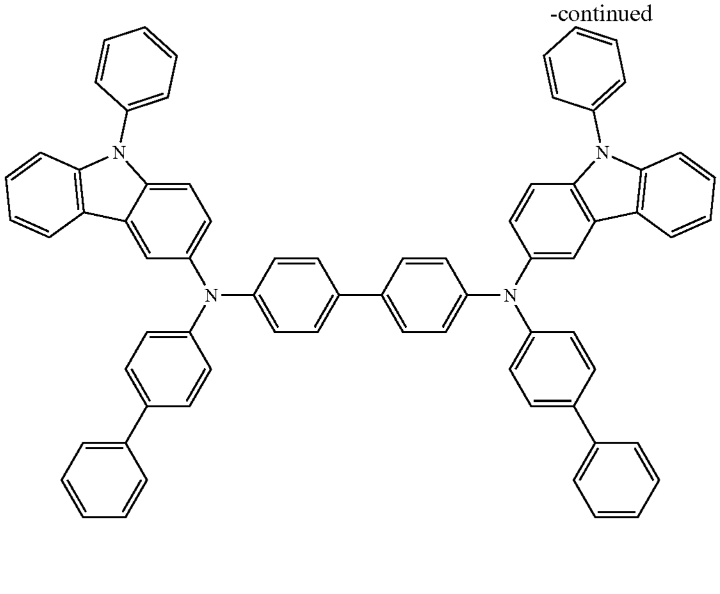
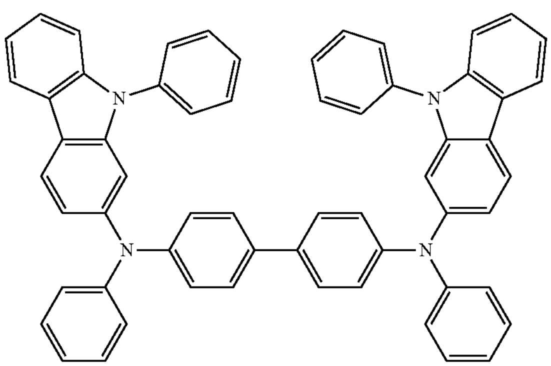
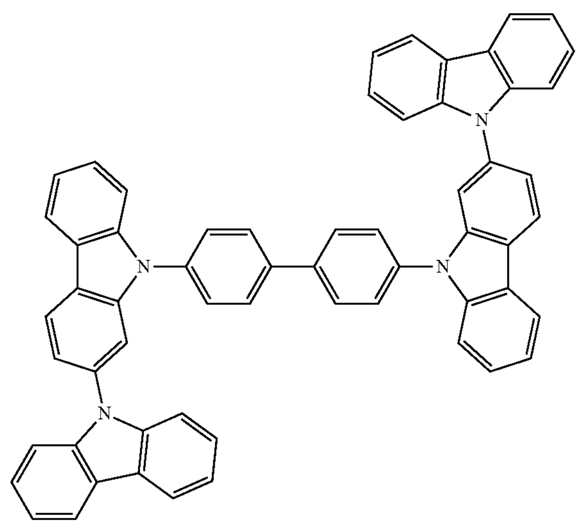
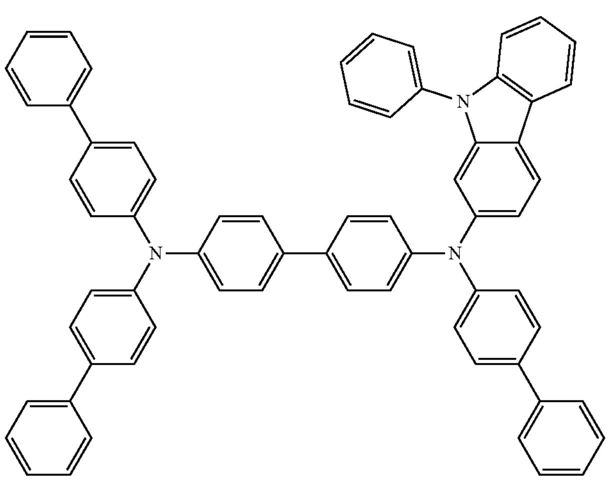
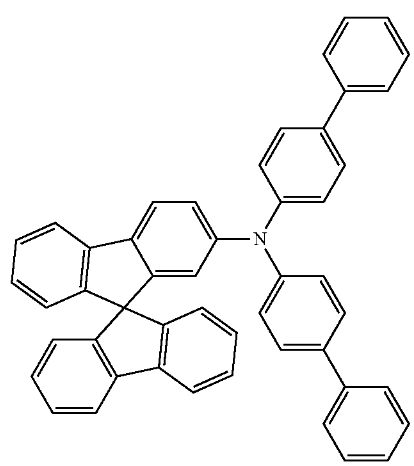

-continued

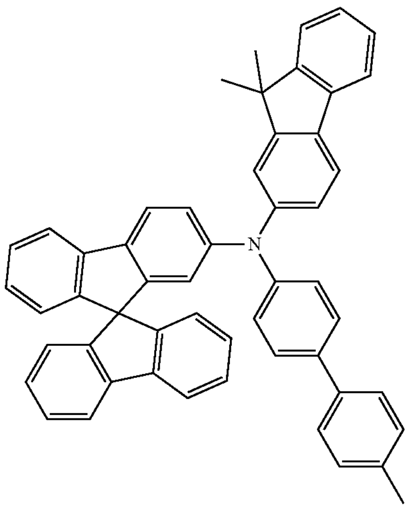

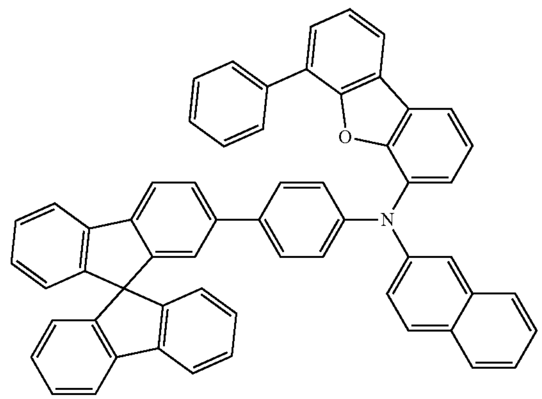

The hole transport region HTR may include a phthalocyanine compound (such as copper phthalocyanine), $N^1$,$N^{1'}$-([1,1'-biphenyl]-4,4'-diyl)bis($N^1$-phenyl-$N^4$,$N^4$-di-m-tolyl-benzene-1,4-diamine) (DNTPD), 4,4',4"-[tris(3-methylphenyl)phenylamino] triphenylamine (m-MTDATA), 4,4',4"-tris(N,N-diphenylamino)triphenylamine (TDATA), 4,4',4"-tris[N(2-naphthyl)-N-phenylamino]-triphenylamine (2-TNATA), poly(3,4-ethylene dioxythiophene)/poly(4-styrene sulfonate) (PEDOT/PSS), polyaniline/dodecylbenzene sulfonic acid (PANI/DBSA), polyaniline/camphor sulfonic acid (PANI/CSA), polyaniline/poly(4-styrene sulfonate) (PANI/PSS), N,N'-di(1-naphthalene-1-yl)-N,N'-diphenyl-benzidine (NPB), triphenylamine-containing polyether ketone (TPAPEK), 4-isopropyl-4'-methyldiphenyliodonium [tetrakis(pentafluorophenyl)borate], and dipyrazino[2,3-f:2',3'-h] quinoxaline-2,3,6,7,10,11-hexacarbonitrile (HAT-CN).

In some embodiments, the hole transport region HTR may include carbazole derivatives (such as N-phenyl carbazole and/or polyvinyl carbazole), fluorene-based derivatives, N,N'-bis(3-methylphenyl)-N,N'-diphenyl-[1,1-biphenyl]-4,4'-diamine (TPD), triphenylamine-based derivatives (such as 4,4',4"-tris(N-carbazolyl)triphenylamine (TCTA)), N,N'-di(1-naphthalene-1-yl)-N,N'-diphenyl-benzidine (NPB), 4,4'-cyclohexylidene bis[N,N-bis(4-methylphenyl)benzeneamine (TAPC), 4,4'-bis[N,N'-(3-tolyl)amino]-3,3'-dimethylbiphenyl (HMTPD), 9-(4-tert-butylphenyl)-3,6-bis(triphenylsilyl)-9H-carbazole (CzSi), 9-phenyl-9H-3,9'-bicarbazole (CCP), 1,3-bis(N-carbazolyl)benzene (mCP), 1,3-bis(1,8-dimethyl-9H-carbazol-9-yl)benzene (mDCP), etc.

The hole transport region HTR may include the compounds of the hole transport region in at least one among the hole injection layer HIL, hole transport layer HTL, and electron blocking layer EBL.

The thickness of the hole transport region HTR may be about 100 Å to about 10,000 Å, for example, about 100 Å to about 5,000 Å. When the hole transport region HTR includes a hole injection layer HIL, the thickness of the hole injection region HIL may be, for example, about 30 Å to about 1,000 Å. When the hole transport region HTR includes a hole transport layer HTL, the thickness of the hole transport layer HTL may be about 30 Å to about 1,000 Å. For example, when the hole transport region HTR includes an electron blocking layer EBL, the thickness of the electron blocking layer EBL may be about 10 Å to about 1,000 Å. When the thicknesses of the hole transport region HTR, the hole injection layer HIL, the hole transport layer HTL and the electron blocking layer EBL satisfy the above-described ranges, satisfactory hole transport properties may be achieved without substantial increase of a driving voltage.

The hole transport region HTR may further include a charge generating material to increase conductivity in addition to the above-described materials. The charge generating material may be dispersed substantially uniformly or non-uniformly in the hole transport region HTR. The charge generating material may be, for example, a p-dopant. The p-dopant may include at least one metal halide compound, quinone derivative, metal oxide, or cyano group-containing compound, without limitation. For example, the p-dopant may include one or more metal halide compounds (such as CuI and/or RbI), quinone derivatives (such as tetracyanoquinodimethane (TCNQ) and/or 2,3,5,6-tetrafluoro-7,7',8,8-tetracyanoquinodimethane (F4-TCNQ)), metal oxides (such as tungsten oxide and/or molybdenum oxide), cyano group-containing compounds (such as dipyrazino[2,3-f: 2',3'-h] quinoxaline-2,3,6,7,10,11-hexacarbonitrile (HATCN) and/or 4-[[2,3-bis[cyano-(4-cyano-2,3,5,6-tetrafluorophenyl) methylidene]cyclopropylidene]-cyanomethyl]-2,3,5,6-tetrafluorobenzonitrile), etc., without limitation.

As described above, the hole transport region HTR may further include at least one of a butter layer or an electron blocking layer EBL in addition to the hole injection layer HIL and the hole transport layer HTL. The buffer layer may compensate for an optical resonance distance of the wavelength of light emitted from an emission layer EML, and may thereby increase light emission efficiency. Materials that may be included in a hole transport region HTR may be utilized as materials included in a buffer layer. The electron blocking layer EBL is a layer playing the role of preventing or reducing the electron injection from the electron transport region ETR to the hole transport region HTR.

The emission layer EML is provided on the hole transport region HTR. The emission layer EML may have a thickness of, for example, about 100 Å to about 1,000 Å or about 100 Å to about 300 Å. The emission layer EML may have a single layer formed utilizing a single material, a single layer formed utilizing multiple different materials, or a multilayer structure having multiple layers formed utilizing multiple different materials.

In the light emitting diode ED of an embodiment, the emission layer EML may include one or more anthracene derivatives, pyrene derivatives, fluoranthene derivatives, chrysene derivatives, dihydrobenzanthracene derivatives, and/or triphenylene derivatives. For example, the emission layer EML may include one or more anthracene derivatives and/or pyrene derivatives.

In the light emitting diodes ED of embodiments, shown in FIG. 3 to FIG. 6, the emission layer EML may include a host and a dopant, and the emission layer EML may include a compound represented by Formula E-1. The compound represented by Formula E-1 may be utilized as a fluorescence host material.

Formula E-1

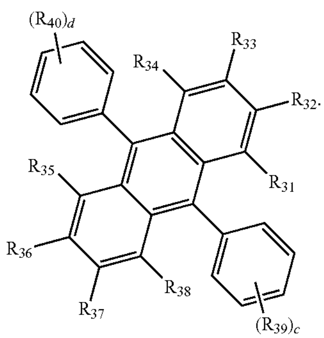

In Formula E-1, $R_{31}$ to $R_{40}$ may each independently be a hydrogen atom, a deuterium atom, a halogen atom, a substituted or unsubstituted silyl group, a substituted or unsubstituted alkyl group of 1 to 20 carbon atoms, a substituted or unsubstituted alkenyl group of 2 to 20 carbon atoms, a substituted or unsubstituted oxy group, a substituted or unsubstituted thiol group, a substituted or unsubstituted aryl group of 6 to 30 ring-forming carbon atoms, or a substituted or unsubstituted heteroaryl group of 2 to 30 ring-forming carbon atoms, and/or may be combined with an adjacent group to form a ring. In some embodiments, $R_{31}$ to $R_{40}$ may be combined with an adjacent group to form a saturated hydrocarbon ring or an unsaturated hydrocarbon ring. In some embodiments, $R_{31}$ to $R_{40}$ may be combined with an adjacent substituent or an adjacent benzene ring to form a fused ring.

In Formula E-1, "c" and "d" may each independently be an integer of 0 to 5.

Formula E-1 may be represented by any one among Compound E1 to Compound E19:

E1

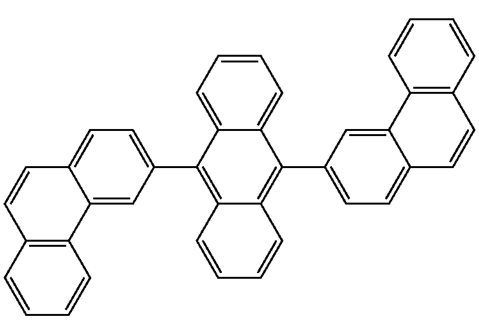

-continued

E2

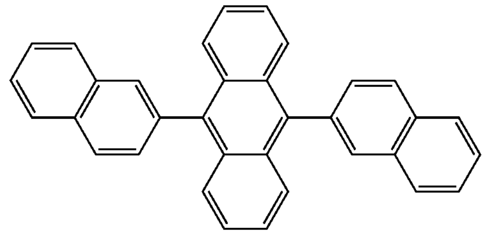

E3

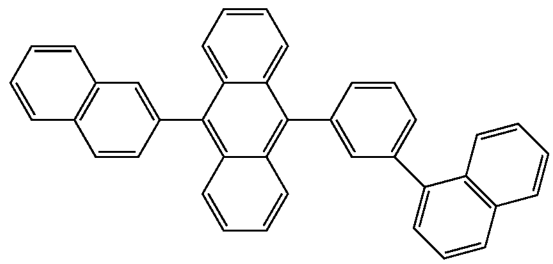

E4

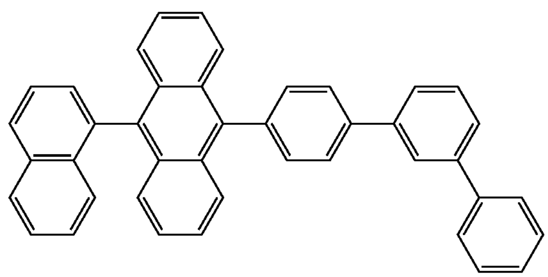

E5

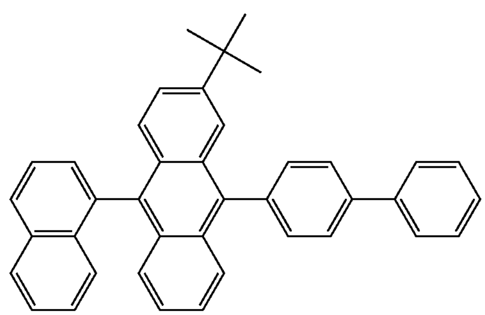

E6

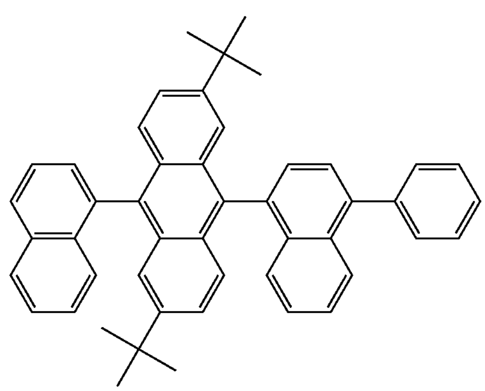

-continued
E7
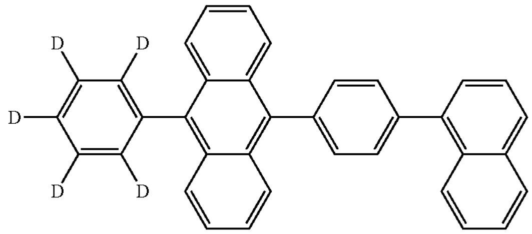
E8
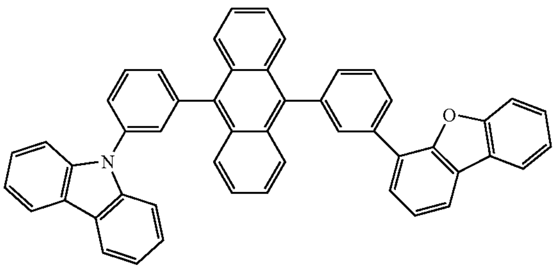
E9
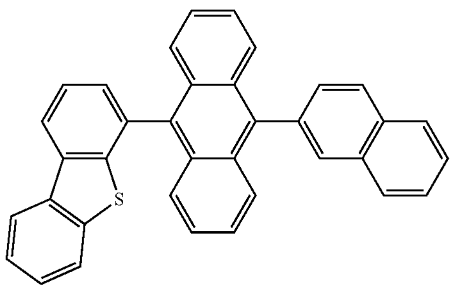
E10
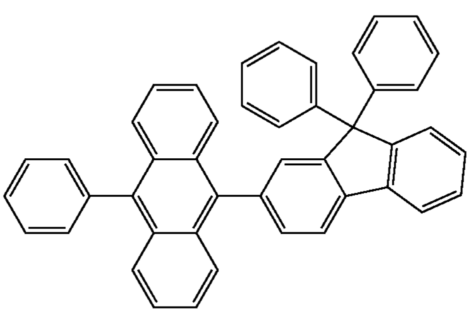
E11
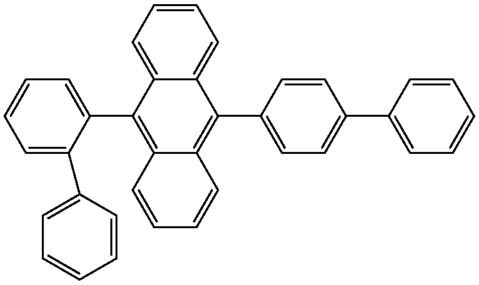
-continued
E12
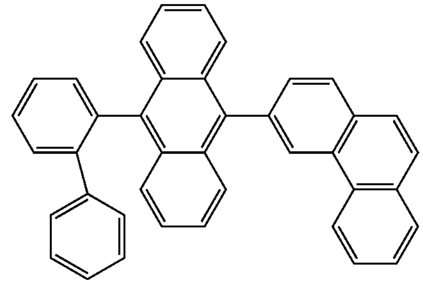
E13
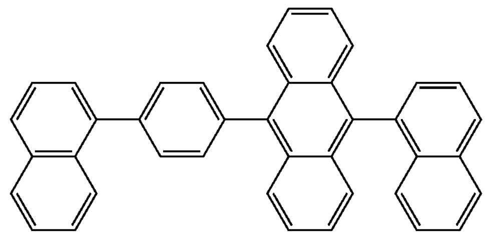
E14
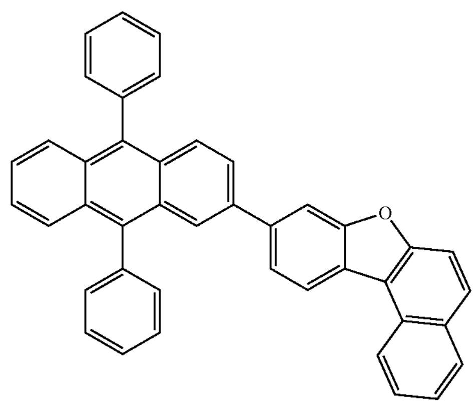
E15
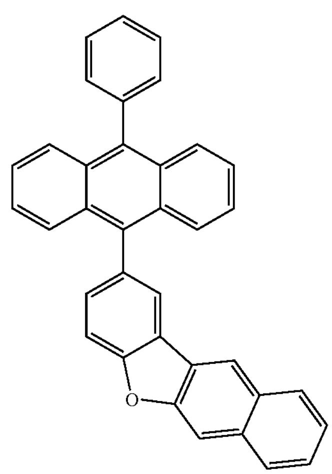

-continued
E16
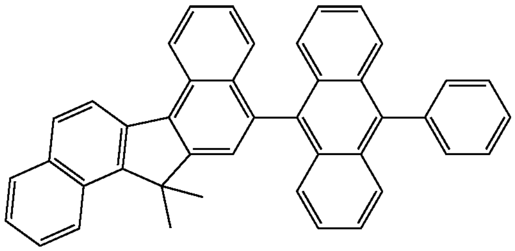
E17
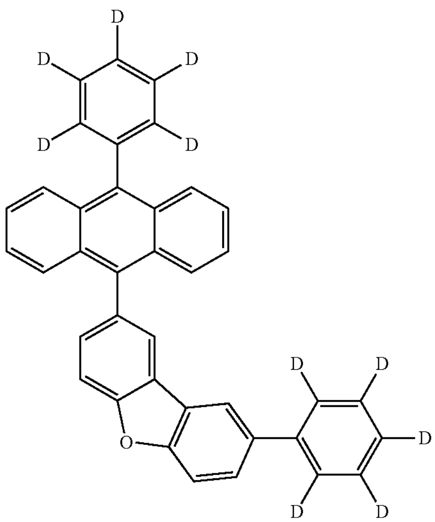
E18
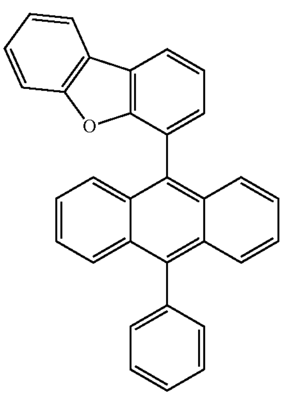
E19
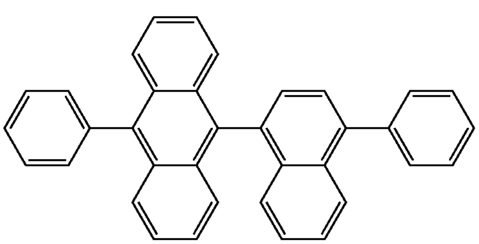
In some embodiments, Formula E-1 may be represented by any one among the compounds:
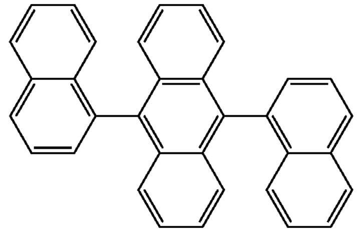
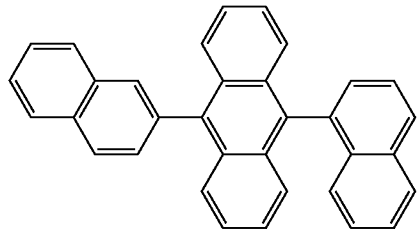
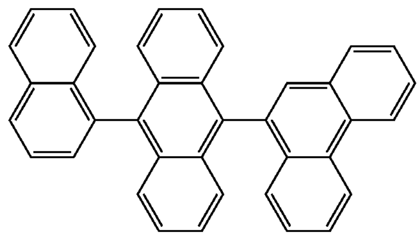
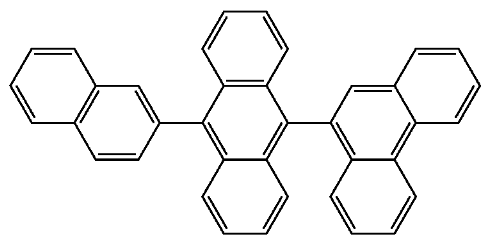
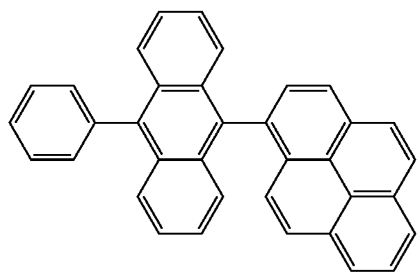
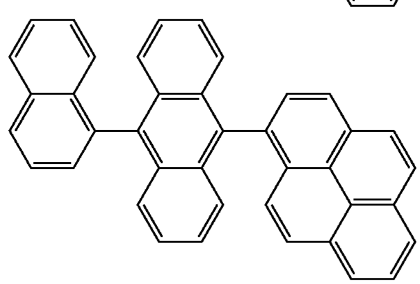
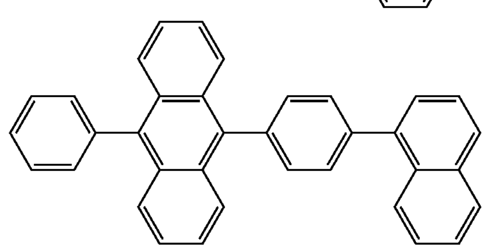

-continued
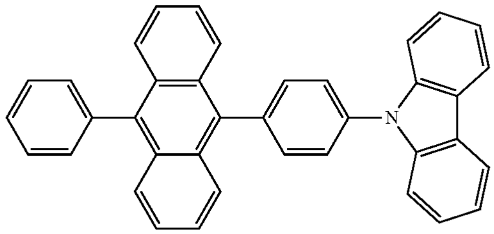
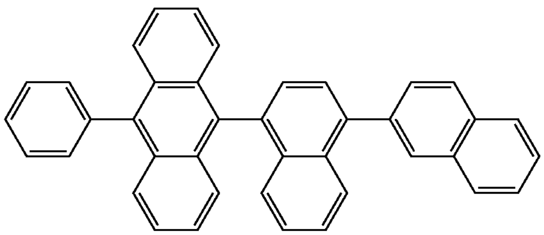
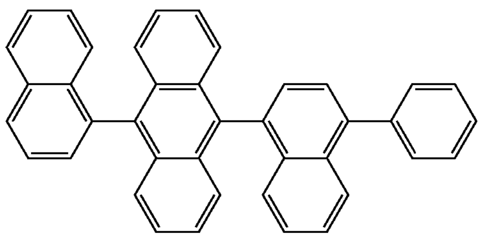
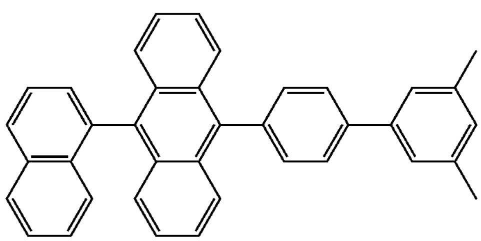
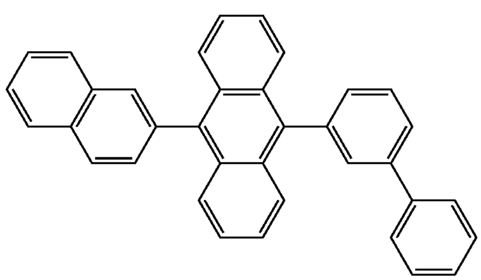
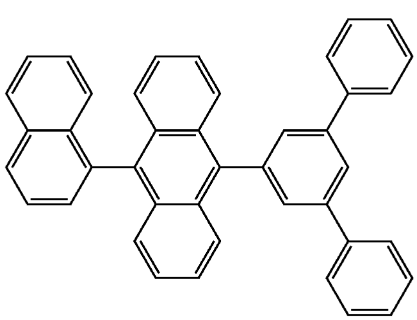
-continued
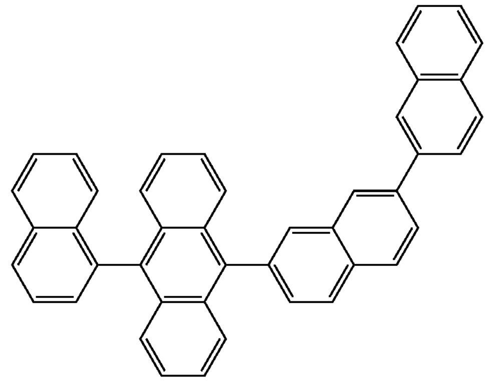
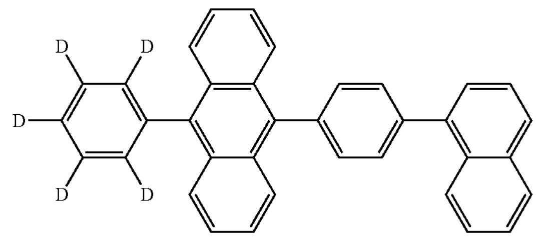
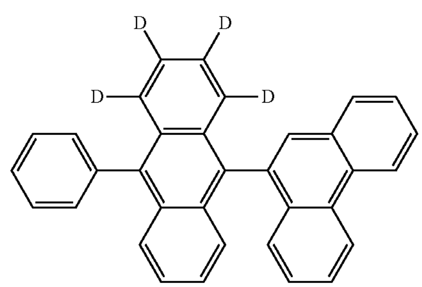
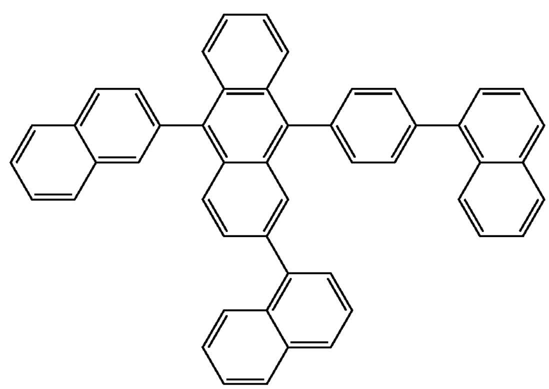
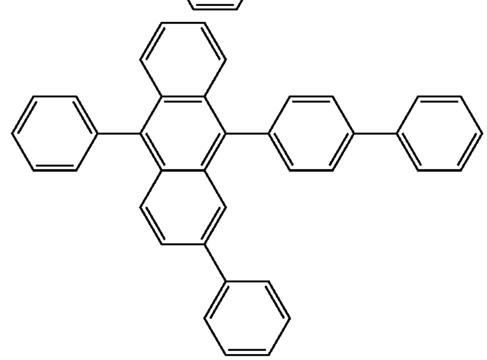

-continued
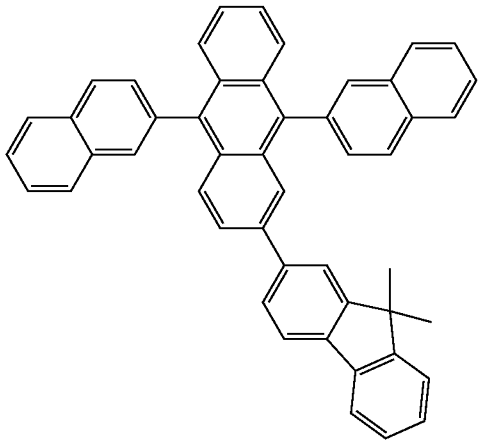
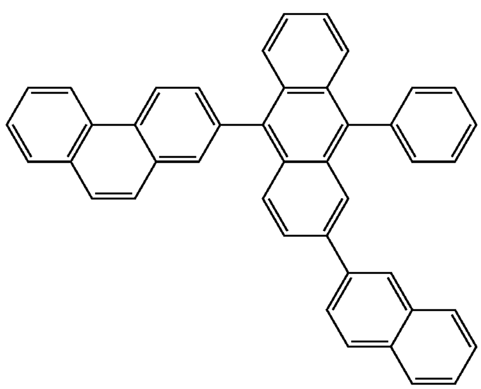
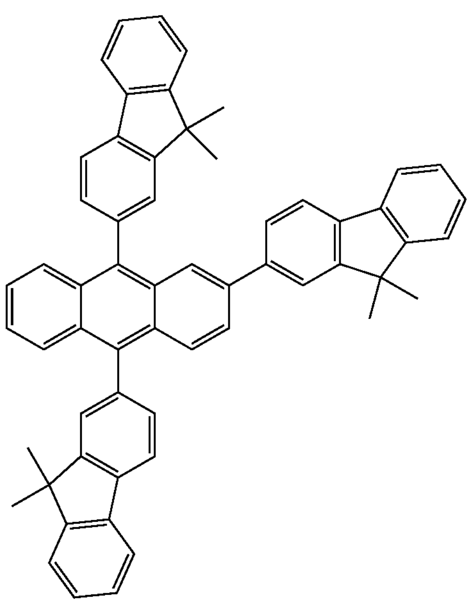
-continued
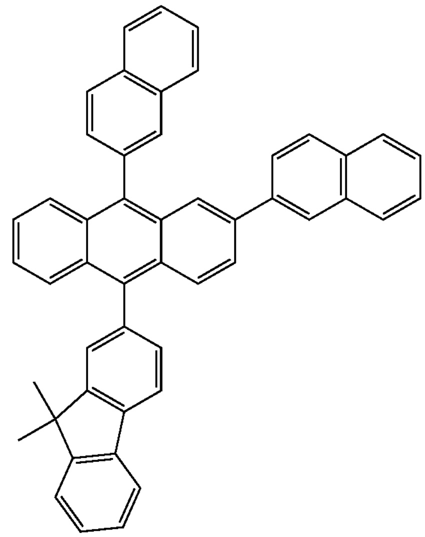
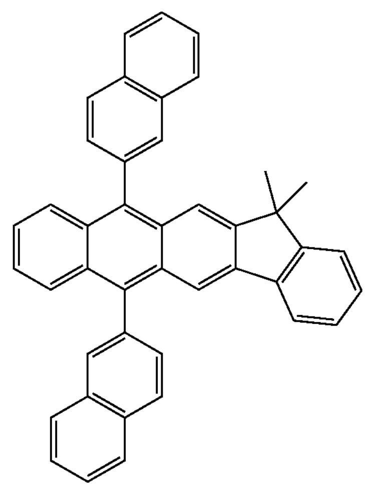
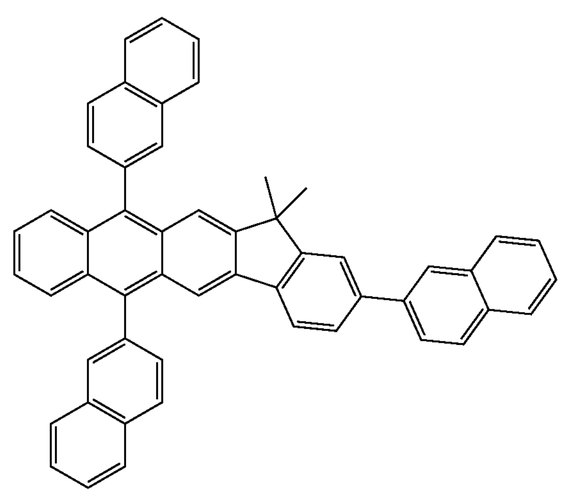
In an embodiment, the emission layer EML may include a compound represented by Formula E-2a or Formula E-2b. The compound represented by Formula E-2a or Formula E-2b may be utilized as a phosphorescence host material:

Formula E-2a

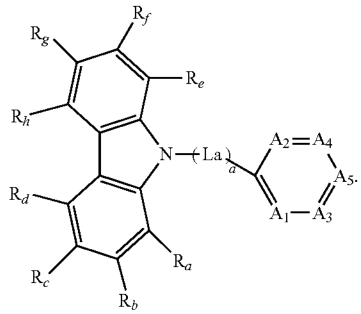

In Formula E-2a, "a" may be an integer of 0 to 10, La may be a direct linkage, a substituted or unsubstituted arylene group of 6 to 30 ring-forming carbon atoms, or a substituted or unsubstituted heteroarylene group of 2 to 30 ring-forming carbon atoms. When "a" is an integer of 2 or more, multiple La may each independently be a substituted or unsubstituted arylene group of 6 to 30 ring-forming carbon atoms, or a substituted or unsubstituted heteroarylene group of 2 to 30 ring-forming carbon atoms.

In some embodiments, in Formula E-2a, $A_1$ to $A_5$ may each independently be N or CRi. $R_a$ to $R_i$ may each independently be a hydrogen atom, a deuterium atom, a substituted or unsubstituted amine group, a substituted or unsubstituted thio group, a substituted or unsubstituted oxy group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, and/or may be combined with an adjacent group to form a ring. $R_a$ to $R_i$ may be combined with an adjacent group to form a hydrocarbon ring or a heterocycle including N, O, S, etc. as a ring-forming atom.

In some embodiments, in Formula E-2a, two or three selected from $A_1$ to $A_5$ may be N, and the remainder may be $CR_i$.

Formula E-2b $$(\text{Cbz1}) \text{-} (L_b)_b \text{-} (\text{Cbz2}).$$

In Formula E-2b, Cbz1 and Cbz2 may each independently be an unsubstituted carbazole group, or a carbazole group substituted with an aryl group of 6 to 30 ring-forming carbon atoms. $L_b$ may be a direct linkage, a substituted or unsubstituted arylene group of 6 to 30 ring-forming carbon atoms, or a substituted or unsubstituted heteroarylene group of 2 to 30 ring-forming carbon atoms. "b" may be an integer of 0 to 10, and if "b" is an integer of 2 or more, multiple $L_b$ may each independently be a substituted or unsubstituted arylene group of 6 to 30 ring-forming carbon atoms, or a substituted or unsubstituted heteroarylene group of 2 to 30 ring-forming carbon atoms.

The compound represented by Formula E-2a or Formula E-2b may be represented by any one among the compounds in Compound Group E-2. However, the compounds shown in Compound Group E-2 are only illustrations, and the compound represented by Formula E-2a or Formula E-2b is not limited to the compounds represented in Compound Group E-2:

Compound Group E-2

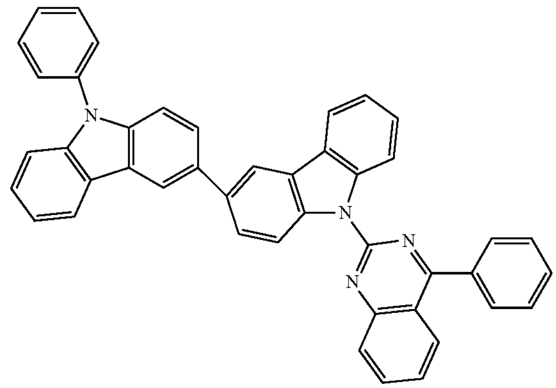

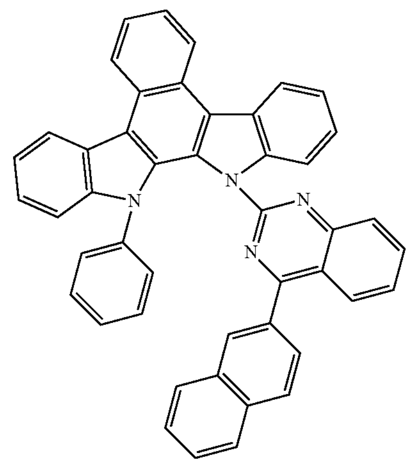

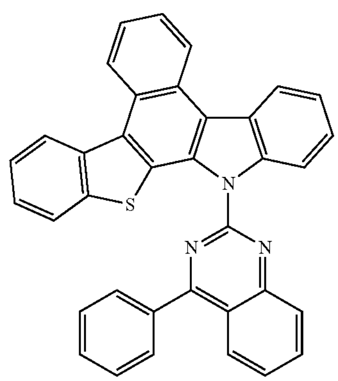

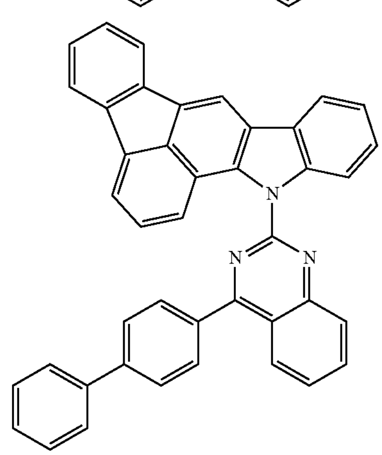

-continued
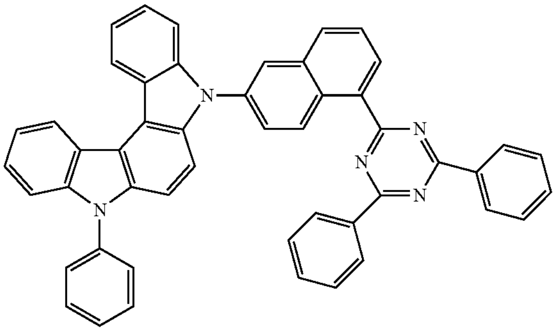
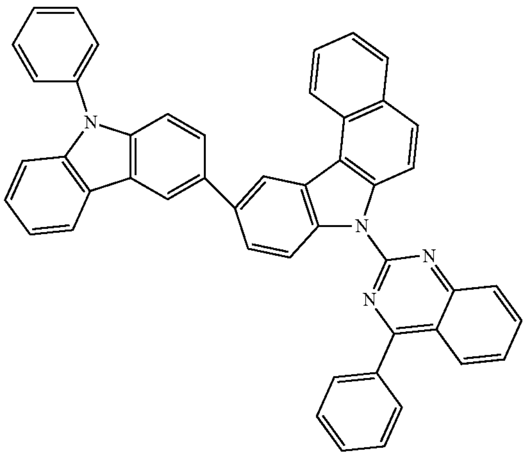
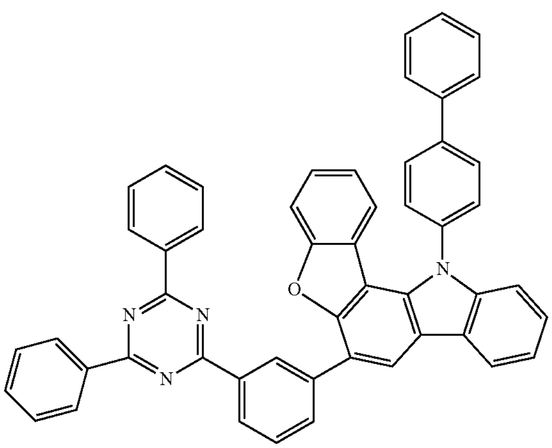
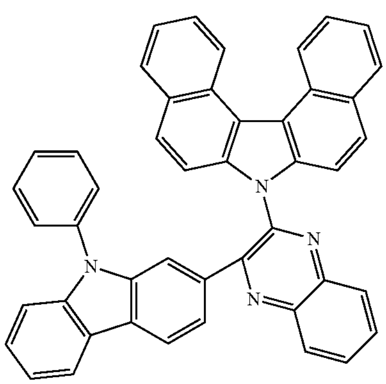
-continued
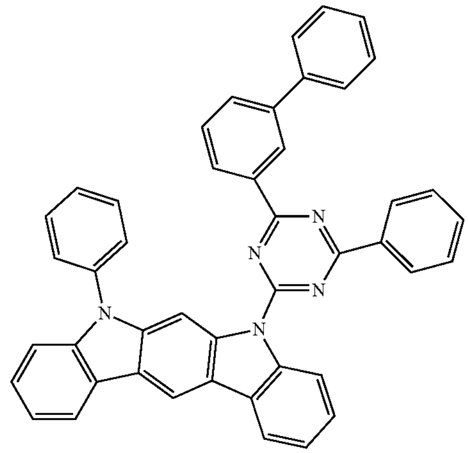
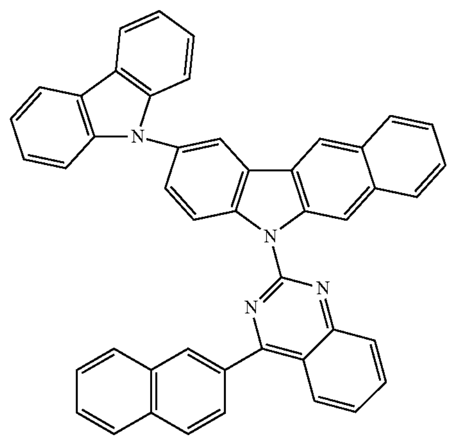
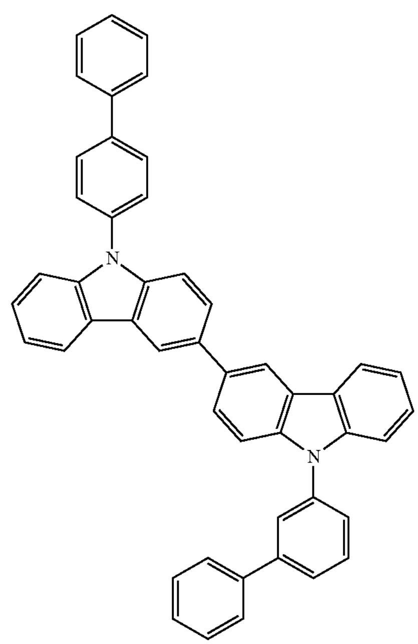

-continued
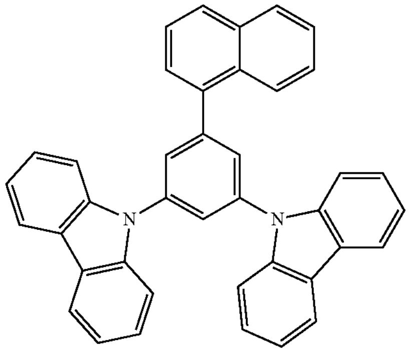
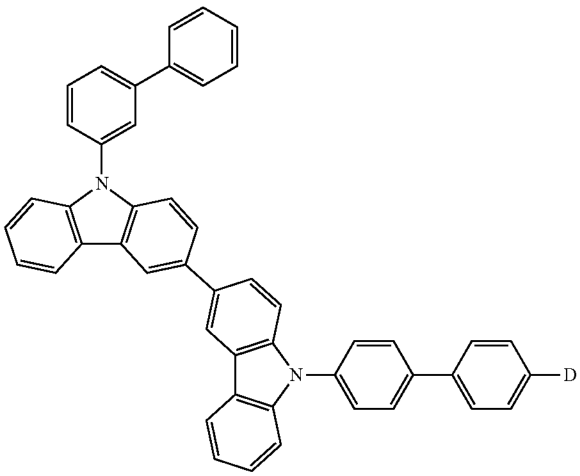
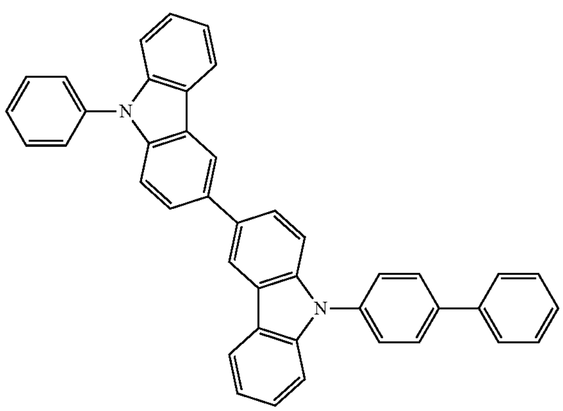
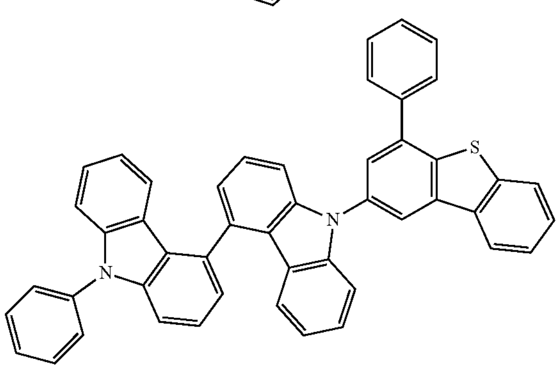
-continued
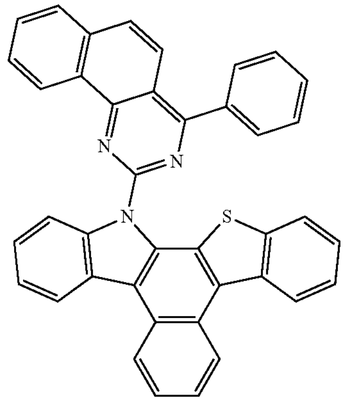
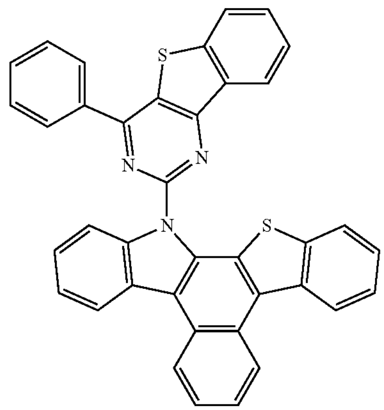
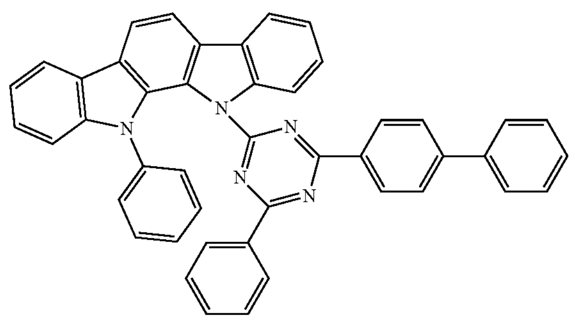
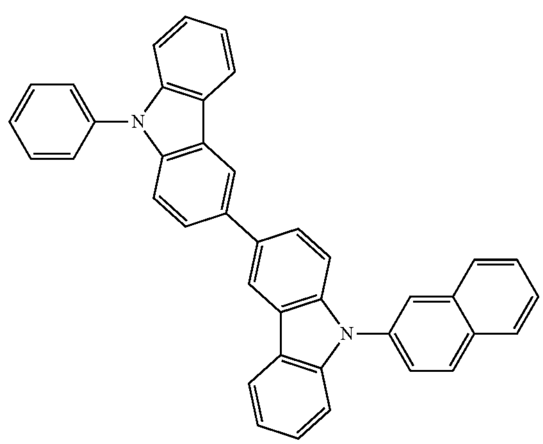

-continued
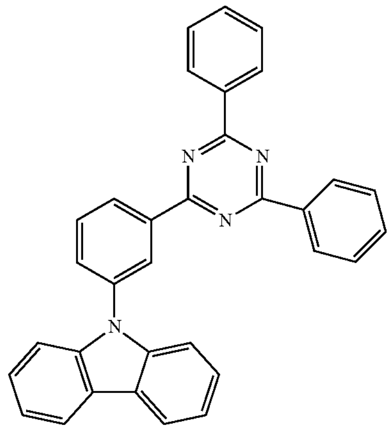
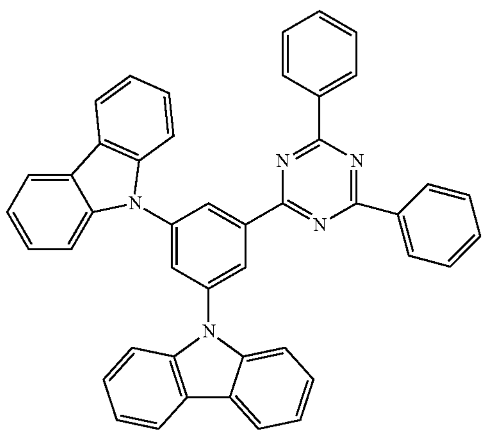
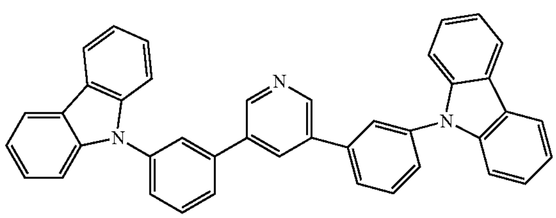
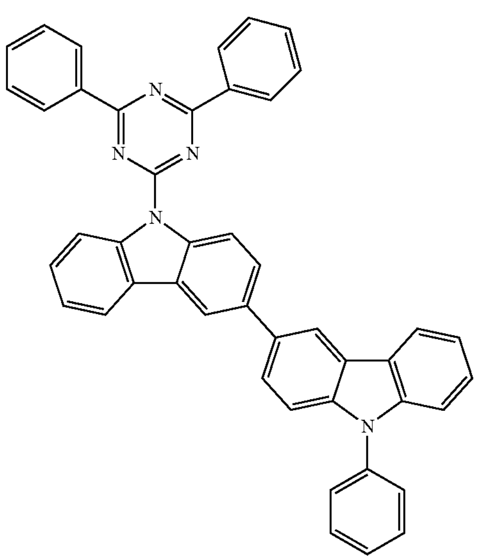
-continued
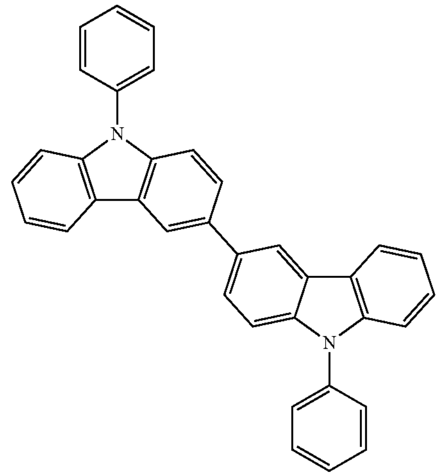
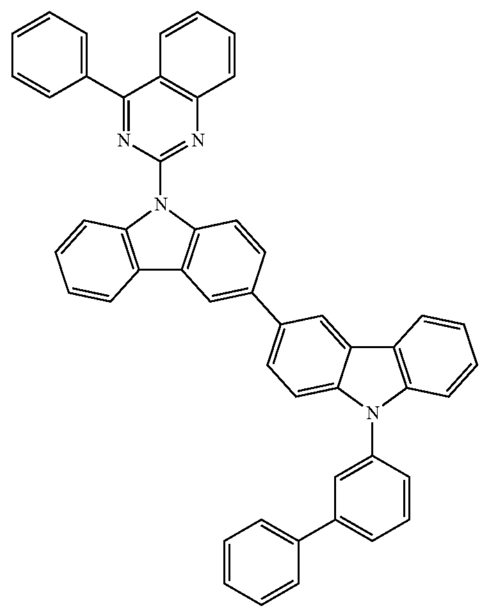
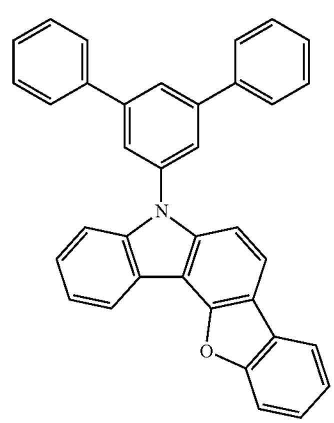

-continued

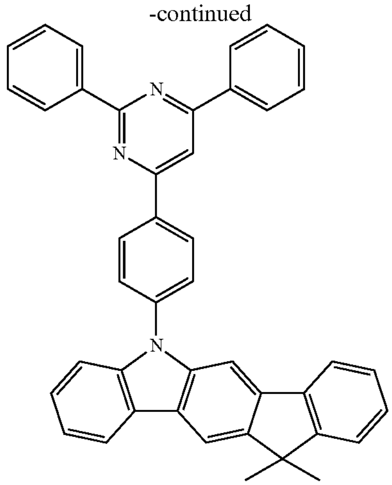

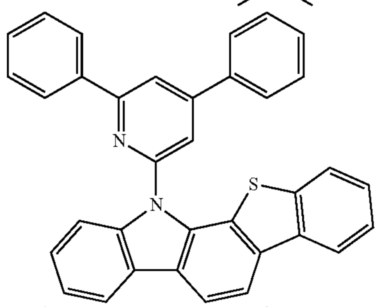

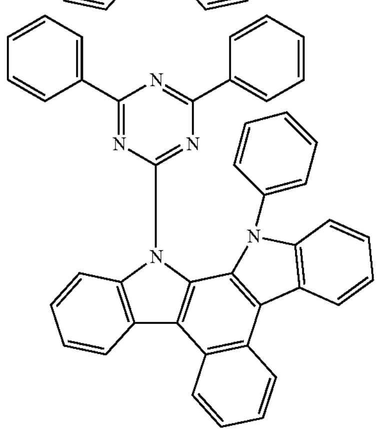

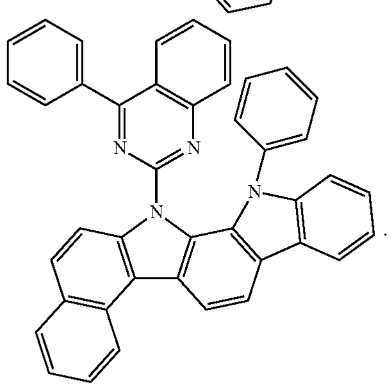

The emission layer EML may further include any suitable host material in the art. For example, the emission layer EML may include, as a host material, at least one of bis[2-(diphenylphosphino)phenyl] ether oxide (DPEPO), 4,4'-bis(carbazol-9-yl)biphenyl (CBP), 1,3-bis(carbazol-9-yl)benzene (mCP), 2,8-bis(diphenylphosphoryl)dibenzo[b,d]furan (PPF), 4,4',4"-tris(carbazol-9-yl)-triphenylamine (TCTA), or 1,3,5-tris(1-phenyl-1H-benz[d]imidazole-2-yl)benzene (TPBi). However, embodiments of the present disclosure are not limited thereto. For example, tris(8-hydroxyquinolino)aluminum ($Alq_3$), 4,4'-bis(N-carbazolyl)-1,1'-biphenyl (CBP), poly(N-vinylcarbazole) (PVK), 9,10-di(naphthalene-2-yl)anthracene (ADN), 4,4',4"-tris(carbazol-9-yl)-triphenylamine (TCTA), 1,3,5-tris(N-phenylbenzimidazole-2-yl)benzene (TPBi), 2-tert-butyl-9,10-di(naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), hexaphenyl cyclotriphosphazene (CP1), 1,4-bis(triphenylsilyl)benzene (UGH2), hexaphenylcyclotrisiloxane ($DPSiO_3$), octaphenylcyclotetra siloxane ($DPSiO_4$), 2,8-bis(diphenylphosphoryl)dibenzofuran (PPF), etc. may be utilized as the host material.

The emission layer EML may include a compound represented by Formula M-a or Formula M-b. The compound represented by Formula M-a or Formula M-b may be utilized as a phosphorescence dopant material:

Formula M-a

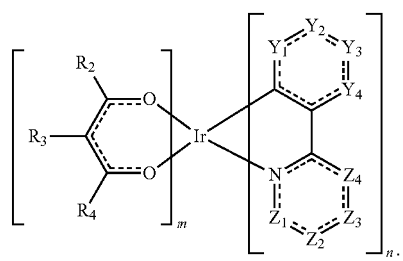

In Formula M-a, $Y_1$ to $Y_4$, and $Z_1$ to $Z_4$ may each independently be $CR_1$ or N, and $R_1$ to $R_4$ may each independently be a hydrogen atom, a deuterium atom, a substituted or unsubstituted amine group, a substituted or unsubstituted thio group, a substituted or unsubstituted oxy group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, and/or may be combined with an adjacent group to form a ring. In Formula M-a, “m” may be 0 or 1, and “n” is 2 or 3. In Formula M-a, when “m” is 0, “n” is 3, and when “m” is 1, “n” is 2.

The compound represented by Formula M-a may be utilized as a red phosphorescence dopant or a green phosphorescence dopant.

The compound represented by Formula M-a may be represented by any one among Compounds M-a1 to M-a23. However, Compounds M-a1 to M-a23 are illustrations, and the compound represented by Formula M-a is not limited to the compounds represented by Compounds M-a1 to M-a23.

-continued
M-a1
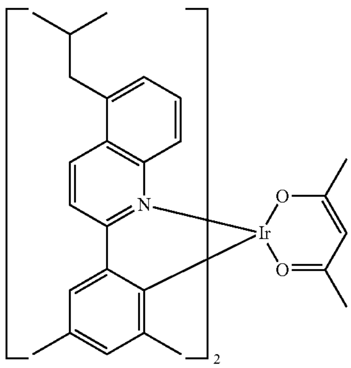
M-a2
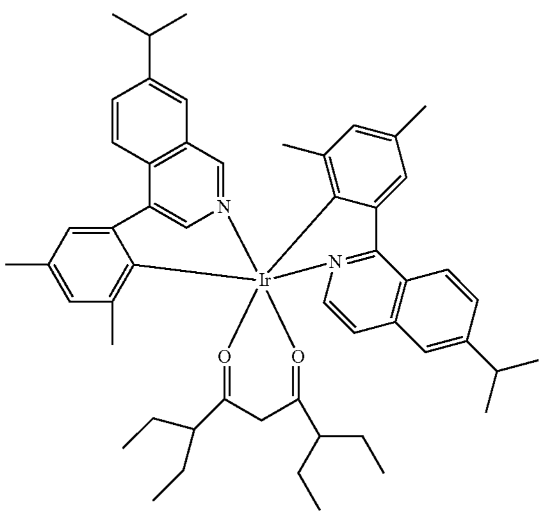
M-a3
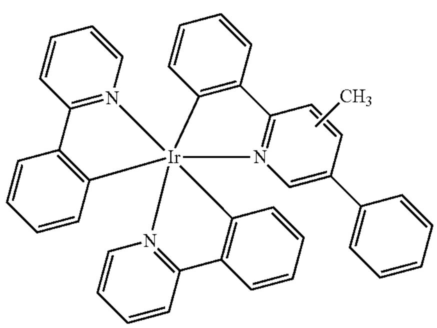
M-a4
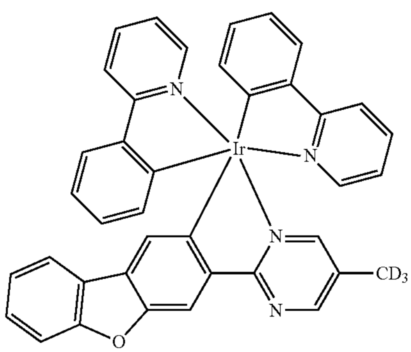
M-a5
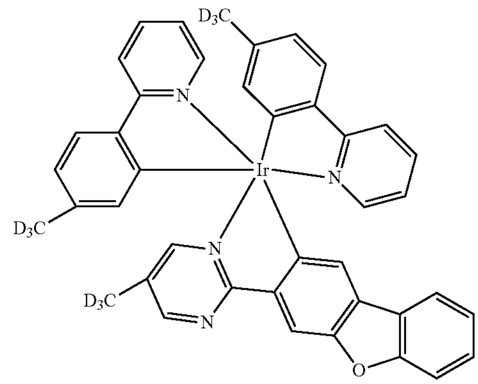
M-a6
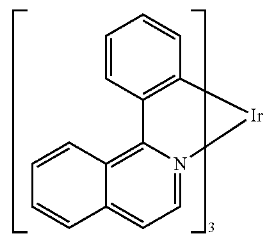
M-a7
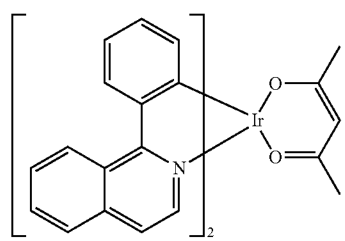
M-a8
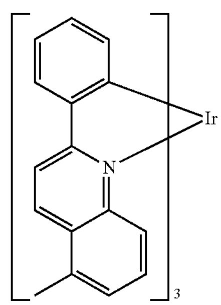
M-a9
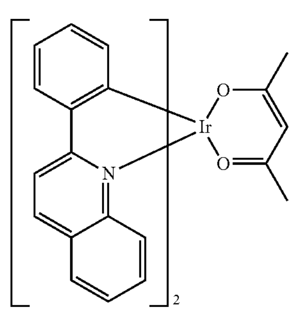

M-a10
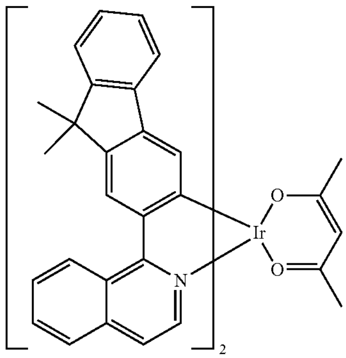
M-a11
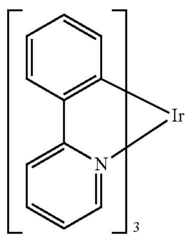
M-a12
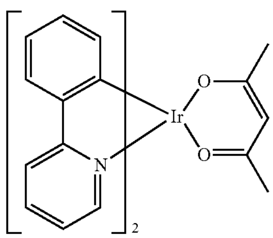
M-a13
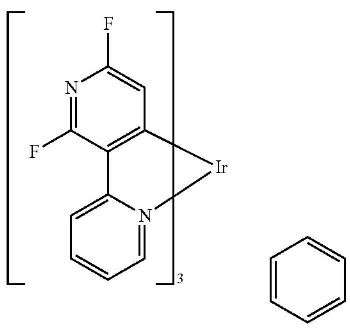
M-a14
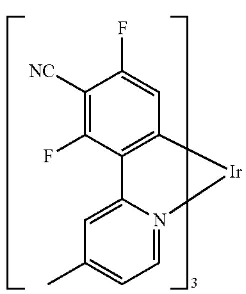
M-a15
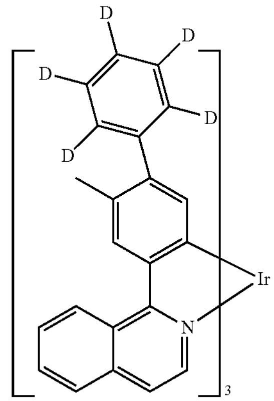
M-a16
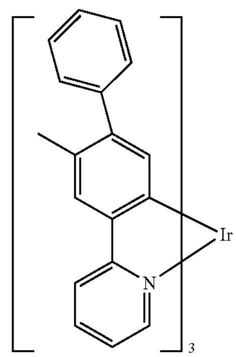
M-a17
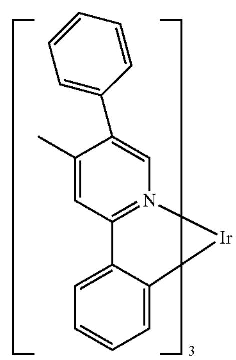
M-a18
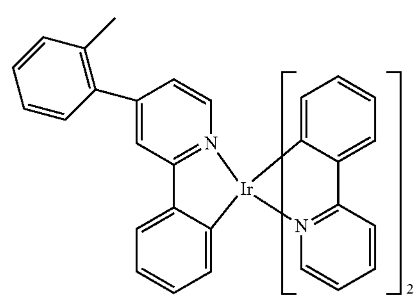

-continued

M-a19

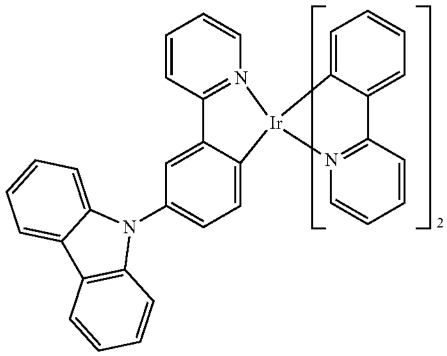

M-a20

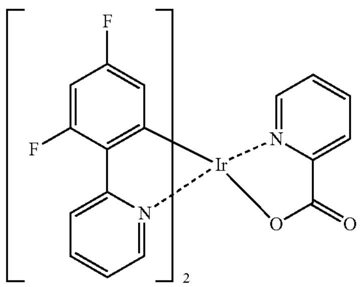

M-a21

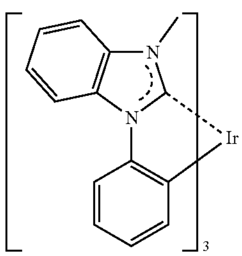

M-a22

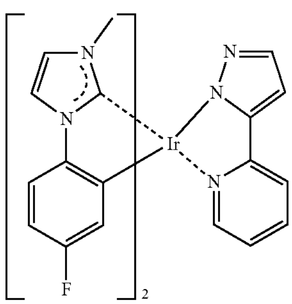

M-a23

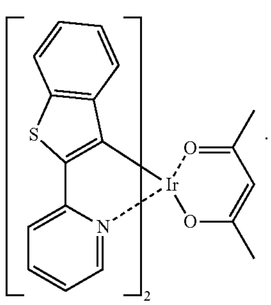

Compound M-a1 and Compound M-a2 may be utilized as red dopant materials, and Compound M-a3 to Compound M-a5 may be utilized as green dopant materials.

Formula M-b

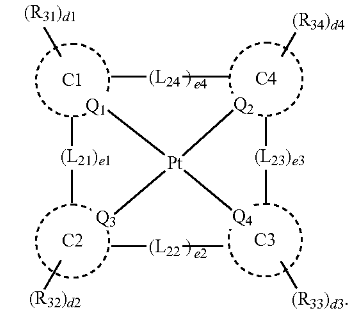

In Formula M-b, $Q_1$ to $Q_4$ may each independently be C or N, and C1 to C4 may each independently be a substituted or unsubstituted hydrocarbon ring of 5 to 30 ring-forming carbon atoms, or a substituted or unsubstituted heterocycle of 2 to 30 ring-forming carbon atoms. $L_{21}$ to $L_{24}$ may each independently be a direct linkage,

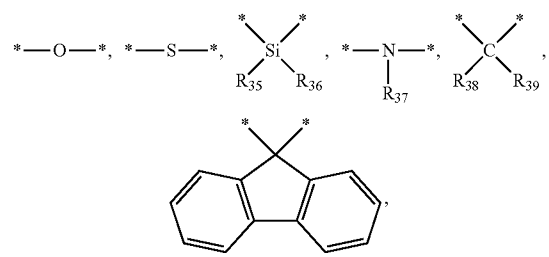

a substituted or unsubstituted divalent alkyl group of 1 to 20 carbon atoms, a substituted or unsubstituted arylene group of 6 to 30 ring-forming carbon atoms, or a substituted or unsubstituted heteroarylene group of 2 to 30 ring-forming carbon atoms, and e1 to e4 may each independently be 0 or 1. $R_{31}$ to $R_{39}$ may each independently be a hydrogen atom, a deuterium atom, a halogen atom, a cyano group, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, and/or may be combined with an adjacent group to form a ring, and d1 to d4 may each independently be an integer of 0 to 4.

The compound represented by Formula M-b may be utilized as a blue phosphorescence dopant or a green phosphorescence dopant.

The compound represented by Formula M-b may be represented by any one among the compounds. However, the compounds below are illustrations, and the compound represented by Formula M-b is not limited to the compounds represented below:

-continued
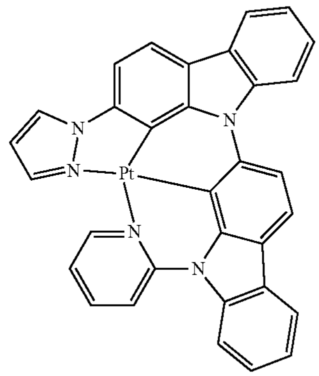
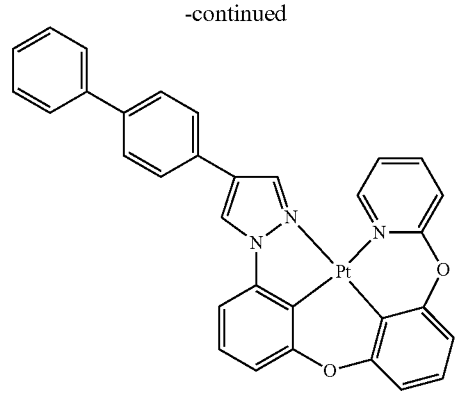
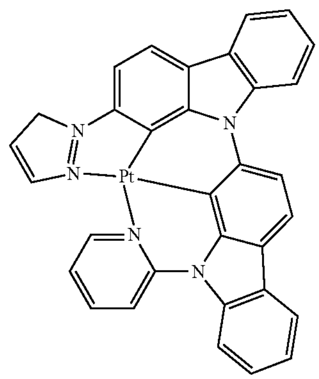
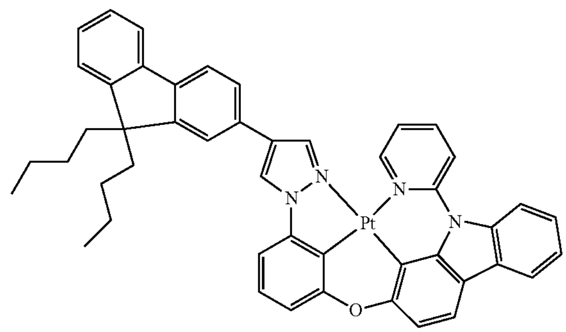
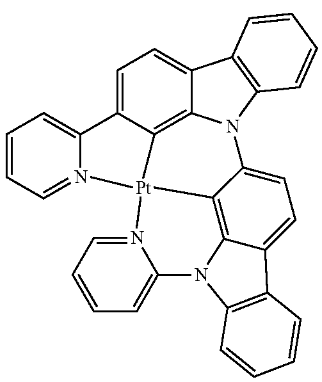
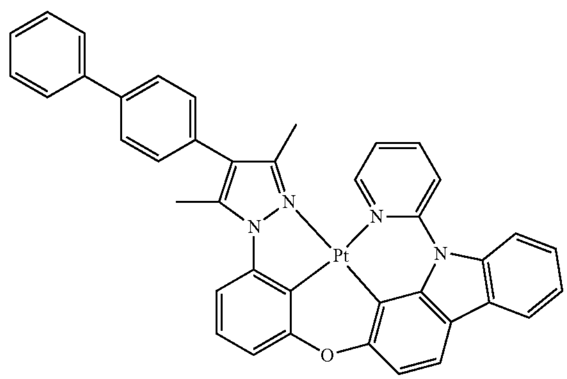
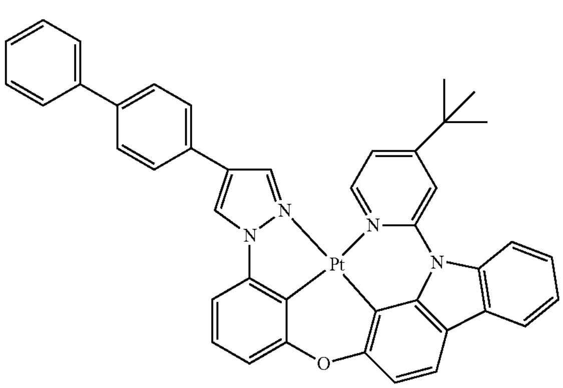
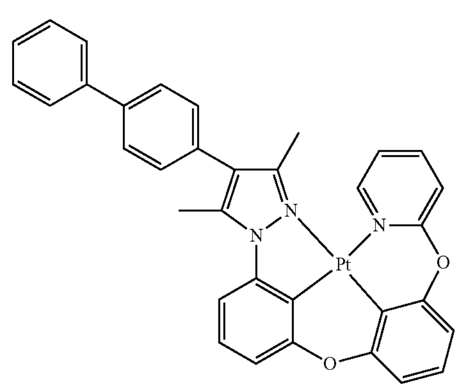

-continued

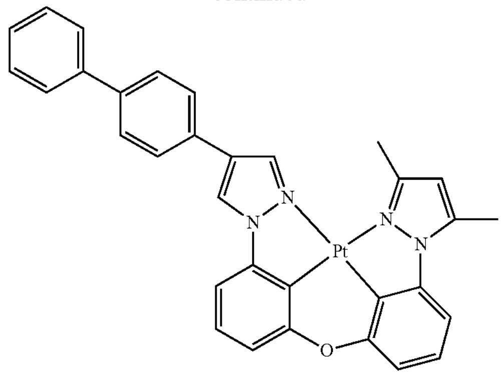

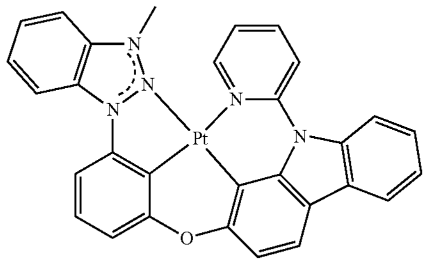

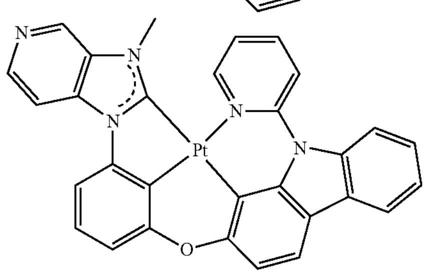

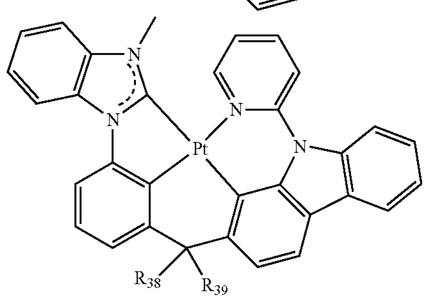

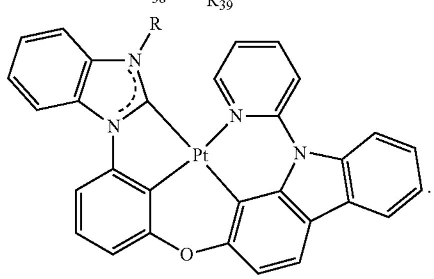

In the compounds above, R, $R_{38}$, and $R_{39}$ may each independently be a hydrogen atom, a deuterium atom, a halogen atom, a cyano group, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms.

In some embodiments, at least one of the compounds of the dopant material including Pt as a central metal may be included.

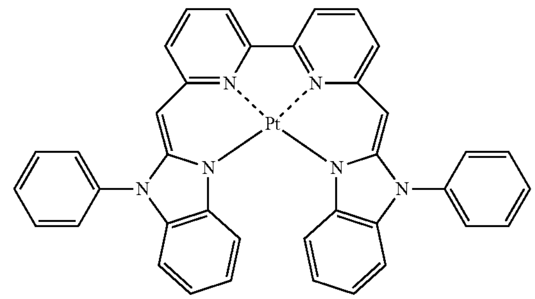

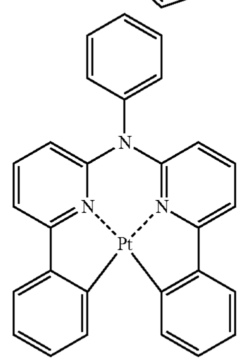

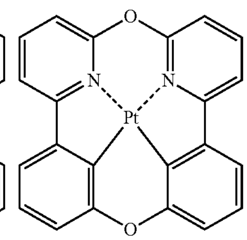

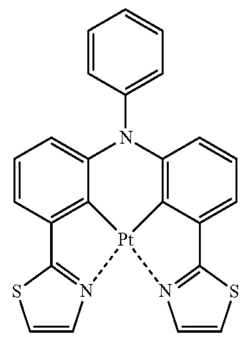

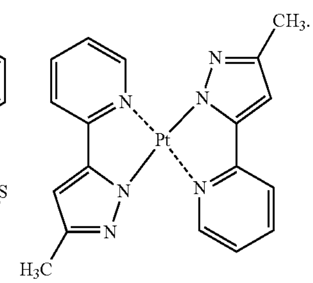

The emission layer EML may include any one among Formula F-a to Formula F-c. The compounds represented by Formula F-a to Formula F-c may be utilized as fluorescence dopant materials.

Formula F-a

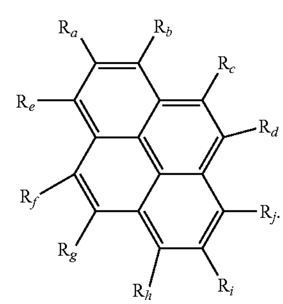

In Formula F-a, two selected from $R_a$ to $R_j$ may each independently be substituted with *—$NAr_1Ar_2$. The remaining positions (groups) among $R_a$ to $R_j$ that are not substituted with *—$NAr_1Ar_2$ may each independently be a hydrogen atom, a deuterium atom, a halogen atom, a cyano group, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms.

In *—$NAr_1Ar_2$, $Ar_1$ and $Ar_2$ may each independently be a substituted or unsubstituted aryl group of 6 to 30 ring-forming carbon atoms, or a substituted or unsubstituted heteroaryl group of 2 to 30 ring-forming carbon atoms. For example, at least one among $Ar_1$ and Are may be a heteroaryl group including O or S as a ring-forming atom.

The emission layer may include at least one among Compounds FD1 to FD22 as a fluorescence dopant.

FD1

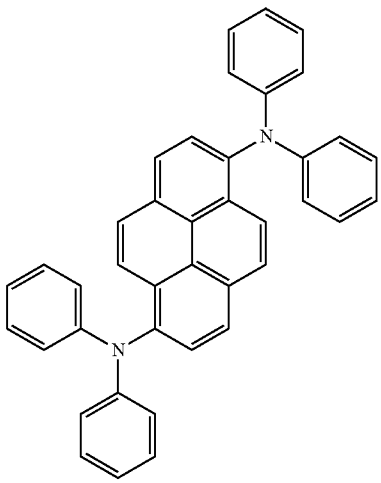

FD2

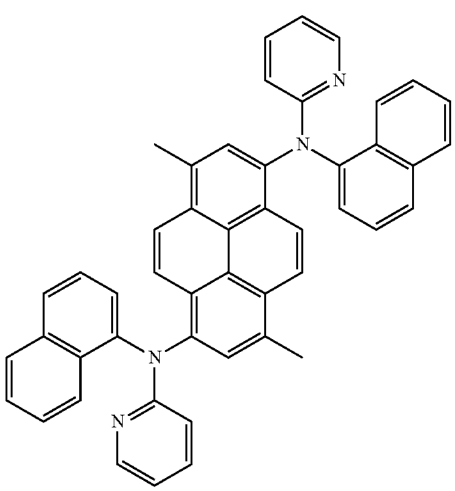

-continued

FD3

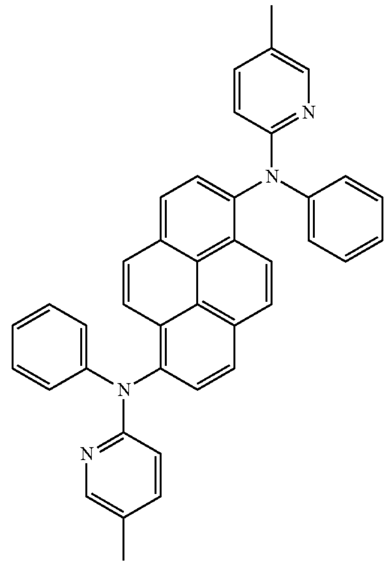

FD4

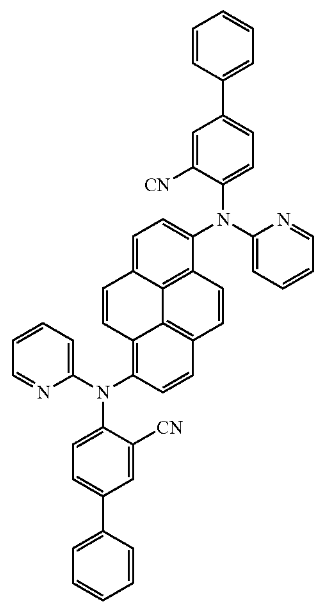

FD5

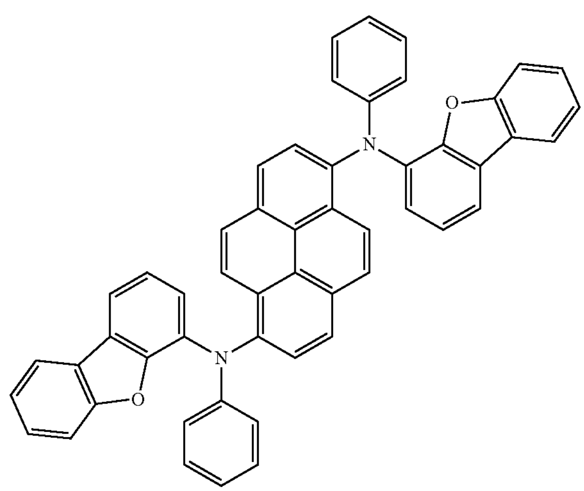

-continued
FD6
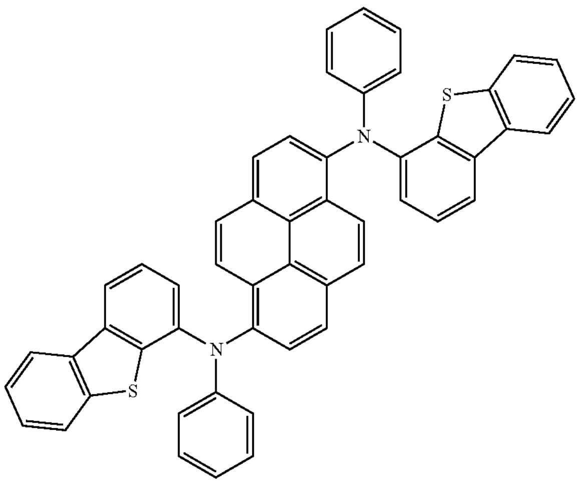
FD7
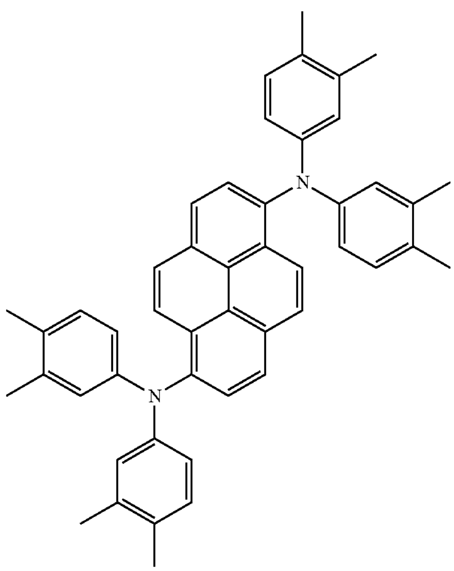
FD8
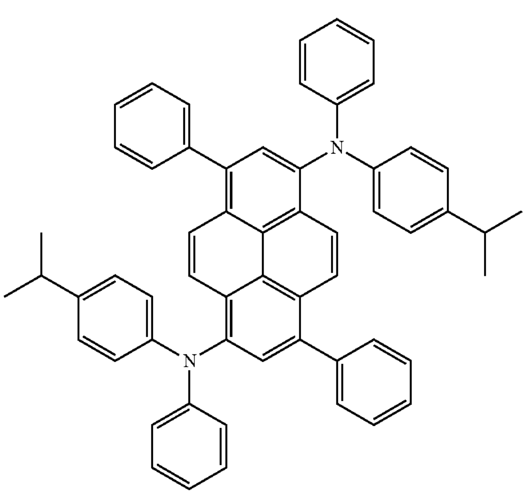
-continued
FD9
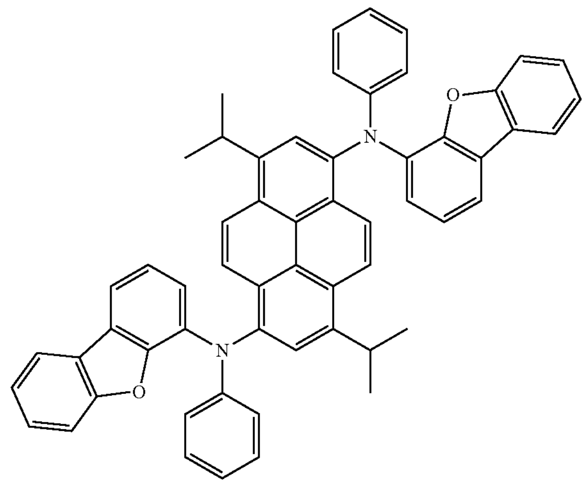
FD10
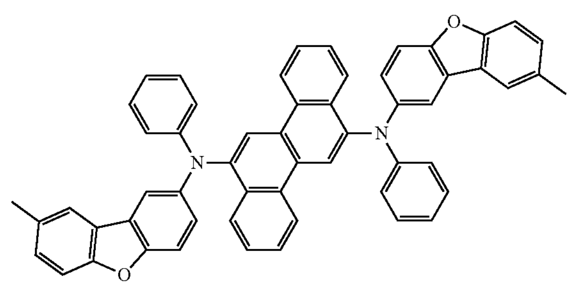
FD11
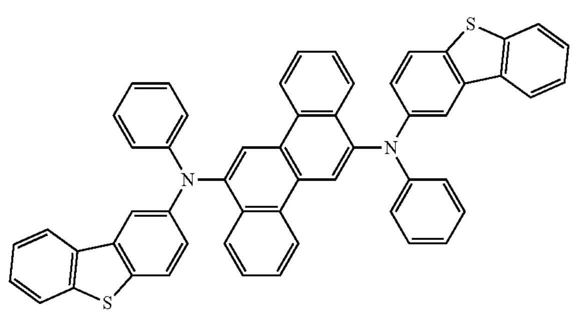
FD12
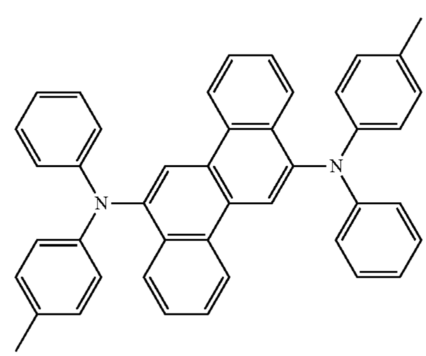

FD13
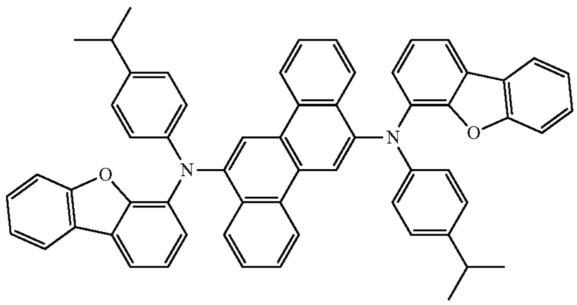
FD14
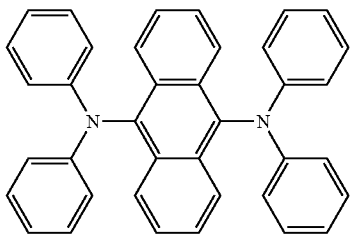
FD15
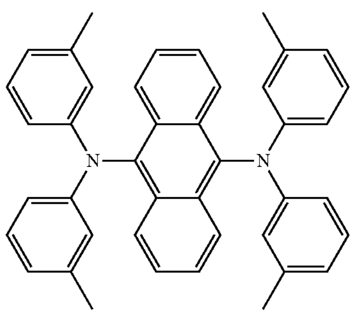
FD16
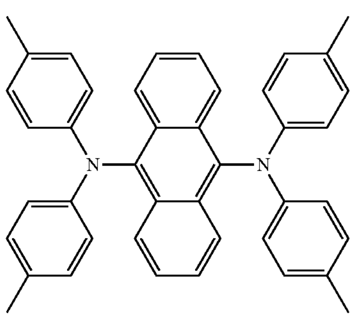
FD17
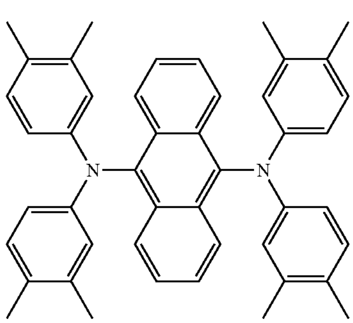
FD18
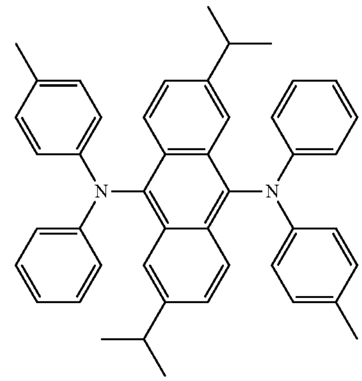
FD19
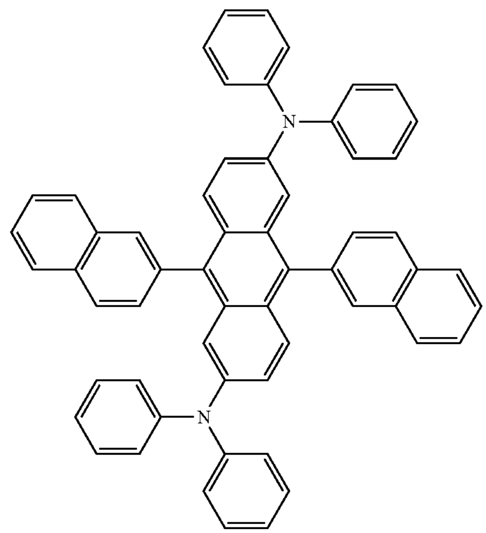
FD20
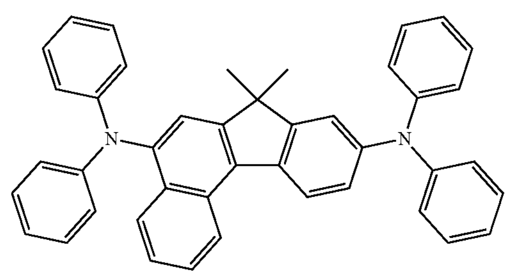
FD21
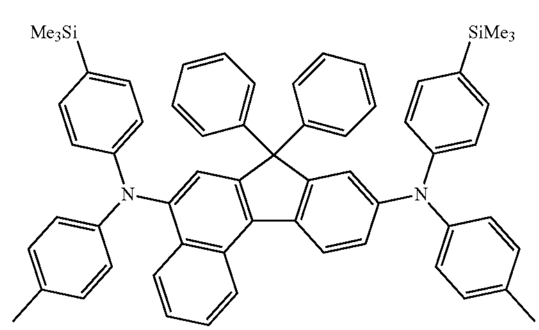

-continued

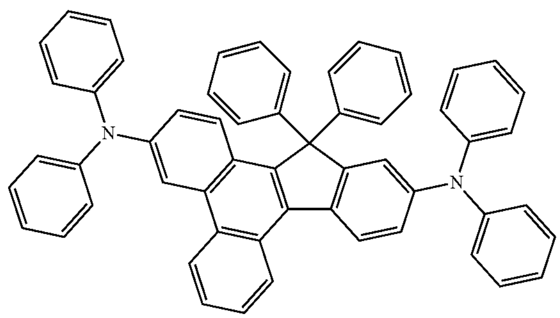

FD22

Formula F-b

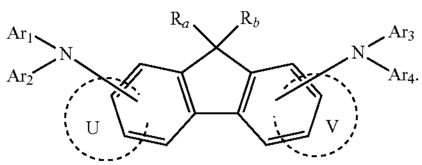

In Formula F-b, $R_a$ and $R_b$ may each independently be a hydrogen atom, a deuterium atom, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, and/or may be combined with an adjacent group to form a ring.

In Formula F-b, U and V may each independently be a substituted or unsubstituted hydrocarbon ring of 5 to 30 ring-forming carbon atoms, or a substituted or unsubstituted heterocycle of 2 to 30 ring-forming carbon atoms.

In Formula F-b, the number of rings represented by U and V may each independently be 0 or 1. For example, in Formula F-b, when the number of U or V is 1, one ring forms a fused ring at the designated part by each of U or V, and when the number of U or V is 0, a ring is not present at the designated part by each of U or V. For example, when the number of U is 0, and the number of V is 1, or when the number of U is 1, and the number of V is 0, a fused ring having the fluorene core of Formula F-b may be a ring compound with four rings total. In some embodiments, if the number of both U and V is 0 (e.g., simultaneously), the fused ring of Formula F-b may be a ring compound with three rings. In some embodiments, when the number of both U and V is 1 (e.g., simultaneously), a fused ring having the fluorene core of Formula F-b may be a ring compound with five rings total.

Formula F-c

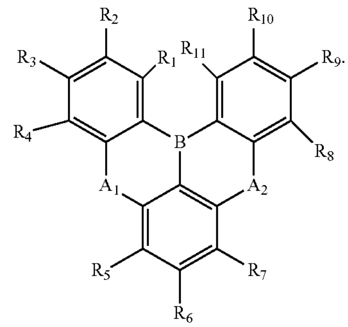

In Formula F-c, $A_1$ and $A_2$ may each independently be O, S, Se, or $NR_m$, and $R_m$ may be a hydrogen atom, a deuterium atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms. $R_1$ to $R_{11}$ may each independently be a hydrogen atom, a deuterium atom, a halogen atom, a cyano group, a substituted or unsubstituted amine group, a substituted or unsubstituted boryl group, a substituted or unsubstituted oxy group, a substituted or unsubstituted thio group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, and/or may be combined with an adjacent group to form a ring.

In Formula F-c, $A_1$ and $A_2$ may each independently be combined with the substituents of an adjacent ring to form a fused ring. For example, when $A_1$ and/or $A_2$ are each $NR_m$, $A_1$ may be combined with $R_4$ or $R_5$ to form a ring, and/or $A_2$ may be combined with $R_7$ or $R_8$ to form a ring.

In an embodiment, the emission layer EML may include any suitable dopant material, for example, styryl derivatives (for example, 1,4-bis[2-(3-N-ethylcarbazolyl)vinyl]benzene (BCzVB), 4-(di-p-tolylamino)-4'-[(di-p-tolylamino)styryl]stilbene (DPAVB), N-(4-((E)-2-(6-((E)-4-(diphenylamino)styryl)naphthalen-2-yl)vinyl)phenyl)-N-phenylbenzenamine (N-BDAVBi), and 4,4'-bis[2-(4-(N,N-diphenylamino)phenyl)vinyl]biphenyl (DPAVBi)), perylene and/or derivatives thereof (for example, 2,5,8,11-tetra-t-butylperylene (TBP)), pyrene and/or derivatives thereof (for example, 1,1-dipyrene, 1,4-dipyrenylbenzene, and 1,4-bis(N,N-diphenylamino)pyrene), etc.

The emission layer EML may include any suitable phosphorescence dopant material. For example, the phosphorescence dopant may utilize a metal complex including iridium (Ir), platinum (Pt), osmium (Os), gold (Au), titanium (Ti), zirconium (Zr), hafnium (Hf), europium (Eu), terbium (Tb) or thulium (Tm). For example, iridium(III) bis(4,6-difluorophenylpyridinato-N, C2')pinocolinate) (FIrpic), bis(2,4-difluorophenylpyridinato)-tetrakis(1-pyrazolyl)borate iridium(III) (Fir6), or platinum octaethyl porphyrin (PtOEP) may be utilized as the phosphorescence dopant. However, embodiments of the present disclosure are not limited thereto.

The emission layer EML may include a quantum dot material. The core of the quantum dot may be selected from a II-VI group compound, a III-VI group compound, a group compound, a III-V group compound, a III-II-V group compound, a IV-VI group compound, a IV group element, a IV group compound, and combinations thereof.

The II-VI group compound may be selected from the group consisting of: a binary compound selected from the group consisting of CdSe, CdTe, CdS, ZnS, ZnSe, ZnTe, ZnO, HgS, HgSe, HgTe, MgSe, MgS, and mixtures thereof; a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and mixtures thereof; and a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and mixtures thereof.

The III-VI group compound may include a binary compound (such as $In_2S_3$), and/or $In_2Se_3$, a ternary compound (such as $InGaS_3$, and/or $InGaSe_3$), or optional combinations thereof.

The group compound may be selected from a ternary compound selected from the group consisting of AgInS, $AgInS_2$, CuInS, $CuInS_2$, $AgGaS_2$, $CuGaS_2$, $CuGaO_2$, $AgGaO_2$, $AgAlO_2$ and mixtures thereof, or a quaternary compound (such as $AgInGaS_2$ and/or $CuInGaS_2$).

The III-V group compound may be selected from the group consisting of a binary compound selected from the group consisting of GaN, GaP, GaAs, GaSb, AlN, AlP, AlAs, AlSb, InN, InP, InAs, InSb, and mixtures thereof, a ternary compound selected from the group consisting of GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, and mixtures thereof, and a quaternary compound selected from the group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and mixtures thereof. In some embodiments, the III-V group compound may further include a II group metal. For example, InZnP, etc. may be selected as a III-II-V group compound.

The IV-VI group compound may be selected from the group consisting of a binary compound selected from the group consisting of SnS, SnSe, SnTe, PbS, PbSe, PbTe, and mixtures thereof, a ternary compound selected from the group consisting of SnSeS, SnSeTe, SnSTe, PbSeS, PbSeTe, PbSTe, SnPbS, SnPbSe, SnPbTe, and mixtures thereof, and a quaternary compound selected from the group consisting of SnPbSSe, SnPbSeTe, SnPbSTe, and mixtures thereof. The IV group element may be selected from the group consisting of Si, Ge, and a mixture thereof. The IV group compound may be a binary compound selected from the group consisting of SiC, SiGe, and a mixture thereof.

In this case, the binary compound, the ternary compound or the quaternary compound may be present at a substantially uniform concentration in a particle, or may be present at a partially different (e.g., a non-uniform) concentration distribution state in the same particle. In some embodiments, a core/shell structure in which one quantum dot wraps (e.g., covers or surrounds) another quantum dot may be possible. The interface of the core and the shell may have a concentration gradient in which the concentration of an element present in the shell is decreased toward the center.

In some embodiments, the quantum dot may have the above-described core-shell structure including a core including a nanocrystal and a shell wrapping the core. The shell of the quantum dot may play the role of a protection layer for preventing or reducing chemical deformation (e.g., degradation) of the core to maintain semiconductor properties and/or the role of a charging layer for imparting the quantum dot with electrophoretic properties. The shell may have a single layer or a multilayer. The interface of the core and the shell may have a concentration gradient in which the concentration of an element present in the shell is decreased toward the center. Examples of the shell of the quantum dot may include a metal or non-metal oxide, a semiconductor compound, and combinations thereof.

For example, the metal or non-metal oxide may include a binary compound (such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$ and/or NiO), or a ternary compound (such as $MgAl_2O_4$, $CoFe_2O_4$, $NiFe_2O_4$ and/or $CoMn_2O_4$), but embodiments of the present disclosure are not limited thereto.

In some embodiments, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, etc., but embodiments of the present disclosure are not limited thereto.

The quantum dot may have a full width at half maximum (FWHM) of emission wavelength spectrum of about 45 nm or less, about 40 nm or less, more, about 30 nm or less. Within this range, color purity or color reproducibility may be improved. In some embodiments, light emitted via such quantum dot is emitted in all directions, and light view angle properties may be improved.

The shape of the quantum dot may be any suitable shape in the art, without specific limitation. For example, a spherical, pyramidal, multi-arm, or cubic nanoparticle, nanotube, nanowire, nanofiber, nanoplate particle, etc. may be utilized.

The quantum dot may control the color of light emitted according to the particle size, and accordingly, the quantum dot may have one or more suitable emission colors (such as blue, red and/or green).

In the light emitting diode ED of an embodiment, as shown in FIG. 1 to FIG. 4, the electron transport region ETR is provided on the emission layer EML. The electron transport region ETR may include at least one of an hole blocking layer HBL, an electron transport layer ETL or an electron injection layer EIL. However, embodiments of the present disclosure are not limited thereto.

The electron transport region ETR may have a single layer formed utilizing a single material, a single layer formed utilizing multiple different materials, or a multilayer structure having multiple layers formed utilizing multiple different materials.

For example, the electron transport region ETR may have a single layer structure of an electron injection layer EIL or an electron transport layer ETL, or a single layer structure formed utilizing an electron injection material and an electron transport material. In some embodiments, the electron transport region ETR may have a single layer structure formed utilizing multiple different materials, or a structure stacked from the emission layer EML of electron transport layer ETL/electron injection layer EIL, or hole blocking layer HBL/electron transport layer ETL/electron injection layer EIL, without limitation. The thickness of the electron transport region ETR may be, for example, about 1,000 Å to about 1,500 Å.

The electron transport region ETR may be formed utilizing one or more suitable methods (such as a vacuum deposition method, a spin coating method, a cast method, a Langmuir-Blodgett (LB) method, an inkjet printing method, a laser printing method, and/or a laser induced thermal imaging (LITI) method).

The electron transport region ETR may include a compound represented by Formula ET-1:

Formula ET-1

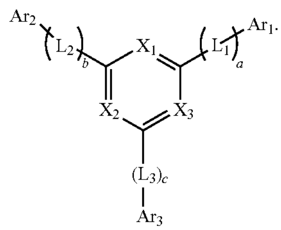

In Formula ET-1, at least one among $X_1$ to $X_3$ may be N, and the remainder are $CR_a$. $R_a$ may be a hydrogen atom, a deuterium atom, a substituted or unsubstituted alkyl of 1 to 20 carbon atoms, a substituted or unsubstituted aryl group of 6 to 30 ring-forming carbon atoms, or a substituted or unsubstituted heteroaryl group of 2 to 30 ring-forming carbon atoms. $Ar_1$ to $Ar_3$ may each independently be a hydrogen atom, a deuterium atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms.

In Formula ET-1, "a" to "c" may each independently be an integer of 0 to 10. In Formula ET-1, $L_1$ to $L_3$ may each independently be a direct linkage, a substituted or unsubstituted arylene group of 6 to 30 ring-forming carbon atoms, or a substituted or unsubstituted heteroarylene group of 2 to 30 ring-forming carbon atoms. In some embodiments, when "a" to "c" are integers of 2 or more, $L_1$ to $L_3$ may each independently be a substituted or unsubstituted arylene group of 6 to 30 ring-forming carbon atoms, or a substituted or unsubstituted heteroarylene group of 2 to 30 ring-forming carbon atoms.

The electron transport region ETR may include an anthracene-based compound. However, embodiments of the present disclosure are not limited thereto, and the electron transport region ETR may include, for example, tris(8-hydroxyquinolinato)aluminum ($Alq_3$), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazolyl-1-ylphenyl)-9,10-dinaphthylanthracene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,08)-(1,1'-biphenyl-4-olato) aluminum (BAlq), beryllium bis(benzoquinolin-10-olate ($Bebq_2$), 9,10-di(naphthalene-2-yl)anthracene (ADN), 1,3-bis[3,5-di(pyridin-3-yl)phenyl]benzene (BmPyPhB), and/or one or more mixtures thereof, without limitation.

The electron transport region ETR may include at least one among Compounds ET1 to ET36:

ET1

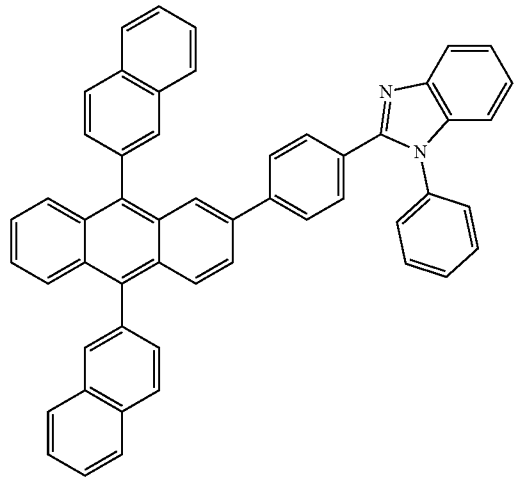

ET2

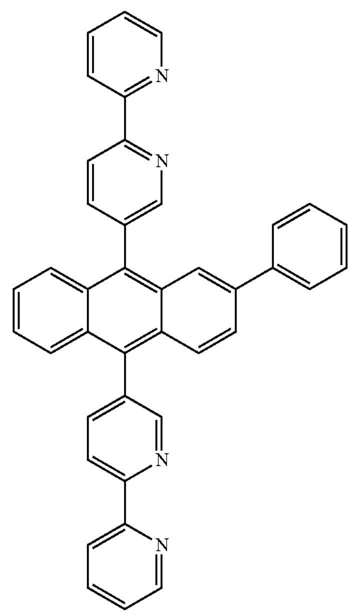

ET3

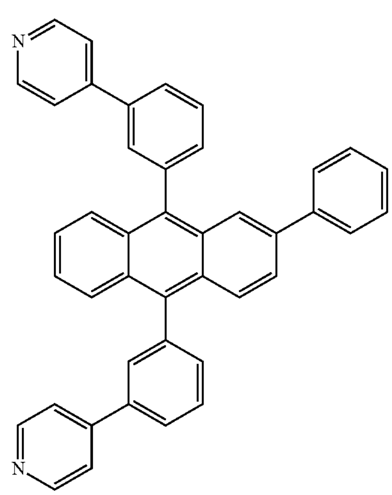

-continued
ET4
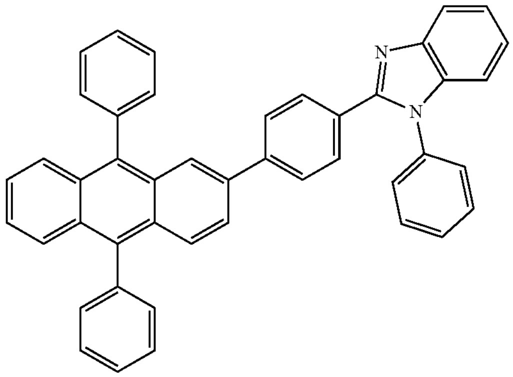
ET5
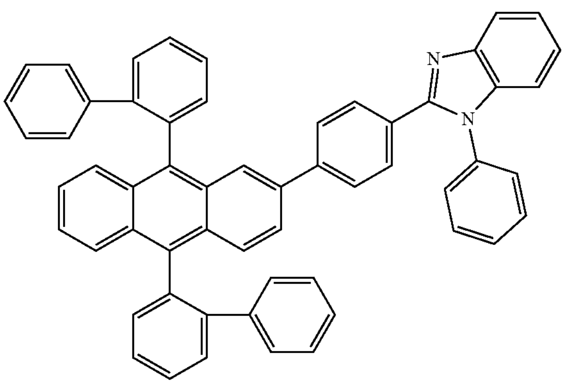
ET6
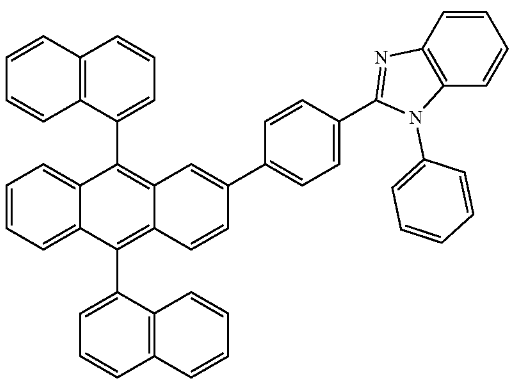
ET7
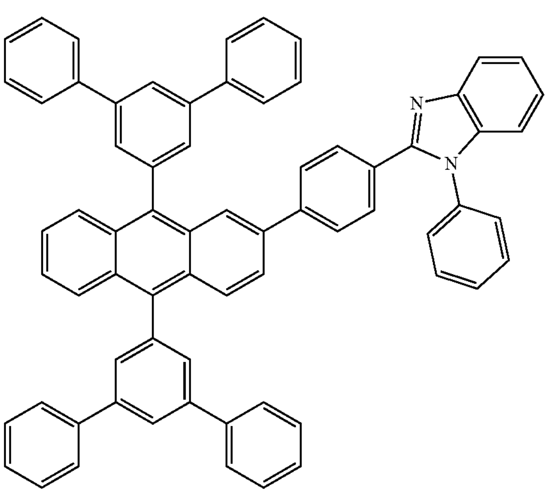
-continued
ET8
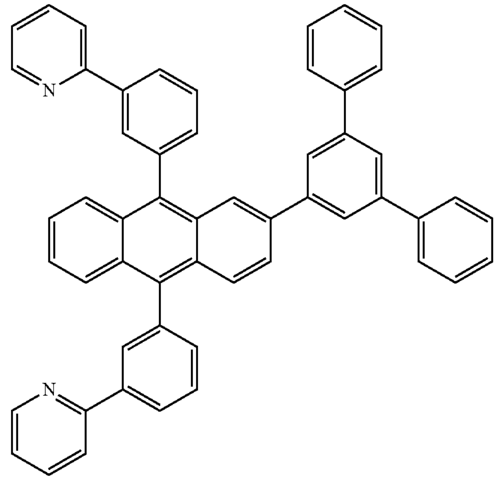
ET9
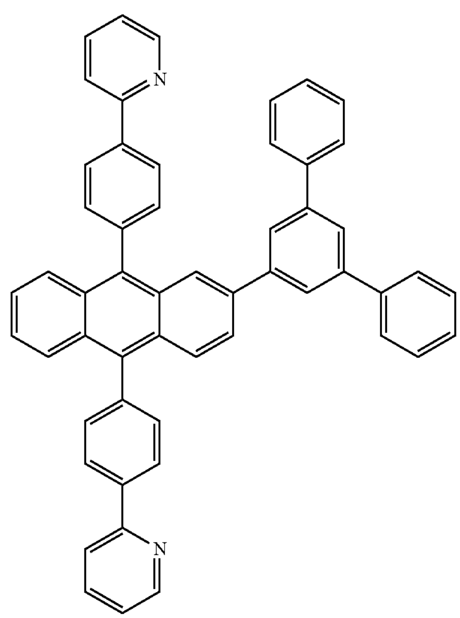

-continued
ET10
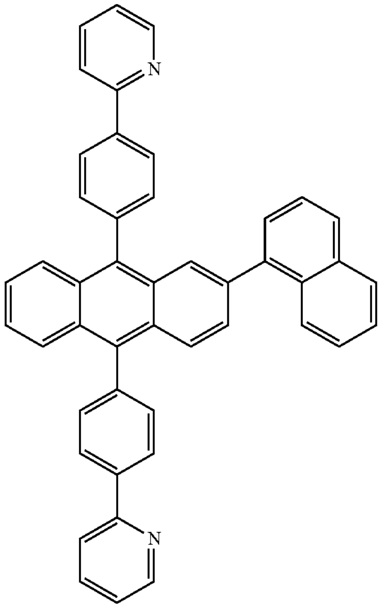
ET11
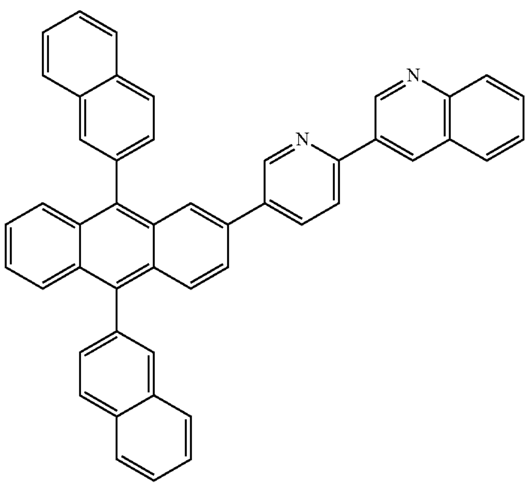
ET12
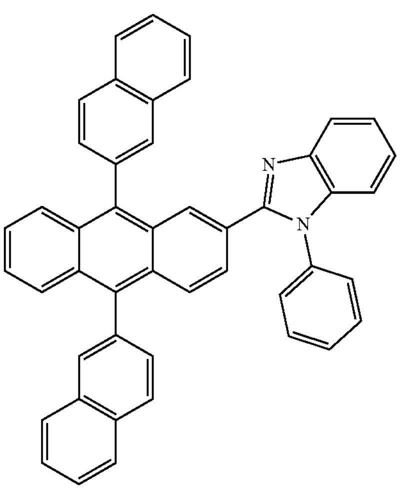
-continued
ET13
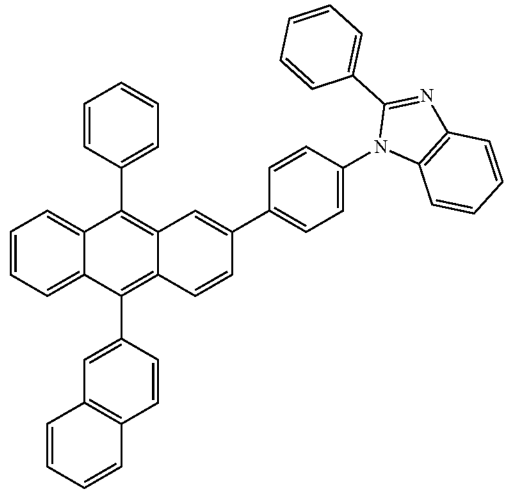
ET14
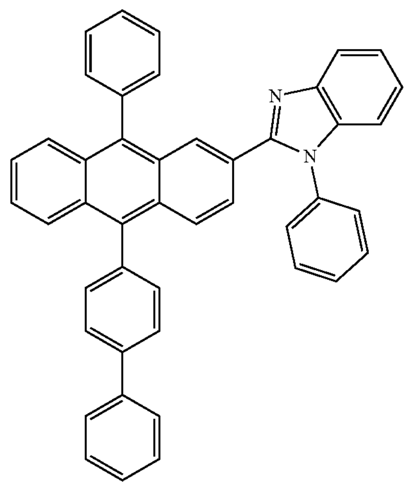
ET15
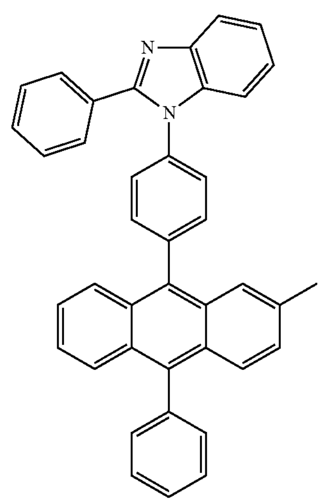

ET16
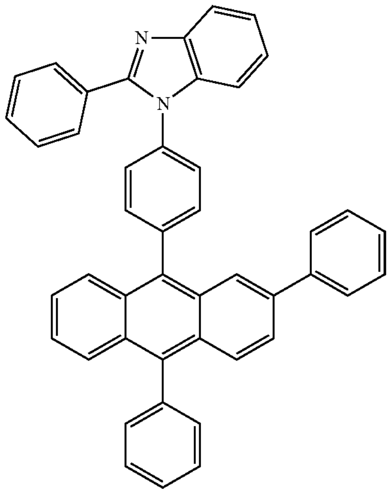
ET17
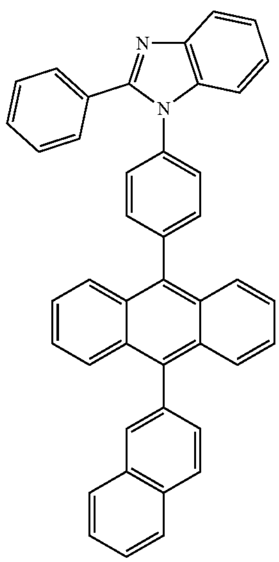
ET18
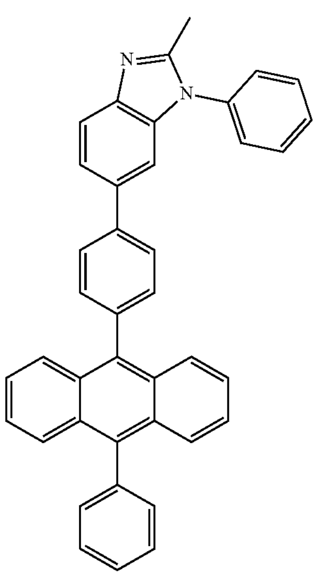
ET19
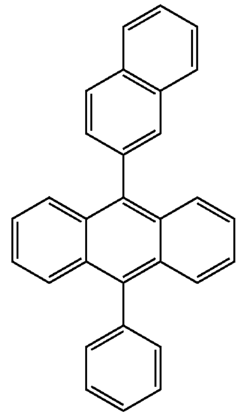
ET20
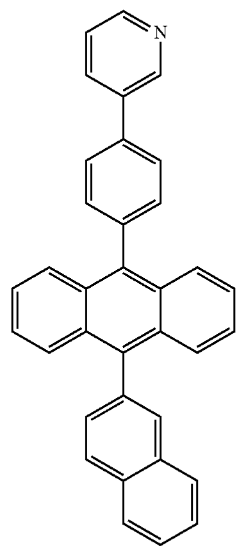
ET21
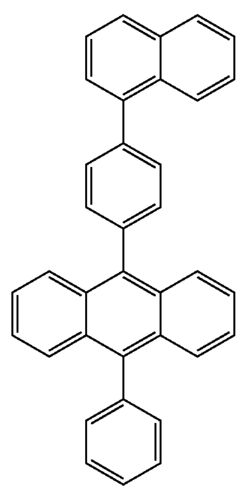

-continued
ET22
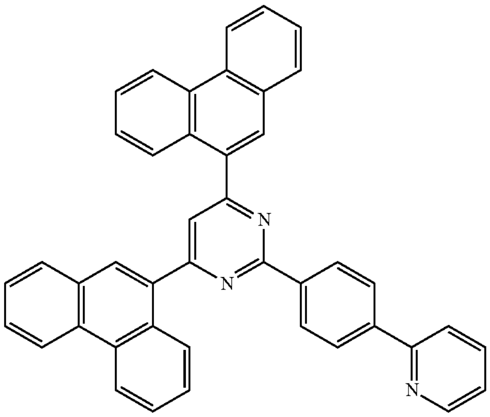
ET23
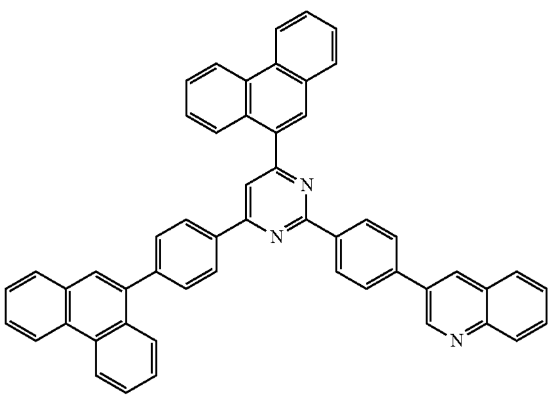
ET24
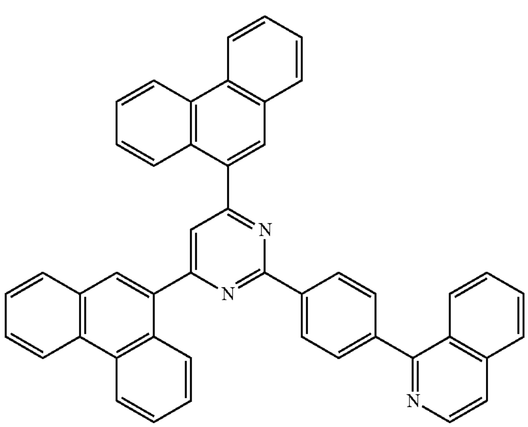
-continued
ET25
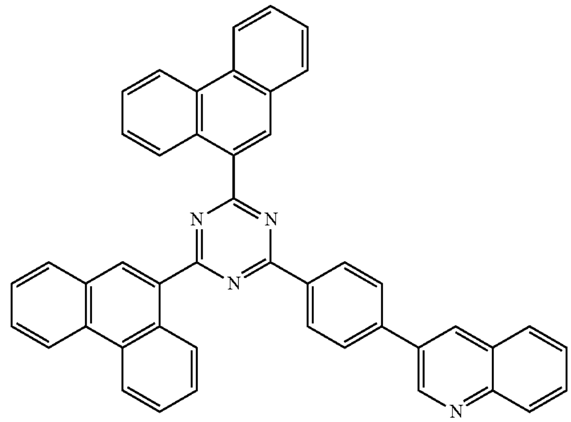
ET26
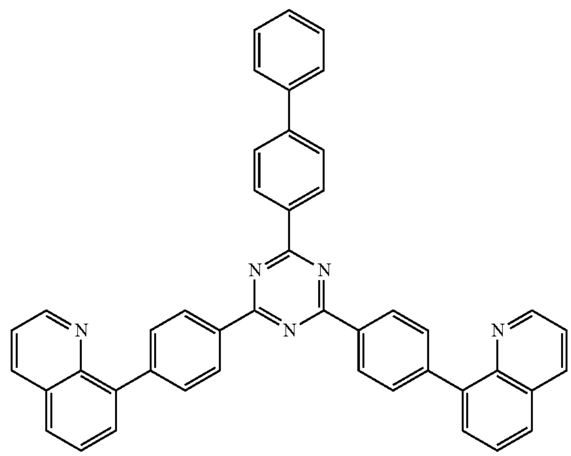
ET27
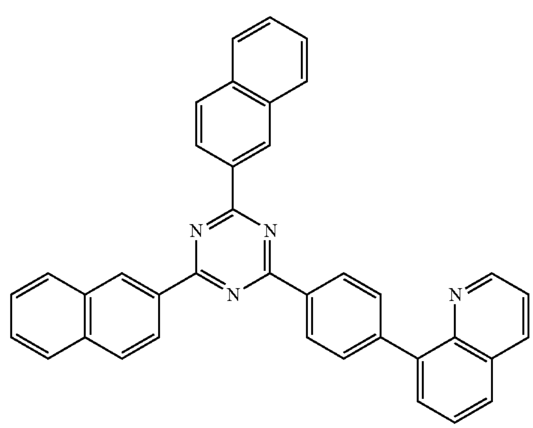

-continued
ET28
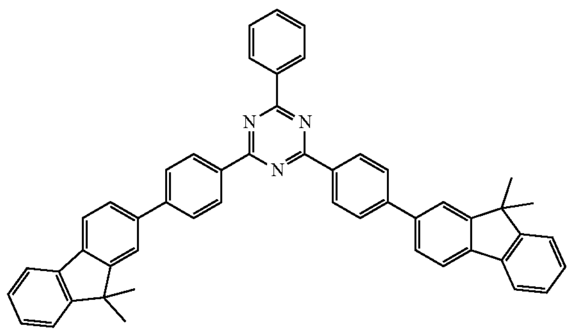
ET29
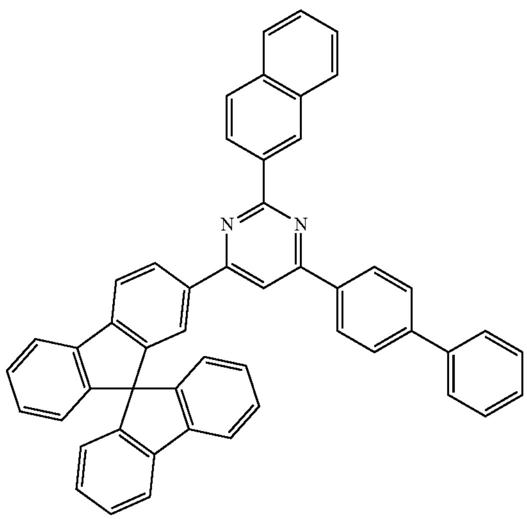
ET30
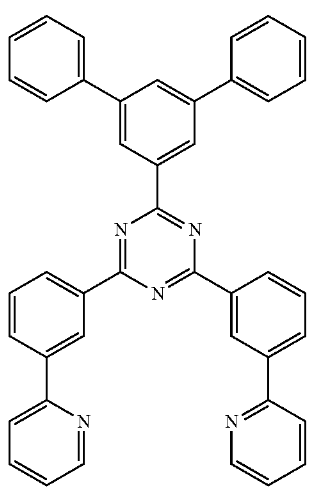
-continued
ET31
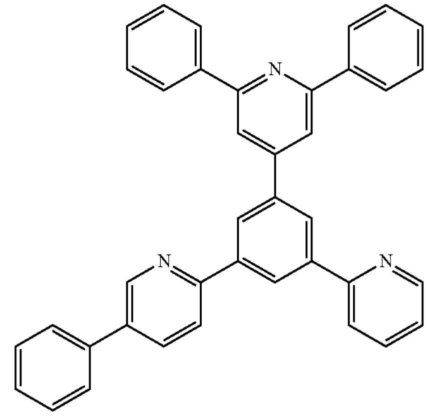
ET32
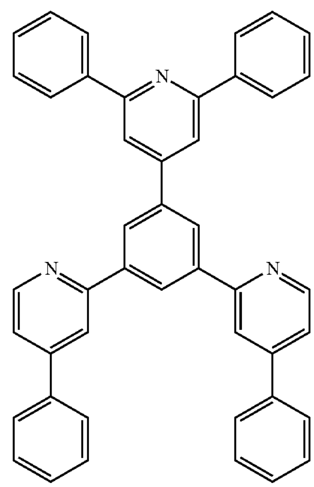
ET33
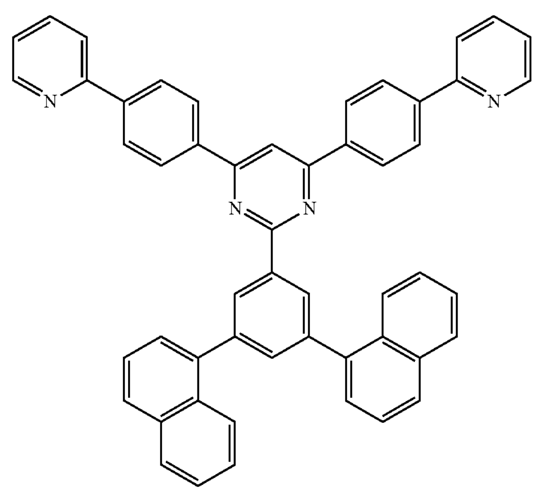

-continued

ET34

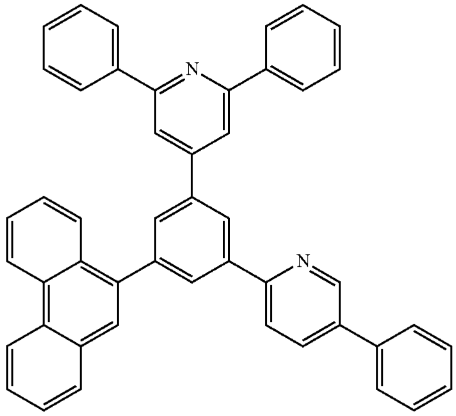

ET35

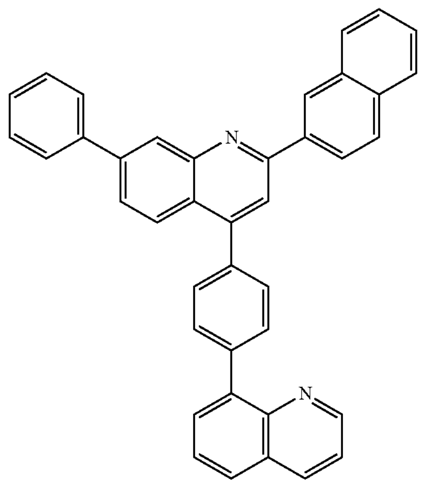

ET36

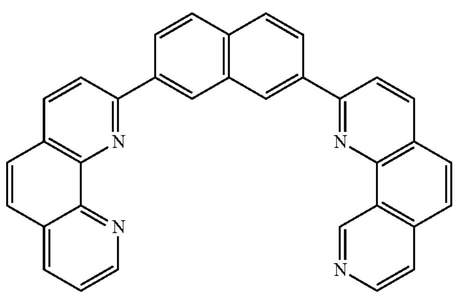

In some embodiments, the electron transport region ETR may include a metal halide (such as LiF, NaCl, CsF, RbCl, RbI, CuI and/or KI), a lanthanide metal (such as Yb), or a co-depositing material of the metal halide and the lanthanide metal. For example, the electron transport region ETR may include KI:Yb, RbI:Yb, etc., as the co-depositing material. In some embodiments, the electron transport region ETR may utilize a metal oxide (such as $Li_2O$ and/or BaO), or 8-hydroxy-lithium quinolate (LiQ). However, embodiments of the present disclosure are not limited thereto. The electron transport region ETR also may be formed utilizing a mixture material of an electron transport material and an insulating organo metal salt. The organo metal salt may be a material having an energy band gap of about 4 eV or more. For example, the organo metal salt may include, for example, one or more metal acetates, metal benzoates, metal acetoacetates, metal acetylacetonates, and/or metal stearates.

The electron transport region ETR may include at least one of 2,9-dimethyl-4,7-diphenyl-1,10-phenanthroline (BCP), or 4,7-diphenyl-1,10-phenanthroline (Bphen) in addition to the aforementioned materials. However, embodiments of the present disclosure are not limited thereto.

The electron transport region ETR may include the compounds of the electron transport region in at least one among an electron injection layer EIL, an electron transport layer ETL, and a hole blocking layer HBL.

When the electron transport region ETR includes the electron transport layer ETL, the thickness of the electron transport layer ETL may be about 100 Å to about 1,000 Å, for example, about 150 Å to about 500 Å. When the thickness of the electron transport layer ETL satisfies the above-described range, satisfactory electron transport properties may be obtained without substantial increase of a driving voltage. When the electron transport region ETR includes the electron injection layer EIL, the thickness of the electron injection layer EIL may be about 1 Å to about 100 Å, and about 3 Å to about 90 Å. When the thickness of the electron injection layer EIL satisfies the above described range, satisfactory electron injection properties may be obtained without inducing substantial increase of a driving voltage.

The second electrode EL2 is provided on the electron transport region ETR. The second electrode EL2 may be a common electrode. The second electrode EL2 may be a cathode or an anode, but embodiments of the present disclosure are not limited thereto. For example, when the first electrode EL1 is an anode, the second cathode EL2 may be a cathode, and when the first electrode EL1 is a cathode, the second electrode EL2 may be an anode.

The second electrode EL2 may be a transmissive electrode, a transflective electrode or a reflective electrode. When the second electrode EL2 is a transmissive electrode, the second electrode EL2 may include a transparent metal oxide, for example, ITO, IZO, ZnO, ITZO, etc.

When the second electrode EL2 is the transflective electrode or the reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, Yb, W, compounds of one or more thereof, or mixtures of one or more thereof (for example, AgMg, AgYb, or MgYb). In some embodiments, the second electrode EL2 may have a multilayered structure including a reflective layer or a transflective layer formed utilizing the above-described materials and a transparent conductive layer formed utilizing ITO, IZO, ZnO, ITZO, etc. For example, the second electrode EL2 may include the aforementioned metal materials, combinations of two or more metal materials selected from the aforementioned metal materials, or oxides of the aforementioned metal materials.

In some embodiments, the second electrode EL2 may be connected with an auxiliary electrode. When the second electrode EL2 is connected with the auxiliary electrode, the resistance of the second electrode EL2 may decrease.

In some embodiments, on the second electrode EL2 in the light emitting diode ED of an embodiment, a capping layer CPL may be further disposed. The capping layer CPL may include a multilayer or a single layer.

In an embodiment, the capping layer CPL may be an organic layer or an inorganic layer. For example, when the capping layer CPL includes an inorganic material, the inorganic material may include an alkali metal compound (such as LiF), an alkaline earth metal compound (such as $MgF_2$, SiON, $SiN_x$, $SiO_y$), etc.

For example, when the capping layer CPL includes an organic material, the organic material may include α-NPD, NPB, TPD, m-MTDATA, $Alq_3$, CuPc, N4,N4,N4',N4'-tetra (biphenyl-4-yl) biphenyl-4,4'-diamine (TPD15), 4,4',4"-tris (carbazol-9-yl) triphenylamine (TCTA), etc., or includes an epoxy resin, or acrylate (such as methacrylate). In some embodiments, a capping layer CPL may include at least one among Compounds P1 to P5, but embodiments of the present disclosure are not limited thereto.

P1

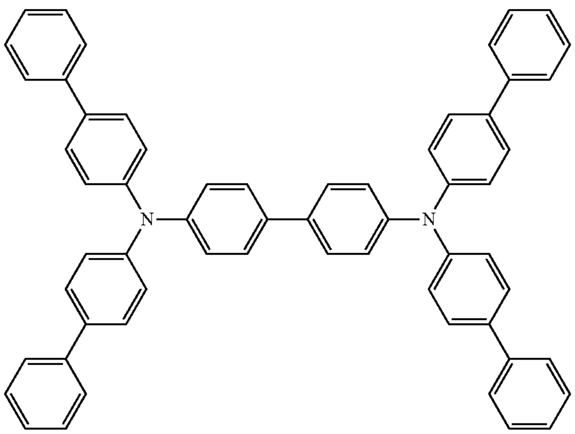

P2

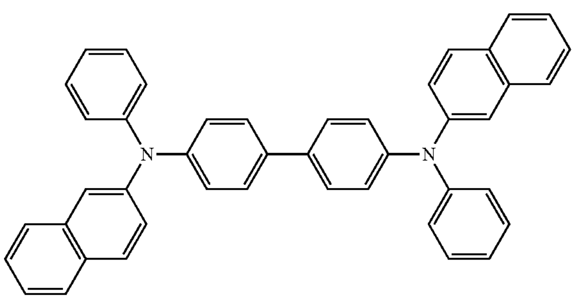

P3

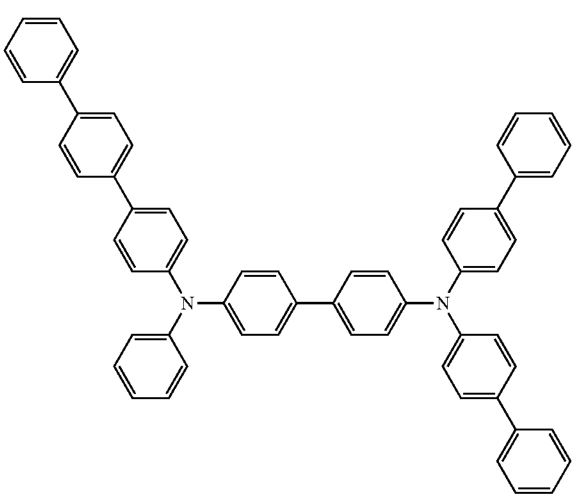

-continued

P4

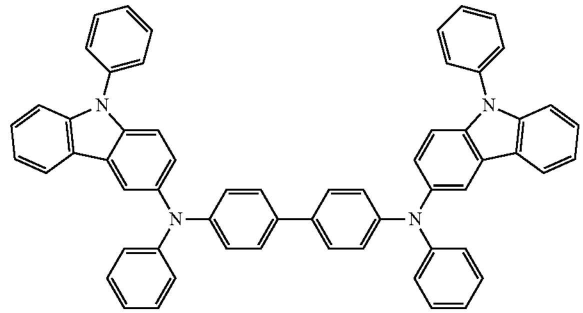

P5

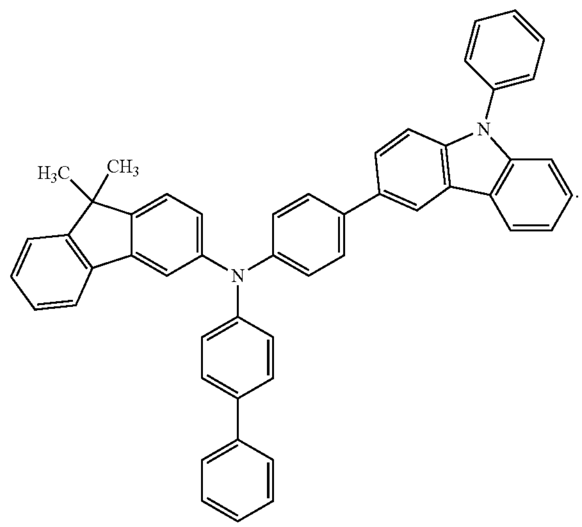

In some embodiments, the refractive index of the capping layer CPL may be about 1.6 or more. For example, the refractive index of the capping layer CPL with respect to light in a wavelength range of about 550 nm to about 660 nm may be about 1.6 or more.

Figure 7:
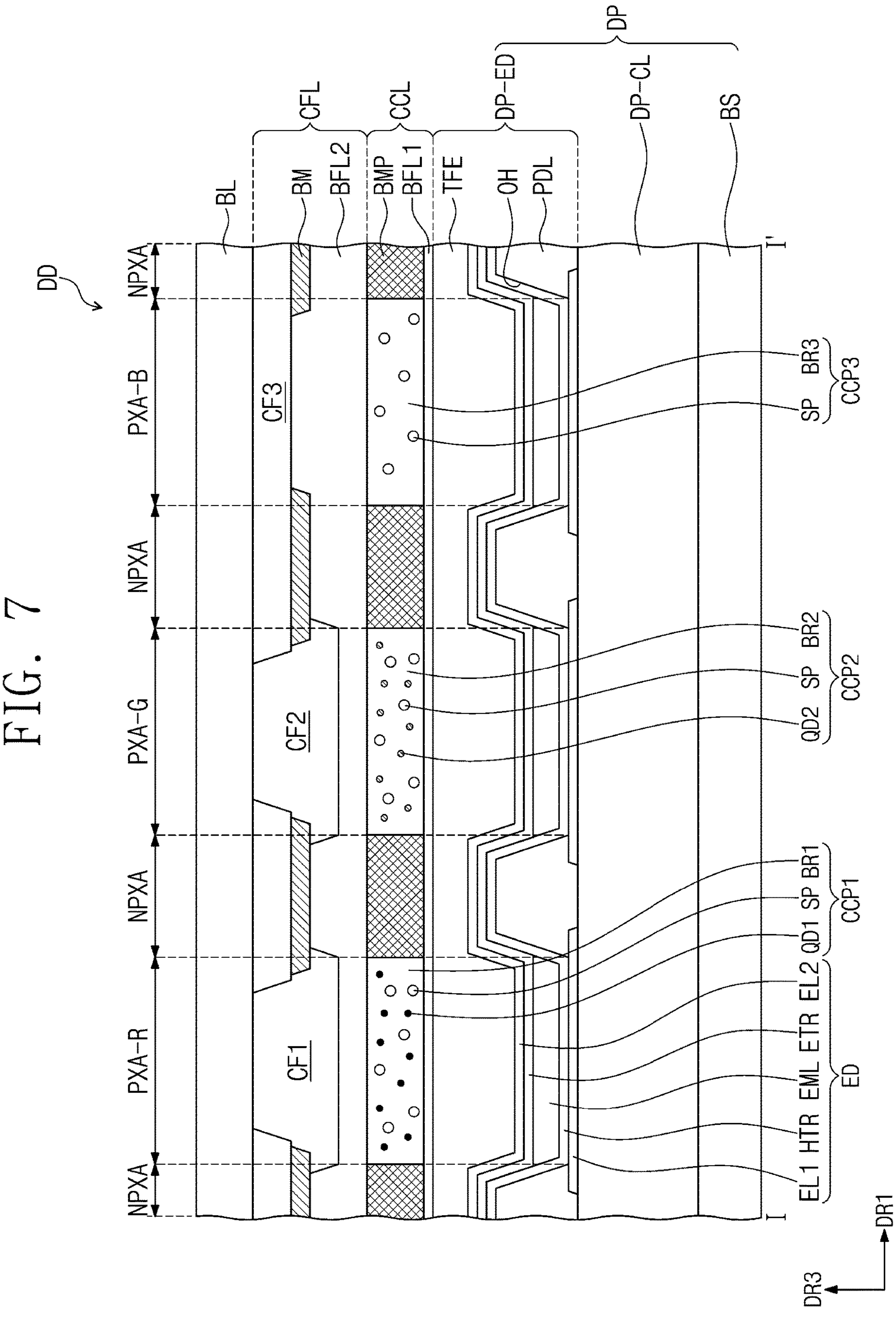
FIG. 7 is a cross-sectional view of a display apparatus according to an embodiment.
Figure 8:
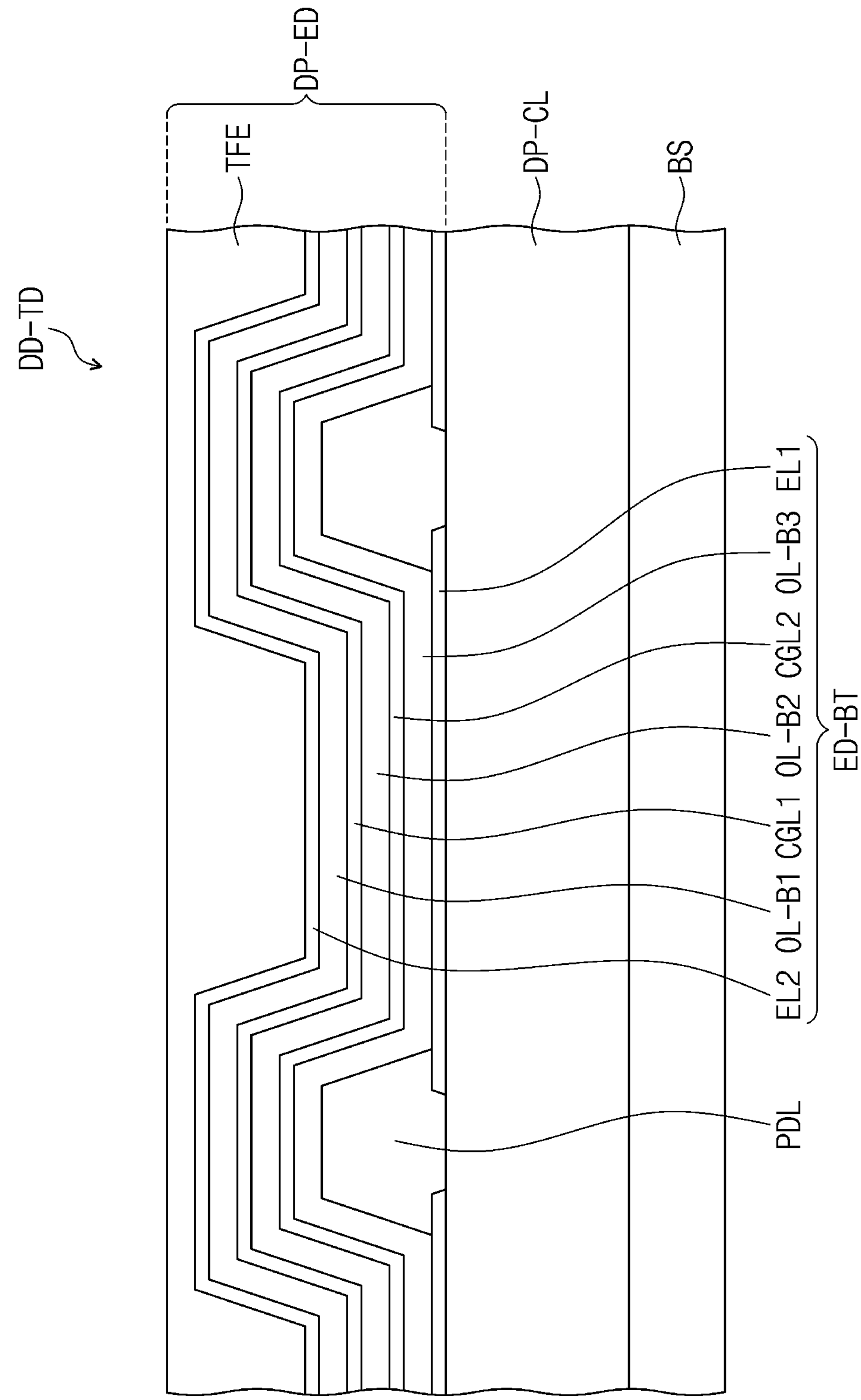
FIG. 8 is a cross-sectional view of a display apparatus according to an embodiment.

FIG. 7 and FIG. 8 are cross-sectional views on display apparatuses according to embodiments. Hereinafter, in the explanation on the display apparatuses of embodiments, referring to FIG. 7 and FIG. 8, overlapping parts with the explanations of FIG. 1 to FIG. 6 will not be explained again, and different features will be chiefly explained.

Referring to FIG. 7, the display apparatus DD according to an embodiment may include a display panel DP including a display element layer DP-ED, a light controlling layer CCL disposed on the display panel DP and a color filter layer CFL.

In the embodiment shown in FIG. 7, the display panel DP includes a base layer BS, a circuit layer DP-CL provided on the base layer BS and a display element layer DP-ED, and the display element layer DP-ED may include a light emitting diode ED.

The light emitting diode ED may include a first electrode EL1, a hole transport region HTR disposed on the first electrode EL1, an emission layer EML disposed on the hole transport region HTR, an electron transport region ETR disposed on the emission layer EML, and a second electrode EL2 disposed on the electron transport region ETR. In some embodiments, the same structures of the light emitting diodes of FIG. 4 to FIG. 6 may be applied to the structure of the light emitting diode ED shown in FIG. 7.

Referring to FIG. 7, the emission layer EML may be disposed in an opening part OH defined in a pixel definition layer PDL. For example, the emission layer EML divided by the pixel definition layer PDL and correspondingly provided to each of emitting areas PXA-R, PXA-G and PXA-B may be to emit light in the same wavelength region. In the display apparatus DD of an embodiment, the emission layer EML may be to emit blue light. In some embodiments, different from the drawings, in an embodiment, the emission layer EML may be provided as a common layer for all emitting areas PXA-R, PXA-G and PXA-B.

The light controlling layer CCL may be disposed on the display panel DP. The light controlling layer CCL may include a light converter. The light converter may be a quantum dot or a phosphor. The light converter may transform the wavelength of light provided and then emit the transformed light. For example, the light controlling layer CCL may be a layer including a quantum dot or a layer including a phosphor.

The light controlling layer CCL may include multiple light controlling parts CCP1, CCP2 and CCP3. The light controlling parts CCP1, CCP2 and CCP3 may be separated from one another.

Referring to FIG. 7, a partition pattern BMP may be disposed between the separated light controlling parts CCP1, CCP2 and CCP3, but embodiments of the present disclosure are not limited thereto. In FIG. 7, the partition pattern BMP is shown as not overlapping with the light controlling parts CCP1, CCP2 and CCP3, but at least a portion of the edge of the light controlling parts CCP1, CCP2 and CCP3 may be overlapped with the partition pattern BMP.

The light controlling layer CCL may include a first light controlling part CCP1 including a first quantum dot QD1 to convert first color light provided from the light emitting diode ED into second color light, a second light controlling part CCP2 including a second quantum dot QD2 to convert first color light into third color light, and a third light controlling part CCP3 to transmit first color light.

In an embodiment, the first light controlling part CCP1 may provide red light which is the second color light, and the second light controlling part CCP2 may provide green light which is the third color light. The third light controlling part CCP3 may transmit and provide blue light which is the first color light provided from the light emitting diode ED. For example, the first quantum dot QD1 may be a red quantum dot, and the second quantum dot QD2 may be a green quantum dot. The quantum dots QD1 and QD2 may be the same as described above may be applied.

In some embodiments, the light controlling layer CCL may further include a scatterer SP. The first light controlling part CCP1 may include the first quantum dot QD1 and the scatterer SP, the second light controlling part CCP2 may include the second quantum dot QD2 and the scatterer SP, and the third light controlling part CCP3 may not include a quantum dot but include the scatterer SP.

The scatterer SP may be an inorganic particle. For example, the scatterer SP may include at least one among $TiO_2$, ZnO, $Al_2O_3$, $SiO_2$, and hollow silica. The scatterer SP may include at least one among $TiO_2$, ZnO, $Al_2O_3$, $SiO_2$, and hollow silica, or may be a mixture of two or more materials selected among $TiO_2$, ZnO, $Al_2O_3$, $SiO_2$, and hollow silica.

Each of the first light controlling part CCP1, the second light controlling part CCP2, and the third light controlling part CCP3 may include base resins BR1, BR2 and BR3 dispersing the quantum dots QD1 and QD2 and the scatterer SP. In an embodiment, the first light controlling part CCP1 may include the first quantum dot QD1 and the scatterer SP dispersed in the first base resin BR1, the second light controlling part CCP2 may include the second quantum dot QD2 and the scatterer SP dispersed in the second base resin BR2, and the third light controlling part CCP3 may include the scatterer particle SP dispersed in the third base resin BR3. The base resins BR1, BR2 and BR3 are mediums in which the quantum dots QD1 and QD2 and the scatterer SP are dispersed, and may be composed of one or more suitable resin compositions (which may be generally referred to as a binder). For example, the base resins BR1, BR2 and BR3 may be acrylic resins, urethane-based resins, silicone-based resins, epoxy-based resins, etc. The base resins BR1, BR2 and BR3 may be transparent resins. In an embodiment, the first base resin BR1, the second base resin BR2 and the third base resin BR3 may be the same or different from each other.

The light controlling layer CCL may include a barrier layer BFL1. The barrier layer BFL1 may play the role of blocking the penetration of moisture and/or oxygen (hereinafter referred to as "humidity/oxygen"). The barrier layer BFL1 may be disposed on the light controlling parts CCP1, CCP2 and CCP3 to block or reduce exposure of the light controlling parts CCP1, CCP2 and CCP3 to humidity/oxygen. In some embodiments, the barrier layer BFL1 may cover the light controlling parts CCP1, CCP2 and CCP3. In some embodiments, the barrier layer BFL2 may be provided between the light controlling parts CCP1, CCP2 and CCP3 and a color filter layer CFL.

The barrier layers BFL1 and BFL2 may include at least one inorganic layer. For example, the barrier layers BFL1 and BFL2 may be formed by including an inorganic material. For example, the barrier layers BFL1 and BFL2 may be formed by including silicon nitride, aluminum nitride, zirconium nitride, titanium nitride, hafnium nitride, tantalum nitride, silicon oxide, aluminum oxide, titanium oxide, tin oxide, cerium oxide and/or silicon oxynitride and/or a metal thin film securing light transmittance. In some embodiments, the barrier layers BFL1 and BFL2 may further include an organic layer. The barrier layers BFL1 and BFL2 may each independently be composed of a single layer or multiple layers.

In the display apparatus DD of an embodiment, the color filter layer CFL may be disposed on the light controlling layer CCL. For example, the color filter layer CFL may be disposed directly on the light controlling layer CCL. In this case, the barrier layer BFL2 may not be provided.

The color filter layer CFL may include a light blocking part BM and filters CF-B, CF-G and CF-R. The color filter layer CFL may include a first filter CF1 transmitting second color light, a second filter CF2 transmitting third color light, and a third filter CF3 transmitting first color light. For example, the first filter CF1 may be a red filter, the second filter CF2 may be a green filter, and the third filter CF3 may be a blue filter. Each of the filters CF1, CF2 and CF3 may include a polymer photosensitive resin and/or a pigment or dye. The first filter CF1 may include a red pigment or dye, the second filter CF2 may include a green pigment or dye, and the third filter CF3 may include a blue pigment or dye. In some embodiments, embodiments of the present disclosure are not limited thereto, and the third filter CF3 may not include the pigment or dye. The third filter CF3 may include a polymer photosensitive resin and not include a pigment or dye. The third filter CF3 may be transparent. The third filter CF3 may be formed utilizing a transparent photosensitive resin.

In some embodiments, in an embodiment, the first filter CF1 and the second filter CF2 may each be yellow filters. In some embodiments, the first filter CF1 and the second filter CF2 may be provided in one body without distinction.

The light blocking part BM may be a black matrix. The light blocking part BM may be formed by including an organic light blocking material or an inorganic light blocking material including a black pigment or black dye. The light blocking part BM may prevent or reduce light leakage phenomenon and may provide boundaries among adjacent filters CF1, CF2 and CF3. In an embodiment, the light blocking part BM may be formed as a blue filter.

Each of the first to third filters CF1, CF2 and CF3 may be respectively disposed to correspond to a red emitting area PXA-R, green emitting area PXA-G, and blue emitting area PXA-B.

On the color filter layer CFL, a base substrate BL may be disposed. The base substrate BL may be a member providing a base surface on which the color filter layer CFL, the light controlling layer CCL, etc. are disposed. The base substrate BL may be a glass substrate, a metal substrate, a plastic substrate, etc. However, embodiments of the present disclosure are not limited thereto, and the base substrate BL may be an inorganic layer, an organic layer or a composite material layer. In some embodiments, the base substrate BL may not be provided.

FIG. 8 is a cross-sectional view showing a portion of the display apparatus according to an embodiment. In FIG. 8, the cross-sectional view of a portion corresponding to the display panel DP in FIG. 7 is shown. In a display apparatus DD-TD of an embodiment, the light emitting diode ED-BT may include multiple light emitting structures OL-B1, OL-B2 and OL-B3. The light emitting diode ED-BT may include oppositely disposed first electrode EL1 and second electrode EL2, and the multiple light emitting structures OL-B1, OL-B2 and OL-B3 may be stacked in order in a thickness direction and provided between the first electrode EL1 and the second electrode EL2. Each of the light emitting structures OL-B1, OL-B2 and OL-B3 may include an emission layer EML (FIG. 7), and a hole transport region HTR and an electron transport region ETR disposed with the emission layer EML (FIG. 7) therebetween.

For example, the light emitting diode ED-BT included in the display apparatus DD-TD of an embodiment may be a light emitting diode of a tandem structure including multiple emission layers.

In an embodiment shown in FIG. 8, light to be emitted from the light emitting structures OL-B1, OL-B2 and OL-B3 may be all blue light. However, embodiments of the present disclosure are not limited thereto, and the wavelength regions of light to be emitted from the light emitting structures OL-B1, OL-B2 and OL-B3 may be different from each other. For example, the light emitting diode ED-BT including the multiple light emitting structures OL-B1, OL-B2 and OL-B3 (each to emit light in different wavelength regions) may be to emit white light.

Between neighboring light emitting structures OL-B1, OL-B2 and OL-B3, a charge generating layer including layers CGL1 and CGL2 may be disposed. The charge generating layer may include a p-type charge generating layer and/or an n-type charge generating layer.

At least one of light emitting structures OL-B1, OL-B2 and OL-B3 included in the display apparatus DD-TD of an embodiment may include the above-described amine compound of an embodiment.

The light emitting diode ED according to an embodiment of the present disclosure may include the amine compound of an embodiment in at least one functional layer disposed between the first electrode EL1 and the second electrode EL2 and may show improved emission efficiency and improved life characteristics. The light emitting diode ED according to an embodiment may include the amine compound of an embodiment in at least one of a hole transport region HTR, an emission layer EML or an electron transport region ETR disposed between the first electrode EL1 and the second electrode EL2, and/or in a capping layer CPL.

For example, the amine compound according to an embodiment may be included in the hole transport region HTR of the light emitting diode ED of an embodiment, and the light emitting diode of an embodiment may show excellent or suitable emission efficiency and/or long-life characteristics.

The amine compound of an embodiment has a structure including a carbazole derivative combined at (e.g., linked via) a specific position, a triarylsilyl group, and an additional polycyclic aromatic hydrocarbon ring or polycyclic heterocycle combined with the nitrogen atom of an amine group, and due to a large three-dimensional molecular structure (e.g., volume), the deposition temperature utilized during formation of the functional layer may be reduced, and the stability of the compound and the functional layer formed thereof may be improved. In addition, the amine compound of an embodiment includes both (e.g., simultaneously) a carbazole derivative having good or suitable hole transport properties and a triarylsilyl group having high electron tolerance, and the inflow (e.g., diffusion) of excitons produced in an emission layer into a hole transport region and the inflow (e.g., diffusion) of electrons from an emission layer may be prevented or reduced to contribute to improvement of emission efficiency and/or diode-life characteristics. In some embodiments, the amine compound of an embodiment further includes an additional aromatic hydrocarbon ring or heterocycle, such that a conjugation system in a compound molecule may be increased, hole transport properties may be improved, and the unstable state of radicals or radical cations may be stabilized.

Accordingly, the amine compound of an embodiment may enable improvement of the stability and/or hole transport capacity of a material to contribute to the long-life characteristics and/or high-efficiency properties of a light emitting diode.

Hereinafter, the amine compound according to an embodiment and the light emitting diode of an embodiment of the present disclosure will be explained with reference to embodiments and comparative embodiments. The embodiments are only illustrations to assist the understanding of the present disclosure, and the scope of the present disclosure is not limited thereto.

Examples

1. Synthesis of Amine Compound

First, synthetic methods of an amine compound according to an embodiment will be explained by illustrating the synthetic methods of Compound A12, Compound A23, Compound A49, Compound A58, Compound A76, Compound A112, Compound A141, Compound A155, Compound A161, and Compound A184 in Compound Group 1A, and Compound B4, Compound B23, Compound B72, Compound B92, Compound B142, Compound B180, and Compound B186 in Compound Group 1B. The synthetic methods of the amine compounds explained hereinafter are embodiments, and synthetic methods of the amine compound according to embodiments of the present disclosure are not limited to the following method.

The molecular weights of the compounds synthesized by the methods were confirmed through FAB-MS measurement utilizing a JMS-700V (JEOL Co.), and the compounds were identified utilizing $^{1}$H-NMR utilizing an AVAVCE300M (Bruker Biospin K.K. Co).

Synthesis of Compound A12

Amine Compound A12 according to an embodiment may be synthesized, for example, by the steps of Reaction 1.

Reaction 1

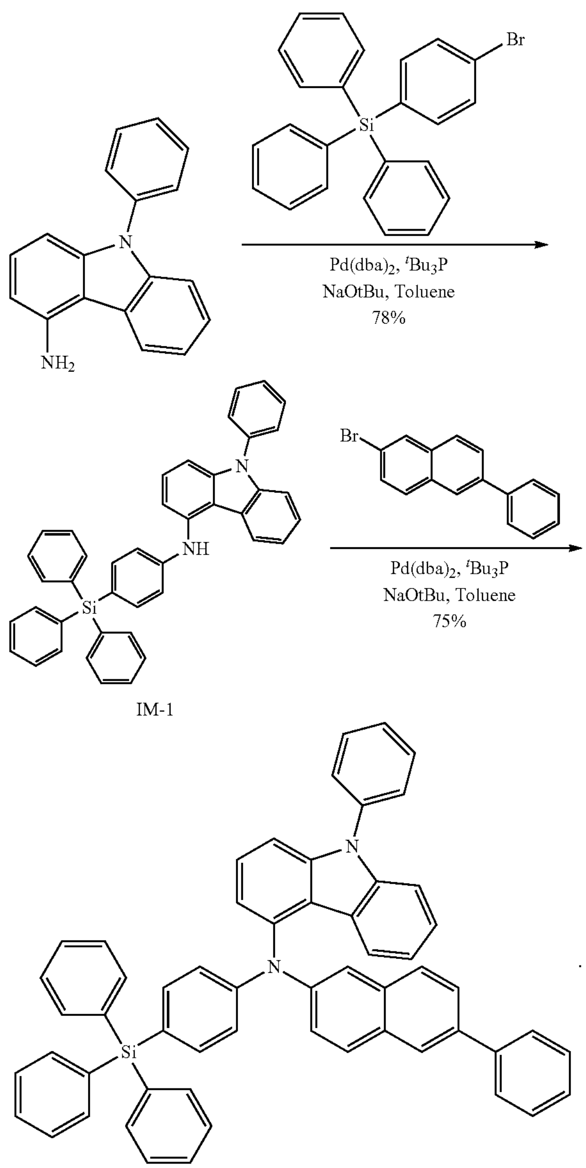

A12

Synthesis of Intermediate IM-1

Under an argon (Ar) atmosphere, to a 500 mL, three-neck flask, 10.00 g (38.7 mmol) of 9-phenyl-9H-carbazol-4-amine, 0.67 g (0.03 equiv, 1.2 mmol) of Pd(dba)$_2$, 3.72 g (1.0 equiv, 38.7 mmol) of NaOtBu, 194 mL of toluene, 17.69 g (1.1 equiv, 42.6 mmol) of (4-bromophenyl)triphenylsilane and 0.78 g (0.1 equiv, 3.9 mmol) of $^t$Bu$_3$P were added in order, and stirred while heating and refluxing. After cooling to room temperature, water was added to the reaction solution, and an organic layer was separately taken. Then, toluene was added to an aqueous layer, and an organic layer was further extracted. The organic layers were collected, washed with a saline solution and dried with $MgSO_4$. $MgSO_4$ was filtered, an organic layer was concentrated, and the crude product thus obtained was separated by silica gel column chromatography (utilizing a mixture solvent of hexane and toluene as a developing layer) to obtain Intermediate IM-1 (17.90 g, yield 78%).

FAB-MS was measured, mass number m/z=592 was observed as a molecular ion peak, and Intermediate IM-1 was identified.

Synthesis of Compound A12

Under an argon atmosphere, to a 300 mL, three-neck flask, 10.00 g (16.9 mmol) of Intermediate IM-1, 0.29 g (0.03 equiv, 0.5 mmol) of Pd(dba)$_2$, 3.24 g (2.0 equiv, 33.8 mmol) of NaO$^t$Bu, 84 mL of toluene, 5.25 g (1.1 equiv, 18.6 mmol) of 2-bromo-6-phenylnaphthalene and 0.34 g (0.1 equiv, 1.7 mmol) of $^t$Bu$_3$P were added in order, and stirred while heating and refluxing. After cooling to room temperature, water was added to the reaction solution, and an organic layer was isolated. Then, toluene was added to an aqueous layer, and an organic layer was further extracted. The organic layers were collected, washed with a saline solution and dried with $MgSO_4$. $MgSO_4$ was filtered, an organic layer was concentrated, and the crude product thus obtained was separated by silica gel column chromatography (utilizing a mixture solvent of hexane and toluene as a developing layer) to obtain Compound A12 of a solid (10.06 g, yield 75%).

FAB-MS was measured, mass number m/z=795 was observed as a molecular ion peak, and Compound A12 was identified.

Synthesis of Compound A49

Amine Compound A49 according to an embodiment may be synthesized, for example, by the steps of Reaction 2.

Reaction 2

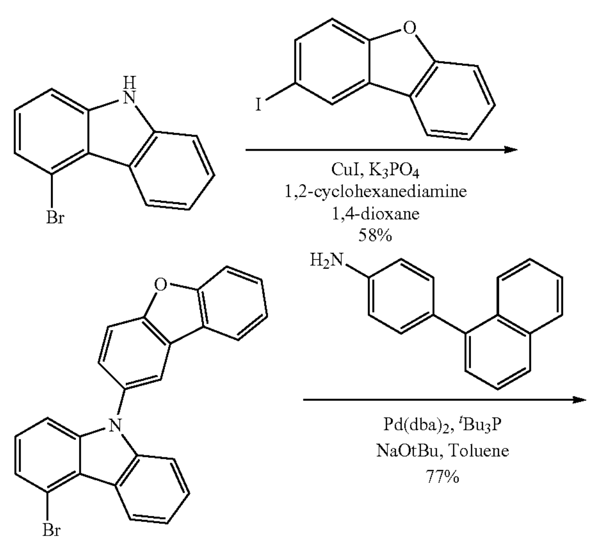

IM-2

-continued

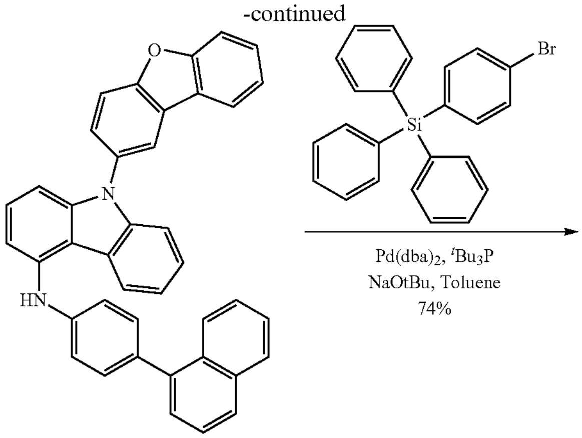

IM-3

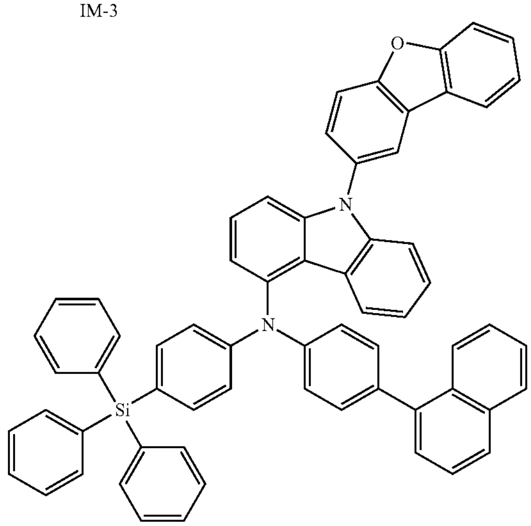

A49

Synthesis of Intermediate IM-2

Under an argon atmosphere, to a 1,000 mL, three-neck flask, 15.00 g (60.9 mmol) of 4-bromo-9H-carbazole, 1.16 g (0.1 equiv, 6.1 mmol) of CuI, 38.81 g (3.0 equiv, 182.8 mmol) of $K_3PO_4$, 89.62 g (5.0 equiv, 304.7 mmol) of 2-iododibenzofuran, 304 mL of 1,4-dioxane, and 1.39 g (0.2 equiv, 12.2 mmol) of 1,2-cyclohexanediamine were added in order, and stirred while heating and refluxing. After cooling to room temperature, water was added to the reaction solution, aspiration filtration was performed utilizing Celite, and an organic layer was isolated. Then, toluene was added to an aqueous layer, and an organic layer was further extracted. The organic layers were collected, washed with a saline solution and dried with $MgSO_4$. $MgSO_4$ was filtered, an organic layer was concentrated, and the crude product thus obtained was separated by silica gel column chromatography (utilizing a mixture solvent of hexane and toluene as a developing layer) to obtain Intermediate IM-2 (14.57 g, yield 58%).

FAB-MS was measured, mass number m/z=412 was observed as a molecular ion peak, and Intermediate IM-2 was identified.

Synthesis of Intermediate IM-3

Under an argon atmosphere, to a 500 mL, three-neck flask, 10.00 g (24.3 mmol) of Intermediate IM-2, 0.42 g (0.03 equiv, 0.7 mmol) of Pd(dba)$_2$, 2.33 g (1.0 equiv, 24.3 mmol) of NaO$^t$Bu, 121 mL of toluene, 5.85 g (1.1 equiv, 26.7 mmol) of 4-(naphthalen-1-yl)aniline and 0.49 g (0.1 equiv, 2.4 mmol) of $^t$Bu$_3$P were added in order, and stirred while heating and refluxing. After cooling to room temperature, water was added to the reaction solution, and an organic layer was isolated. Then, toluene was added to an aqueous layer, and an organic layer was further extracted. The organic layers were collected, washed with a saline solution and dried with $MgSO_4$. $MgSO_4$ was filtered, an organic layer was concentrated, and the crude product thus obtained was separated by silica gel column chromatography (utilizing a mixture solvent of hexane and toluene as a developing layer) to obtain Intermediate IM-3 (10.28 g, yield 77%).

FAB-MS was measured, mass number m/z=550 was observed as a molecular ion peak, and Intermediate IM-3 was identified.

Synthesis of Compound A49

Under an argon atmosphere, to a 300 mL, three-neck flask, 10.00 g (18.2 mmol) of Intermediate IM-3, 0.31 g (0.03 equiv, 0.5 mmol) of Pd(dba)$_2$, 3.49 g (2.0 equiv, 36.3 mmol) of NaO$^t$Bu, 91 mL of toluene, 8.30 g (1.1 equiv, 20.0 mmol) of (4-bromophenyl)triphenylsilane and 0.37 g (0.1 equiv, 1.8 mmol) of $^t$Bu$_3$P were added in order, and stirred while heating and refluxing. After cooling to room temperature, water was added to the reaction solution, and an organic layer was isolated. Then, toluene was added to an aqueous layer, and an organic layer was further extracted. The organic layers were collected, washed with a saline solution and dried with $MgSO_4$. $MgSO_4$ was filtered, an organic layer was concentrated, and the crude product thus obtained was separated by silica gel column chromatography (utilizing a mixture solvent of hexane and toluene as a developing layer) to obtain Compound A49 of a solid (11.90 g, yield 74%).

FAB-MS was measured, mass number m/z=885 was observed as a molecular ion peak, and Compound A49 was identified.

Synthesis of Compound A58

Amine Compound A58 according to an embodiment may be synthesized, for example, by the steps of Reaction 3.

Reaction 3

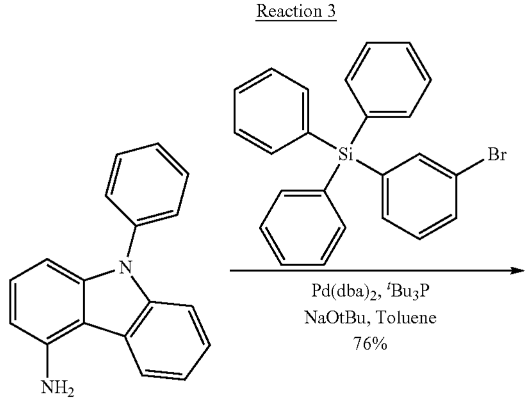

-continued

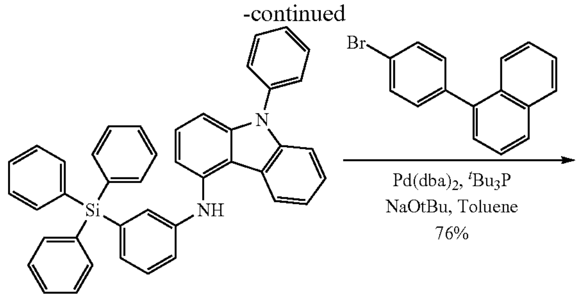

IM-4

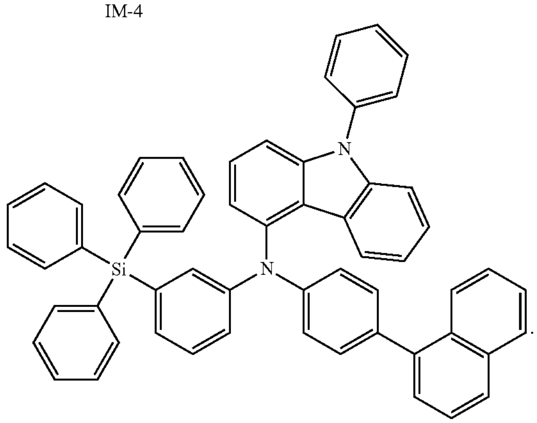

A58

Synthesis of Intermediate IM-4

Under an argon atmosphere, to a 500 mL, three-neck flask, 10.00 g (38.7 mmol) of 9-phenyl-9H-carbazol-4-amine, 0.67 g (0.03 equiv, 1.2 mmol) of $Pd(dba)_2$, 3.72 g (1.0 equiv, 38.7 mmol) of $NaO^tBu$, 194 mL of toluene, 17.69 g (1.1 equiv, 42.6 mmol) of (3-bromophenyl)triphenylsilane and 0.78 g (0.1 equiv, 3.9 mmol) of $^tBu_3P$ were added in order, and stirred while heating and refluxing. After cooling to room temperature, water was added to the reaction solution, and an organic layer was isolated. Then, toluene was added to an aqueous layer, and an organic layer was further extracted. The organic layers were collected, washed with a saline solution and dried with $MgSO_4$. $MgSO_4$ was filtered, an organic layer was concentrated, and the crude product thus obtained was separated by silica gel column chromatography (utilizing a mixture solvent of hexane and toluene as a developing layer) to obtain Intermediate IM-4 (17.44 g, yield 76%).

FAB-MS was measured, mass number m/z=592 was observed as a molecular ion peak, and Intermediate IM-4 was identified.

Synthesis of Compound A58

Under an argon atmosphere, to a 300 mL, three-neck flask, 10.00 g (16.9 mmol) of Intermediate IM-4, 0.29 g (0.03 equiv, 0.5 mmol) of $Pd(dba)_2$, 3.24 g (2.0 equiv, 33.8 mmol) of $NaO^tBu$, 84 mL of toluene, 5.25 g (1.1 equiv, 18.6 mmol) of 1-(4-bromophenyl)naphthalene and 0.34 g (0.1 equiv, 1.7 mmol) of $^tBu_3P$ were added in order, and stirred while heating and refluxing. After cooling to room temperature, water was added to the reaction solution, and an organic layer was isolated. Then, toluene was added to an aqueous layer, and an organic layer was further extracted. The organic layers were collected, washed with a saline solution and dried with $MgSO_4$. $MgSO_4$ was filtered, an organic layer was concentrated, and the crude product thus obtained was separated by silica gel column chromatography (utilizing a mixture solvent of hexane and toluene as a developing layer) to obtain Compound A58 of a solid (10.19 g, yield 76%).

FAB-MS was measured, mass number m/z=795 was observed as a molecular ion peak, and Compound A58 was identified.

Synthesis of Compound A76

Amine Compound A76 according to an embodiment may be synthesized, for example, by the steps of Reaction 4.

Reaction 4

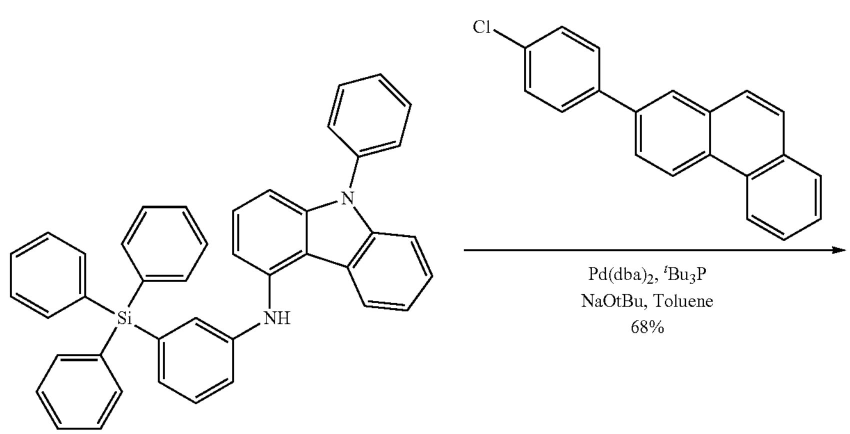

IM-4

-continued

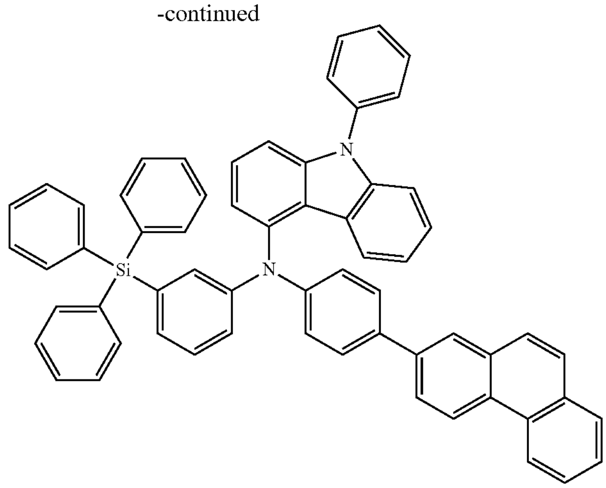

A76

Under an argon atmosphere, to a 300 mL, three-neck flask, 10.00 g (16.9 mmol) of Intermediate IM-4, 0.29 g (0.03 equiv, 0.5 mmol) of Pd(dba)$_2$, 3.24 g (2.0 equiv, 33.8 mmol) of NaO$^t$Bu, 84 mL of toluene, 5.36 g (1.1 equiv, 18.6 mmol) of 2-(4-chlorophenyl)phenanthrene and 0.34 g (0.1 equiv, 1.7 mmol) of $^t$Bu$_3$P were added in order, and stirred while heating and refluxing. After cooling to room temperature, water was added to the reaction solution, and an organic layer was isolated. Then, toluene was added to an aqueous layer, and an organic layer was further extracted. The organic layers were collected, washed with a saline solution and dried with MgSO$_4$. MgSO$_4$ was filtered, an organic layer was concentrated, and the crude product thus obtained was separated by silica gel column chromatography (utilizing a mixture solvent of hexane and toluene as a developing layer) to obtain Compound A76 of a solid (9.69 g, yield 68%).

FAB-MS was measured, mass number m/z=845 was observed as a molecular ion peak, and Compound A76 was identified.

Synthesis of Compound A141

Amine Compound A141 according to an embodiment may be synthesized, for example, by the steps of Reaction 5.

Reaction 5

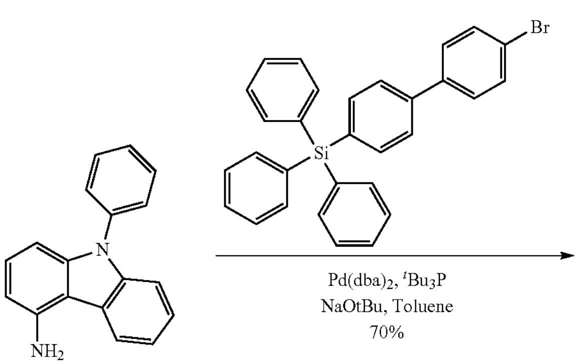

-continued

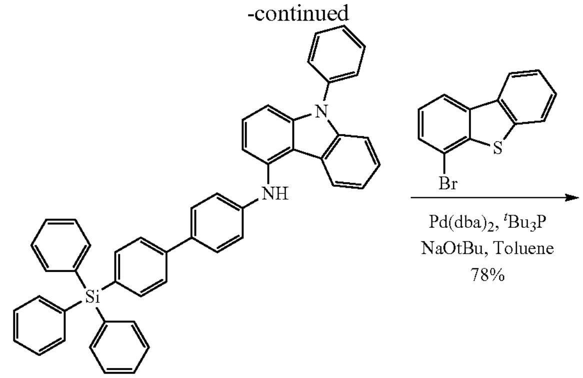

IM-5

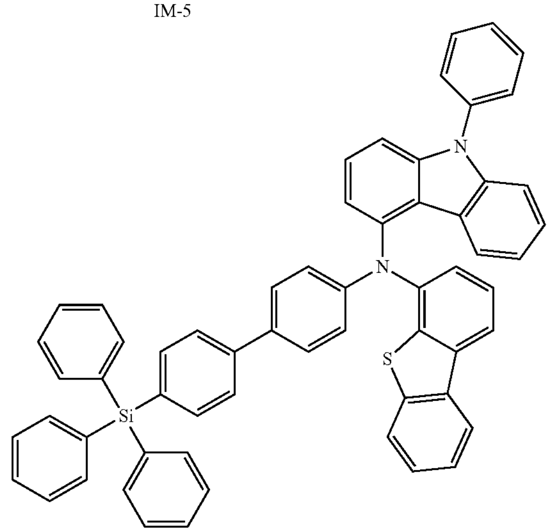

A141

Synthesis of Intermediate IM-5

Under an argon atmosphere, to a 500 mL, three-neck flask, 10.00 g (38.7 mmol) of 9-phenyl-9H-carbazol-4-amine, 0.67 g (0.03 equiv, 1.2 mmol) of Pd(dba)$_2$, 3.72 g (1.0 equiv, 38.7 mmol) of NaO$^t$Bu, 194 mL of toluene, 20.93 g (1.1 equiv, 42.6 mmol) of [4'-bromo-(1,1'-biphenyl)-4-yl] triphenylsilane and 0.78 g (0.1 equiv, 3.9 mmol) of $^t$Bu$_3$P were added in order, and stirred while heating and refluxing. After cooling to room temperature, water was added to the reaction solution, and an organic layer was isolated. Then, toluene was added to an aqueous layer, and an organic layer was further extracted. The organic layers were collected, washed with a saline solution and dried with $MgSO_4$. $MgSO_4$ was filtered, an organic layer was concentrated, and the crude product thus obtained was separated by silica gel column chromatography (utilizing a mixture solvent of hexane and toluene as a developing layer) to obtain Intermediate IM-5 (18.13 g, yield 70%).

FAB-MS was measured, mass number m/z=668 was observed as a molecular ion peak, and Intermediate IM-5 was identified.

Synthesis of Compound A141

Under an argon atmosphere, to a 300 mL, three-neck flask, 10.00 g (14.9 mmol) of Intermediate IM-5, 0.26 g (0.03 equiv, 0.4 mmol) of $Pd(dba)_2$, 2.87 g (2.0 equiv, 29.9 mmol) of $NaO^tBu$, 84 mL of toluene, 4.33 g (1.1 equiv, 16.4 mmol) of 4-bromodibenzothiophene and 0.30 g (0.1 equiv, 1.5 mmol) of $^tBu_3P$ were added in order, and stirred while heating and refluxing. After cooling to room temperature, water was added to the reaction solution, and an organic layer was isolated. Then, toluene was added to an aqueous layer, and an organic layer was further extracted. The organic layers were collected, washed with a saline solution and dried with $MgSO_4$. $MgSO_4$ was filtered, an organic layer was concentrated, and the crude product thus obtained was separated by silica gel column chromatography (utilizing a mixture solvent of hexane and toluene as a developing layer) to obtain Compound A141 of a solid (9.92 g, yield 78%).

FAB-MS was measured, mass number m/z=851 was observed as a molecular ion peak, and Compound A141 was identified.

Synthesis of Compound A155

Amine Compound A155 according to an embodiment may be synthesized, for example, by the steps of Reaction 6.

Reaction 6

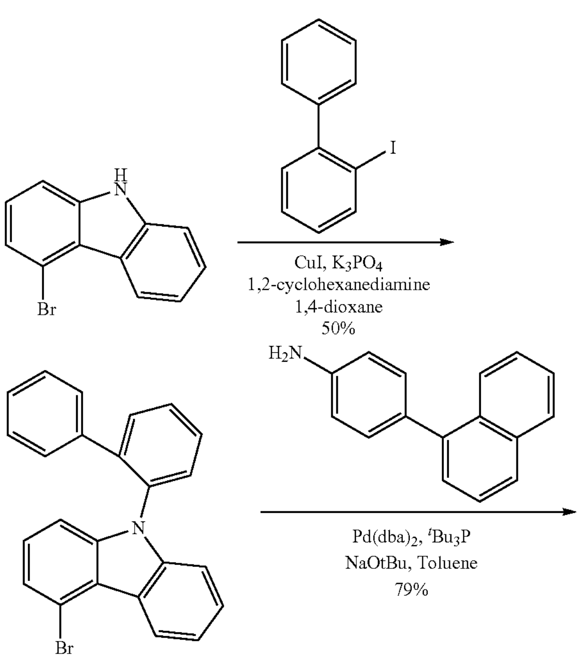

IM-6

-continued

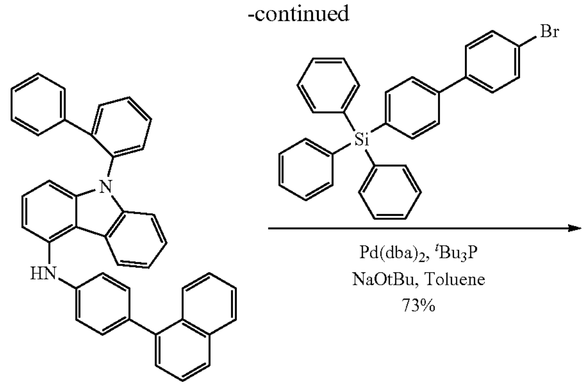

IM-7

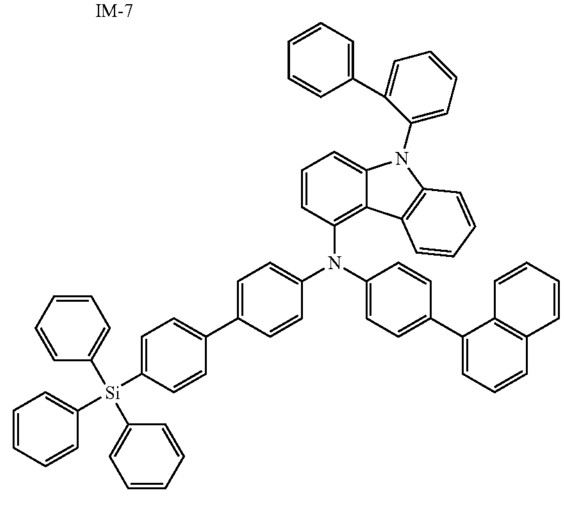

A155

Synthesis of Intermediate IM-6

Under an argon atmosphere, to a 1,000 mL, three-neck flask, 15.00 g (60.9 mmol) of 4-bromo-9H-carbazole, 1.16 g (0.1 equiv, 6.1 mmol) of CuI, 38.81 g (3.0 equiv, 182.8 mmol) of $K_3PO_4$, 85.36 g (5.0 equiv, 304.7 mmol) of 2-iodobiphenyl, 304 mL of 1,4-dioxane, and 1.39 g (0.2 equiv, 12.2 mmol) of 1,2-cyclohexanediamine were added in order, and stirred while heating and refluxing. After cooling to room temperature, water was added to the reaction solution, aspiration filtration was performed utilizing Celite, and an organic layer was isolated. Then, toluene was added to an aqueous layer, and an organic layer was further extracted. The organic layers were collected, washed with a saline solution and dried with $MgSO_4$. $MgSO_4$ was filtered, an organic layer was concentrated, and the crude product thus obtained was separated by silica gel column chromatography (utilizing a mixture solvent of hexane and toluene as a developing layer) to obtain Intermediate IM-6 (12.14 g, yield 50%).

FAB-MS was measured, mass number m/z=398 was observed as a molecular ion peak, and Intermediate IM-6 was identified.

Synthesis of Intermediate IM-7

Under an argon atmosphere, to a 500 mL, three-neck flask, 10.00 g (25.1 mmol) of Intermediate IM-6, 0.43 g (0.03 equiv, 0.8 mmol) of $Pd(dba)_2$, 2.41 g (1.0 equiv, 25.1 mmol) of $NaO^tBu$, 125 mL of toluene, 6.06 g (1.1 equiv, 27.6 mmol) of 4-(naphthalene-1-yl)aniline and 0.51 g (0.1 equiv, 2.5 mmol) of $^tBu_3P$ were added in order, and stirred while heating and refluxing. After cooling to room temperature, water was added to the reaction solution, and an organic layer was isolated. Then, toluene was added to an aqueous layer, and an organic layer was further extracted. The organic layers were collected, washed with a saline solution and dried with $MgSO_4$. $MgSO_4$ was filtered, an organic layer was concentrated, and the crude product thus obtained was separated by silica gel column chromatography (utilizing a mixture solvent of hexane and toluene as a developing layer) to obtain Intermediate IM-7 (10.64 g, yield 79%).

FAB-MS was measured, mass number m/z=536 was observed as a molecular ion peak, and Intermediate IM-7 was identified.

Synthesis of Compound A155

Under an argon atmosphere, to a 300 mL, three-neck flask, 10.00 g (18.6 mmol) of Intermediate IM-7, 0.32 g (0.03 equiv, 0.6 mmol) of $Pd(dba)_2$, 3.58 g (2.0 equiv, 37.3 mmol) of $NaO^tBu$, 93 mL of toluene, 10.07 g (1.1 equiv, 20.5 mmol) of [4'-bromo-(1,1'-biphenyl)-4-yl]triphenylsilane and 0.38 g (0.1 equiv, 1.9 mmol) of $^tBu_3P$ were added in order, and stirred while heating and refluxing. After cooling to room temperature, water was added to the reaction solution, and an organic layer was isolated. Then, toluene was added to an aqueous layer, and an organic layer was further extracted. The organic layers were collected, washed with a saline solution and dried with $MgSO_4$. $MgSO_4$ was filtered, an organic layer was concentrated, and the crude product thus obtained was separated by silica gel column chromatography (utilizing a mixture solvent of hexane and toluene as a developing layer) to obtain Compound A151 of a solid (12.88 g, yield 73%).

FAB-MS was measured, mass number m/z=947 was observed as a molecular ion peak, and Compound A151 was identified.

Synthesis of Compound A161

Amine Compound A161 according to an embodiment may be synthesized, for example, by the steps of Reaction 7.

Reaction 7

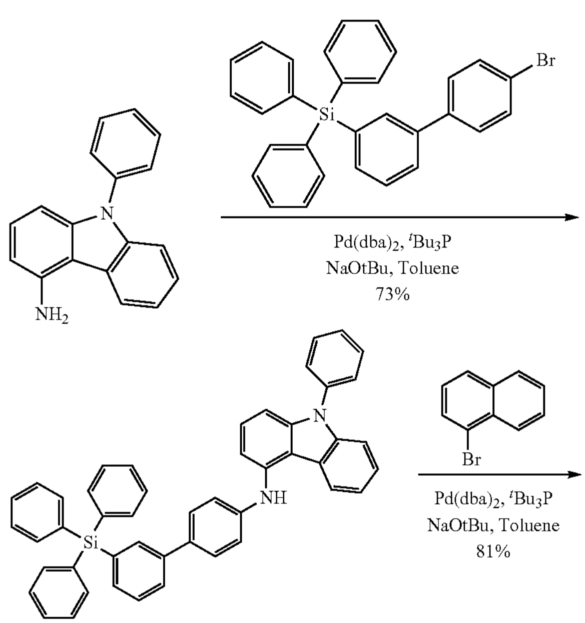

IM-8

-continued

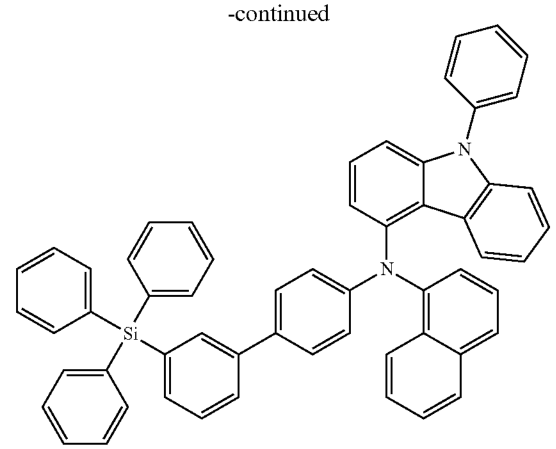

A161

Synthesis of Intermediate IM-8

Under an argon atmosphere, to a 500 mL, three-neck flask, 10.00 g (38.7 mmol) of 9-phenyl-9H-carbazol-4-amine, 0.67 g (0.03 equiv, 1.2 mmol) of $Pd(dba)_2$, 3.72 g (1.0 equiv, 38.7 mmol) of $NaO^tBu$, 194 mL of toluene, 20.93 g (1.1 equiv, 42.6 mmol) of [4'-bromo-(1,1'-biphenyl)-3-yl]triphenylsilane and 0.78 g (0.1 equiv, 3.9 mmol) of $^tBu_3P$ were added in order, and stirred while heating and refluxing. After cooling to room temperature, water was added to the reaction solution, and an organic layer was isolated. Then, toluene was added to an aqueous layer, and an organic layer was further extracted. The organic layers were collected, washed with a saline solution and dried with $MgSO_4$. $MgSO_4$ was filtered, an organic layer was concentrated, and the crude product thus obtained was separated by silica gel column chromatography (utilizing a mixture solvent of hexane and toluene as a developing layer) to obtain Intermediate IM-8 (18.90 g, yield 73%).

FAB-MS was measured, mass number m/z=668 was observed as a molecular ion peak, and Intermediate IM-8 was identified.

Synthesis of Compound A161

Under an argon atmosphere, to a 300 mL, three-neck flask, 10.00 g (14.9 mmol) of Intermediate IM-8, 0.26 g (0.03 equiv, 0.4 mmol) of $Pd(dba)_2$, 2.87 g (2.0 equiv, 29.9 mmol) of $NaO^tBu$, 84 mL of toluene, 3.41 g (1.1 equiv, 16.4 mmol) of 1-bromonaphthalene and 0.30 g (0.1 equiv, 1.5 mmol) of $^tBu_3P$ were added in order, and stirred while heating and refluxing. After cooling to room temperature, water was added to the reaction solution, and an organic layer was isolated. Then, toluene was added to an aqueous layer, and an organic layer was further extracted. The organic layers were collected, washed with a saline solution and dried with $MgSO_4$. $MgSO_4$ was filtered, an organic layer was concentrated, and the crude product thus obtained was separated by silica gel column chromatography (utilizing a mixture solvent of hexane and toluene as a developing layer) to obtain Compound A161 of a solid (9.63 g, yield 81%).

FAB-MS was measured, mass number m/z=795 was observed as a molecular ion peak, and Compound A161 was identified.

Synthesis of Compound A184

Amine Compound A184 according to an embodiment may be synthesized, for example, by the steps of Reaction 8.

Reaction 8

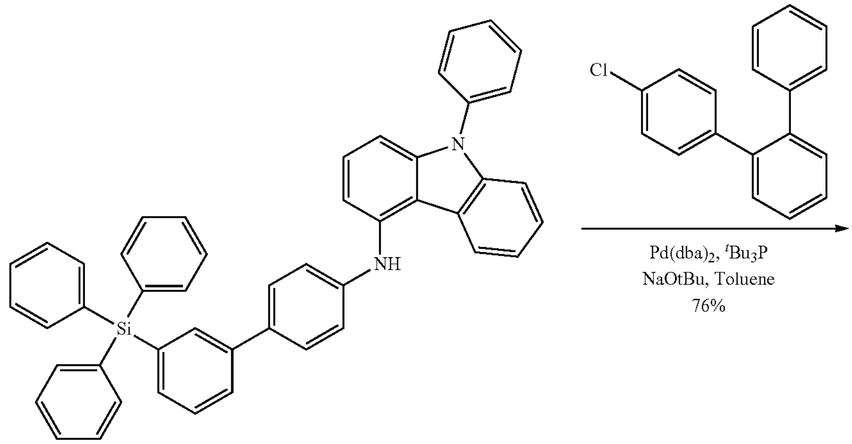

IM-8

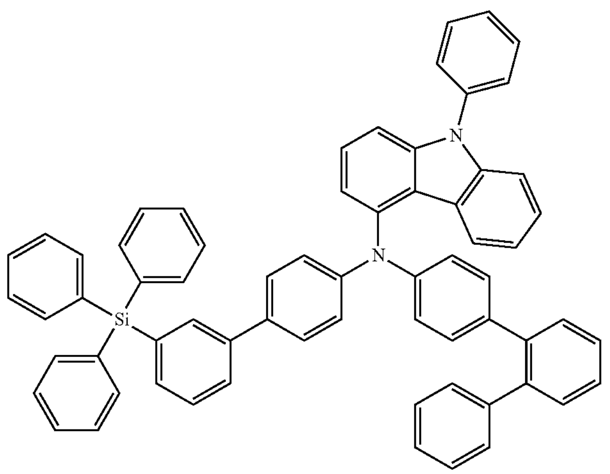

A184

Under an argon atmosphere, to a 300 mL, three-neck flask, 10.00 g (14.9 mmol) of Intermediate IM-8, 0.26 g (0.03 equiv, 0.4 mmol) of $Pd(dba)_2$, 2.87 g (2.0 equiv, 29.9 mmol) of $NaO^tBu$, 84 mL of toluene, 4.35 g (1.1 equiv, 16.4 mmol) of 4-chloro-1,1':2',1"-terphenyl and 0.30 g (0.1 equiv, 1.5 mmol) of $^tBu_3P$ were added in order, and stirred while heating and refluxing. After cooling to room temperature, water was added to the reaction solution, and an organic layer was isolated. Then, toluene was added to an aqueous layer, and an organic layer was further extracted. The organic layers were collected, washed with a saline solution and dried with $MgSO_4$. $MgSO_4$ was filtered, an organic layer was concentrated, and the crude product thus obtained was separated by silica gel column chromatography (utilizing a mixture solvent of hexane and toluene as a developing layer) to obtain Compound A184 of a solid (10.19 g, yield 76%).

FAB-MS was measured, mass number m/z=897 was observed as a molecular ion peak, and Compound A184 was identified.

Synthesis of Compound $A_{23}$

Amine Compound $A_{23}$ according to an embodiment may be synthesized, for example, by the steps of Reaction 9.

Reaction 9

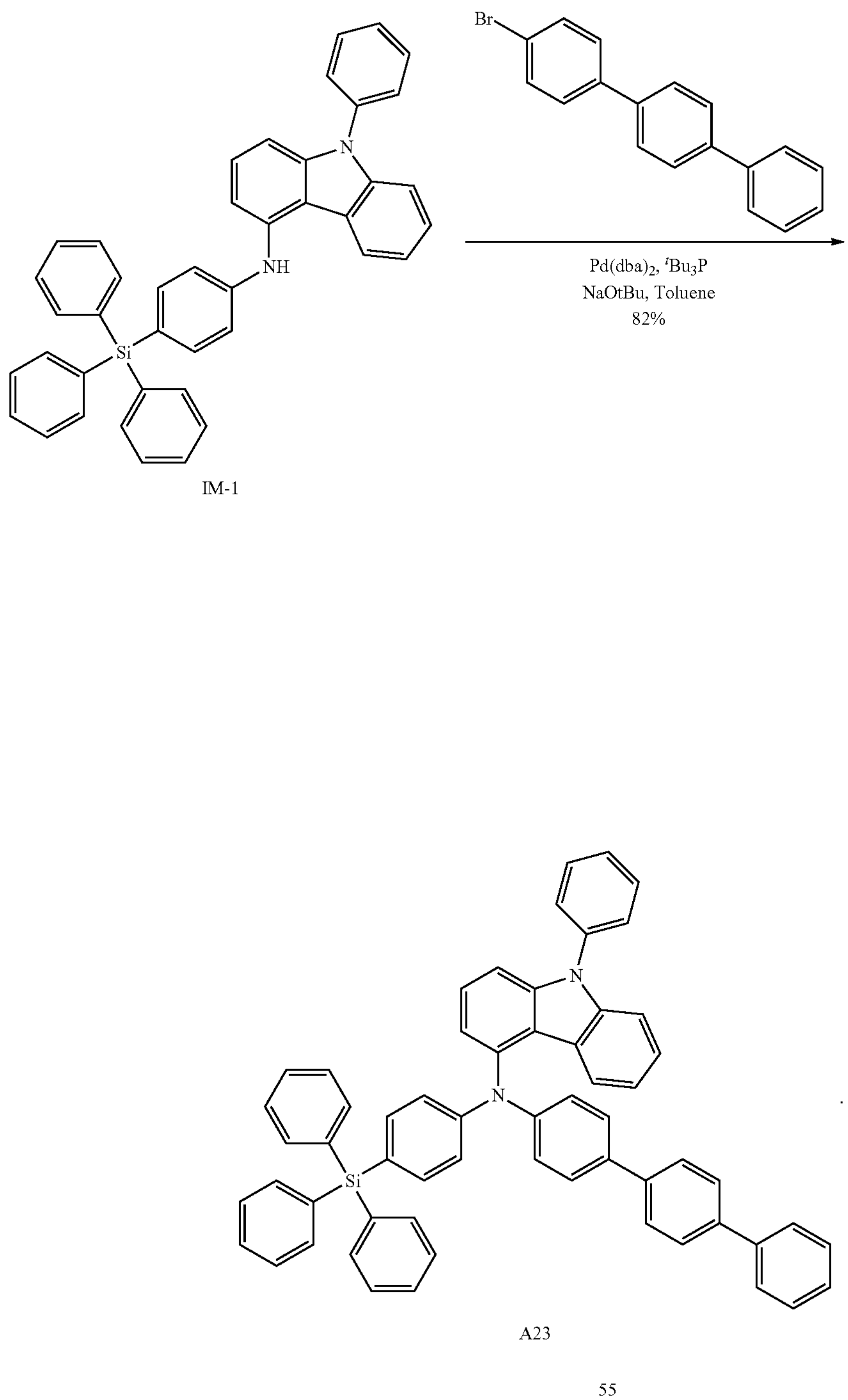

A23

Under an argon atmosphere, to a 300 mL, three-neck flask, 10.00 g (16.9 mmol) of Intermediate IM-1, 0.29 g (0.03 equiv, 0.5 mmol) of $Pd(dba)_2$, 3.24 g (2.0 equiv, 33.8 mmol) of $NaO^tBu$, 84 mL of toluene, 5.74 g (1.1 equiv, 18.6 mmol) of 4-bromo-terphenyl and 0.34 g (0.1 equiv, 1.7 mmol) of $^tBu_3P$ were added in order, and stirred while heating and refluxing. After cooling to room temperature, water was added to the reaction solution, and an organic layer was isolated. Then, toluene was added to an aqueous layer, and an organic layer was further extracted. The organic layers were collected, washed with a saline solution and dried with $MgSO_4$. $MgSO_4$ was filtered, an organic layer was concentrated, and the crude product thus obtained was separated by silica gel column chromatography (utilizing a mixture solvent of hexane and toluene as a developing layer) to obtain Compound $A_{23}$ of a solid (11.36 g, yield 82%).

FAB-MS was measured, mass number m/z=821 was observed as a molecular ion peak, and Compound $A_{23}$ was identified.

Synthesis of Compound A112

Amine Compound A112 according to an embodiment may be synthesized, for example, by the steps of Reaction 10.

Reaction 10

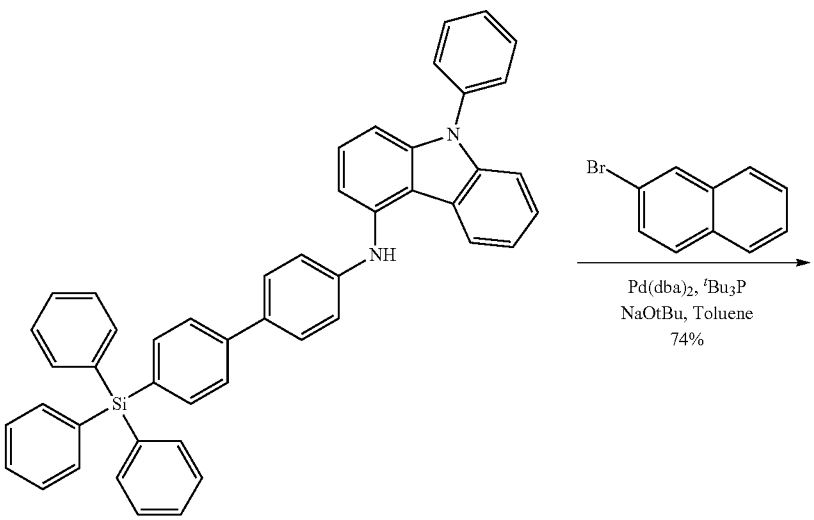

IM-5

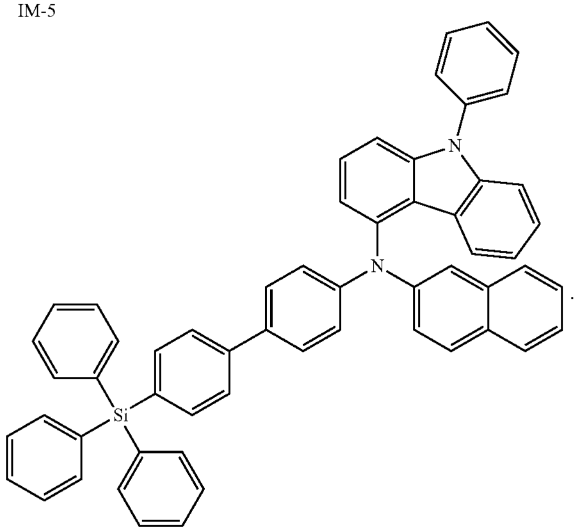

A112

Under an argon atmosphere, to a 300 mL, three-neck flask, 10.00 g (14.9 mmol) of Intermediate IM-5, 0.26 g (0.03 equiv, 0.4 mmol) of $Pd(dba)_2$, 2.87 g (2.0 equiv, 29.9 mmol) of $NaO^tBu$, 84 mL of toluene, 3.41 g (1.1 equiv, 16.4 mmol) of 2-bromonaphthalene and 0.30 g (0.1 equiv, 1.5 mmol) of $^tBu_3P$ were added in order, and stirred while heating and refluxing. After cooling to room temperature, water was added to the reaction solution, and an organic layer was isolated. Then, toluene was added to an aqueous layer, and an organic layer was further extracted. The organic layers were collected, washed with a saline solution and dried with $MgSO_4$. $MgSO_4$ was filtered, an organic layer was concentrated, and the crude product thus obtained was separated by silica gel column chromatography (utilizing a mixture solvent of hexane and toluene as a developing layer) to obtain Compound A112 of a solid (8.80 g, yield 74%).

FAB-MS was measured, mass number m/z=795 was observed as a molecular ion peak, and Compound A112 was identified.

Synthesis of Compound B4

Amine Compound B4 according to an embodiment may be synthesized, for example, by the steps of Reaction 11.

Reaction 11

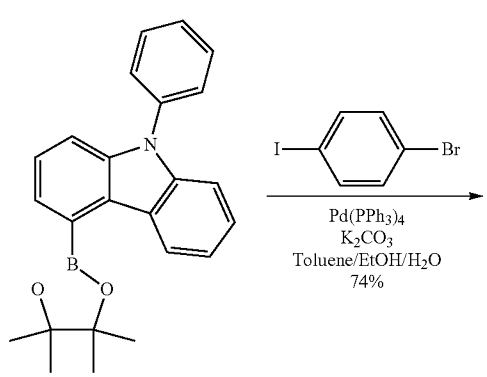

-continued

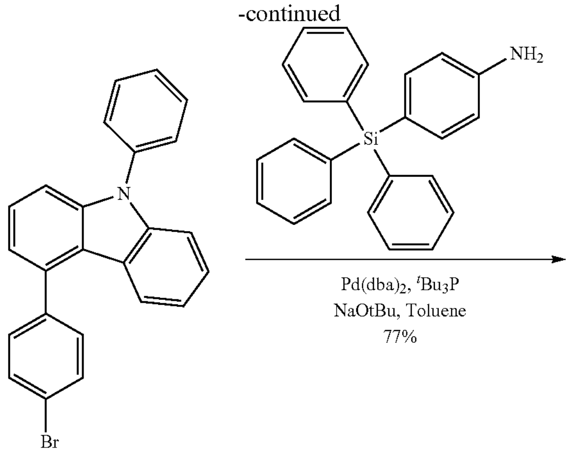

IM-9

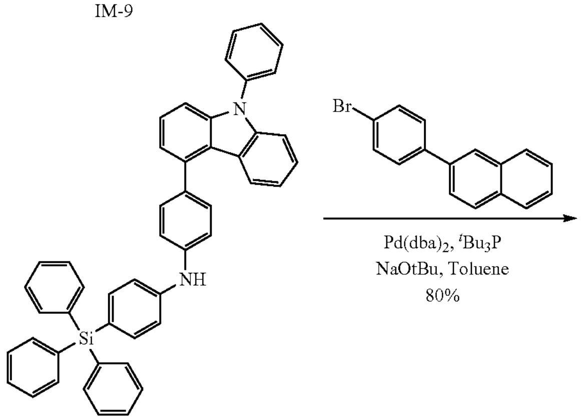

IM-10

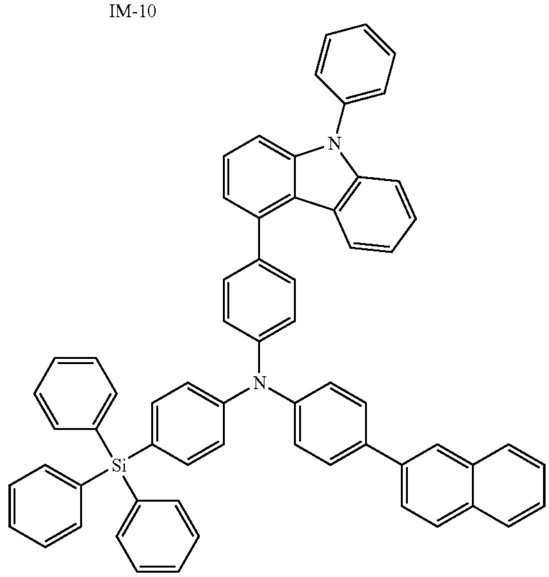

B4

Synthesis of Intermediate IM-9

Under an argon atmosphere, to a 1,000 mL, three-neck flask, 25.00 g (67.7 mmol) of 9-phenyl-4-(4,4,5,5-tetramethyl-1,3,2-dioxaborolan-2-yl)-9H-carbazole, 21.07 g (1.1 equiv, 74.5 mmol) of 1-bromo-4-iodobenzene, 28.07 g (3.0 equiv, 203.1 mmol) of $K_2CO_3$, 3.91 g (0.05 eq, 3.4 mmol) of $Pd(PPh_3)_4$, and 473 mL of a mixture solution of toluene/EtOH/$H_2O$ (4/2/1) were added in order, and heated to about 80° C. and stirred. After cooling to room temperature, the reaction solution was extracted with toluene. Then, an aqueous layer was removed, and an organic layer was washed with a saturated saline solution and dried with $MgSO_4$. $MgSO_4$ was filtered, an organic layer was concentrated, and the crude product thus obtained was separated by silica gel column chromatography (utilizing a mixture solvent of hexane and toluene as a developing layer) to obtain Intermediate IM-9 (19.95 g, yield 74%).

FAB-MS was measured, mass number m/z=398 was observed as a molecular ion peak, and Intermediate IM-9 was identified.

Synthesis of Intermediate IM-10

Under an argon atmosphere, to a 500 mL, three-neck flask, 10.00 g (25.1 mmol) of Intermediate IM-9, 0.43 g (0.03 equiv, 0.8 mmol) of $Pd(dba)_2$, 2.41 g (1.0 equiv, 25.1 mmol) of $NaO^tBu$, 126 mL of toluene, 9.71 g (1.1 equiv, 27.6 mmol) of 4-(triphenylsilyl)aniline and 0.51 g (0.1 equiv, 2.5 mmol) of $^tBu_3P$ were added in order, and stirred while heating and refluxing. After cooling to room temperature, water was added to the reaction solution, and an organic layer was isolated. Then, toluene was added to an aqueous layer, and an organic layer was further extracted. The organic layers were collected, washed with a saline solution and dried with $MgSO_4$. $MgSO_4$ was filtered, an organic layer was concentrated, and the crude product thus obtained was separated by silica gel column chromatography (utilizing a mixture solvent of hexane and toluene as a developing layer) to obtain Intermediate IM-10 (12.93 g, yield 77%).

FAB-MS was measured, mass number m/z=668 was observed as a molecular ion peak, and Intermediate IM-10 was identified. 77%).

Synthesis of Compound B4

Under an argon atmosphere, to a 300 mL, three-neck flask, 10.00 g (14.9 mmol) of Intermediate IM-10, 0.26 g (0.03 equiv, 0.4 mmol) of $Pd(dba)_2$, 2.87 g (2.0 equiv, 29.9 mmol) of $NaO^tBu$, 75 mL of toluene, 4.66 g (1.1 equiv, 16.4 mmol) of 2-(4-bromophenyl)naphthalene and 0.30 g (0.1 equiv, 1.5 mmol) of $^tBu_3P$ were added in order, and stirred while heating and refluxing. After cooling to room temperature, water was added to the reaction solution, and an organic layer was isolated. Then, toluene was added to an aqueous layer, and an organic layer was further extracted. The organic layers were collected, washed with a saline solution and dried with $MgSO_4$. $MgSO_4$ was filtered, an organic layer was concentrated, and the crude product thus obtained was separated by silica gel column chromatography (utilizing a mixture solvent of hexane and toluene as a developing layer) to obtain Compound B4 of a solid (10.42 g, yield 80%).

FAB-MS was measured, mass number m/z=871 was observed as a molecular ion peak, and Compound B4 was identified.

Synthesis of Compound B23

Amine Compound B23 according to an embodiment may be synthesized, for example, by the steps of Reaction 12.

Reaction 12

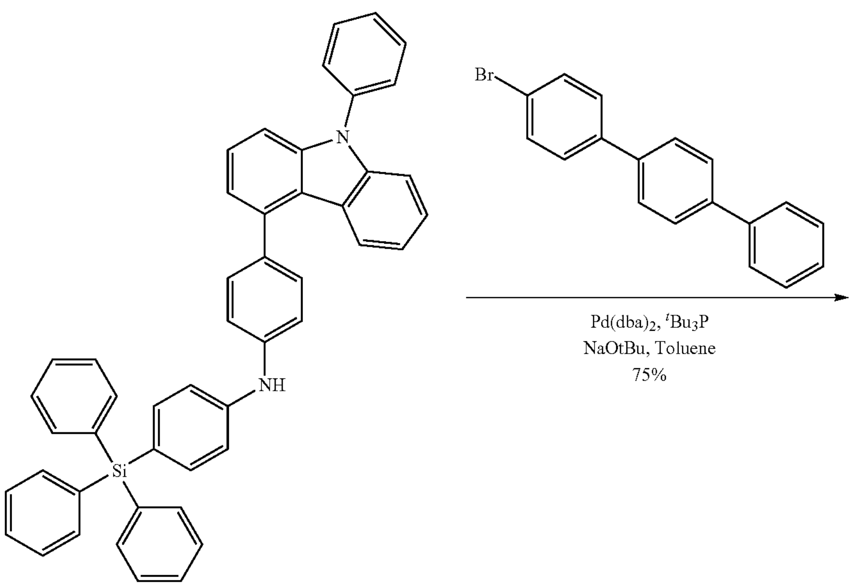

IM-10

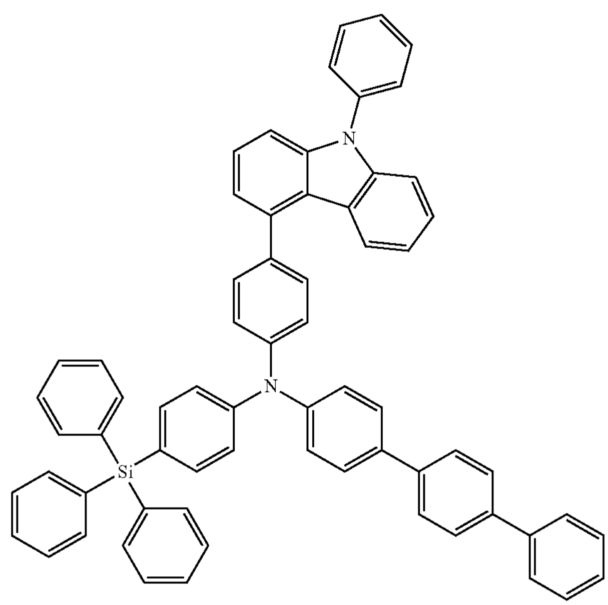

B23

Under an argon atmosphere, to a 300 mL, three-neck flask, 10.00 g (14.9 mmol) of Intermediate IM-10, 0.26 g (0.03 equiv, 0.4 mmol) of $Pd(dba)_2$, 2.87 g (2.0 equiv, 29.9 mmol) of $NaO^tBu$, 75 mL of toluene, 5.08 g (1.1 equiv, 16.4 mmol) of 4-bromo-1,1':4',1"-terphenyl and 0.30 g (0.1 equiv, 1.5 mmol) of $^tBu_3P$ were added in order, and stirred while heating and refluxing. After cooling to room temperature, water was added to the reaction solution, and an organic layer was isolated. Then, toluene was added to an aqueous layer, and an organic layer was further extracted. The organic layers were collected, washed with a saline solution and dried with $MgSO_4$. $MgSO_4$ was filtered, an organic layer was concentrated, and the crude product thus obtained was separated by silica gel column chromatography (utilizing a mixture solvent of hexane and toluene as a developing layer) to obtain Compound B23 of a solid (10.06 g, yield 75%).

FAB-MS was measured, mass number m/z=897 was observed as a molecular ion peak, and Compound B23 was identified.

Synthesis of Compound B72

Amine Compound B72 according to an embodiment may be synthesized, for example, by the steps of Reaction 13.

Reaction 13

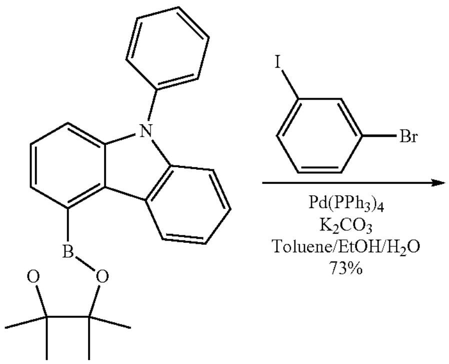

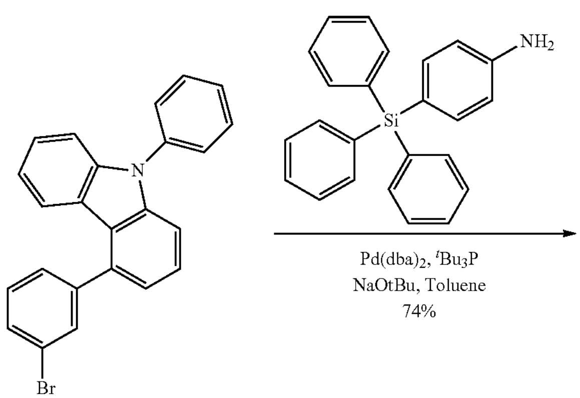

IM-11

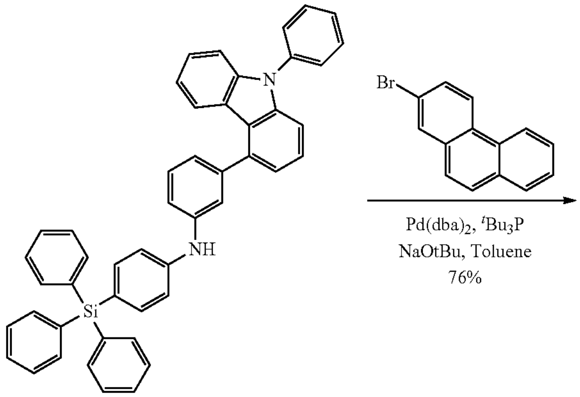

IM-12

-continued

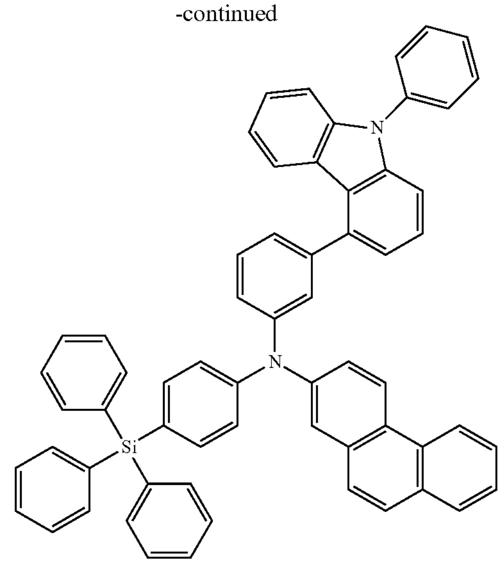

B72

Synthesis of Intermediate IM-11

Under an argon atmosphere, to a 1,000 mL, three-neck flask, 25.00 g (67.7 mmol) of 9-phenyl-4-(4,4,5,5-tetramethyl-1,3,2-dioxaborolan-2-yl)-9H-carbazole, 21.07 g (1.1 equiv, 74.5 mmol) of 1-bromo-3-iodobenzene, 28.07 g (3.0 equiv, 203.1 mmol) of $K_2CO_3$, 3.91 g (0.05 eq, 3.4 mmol) of $Pd(PPh_3)_4$, and 473 mL of a mixture solution of toluene/$EtOH/H_2O$ (4/2/1) were added in order, and heated to about 80° C. and stirred. After cooling to room temperature, the reaction solution was extracted with toluene. Then, an aqueous layer was removed, and an organic layer was washed with a saturated saline solution and dried with $MgSO_4$. $MgSO_4$ was filtered, an organic layer was concentrated, and the crude product thus obtained was separated by silica gel column chromatography (utilizing a mixture solvent of hexane and toluene as a developing layer) to obtain Intermediate IM-11 (19.68 g, yield 73%).

FAB-MS was measured, mass number m/z=398 was observed as a molecular ion peak, and Intermediate IM-11 was identified.

Synthesis of Intermediate IM-12

Under an argon atmosphere, to a 500 mL, three-neck flask, 10.00 g (25.1 mmol) of Intermediate IM-11, 0.43 g (0.03 equiv, 0.8 mmol) of $Pd(dba)_2$, 2.41 g (1.0 equiv, 25.1 mmol) of $NaO^tBu$, 126 mL of toluene, 9.71 g (1.1 equiv, 27.6 mmol) of 4-(triphenylsilyl)aniline and 0.51 g (0.1 equiv, 2.5 mmol) of $^tBu_3P$ were added in order, and stirred while heating and refluxing. After cooling to room temperature, water was added to the reaction solution, and an organic layer was isolated. Then, toluene was added to an aqueous layer, and an organic layer was further extracted. The organic layers were collected, washed with a saline solution and dried with $MgSO_4$. $MgSO_4$ was filtered, an organic layer was concentrated, and the crude product thus obtained was separated by silica gel column chromatography (utilizing a mixture solvent of hexane and toluene as a developing layer) to obtain Intermediate IM-12 (12.43 g, yield 76%).

FAB-MS was measured, mass number m/z=668 was observed as a molecular ion peak, and Intermediate IM-12 was identified.

Synthesis of Compound B72

Under an argon atmosphere, to a 300 mL, three-neck flask, 10.00 g (14.9 mmol) of Intermediate IM-12, 0.26 g (0.03 equiv, 0.4 mmol) of $Pd(dba)_2$, 2.87 g (2.0 equiv, 29.9 mmol) of $NaO^tBu$, 75 mL of toluene, 4.23 g (1.1 equiv, 16.4 mmol) of 2-bromophenanthrene and 0.30 g (0.1 equiv, 1.5 mmol) of $^tBu_3P$ were added in order, and stirred while heating and refluxing. After cooling to room temperature, water was added to the reaction solution, and an organic layer was isolated. Then, toluene was added to an aqueous layer, and an organic layer was further extracted. The organic layers were collected, washed with a saline solution and dried with $MgSO_4$. $MgSO_4$ was filtered, an organic layer was concentrated, and the crude product thus obtained was separated by silica gel column chromatography (utilizing a mixture solvent of hexane and toluene as a developing layer) to obtain Compound B72 of a solid (9.60 g, yield 76%).

FAB-MS was measured, mass number m/z=845 was observed as a molecular ion peak, and Compound B72 was identified.

Synthesis of Compound B92

Amine Compound B92 according to an embodiment may be synthesized, for example, by the steps of Reaction 14.

Reaction 14

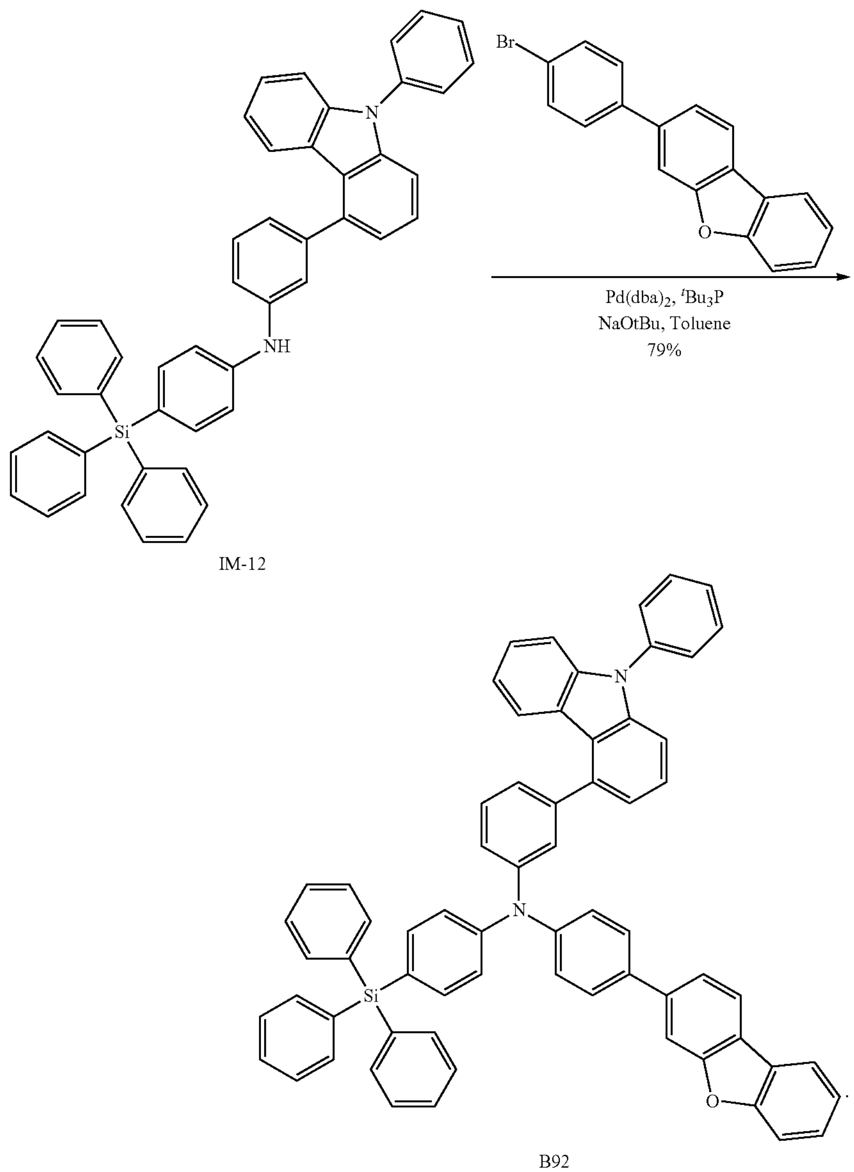

Under an argon atmosphere, to a 300 mL, three-neck flask, 10.00 g (14.9 mmol) of Intermediate IM-12, 0.26 g (0.03 equiv, 0.4 mmol) of $Pd(dba)_2$, 2.87 g (2.0 equiv, 29.9 mmol) of $NaO^tBu$, 75 mL of toluene, 5.32 g (1.1 equiv, 16.4 mmol) of 3-(4-bromophenyl)dibenzofuran and 0.30 g (0.1 equiv, 1.5 mmol) of $^tBu_3P$ were added in order, and stirred while heating and refluxing. After cooling to room temperature, water was added to the reaction solution, and an organic layer was isolated. Then, toluene was added to an aqueous layer, and an organic layer was further extracted. The organic layers were collected, washed with a saline solution and dried with $MgSO_4$. $MgSO_4$ was filtered, an organic layer was concentrated, and the crude product thus obtained was separated by silica gel column chromatography (utilizing a mixture solvent of hexane and toluene as a developing layer) to obtain Compound B92 of a solid (10.76 g, yield 79%).

FAB-MS was measured, mass number m/z=911 was observed as a molecular ion peak, and Compound B92 was identified.

Synthesis of Compound B142

Amine Compound B142 according to an embodiment may be synthesized, for example, by the steps of Reaction 15.

Reaction 15

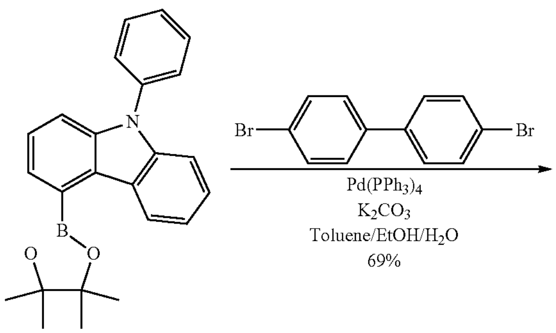

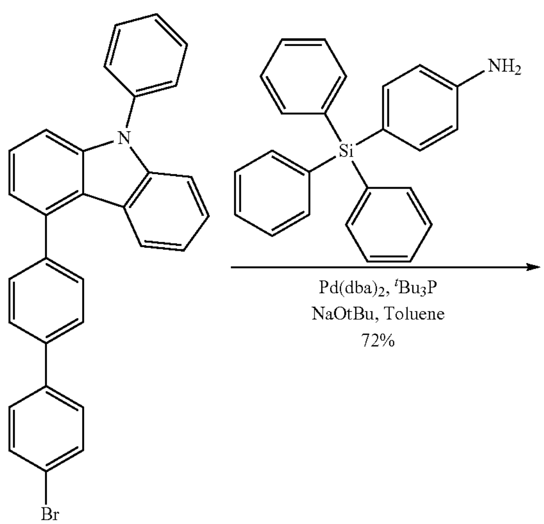

IM-13

-continued

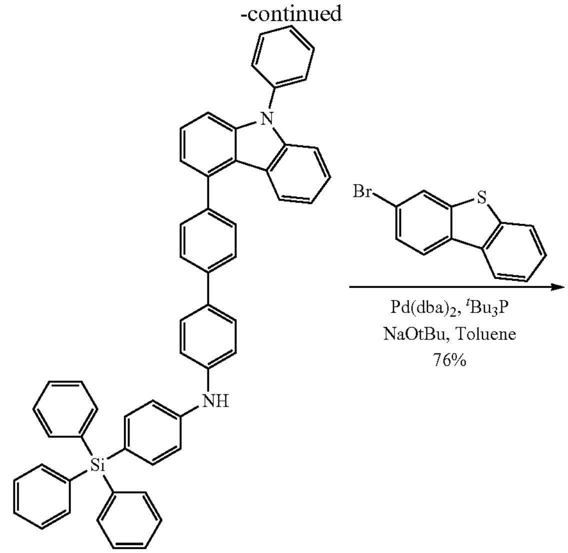

IM-14

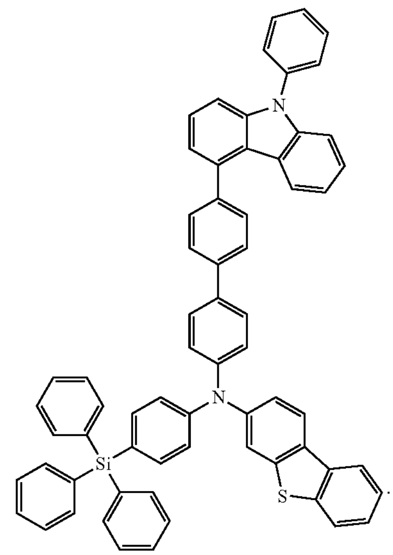

B142

Synthesis of Intermediate IM-13

Under an argon atmosphere, to a 1,000 mL, three-neck flask, 25.00 g (67.7 mmol) of 9-phenyl-4-(4,4,5,5-tetramethyl-1,3,2-dioxaborolan-2-yl)-9H-carbazole, 23.24 g (1.1 equiv, 74.5 mmol) of 4,4'-dibromo-1,1'-biphenyl, 28.07 g (3.0 equiv, 203.1 mmol) of $K_2CO_3$, 3.91 g (0.05 eq, 3.4 mmol) of $Pd(PPh_3)_4$, and 473 mL of a mixture solution of toluene/EtOH/$H_2O$ (4/2/1) were added in order, and heated to about 80° C. and stirred. After cooling to room temperature, the reaction solution was extracted with toluene. Then, an aqueous layer was removed, and an organic layer was washed with a saturated saline solution and dried with $MgSO_4$. $MgSO_4$ was filtered, an organic layer was concentrated, and the crude product thus obtained was separated by silica gel column chromatography (utilizing a mixture solvent of hexane and toluene as a developing layer) to obtain Intermediate IM-13 (22.16 g, yield 69%).

FAB-MS was measured, mass number m/z=474 was observed as a molecular ion peak, and Intermediate IM-13 was identified.

Synthesis of Intermediate IM-14

Under an argon atmosphere, to a 500 mL, three-neck flask, 10.00 g (21.1 mmol) of Intermediate IM-13, 0.36 g (0.03 equiv, 0.6 mmol) of $Pd(dba)_2$, 2.03 g (1.0 equiv, 21.1 mmol) of $NaO^tBu$, 105 mL of toluene, 9.63 g (1.1 equiv, 23.2 mmol) of 4-(triphenylsilyl)aniline and 0.43 g (0.1 equiv, 2.1 mmol) of $^tBu_3P$ were added in order, and stirred while heating and refluxing. After cooling to room temperature, water was added to the reaction solution, and an organic layer was isolated. Then, toluene was added to an aqueous layer, and an organic layer was further extracted. The organic layers were collected, washed with a saline solution and dried with $MgSO_4$. $MgSO_4$ was filtered, an organic layer was concentrated, and the crude product thus obtained was separated by silica gel column chromatography (utilizing a mixture solvent of hexane and toluene as a developing layer) to obtain Intermediate IM-14 (11.31 g, yield 72%).

FAB-MS was measured, mass number m/z=745 was observed as a molecular ion peak, and Intermediate IM-14 was identified.

Synthesis of Compound B142

Under an argon atmosphere, to a 300 mL, three-neck flask, 10.00 g (13.4 mmol) of Intermediate IM-14, 0.23 g (0.03 equiv, 0.4 mmol) of $Pd(dba)_2$, 2.58 g (2.0 equiv, 26.8 mmol) of $NaO^tBu$, 67 mL of toluene, 3.89 g (1.1 equiv, 14.7 mmol) of 3-bromodibenzothiophene and 0.27 g (0.1 equiv, 1.3 mmol) of $^tBu_3P$ were added in order, and stirred while heating and refluxing. After cooling to room temperature, water was added to the reaction solution, and an organic layer was isolated. Then, toluene was added to an aqueous layer, and an organic layer was further extracted. The organic layers were collected, washed with a saline solution and dried with $MgSO_4$. $MgSO_4$ was filtered, an organic layer was concentrated, and the crude product thus obtained was separated by silica gel column chromatography (utilizing a mixture solvent of hexane and toluene as a developing layer) to obtain Compound B142 of a solid (9.46 g, yield 76%).

FAB-MS was measured, mass number m/z=927 was observed as a molecular ion peak, and Compound B142 was identified.

Synthesis of Compound B180

Amine Compound B180 according to an embodiment may be synthesized, for example, by the steps of Reaction 16.

Reaction 16

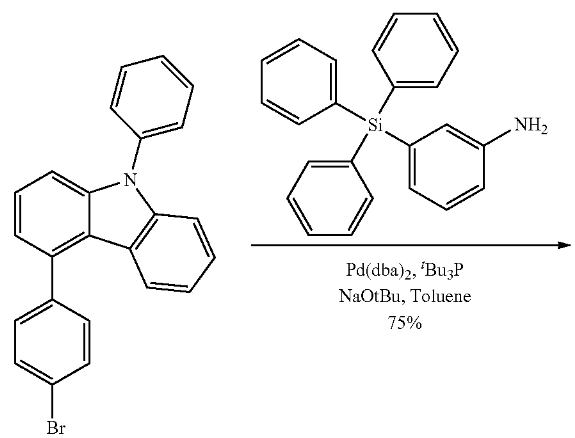

IM-9

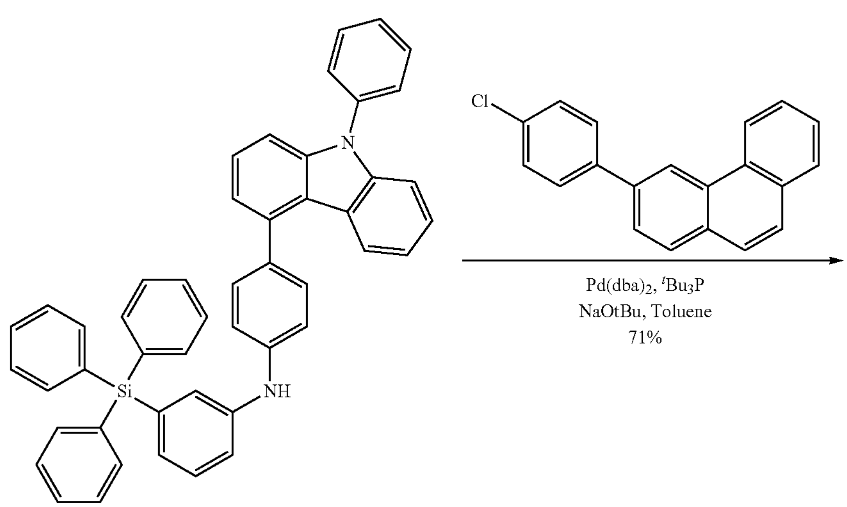

IM-15

-continued

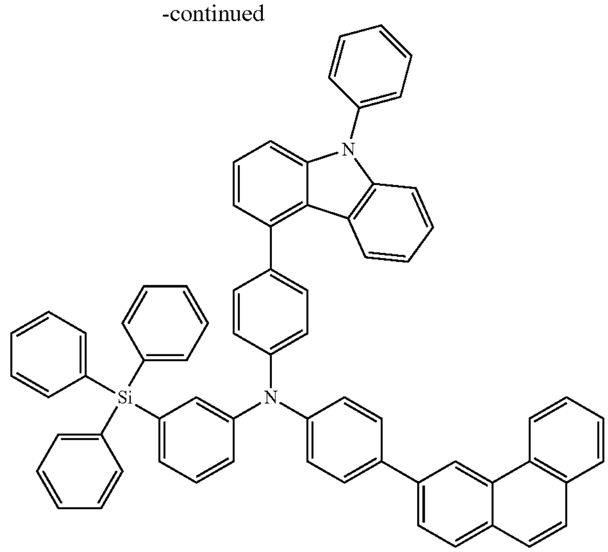

B180

Synthesis of Intermediate IM-15

Under an argon atmosphere, to a 500 mL, three-neck flask, 10.00 g (25.1 mmol) of Intermediate IM-9, 0.43 g (0.03 equiv, 0.8 mmol) of $Pd(dba)_2$, 2.41 g (1.0 equiv, 25.1 mmol) of $NaO^tBu$, 126 mL of toluene, 9.71 g (1.1 equiv, 27.6 mmol) of 3-(triphenylsilyl)aniline and 0.51 g (0.1 equiv, 2.5 mmol) of $^tBu_3P$ were added in order, and stirred while heating and refluxing. After cooling to room temperature, water was added to the reaction solution, and an organic layer was isolated. Then, toluene was added to an aqueous layer, and an organic layer was further extracted. The organic layers were collected, washed with a saline solution and dried with $MgSO_4$. $MgSO_4$ was filtered, an organic layer was concentrated, and the crude product thus obtained was separated by silica gel column chromatography (utilizing a mixture solvent of hexane and toluene as a developing layer) to obtain Intermediate IM-15 (12.60 g, yield 75%).

FAB-MS was measured, mass number m/z=668 was observed as a molecular ion peak, and Intermediate IM-15 was identified.

Synthesis of Compound B180

Under an argon atmosphere, to a 300 mL, three-neck flask, 10.00 g (14.9 mmol) of Intermediate IM-15, 0.26 g (0.03 equiv, 0.4 mmol) of $Pd(dba)_2$, 2.87 g (2.0 equiv, 29.9 mmol) of $NaO^tBu$, 75 mL of toluene, 4.75 g (1.1 equiv, 16.4 mmol) of 3-(4-chlorophenyl)phenanthrene and 0.30 g (0.1 equiv, 1.5 mmol) of $^tBu_3P$ were added in order, and stirred while heating and refluxing. After cooling to room temperature, water was added to the reaction solution, and an organic layer was isolated. Then, toluene was added to an aqueous layer, and an organic layer was further extracted. The organic layers were collected, washed with a saline solution and dried with $MgSO_4$. $MgSO_4$ was filtered, an organic layer was concentrated, and the crude product thus obtained was separated by silica gel column chromatography (utilizing a mixture solvent of hexane and toluene as a developing layer) to obtain Compound B180 of a solid (9.78 g, yield 71%).

FAB-MS was measured, mass number m/z=921 was observed as a molecular ion peak, and Compound B180 was identified.

Synthesis of Compound B186

Amine Compound B186 according to an embodiment may be synthesized, for example, by the steps of Reaction 17.

Reaction 17

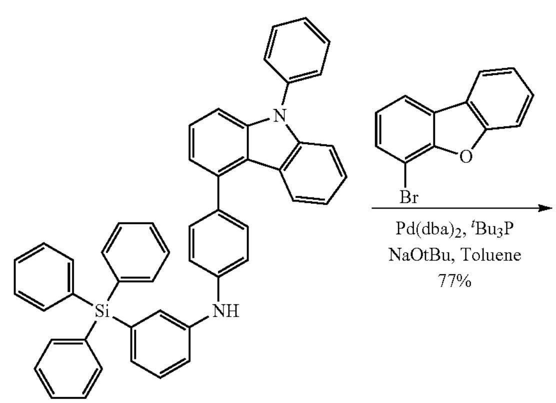

IM-15

-continued

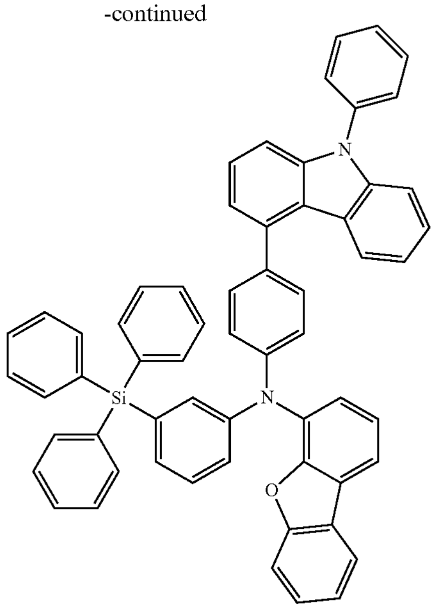

B186

Under an argon atmosphere, to a 300 mL, three-neck flask, 10.00 g (14.9 mmol) of Intermediate IM-15, 0.26 g (0.03 equiv, 0.4 mmol) of $Pd(dba)_2$, 2.87 g (2.0 equiv, 29.9 mmol) of $NaO^tBu$, 75 mL of toluene, 4.06 g (1.1 equiv, 16.4 mmol) of 4-bromodibenzofuran and 0.30 g (0.1 equiv, 1.5 mmol) of $^tBu_3P$ were added in order, and stirred while heating and refluxing. After cooling to room temperature, water was added to the reaction solution, and an organic layer was isolated. Then, toluene was added to an aqueous layer, and an organic layer was further extracted. The organic layers were collected, washed with a saline solution and dried with $MgSO_4$. $MgSO_4$ was filtered, an organic layer was concentrated, and the crude product thus obtained was separated by silica gel column chromatography (utilizing a mixture solvent of hexane and toluene as a developing layer) to obtain Compound B186 of a solid (9.61 g, yield 77%).

FAB-MS was measured, mass number m/z=835 was observed as a molecular ion peak, and Compound B186 was identified.

2. Manufacture and Evaluation of Light Emitting Diode

Manufacture of Light Emitting Diode

A light emitting diode of an embodiment including an amine compound of an embodiment in a hole transport layer was manufactured by a method. Light emitting diodes of Examples 1 to 17 were manufactured utilizing the amine compounds of Compound A12, Compound A23, Compound A49, Compound A58, Compound A76, Compound A112, Compound A141, Compound A155, Compound A161, Compound A184, Compound B4, Compound B23, Compound B72, Compound B92, Compound B142, Compound B180, and Compound B186 as materials for a hole transport layer. In Comparative Examples 1 to 12, light emitting diodes were manufactured utilizing Comparative Compounds R1 to R12 as materials of a hole transport layer.

The compounds utilized in hole transport layers in Example 1 to Example 17, and Comparative Example 1 to Comparative Example 12 are shown.

(Example Compounds Utilized for Manufacturing Diodes)

A12

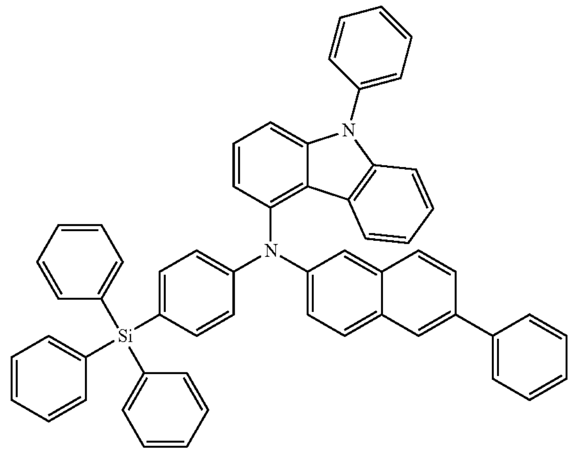

A49

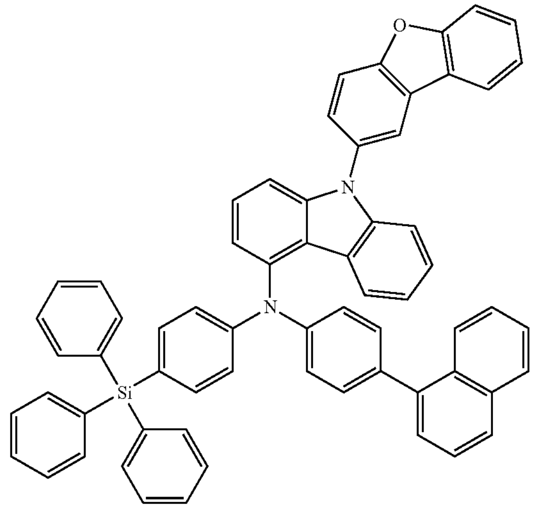

A58

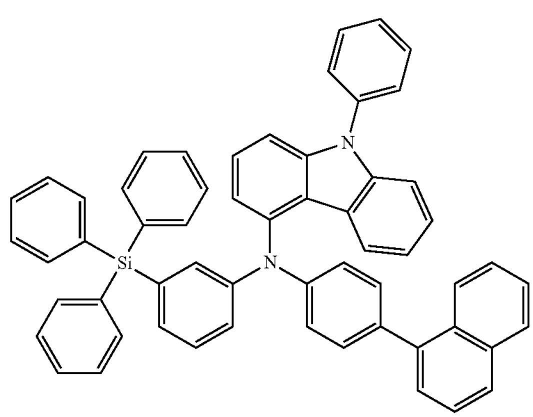

-continued
A76
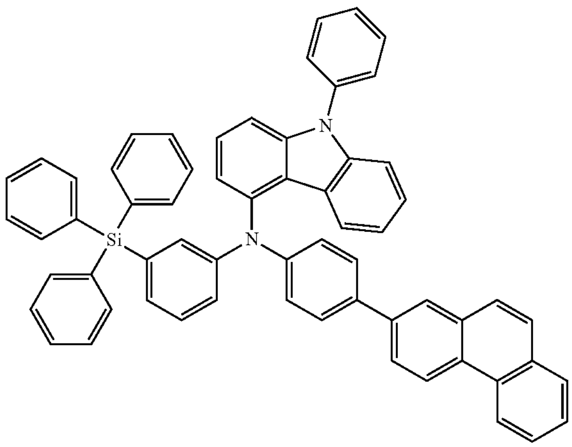
A141
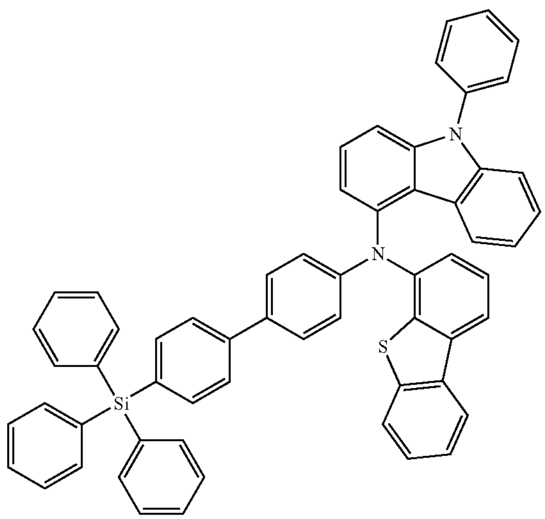
A155
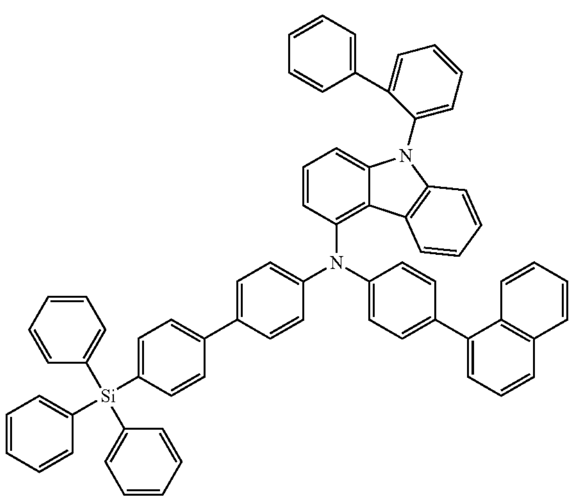
-continued
A161
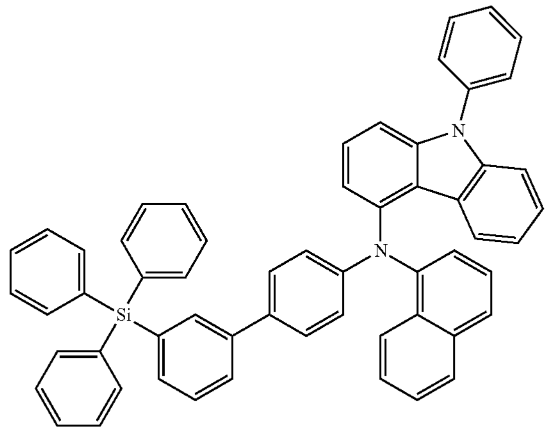
A184
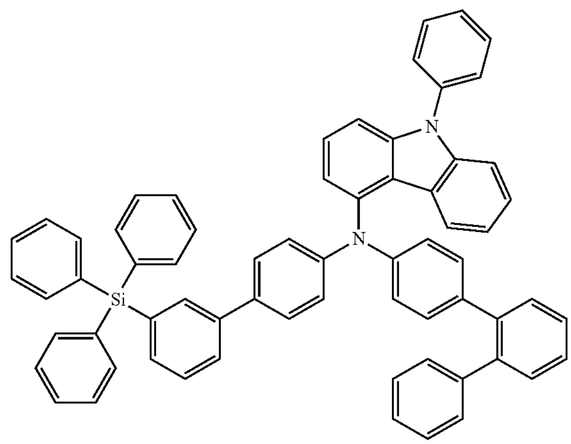
A23
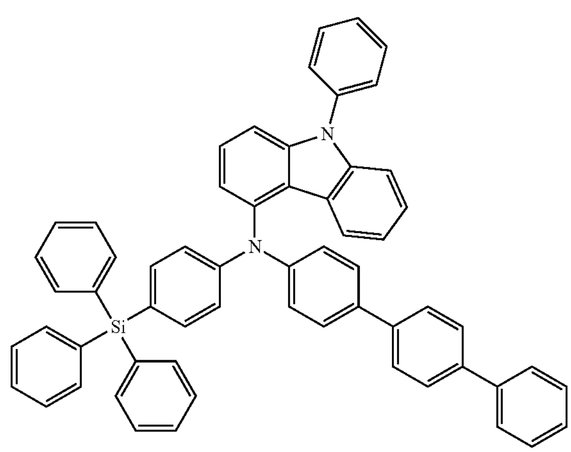

-continued
A112
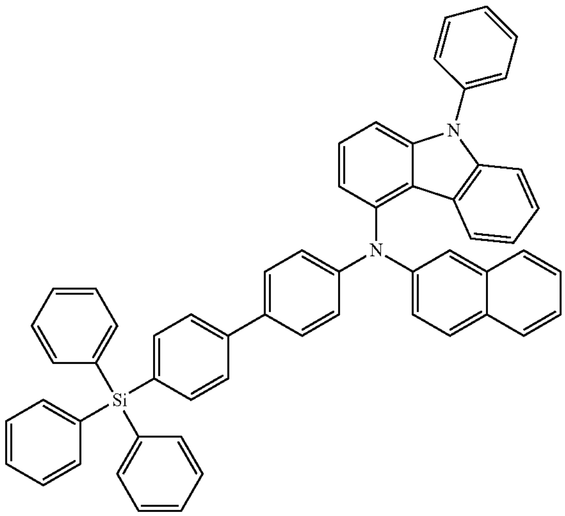
B4
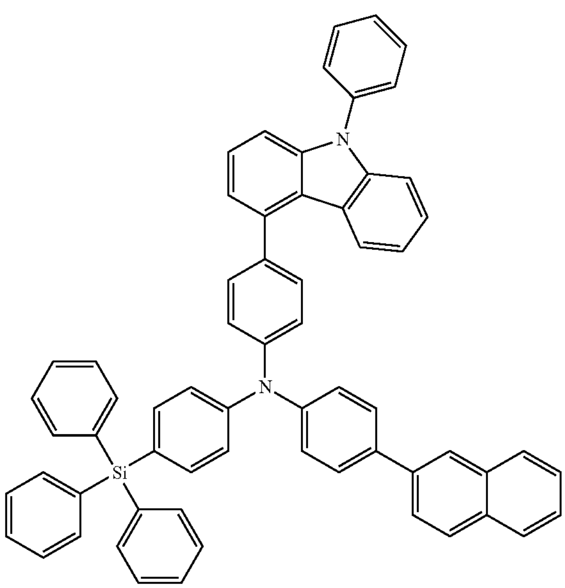
-continued
B23
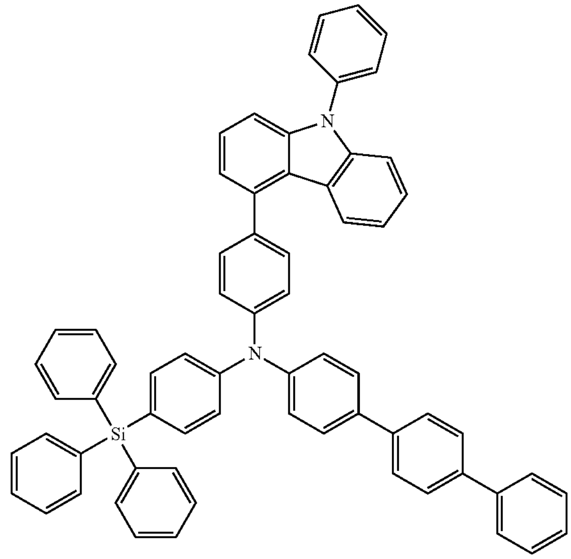
B72
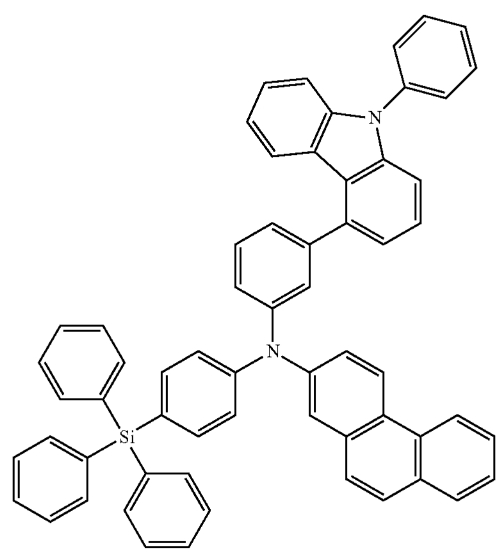

-continued
B92
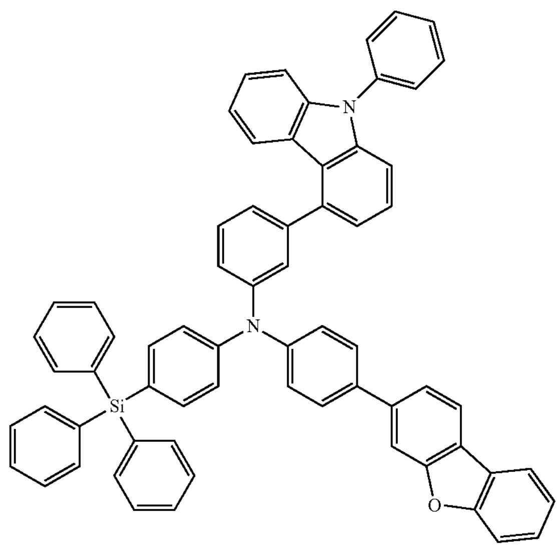
B142
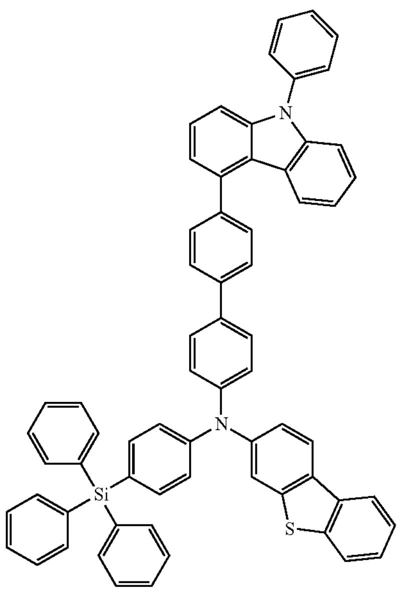
B180
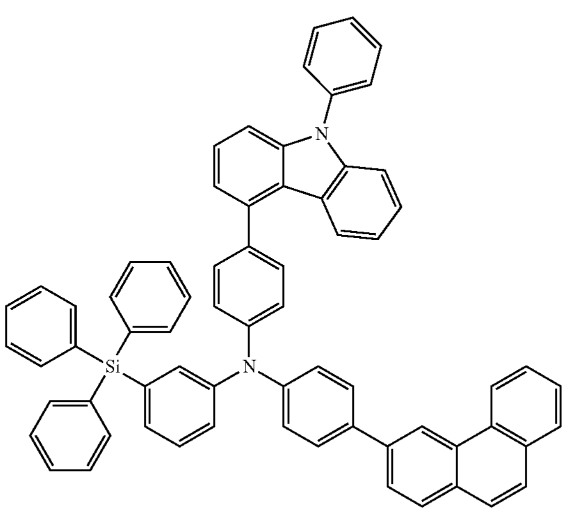
-continued
B186
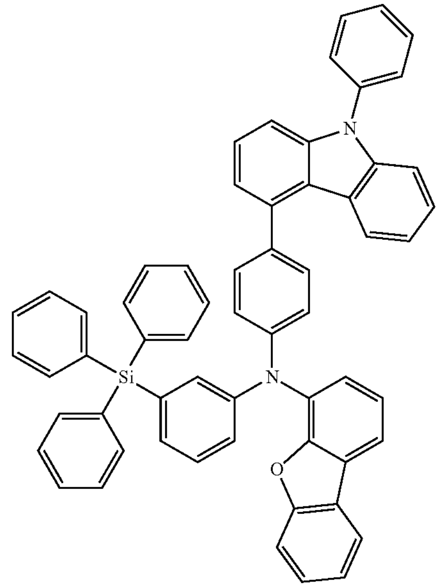
(Comparative Compounds Utilized for Manufacturing Diodes)
R1
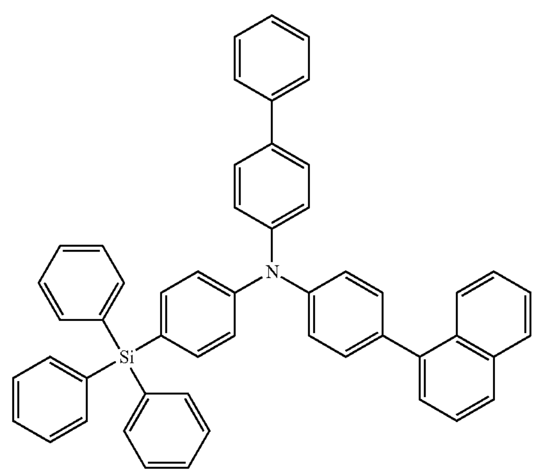

-continued
R2
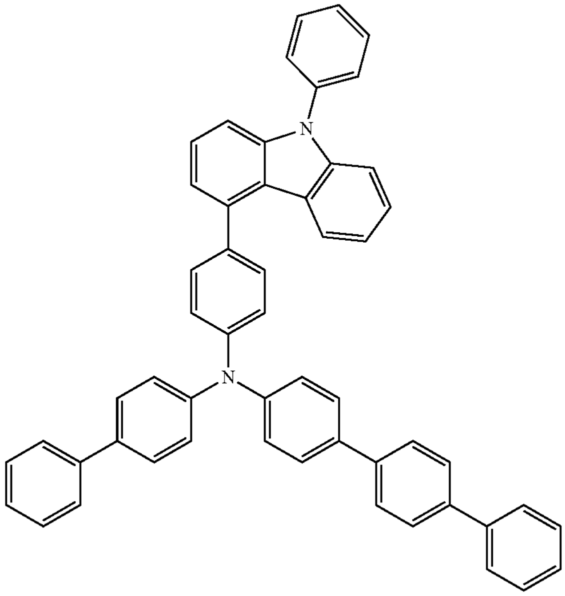
R3
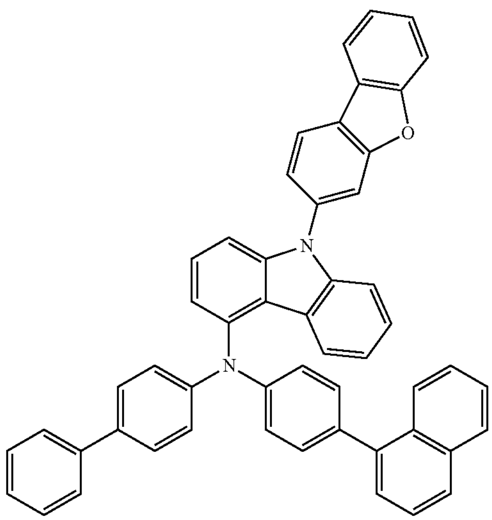
R4
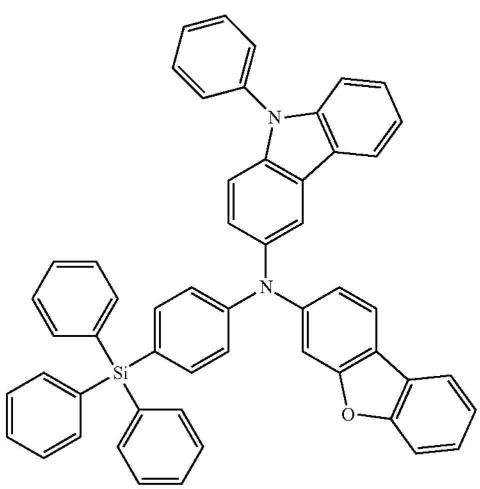
-continued
R5
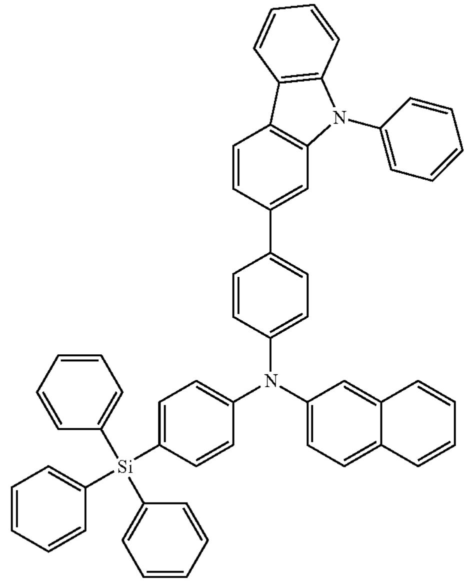
R6
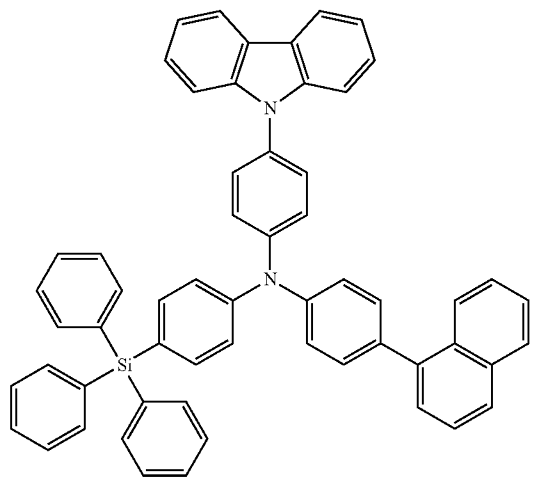
R7
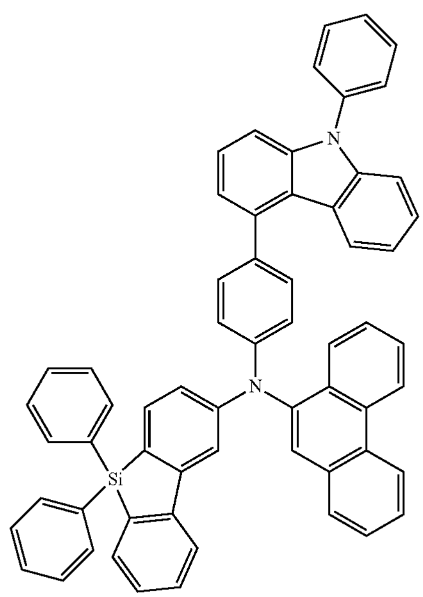

-continued

R8

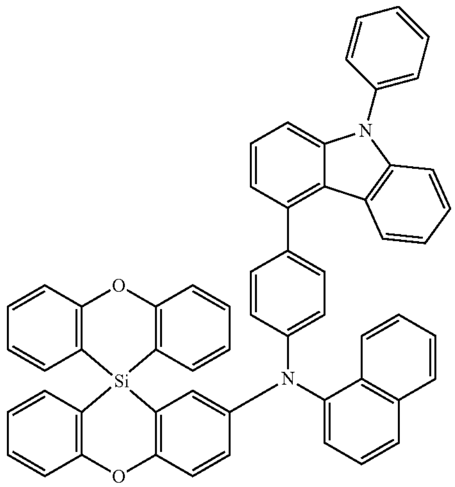

R9

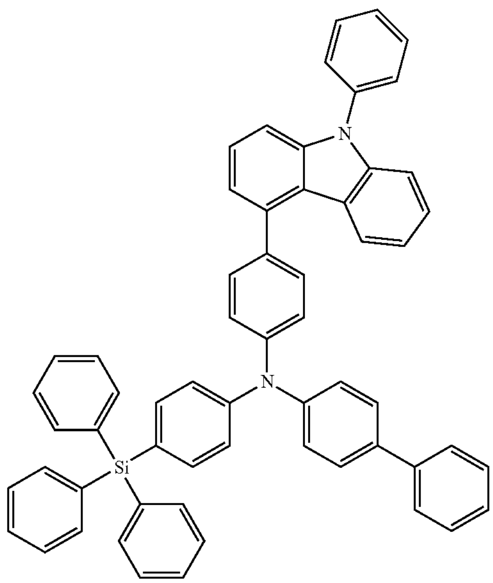

R10

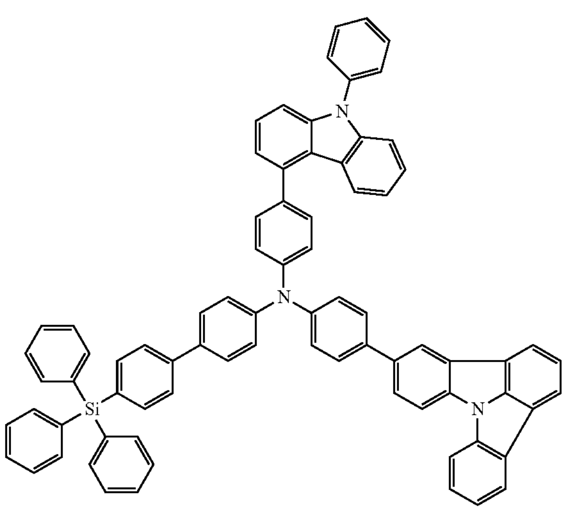

-continued

R11

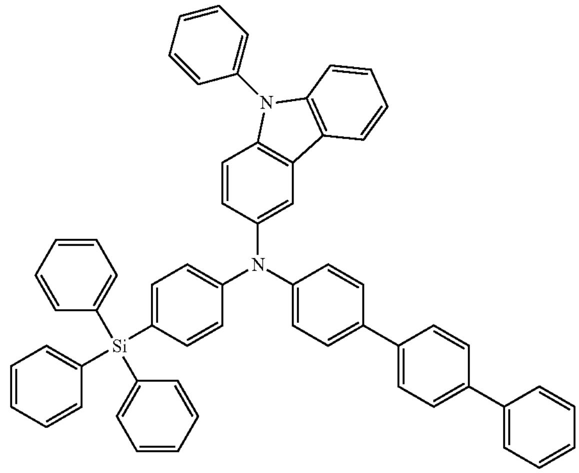

R12

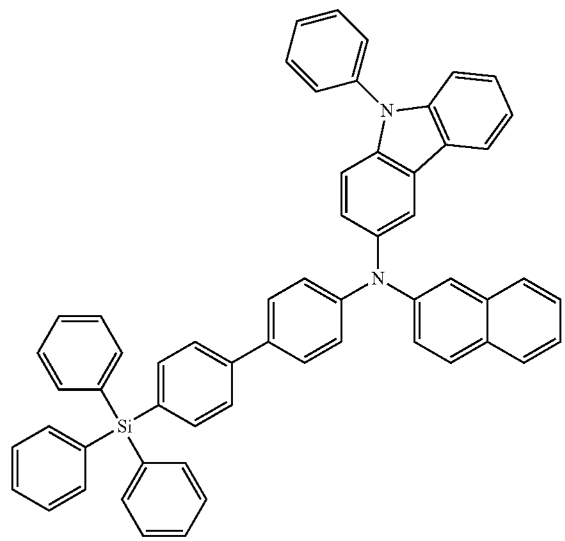

ITO with a thickness of about 1,500 Å was patterned on a glass substrate, washed with ultra-pure water and treated with UV ozone for about 10 minutes. Then, 2-TNATA was deposited to a thickness of about 600 Å to form a hole injection layer. Then, the Example Compound or Comparative Compound was deposited to a thickness of about 300 Å to form a hole transport layer.

Then, an emission layer with a thickness of about 250 Å was formed utilizing ADN doped with 3% TBP. After that, $Alq_3$ was deposited to a thickness of about 250 Å to form an electron transport region, and LiF was deposited to a thickness of about 10 Å to form an electron injection layer.

Then, Al was provided to a thickness of about 1,000 Å to form a second electrode. On the second electrode, a capping layer including Compound P4 was formed to a thickness of about 600 Å.

P4

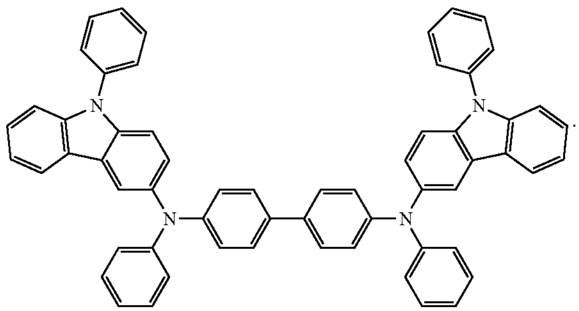

In the Examples, the hole injection layer, the hole transport layer, the emission layer, the electron transport layer, the electron injection layer and the second electrode were formed utilizing a vacuum deposition apparatus.

Evaluation of Properties of Light Emitting Diode

In Table 1, the evaluation results of the light emitting diodes of Example 1 to Example 12, and Comparative Example 1 to Comparative Example 12 are shown. In Table 1, the emission efficiency and diode life of the light emitting diodes thus manufactured are compared and shown. In the evaluation results on the properties of the Examples and Comparative Examples shown in Table 1, the emission efficiency shows efficiency values at a current density of about 10 mA/cm$^2$, and the diode life (LT50) is the luminance half-life at 1.0 mA/cm$^2$.

The current density, voltage and emission efficiency of the light emitting diodes of the Examples and Comparative Examples were obtained utilizing 2400 series Source Meter of Keithley Instrument Co., a chroma meter CS-200 of Konica Minolta Co., and PC Program LabVIEW 2.0 for measurement of National Instrument Co., in a dark room.

TABLE 1

| Diode manufacturing example | Hole transport layer material | Efficiency (cd/A) | Life LT50 (h) |
|---|---|---|---|
| Example 1 | Example Compound A12 | 115% | 131% |
| Example 2 | Example Compound A49 | 117% | 127% |
| Example 3 | Example Compound A58 | 120% | 126% |
| Example 4 | Example Compound A76 | 121% | 132% |
| Example 5 | Example Compound A141 | 119% | 130% |
| Example 6 | Example Compound A155 | 123% | 134% |
| Example 7 | Example Compound A161 | 119% | 129% |
| Example 8 | Example Compound A184 | 124% | 133% |
| Example 9 | Example Compound B4 | 121% | 140% |
| Example 10 | Example Compound B23 | 120% | 145% |
| Example 11 | Example Compound B72 | 125% | 125% |
| Example 12 | Example Compound B92 | 124% | 128% |
| Example 13 | Example Compound B142 | 123% | 147% |
| Example 14 | Example Compound B180 | 119% | 131% |
| Example 15 | Example Compound B186 | 124% | 129% |
| Example 16 | Example Compound A23 | 122% | 134% |
| Example 17 | Example Compound A112 | 126% | 138% |
| Comparative Example 1 | Comparative Compound R1 | 90% | 68% |
| Comparative Example 2 | Comparative Compound R2 | 98% | 71% |
| Comparative Example 3 | Comparative Compound R3 | 99% | 75% |
| Comparative Example 4 | Comparative Compound R4 | 96% | 102% |
| Comparative Example 5 | Comparative Compound R5 | 97% | 104% |
| Comparative Example 6 | Comparative Compound R6 | 101% | 95% |

TABLE 1-continued

| Diode manufacturing example | Hole transport layer material | Efficiency (cd/A) | Life LT50 (h) |
|---|---|---|---|
| Comparative Example 7 | Comparative Compound R7 | 94% | 37% |
| Comparative Example 8 | Comparative Compound R8 | 96% | 43% |
| Comparative Example 9 | Comparative Compound R9 | 100% | 100% |
| Comparative Example 10 | Comparative Compound R10 | 95% | 35% |
| Comparative Example 11 | Comparative Compound R11 | 95% | 103% |
| Comparative Example 12 | Comparative Compound R12 | 99% | 97% |

The emission efficiency and diode-life characteristics shown in Table 1 are relative values based on (e.g., normalized with respect to) Comparative Example 9. The emission efficiency and diode life correspond to relative ratios considering the emission efficiency and the diode life of Comparative Example 9 as 100%.

Referring to the results of Table 1, it could be found that the light emitting diodes of the Examples utilizing the amine compounds of embodiments of the present disclosure as materials for hole transport layers showed excellent or suitable diode efficiency and improved diode-life characteristics. For example, referring to Table 1, it could be confirmed that the diodes of Example 1 to Example 17 each showed long life and high efficiency when compared with the diodes of Comparative Example 1 to Comparative Example 12.

The amine compound according to an embodiment includes all of a carbazole derivative, a triarylsilyl group, and a polycyclic aromatic ring group or heterocyclic group, and has a structure in which the carbazole derivative is combined with an amine moiety via position 4 of a carbazole group, thereby showing long life and high-efficiency properties at the same time (e.g., simultaneously).

In the amine compound of an embodiment, a carbazole group having high hole transport capacity is combined with an amine moiety via position 4, and the whole molecular volume of the amine compound may increase. Accordingly, the deposition temperature utilized in depositing the Example Compound may be lowered, and the materials may be stabilized during manufacturing a diode. In addition, because the energy band gap is increased, the inflow (e.g., diffusion) of excitons generated in an emission layer into a hole transport region may be inhibited. Because the amine compound of the Example includes a triarylsilyl group, electron tolerance may be increased, and thus, electron inflow (e.g., diffusion) into an emission layer may be reduced. In some embodiments, the Example Compound additionally includes the polycyclic aromatic ring group or heterocyclic group in addition to the carbazole group, and electron tolerance may be additionally increased, and a π conjugation system may be extended to improve hole transport properties and to stabilize radicals or radical cations. Through the combination of the molecular properties, in each of the Example Compounds, high efficiency and long life of a light emitting diode may be achieved at the same time.

Comparative Compound R1 is an amine compound material including a triarylsilyl group but not including a carbazole group, and its hole transport capacity is degraded. When compared with the Examples, Comparative Example 1 showed degraded results of both (e.g., simultaneously) emission efficiency and diode life.

Comparative Compounds R2 and R3 are materials including a 4-carbazole group but not including a triarylsilyl group, and their electron tolerances are insufficient. When compared with the Examples, the materials were deteriorated during continuous driving, and degraded results of both (e.g., simultaneously) emission efficiency and diode life were shown in Comparative Examples 2 and 3.

Comparative Compounds R4 to R6, R11 and R12 are materials including both (e.g., simultaneously) a triarylsilyl group and a carbazole group, but the combination (e.g., linkage) position of the carbazole group with the amine group is different from that in the Example Compounds. Accordingly, when compared with the Examples, Comparative Examples 4 to 6, 11 and 12 showed degraded results of both (e.g., simultaneously) emission efficiency and diode life. When the carbazole group is combined with an amine moiety at position 2, 3 or 9, the volume of a molecule may be reduced in comparison to a case of combining at position 4, and the planarity of a whole molecule may be improved and intermolecular stacking may increase. With the easy stacking of molecules, the deposition temperature of a material may increase, and the material may be decomposed during a deposition process, or layer forming properties may be degraded. In some embodiments, when compared with the case of combination at position 4, an energy band gap may be reduced, and the performance of a light emitting diode is thought to decrease. In some embodiments, in case of a 4-carbazole group shown in the Examples, the volume of a whole molecule may increase, interaction among molecules may be weakened, and the deposition temperature may be lowered. Accordingly, the thermal decomposition of this material may be restrained, and excellent or suitable diode properties may be shown.

In Comparative Compounds R7 and R8, a triarylsilyl moiety forms a fused ring. A silicon atom (Si) has a large atomic radius, and if combined with a nearby substituent to form a five-member ring or a six-member ring, the stabilization of a structure may become difficult. Accordingly, the decomposition of materials may be induced at high temperature conditions, and when compared with the Examples, Comparative Examples 7 and 8 are thought to show degraded results of both (e.g., simultaneously) emission efficiency and diode life.

Comparative Compound R9 is a material including both (e.g., simultaneously) a triarylsilyl group and a 4-carbazole group, but Comparative Compound R9 showed degraded results of both (e.g., simultaneously) emission efficiency and diode life when compared with the Examples. This is because Comparative Compound R9 includes a biphenyl group having small (e.g., few) ring-forming carbon atoms (e.g., aromatic rings) as a substituent of an amine group, and electron tolerance and $\pi$ conjugation are insufficient. Accordingly, it is thought that the diode performance of Comparative Example 9 was degraded when compared with the Examples.

As shown in Example Compounds 1-4, 6, 7, 9, 11, 14 and 17, when a polycyclic aromatic group having lots of ring-forming carbon atoms (such as a naphthalene group and/or a phenanthrene group) is included, or as in Example Compounds 5, 12, 13 and 15, when an amine compound including a heterocyclic group is utilized, electron tolerance may be improved, a $\pi$ conjugation system may be extended, and excellent or suitable diode properties may be shown. In addition, as in Example Compounds 8, 10 and 16, though there is no aromatic ring group of a fused ring, when a polycyclic substituent having lots of total carbon atoms of a substituted aryl group is included, similar effects as the above-described Example Compounds may be shown, and Examples 8, 10 and 16 may also show excellent or suitable diode properties. Comparative Compound R10 is a material having an indolocarbazole group, and its hole transport properties were excessively high, such that the device carrier balance collapsed, and degraded results of both (e.g., simultaneously) diode efficiency and diode life were shown.

As described above, Examples 1 to 17 show improved results of emission efficiency and diode life at the same time when compared with Comparative Examples 1 to 12. For example, the diode efficiency and diode life of a light emitting diode of an embodiment may be improved at the same time (e.g., simultaneously) by utilizing an amine compound of an embodiment including a 4-carbazole group, a triarylsilyl group, and a polycyclic ring, a fused ring, a heterocycle, etc., for extending a $\pi$ conjugation system.

The amine compound according to an embodiment has a molecular structure including a carbazole group combined with an amine moiety at a specific position, a triarylsilyl group, and a polycyclic aromatic hydrocarbon ring or heterocycle, and may contribute to the increase of the life and efficiency of a light emitting diode. In some embodiments, the light emitting diode according to an embodiment includes an amine compound of an embodiment and may show long life and high-efficiency properties at the same time.

The light emitting diode of an embodiment includes the amine compound of an embodiment in a hole transport region, and may thus show high efficiency and long-life characteristics.

The amine compound of an embodiment may improve the emission efficiency and the diode life of a light emitting diode.

As used herein, the terms "substantially," "about," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Although embodiments of the present disclosure have been described, it is understood that the present disclosure is not limited to these embodiments, and that various suitable changes and modifications can be made by one of ordinary skill in the art within the spirit and scope of the present disclosure as set forth in the following claims and their equivalents.

What is claimed is:

1. A light emitting diode, comprising:

a first electrode;

a second electrode on the first electrode; and at least one functional layer between the first electrode and the second electrode and comprising an amine compound represented by Formula 1:

Formula 1

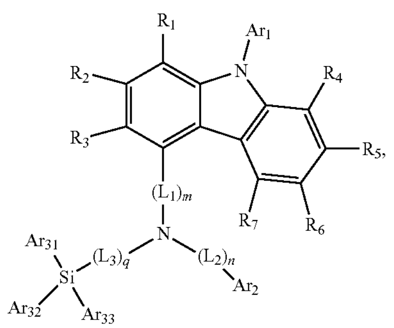

wherein in Formula 1, $Ar_1$ is a substituted or unsubstituted aryl group of 6 to 30 ring-forming carbon atoms, or a substituted or unsubstituted heteroaryl group of 2 to 30 ring-forming carbon atoms, $R_1$ to $R_7$ are each independently a hydrogen atom, a deuterium atom, a halogen atom, a substituted or unsubstituted oxy group, a substituted or unsubstituted thiol group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, and are optionally combined with an adjacent group to form a ring, "m" and "n" are each independently an integer of 0 to 2, "q" is an integer of 1 to 3, $L_1$ to $L_3$ are each independently a direct linkage, or a substituted or unsubstituted arylene group of 6 to 30 ring-forming carbon atoms, $Ar_{31}$ to $Ar_{33}$ are each independently a substituted or unsubstituted aryl group of 6 to 30 ring-forming carbon atoms, and $Ar_2$ is a substituted or unsubstituted aryl group of 10 to 30 ring-forming carbon atoms, or a heteroaryl group of 2 to 30 ring-forming carbon atoms and including O or S as a ring-forming atom, where a case where *-$(L_2)_n$-$Ar_2$ is an unsubstituted biphenyl group is excluded.

2. The light emitting diode of claim 1, wherein the at least one functional layer comprises an emission layer, a hole transport region between the first electrode and the emission layer, and an electron transport region between the emission layer and the second electrode, and the hole transport region comprises the amine compound.

3. The light emitting diode of claim 2, wherein the hole transport region comprises at least one among a hole injection layer, a hole transport layer, and an electron blocking layer, and at least one among the hole injection layer, the hole transport layer, and the electron blocking layer comprises the amine compound.

4. The light emitting diode of claim 1, further comprising a capping layer on the second electrode, wherein a refractive index of the capping layer is about 1.6 or more.

5. The light emitting diode of claim 1, wherein, in Formula 1, *-$(L_2)_n$-$Ar_2$ is represented by any one among Formula 2-1 to Formula 2-4:

Formula 2-1

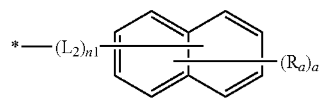

Formula 2-2

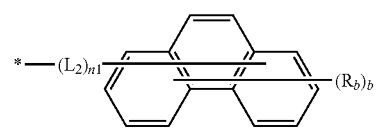

Formula 2-3

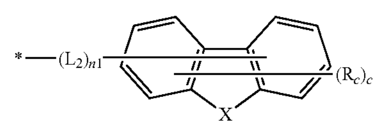

Formula 2-4

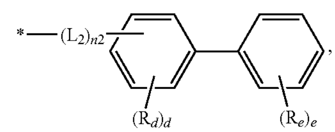

, and wherein in Formula 2-1 to Formula 2-4, $R_a$ to $R_e$ are each independently a hydrogen atom, a deuterium atom, a halogen atom, a substituted or unsubstituted oxy group, a substituted or unsubstituted thiol group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, and are optionally combined with an adjacent group to form a ring, "n1" is an integer of 0 to 2, "n2" is 1 or 2, "a" and "c" are integers of 0 to 7, "b" is an integer of 0 to 9, "d" is an integer of 0 to 4, "e" is an integer of 0 to 5, X is O or S, and $L_2$ is the same as defined in Formula 1.

6. The light emitting diode of claim 1, wherein Formula 1 is represented by Formula 1-1 or Formula 1-2:

Formula 1-1

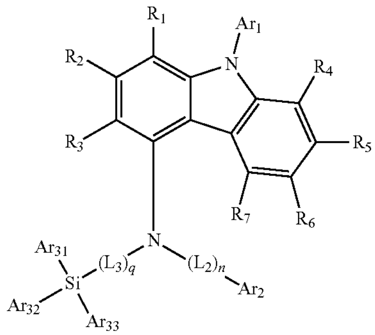

Formula 1-2

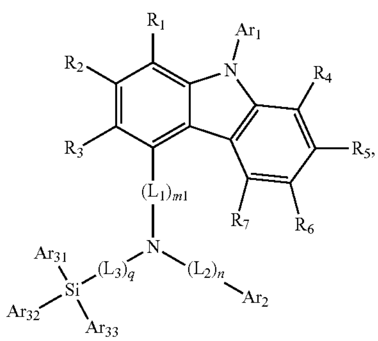

wherein in Formula 1-2, "m1" is 1 or 2, and wherein in Formula 1-1 and Formula 1-2, $Ar_1$, $Ar_2$, $Ar_{31}$ to $Ar_{33}$, $L_1$ to $L_3$, "n", "q", and $R_1$ to $R_7$ are each independently the same as defined in Formula 1.

7. The light emitting diode of claim 6, wherein, in Formula 1-2, $L_1$ comprises a substituted or unsubstituted phenylene group, a substituted or unsubstituted divalent biphenyl group, a substituted or unsubstituted naphthalene group, or a substituted or unsubstituted phenanthrene group.

8. The light emitting diode of claim 1, wherein $Ar_{31}$ to $Ar_{33}$ are each independently a substituted or unsubstituted phenyl group, or a substituted or unsubstituted naphthyl group.

9. The light emitting diode of claim 1, wherein when "n" is an integer of 1 or more, $L_2$ comprises a substituted or unsubstituted phenylene group, a substituted or unsubstituted divalent biphenyl group, a substituted or unsubstituted naphthalene group, or a substituted or unsubstituted phenanthrene group.

10. The light emitting diode of claim 1, wherein $L_3$ comprises a substituted or unsubstituted phenylene group, a substituted or unsubstituted divalent biphenyl group, a substituted or unsubstituted naphthalene group, or a substituted or unsubstituted phenanthrene group.

11. The light emitting diode of claim 1, wherein $Ar_1$ comprises a substituted or unsubstituted phenyl group, a substituted or unsubstituted naphthyl group, a substituted or unsubstituted phenanthrene group, a substituted or unsubstituted dibenzofuran group, or a substituted or unsubstituted dibenzothiophene group.

12. The light emitting diode of claim 2, wherein the emission layer comprises a compound represented by Formula E-1:

Formula E-1

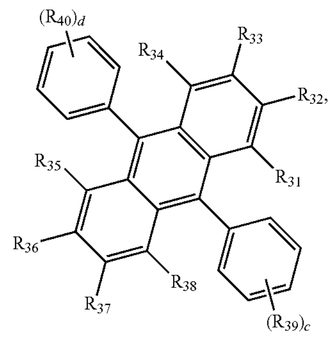

and wherein in Formula E-1,

"c" and "d" are each independently an integer of 0 to 5, and $R_{31}$ to $R_{40}$ are each independently a hydrogen atom, a deuterium atom, a halogen atom, a substituted or unsubstituted silyl group, a substituted or unsubstituted alkyl group of 1 to 20 carbon atoms, a substituted or unsubstituted alkenyl group of 2 to 20 carbon atoms, a substituted or unsubstituted oxy group, a substituted or unsubstituted thiol group, a substituted or unsubstituted aryl group of 6 to 30 ring-forming carbon atoms, or a substituted or unsubstituted heteroaryl group of 2 to 30 ring-forming carbon atoms, and are optionally combined with an adjacent group to form a ring.

13. The light emitting diode of claim 1, wherein the at least one functional layer comprises at least one among amine compounds in Compound Group 1A and Compound Group 1B:

Compound Group 1A

A1

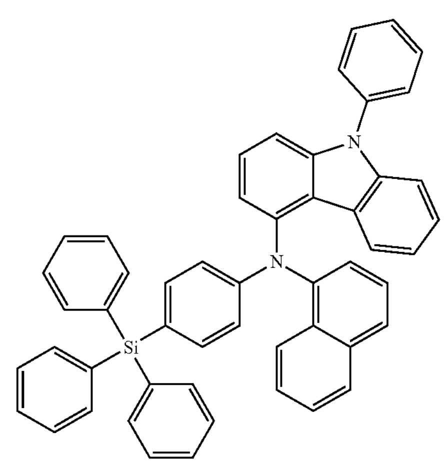

-continued
A2
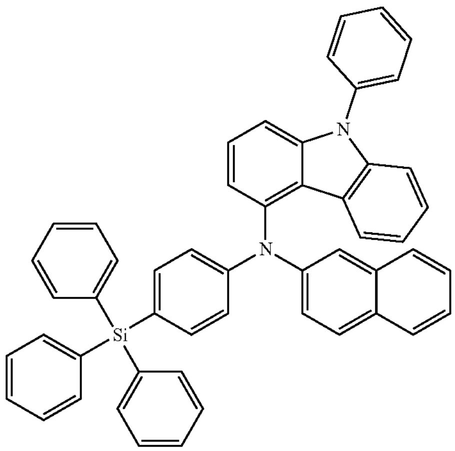
A3
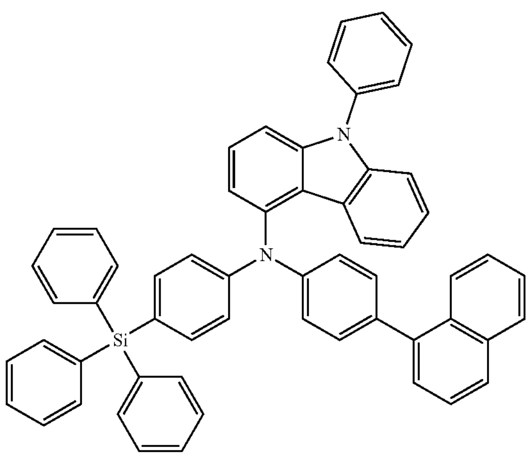
A4
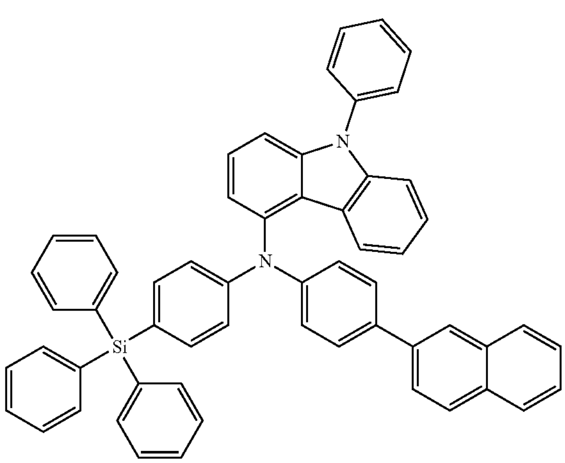
-continued
A5
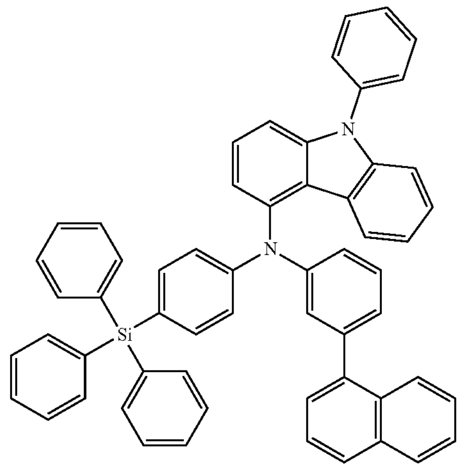
A6
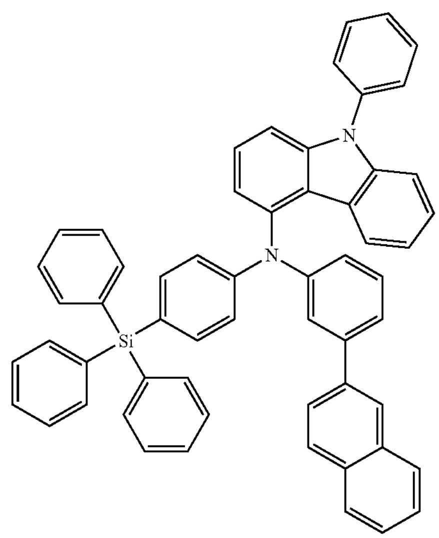
A7
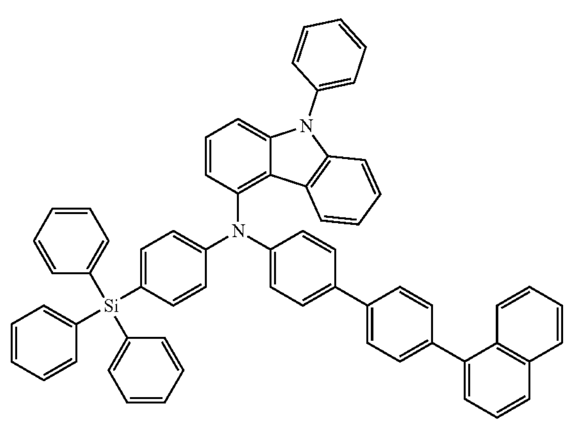

-continued
A8
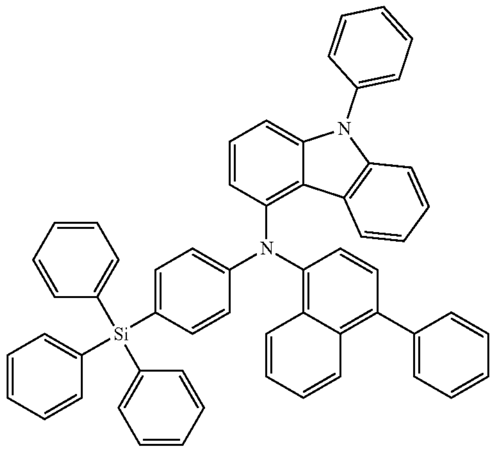
A9
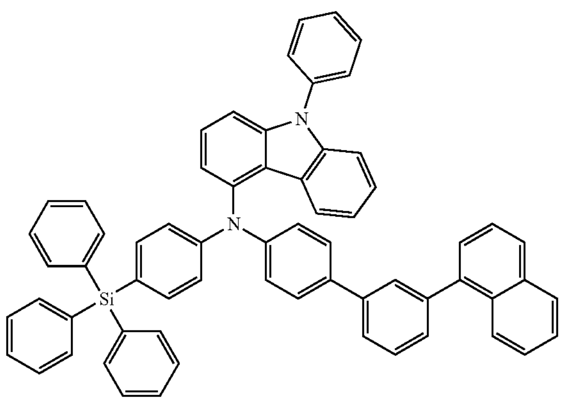
A10
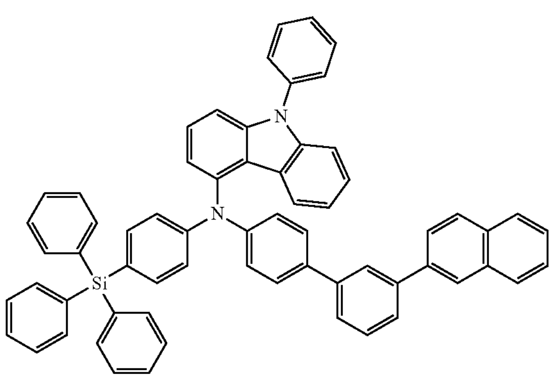
-continued
A11
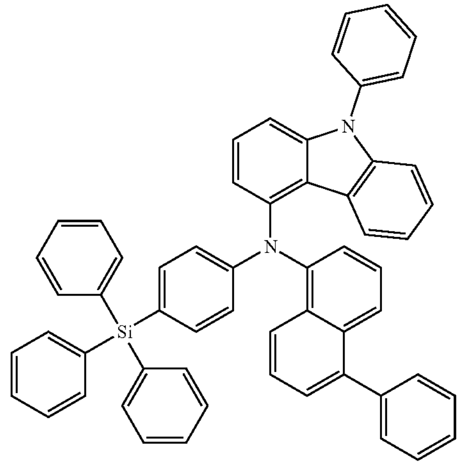
A12
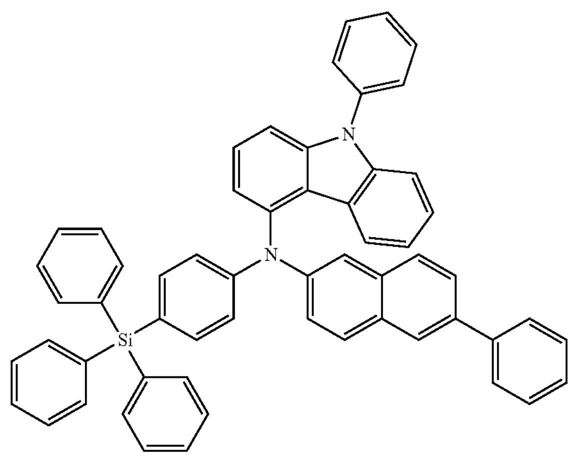
A13
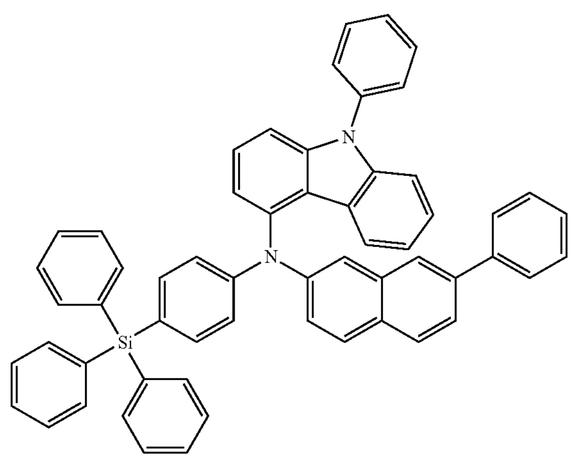

-continued
A14
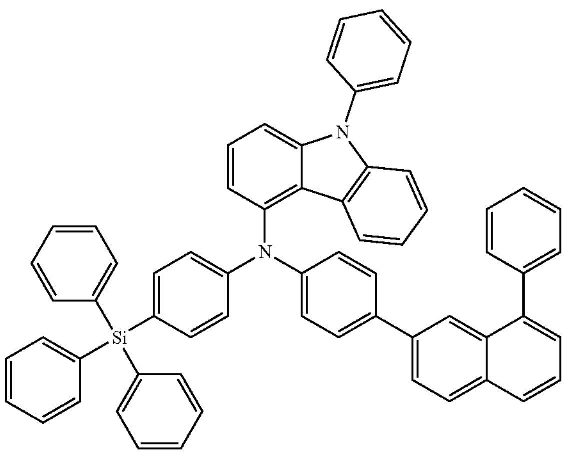
A15
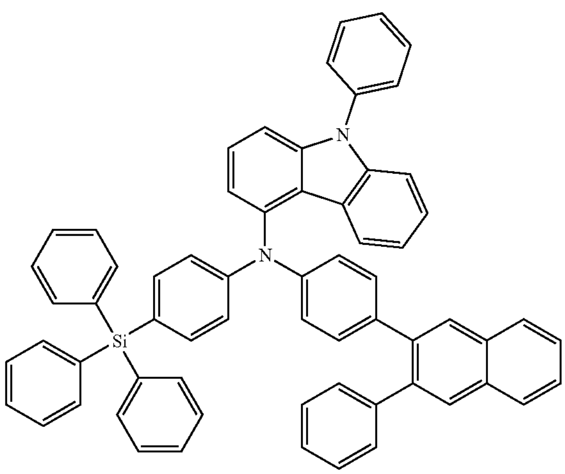
A16
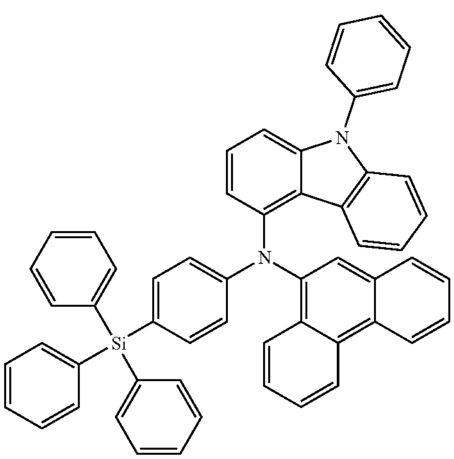
-continued
A17
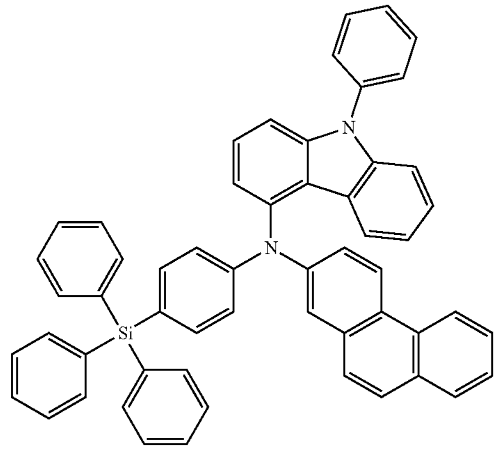
A18
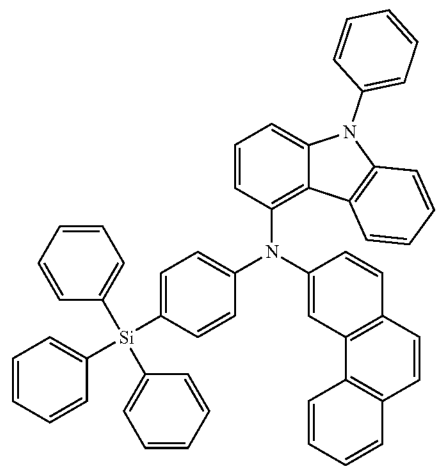
A19
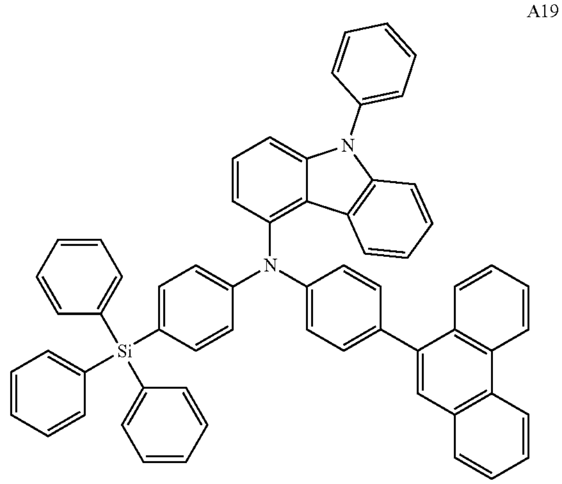

-continued
A20
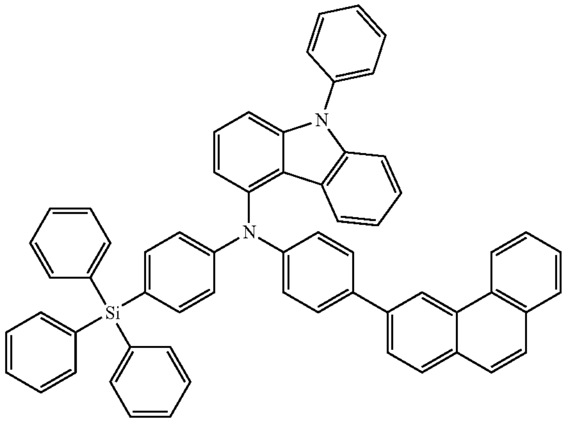
A21
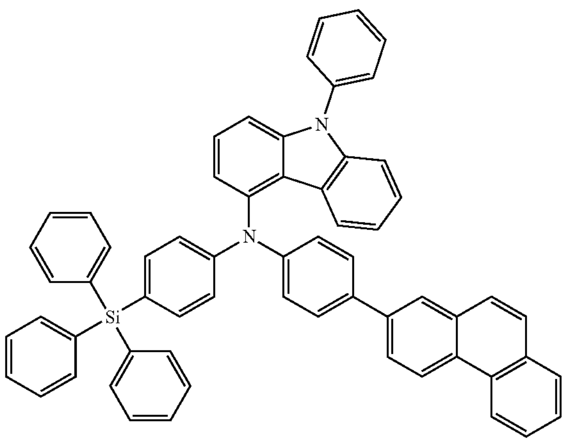
A22
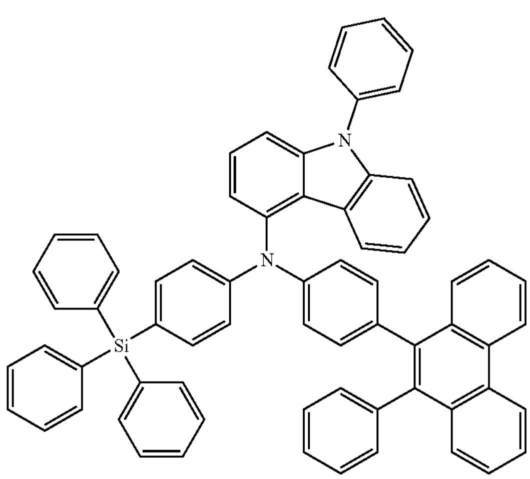
-continued
A23
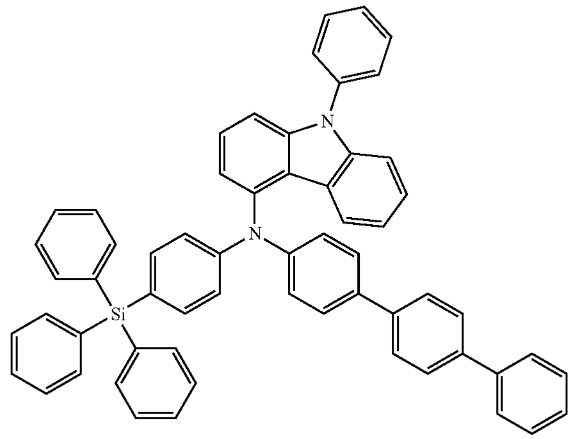
A24
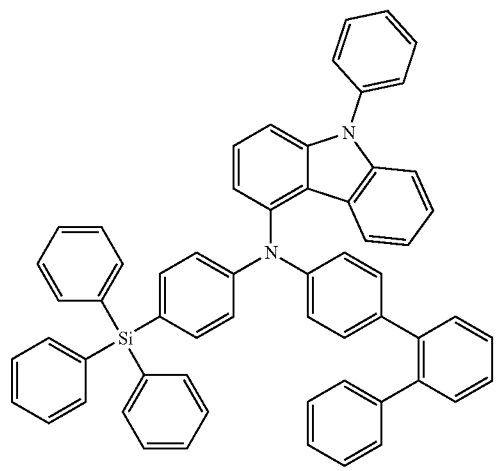
A25
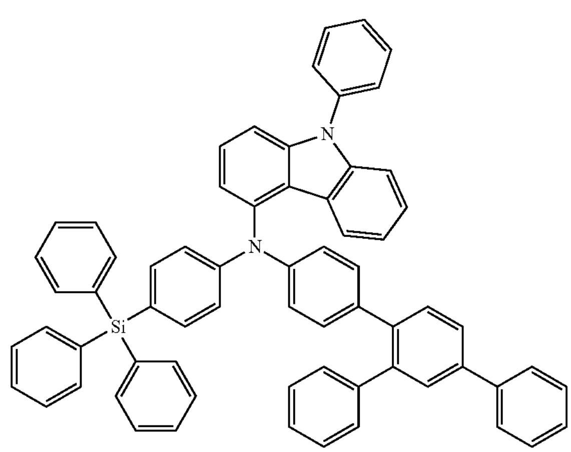

-continued
A26
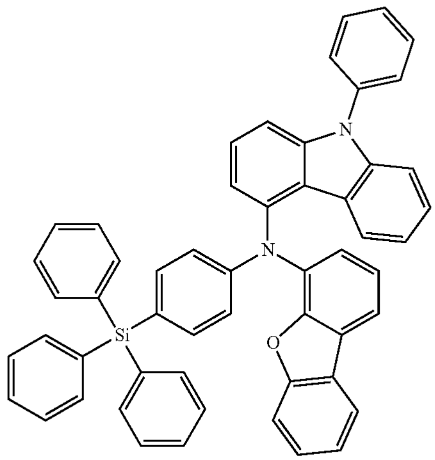
A27
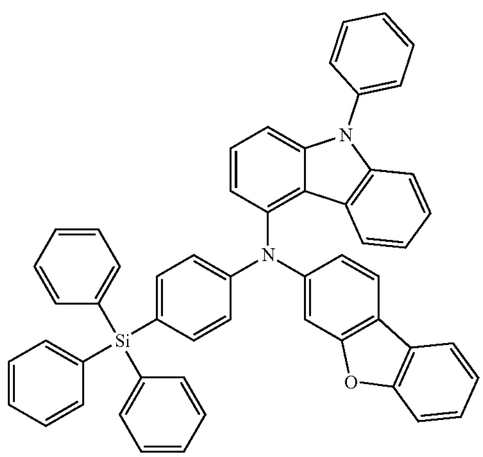
A28
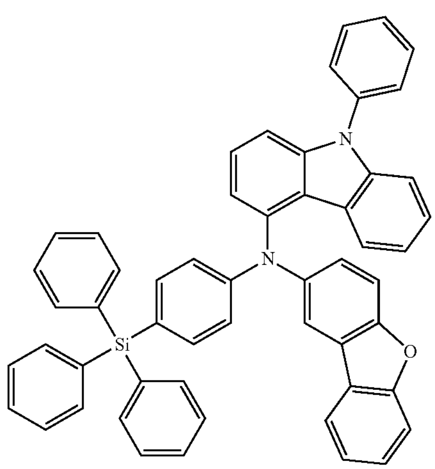
-continued
A29
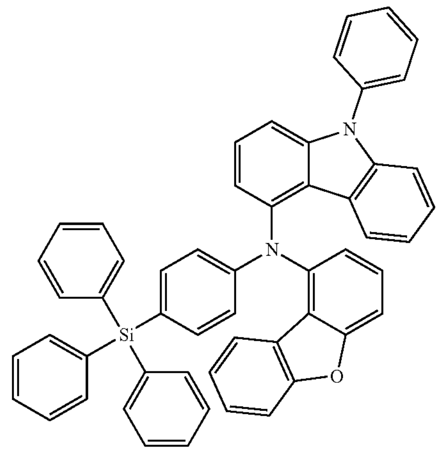
A30
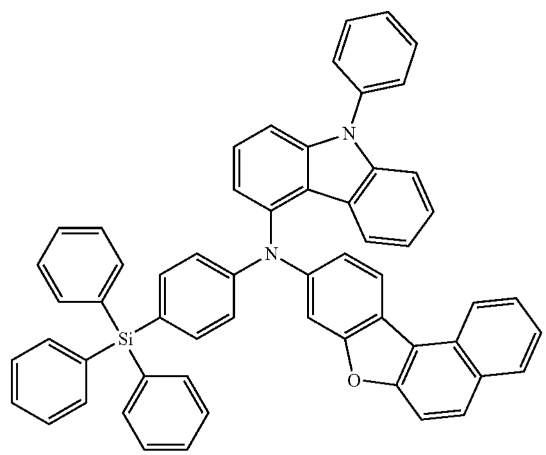
A31
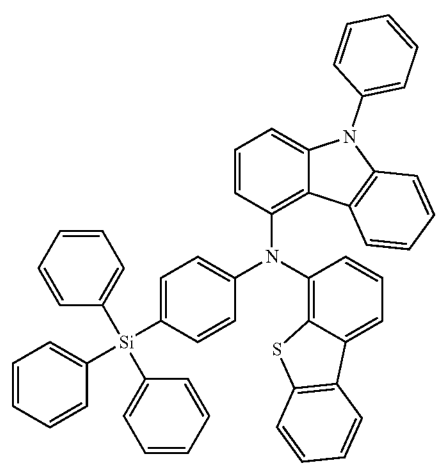

A32
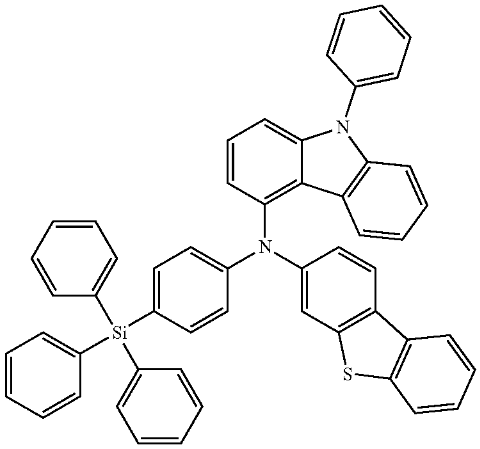
A33
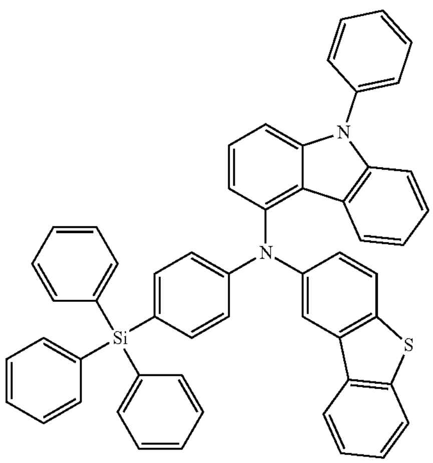
A34
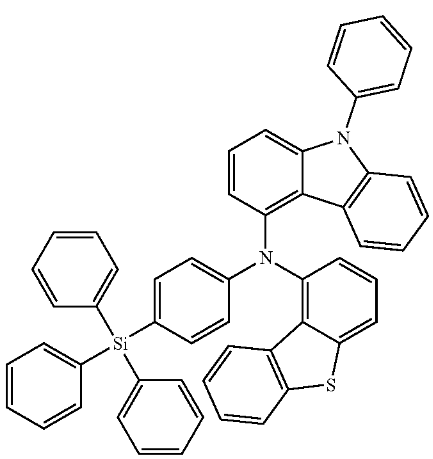
A35
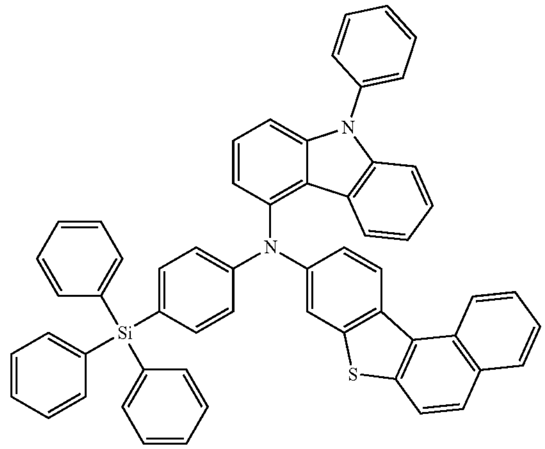
A36
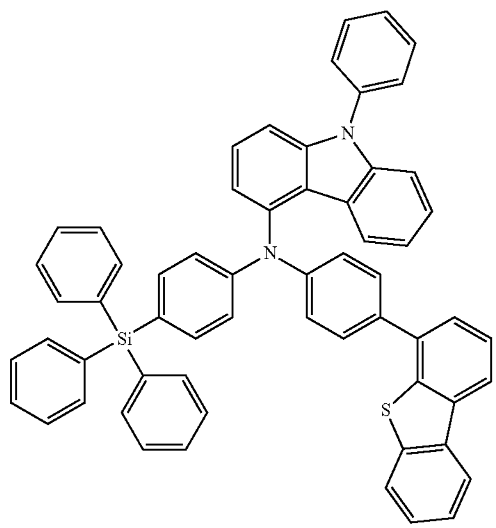
A37
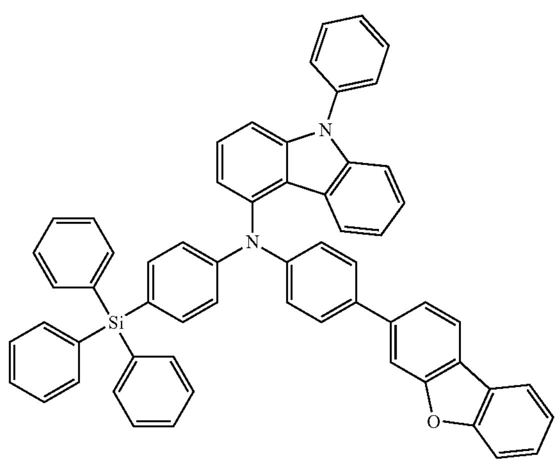

-continued
A38
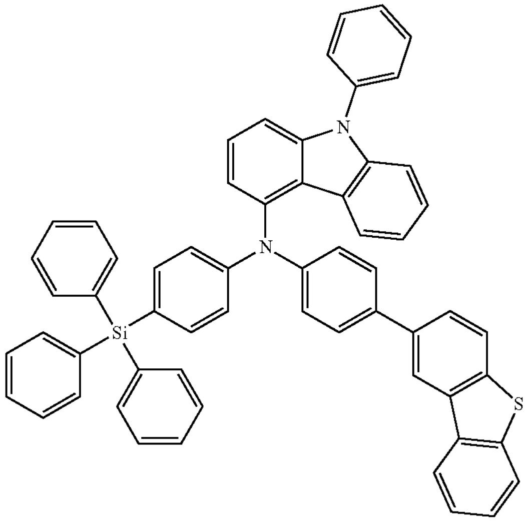
A39
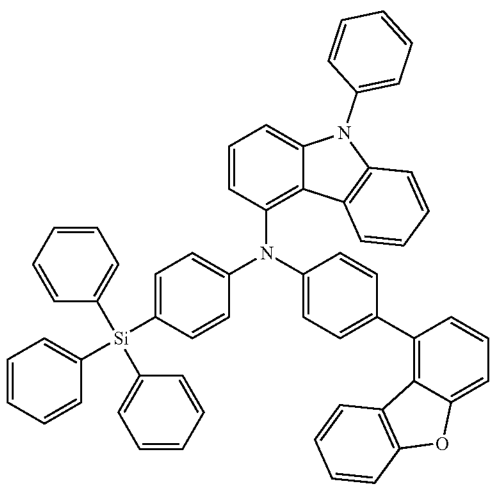
A40
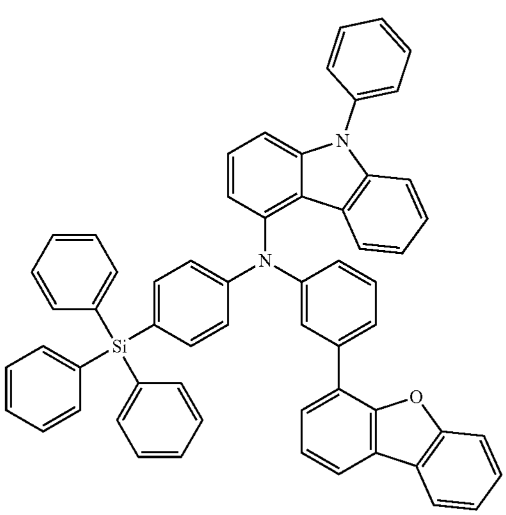
-continued
A41
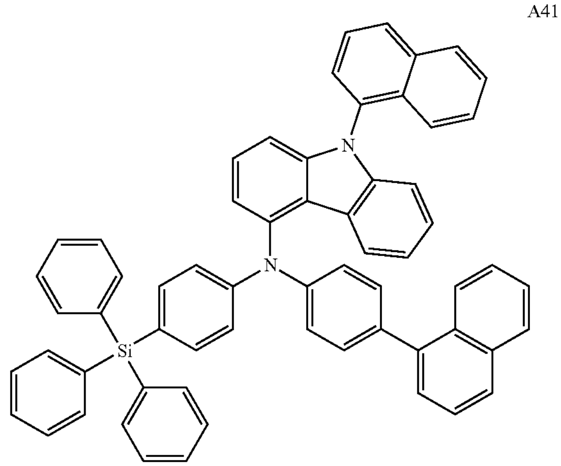
A42
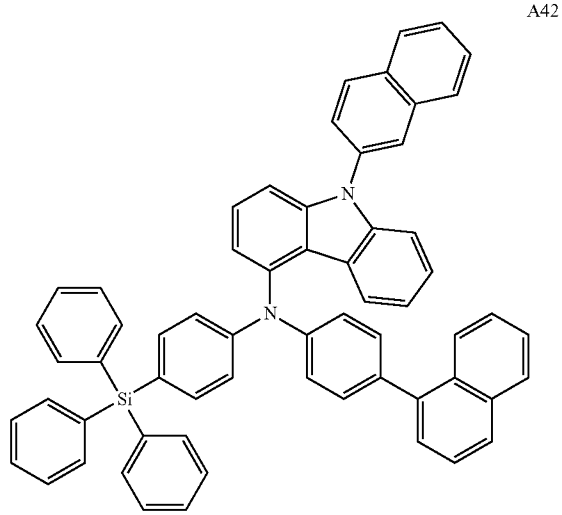
A43
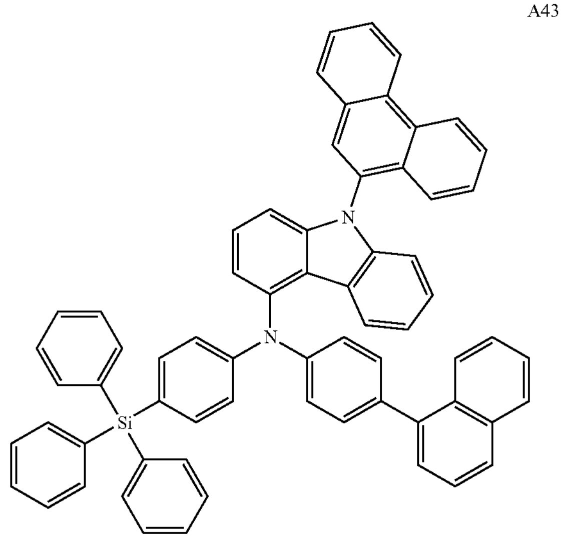

-continued
A44
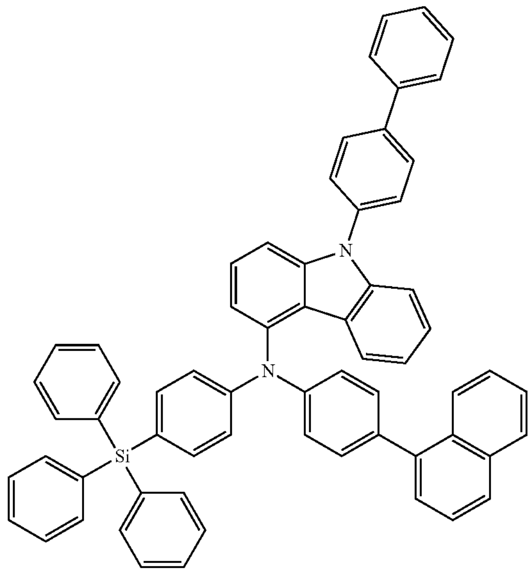
A45
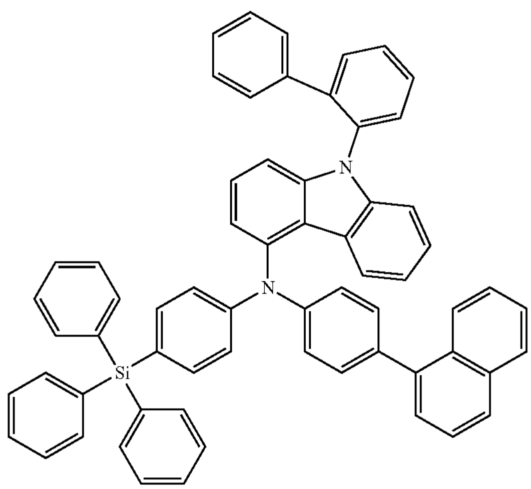
A46
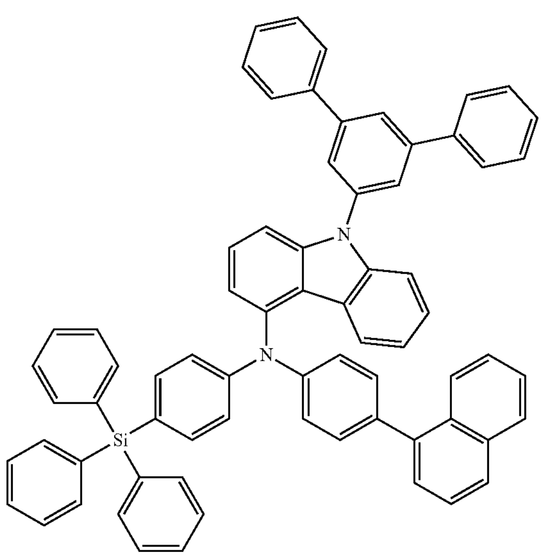
-continued
A47
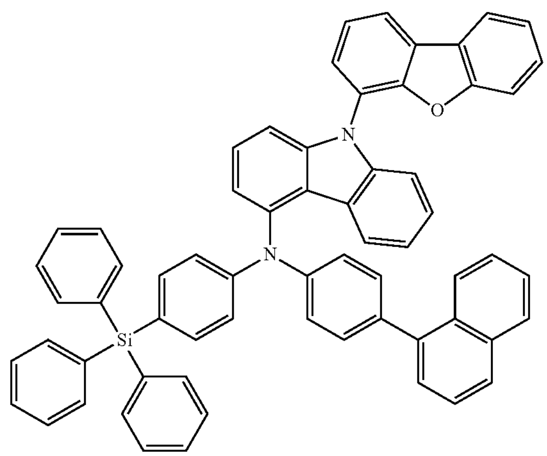
A48
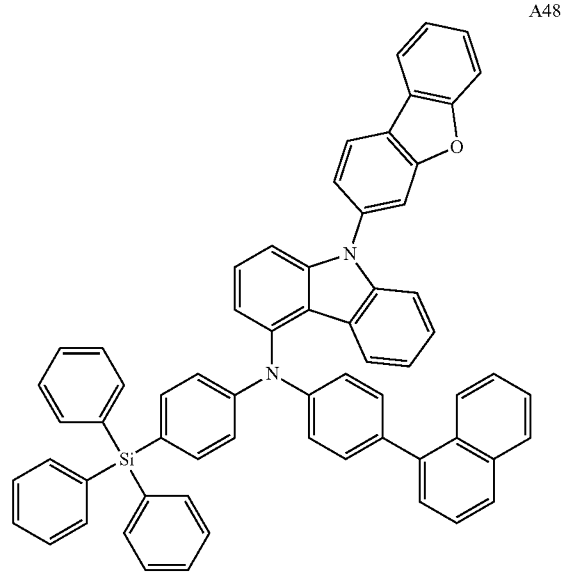
A49
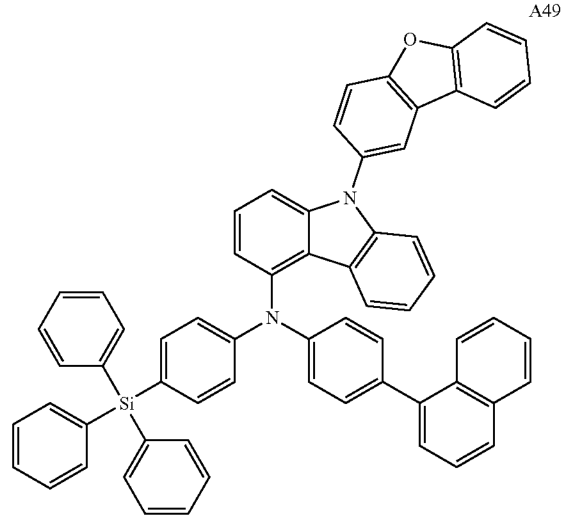

-continued
A50
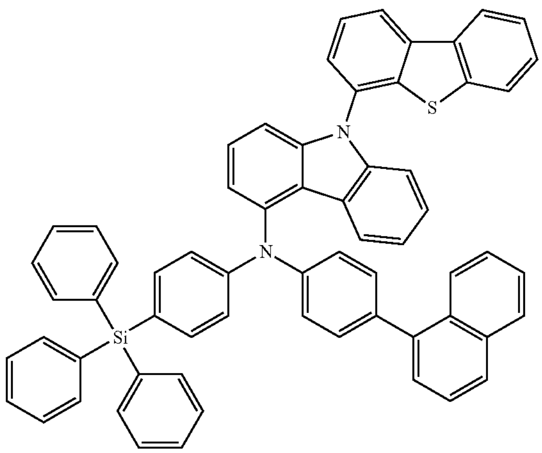
A51
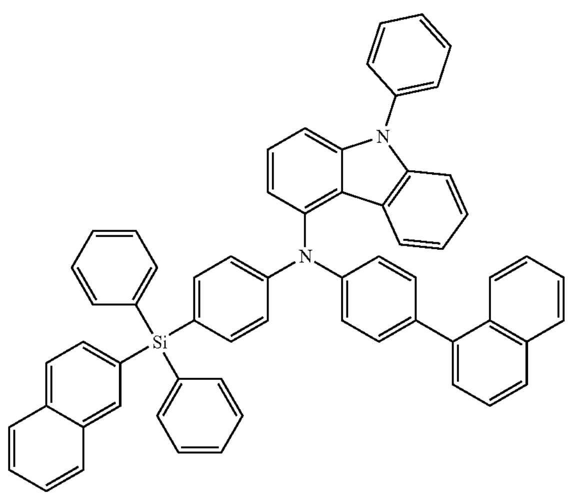
A52
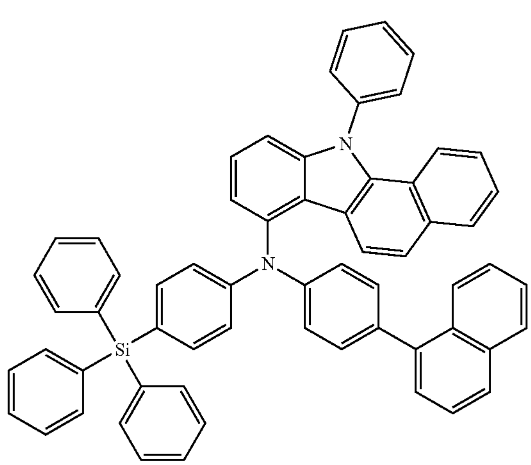
-continued
A53
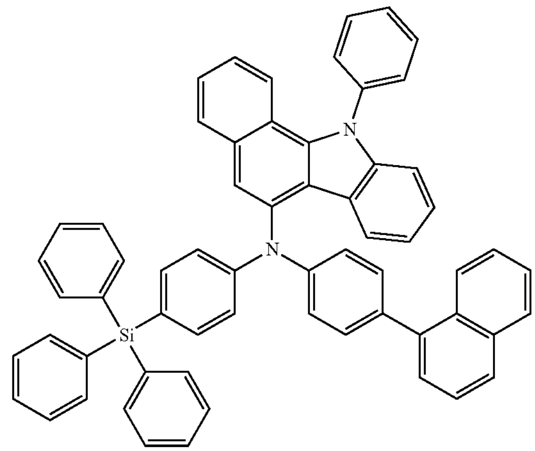
A54
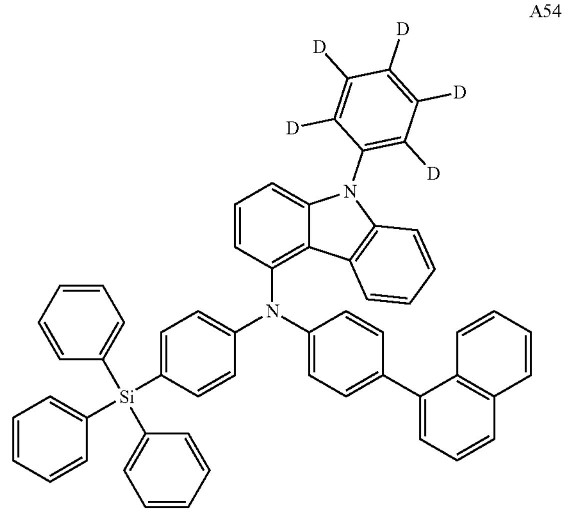
A55
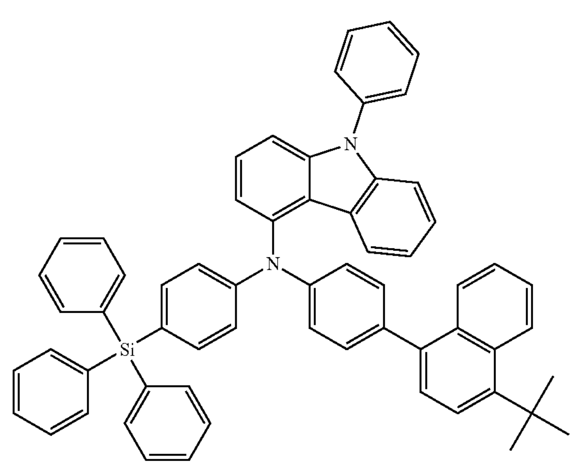

-continued
A56
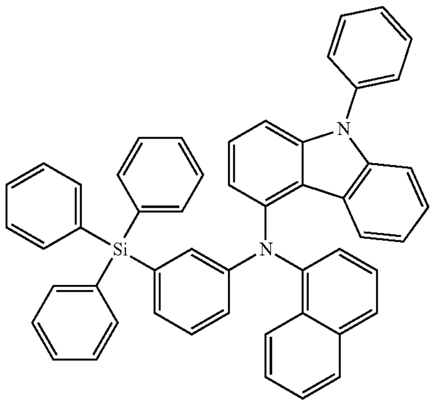
A57
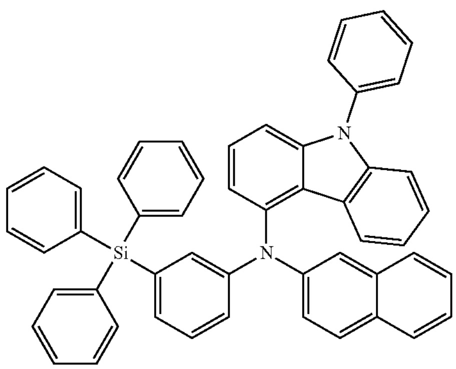
A58
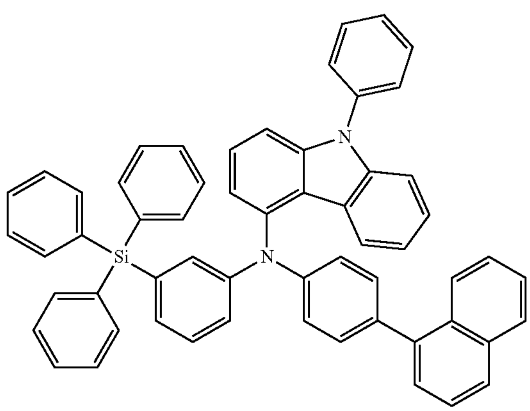
A59
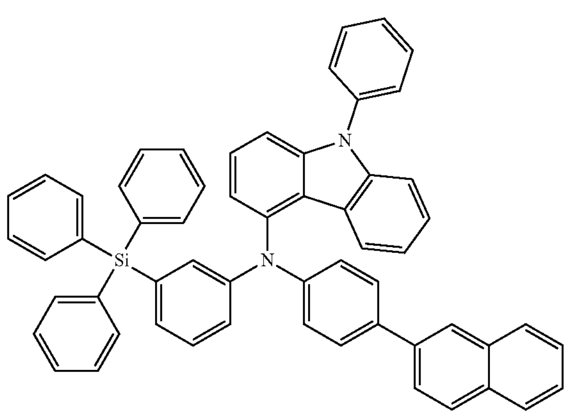
-continued
A60
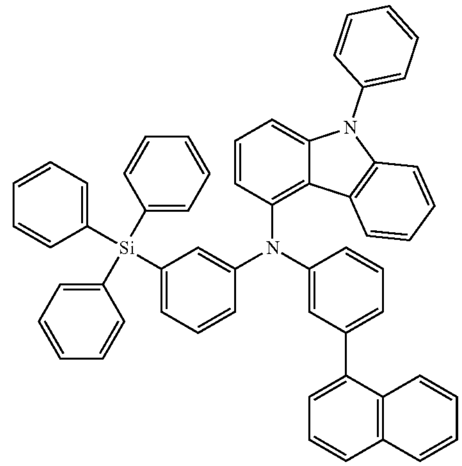
A61
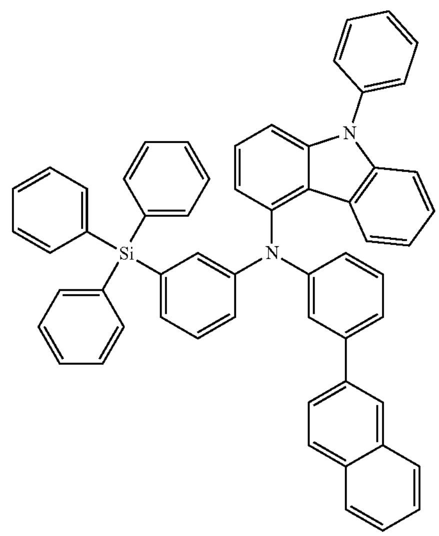
A62
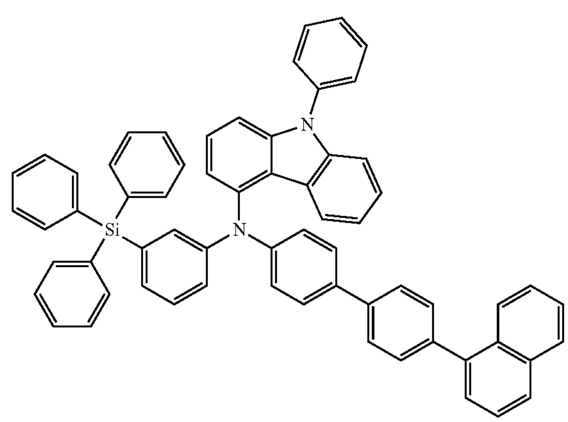

-continued
A63
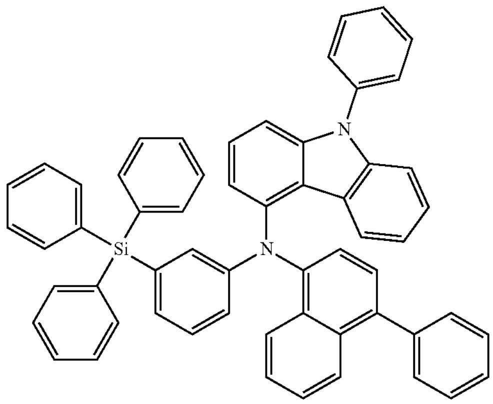
A64
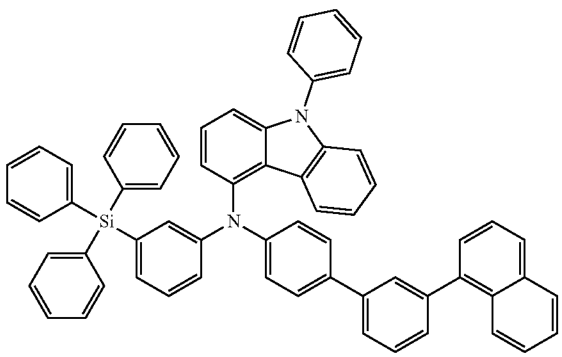
A65
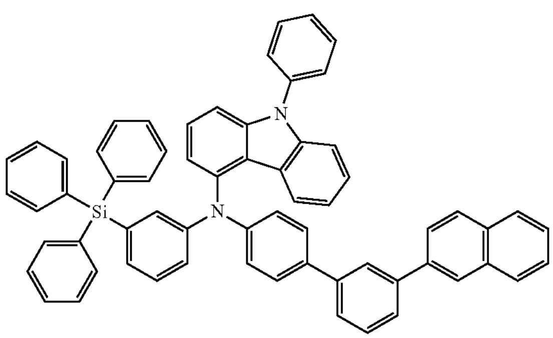
A66
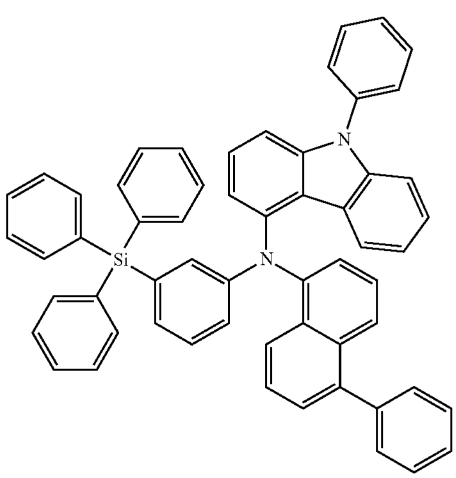
-continued
A67
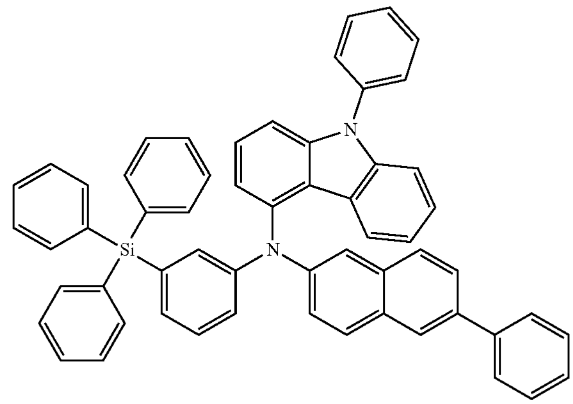
A68
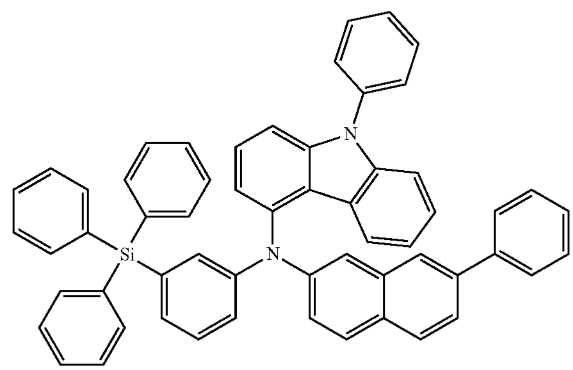
A69
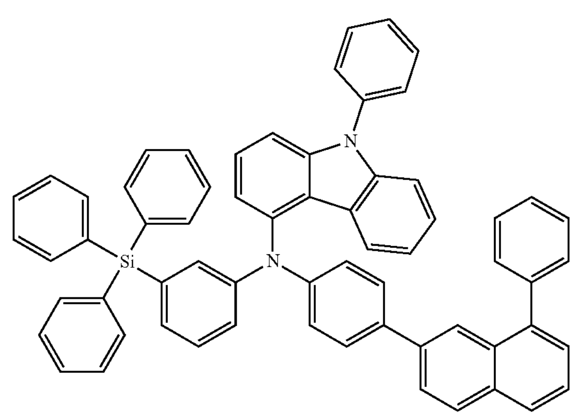

-continued
A70
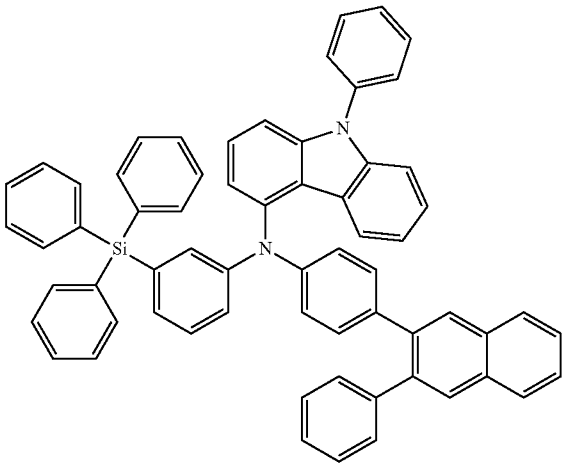
A71
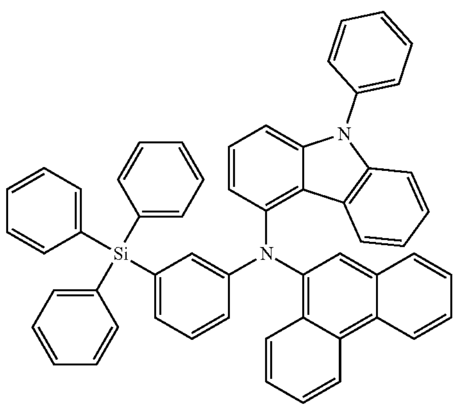
A72
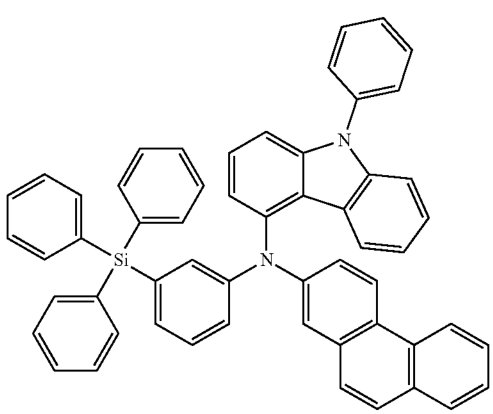
-continued
A73
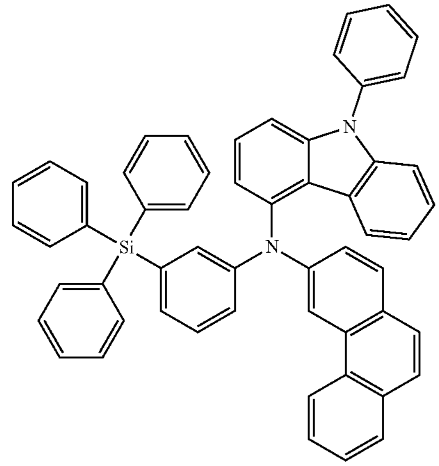
A74
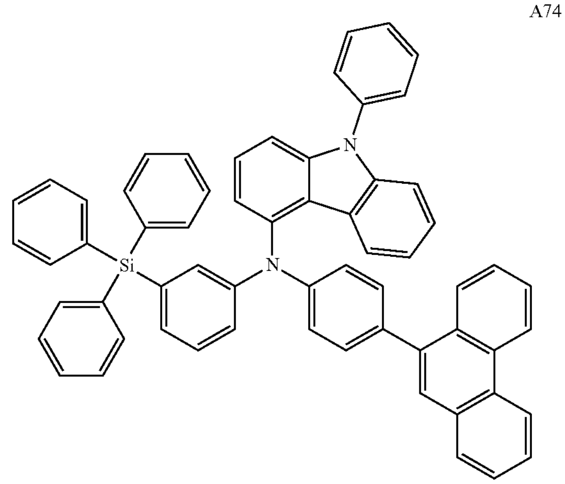
A75
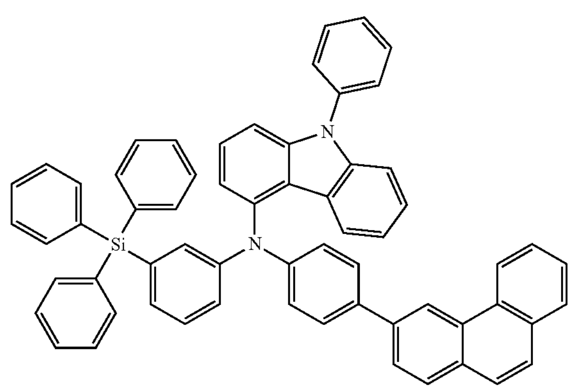

-continued
A76
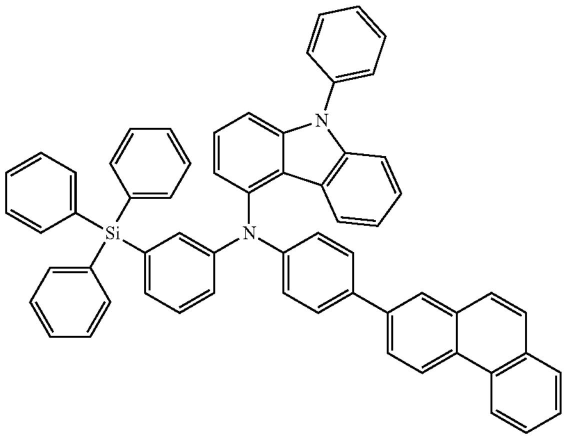
A77
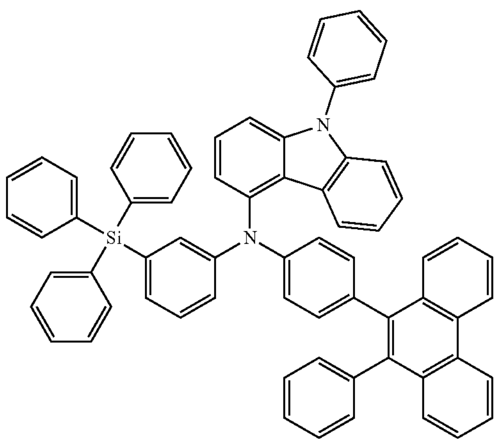
A78
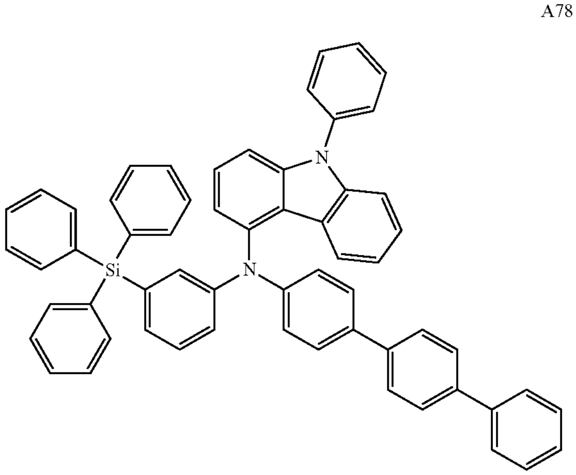
-continued
A79
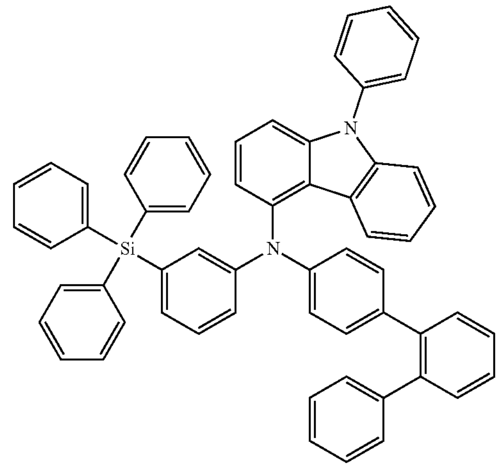
A80
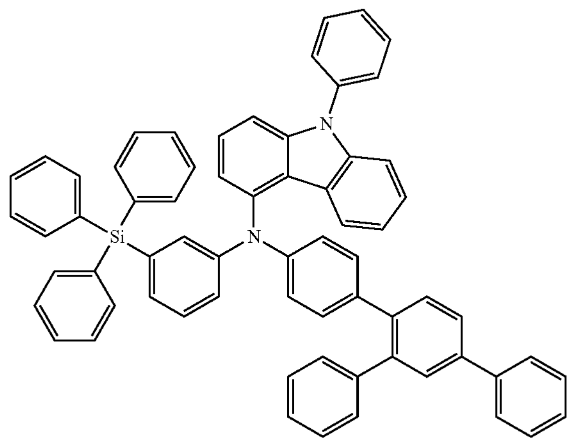
A81
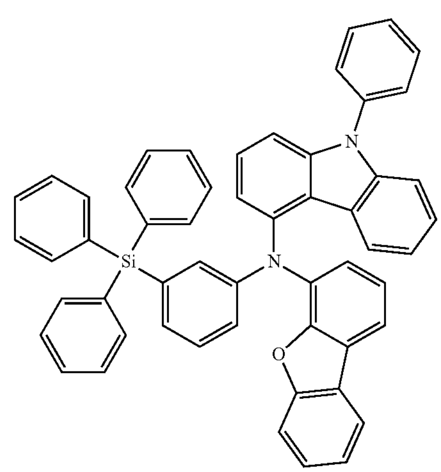

A82
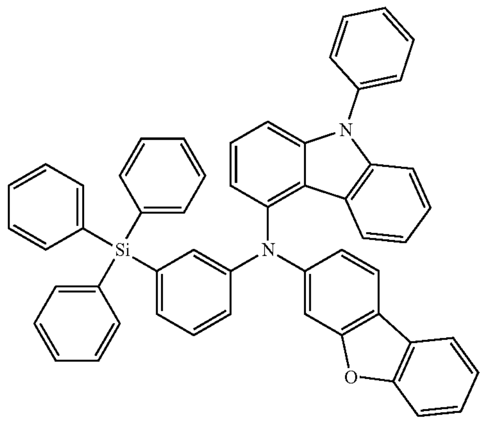
A83
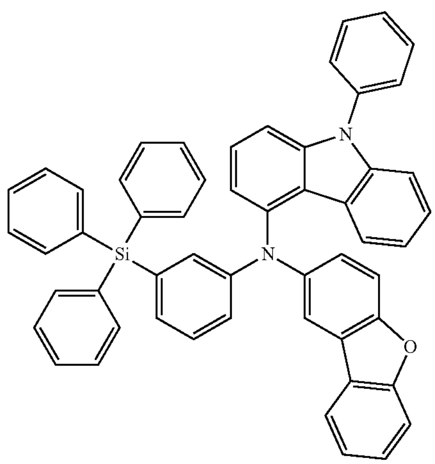
A84
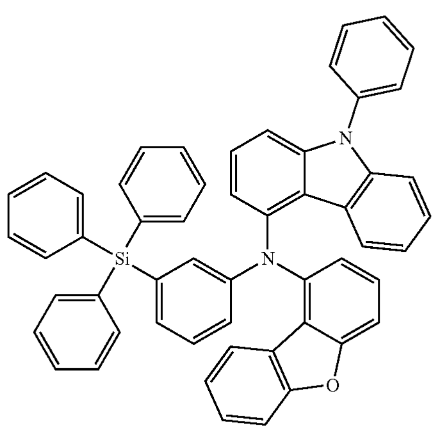
A85
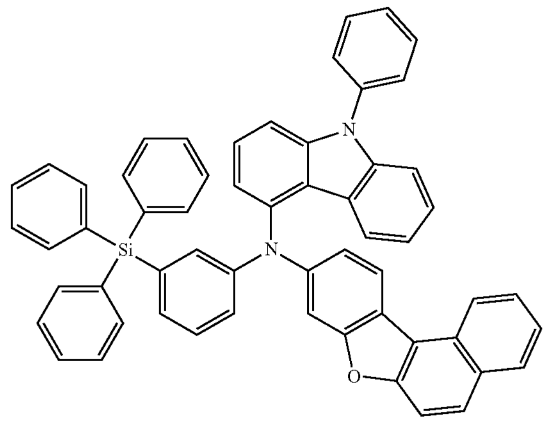
A86
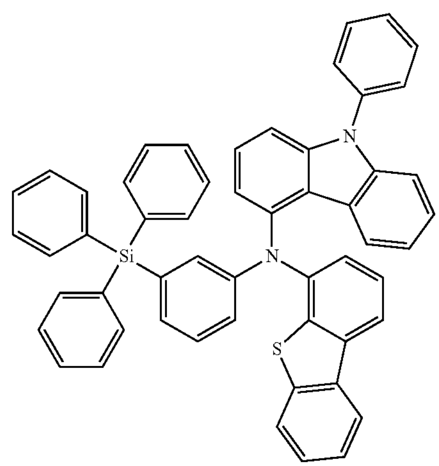
A87
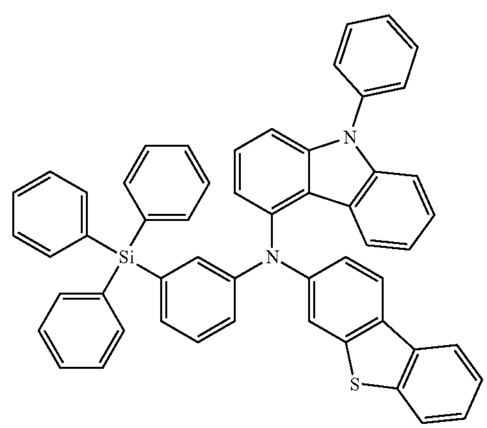

-continued
A88
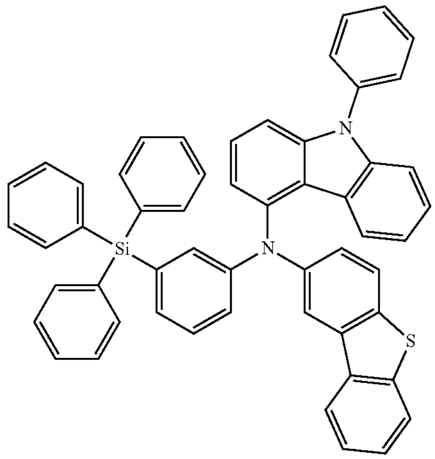
A89
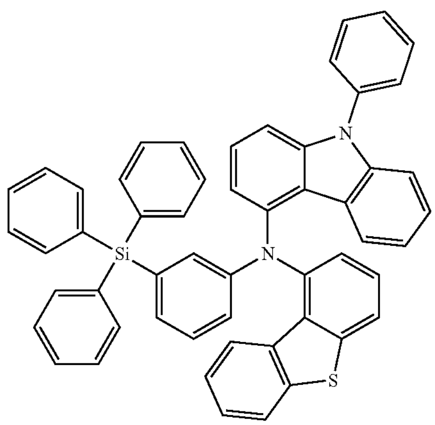
A90
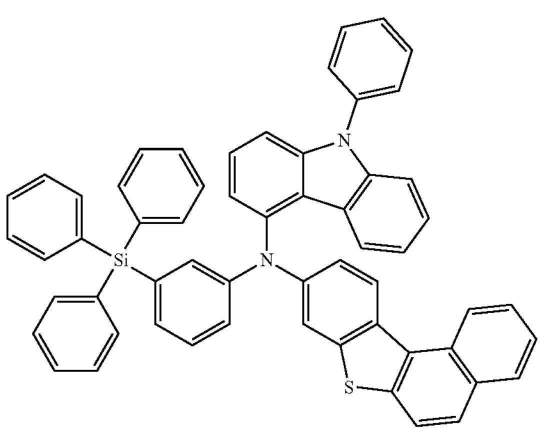
-continued
A91
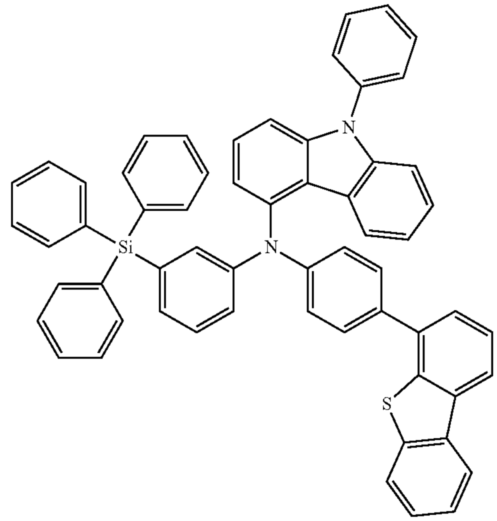
A92
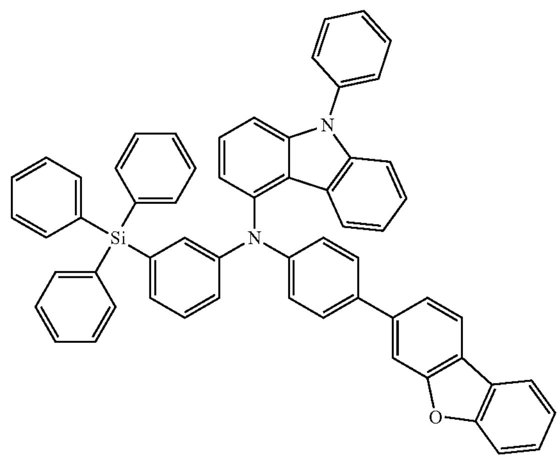
A93
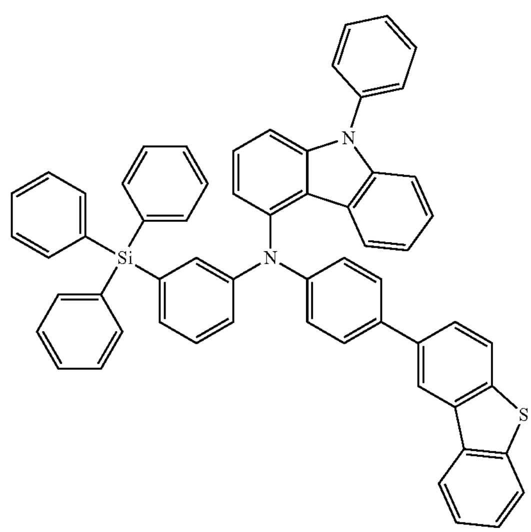

-continued
A94
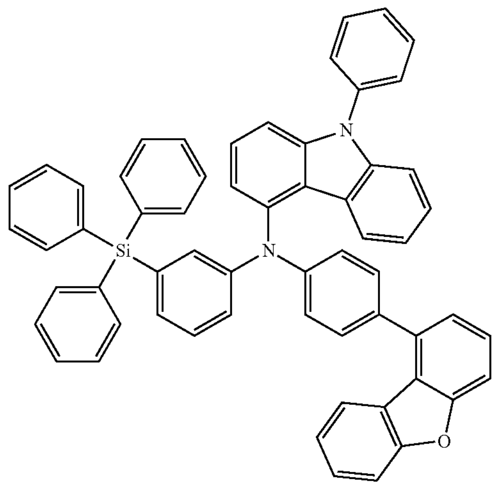
A95
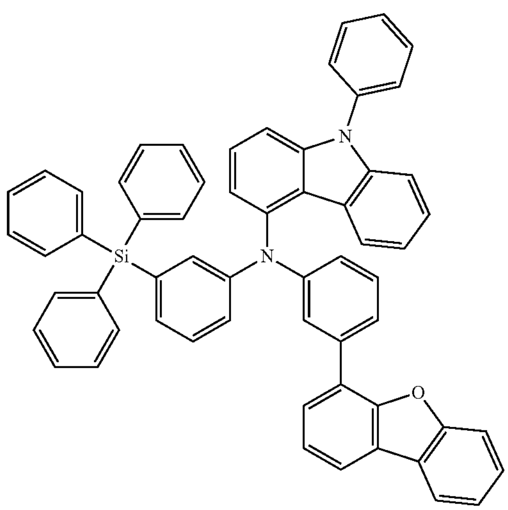
A96
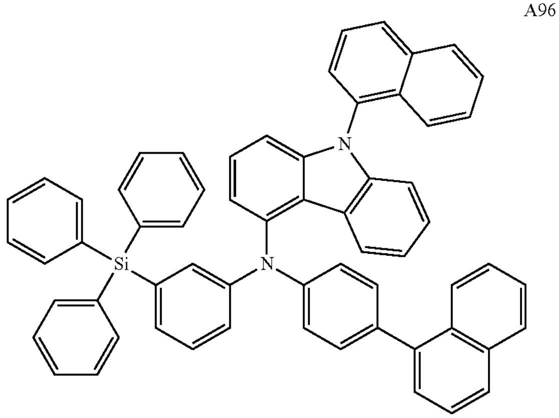
-continued
A97
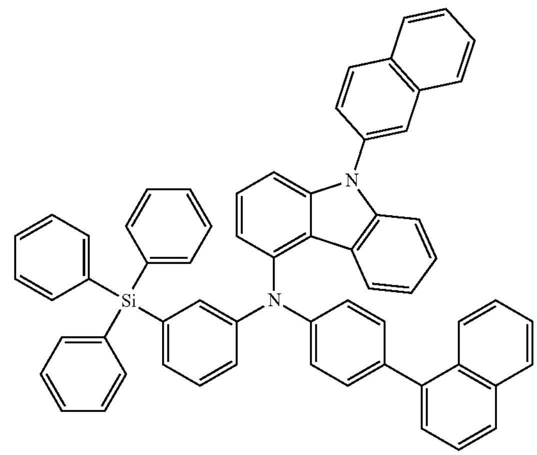
A98
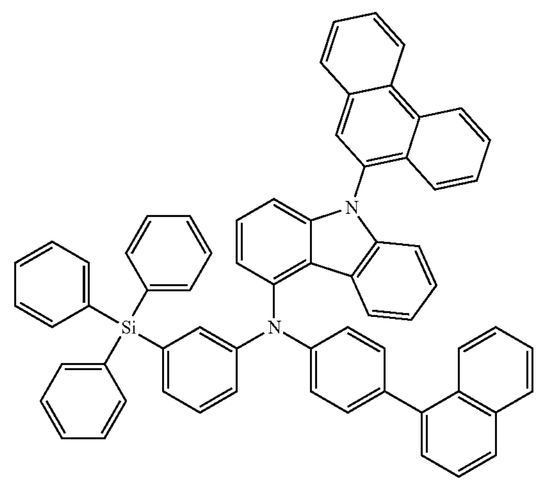
A99
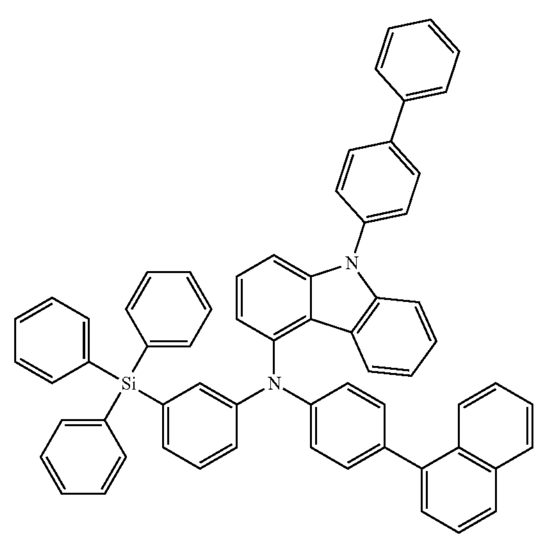

-continued
A100
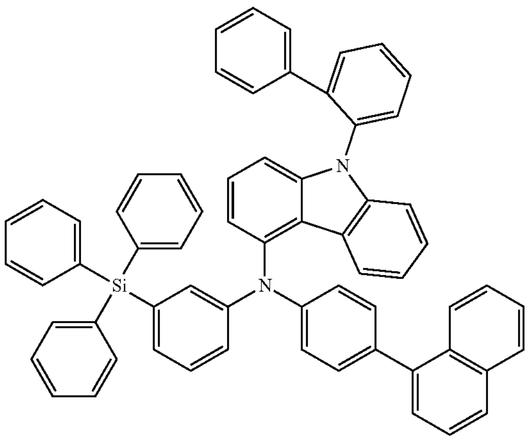
A101
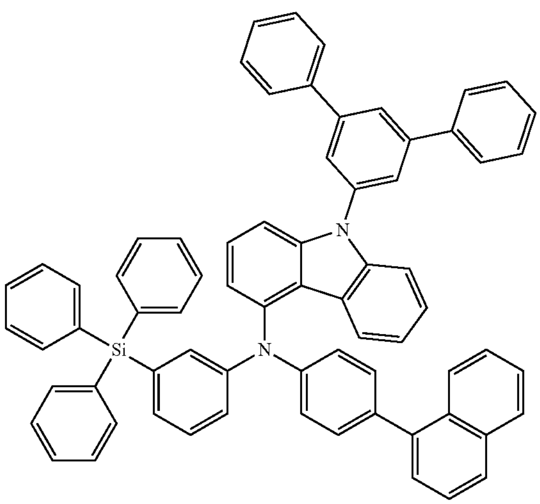
A102
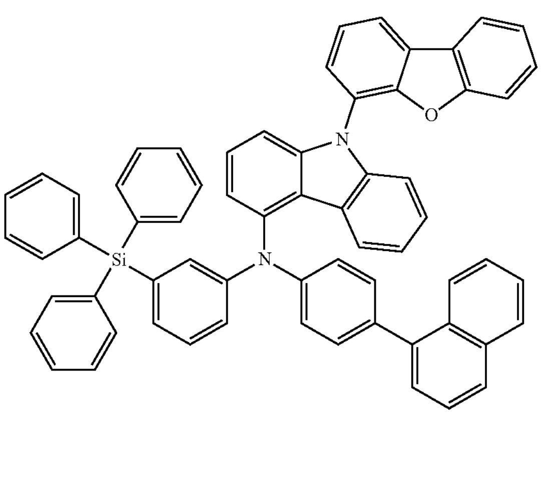
-continued
A103
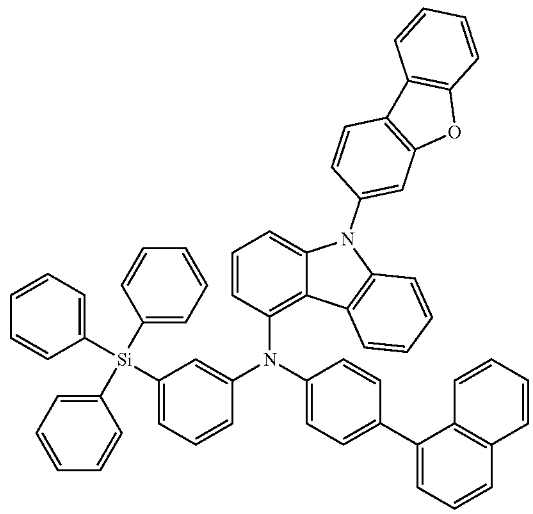
A103
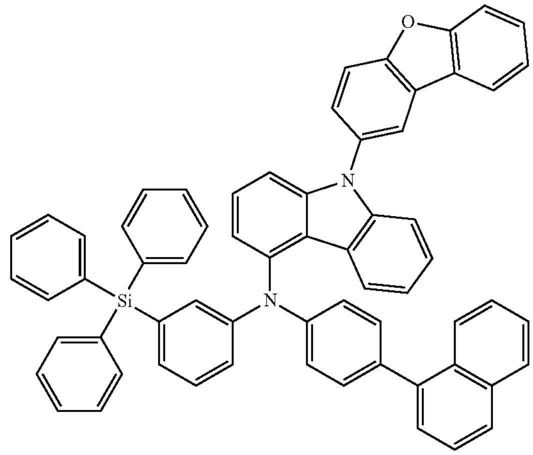
A105
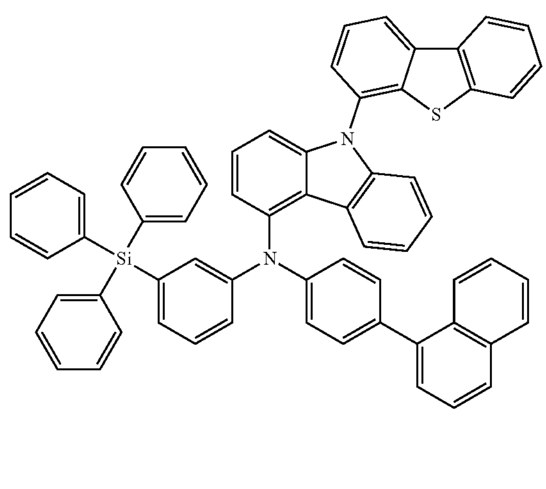

-continued
A106
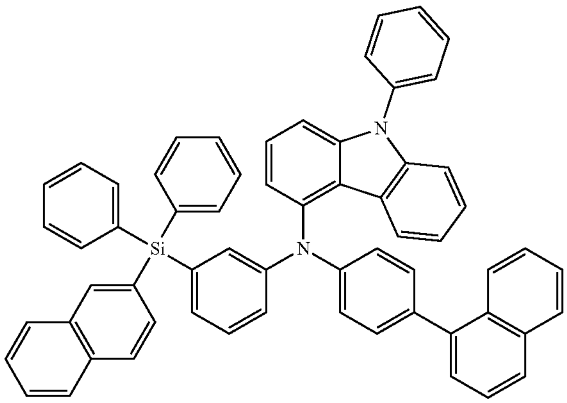
A107
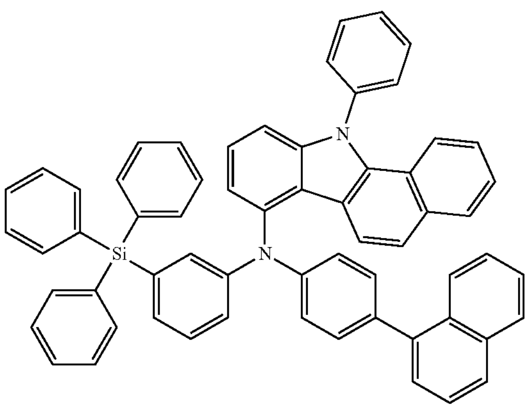
A108
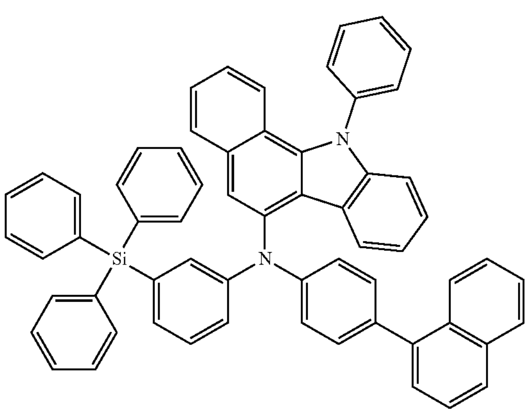
-continued
A109
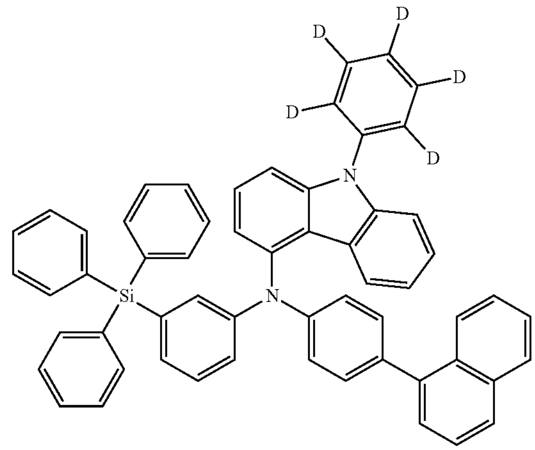
A110
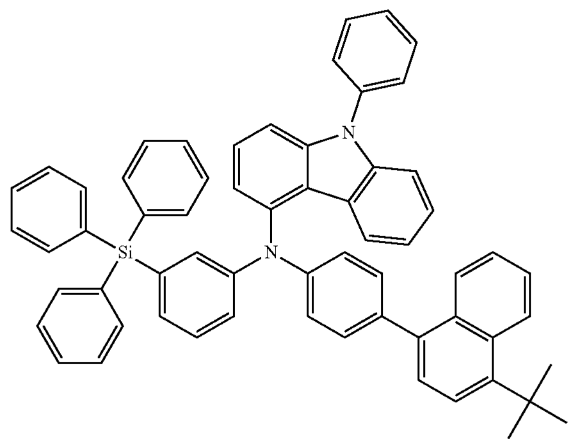
A111
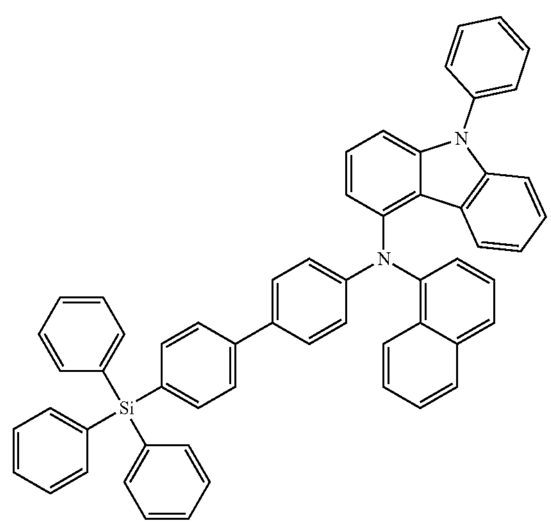

-continued
A112
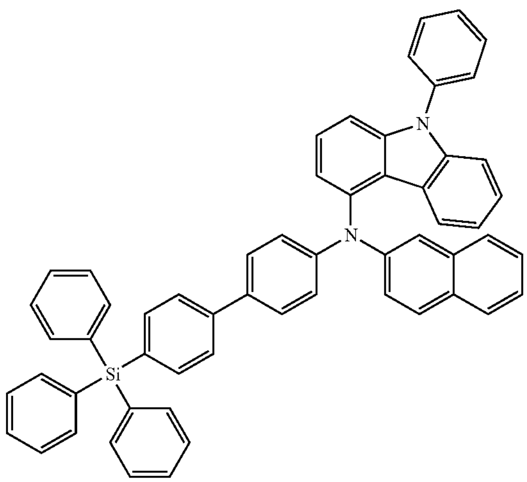
A113
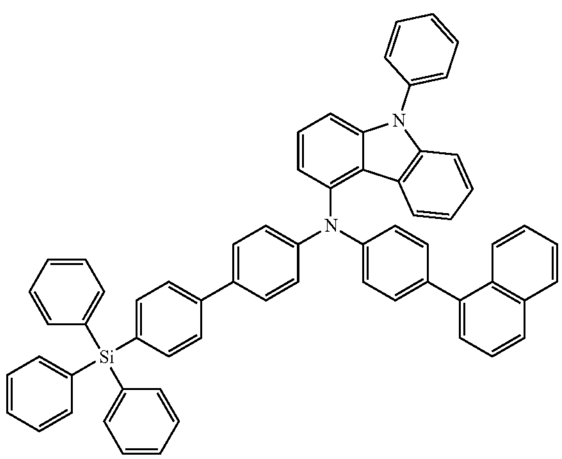
A114
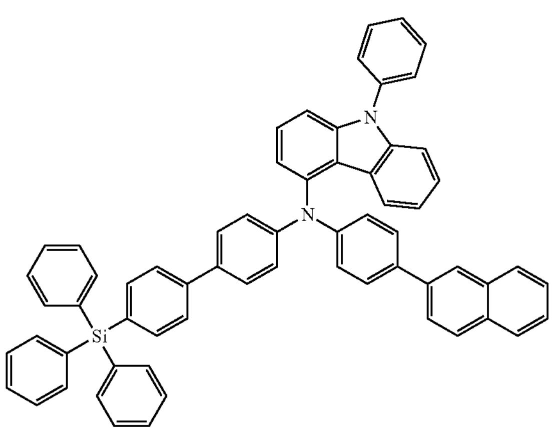
-continued
A115
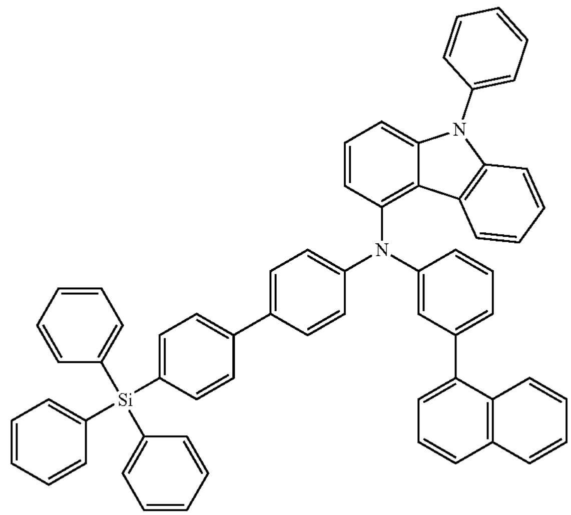
A116
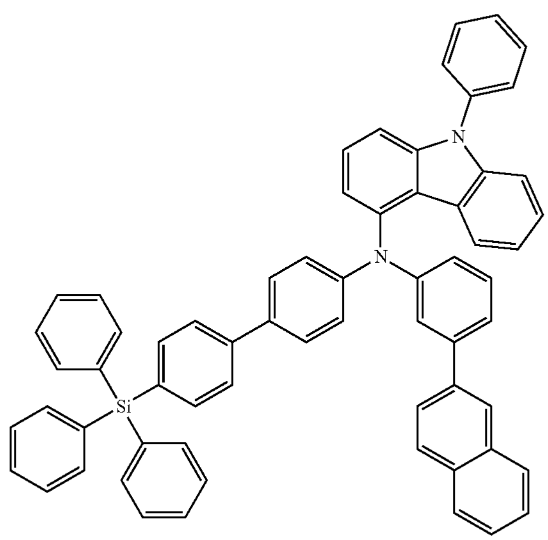
A117
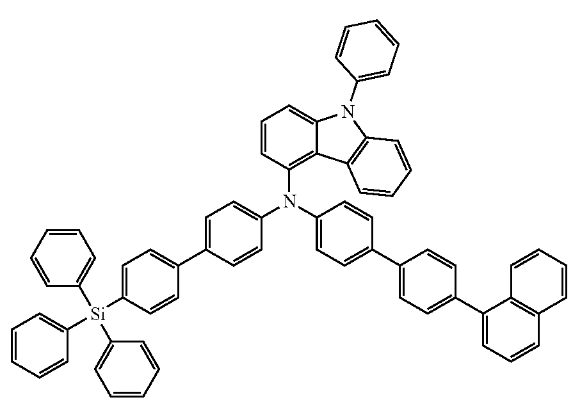

A118
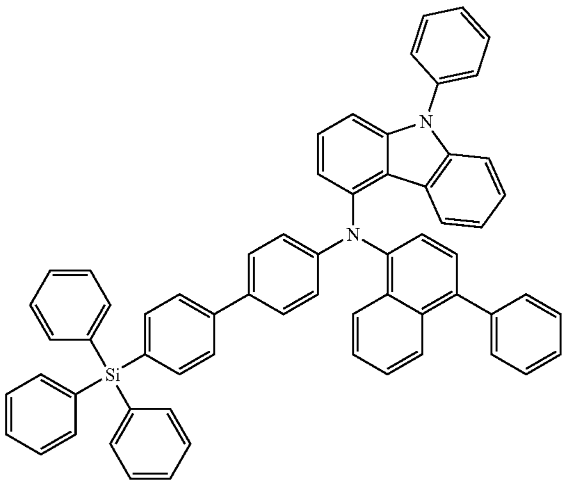
A119
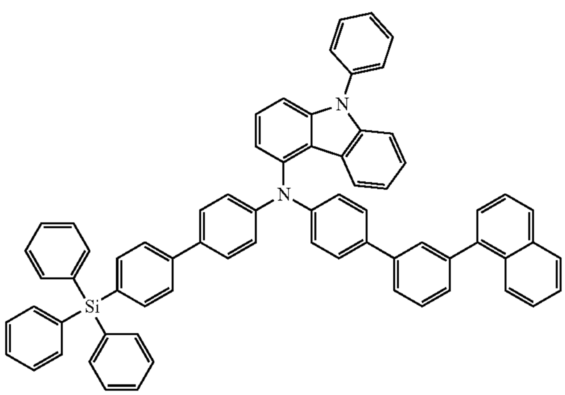
A120
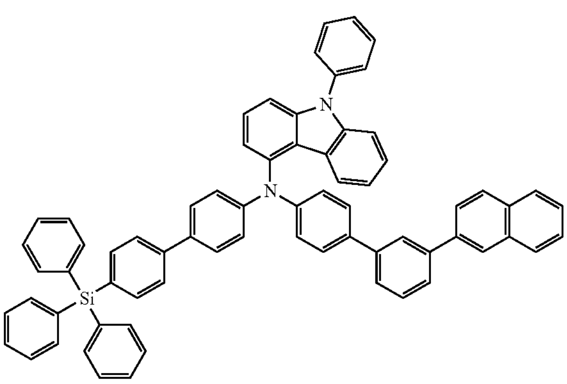
A121
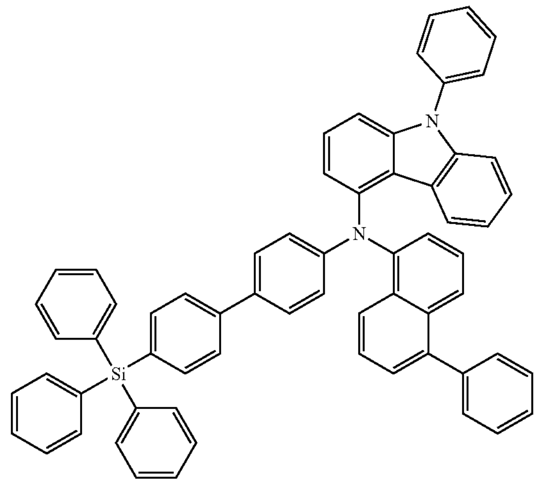
A122
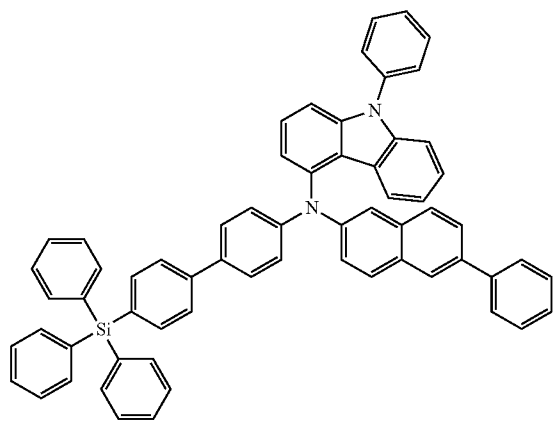
A123
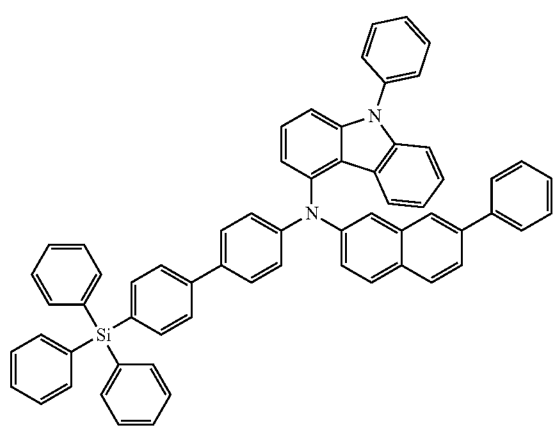

A124
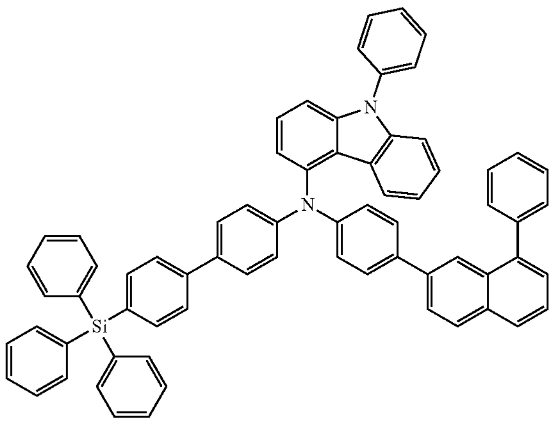
A125
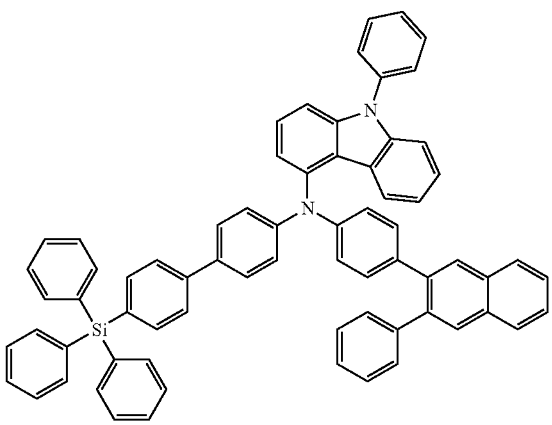
A126
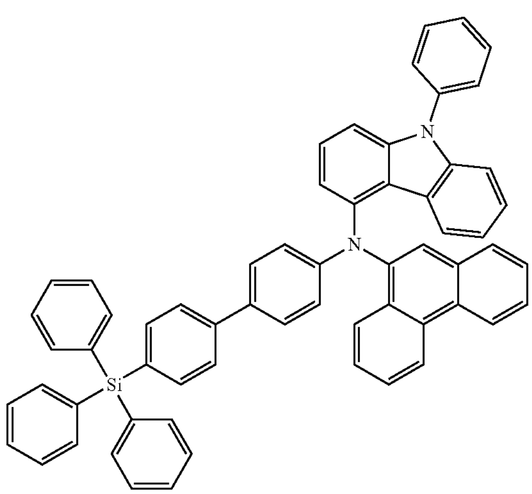
A127
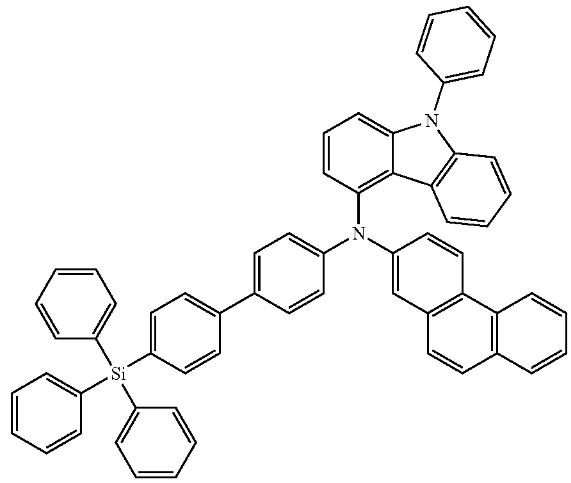
A128
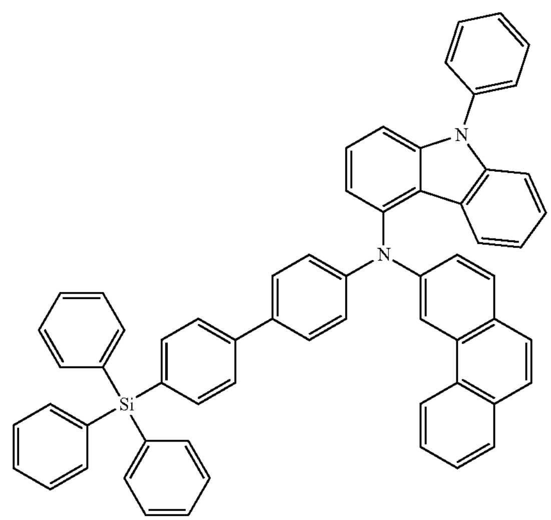
A129
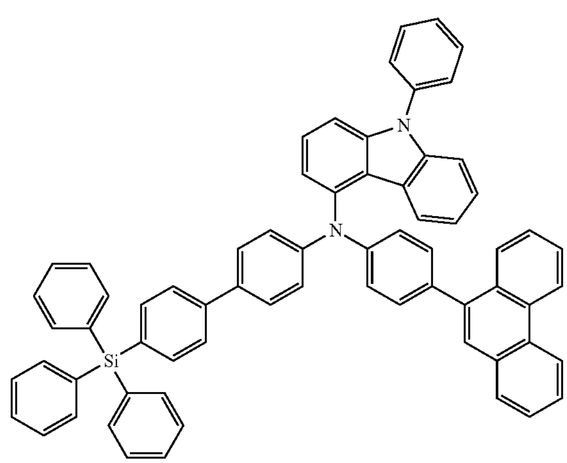

-continued
A130
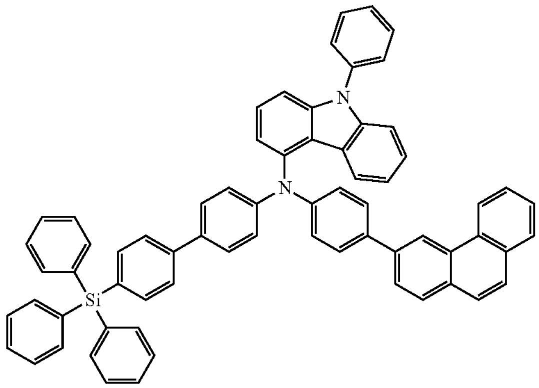
A131
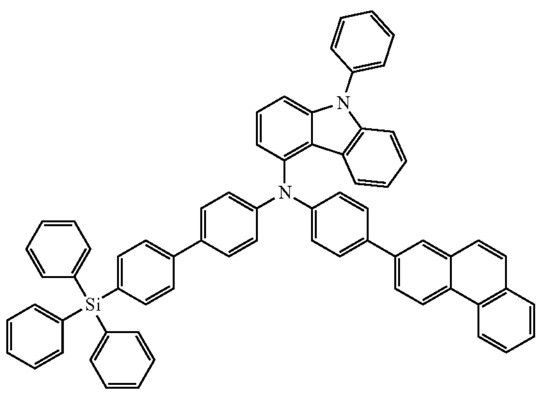
A132
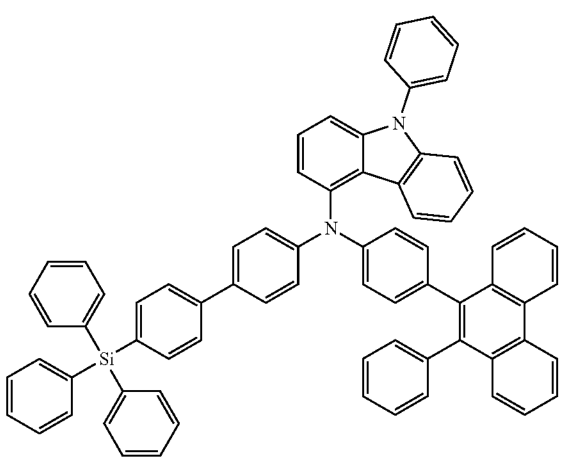
-continued
A133
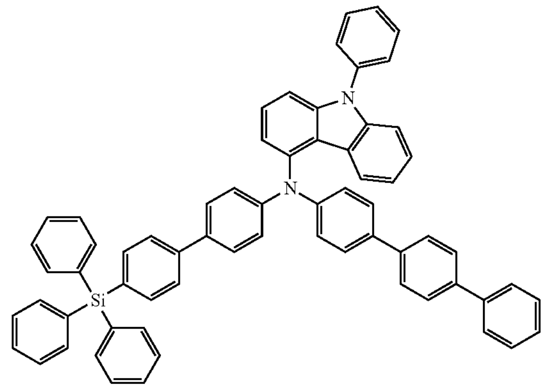
A134
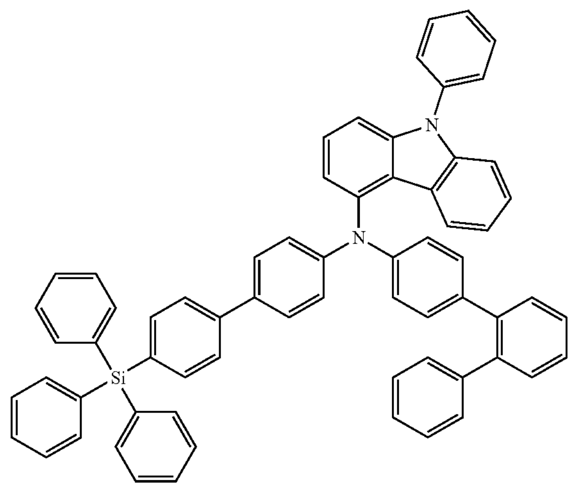
A135
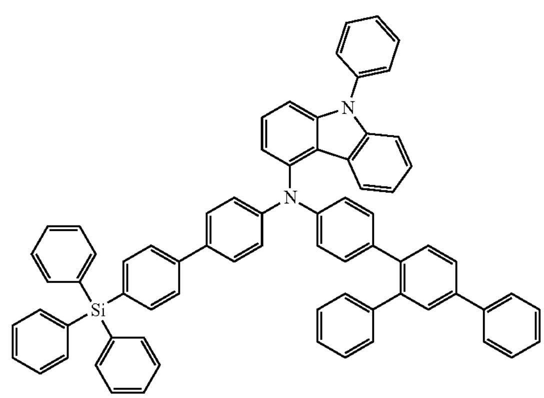

-continued
A136
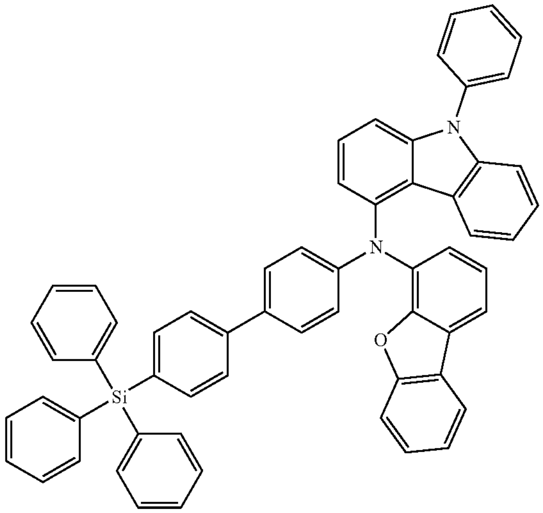
A137
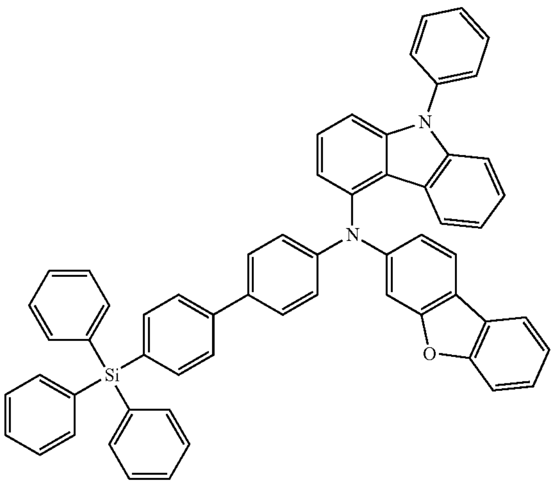
A138
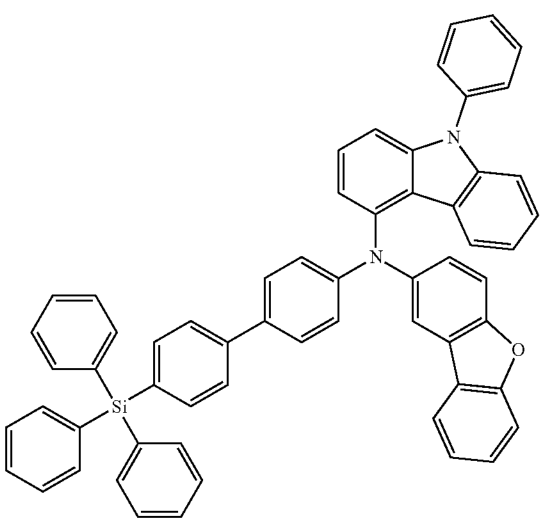
-continued
A139
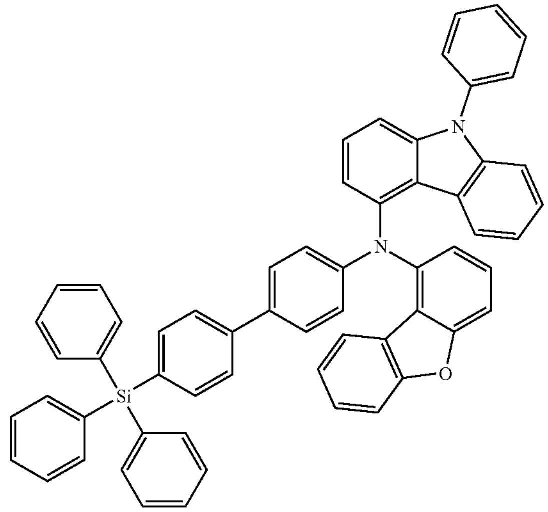
A140
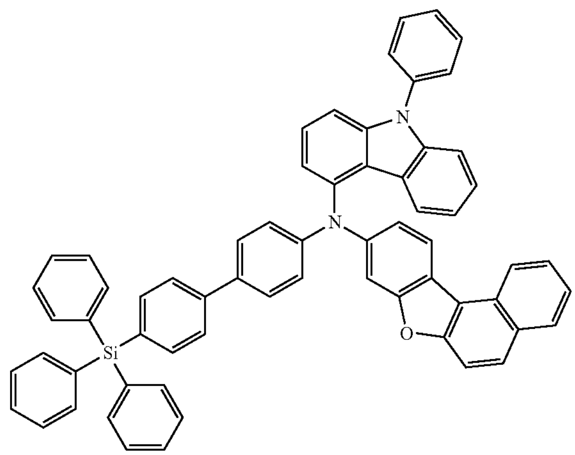
A141
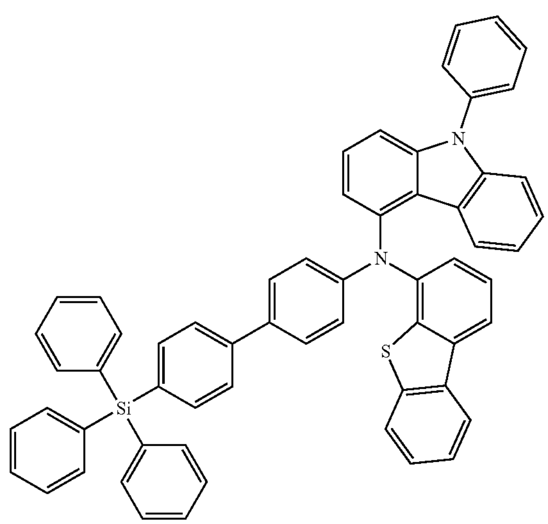

-continued
A142
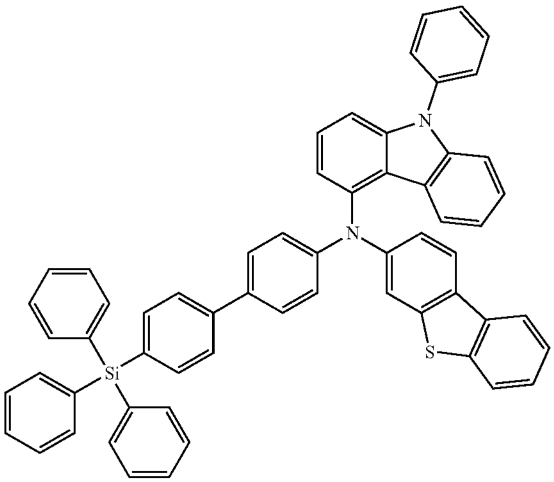
A143
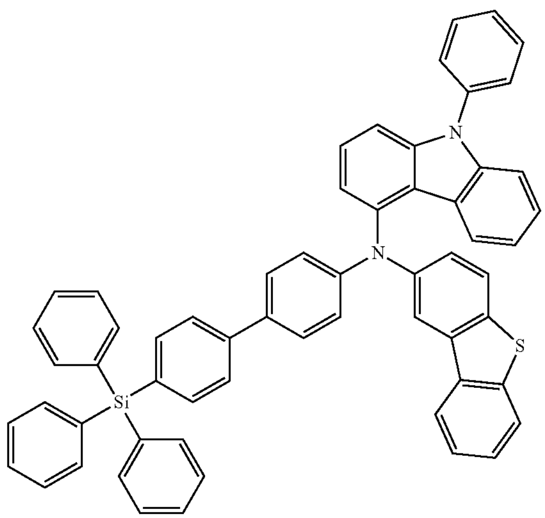
A144
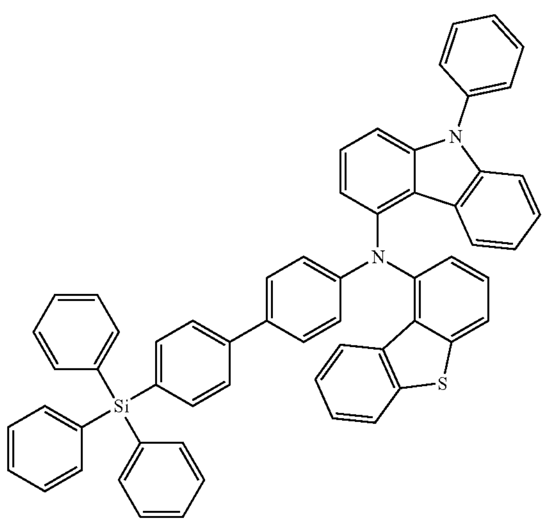
-continued
A145
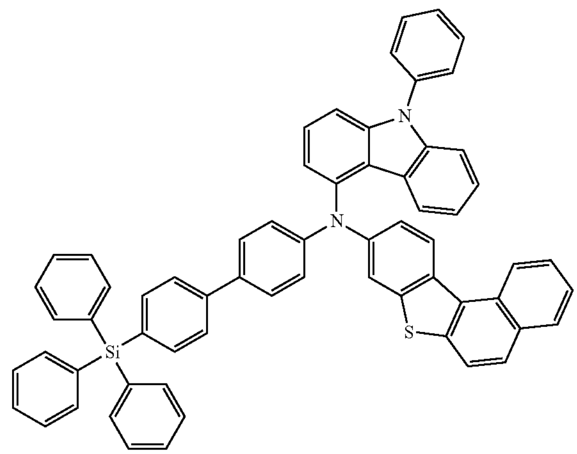
A146
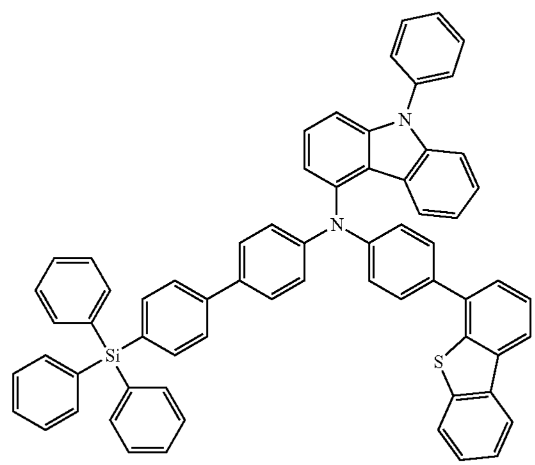
A147
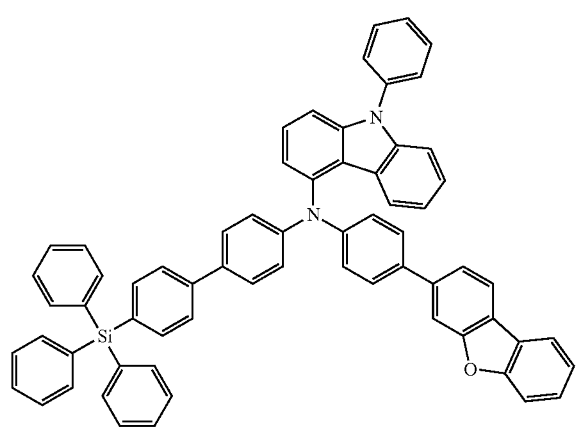

-continued
A148
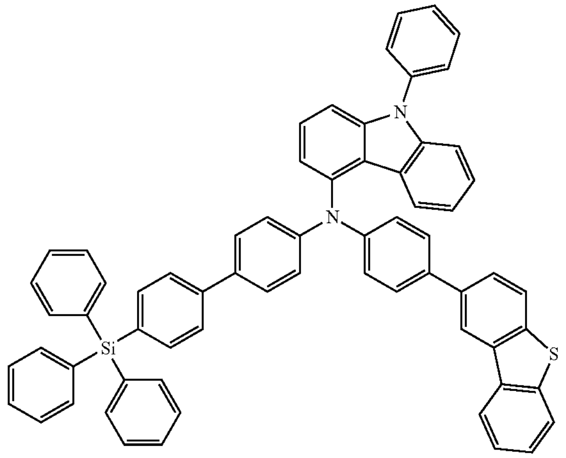
A149
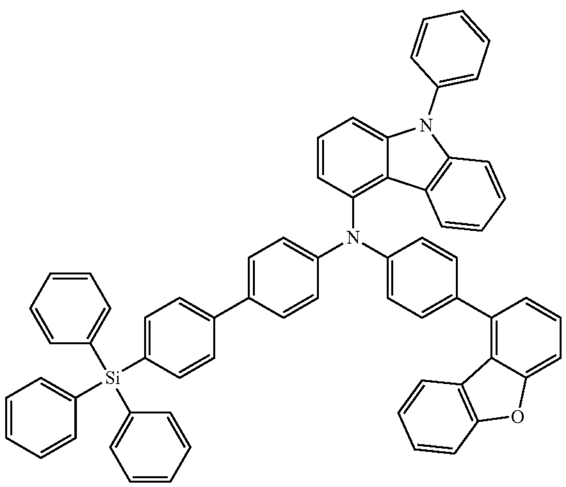
A150
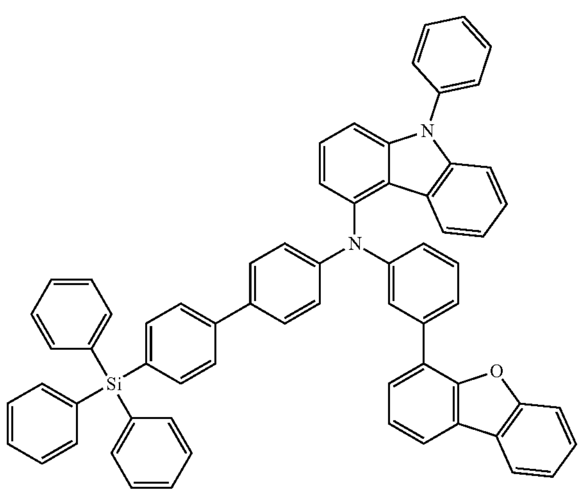
-continued
A151
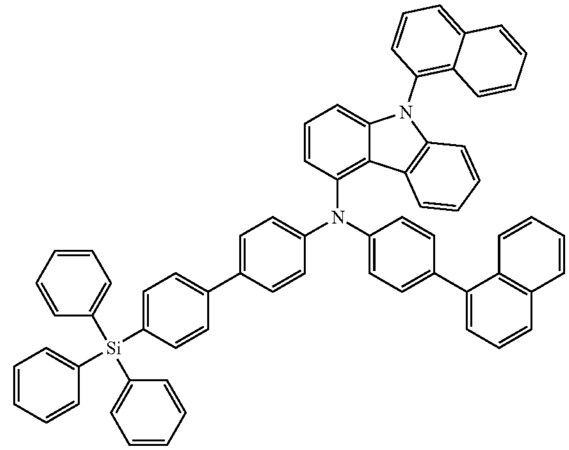
A152
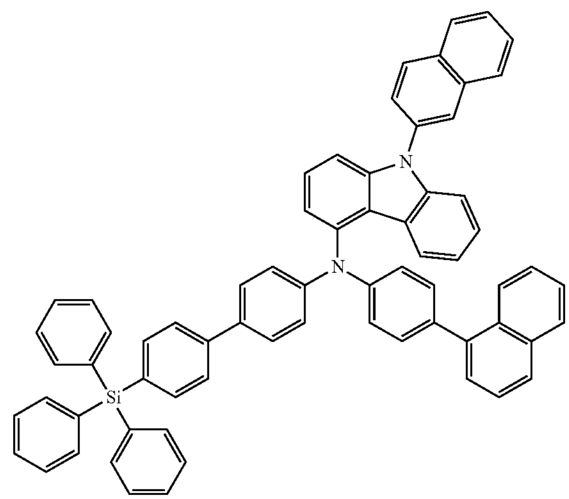
A153
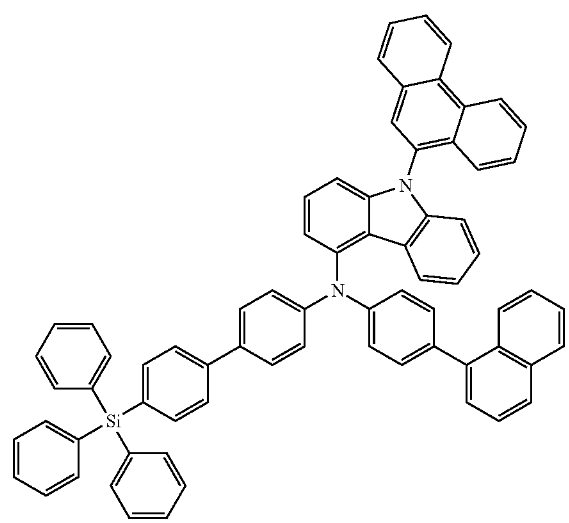

-continued
A154
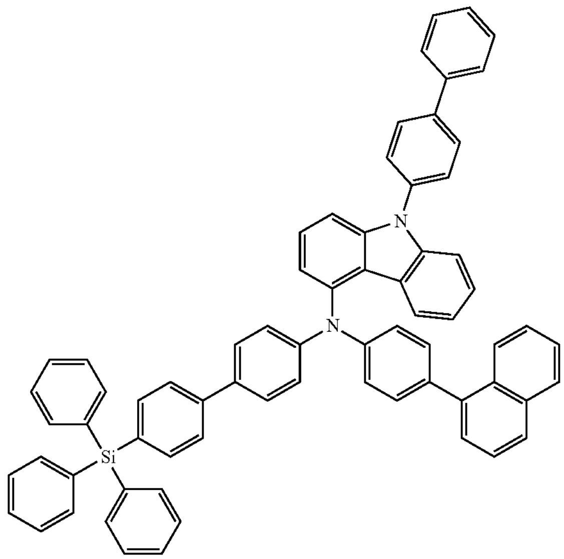
A155
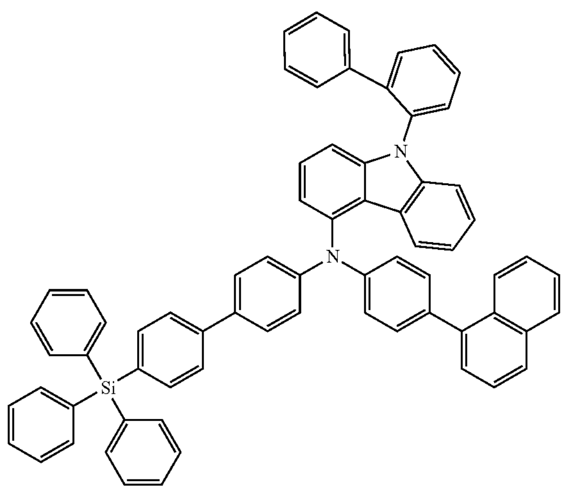
A156
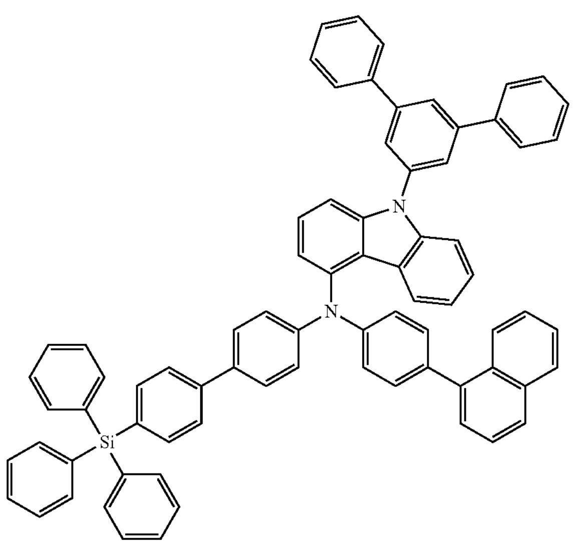
-continued
A157
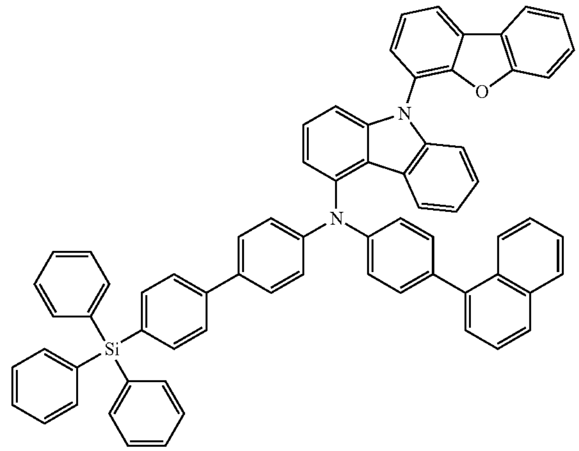
A158
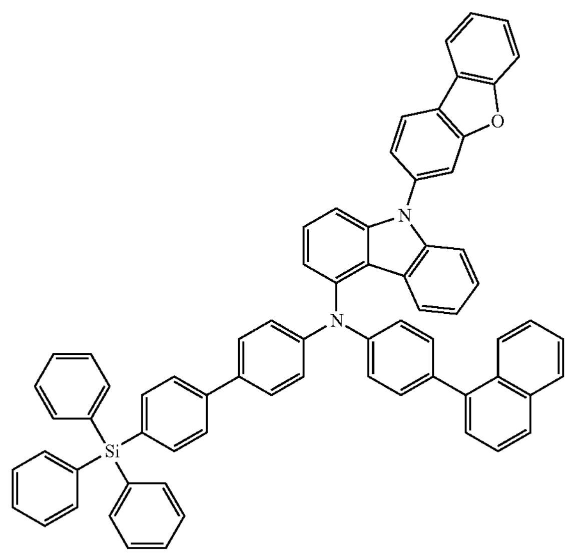
A159
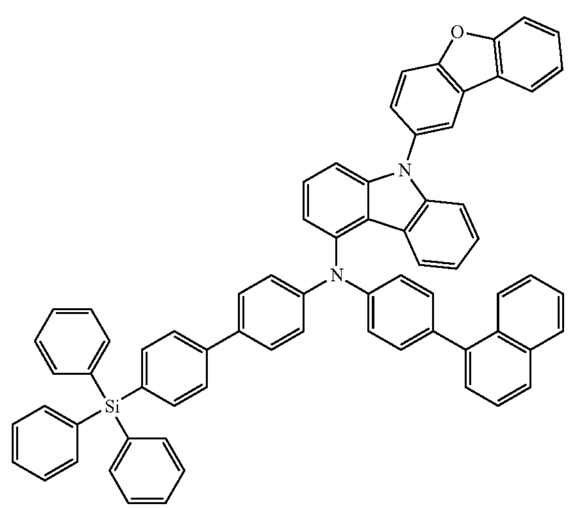

-continued
A160
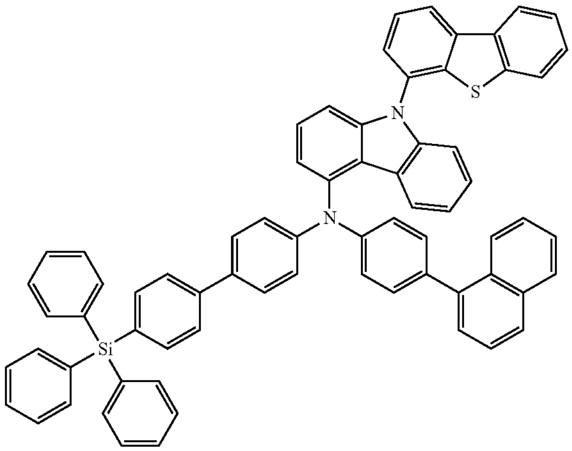
A161
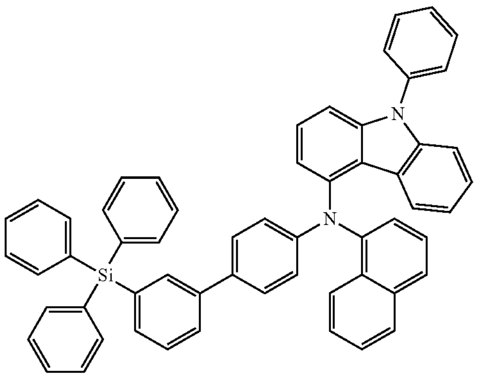
A162
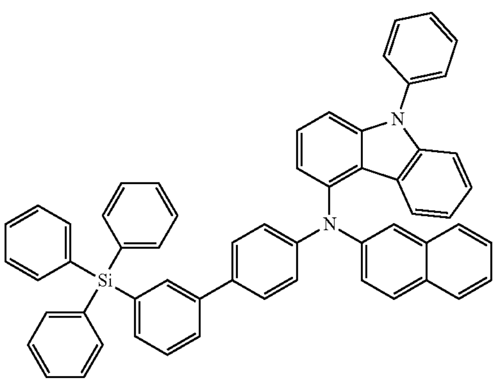
A163
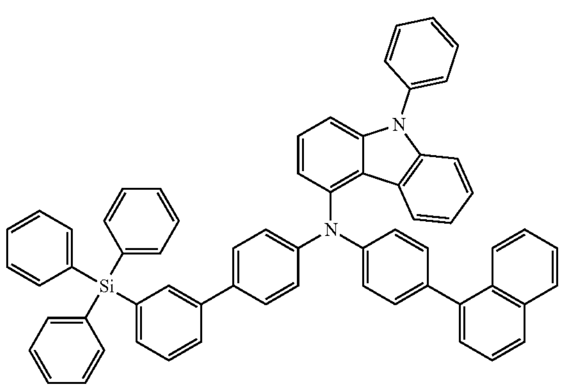
-continued
A164
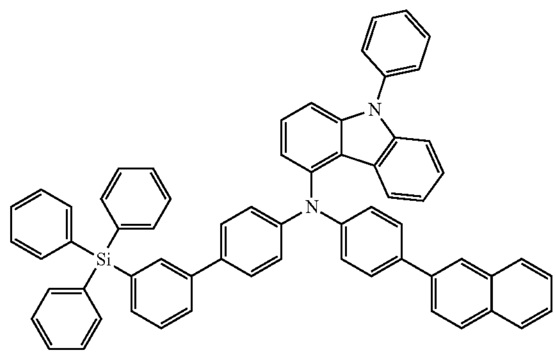
A165
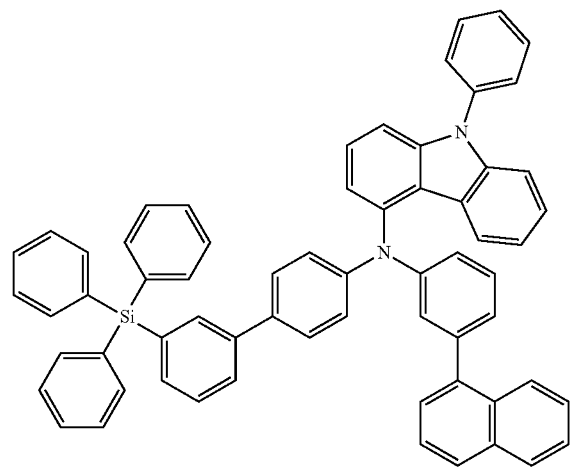
A166
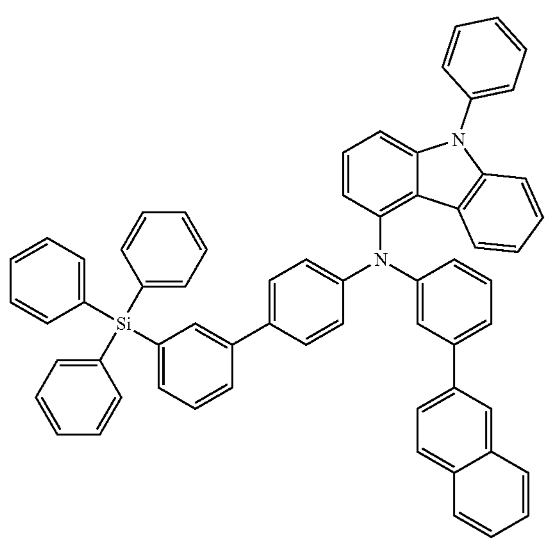

-continued
A167
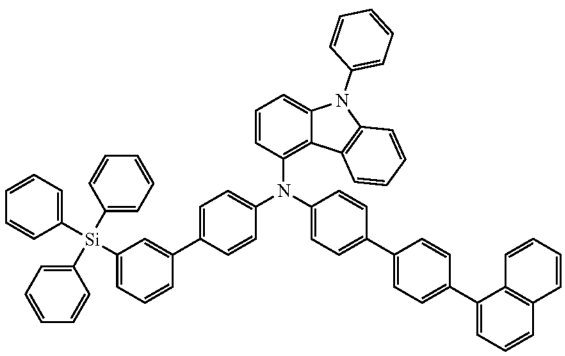
A168
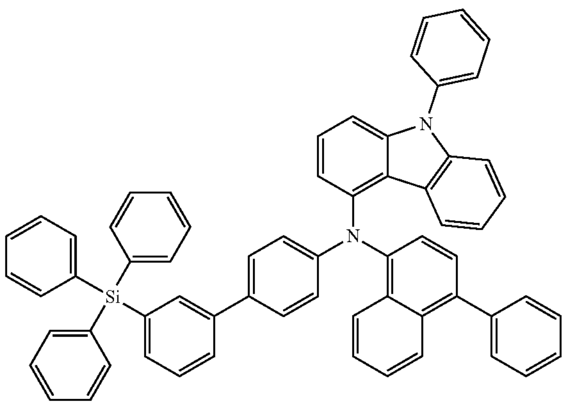
A169
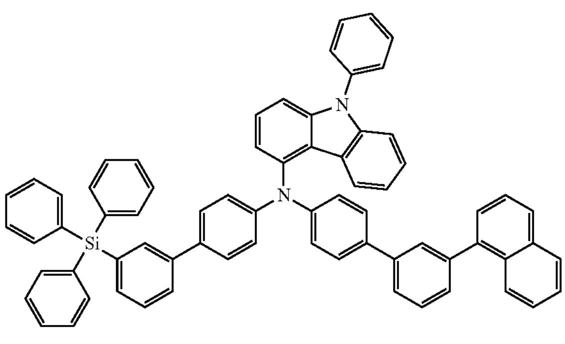
A170
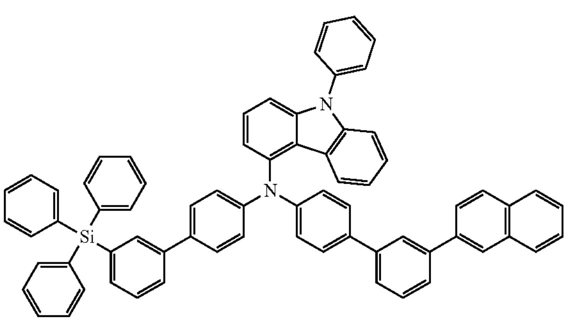
-continued
A171
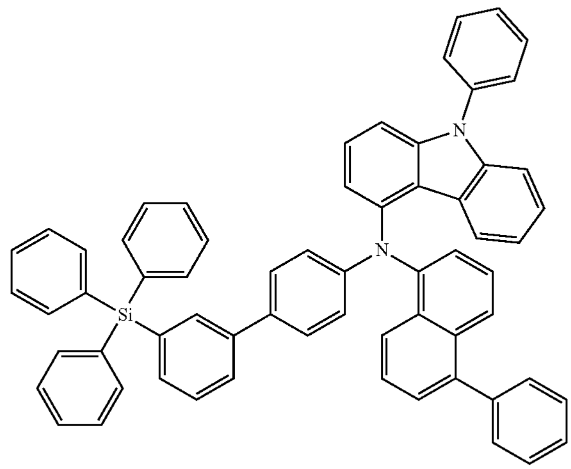
A172
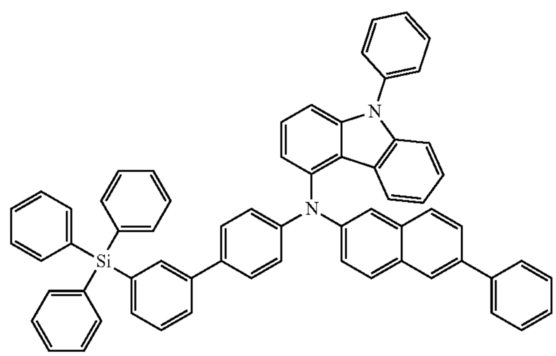
A173
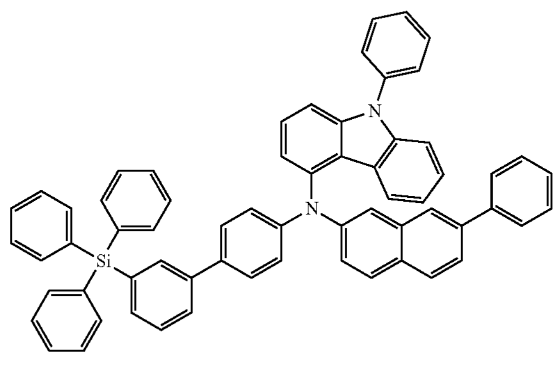
A174
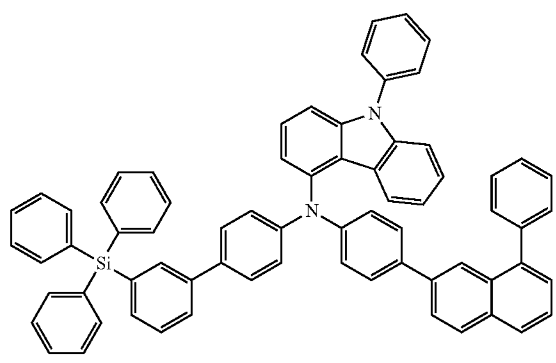

A175
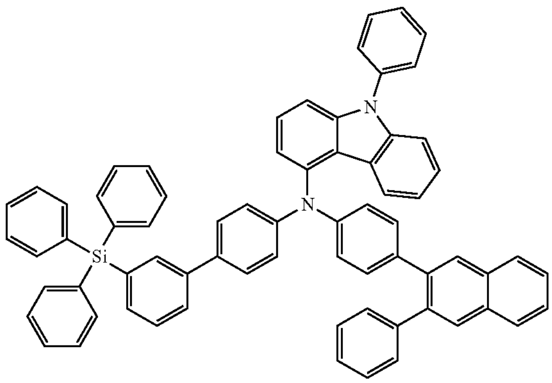
A176
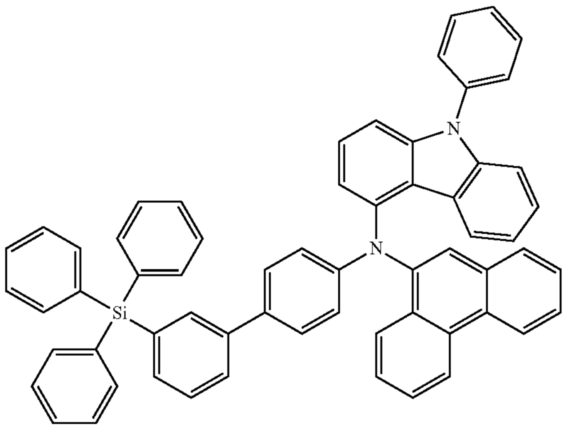
A177
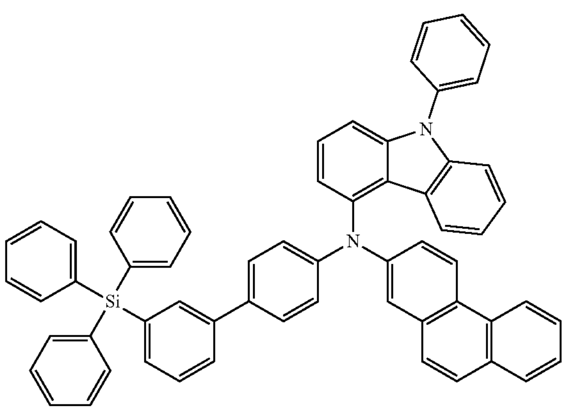
A178
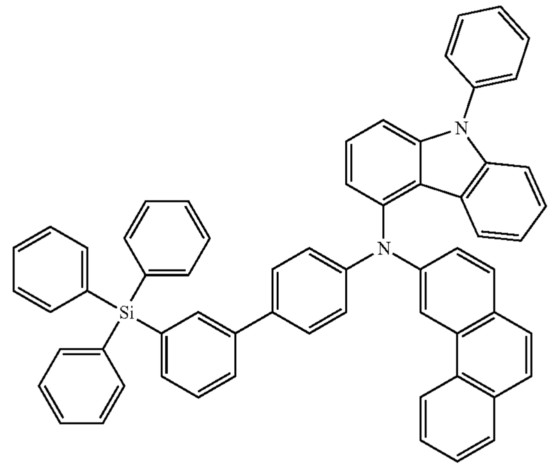
A179
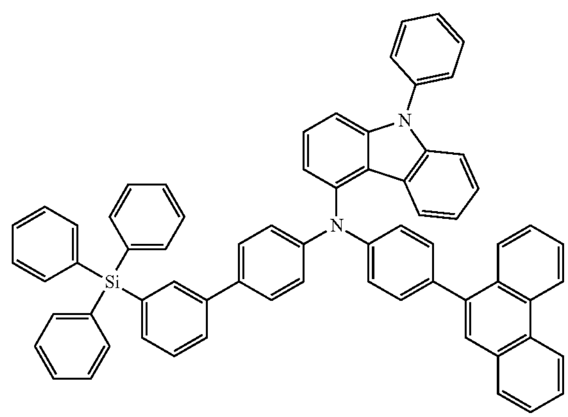
A180
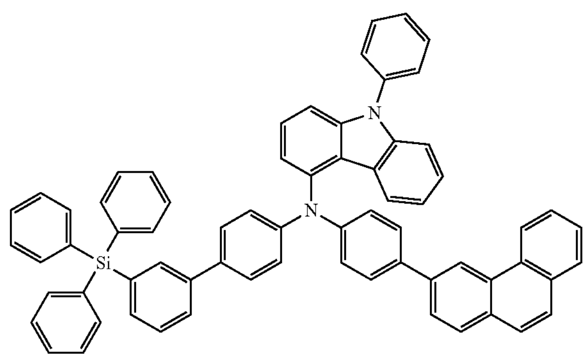

-continued
A181
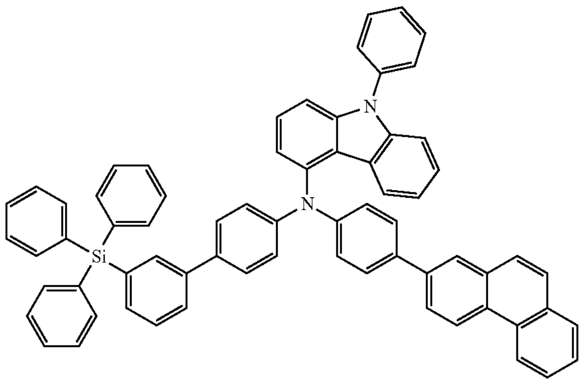
A182
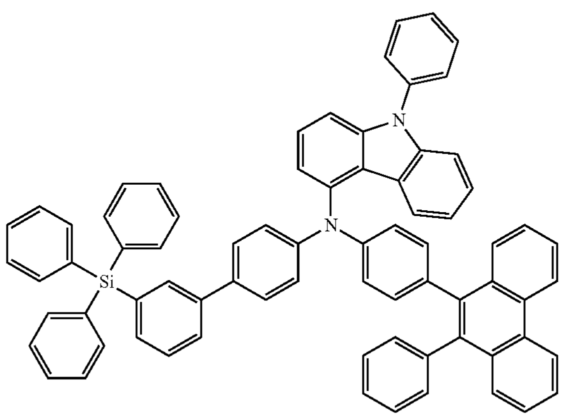
A183
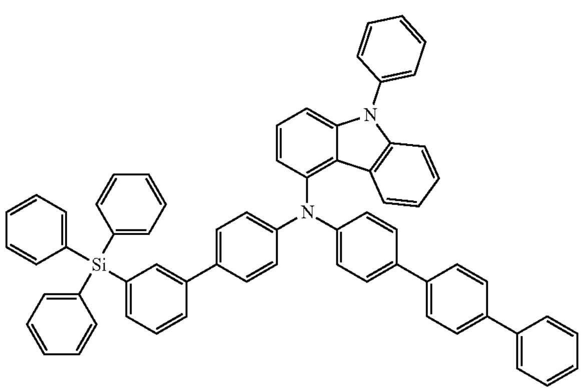
-continued
A184
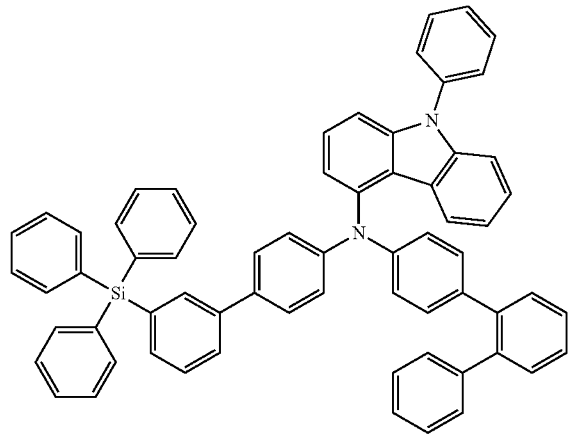
A185
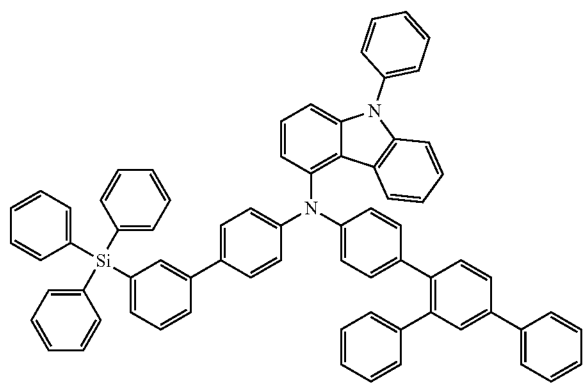
A186
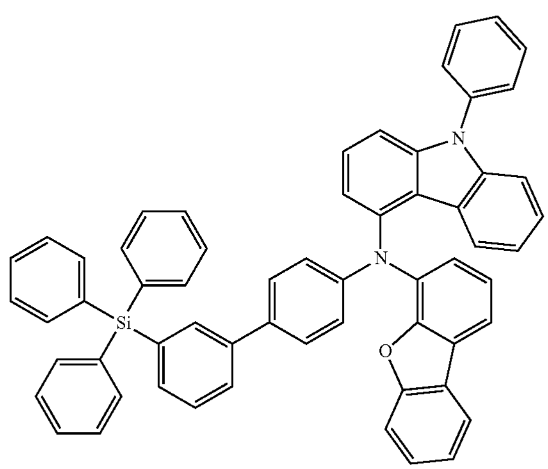

-continued
A187
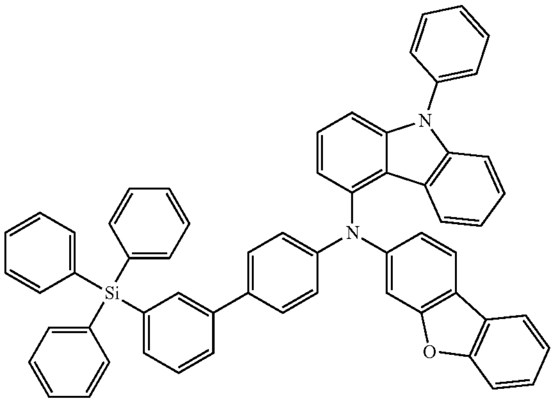
A188
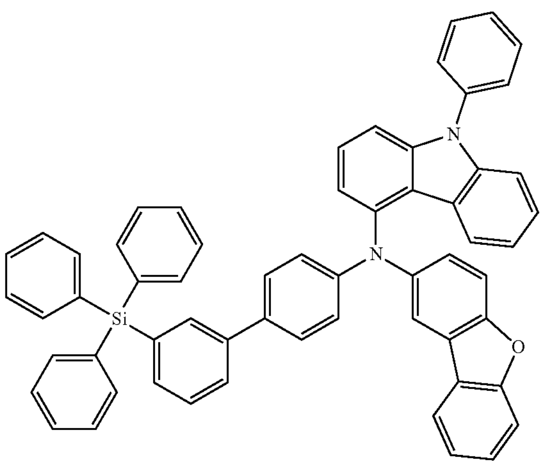
A189
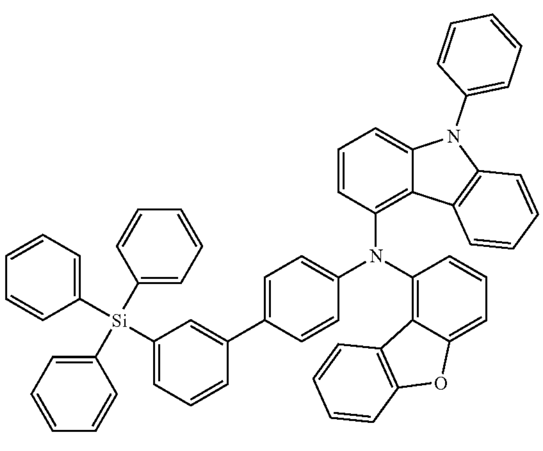
-continued
A190
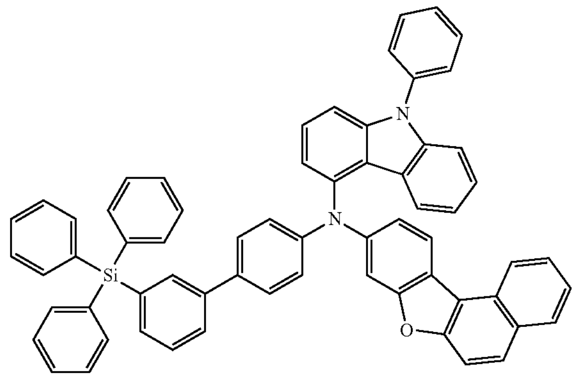
A191
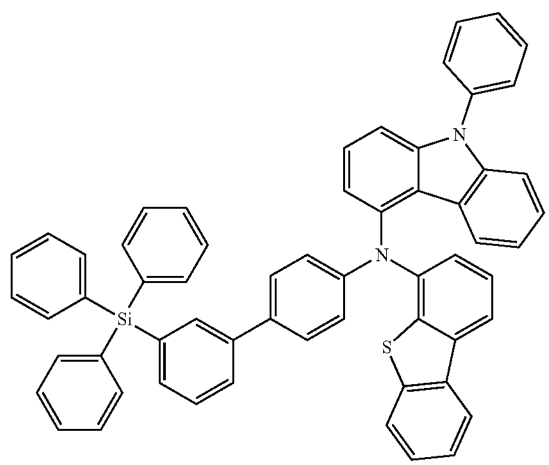
A192
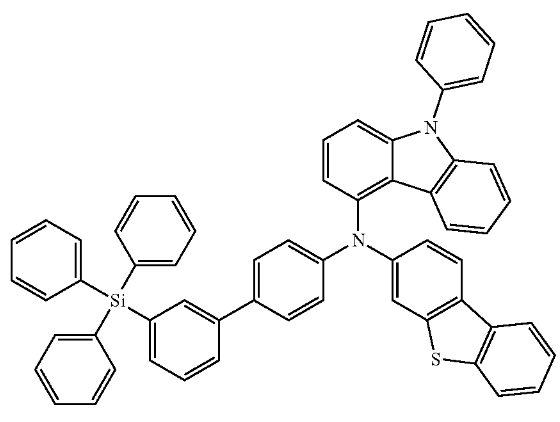

-continued
A193
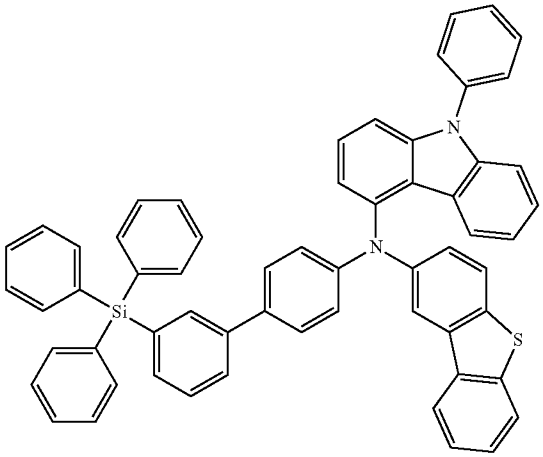
A194
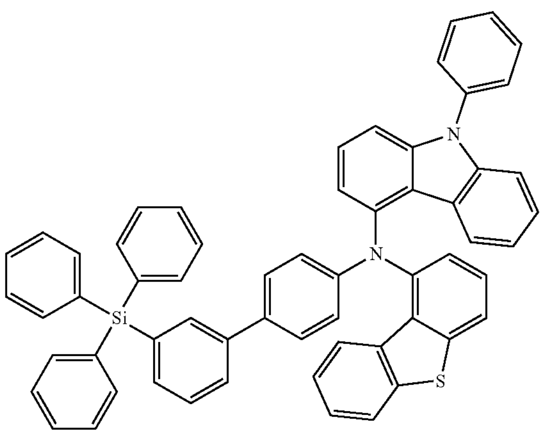
A195
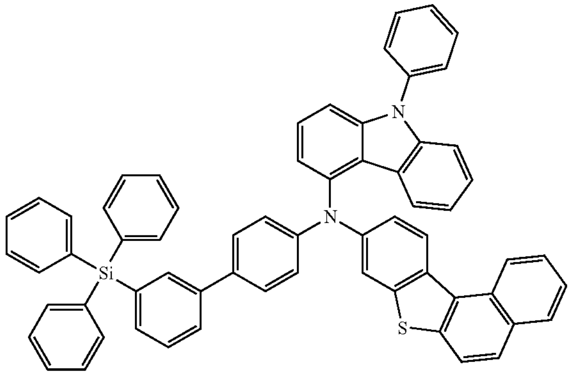
-continued
A196
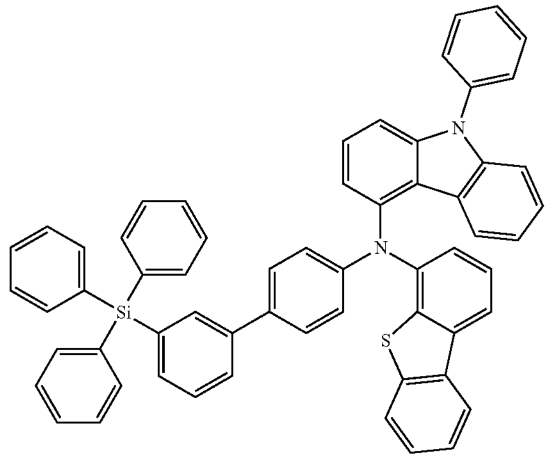
A197
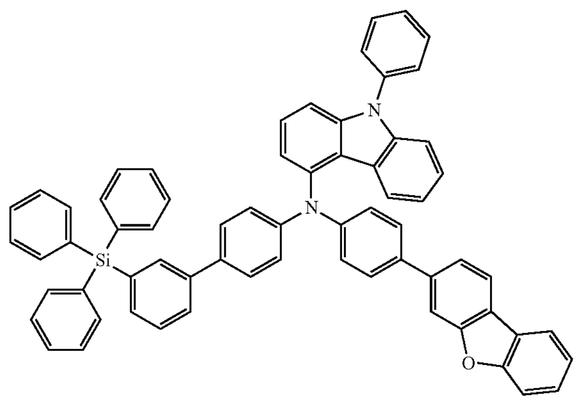
A198
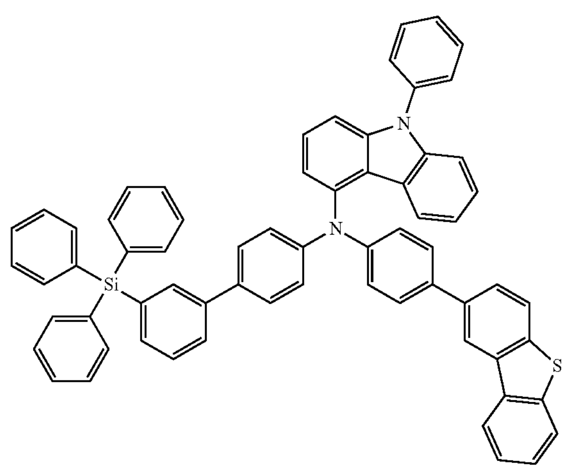

A199
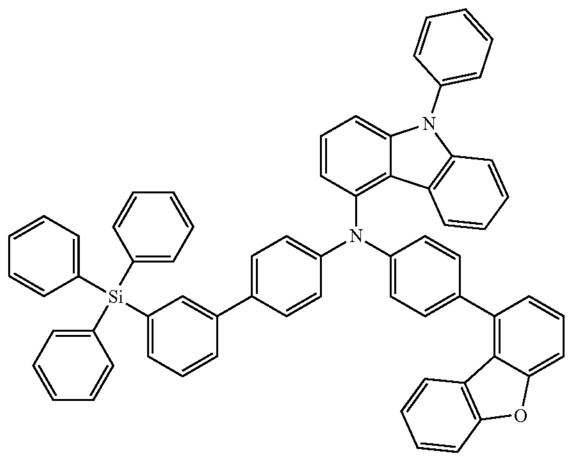
A200
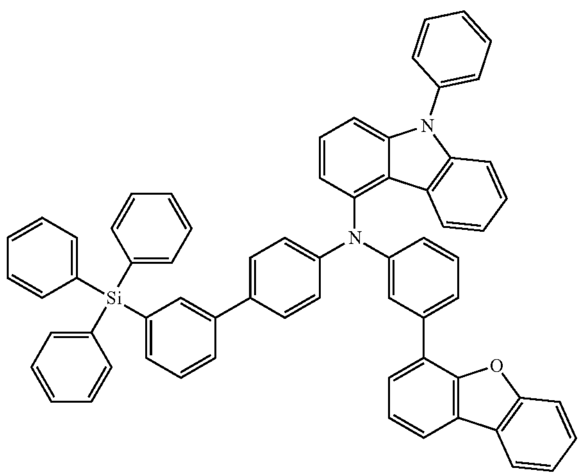
A201
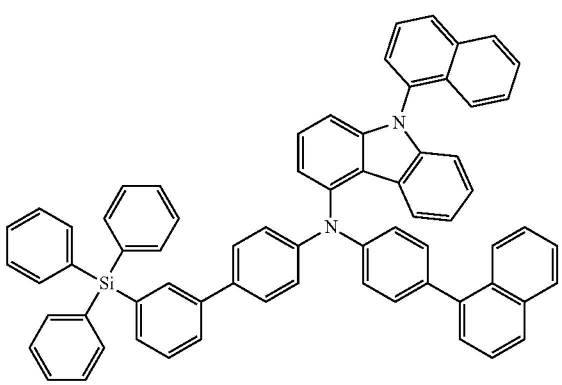
A202
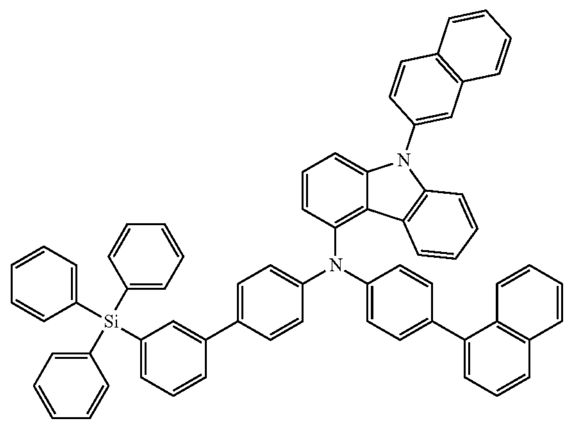
A203
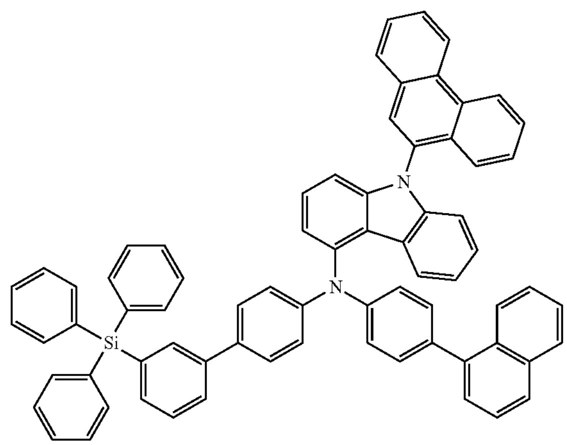
A204
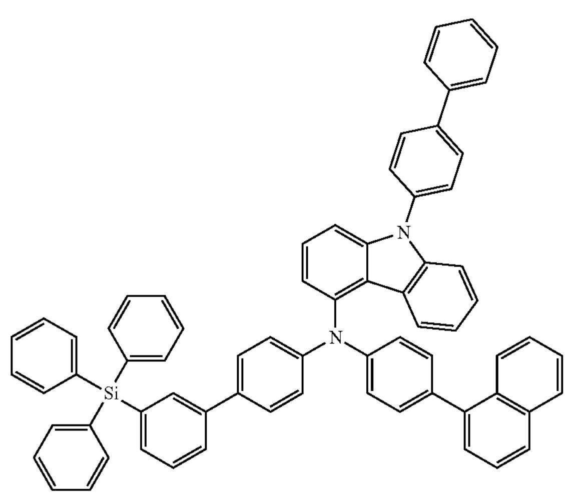

-continued
A205
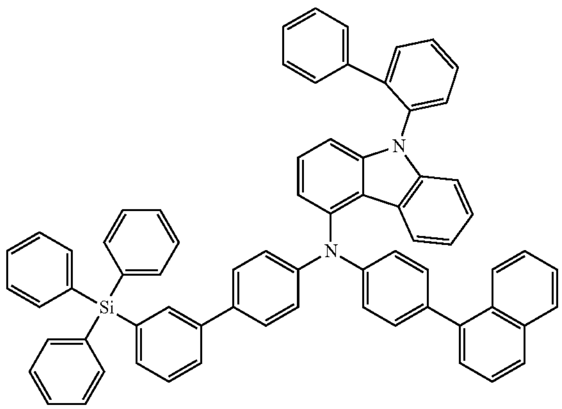
A206
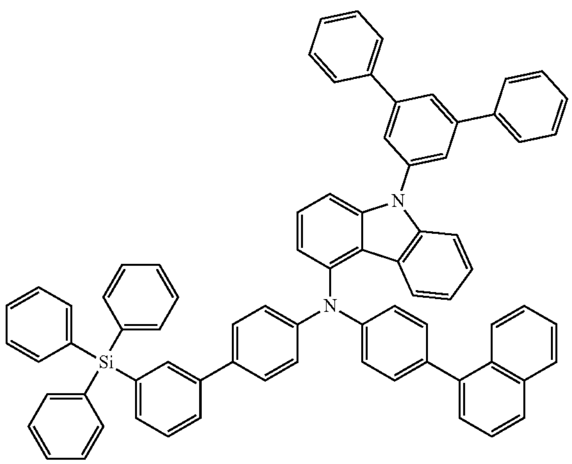
A207
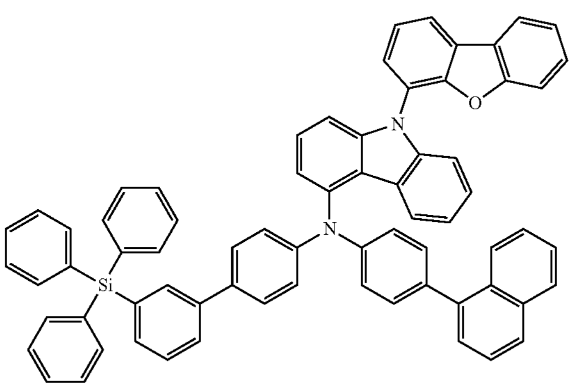
-continued
A208
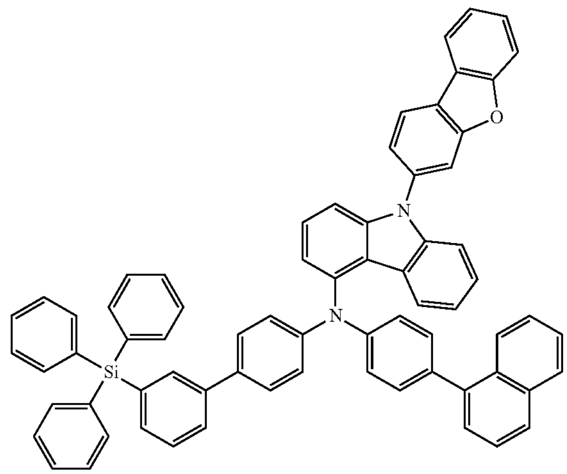
A209
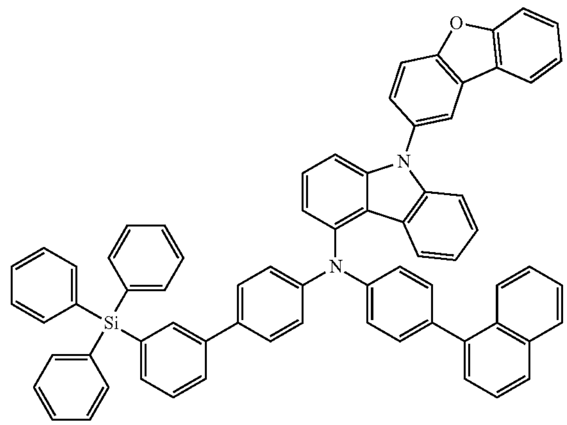
A210
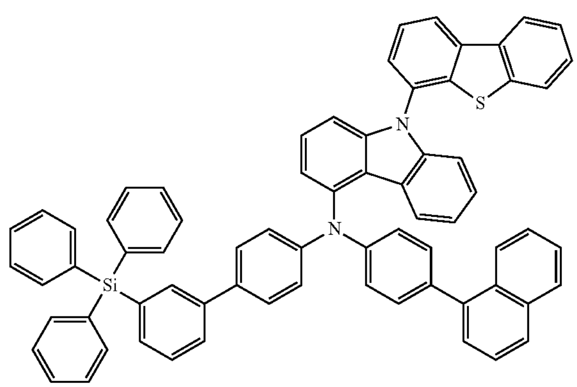

-continued
A211
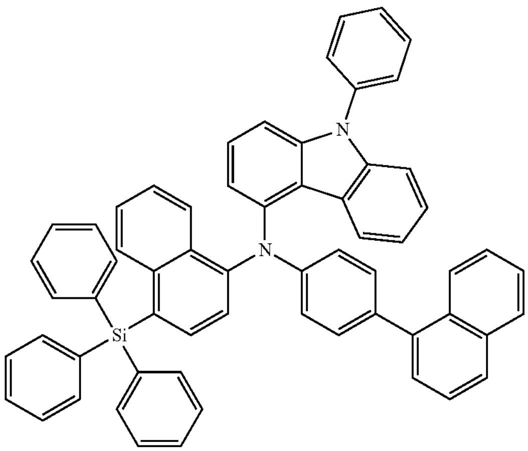
A212
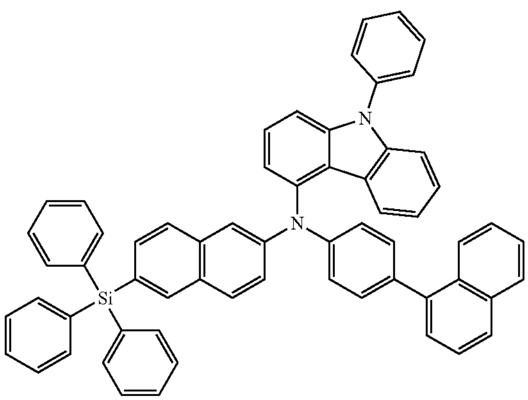
A213
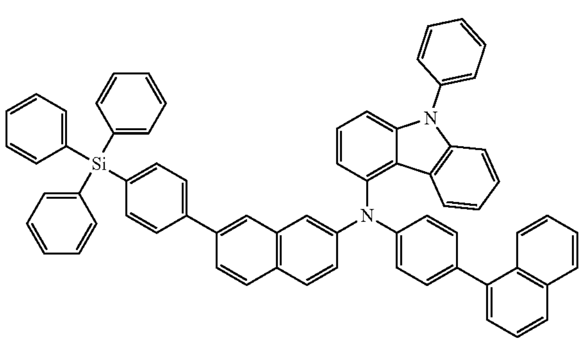
-continued
A214
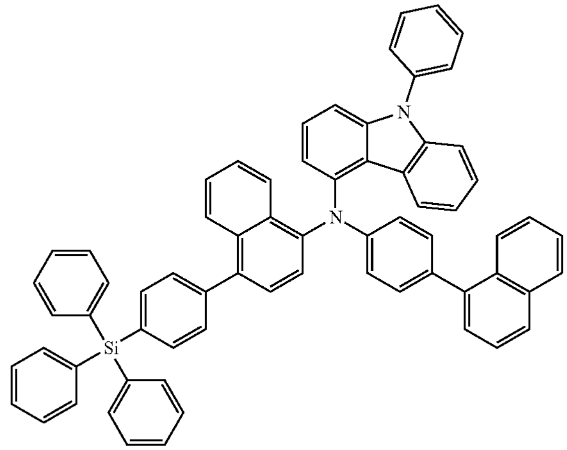
A215
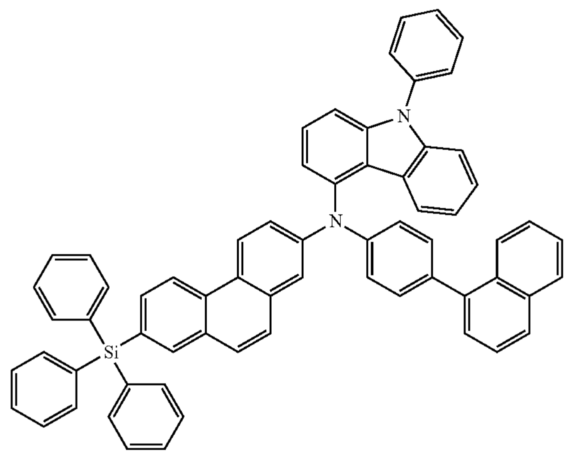
A216
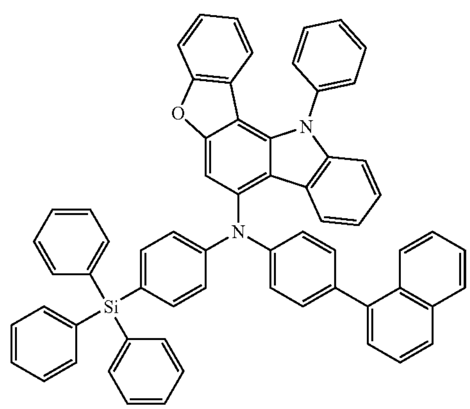

A217
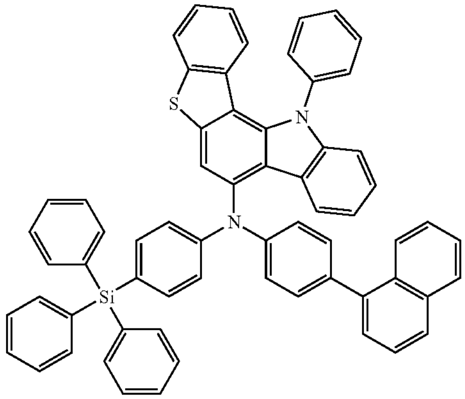
A218
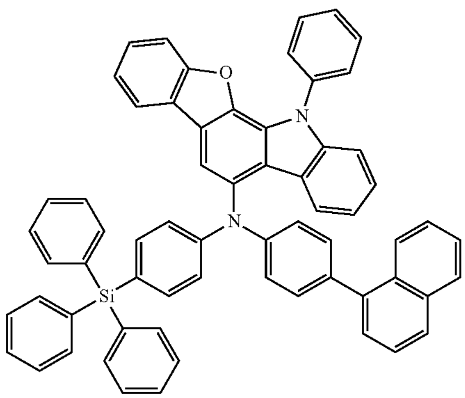
A219
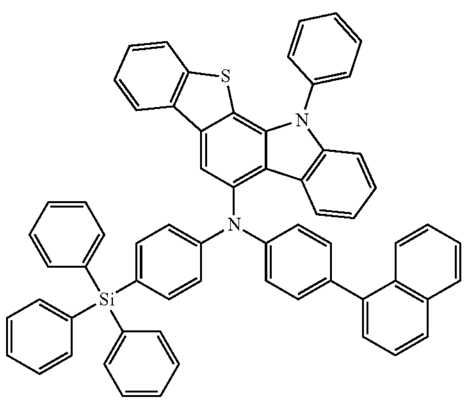
A220
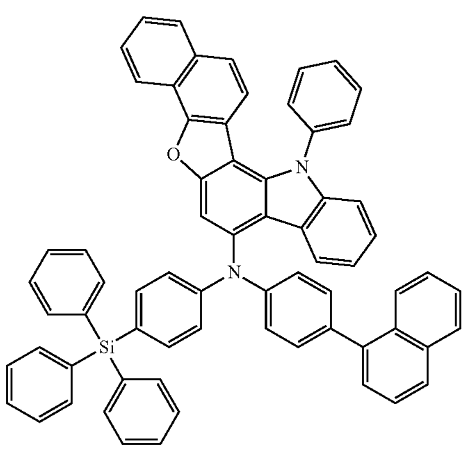
[Compound Group 1B]
B1
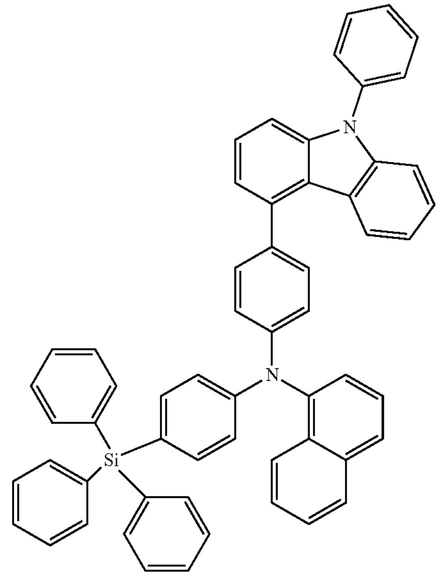
B2
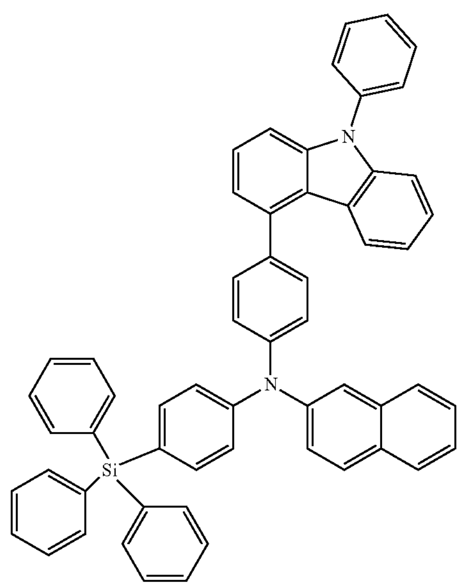

-continued
B3
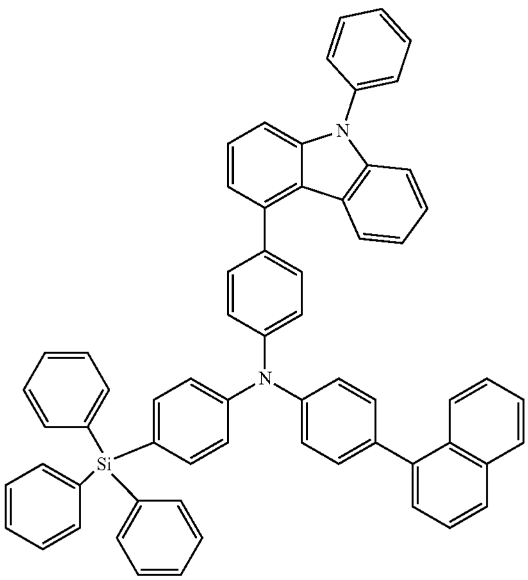
B4
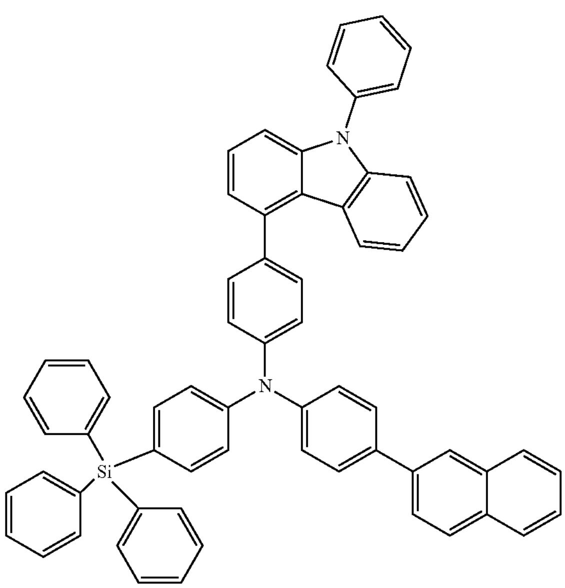
-continued
B5
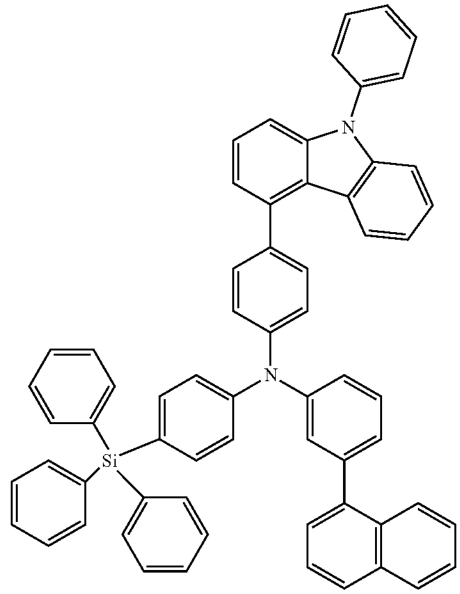
B6
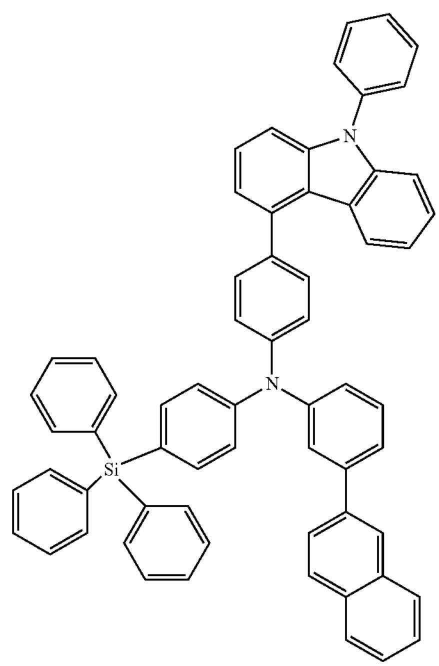

B7
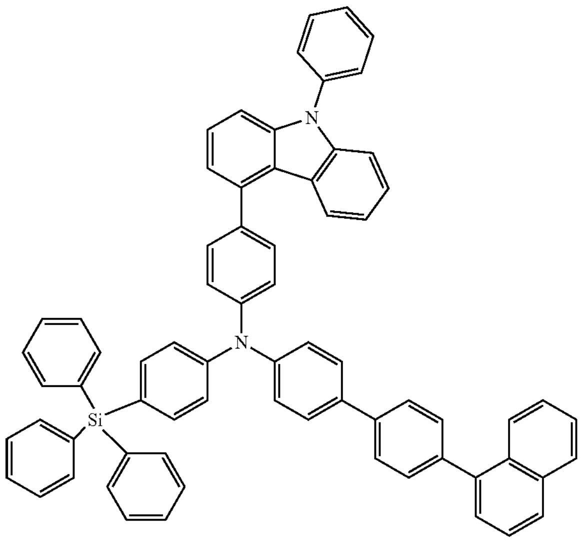
B8
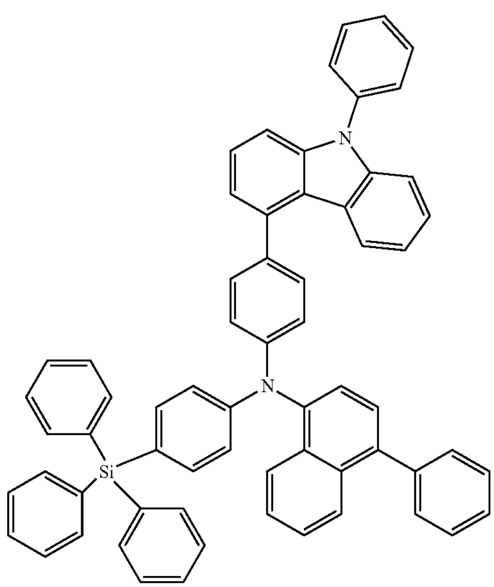
B9
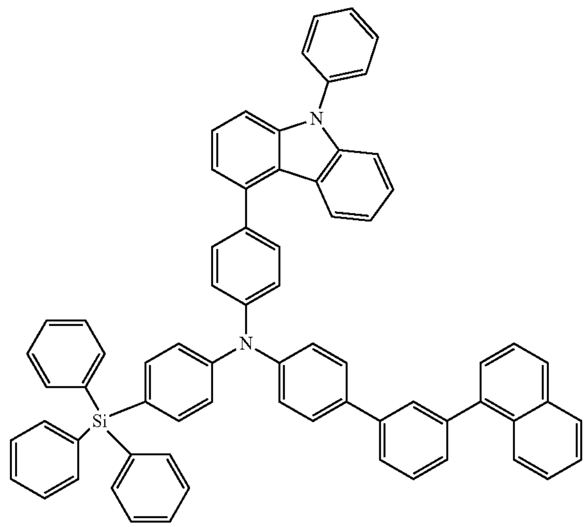
B10
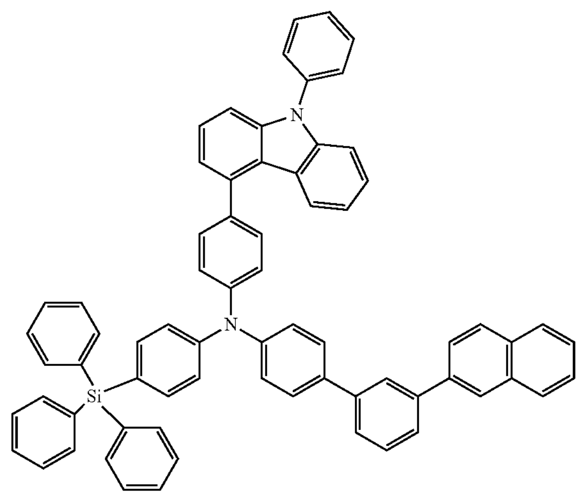
B11
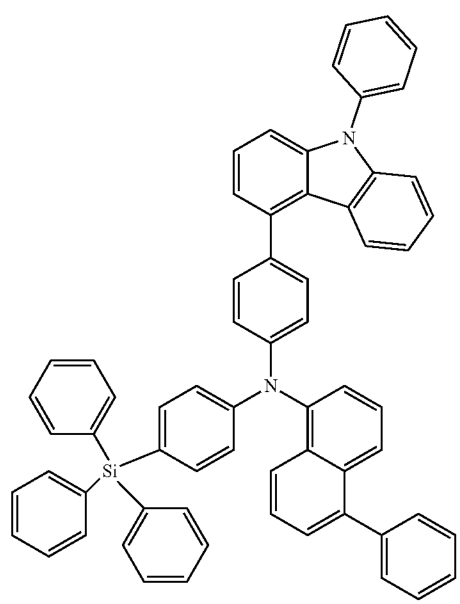

-continued
B12
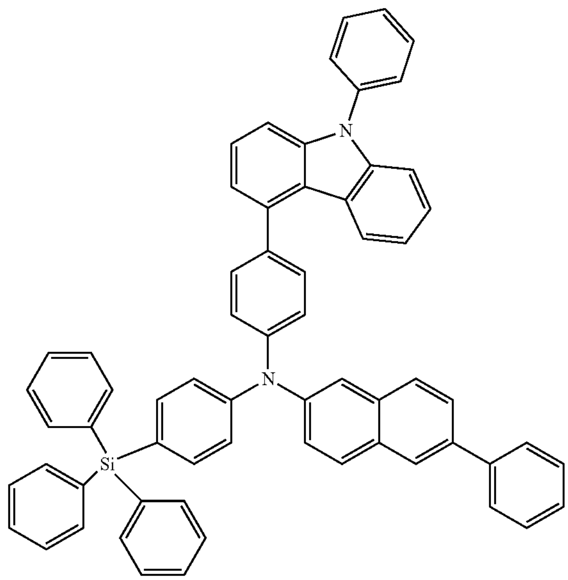
B13
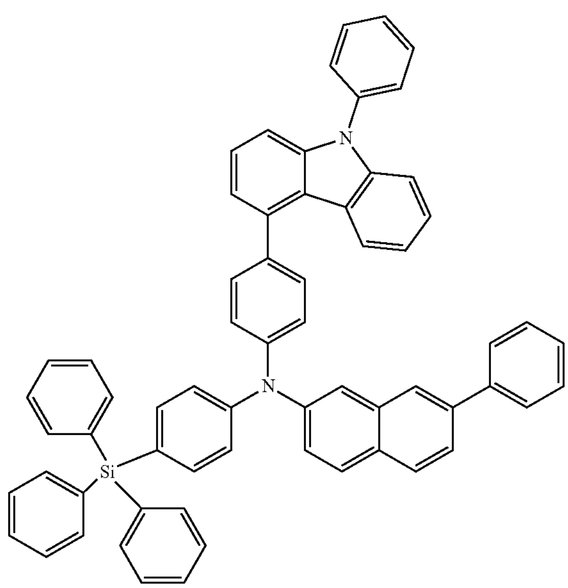
-continued
B14
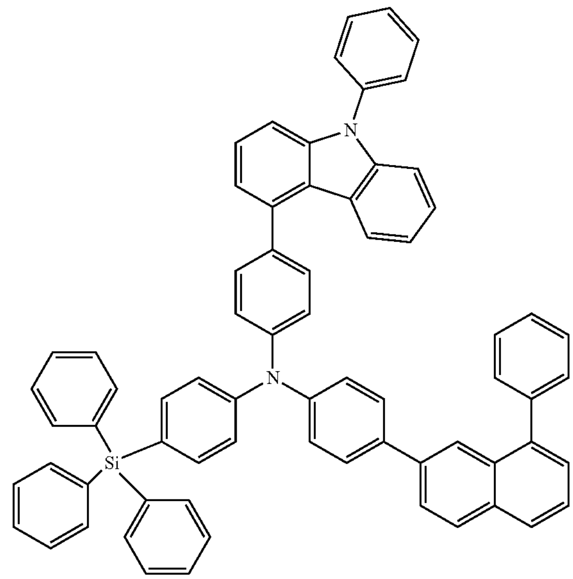
B15
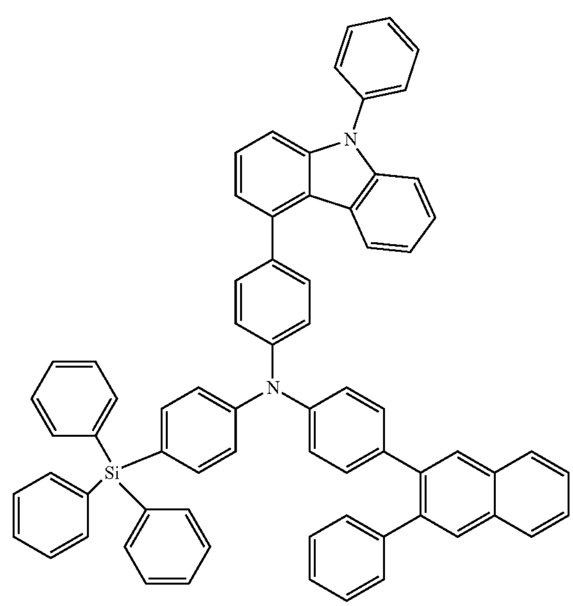

-continued
B16
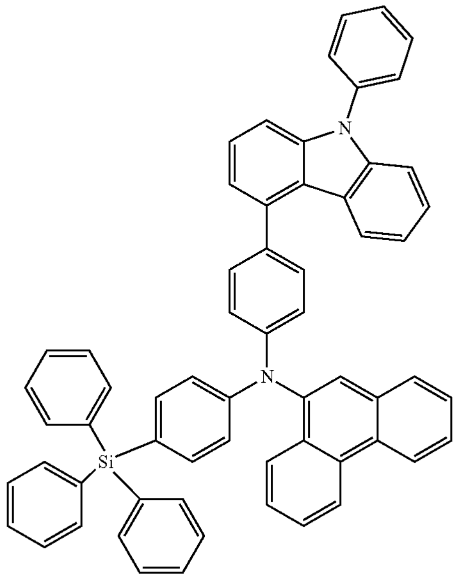
B17
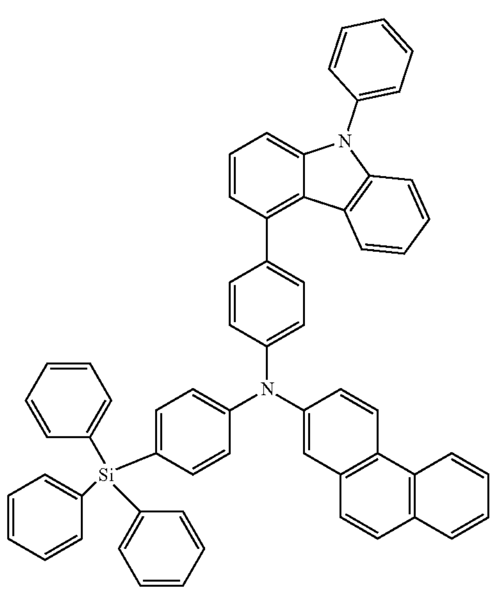
-continued
B18
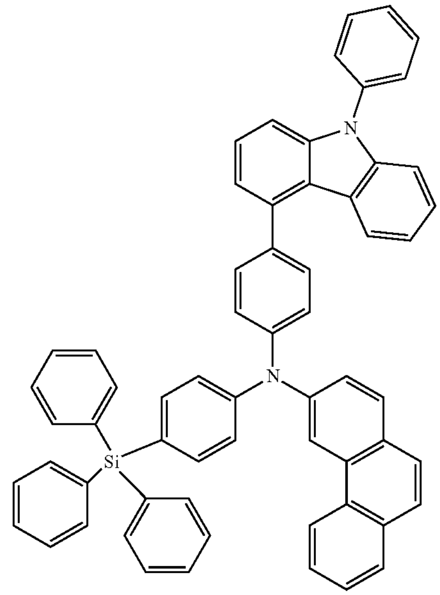
B19
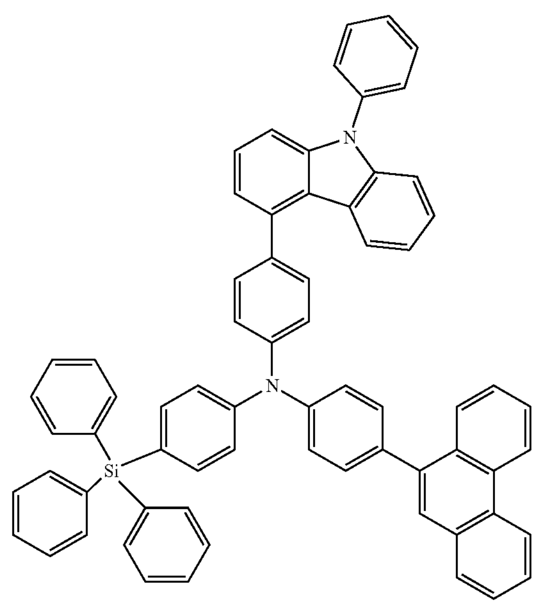

-continued
B20
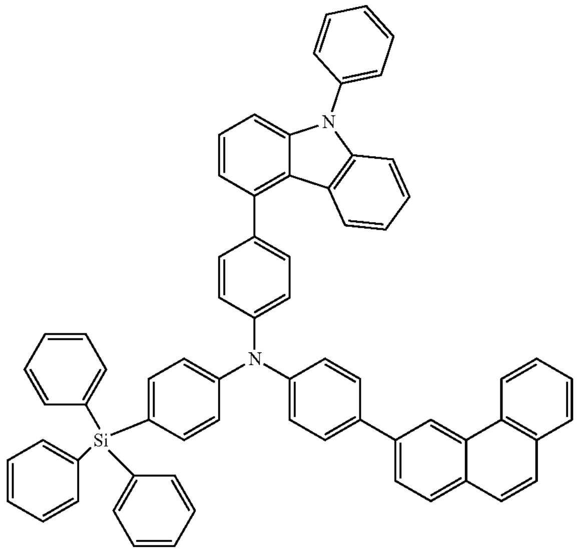
B21
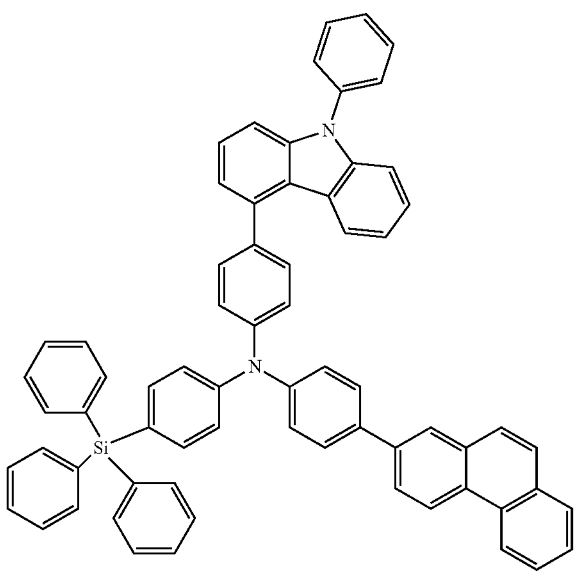
-continued
B22
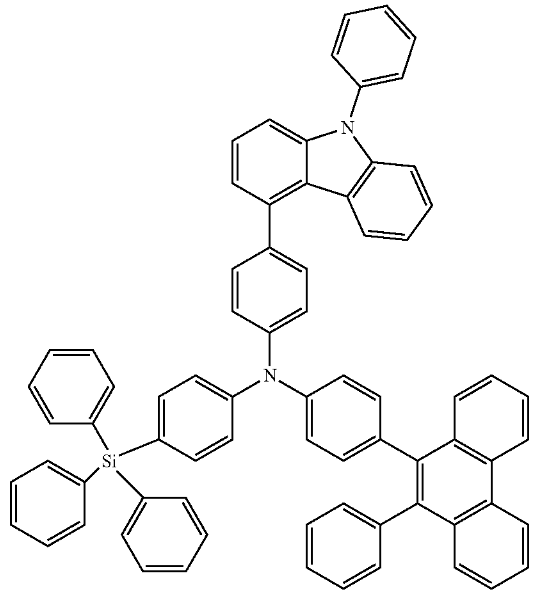
B23
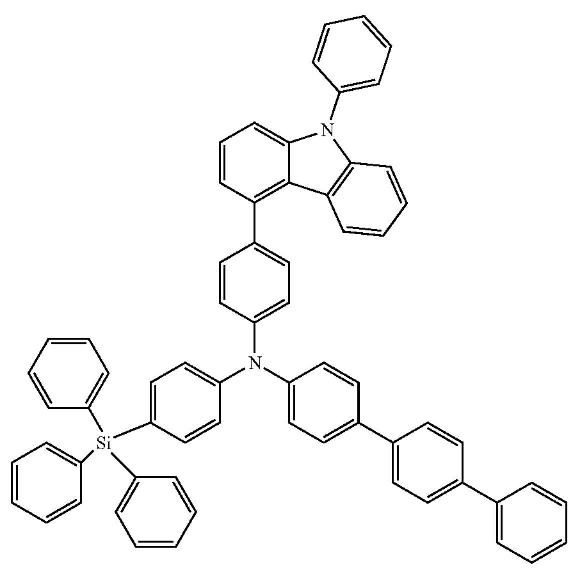

-continued
B24
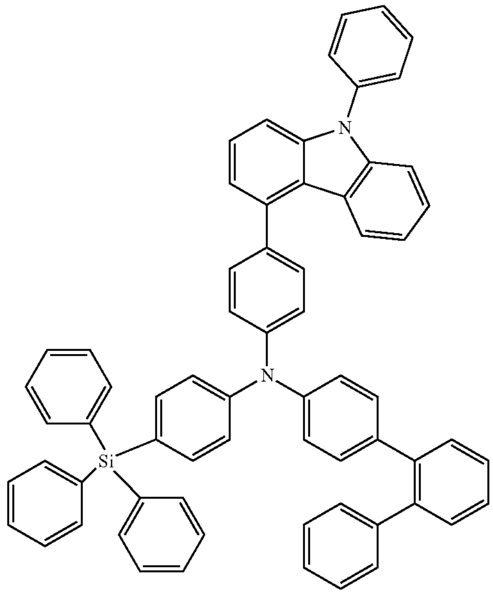
B25
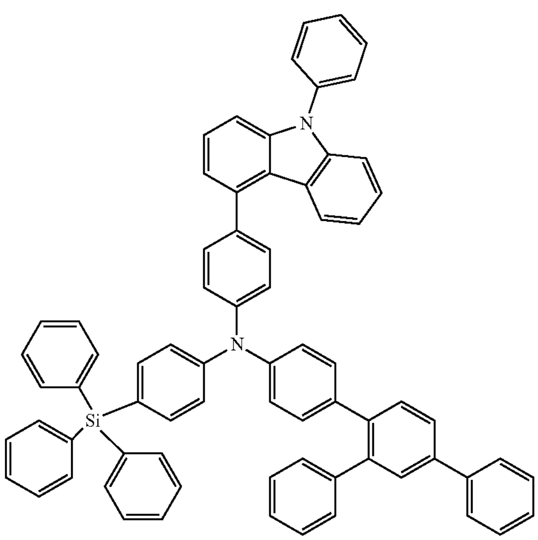
-continued
B26
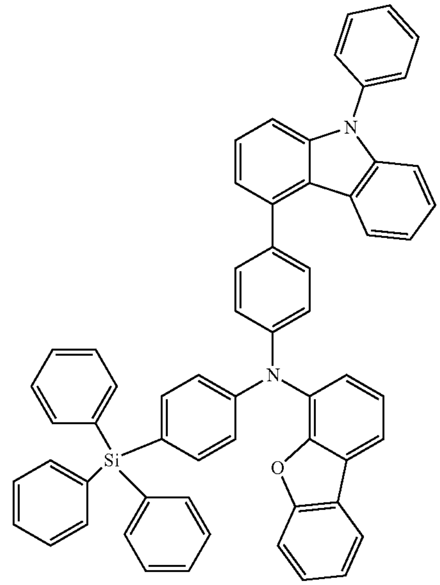
B27
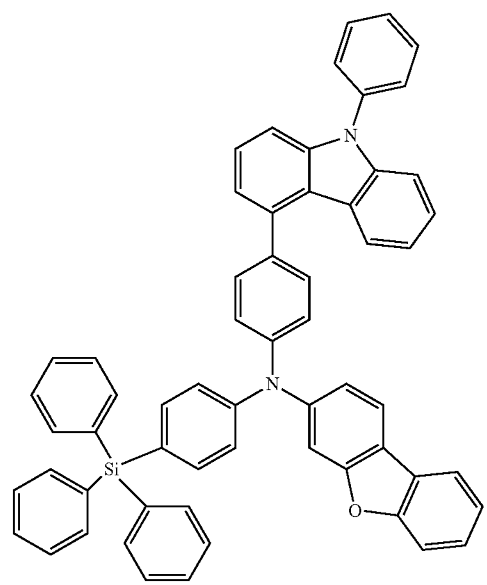

-continued
B28
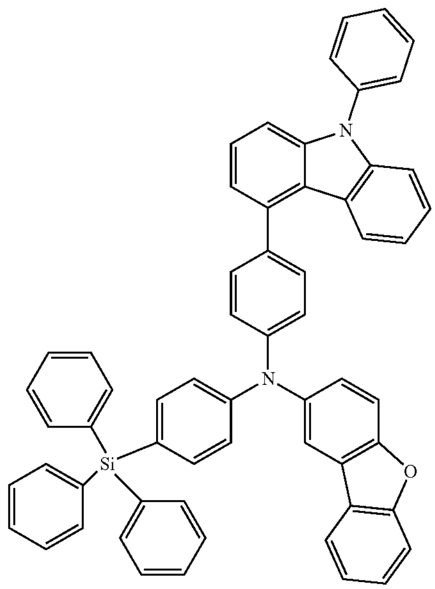
B29
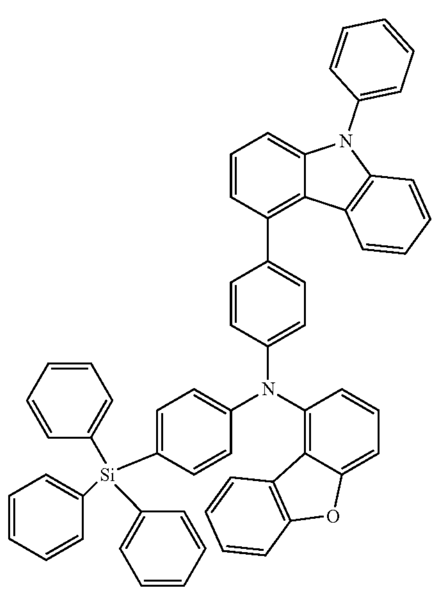
-continued
B30
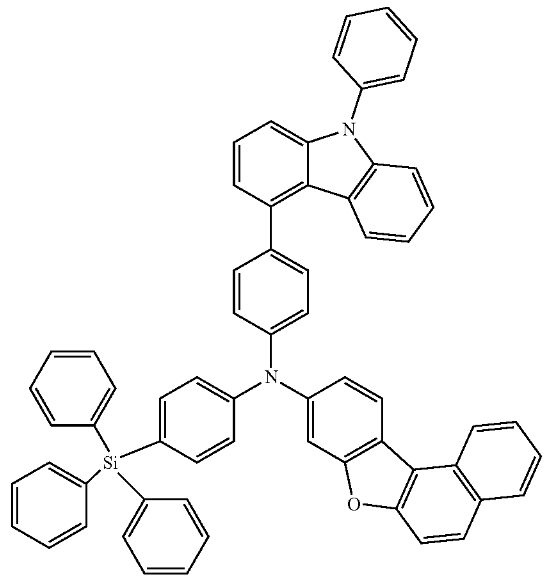
B31
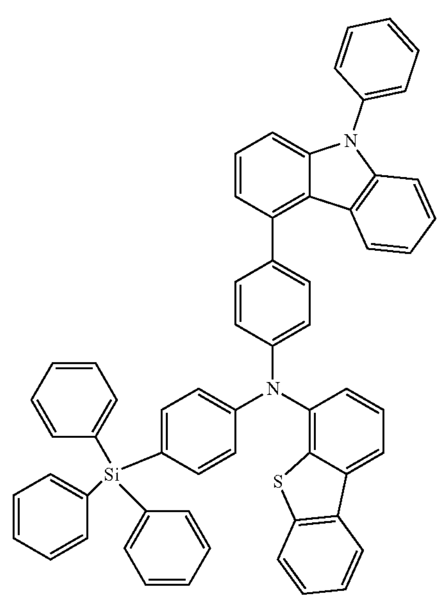

-continued
B32
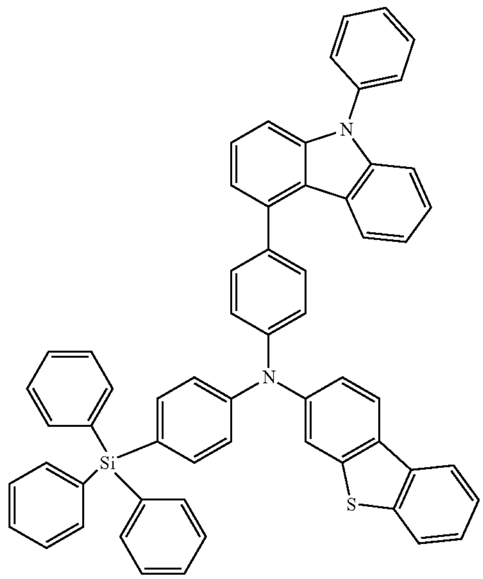
B33
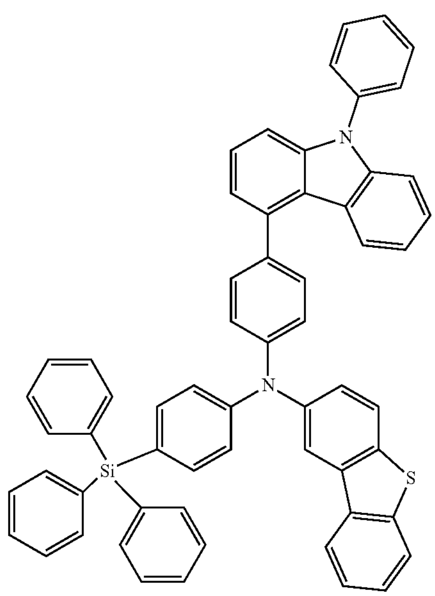
-continued
B34
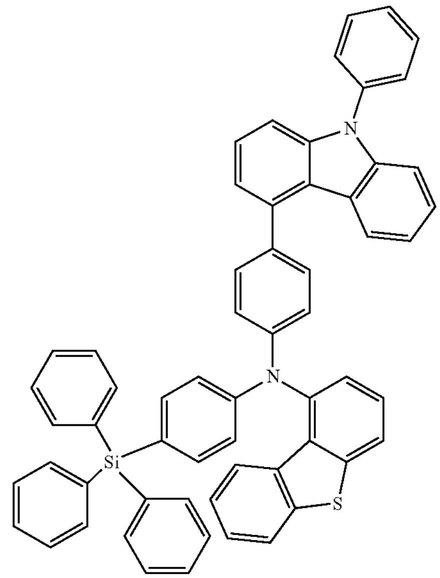
B35
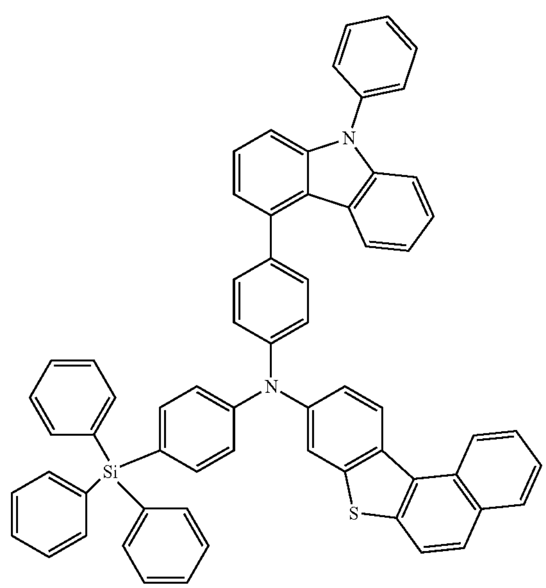

-continued
B36
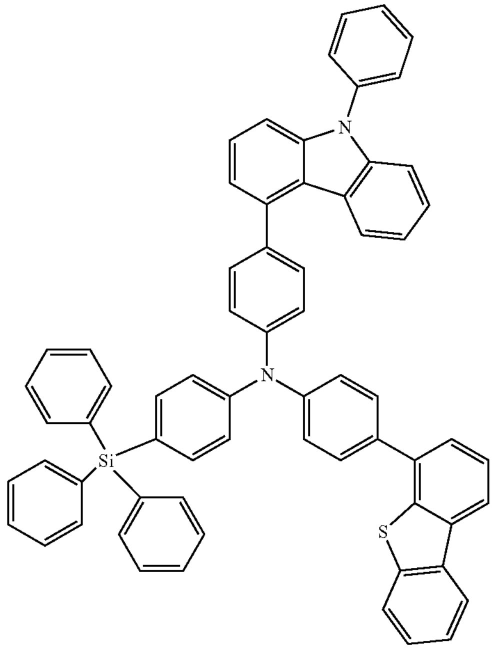
B37
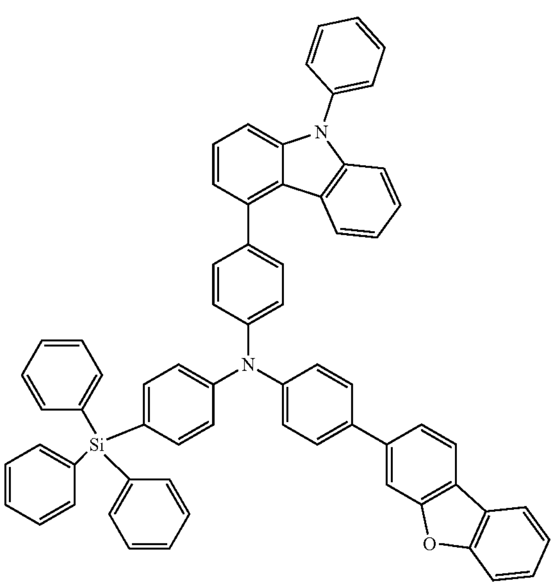
-continued
B38
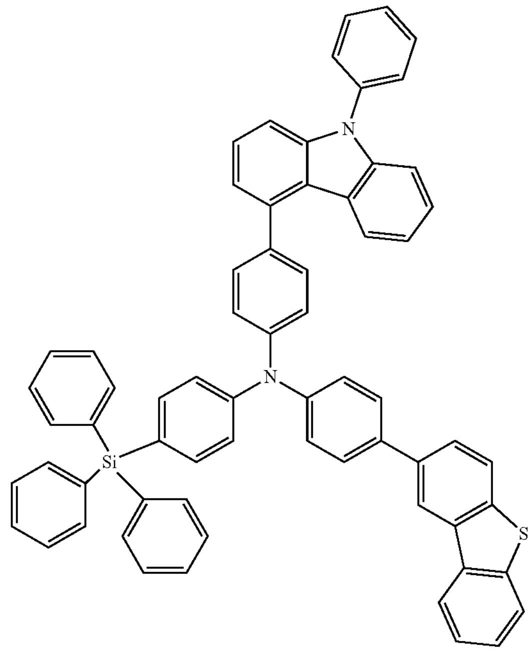
B39
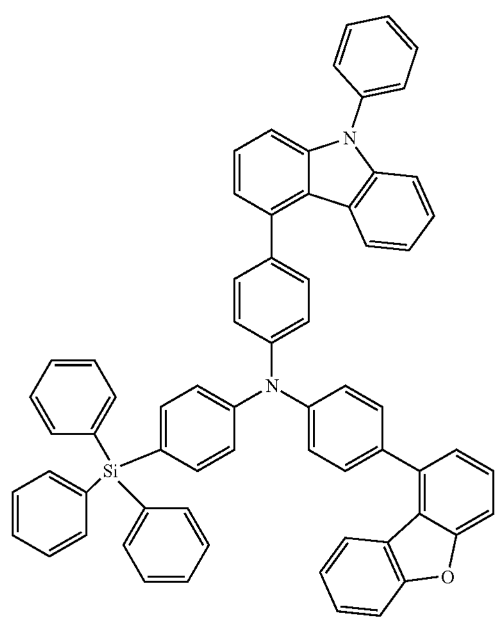

B40
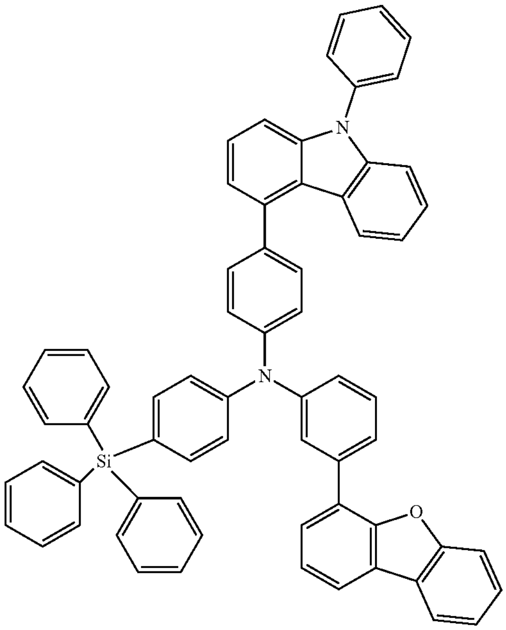
B41
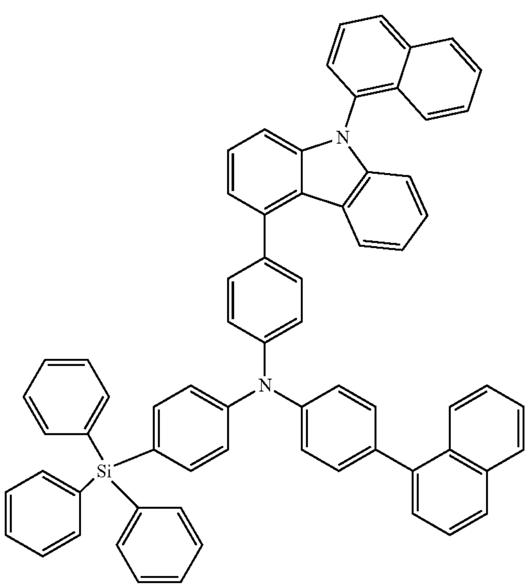
B42
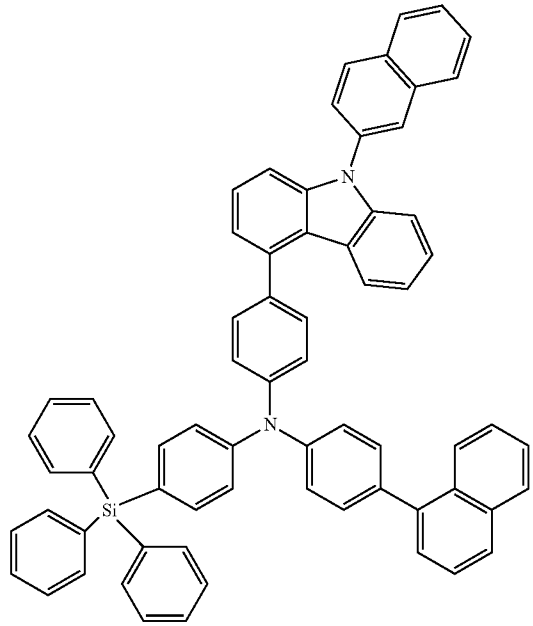
B43
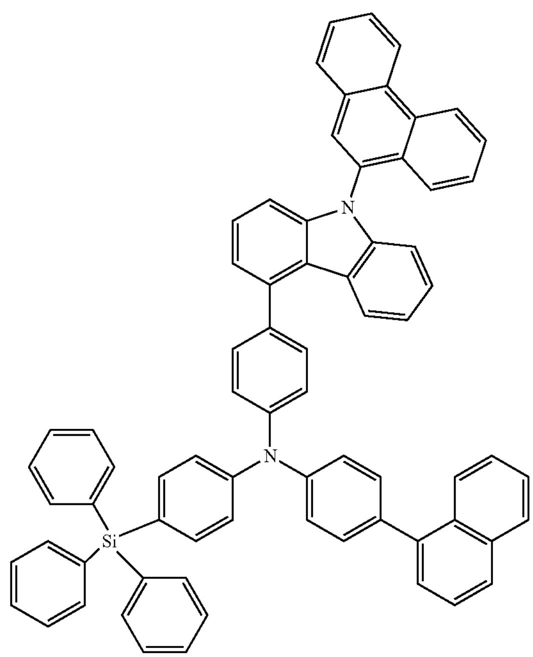

-continued
B44
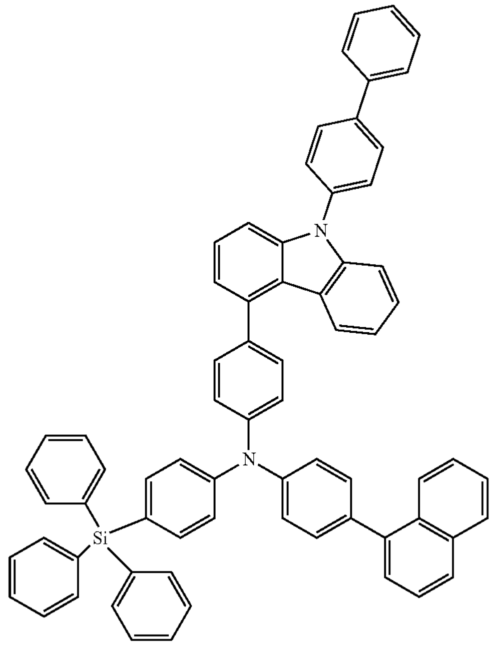
B45
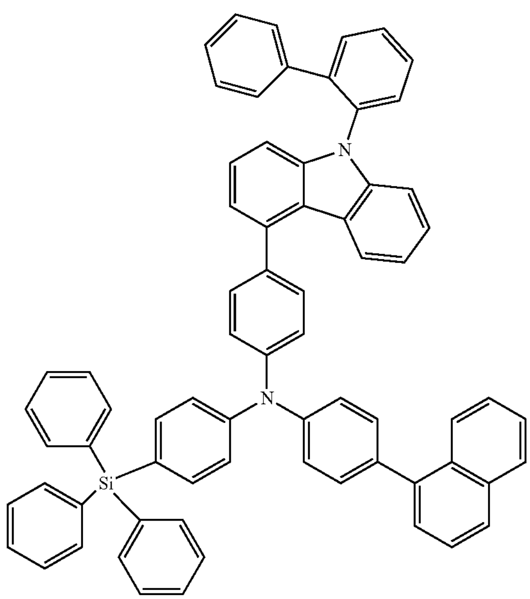
-continued
B46
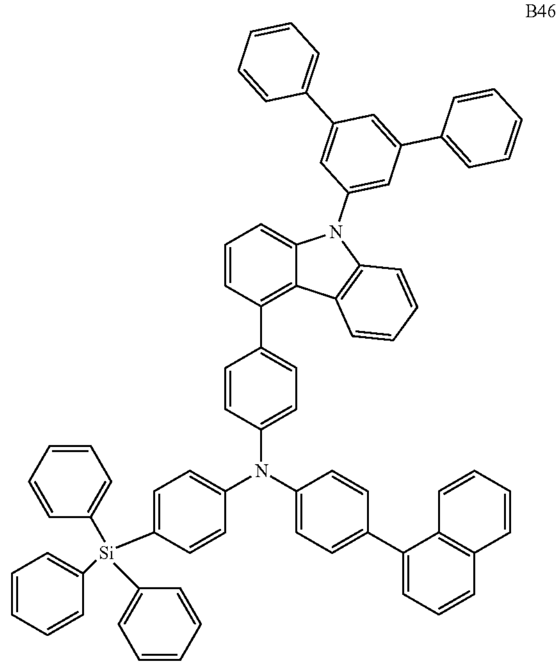
B47
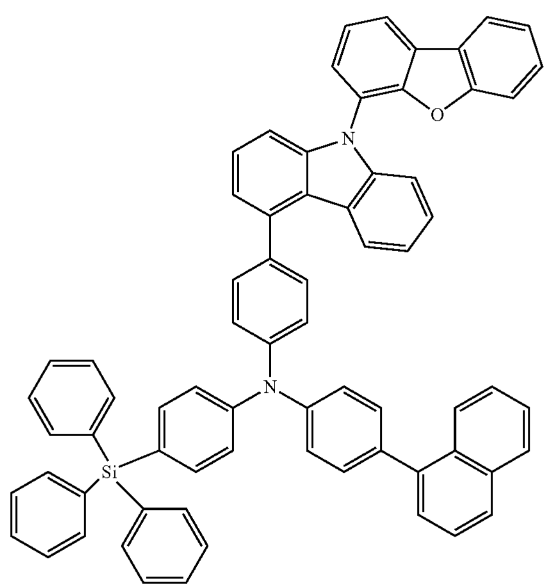

-continued
B48
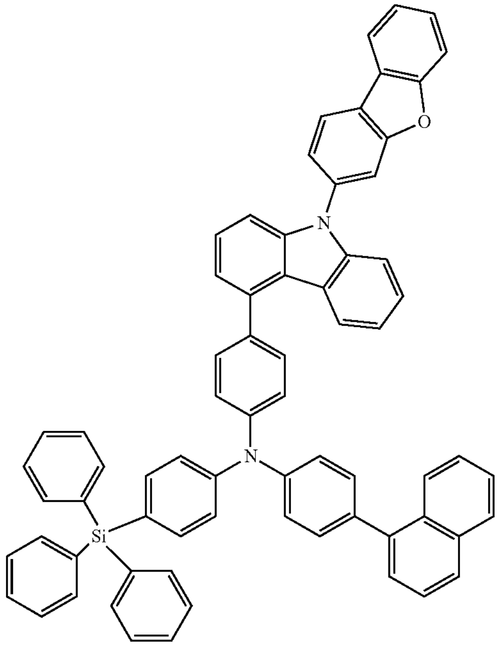
B49
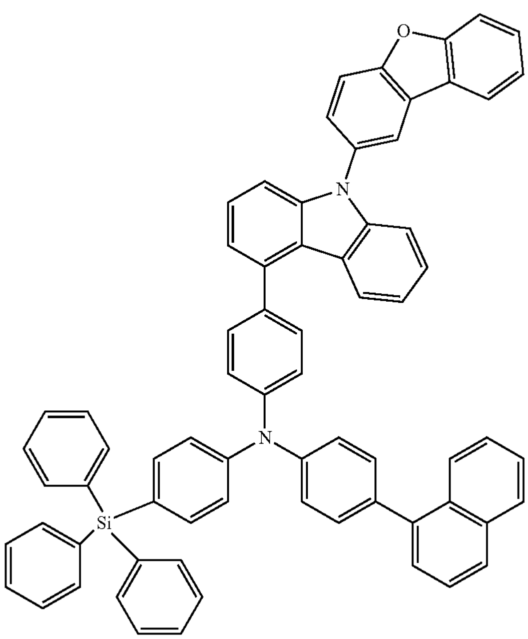
-continued
B50
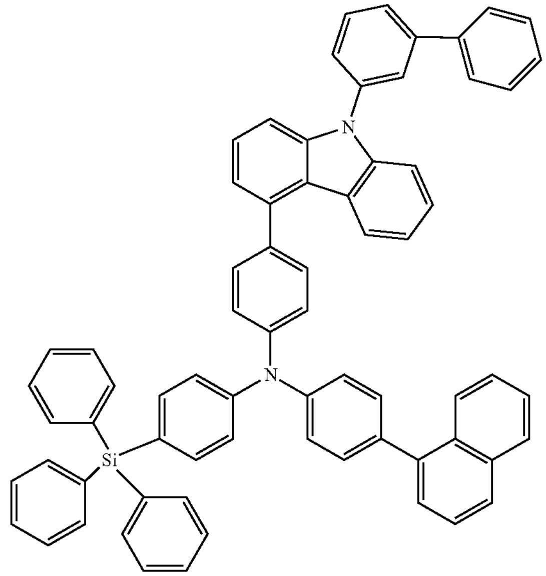
B51
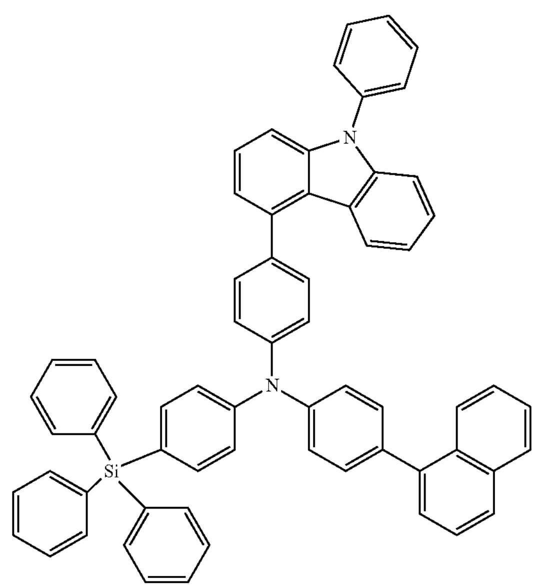

-continued
B52
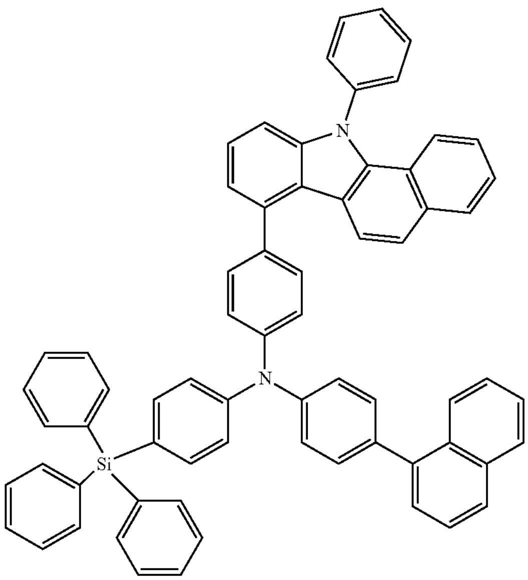
B53
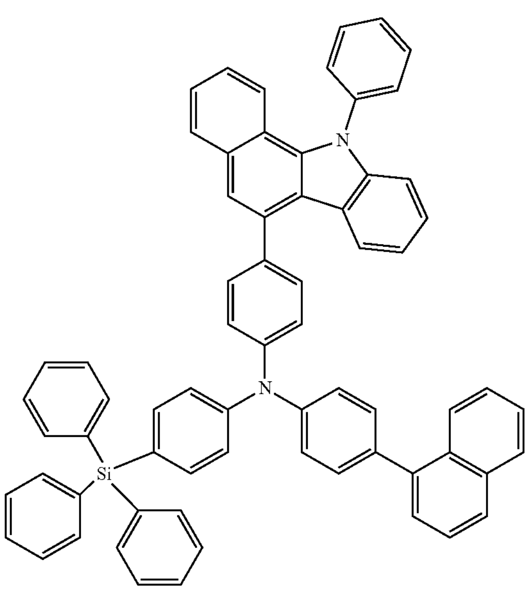
-continued
B54
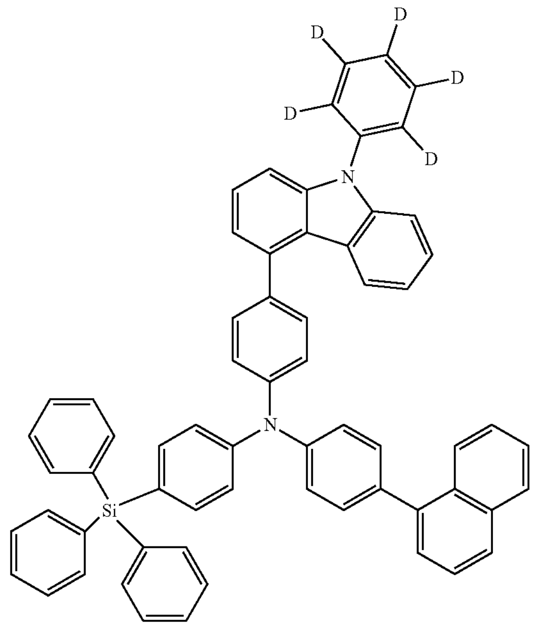
B55
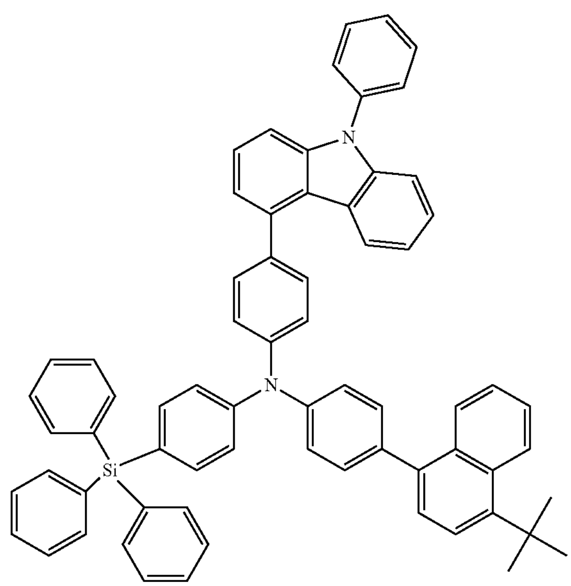

-continued
B56
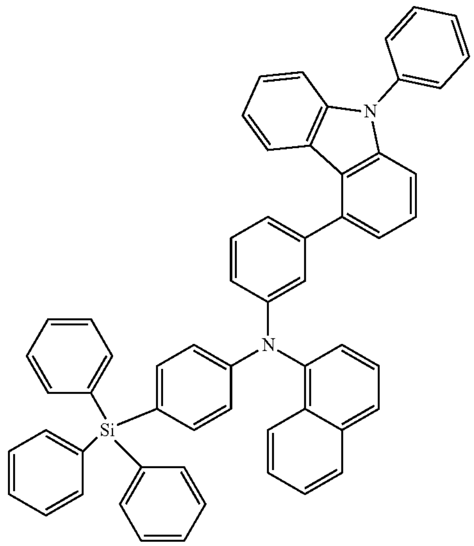
B57
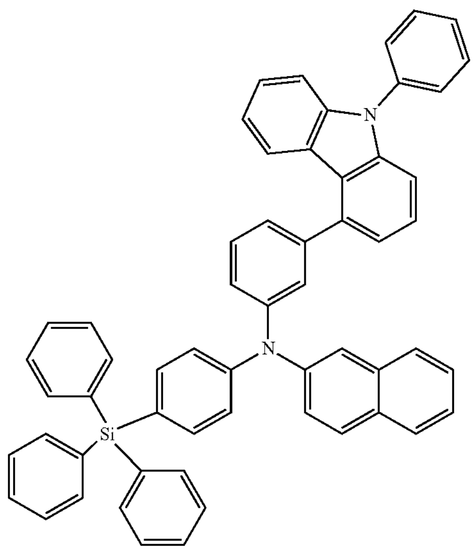
B58
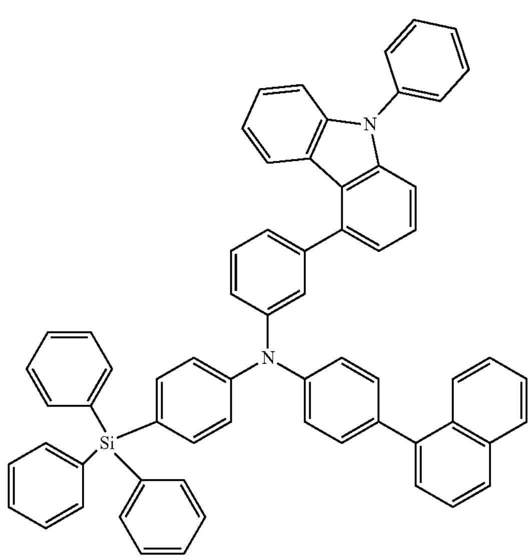
-continued
B59
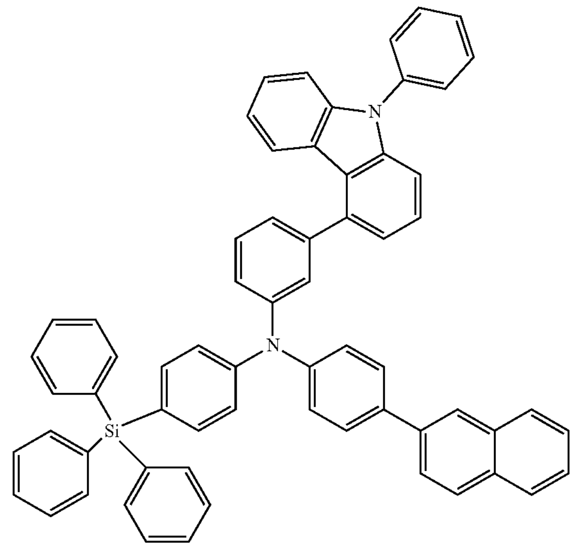
B60
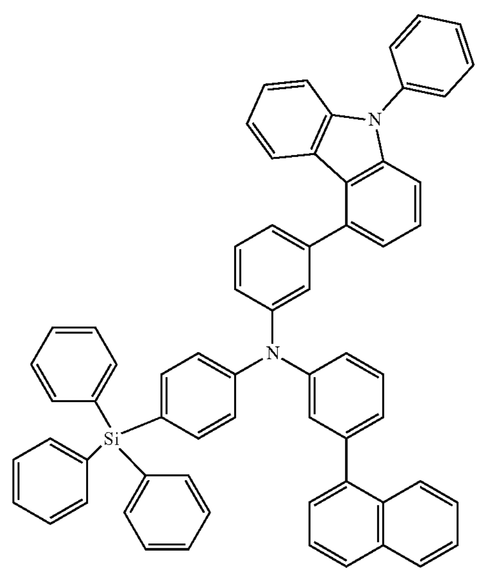

-continued
B61
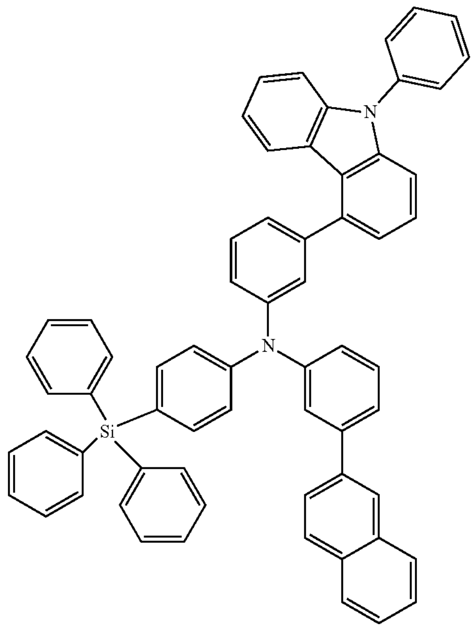
B62
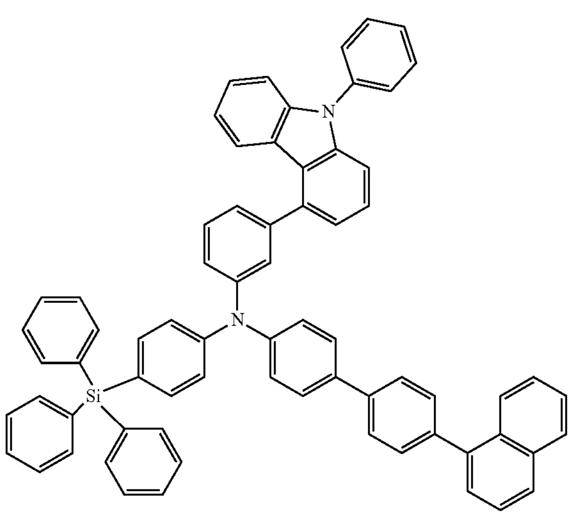
-continued
B63
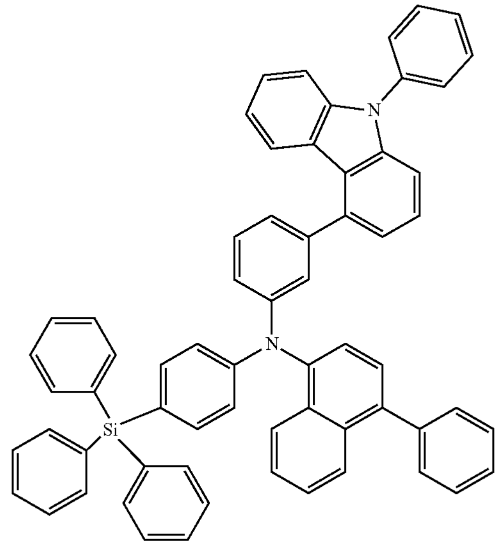
B64
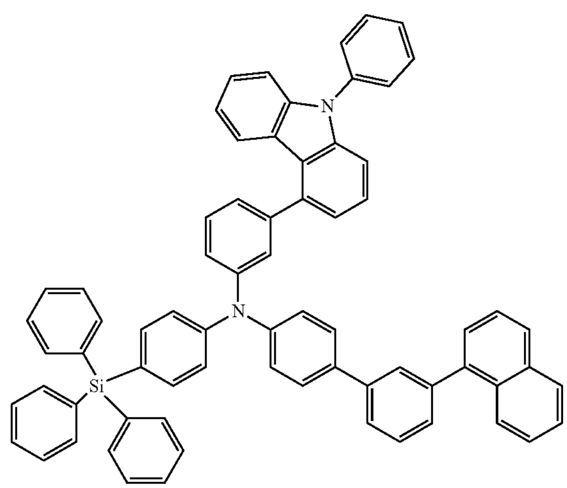
B65
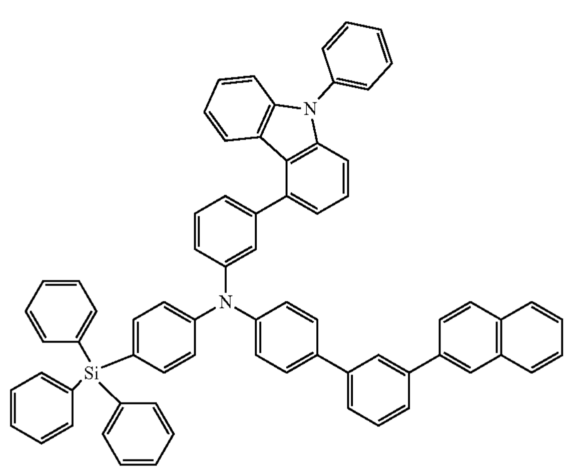

-continued
B66
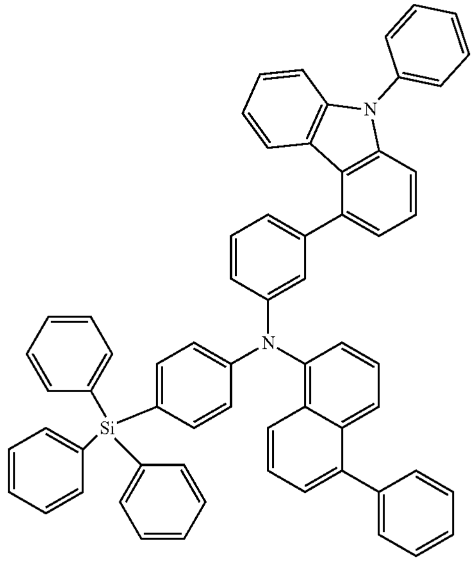
B67
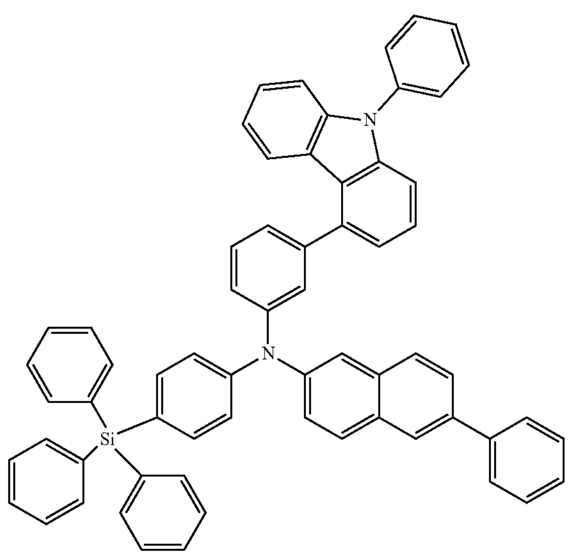
-continued
B68
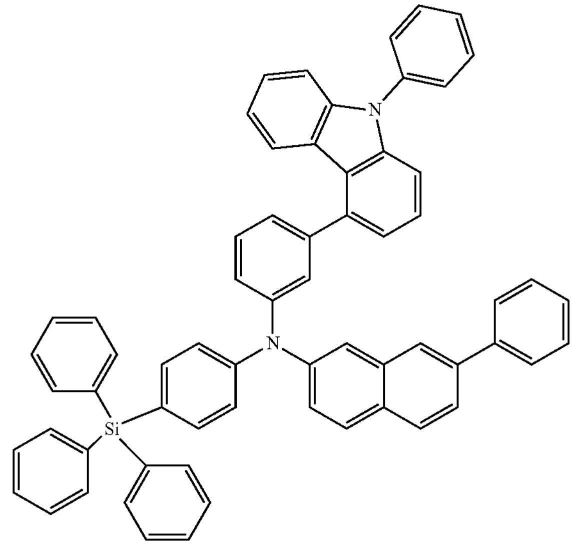
B69
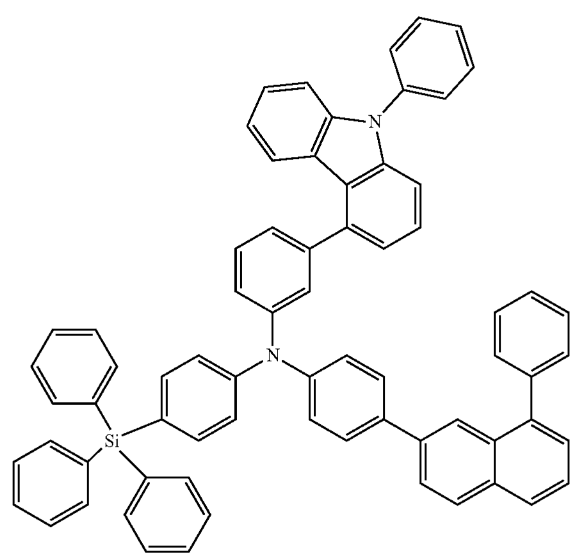

-continued
B70
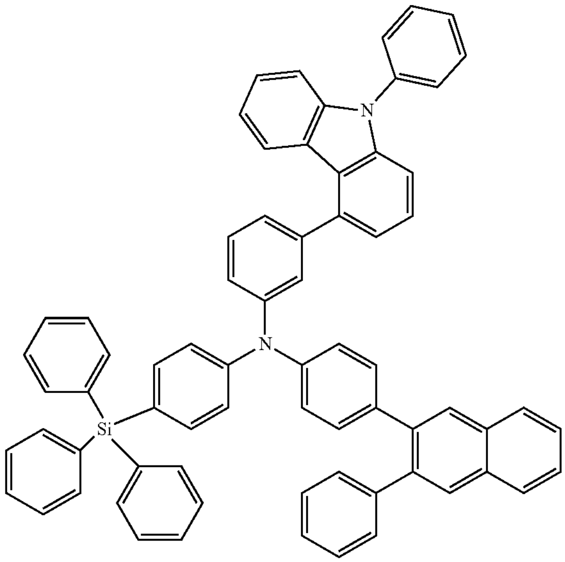
B71
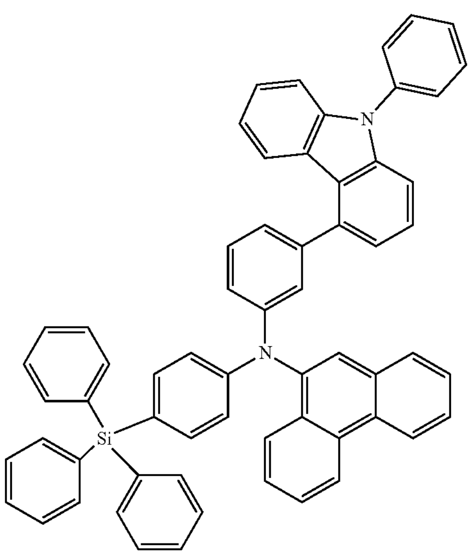
-continued
B72
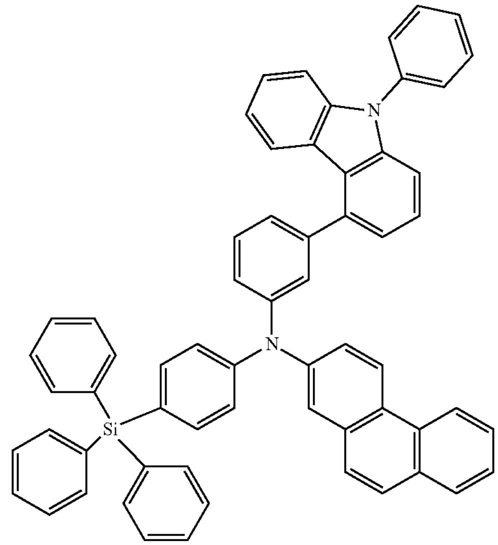
B73
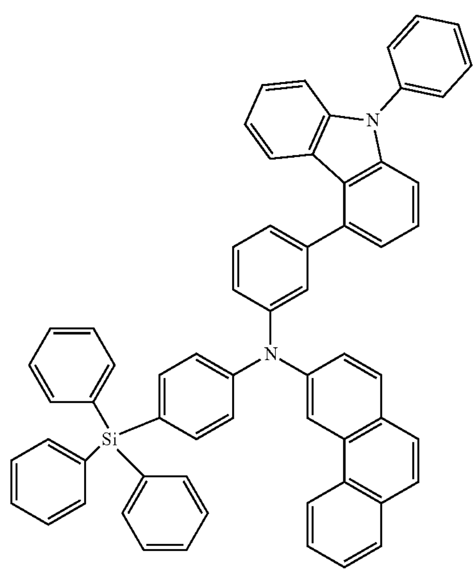

B74
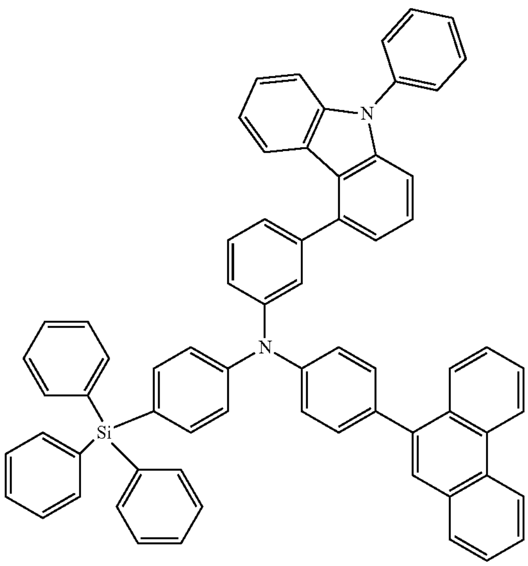
B75
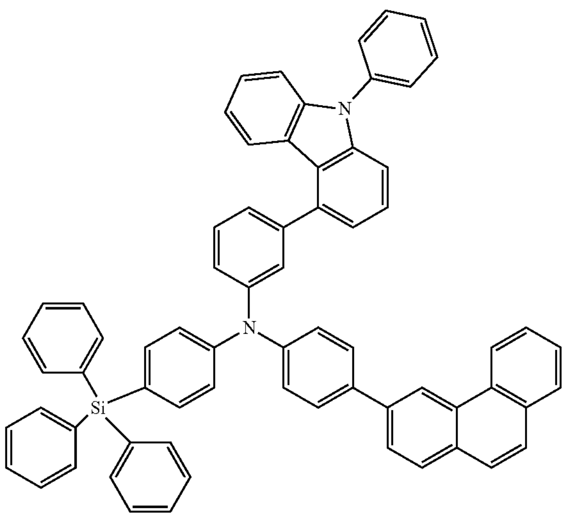
B76
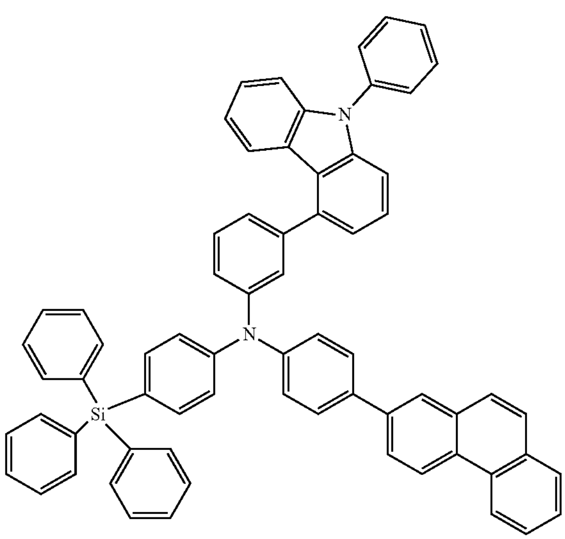
B77
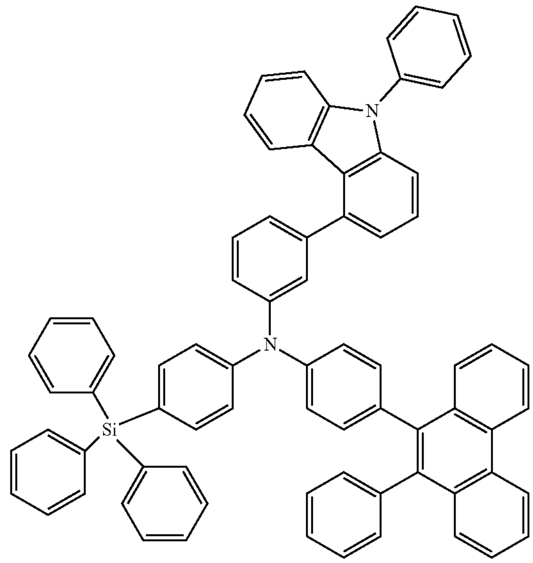
B78
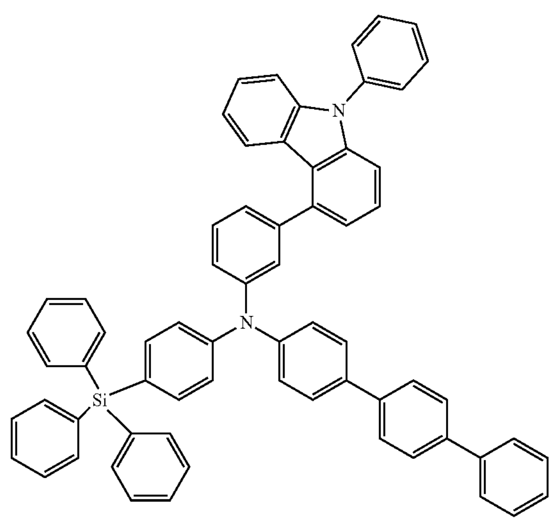

-continued
B79
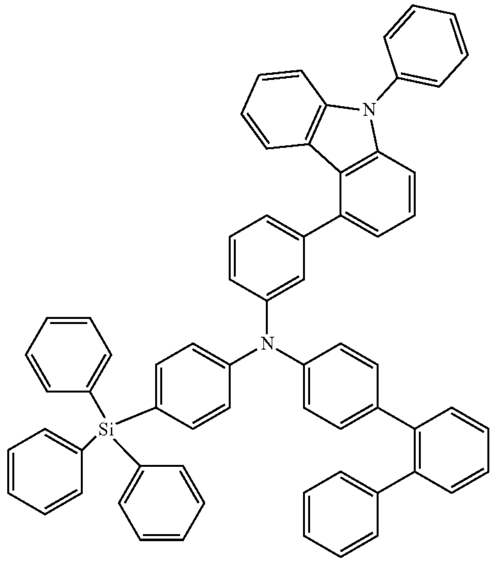
B80
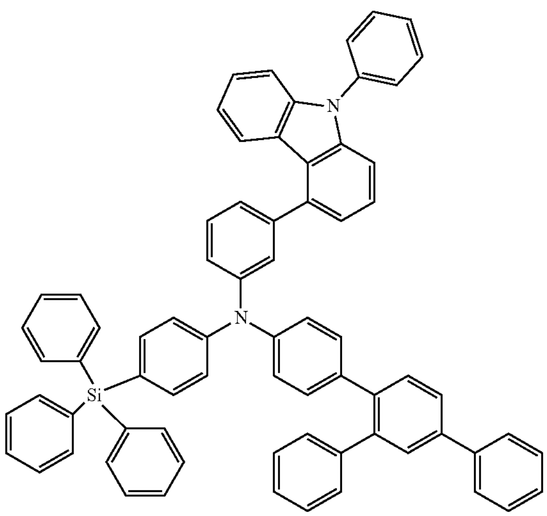
B81
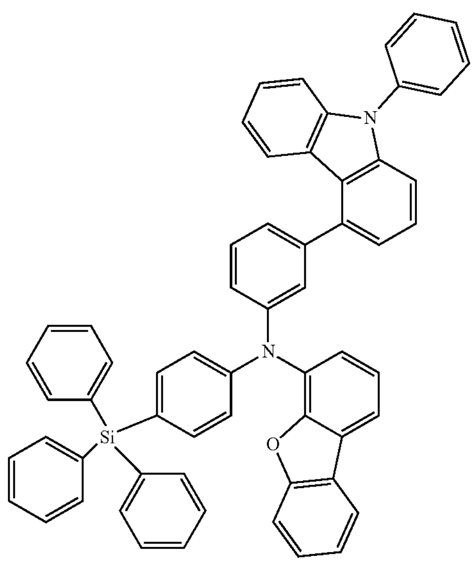
-continued
B82
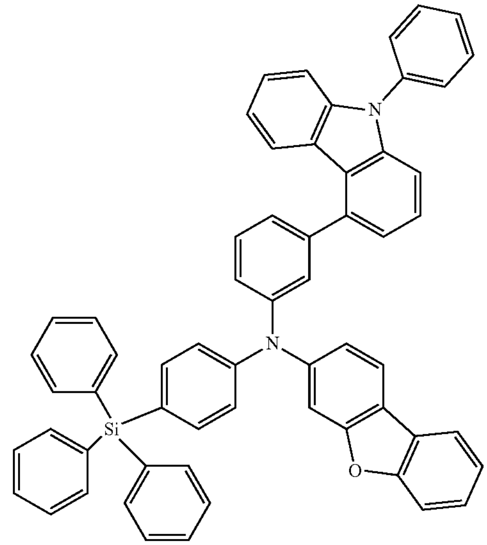
B83
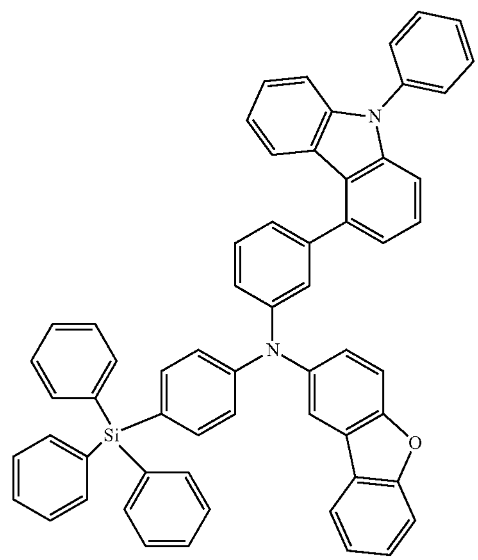
B84
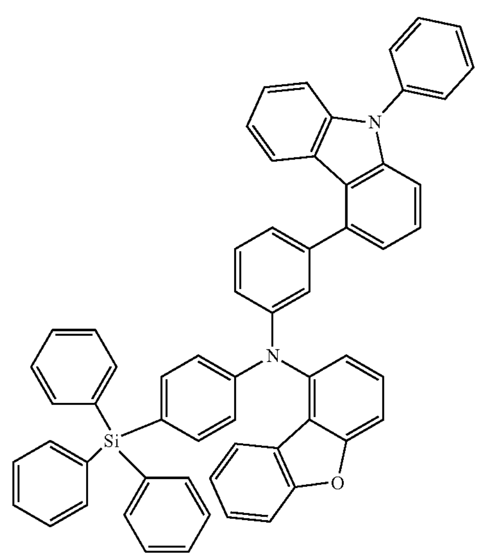

B85
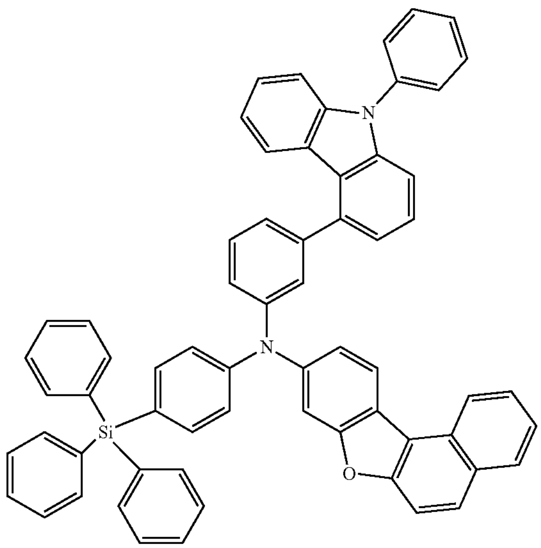
B86
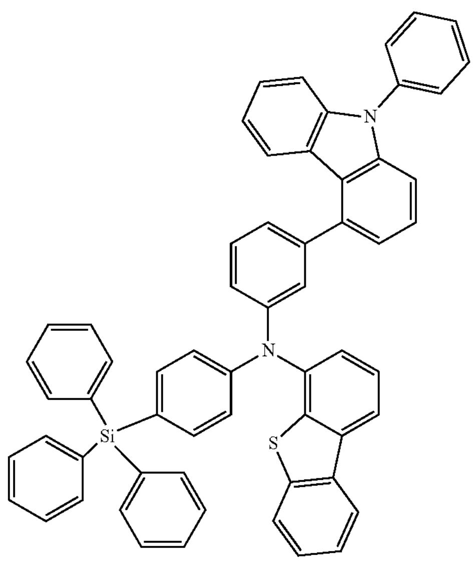
B87
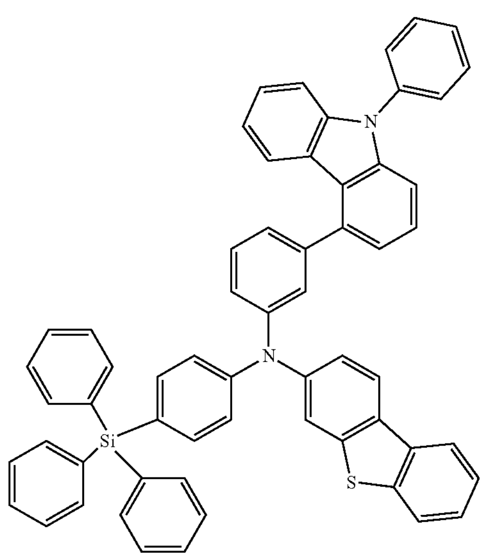
B88
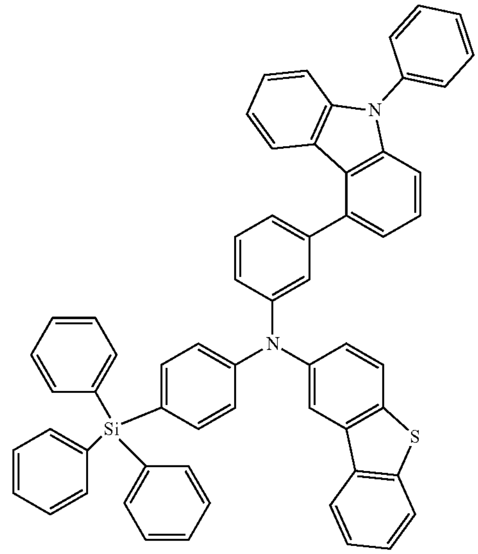
B89
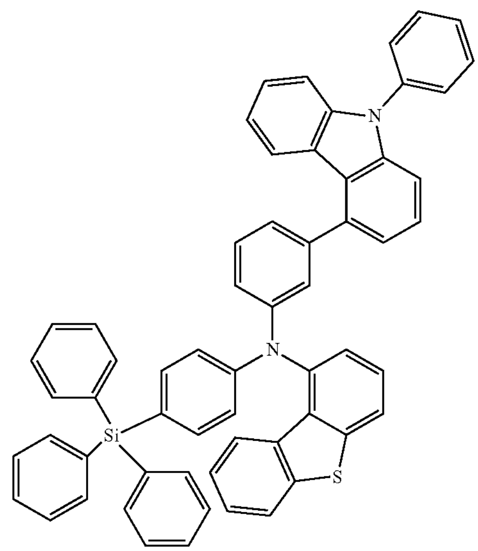
B90
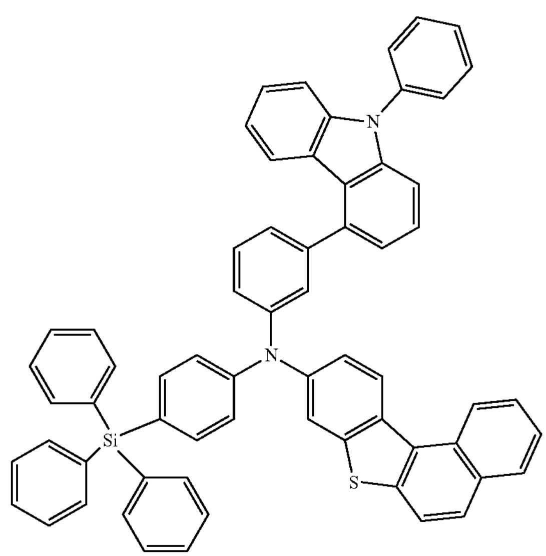

-continued
B91
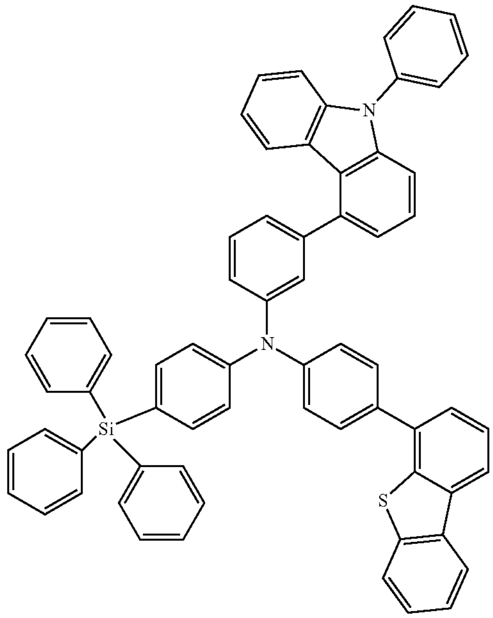
-continued
B93
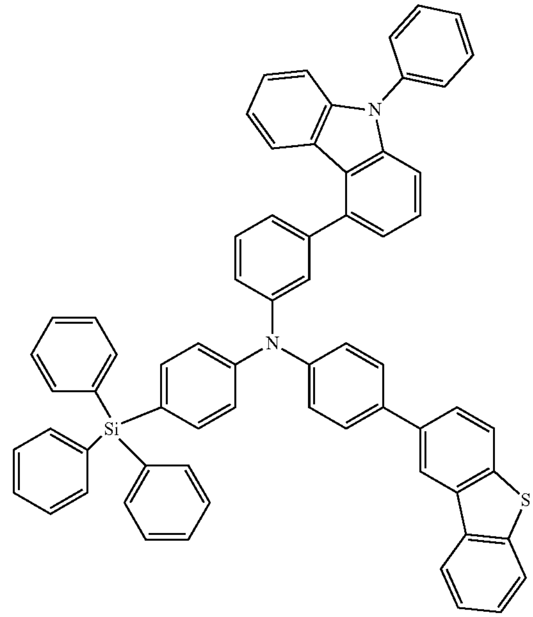
B92
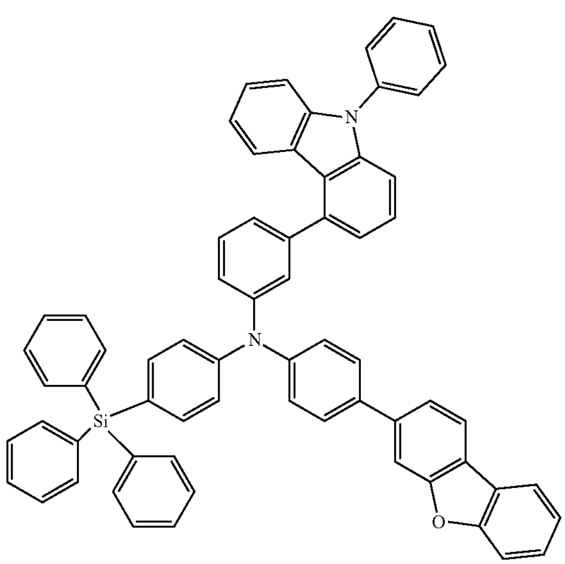
B94
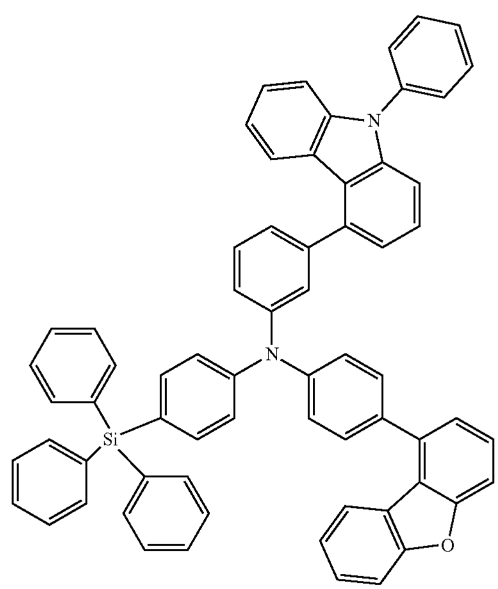

-continued
B95
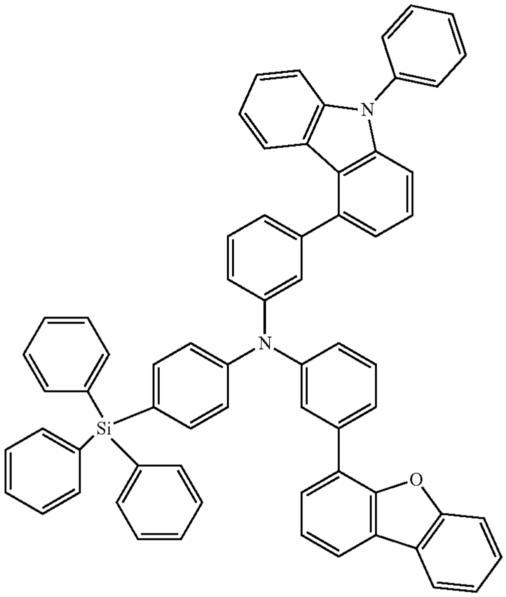
B96
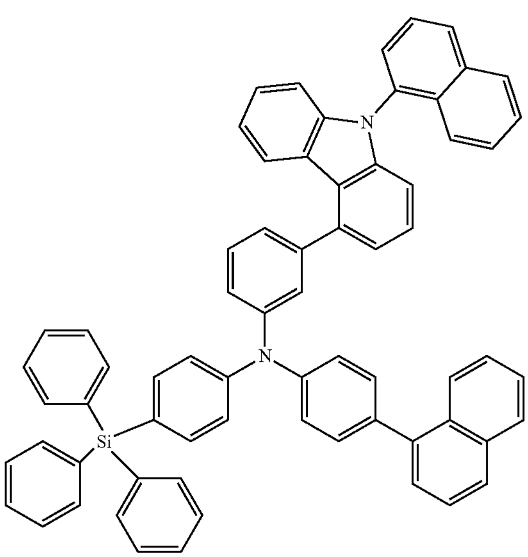
-continued
B97
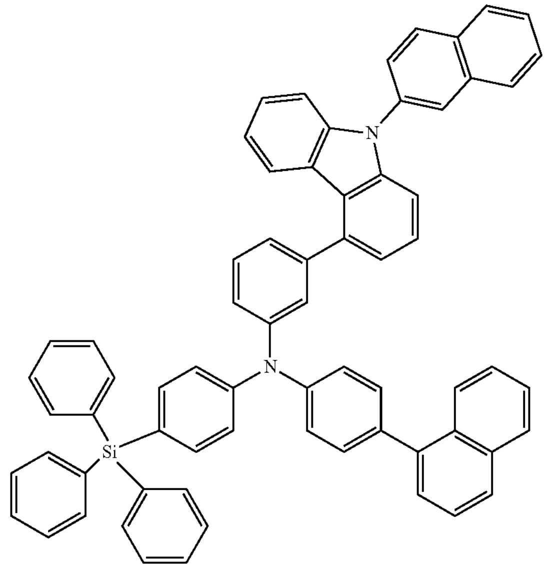
B98
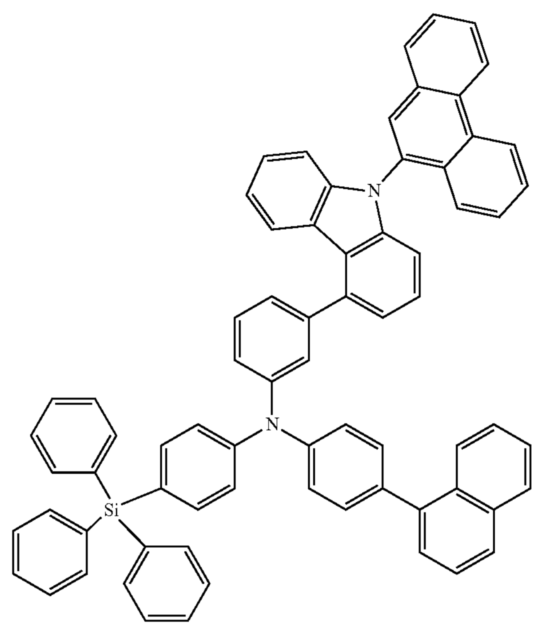

-continued
B99
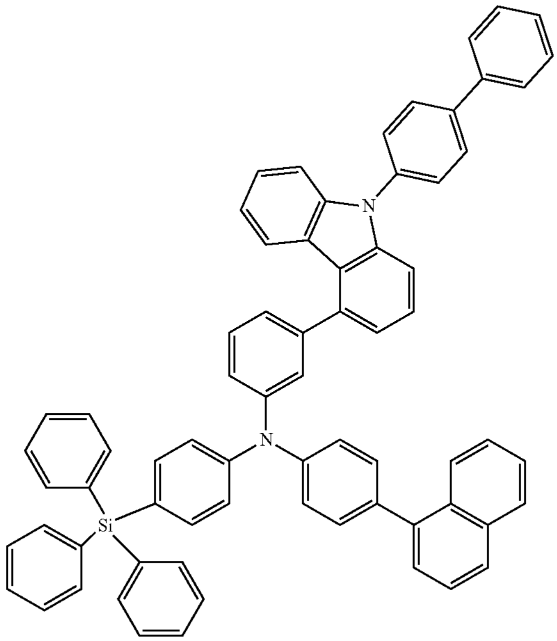
B100
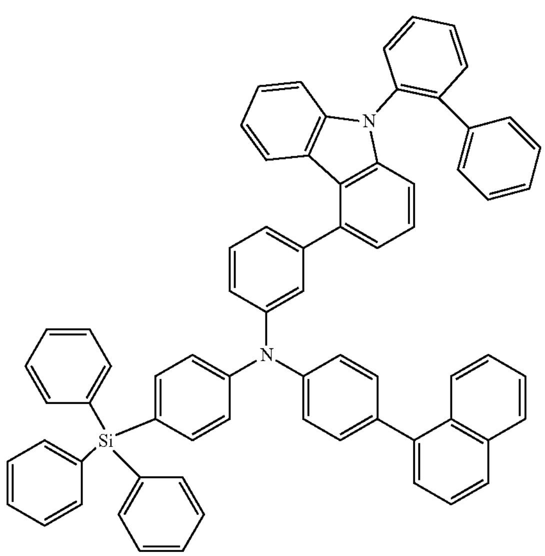
-continued
B101
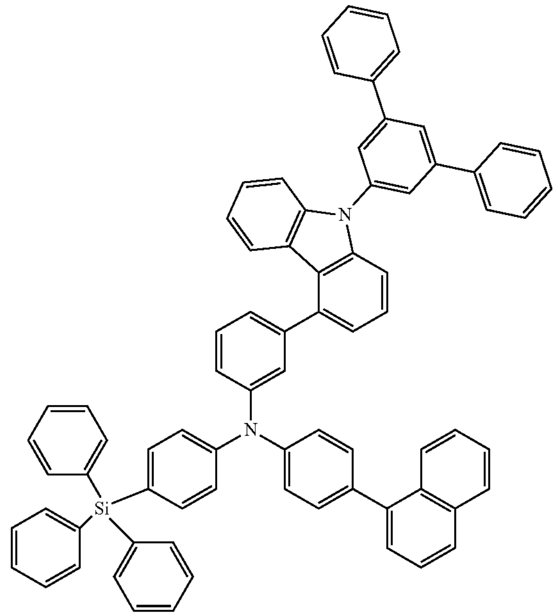
B102
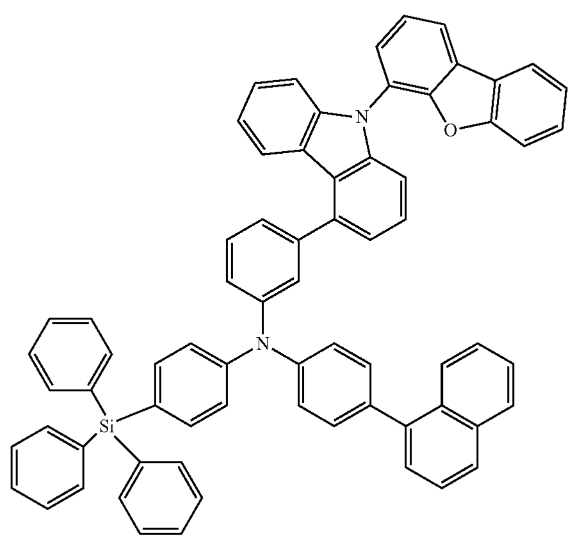

-continued
B103
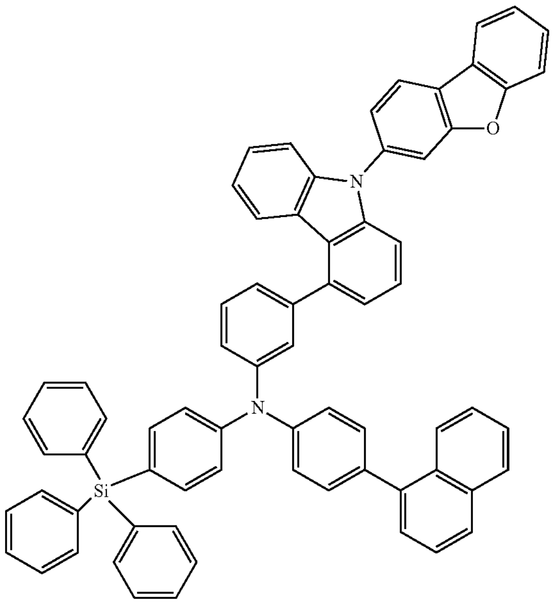
B104
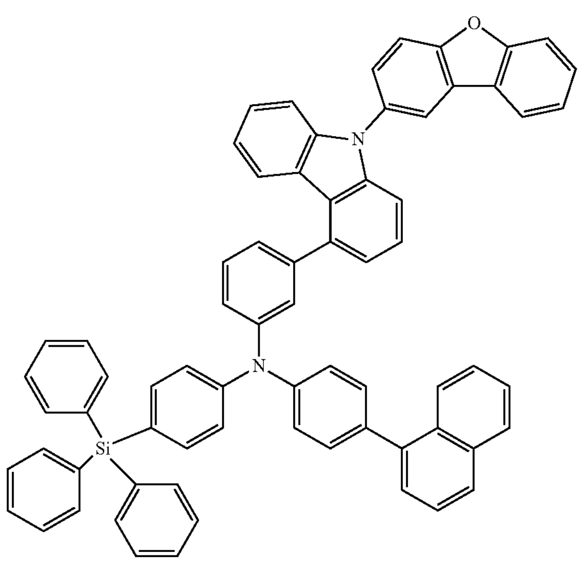
-continued
B105
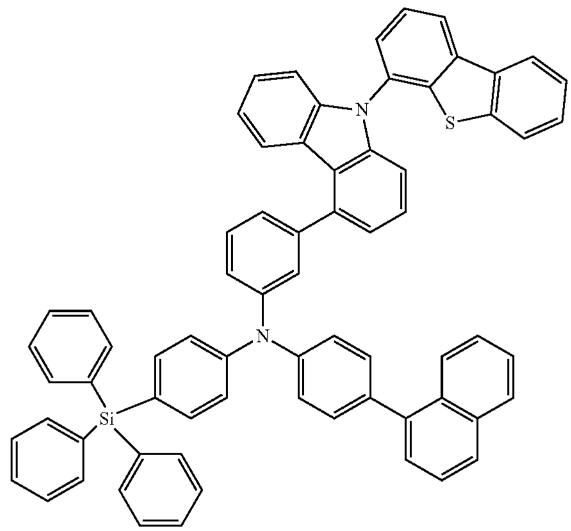
B106
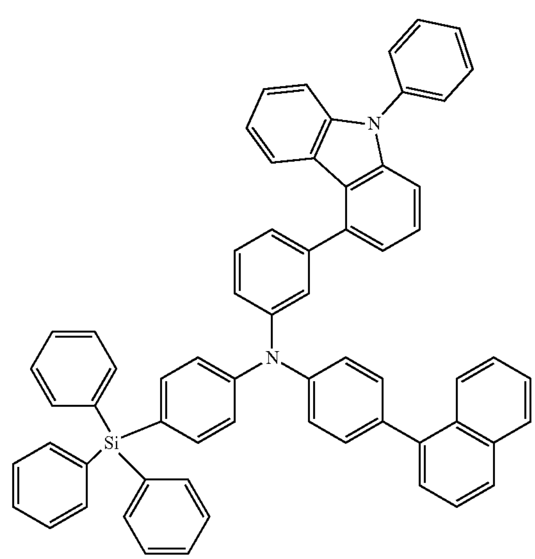

-continued
B107
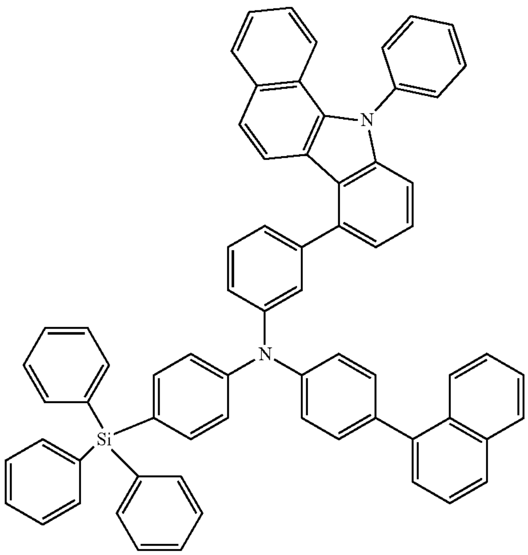
B108
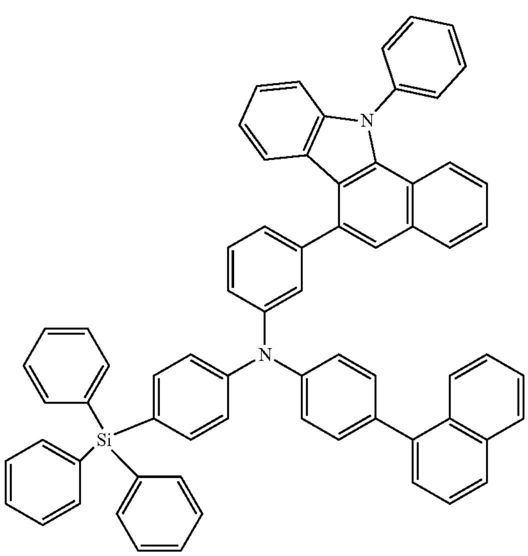
-continued
B109
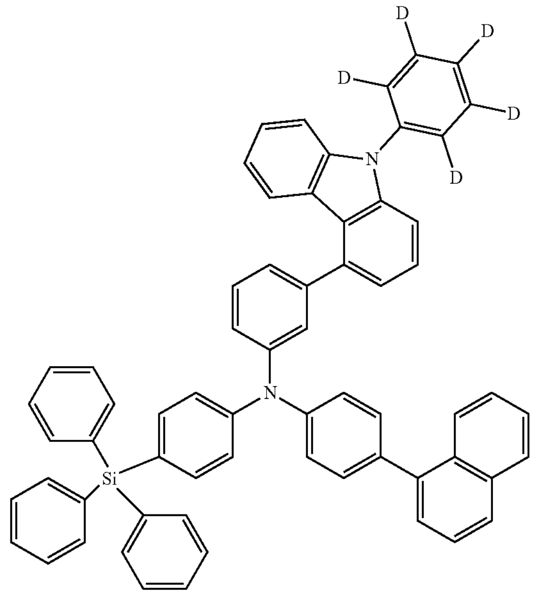
B110
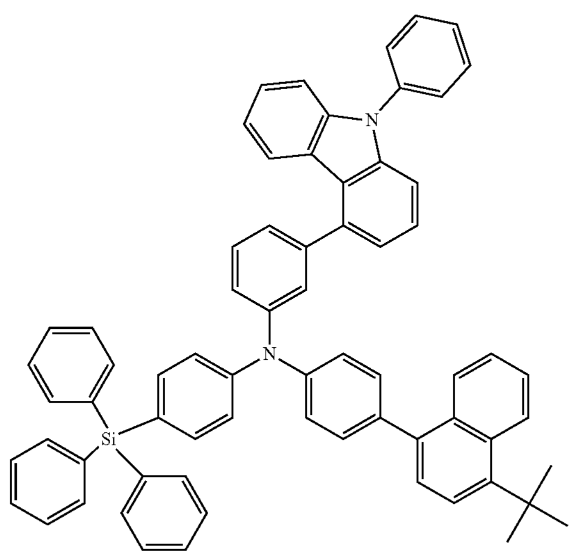

-continued
B111
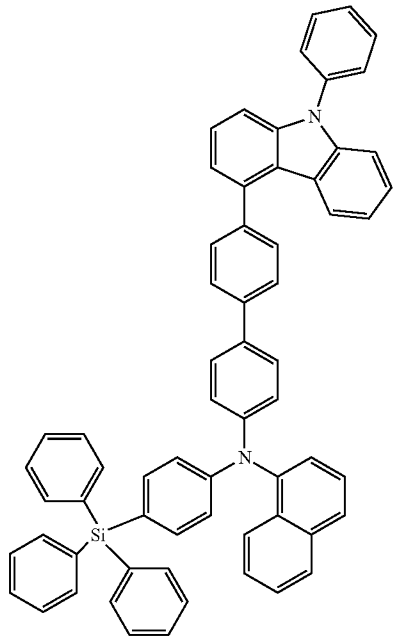
B112
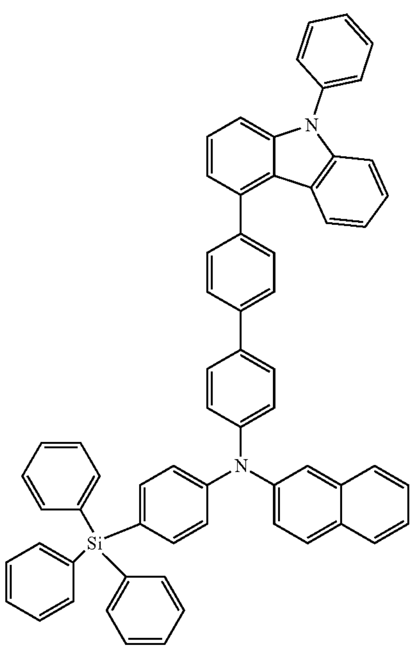
-continued
B113
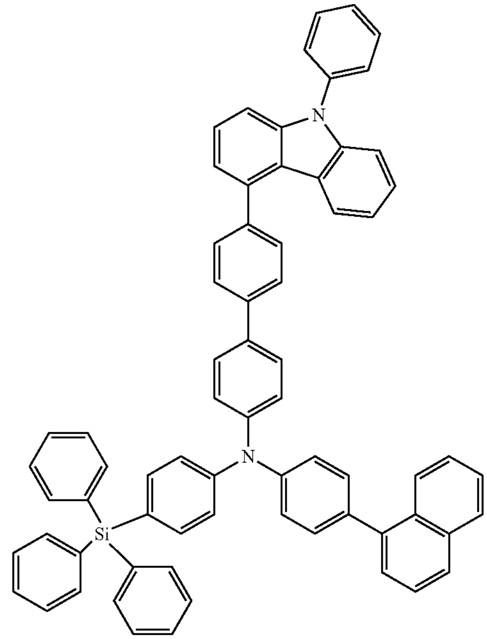
B114
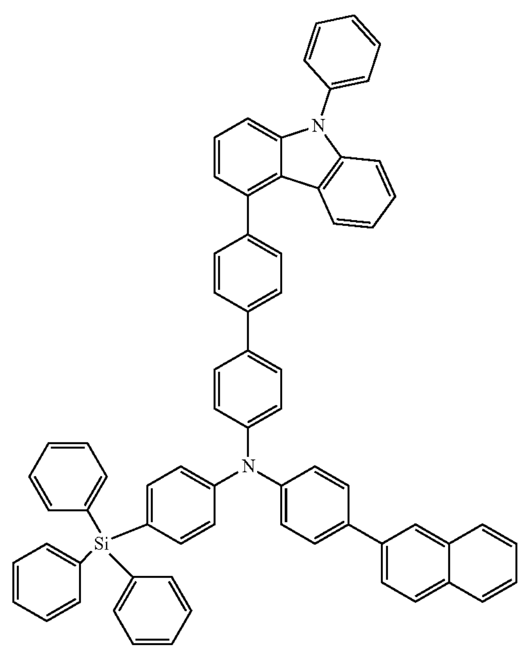

-continued
B115
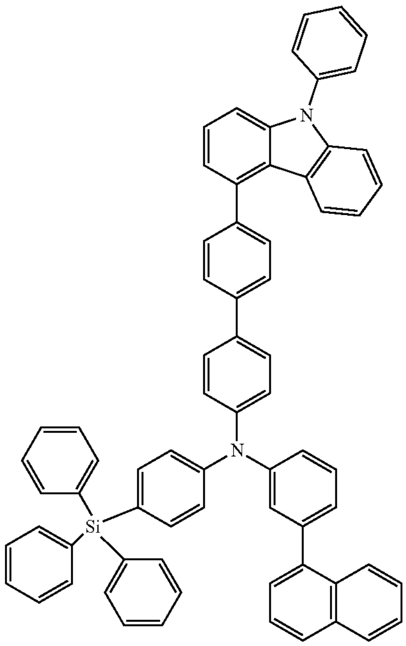
B117
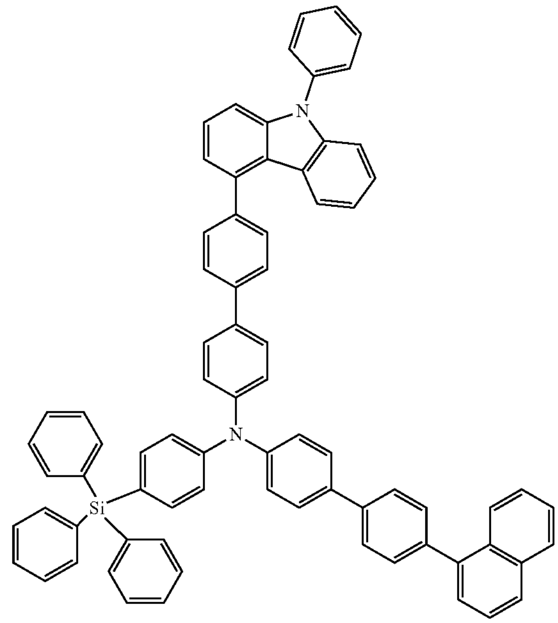
B116
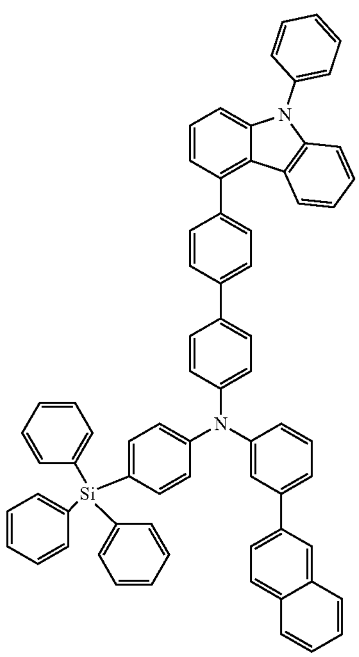
B118
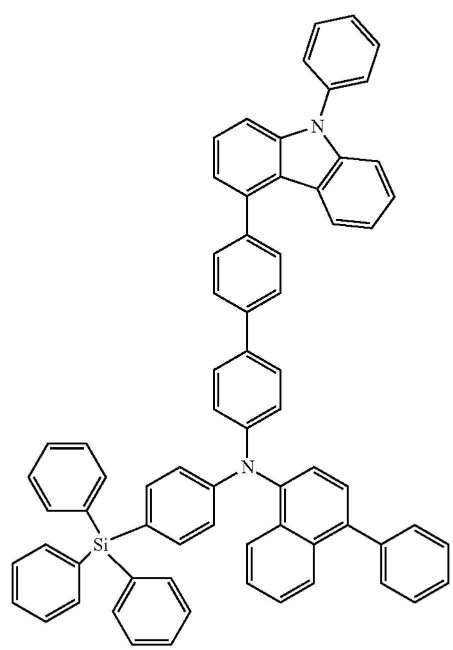

B119
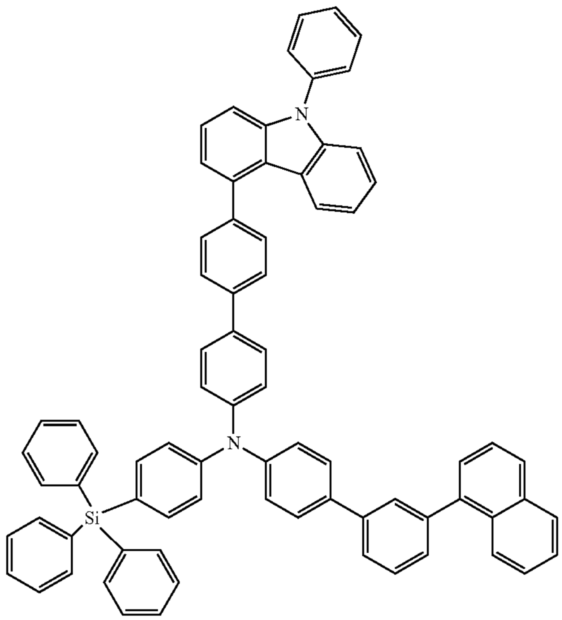
B120
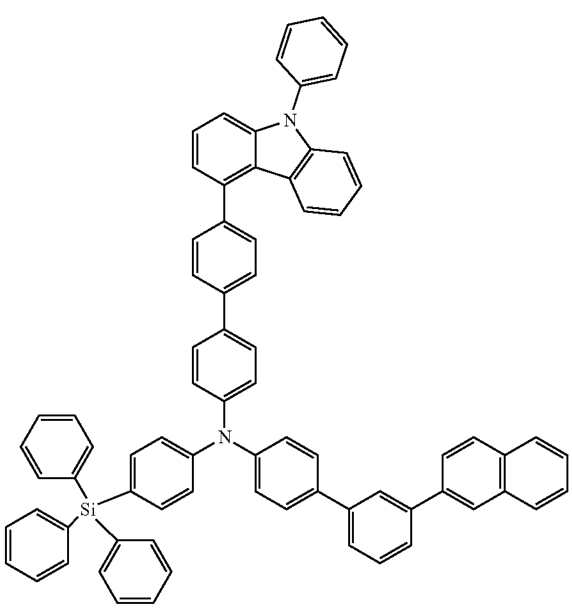
B121
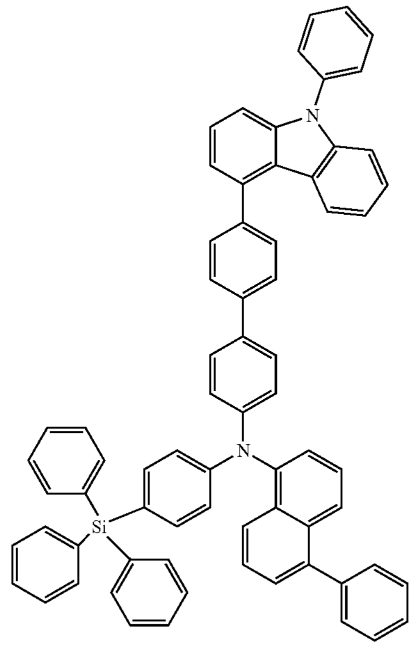
B122
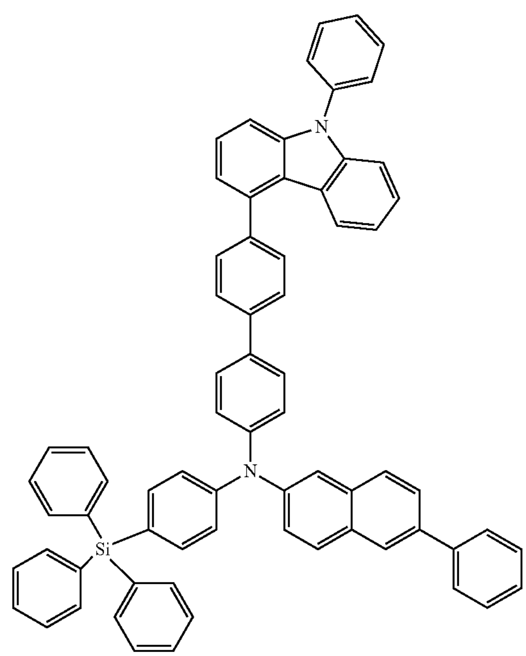

-continued
B123
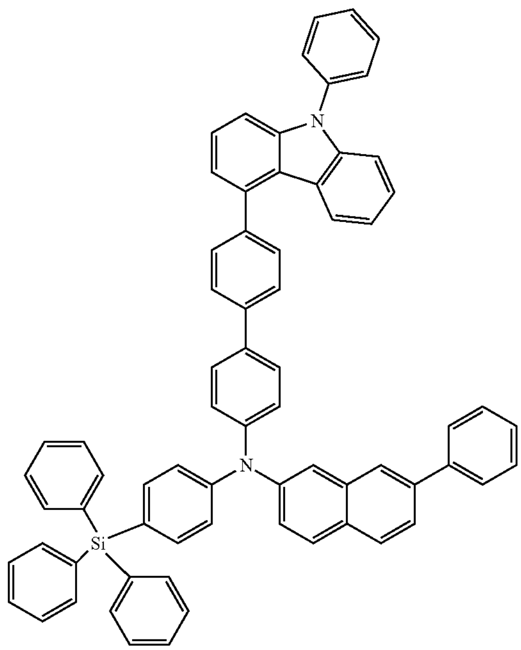
B124
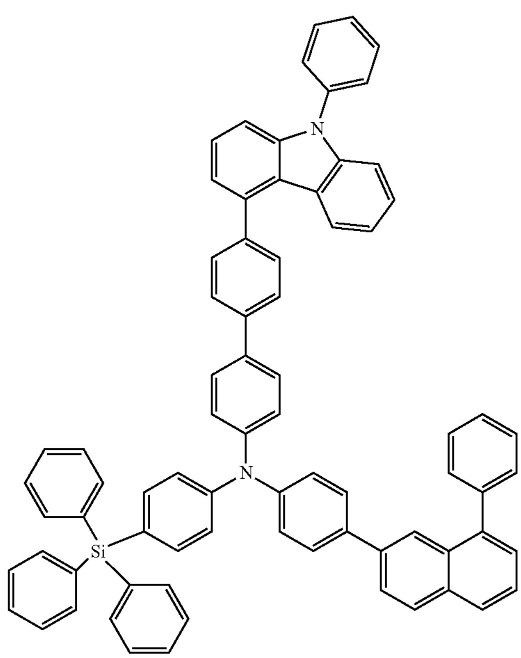
-continued
B125
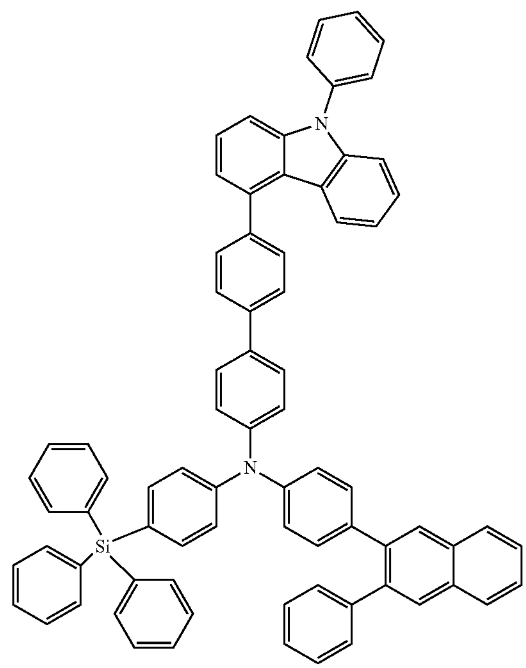
B126
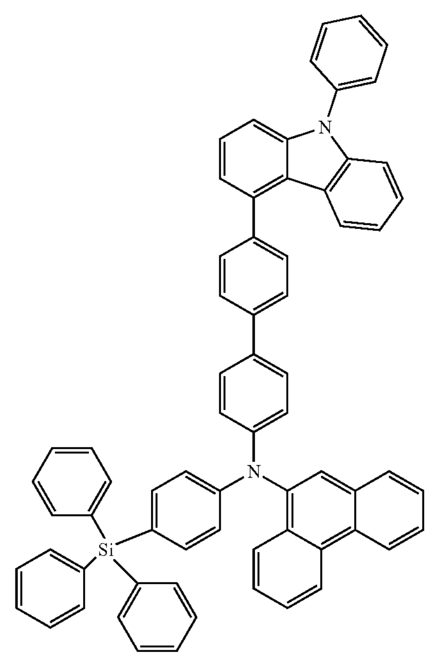

-continued
B127
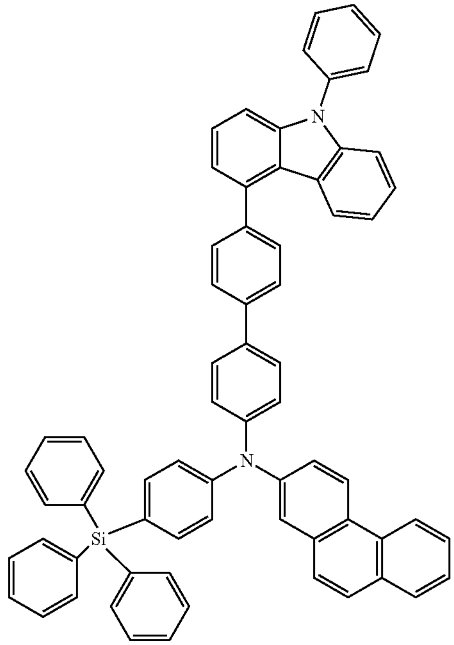
B128
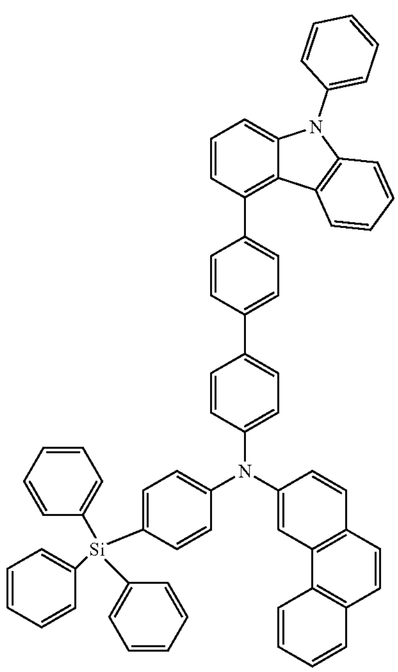
-continued
B129
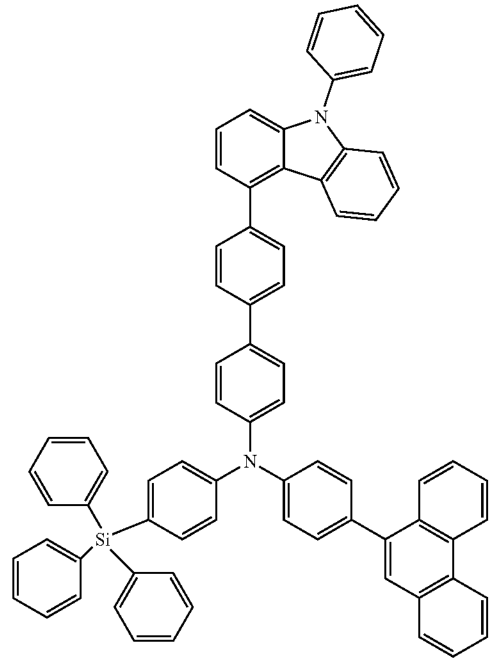
B130
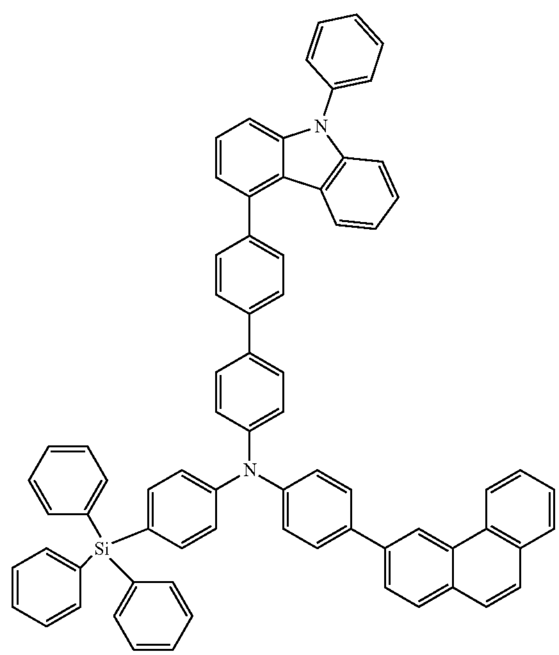

-continued
B131
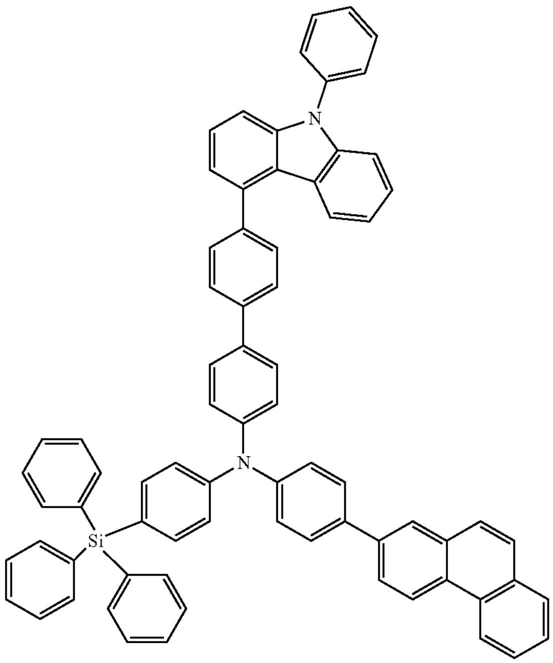
B132
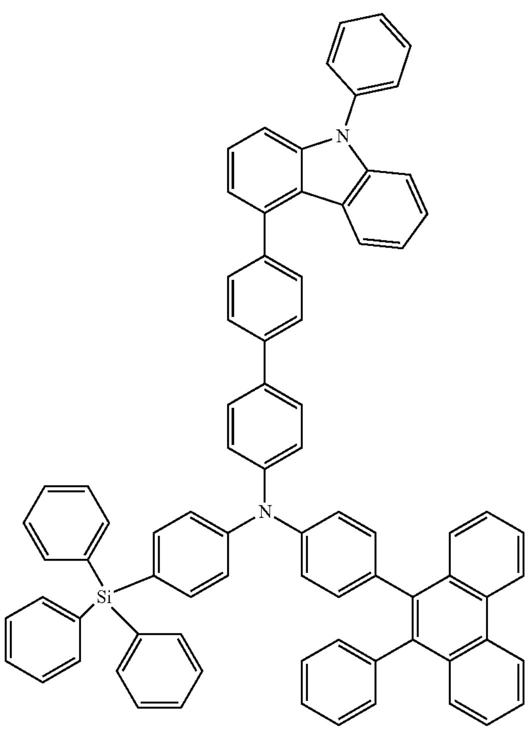
-continued
B133
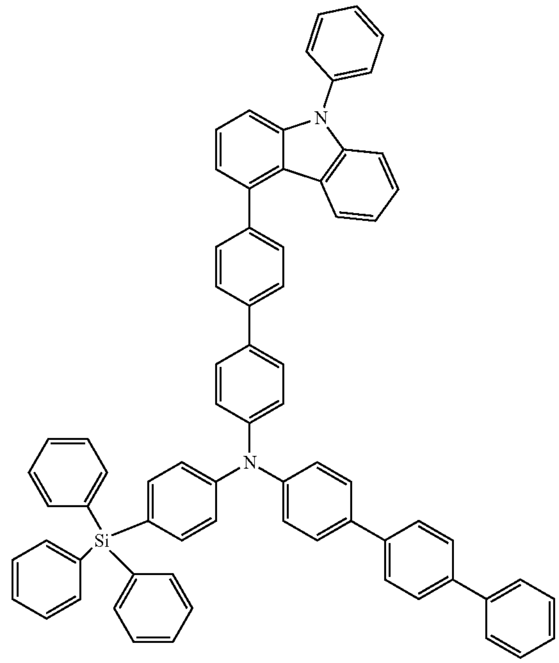
B134
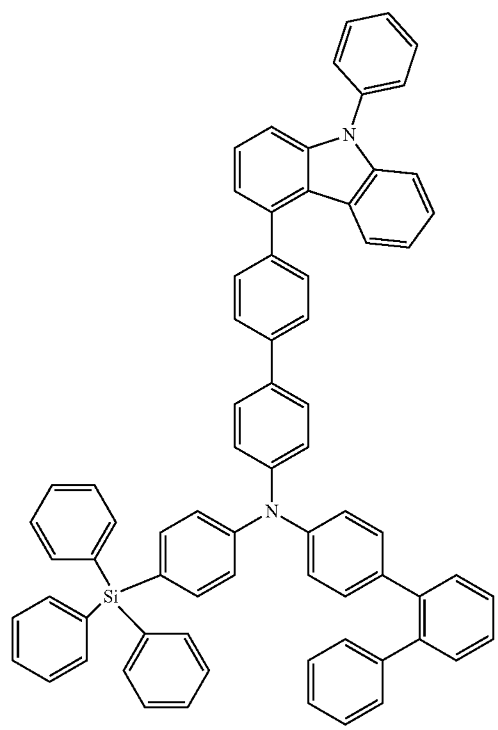

-continued
B135
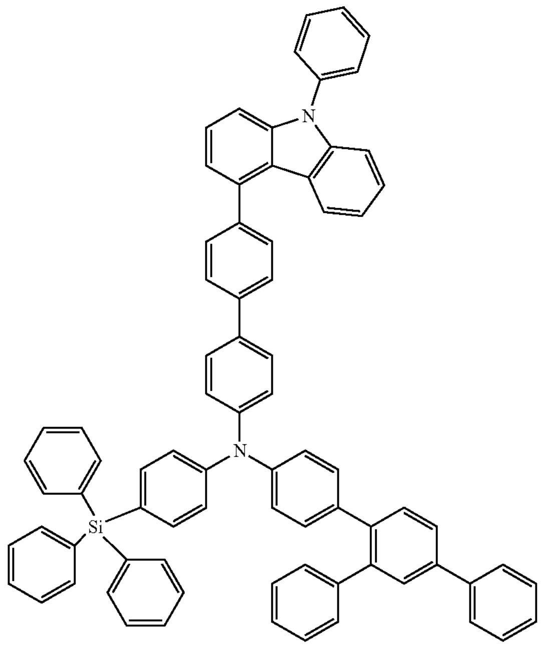
B136
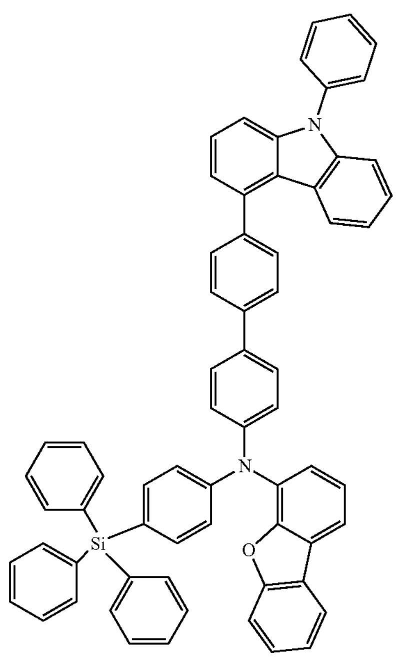
-continued
B137
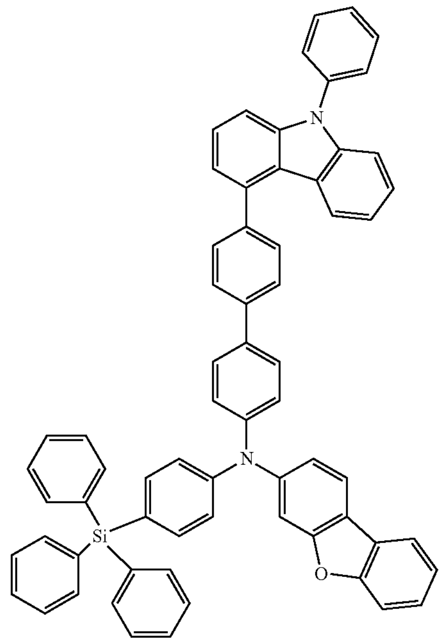
B138
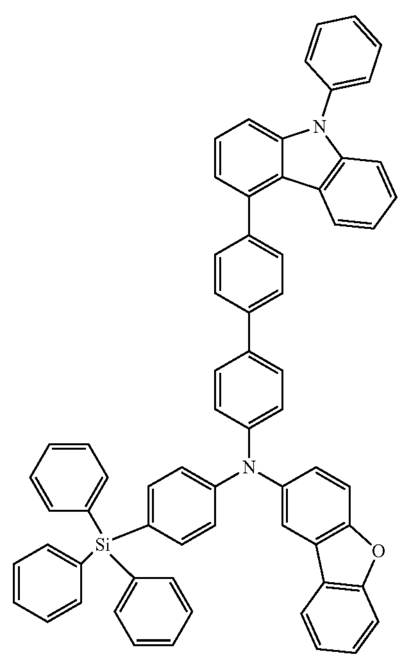

-continued
B139
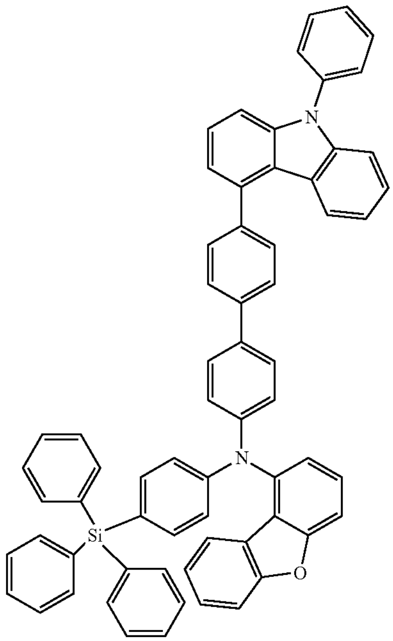
B140
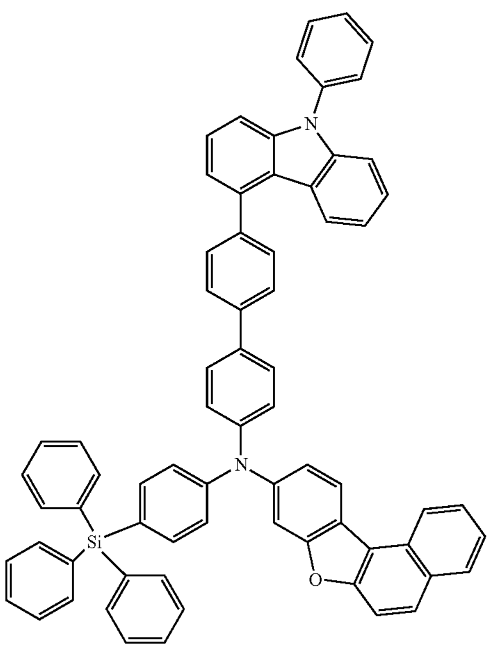
-continued
B141
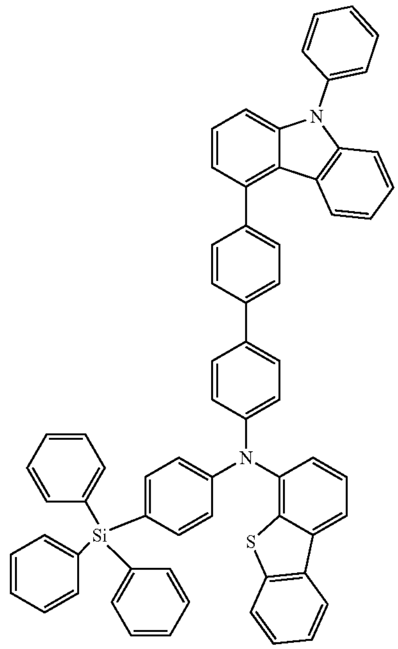
B142
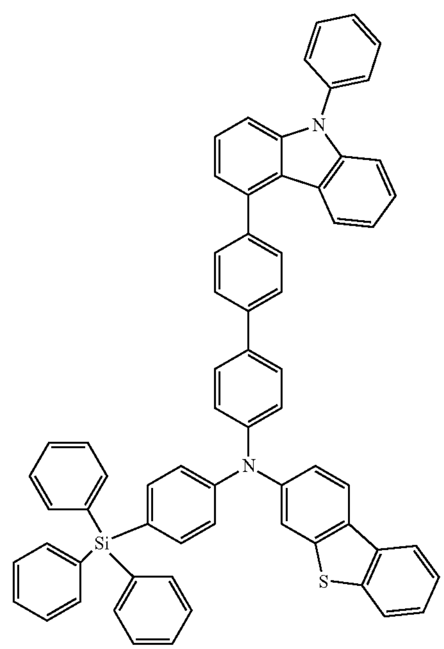

-continued
B143
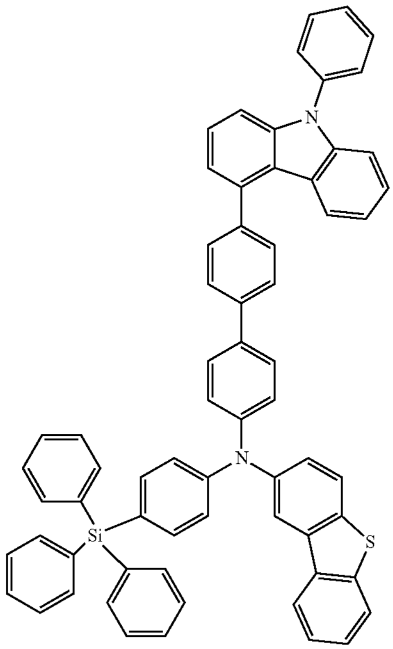
B144
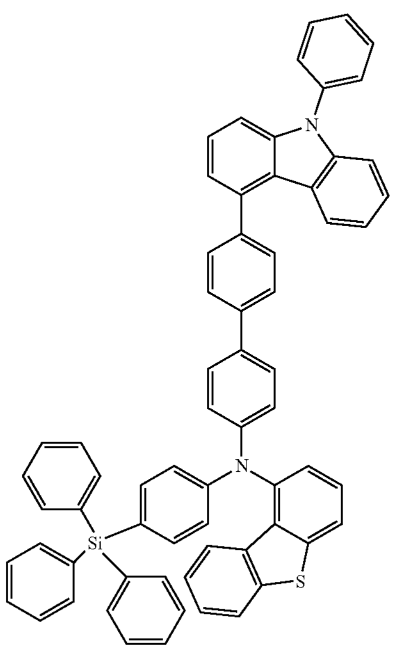
-continued
B145
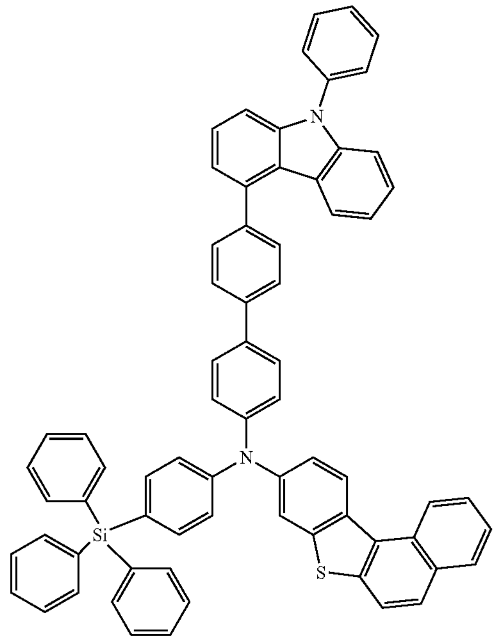
B146
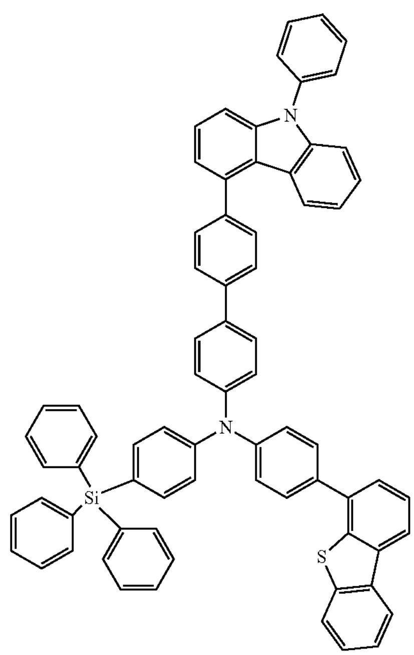

-continued
B147
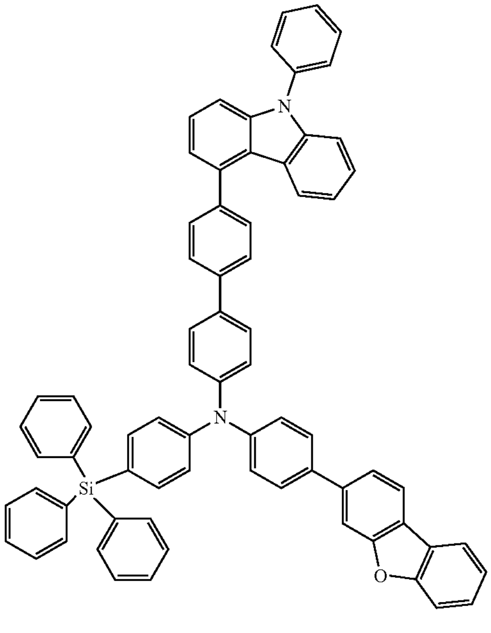
B148
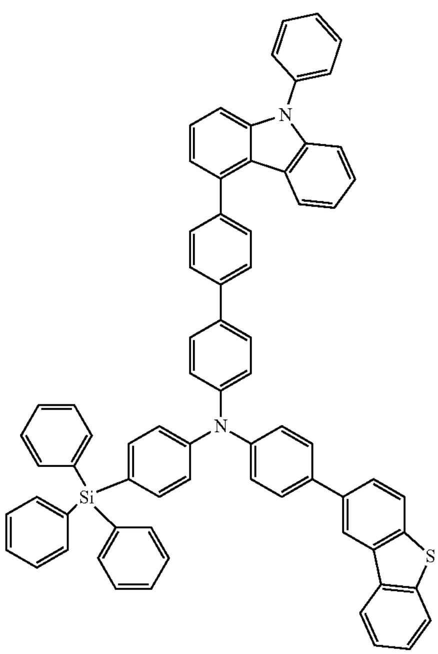
-continued
B149
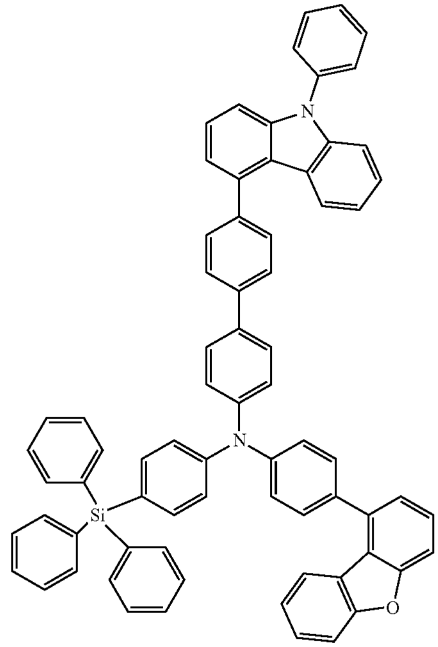
B150
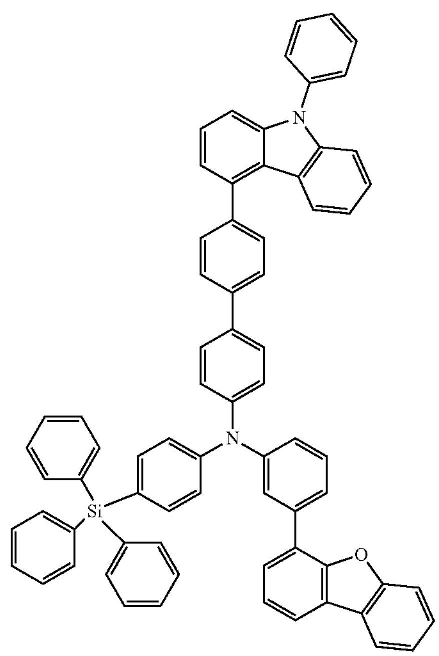

-continued
B151
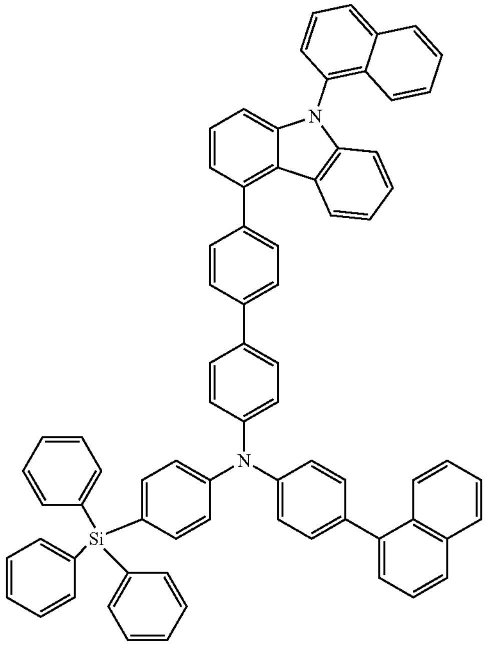
B152
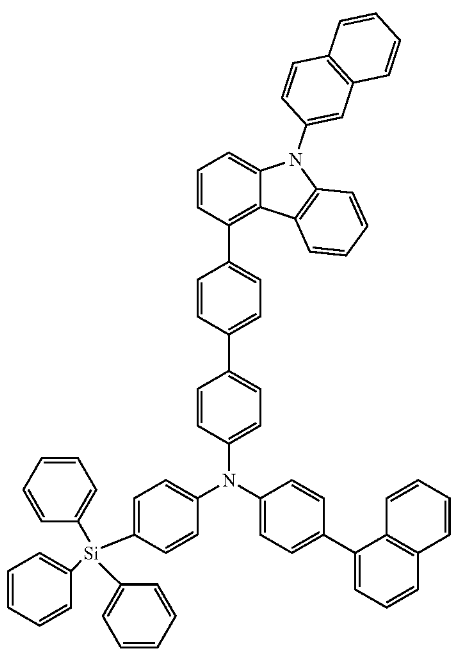
-continued
B153
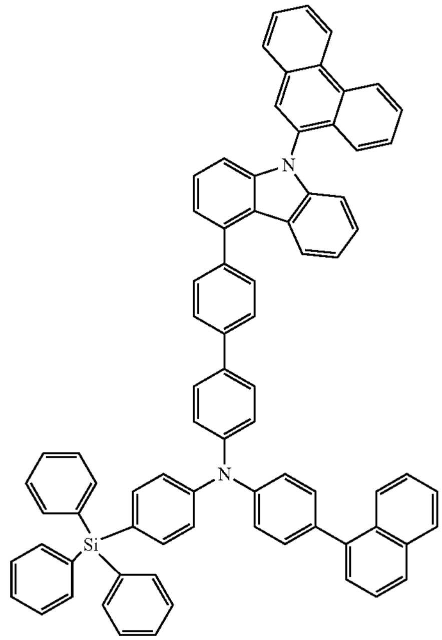
B154
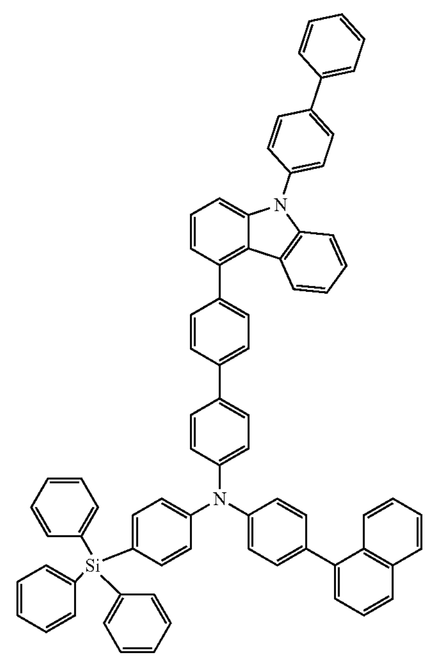

-continued
B155
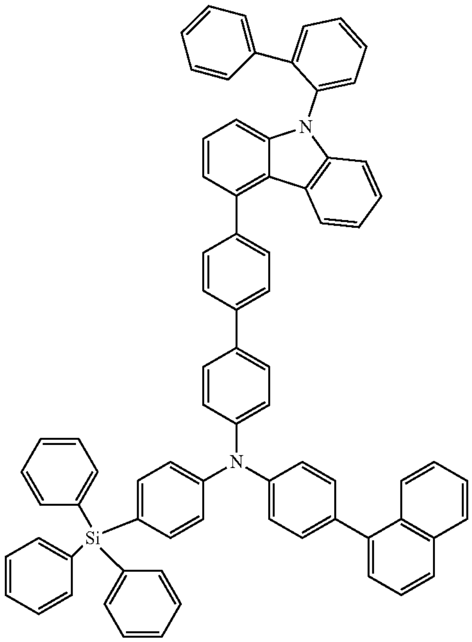
B156
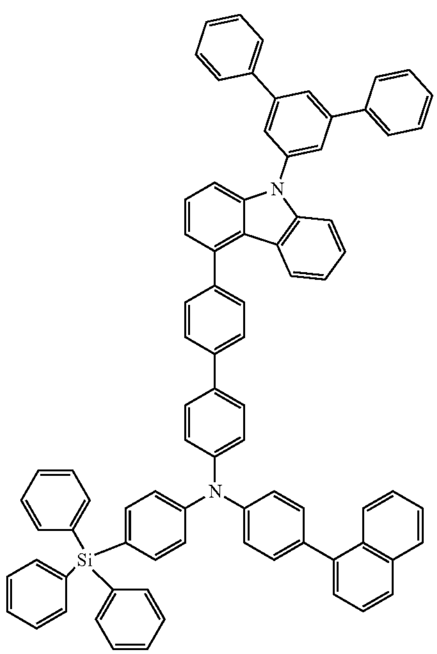
-continued
B157
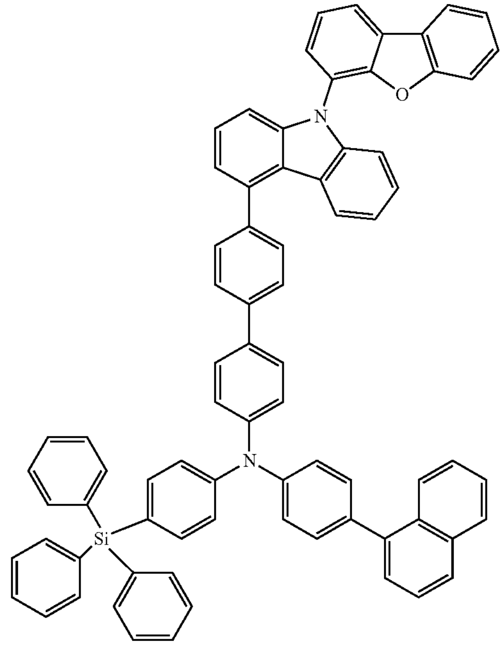
B158
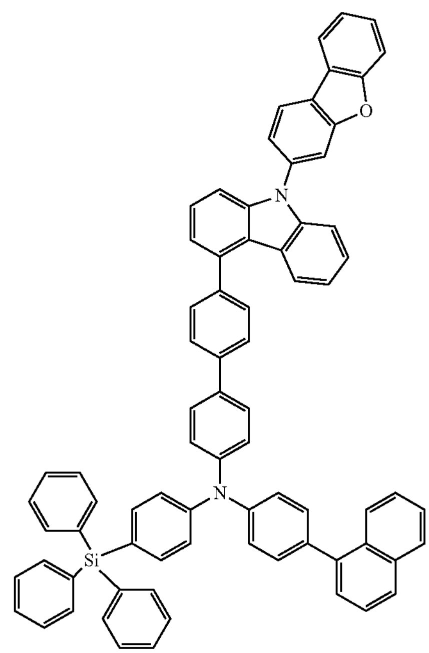

-continued
B159
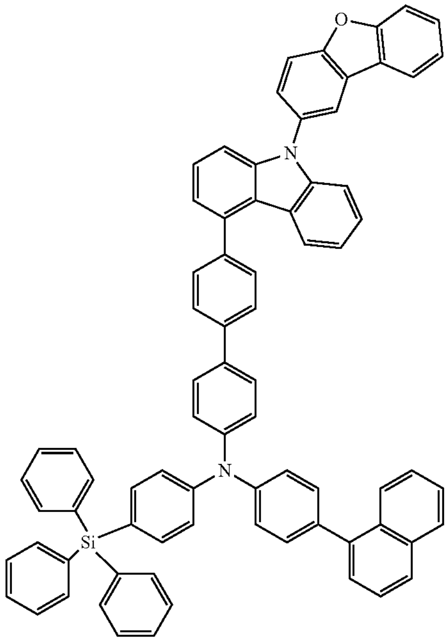
B160
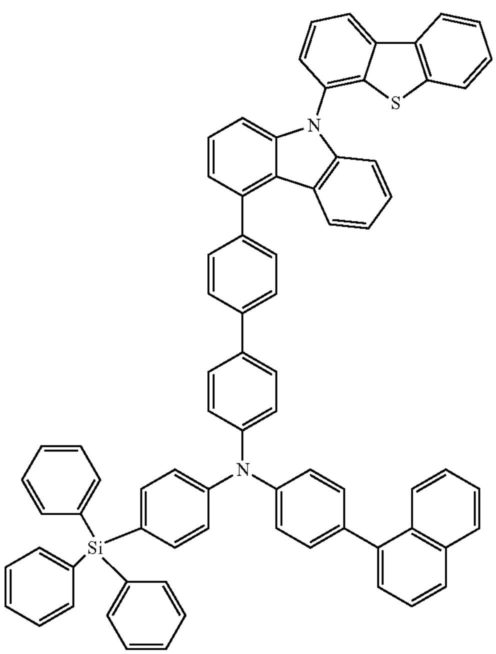
-continued
B161
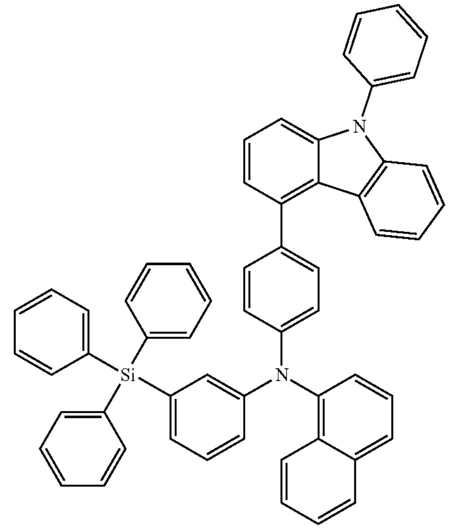
B162
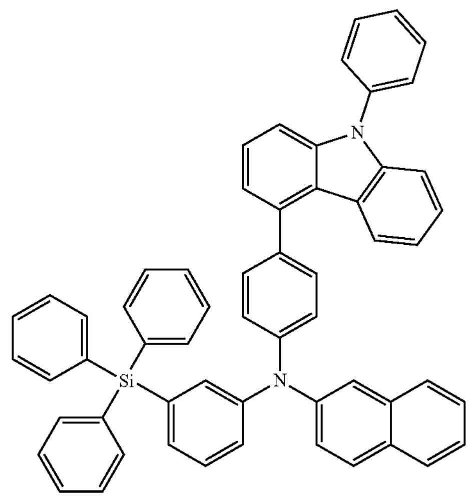
B163
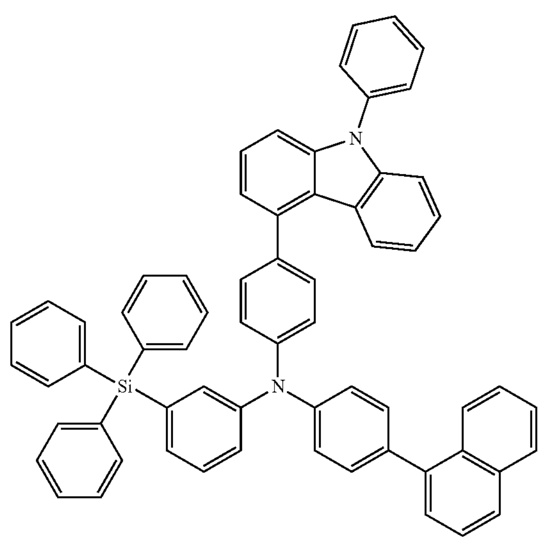

-continued
B164
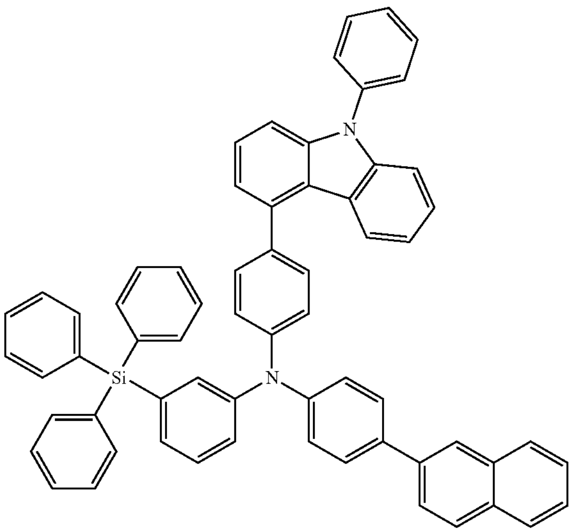
B165
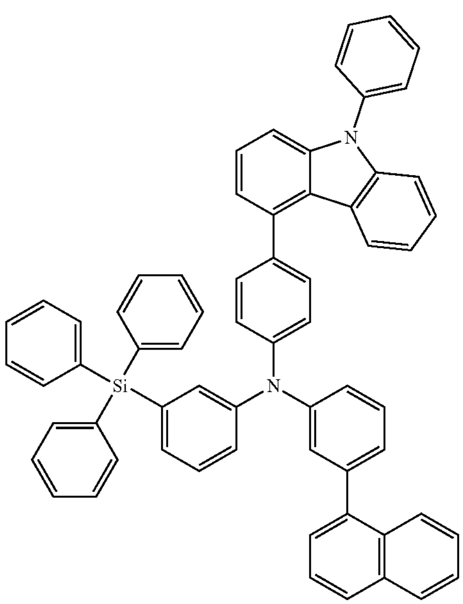
-continued
B166
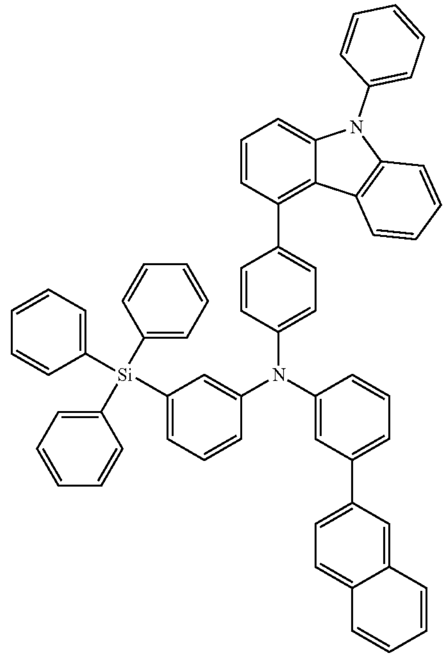
B167
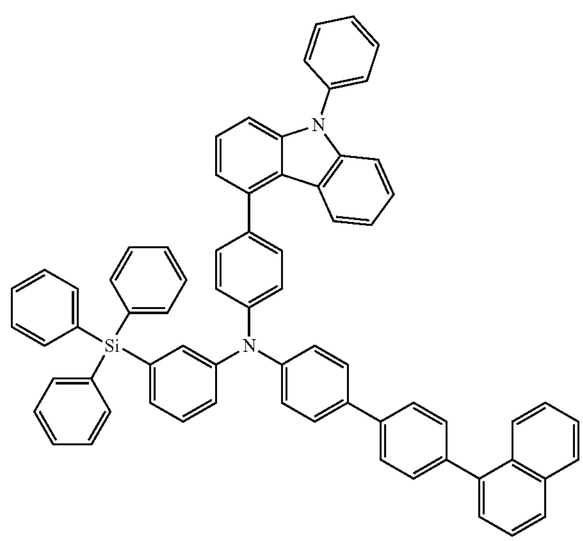

-continued
B168
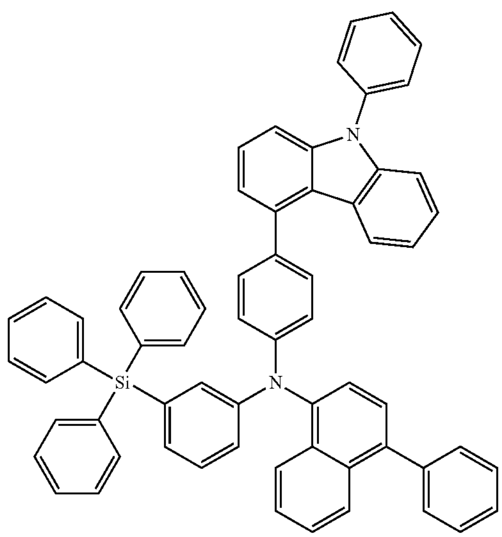
B169
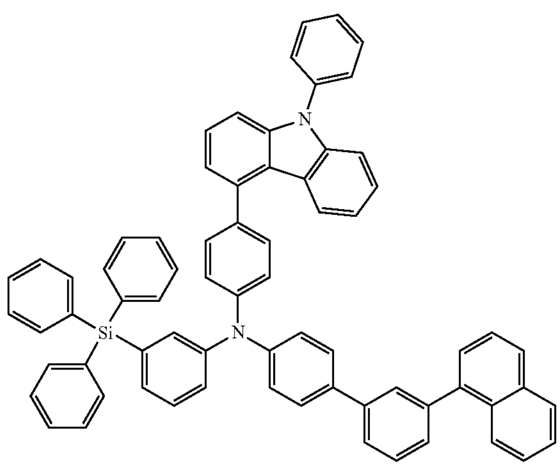
B170
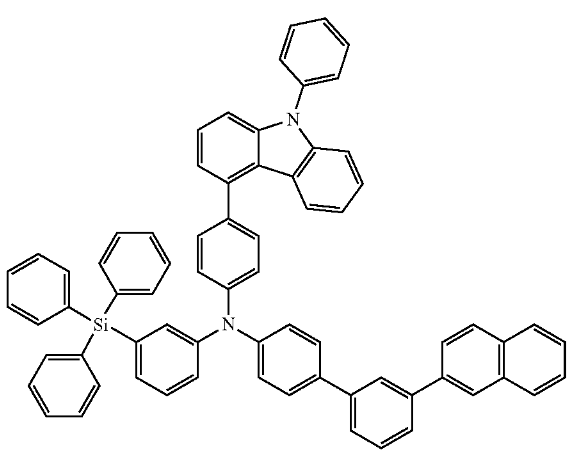
-continued
B171
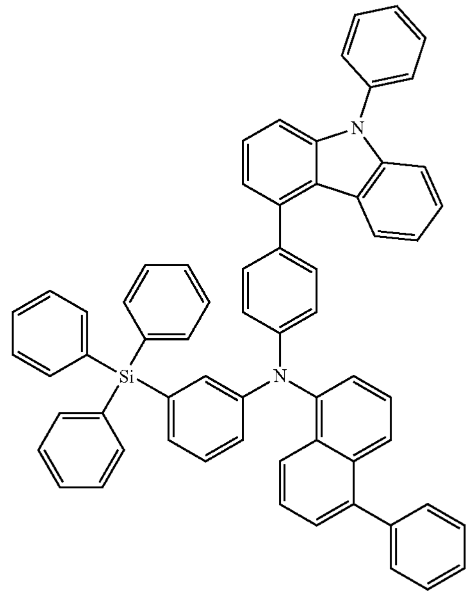
B172
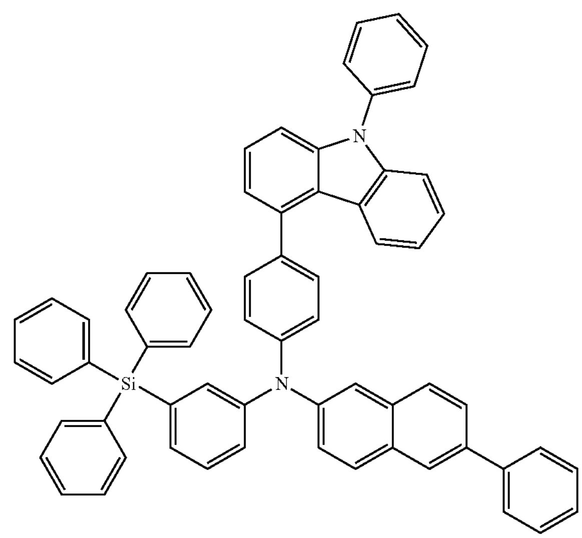
B173
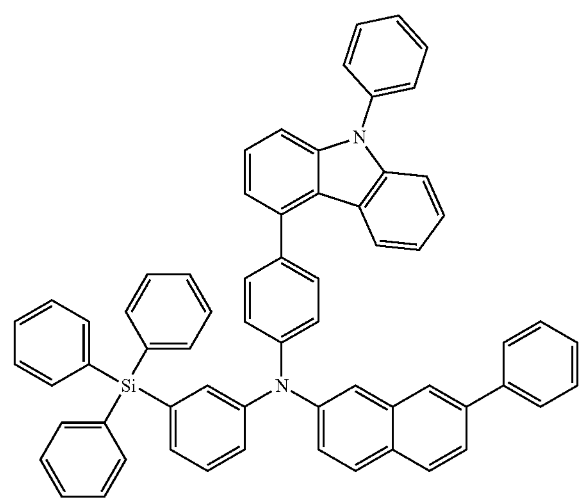

B174
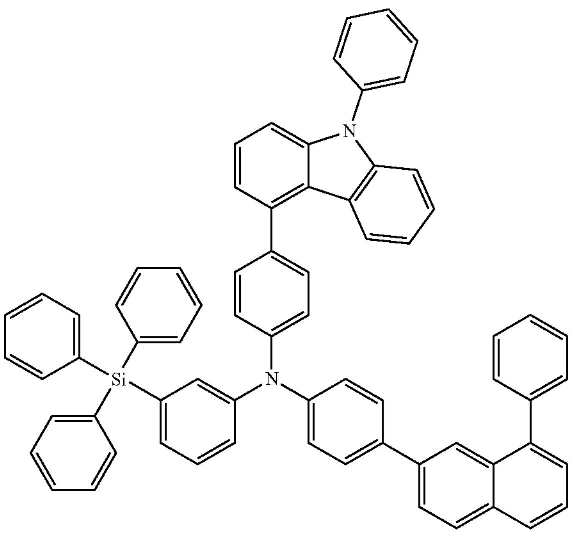
B175
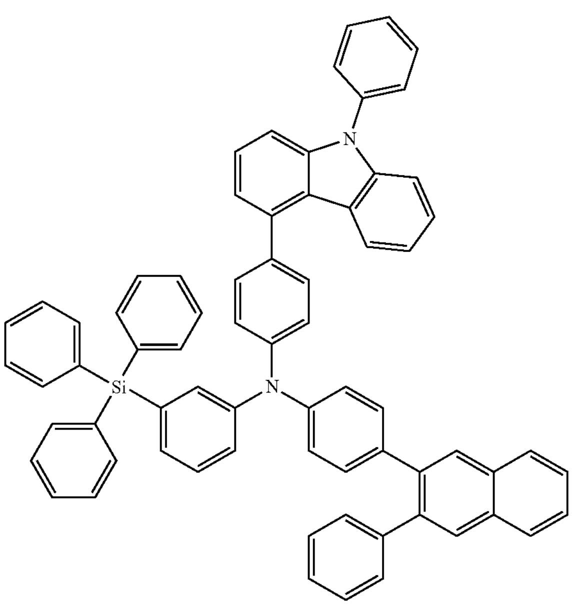
B176
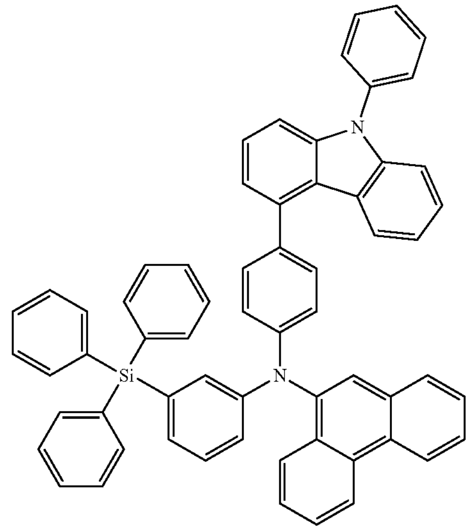
B177
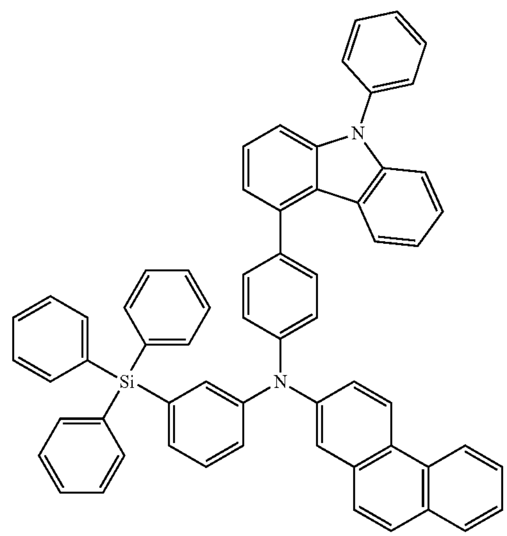
B178
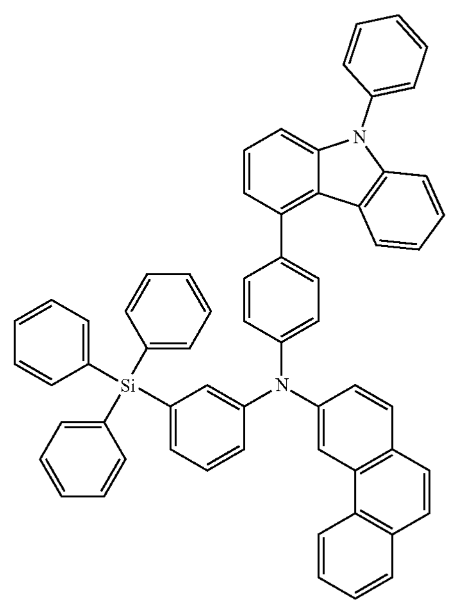

-continued
B179
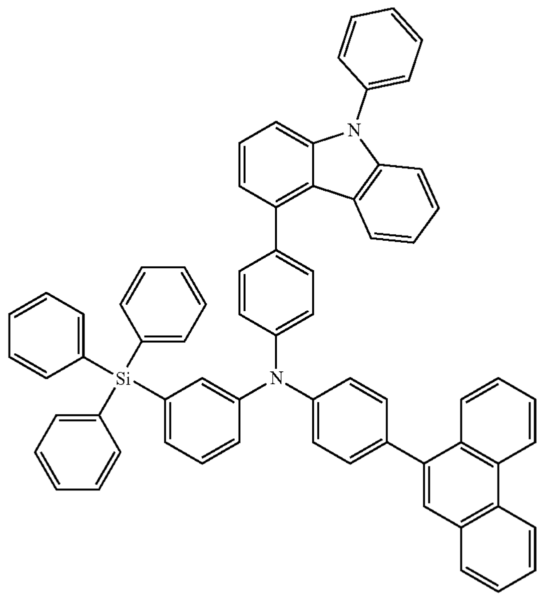
B180
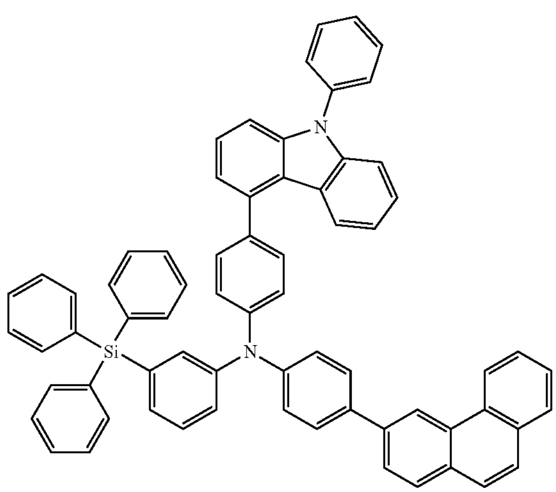
-continued
B181
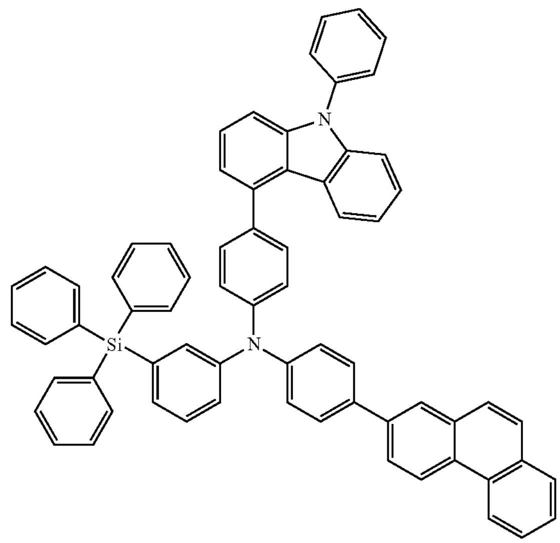
B182
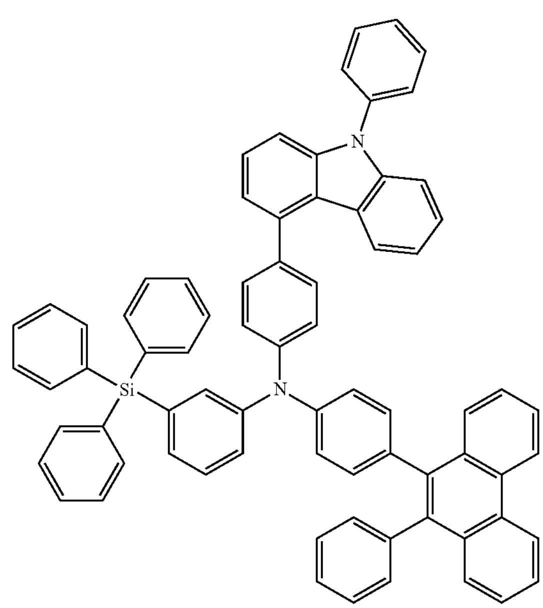

B183
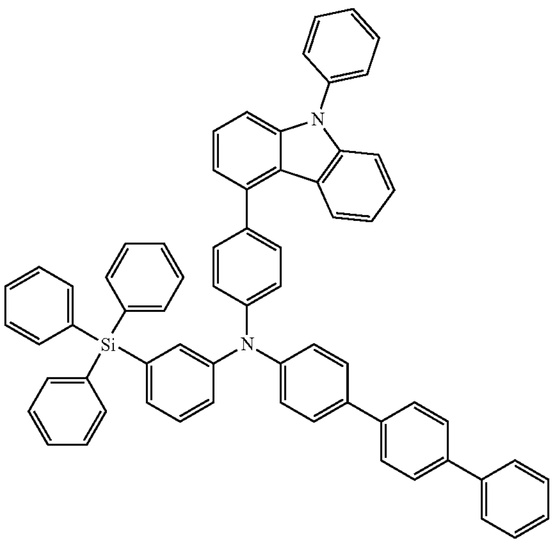
B184
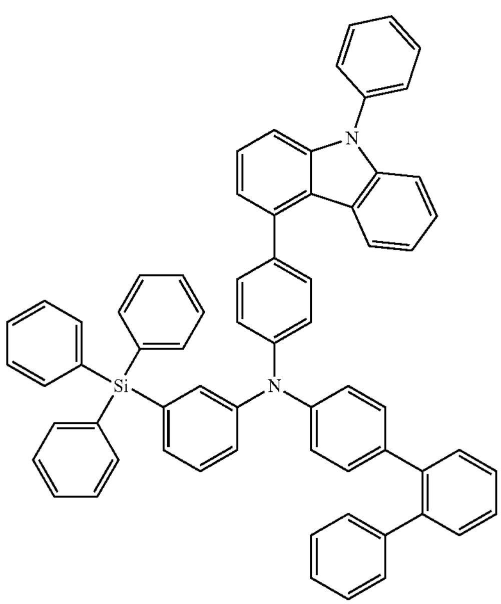
B185
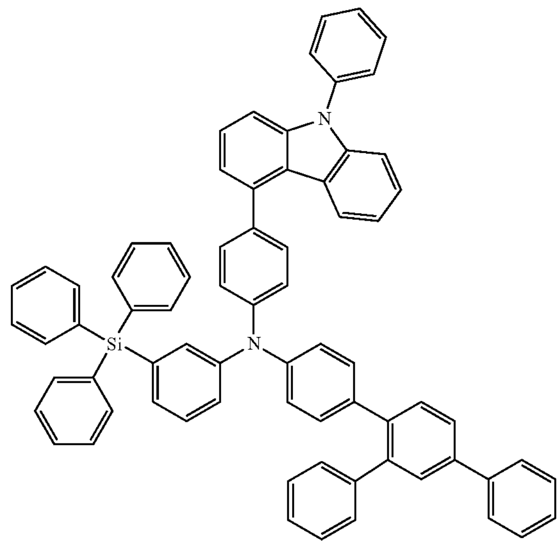
B186
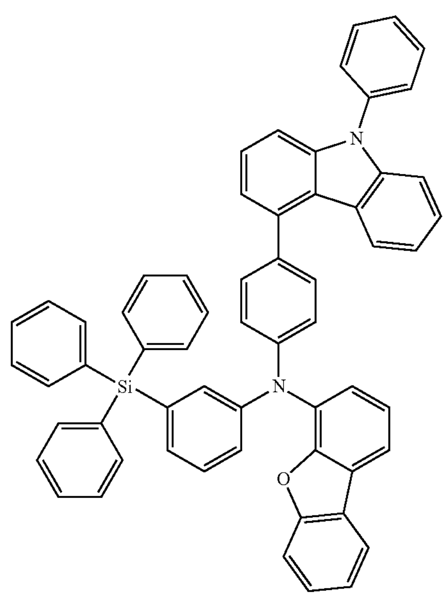

-continued
B187
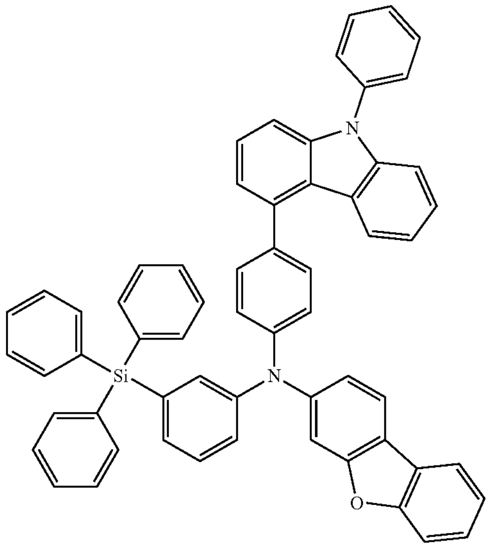
B188
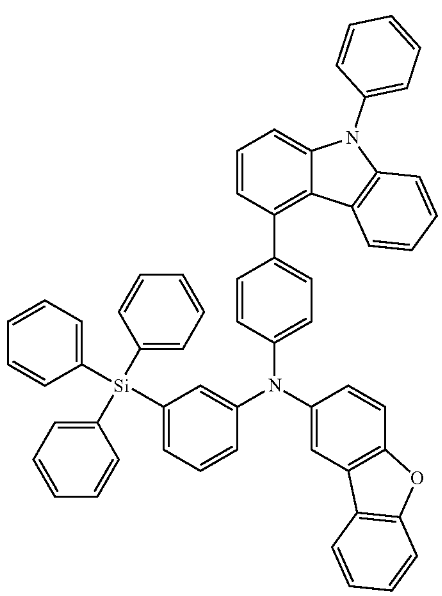
-continued
B189
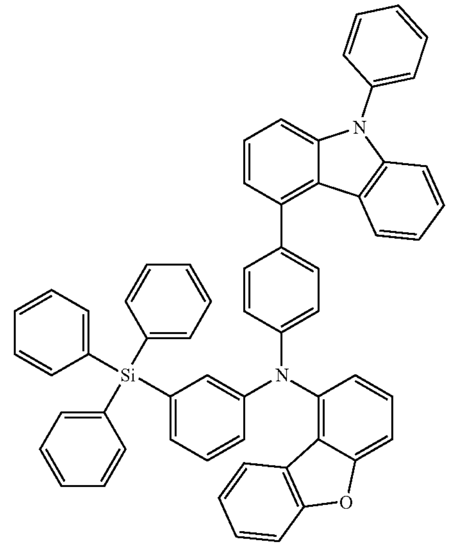
B190
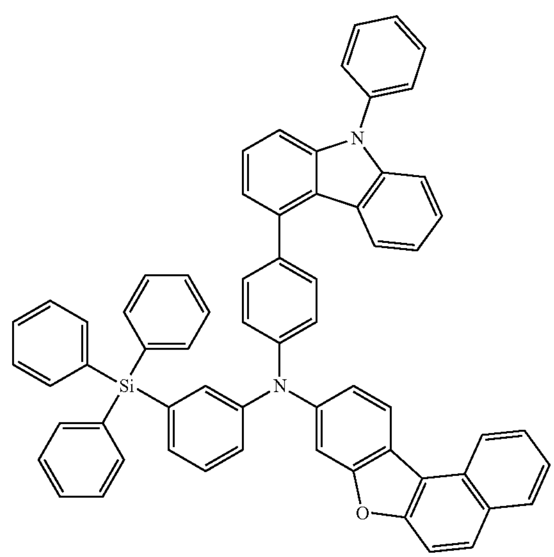

-continued
B191
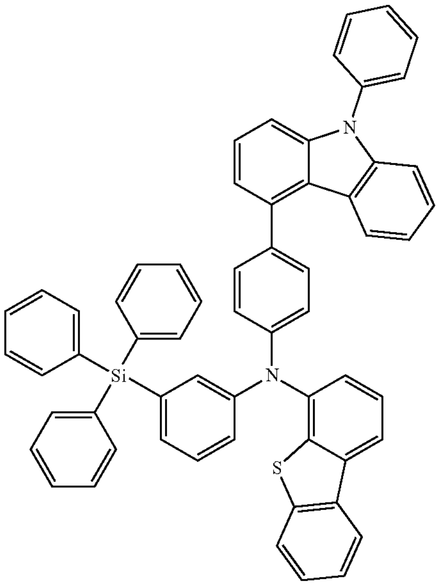
B192
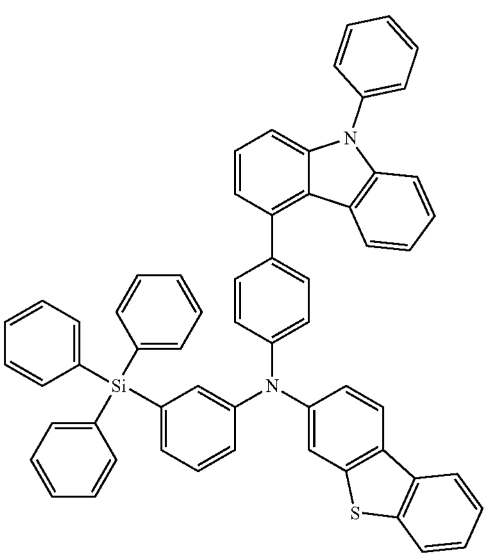
-continued
B193
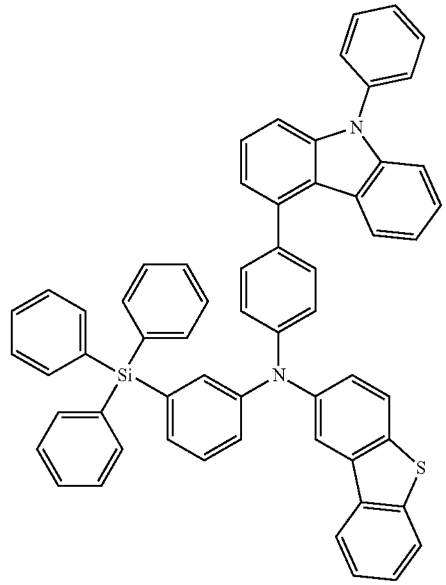
B194
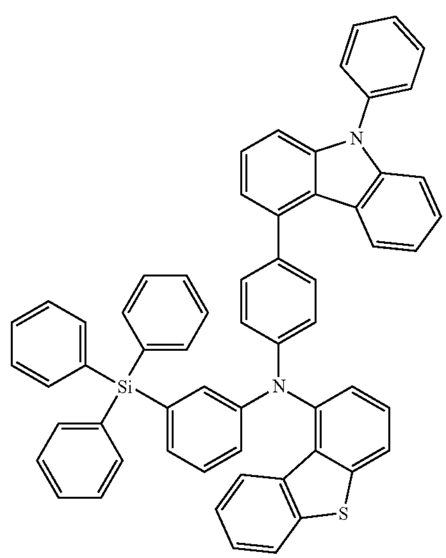

-continued
B195
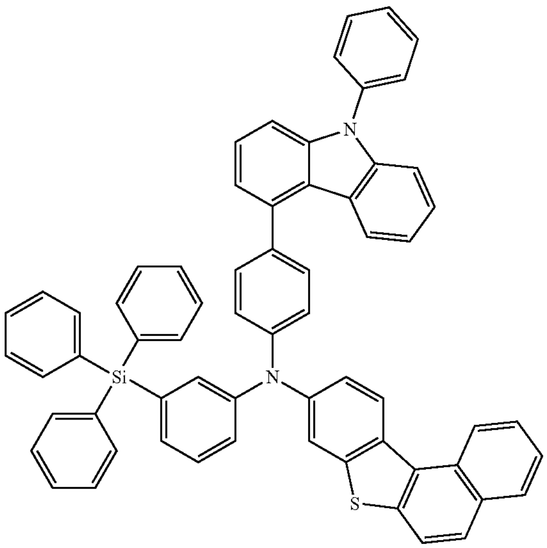
B196
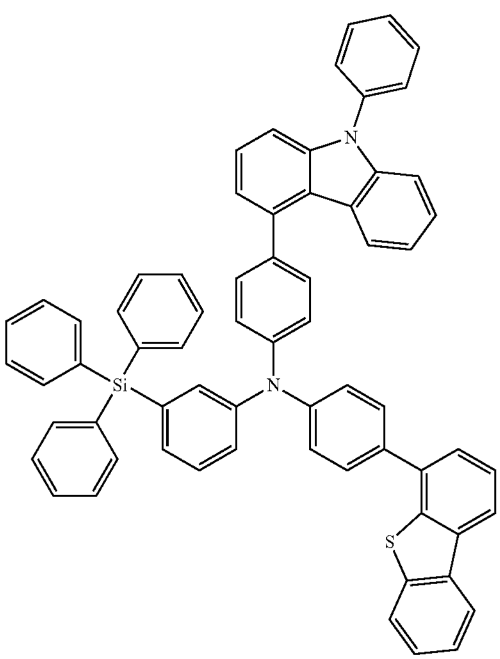
-continued
B197
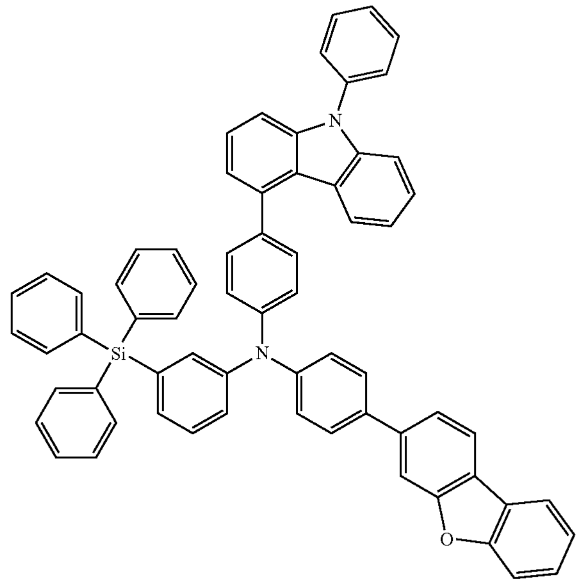
B198
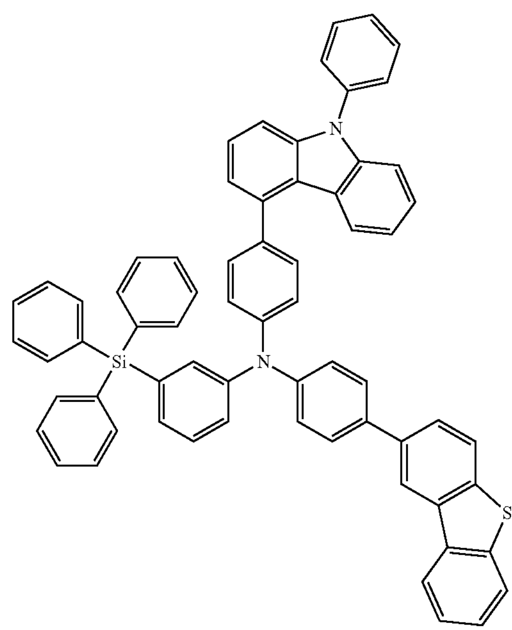

-continued
B199
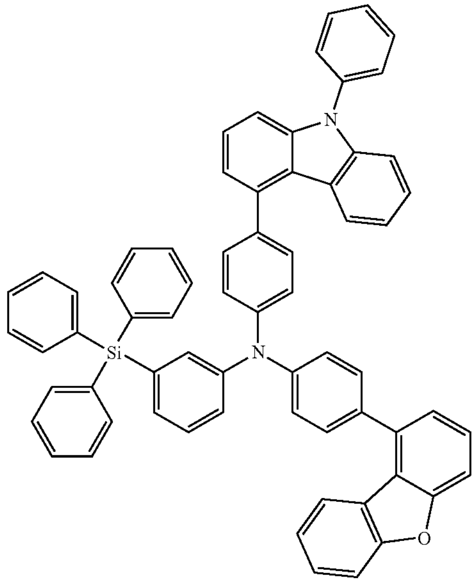
B200
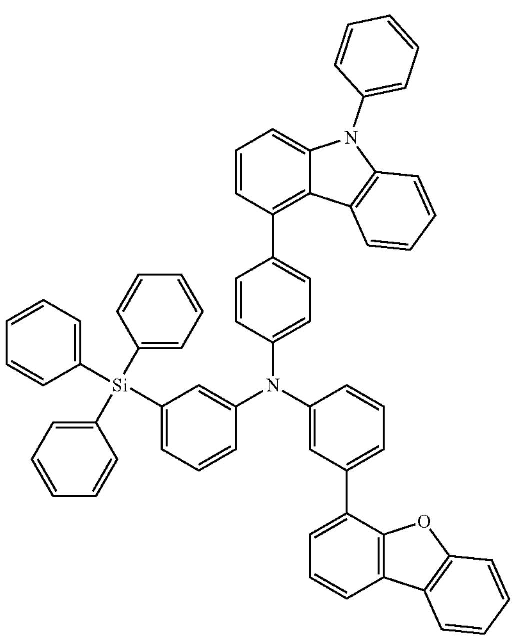
-continued
B201
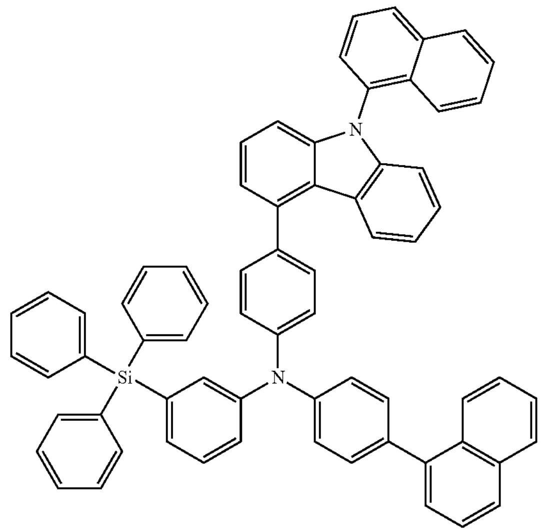
B202
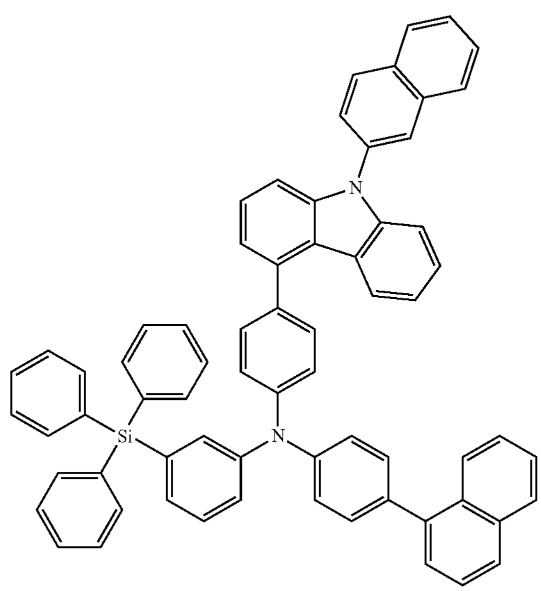

B203
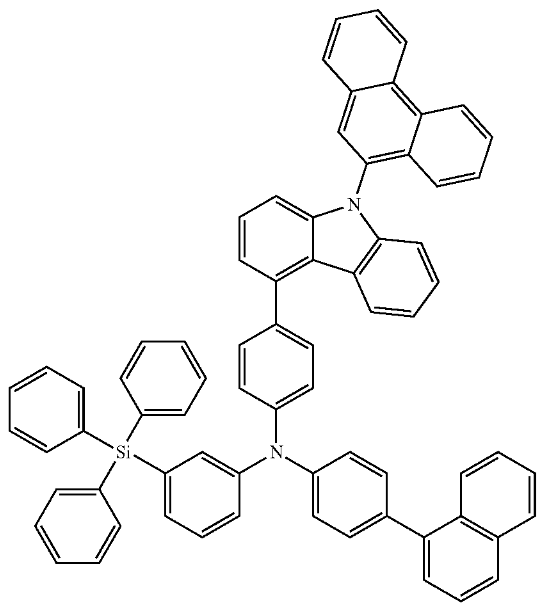
B204
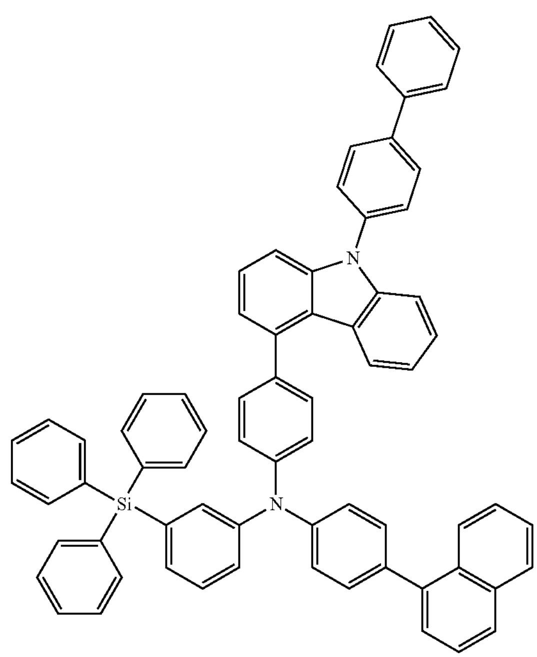
B205
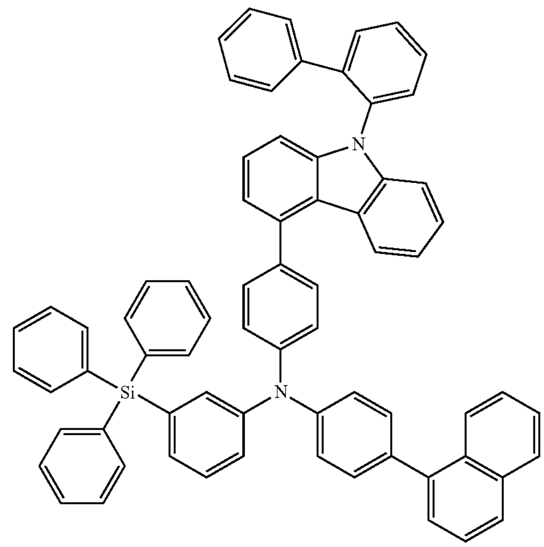
B206
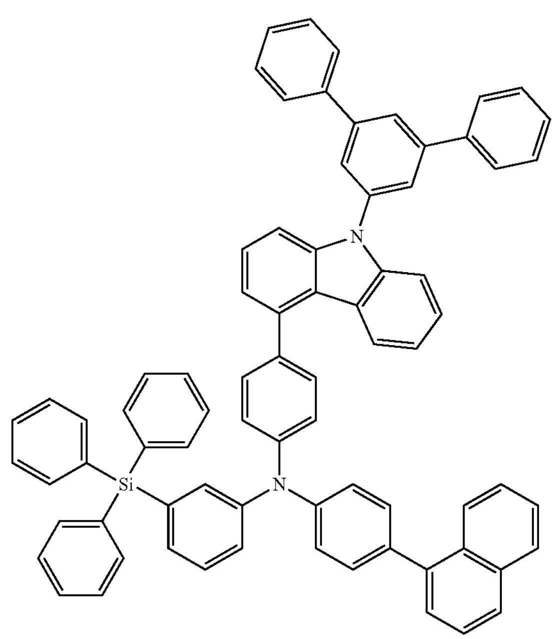

-continued
B207
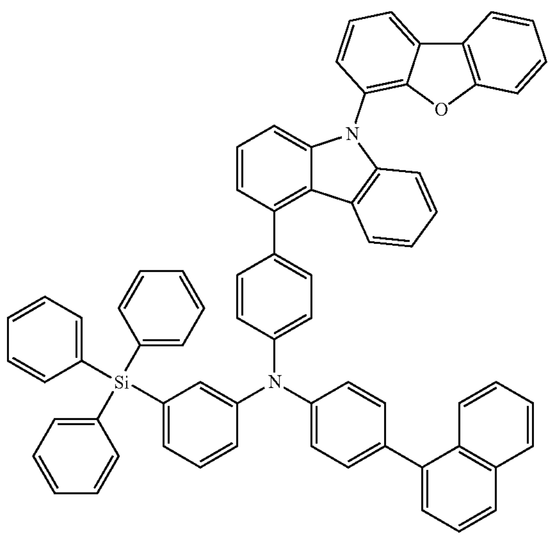
B208
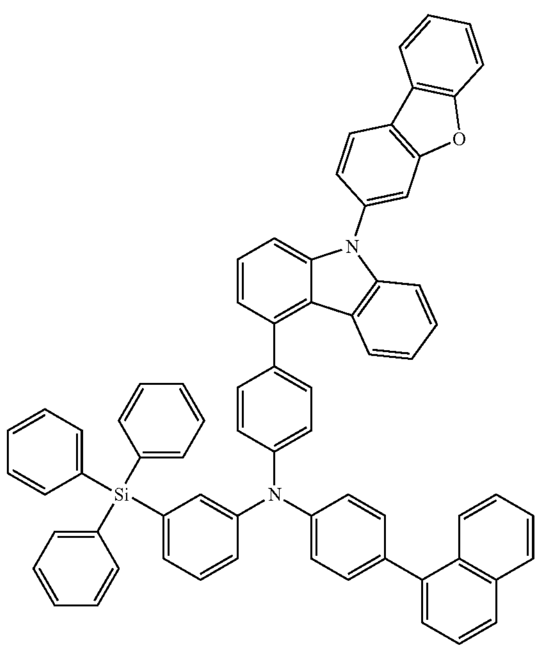
-continued
B209
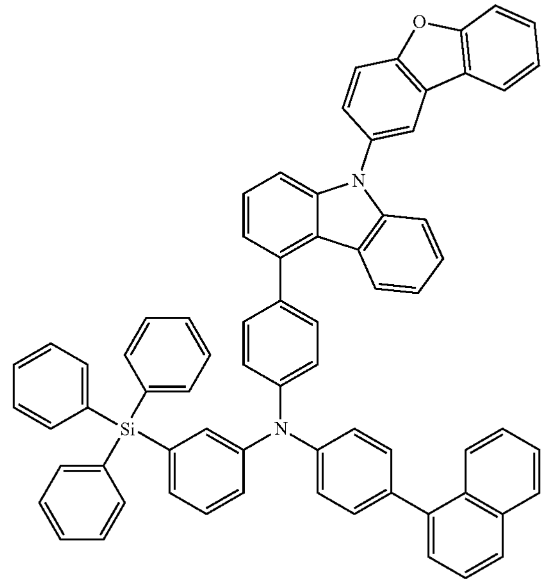
B210
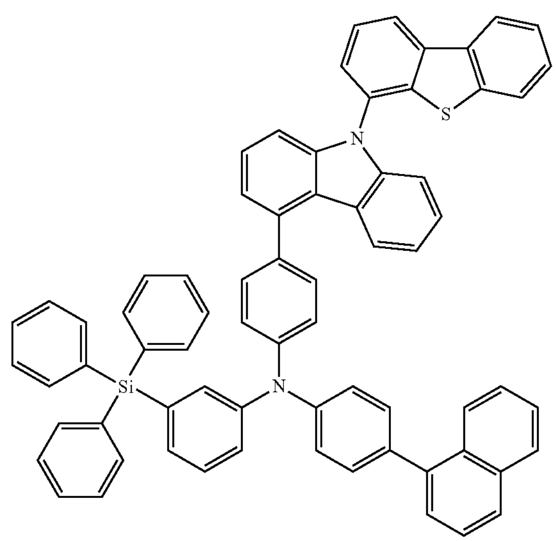

-continued
B211
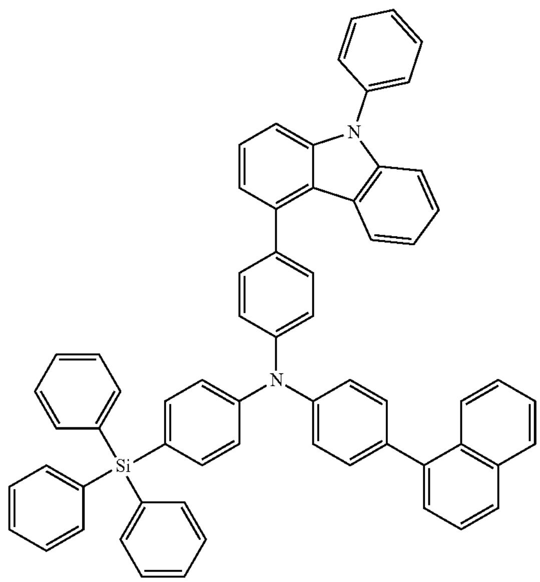
B212
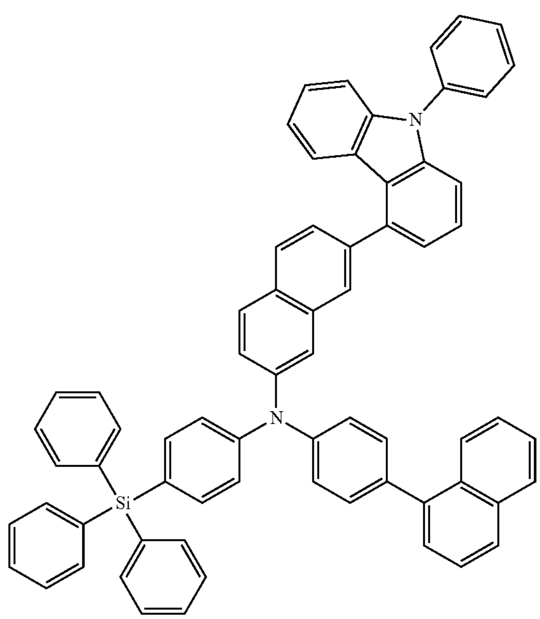
-continued
B213
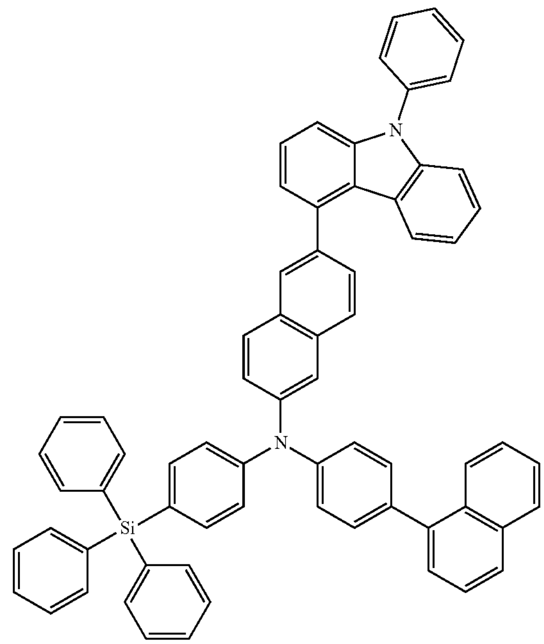
B214
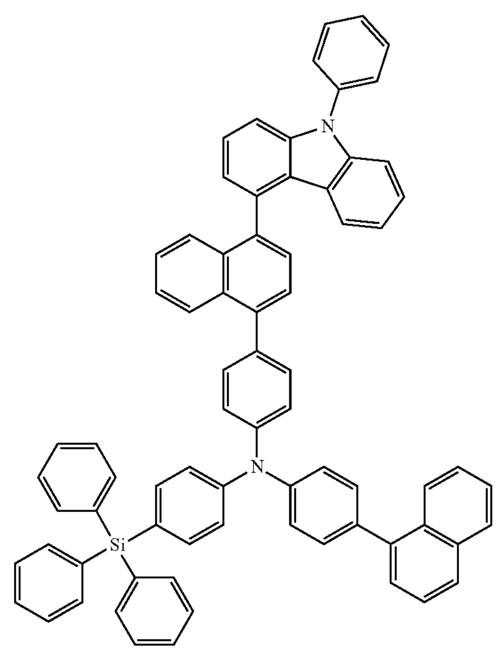

B215
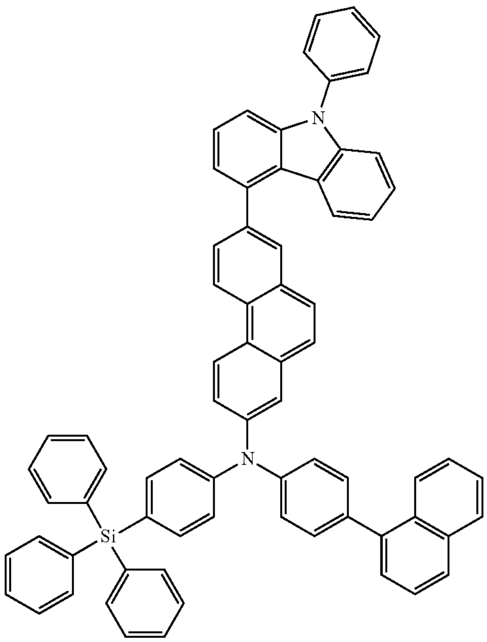
B216
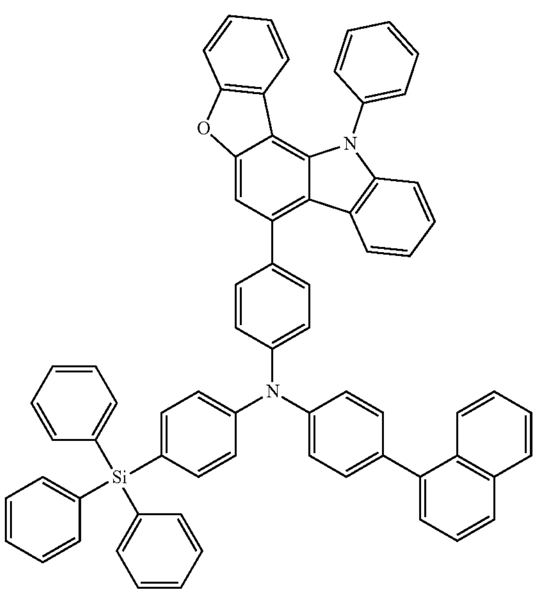
B217
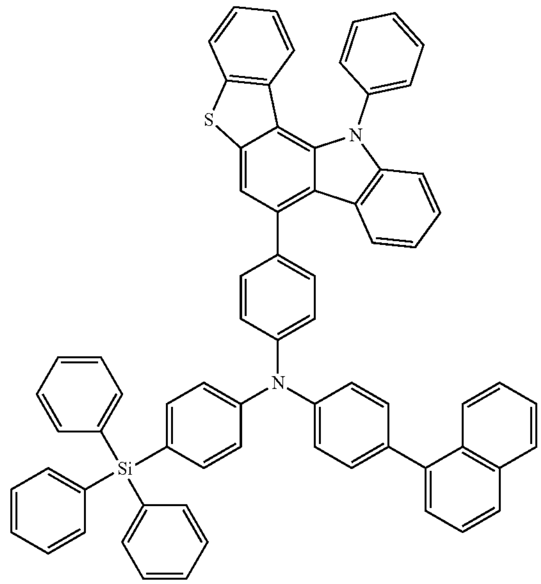
B218
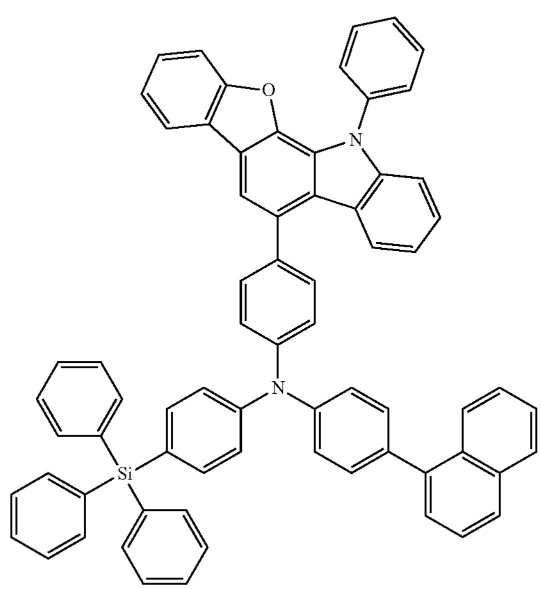

-continued

B219

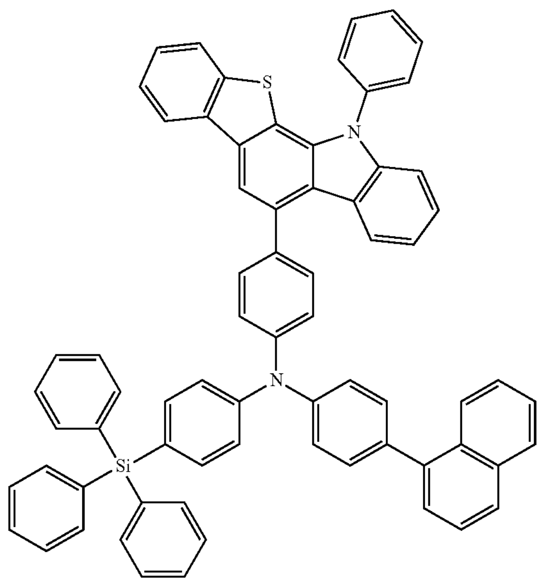

B220

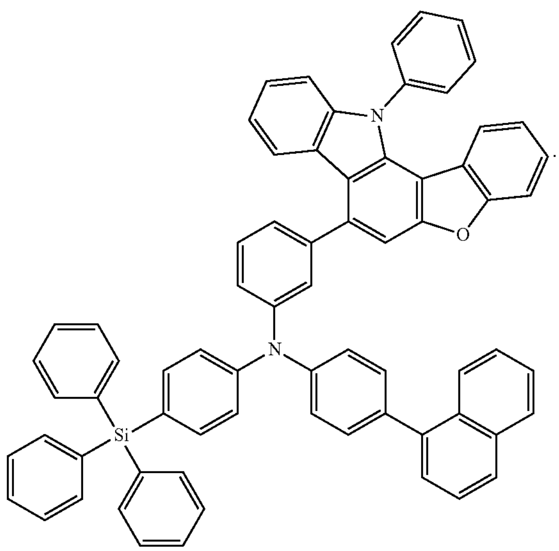

14. An amine compound represented by Formula 1:

Formula 1

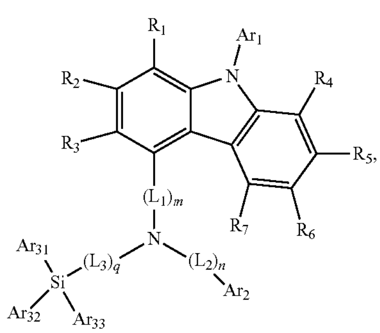

wherein in Formula 1, $Ar_1$ is a substituted or unsubstituted aryl group of 6 to 30 ring-forming carbon atoms or a substituted or unsubstituted heteroaryl group of 2 to 30 ring-forming carbon atoms, $R_1$ to $R_7$ are each independently a hydrogen atom, a deuterium atom, a halogen atom, a substituted or unsubstituted oxy group, a substituted or unsubstituted thiol group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, and are optionally combined with an adjacent group to form a ring, "m" and "n" are each independently an integer of 0 to 2, "q" is an integer of 1 to 3, $L_1$ to $L_3$ are each independently a direct linkage, or a substituted or unsubstituted arylene group of 6 to 30 ring-forming carbon atoms, $Ar_{31}$ to $Ar_{33}$ are each independently a substituted or unsubstituted aryl group of 6 to 30 ring-forming carbon atoms, and $Ar_2$ is a substituted or unsubstituted aryl group of 10 to 30 ring-forming carbon atoms, or a heteroaryl group of 2 to 30 ring-forming carbon atoms and including O or S as a ring-forming atom, where a case where $*\text{-}(L_2)_n\text{-}Ar_2$ is an unsubstituted biphenyl group is excluded.

15. The amine compound of claim 14, wherein, in Formula 1, $*\text{-}(L_2)_n\text{-}Ar_2$ is represented by any one among Formula 2-1 to Formula 2-4:

Formula 2-1

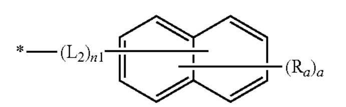

Formula 2-2

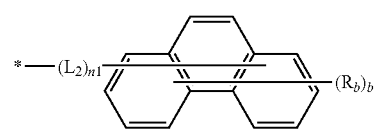

Formula 2-3

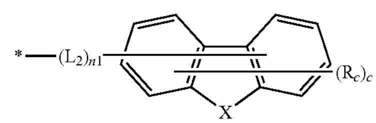

Formula 2-4

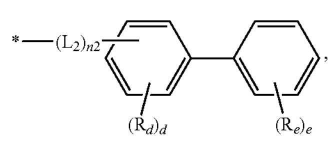

and wherein in Formula 2-1 to Formula 2-4, $R_a$ to $R_e$ are each independently a hydrogen atom, a deuterium atom, a halogen atom, a substituted or unsubstituted oxy group, a substituted or unsubstituted thiol group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, and are optionally combined with an adjacent group to form a ring, "n1" is an integer of 0 to 2,
"n2" is 1 or 2,
"a" and "c" are integers of 0 to 7,
"b" is an integer of 0 to 9,
"d" is an integer of 0 to 4,
"e" is an integer of 0 to 5,
X is O or S, and
$L_2$ is the same as defined in Formula 1.

16. The amine compound of claim 14, wherein Formula 1 is represented by Formula 1-1 or Formula 1-2:

Formula 1-1

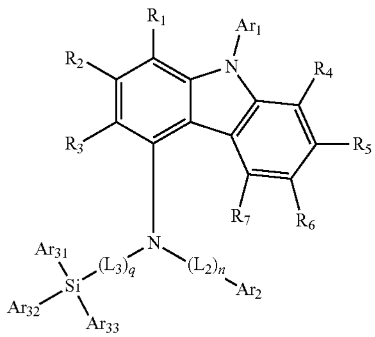

Formula 1-2

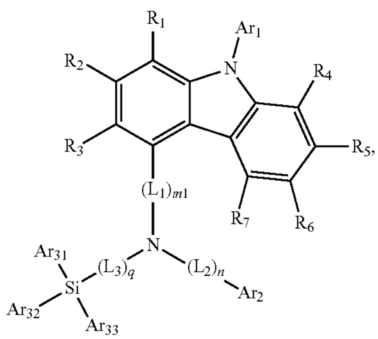

wherein in Formula 1-2, "m1" is 1 or 2, and
wherein in Formula 1-1 and Formula 1-2,
$Ar_1$, $Ar_2$, $Ar_{31}$ to $Ar_{33}$, $L_1$ to $L_3$, "n", "q", and $R_1$ to $R_7$ are each independently the same as defined in Formula 1.

17. The amine compound of claim 16, wherein, in Formula 1-2, $L_1$ comprises a substituted or unsubstituted phenylene group, a substituted or unsubstituted divalent biphenyl group, a substituted or unsubstituted naphthalene group, or a substituted or unsubstituted phenanthrene group.

18. The amine compound of claim 14, wherein $Ar_{31}$ to $Ar_{33}$ are each independently a substituted or unsubstituted phenyl group or a substituted or unsubstituted naphthyl group.

19. The amine compound of claim 14, wherein when "n" is an integer of 1 or more, $L_2$ comprises a substituted or unsubstituted phenylene group, a substituted or unsubstituted divalent biphenyl group, a substituted or unsubstituted naphthalene group, or a substituted or unsubstituted phenanthrene group.

20. The amine compound of claim 14, wherein $L_3$ comprises a substituted or unsubstituted phenylene group, a substituted or unsubstituted divalent biphenyl group, a substituted or unsubstituted naphthalene group, or a substituted or unsubstituted phenanthrene group.

21. The amine compound of claim 14, wherein $Ar_1$ comprises a substituted or unsubstituted phenyl group, a substituted or unsubstituted naphthyl group, a substituted or unsubstituted phenanthrene group, a substituted or unsubstituted dibenzofuran group, or a substituted or unsubstituted dibenzothiophene group.

22. The amine compound of claim 14, wherein the amine compound is represented by at least one among amine compounds in Compound Group 1A and Compound Group 1B:

Compound Group 1A

A1

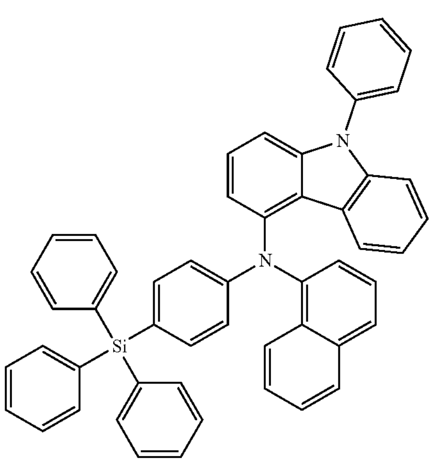

A2

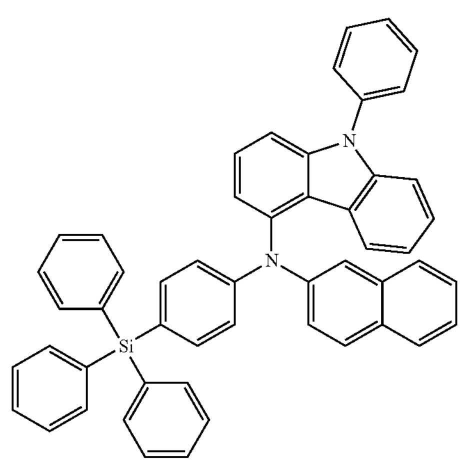

-continued
A3
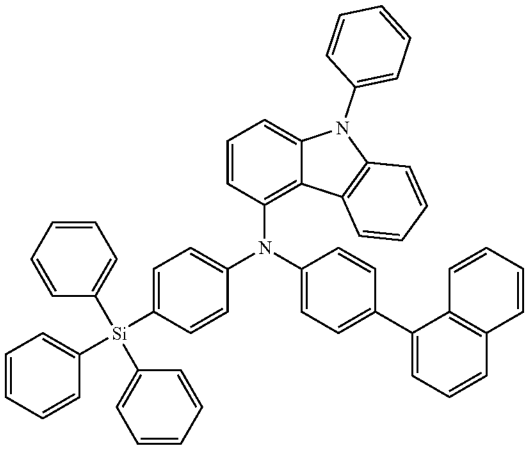
A4
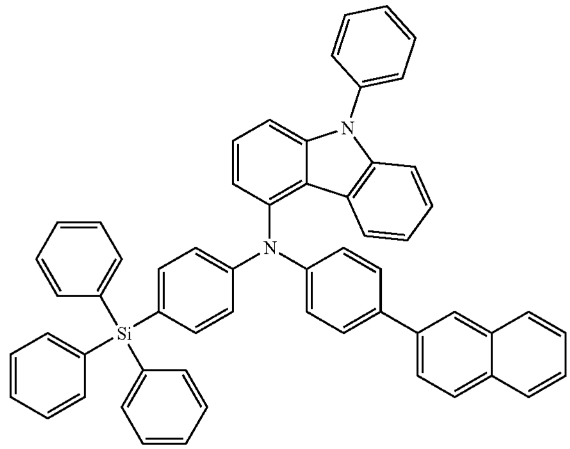
A5
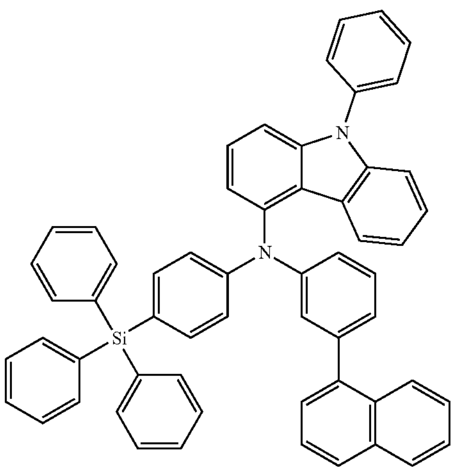
A6
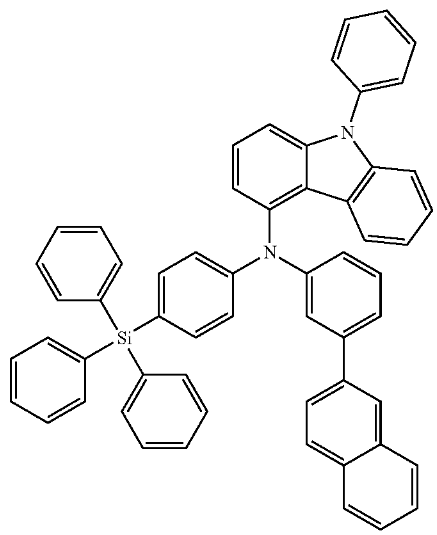
A7
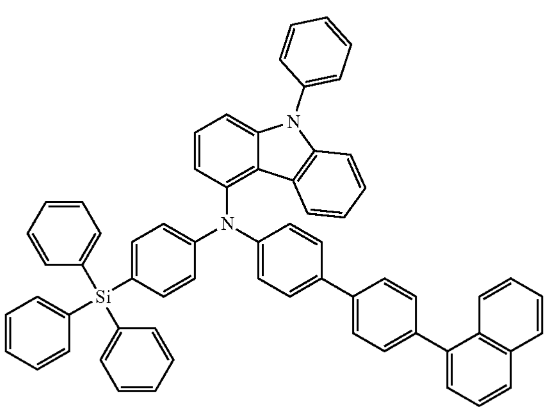
A8
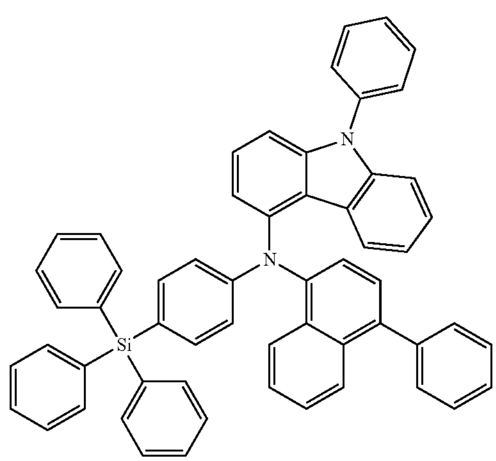

-continued
A9
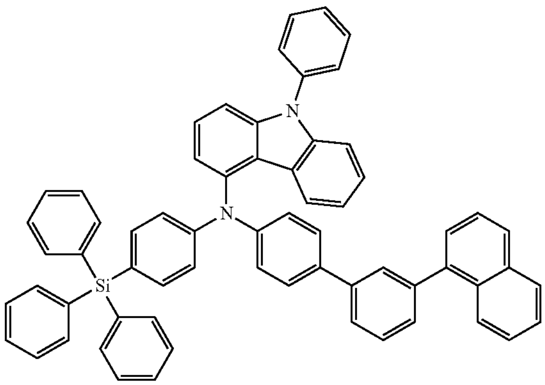
A10
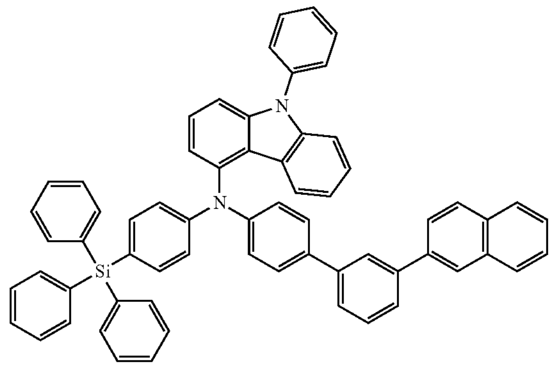
A11
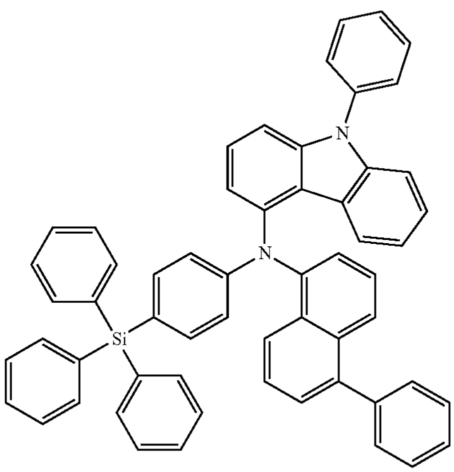
A12
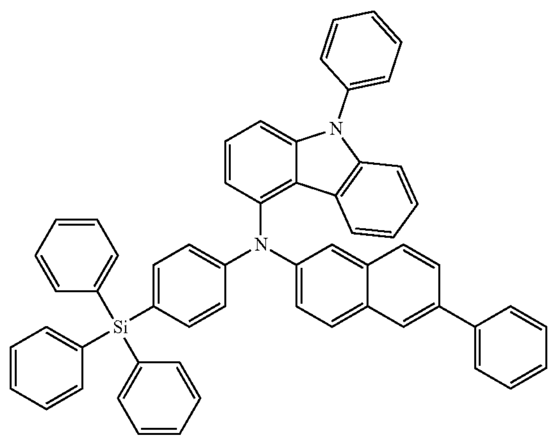
A13
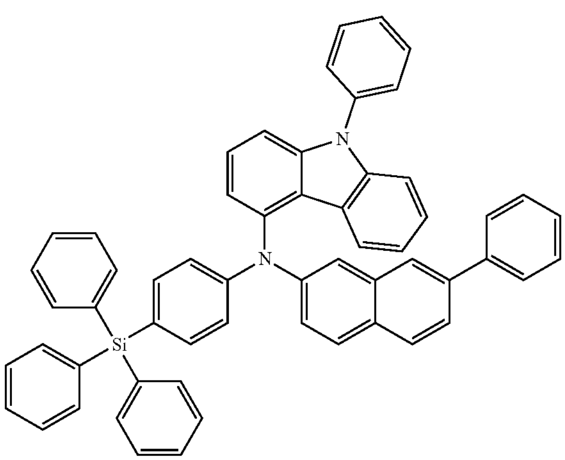
A14
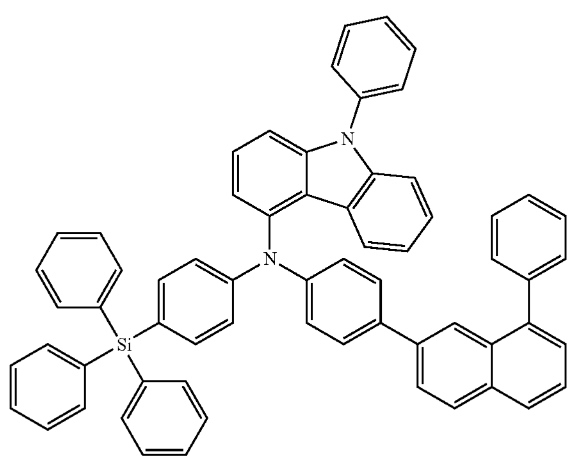

-continued
A15
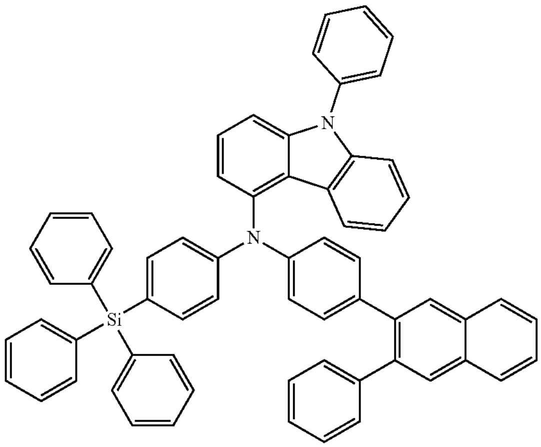
A16
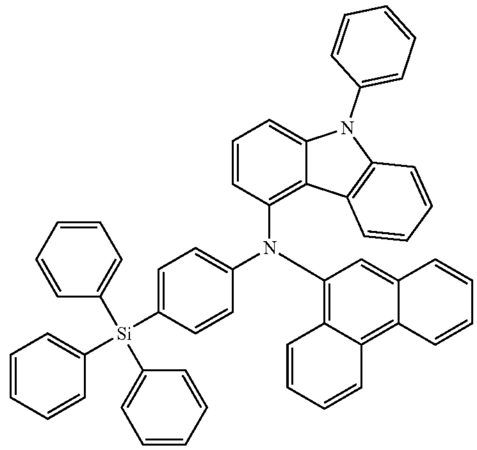
A17
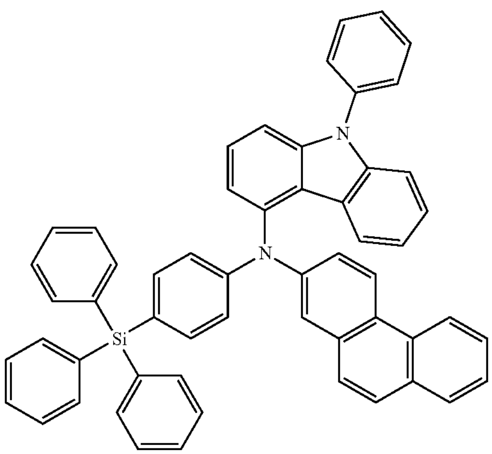
A18
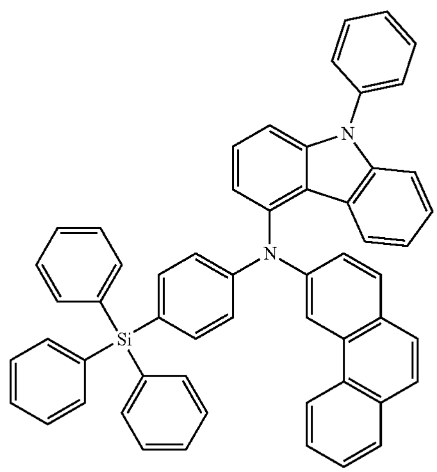
A19
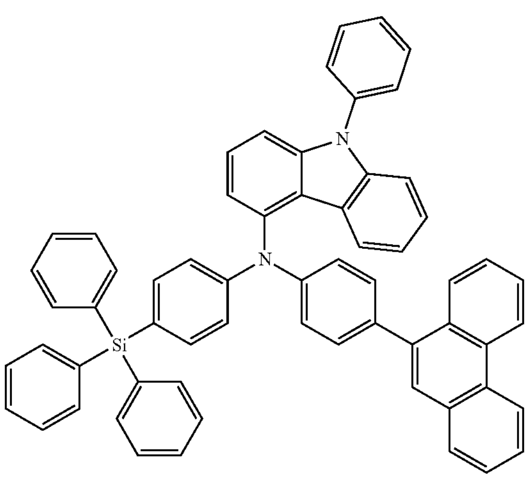
A20
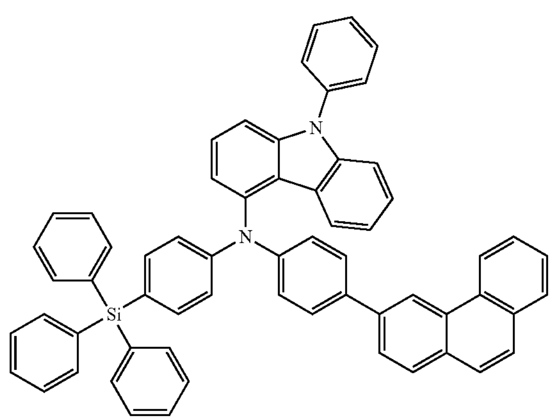

-continued
A21
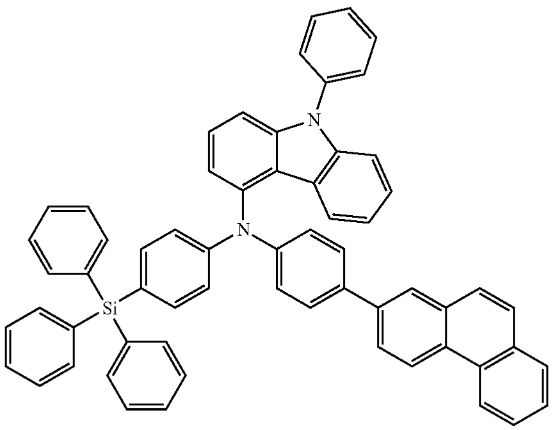
A22
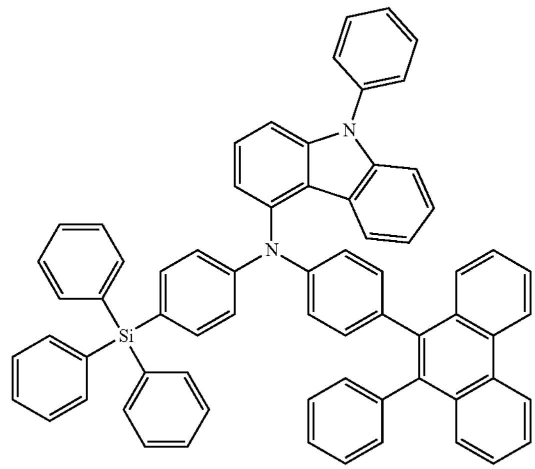
A23
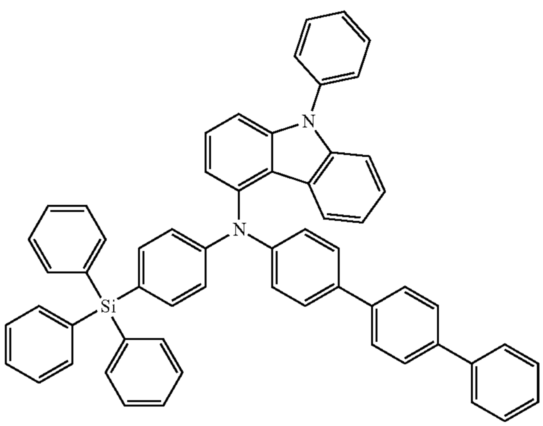
A24
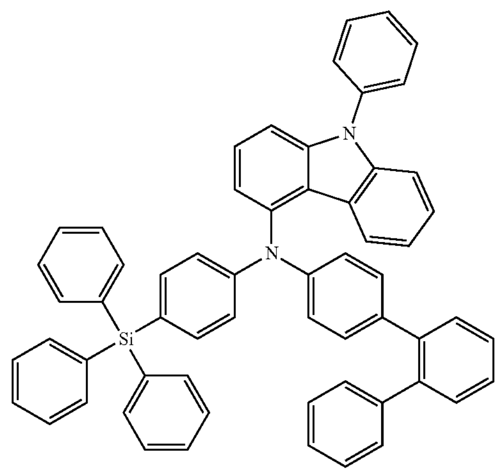
A25
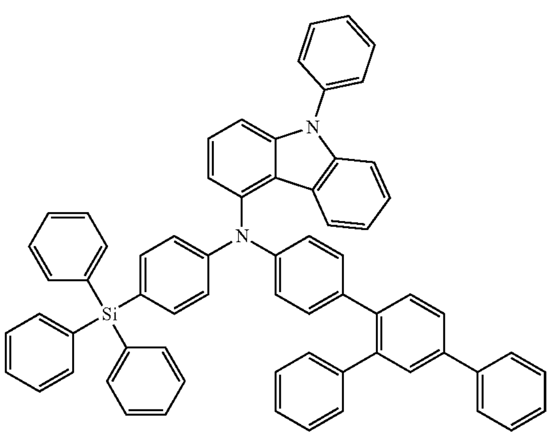
A26
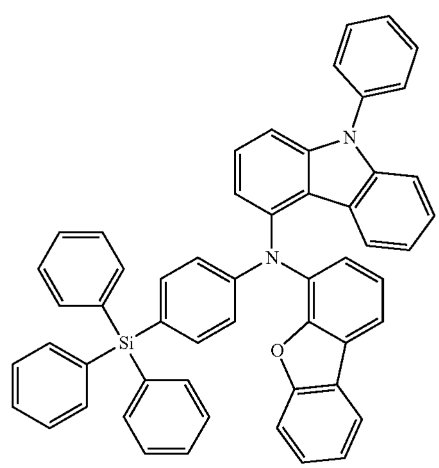

-continued
A27
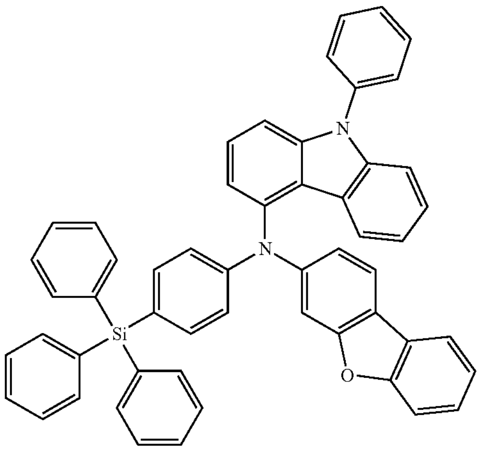
A28
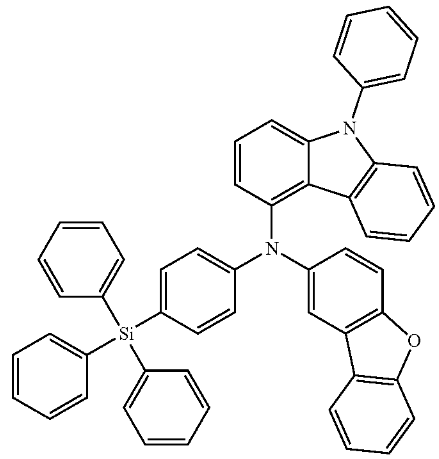
A29
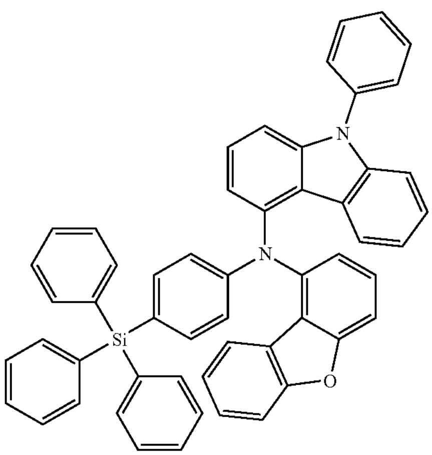
A30
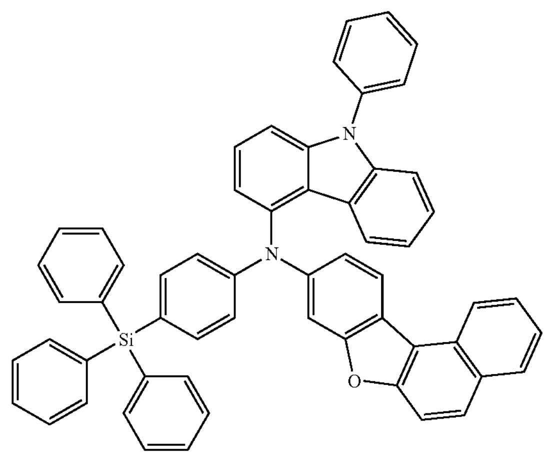
A31
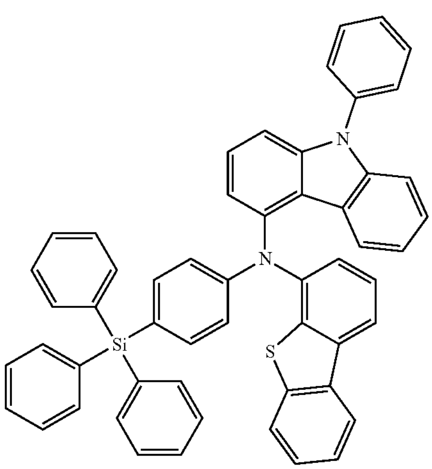
A32
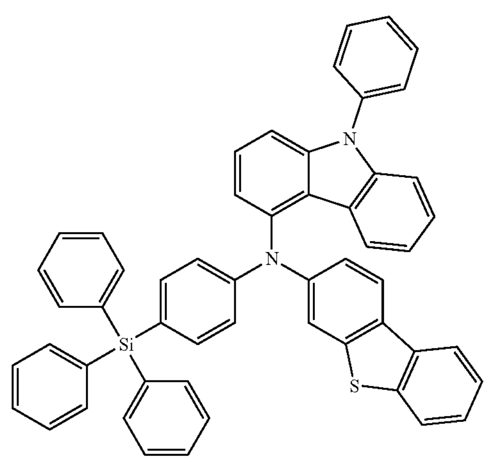

-continued
A33
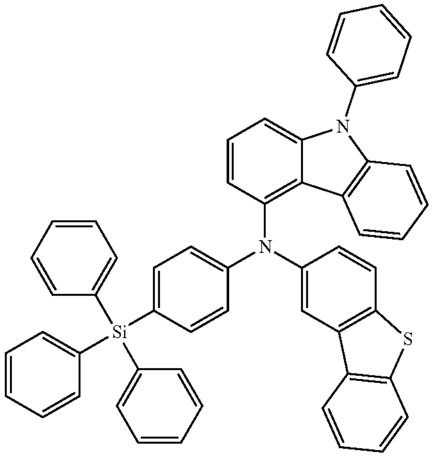
A34
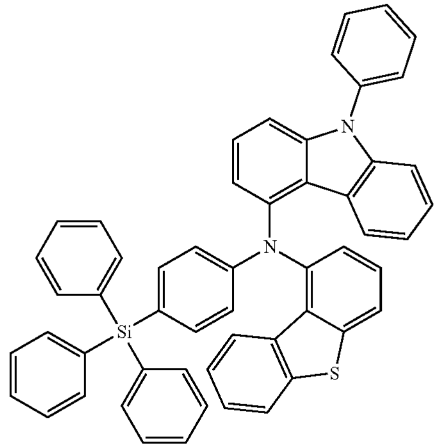
A35
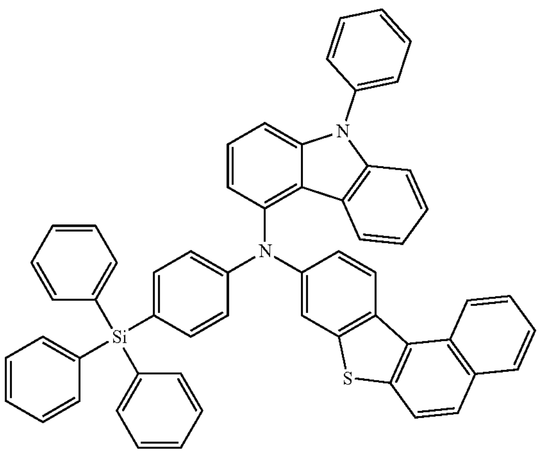
A36
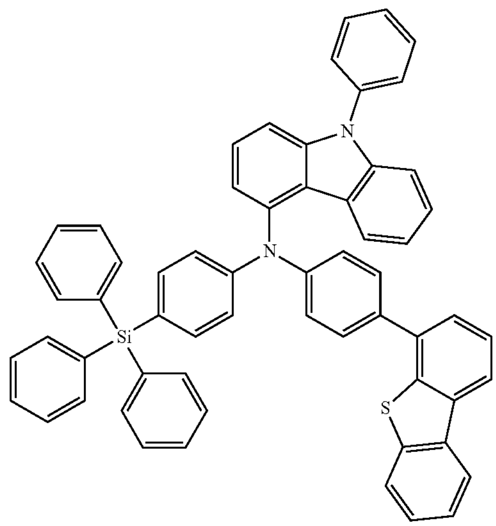
A37
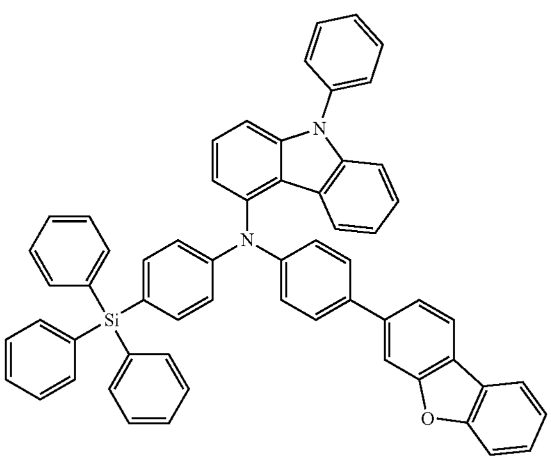
A38
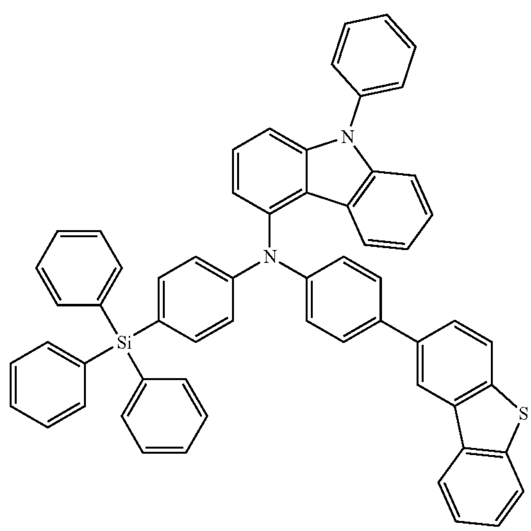

-continued
A39
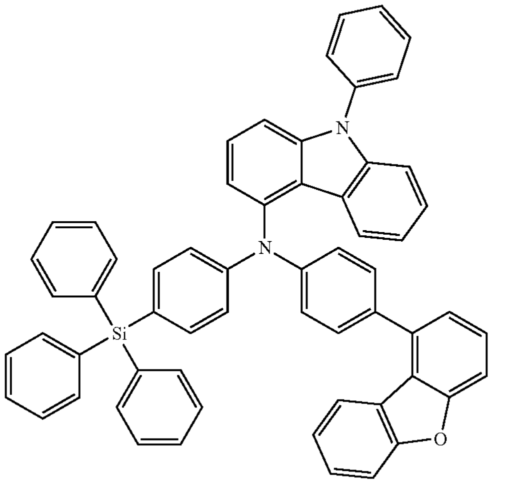
A40
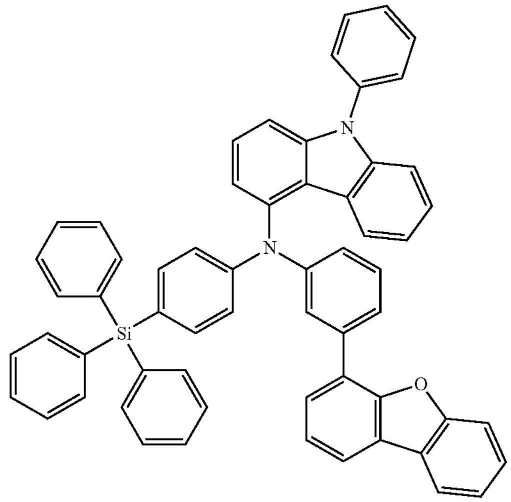
A41
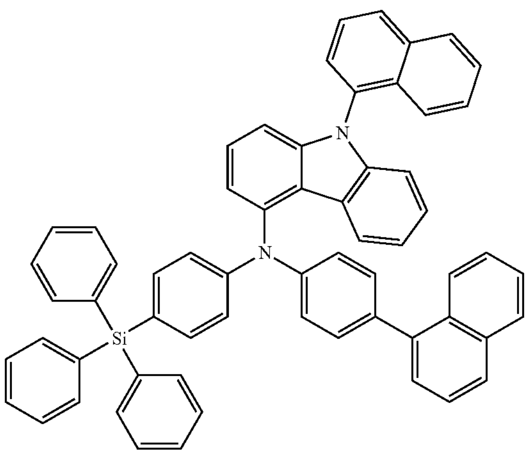
A42
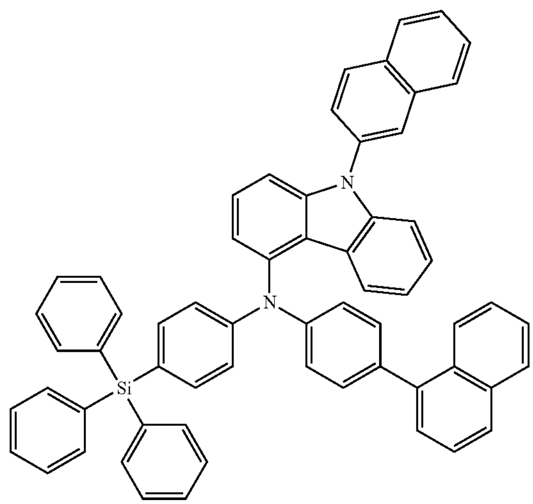
A43
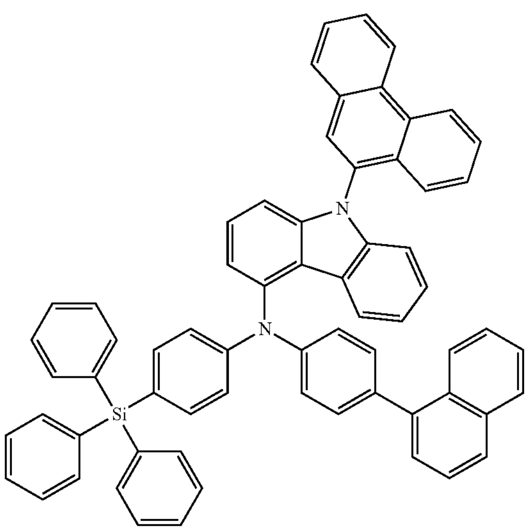
A44
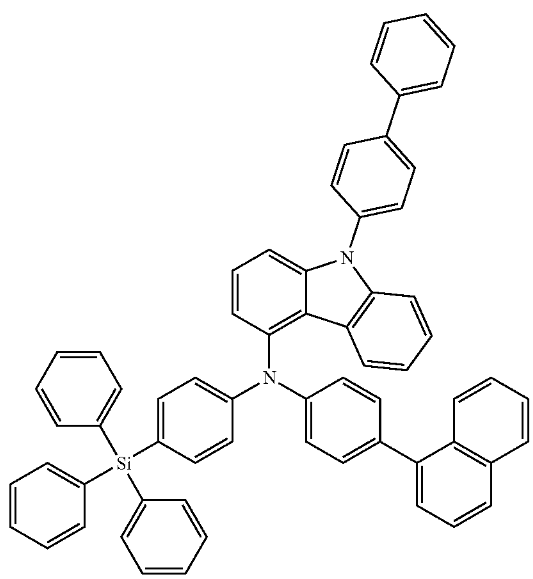

-continued
A45
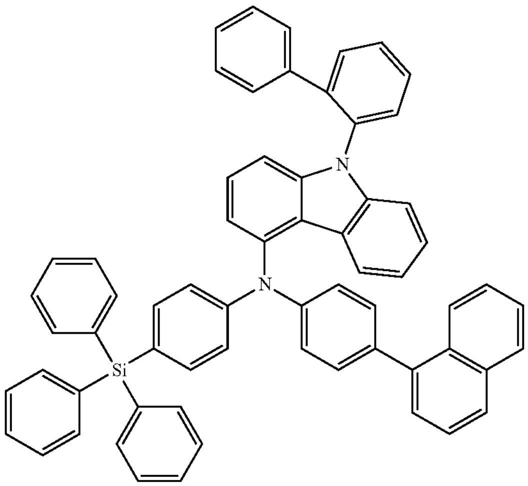
A46
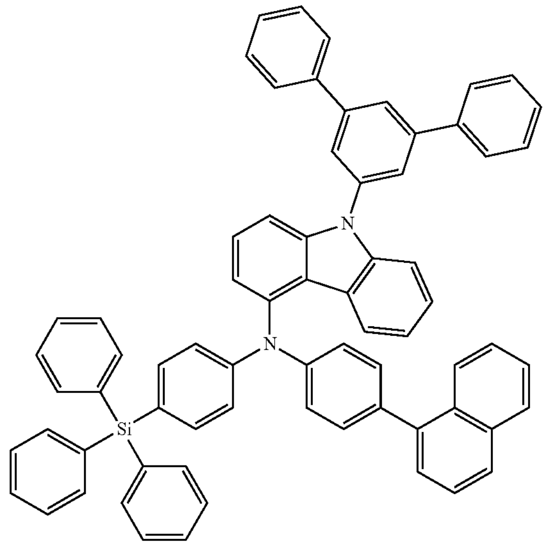
A47
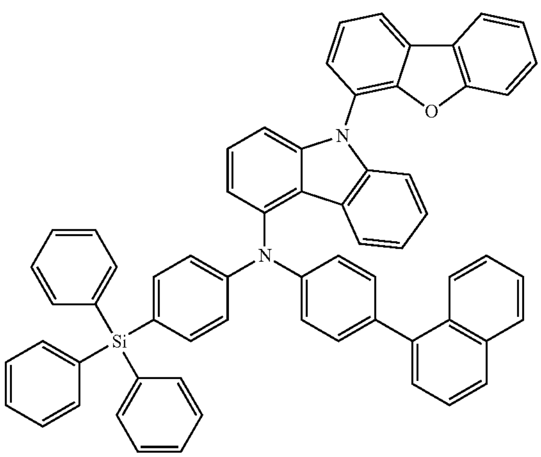
A48
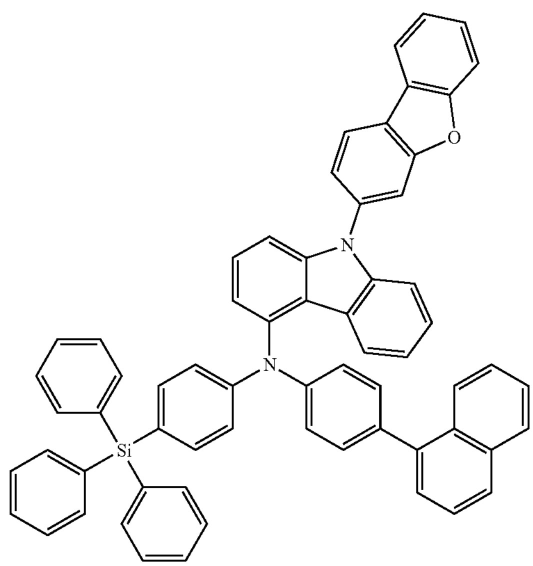
A49
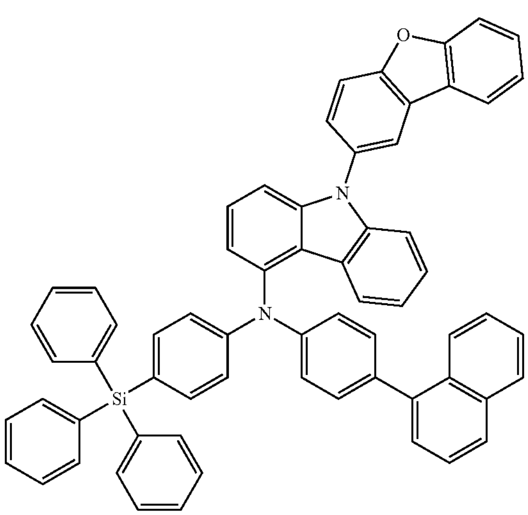
A50
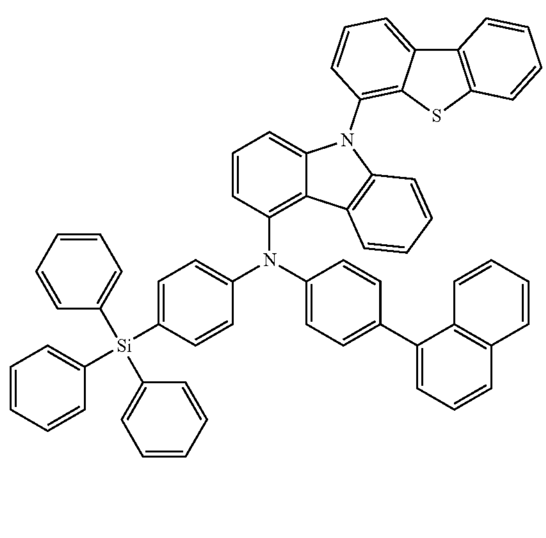

-continued
A51
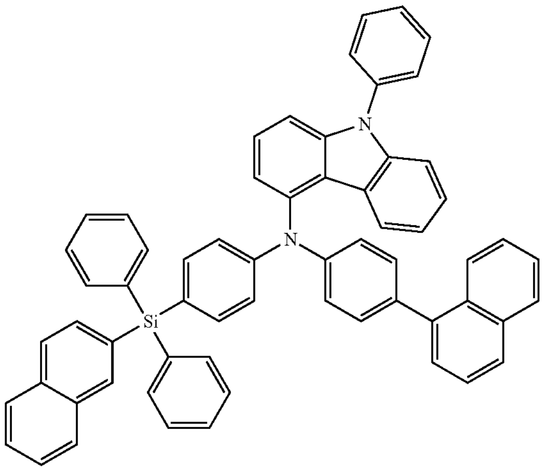
A52
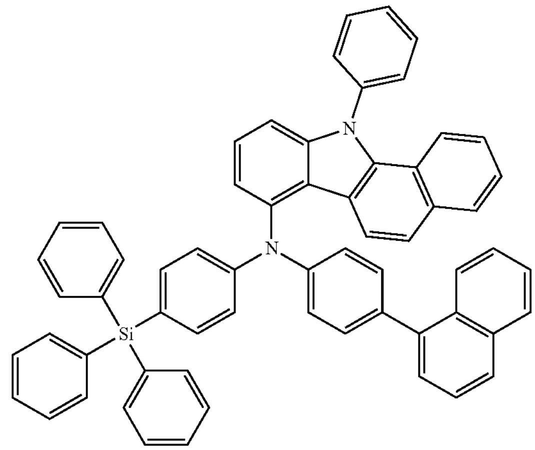
A53
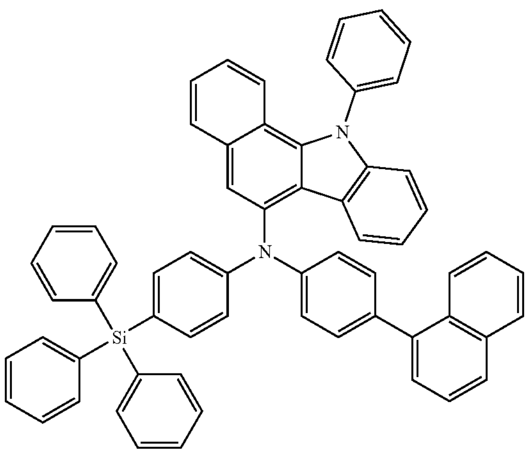
A54
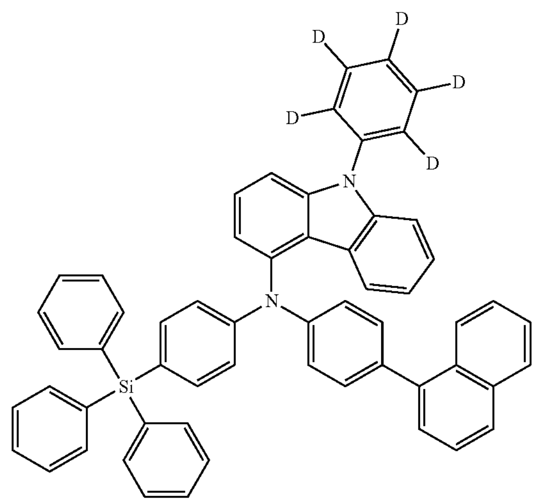
A55
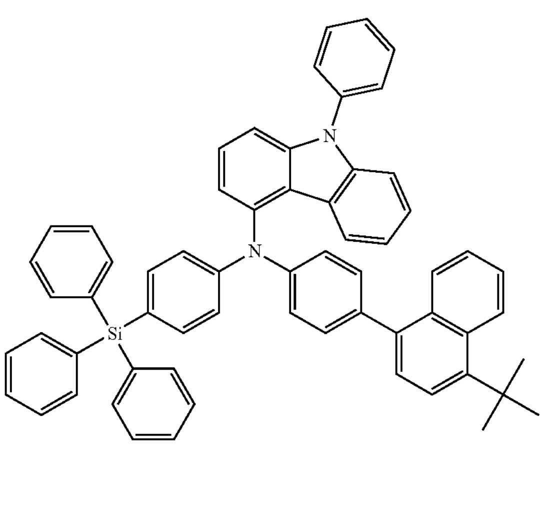
A56
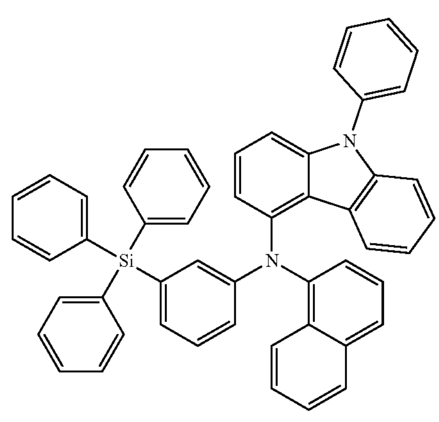

-continued
A57
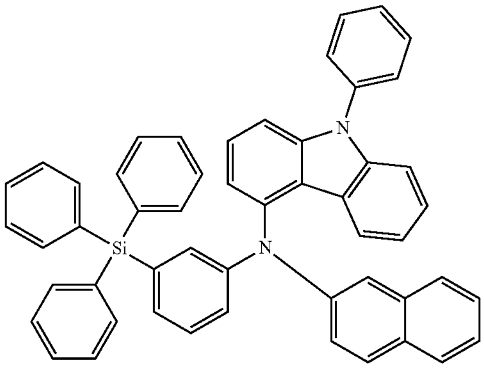
A58
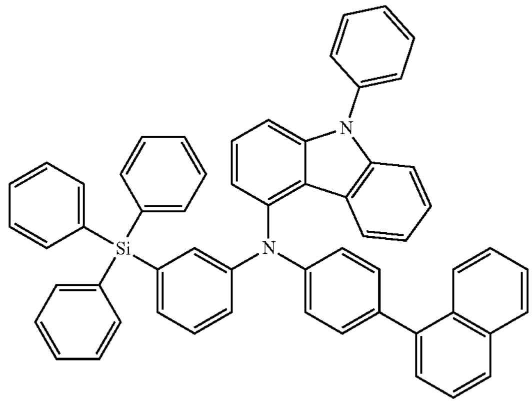
A59
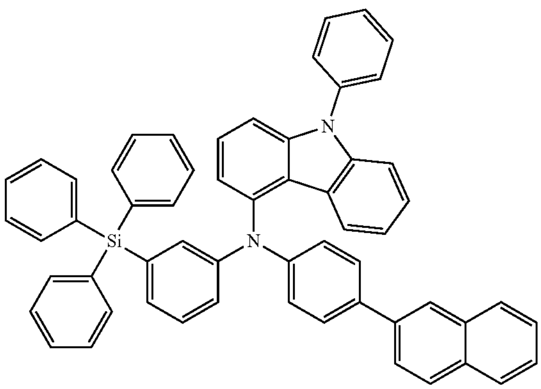
A60
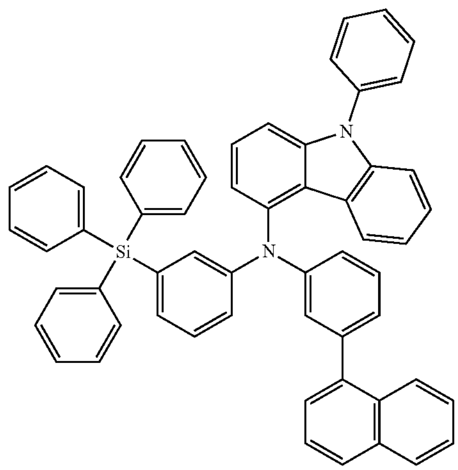
A61
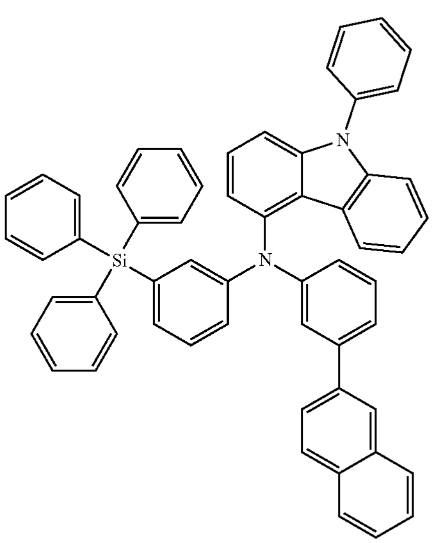
A62
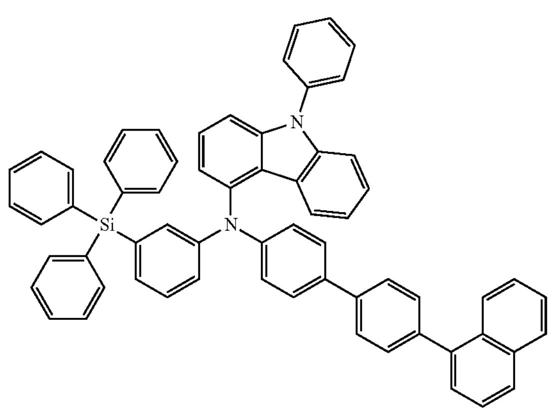

-continued
A63
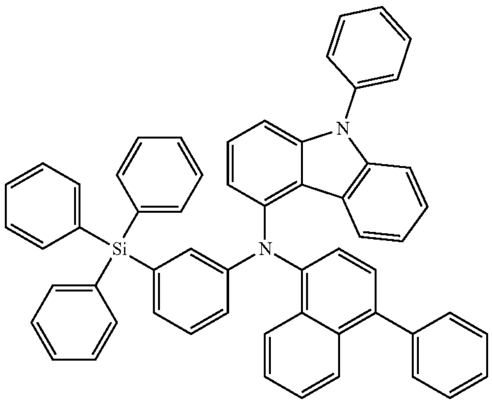
A64
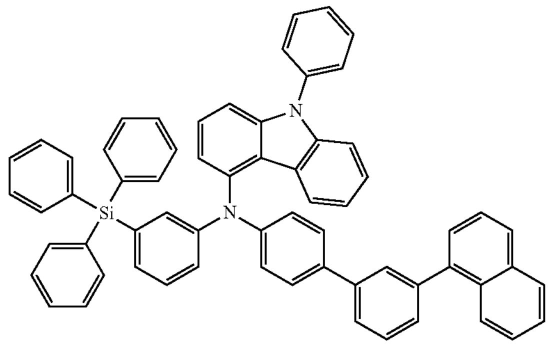
A65
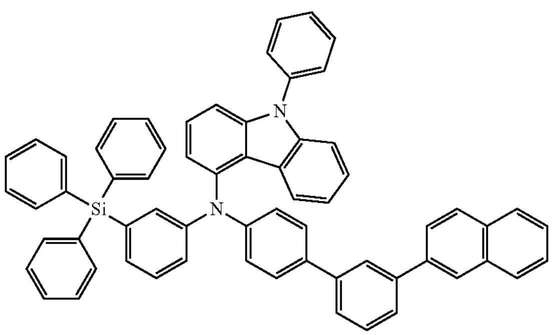
A66
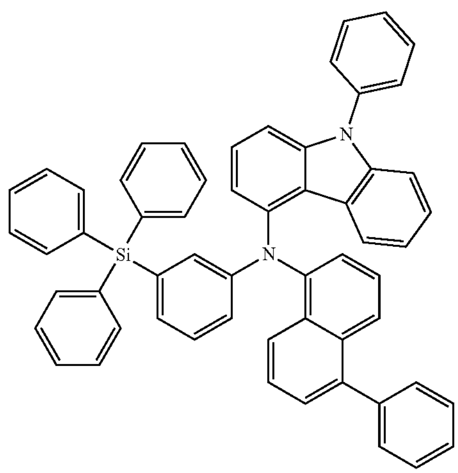
A67
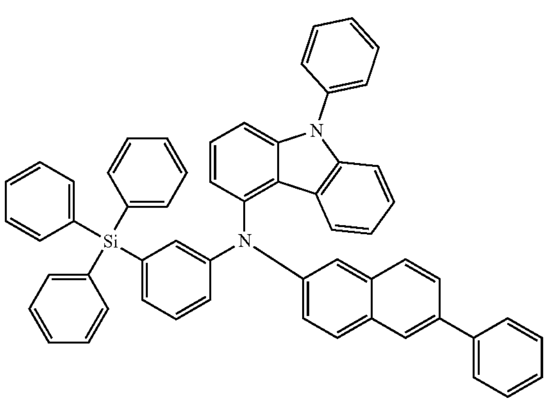
A68
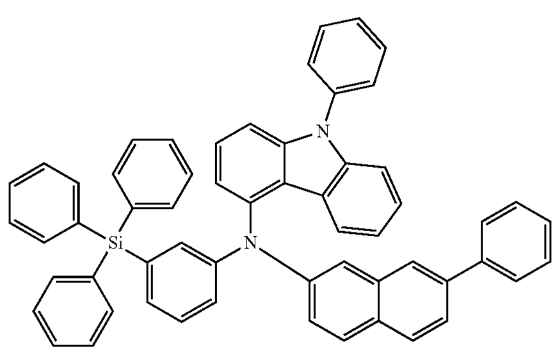

-continued
A69
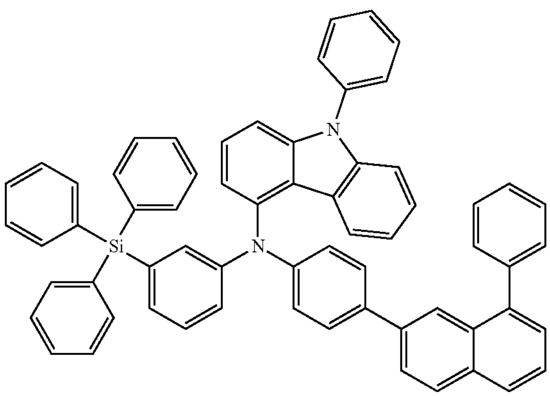
A70
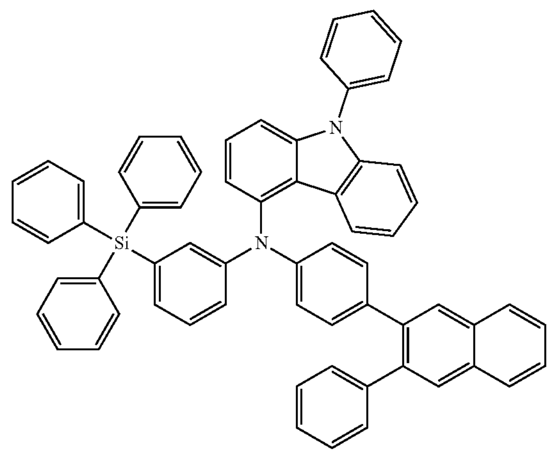
A71
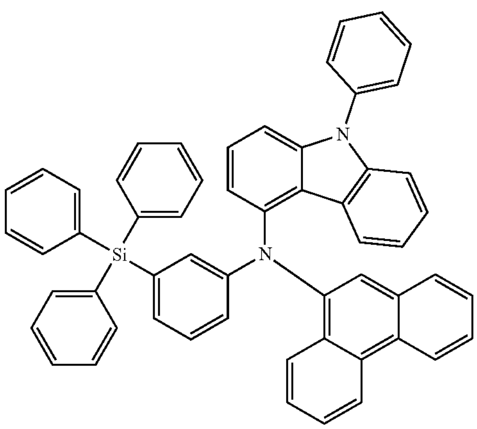
A72
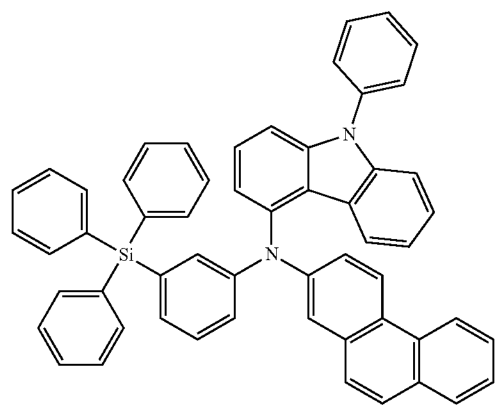
A73
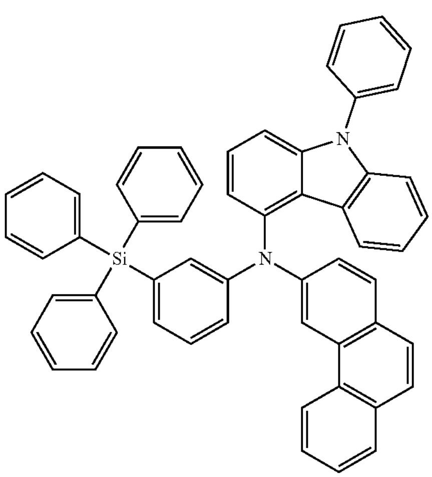
A74
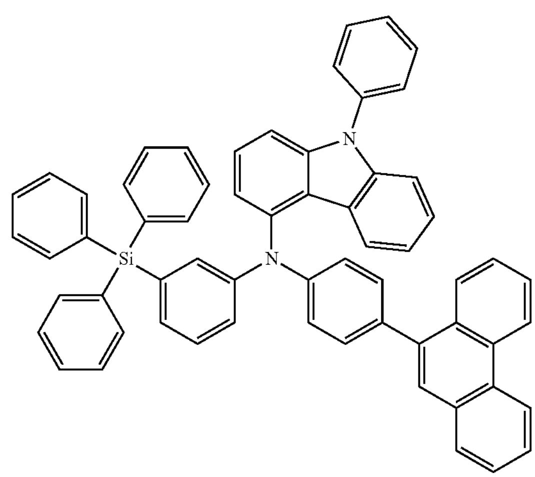

-continued
A75
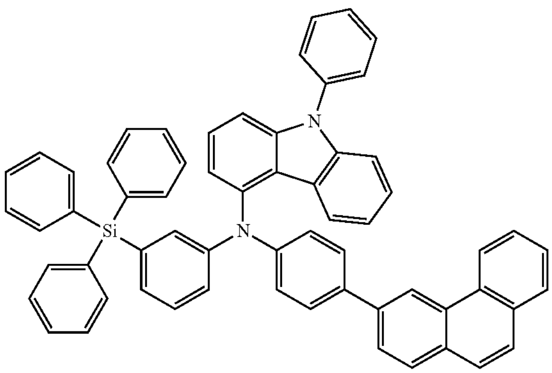
A76
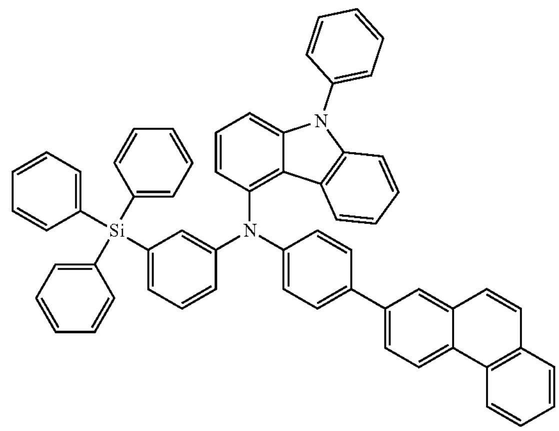
A77
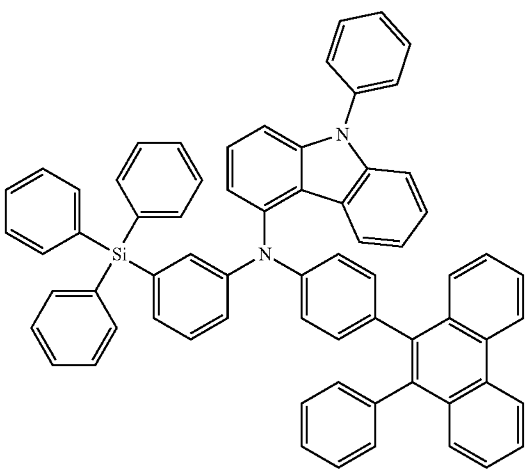
A78
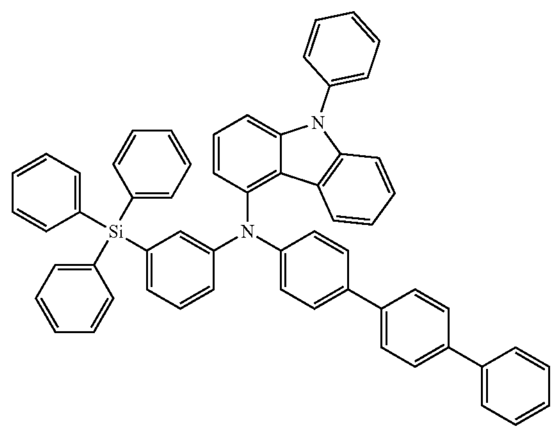
A79
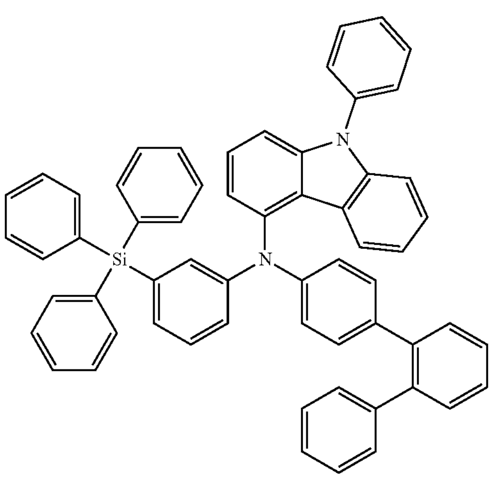
A80
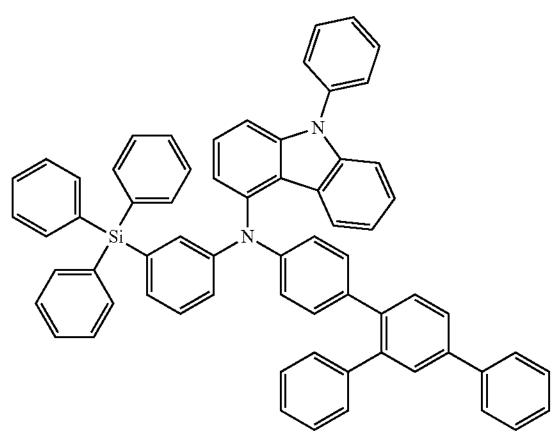

-continued
A81
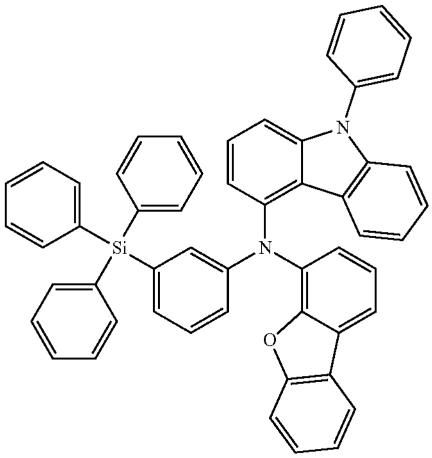
A82
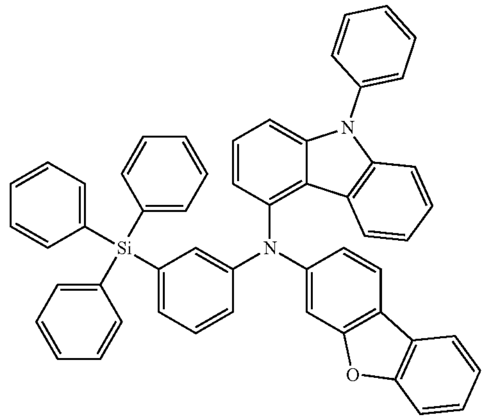
A83
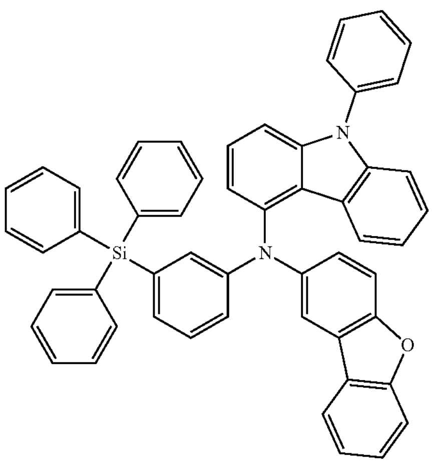
A84
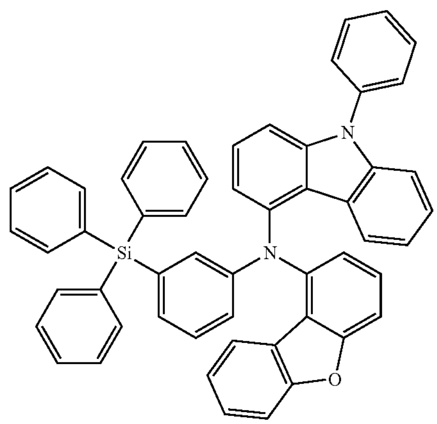
A85
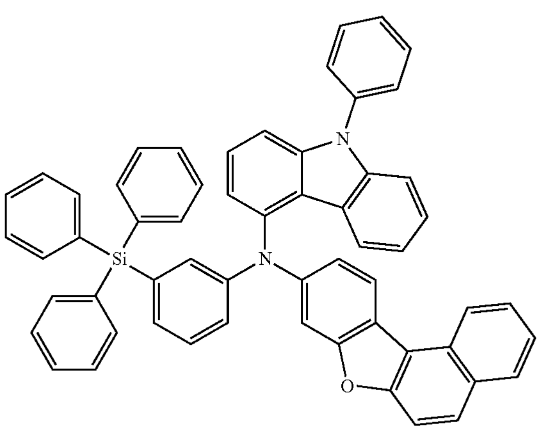
A86
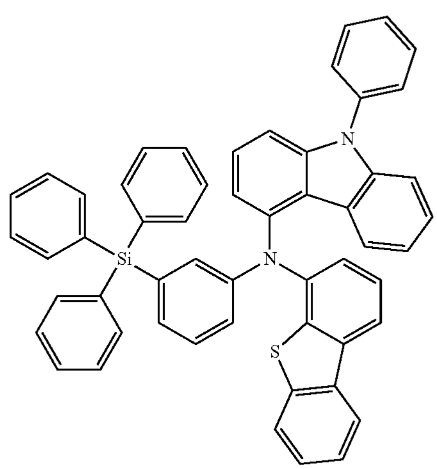

-continued
A87
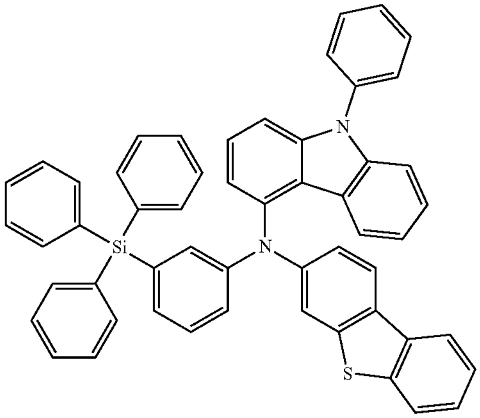
A88
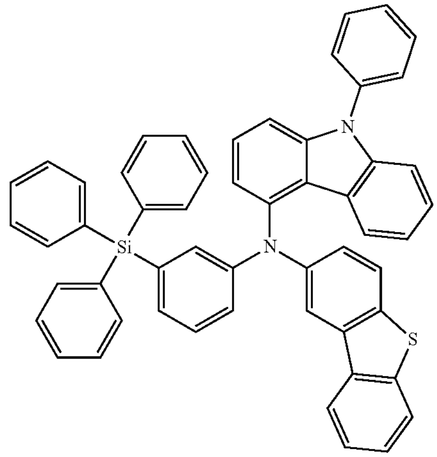
A89
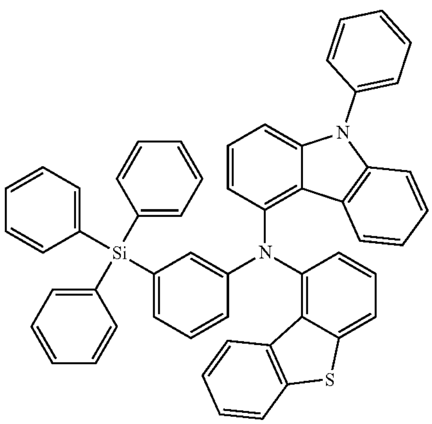
A90
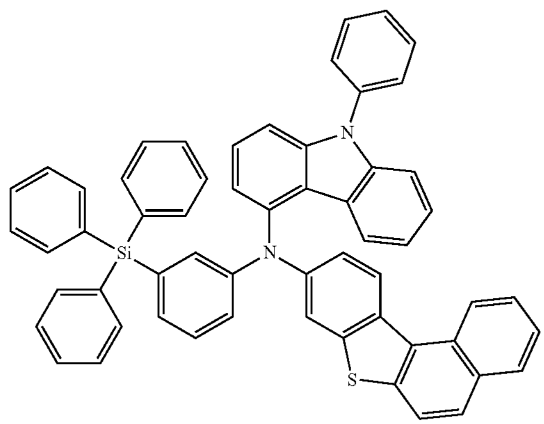
A91
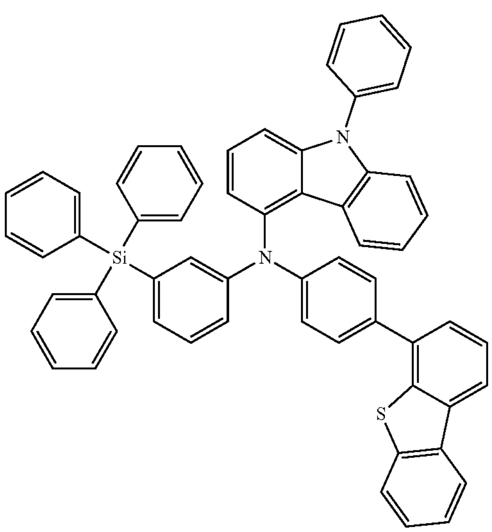
A92
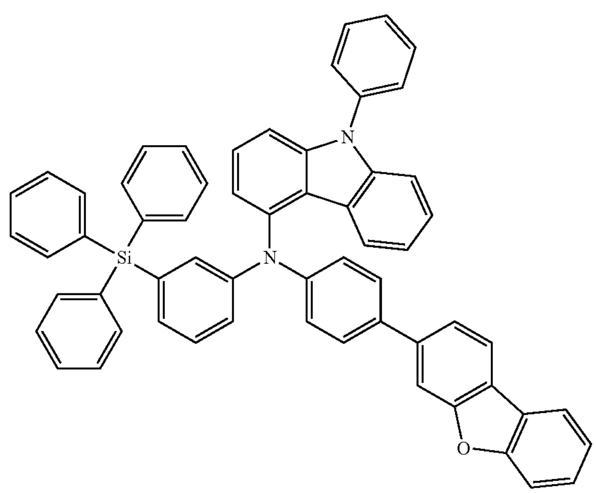

-continued
A93
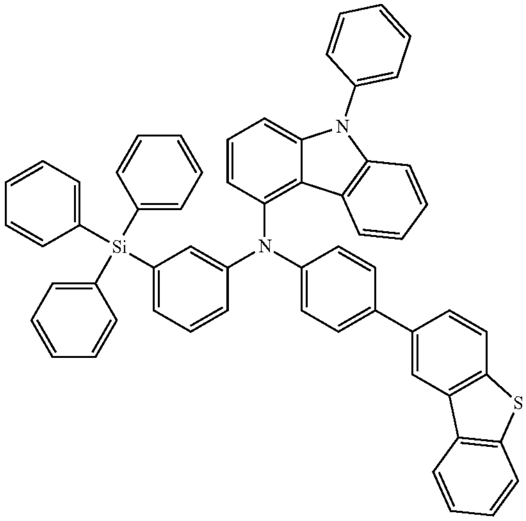
A94
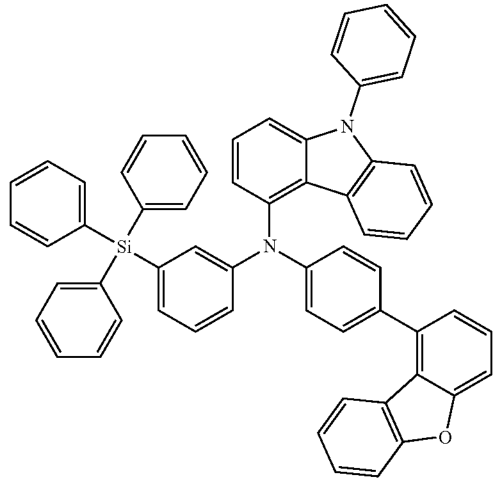
A95
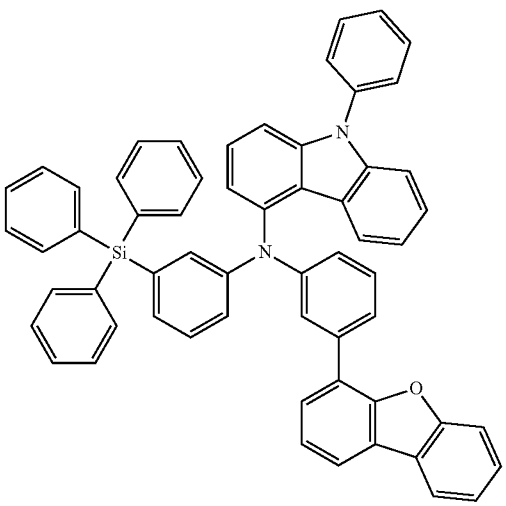
A96
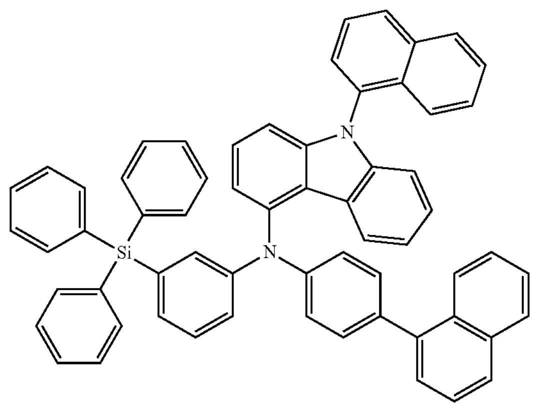
A97
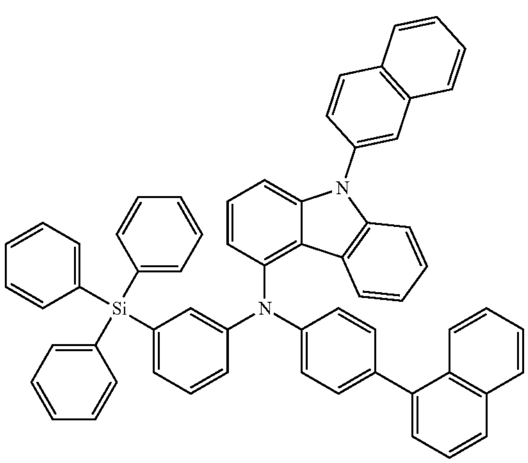
A98
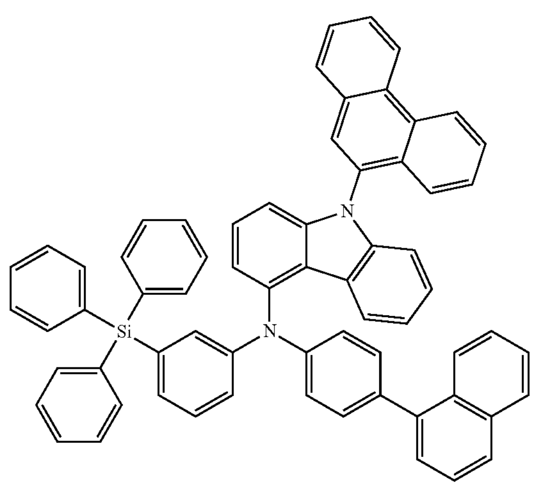

-continued
A99
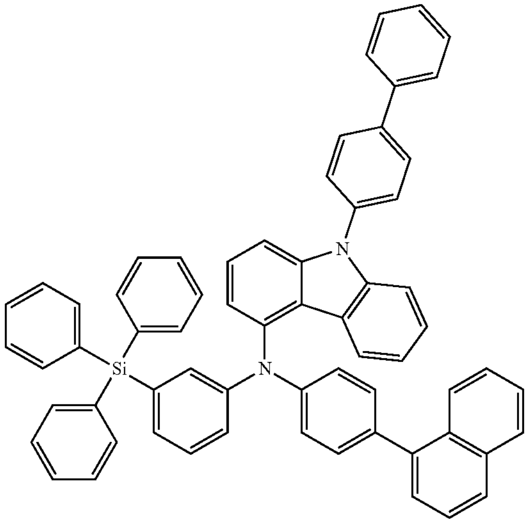
A100
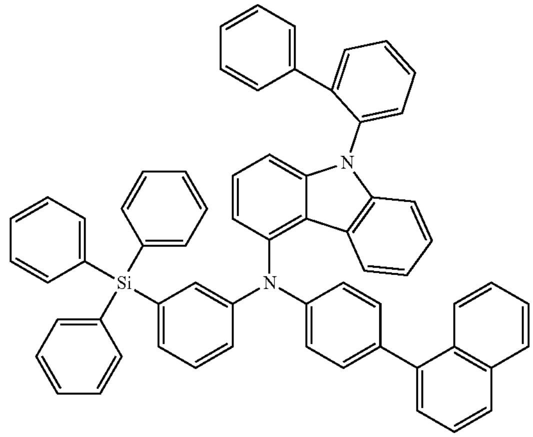
A101
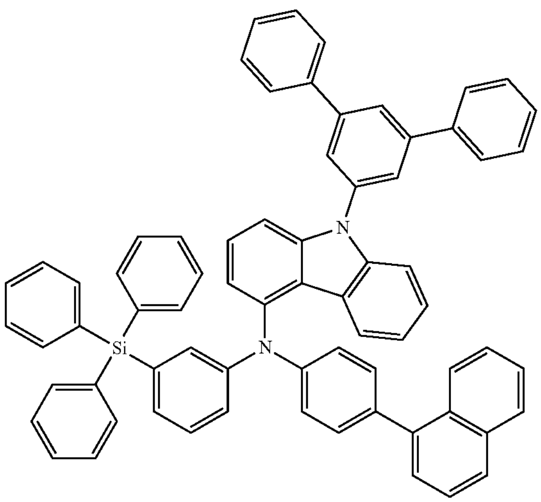
A102
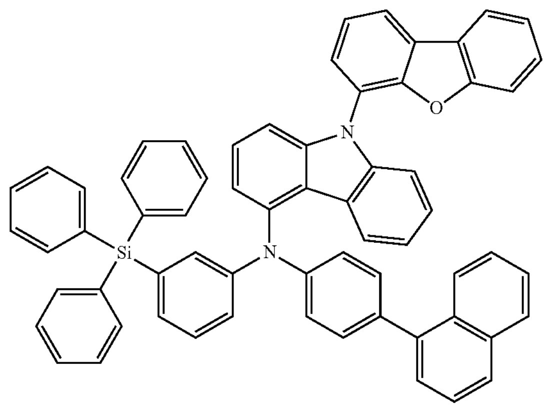
A103
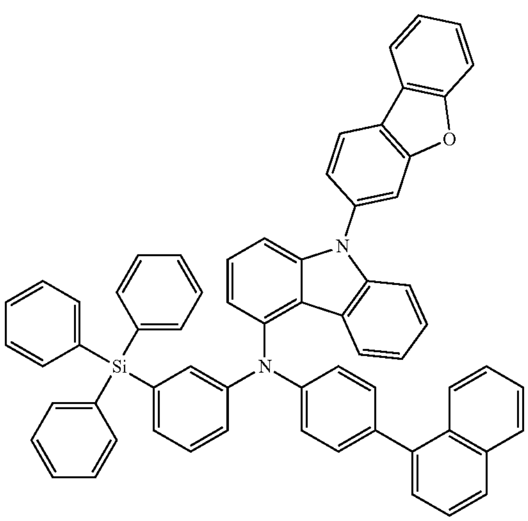
A103
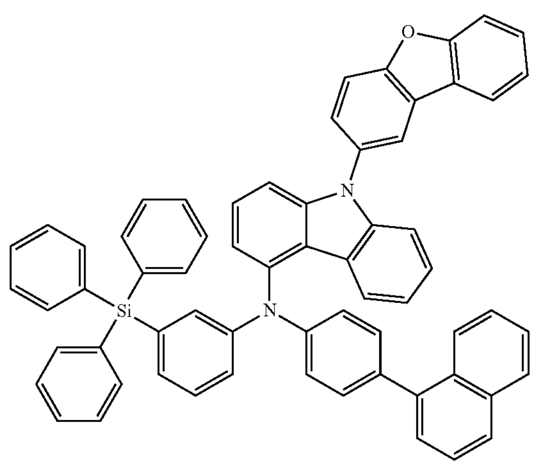

-continued
A105
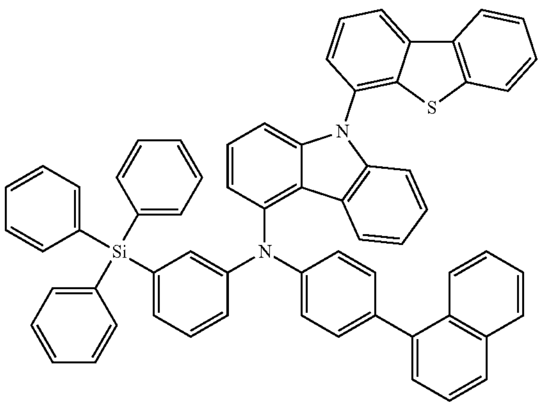
A106
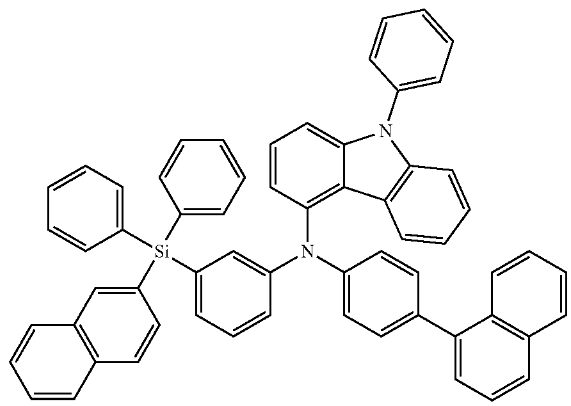
A107
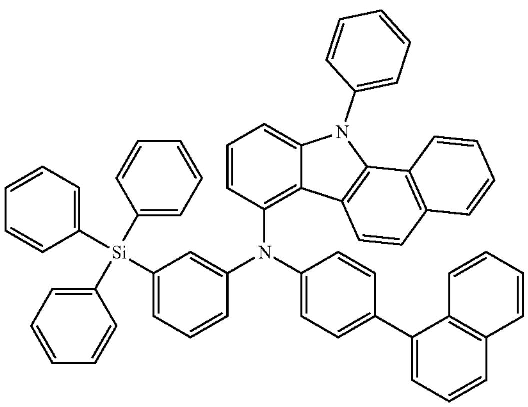
A108
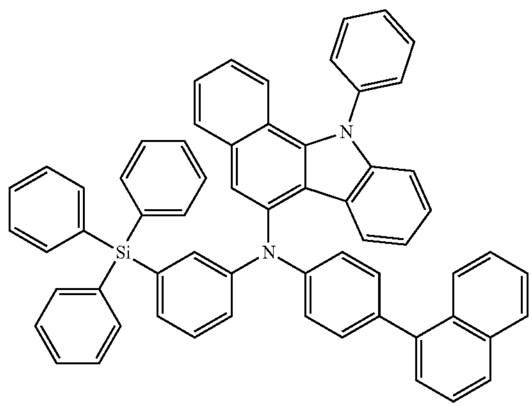
A109
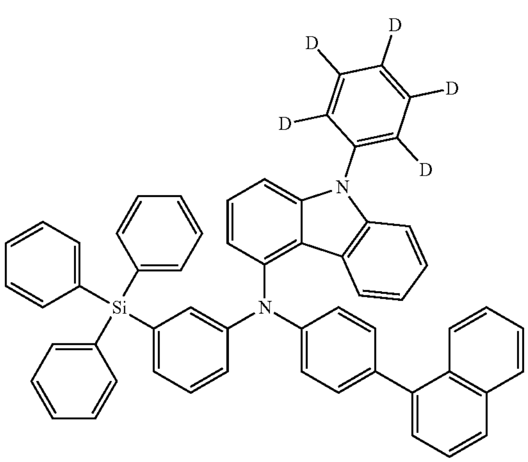
A110
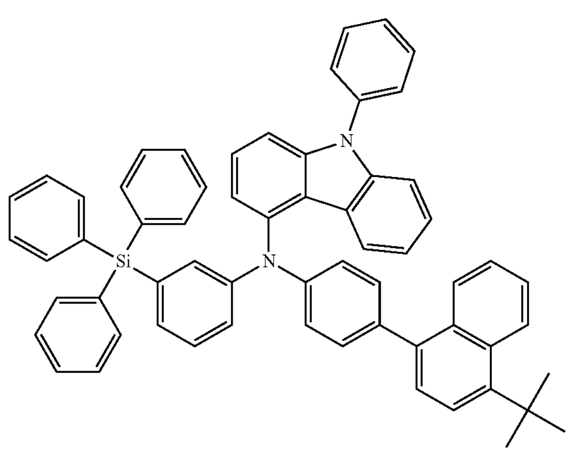

-continued
A111
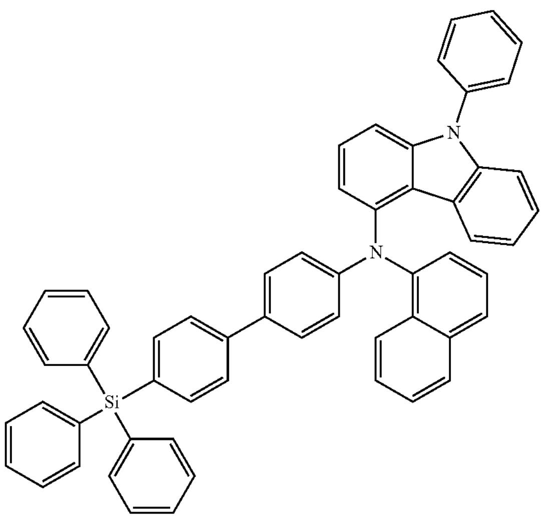
A112
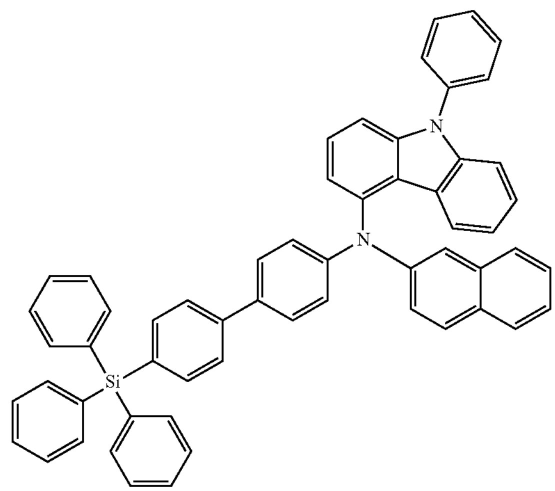
A113
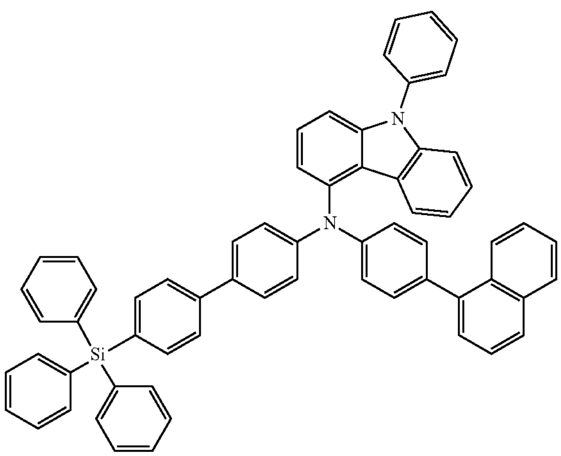
A114
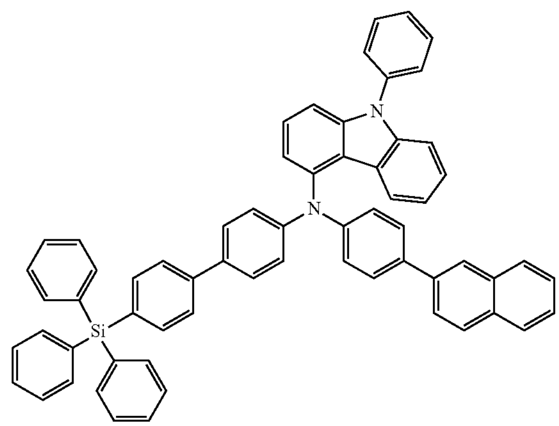
A115
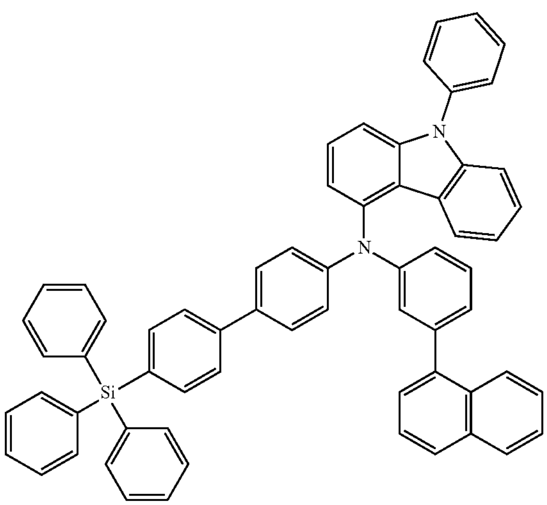
A116
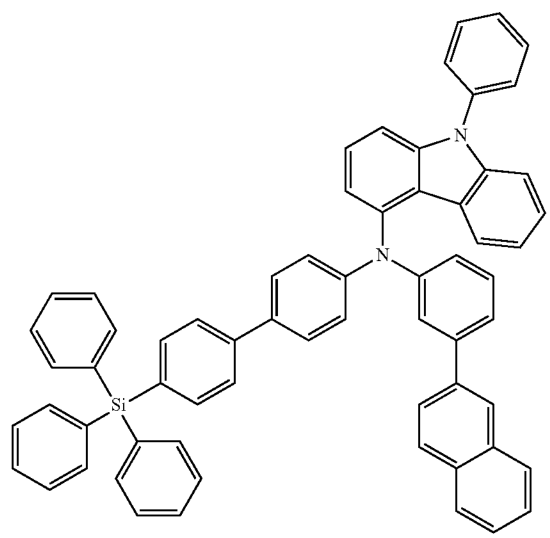

-continued
A117
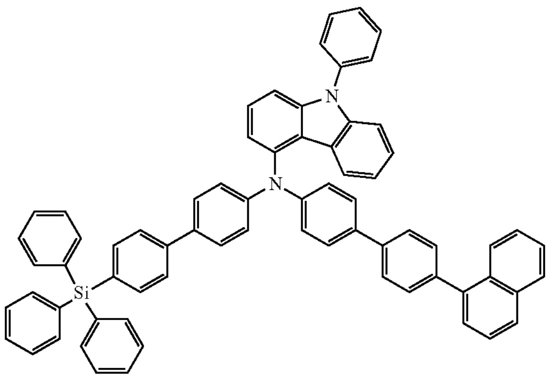
A118
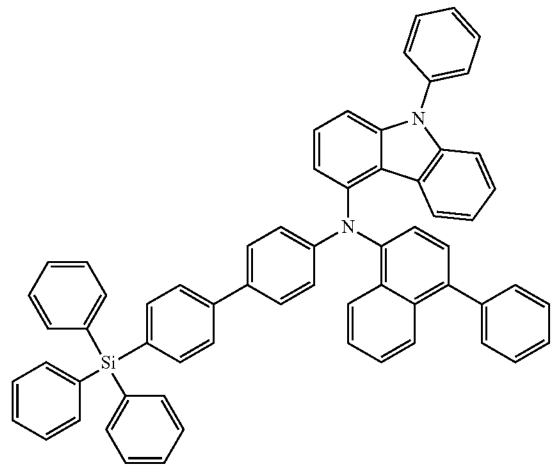
A119
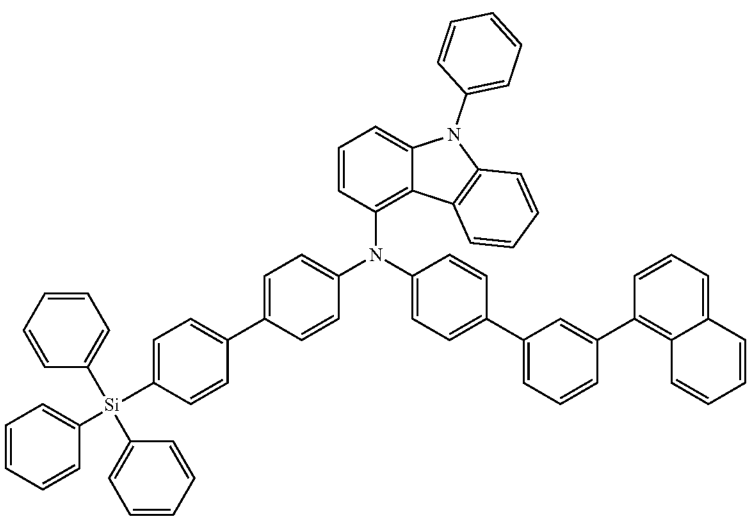
A120
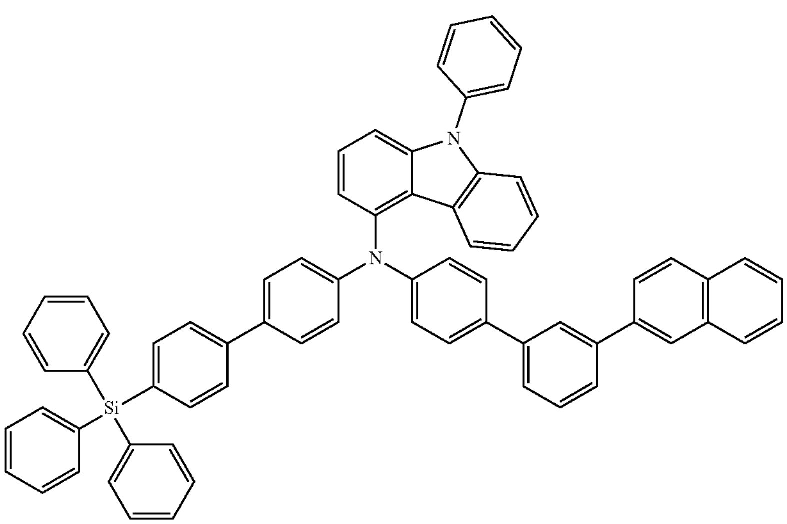

-continued
A121
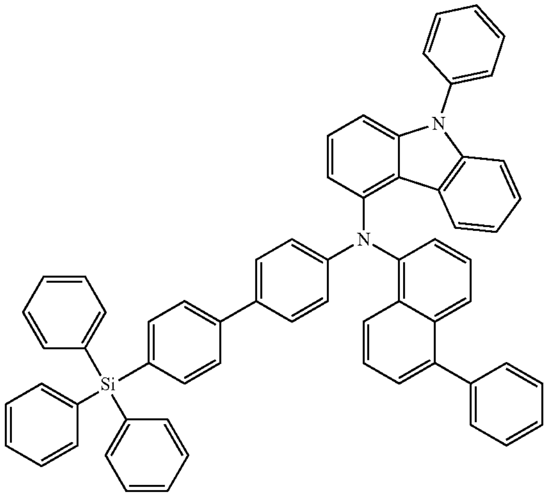
A122
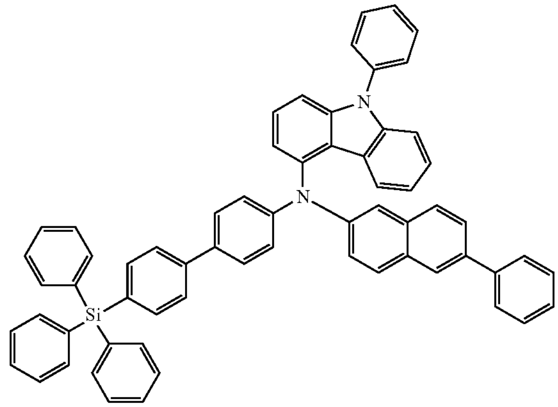
A123
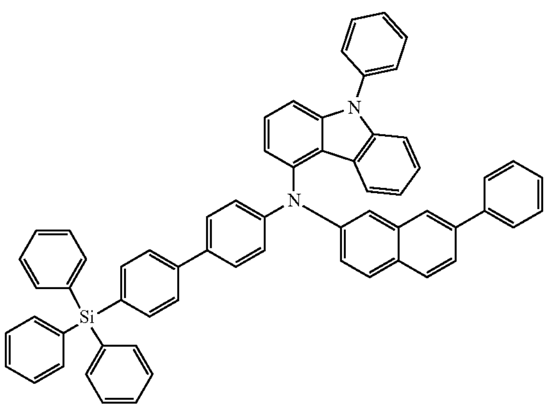
A124
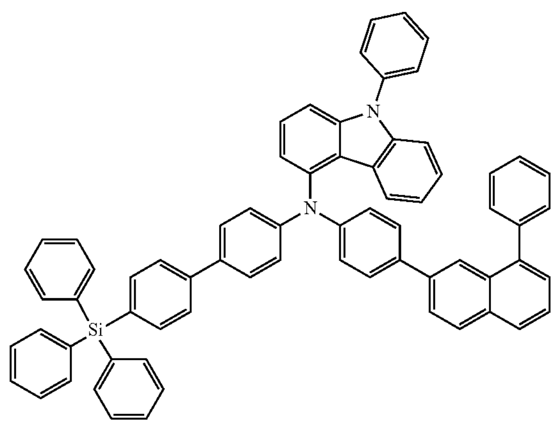
A125
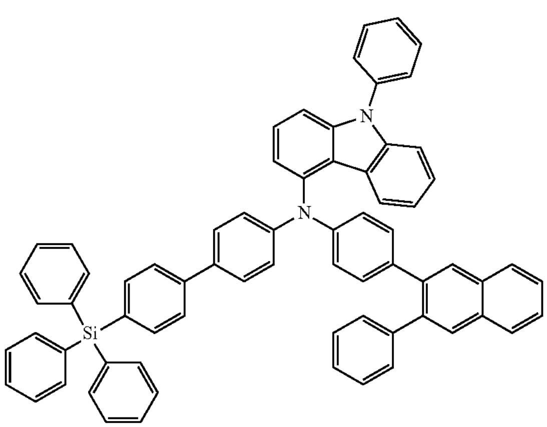
A126
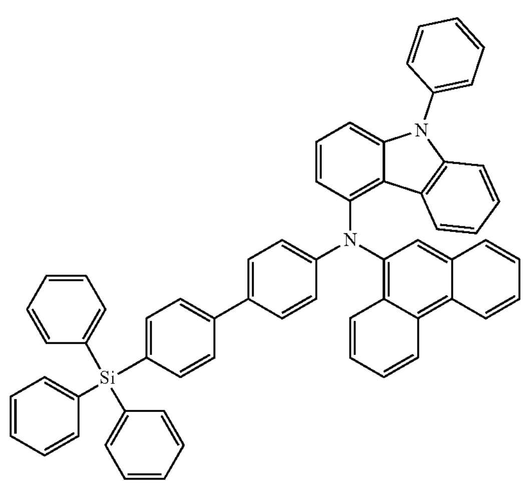

-continued
A127
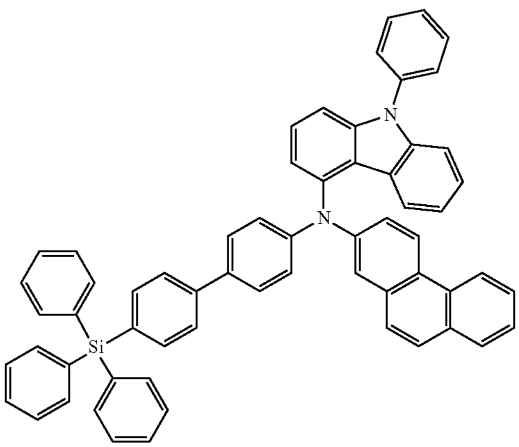
A128
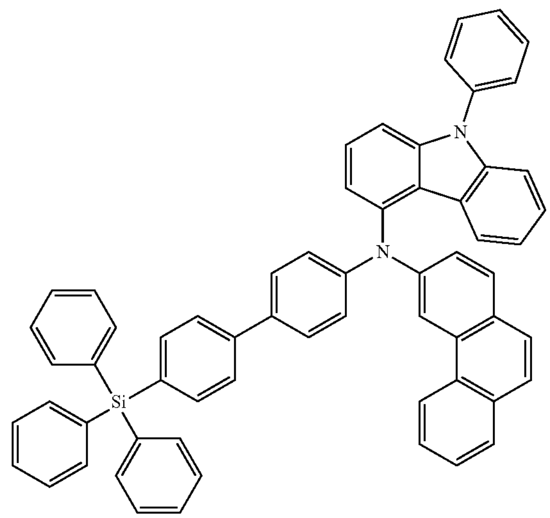
A129
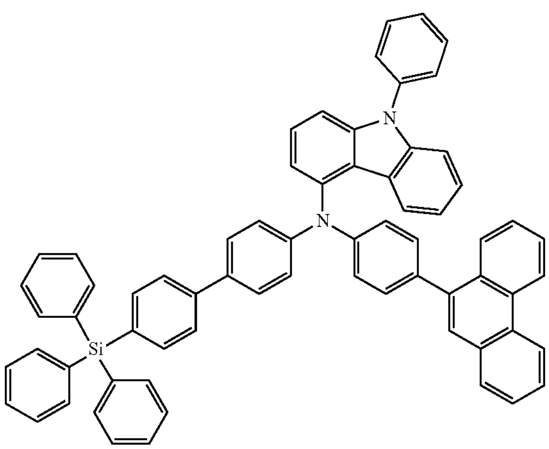
A130
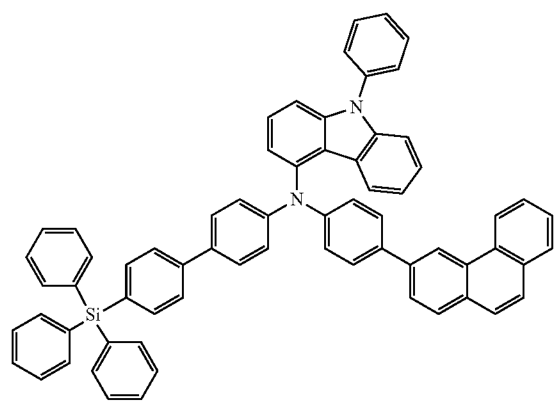
A131
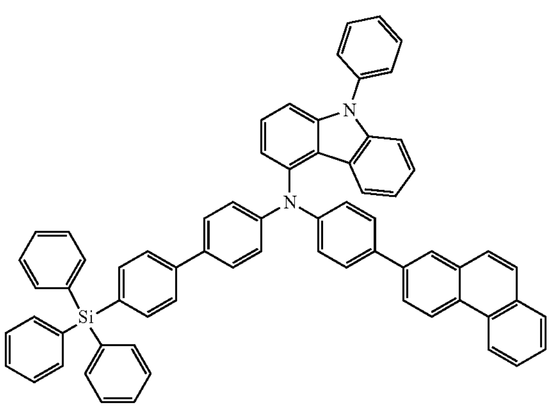
A132
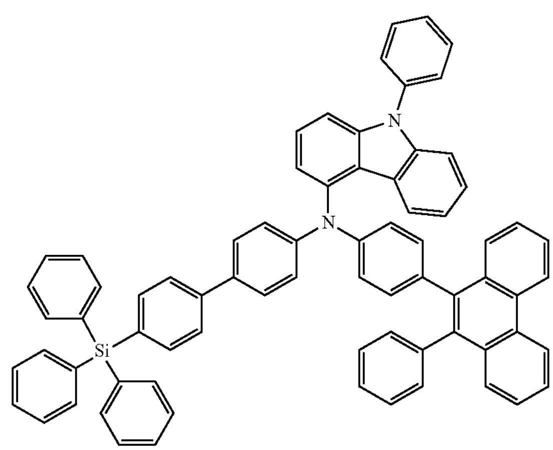

-continued
A133
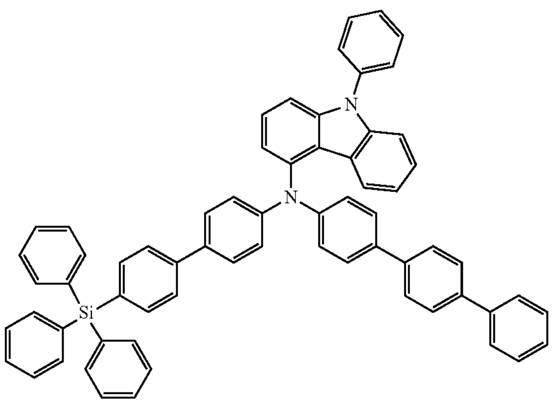
A134
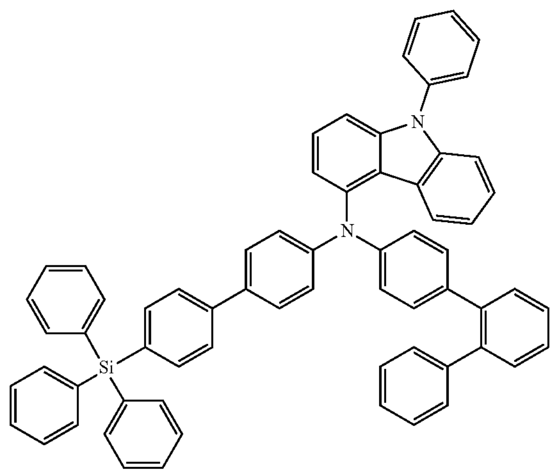
A135
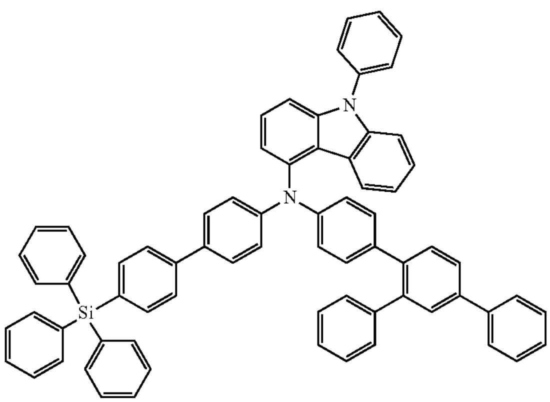
A136
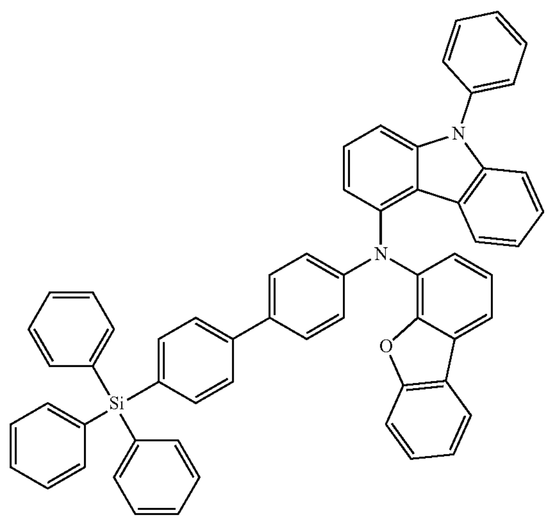
A137
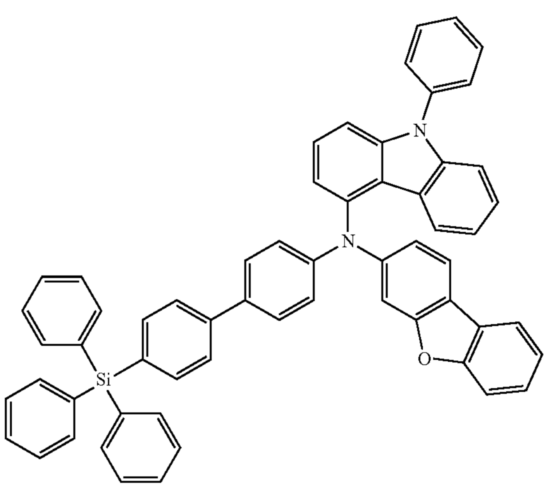
A138
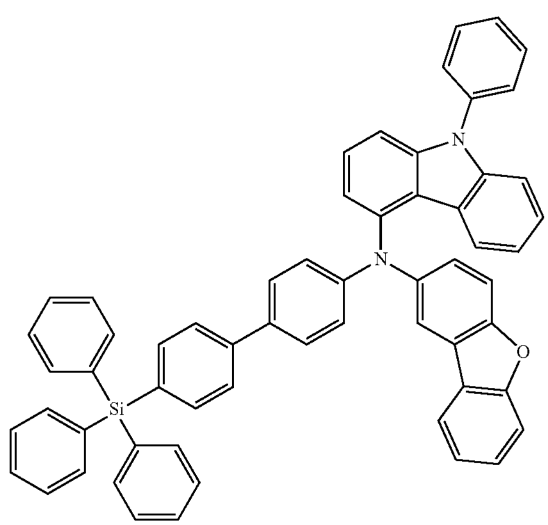

-continued
A139
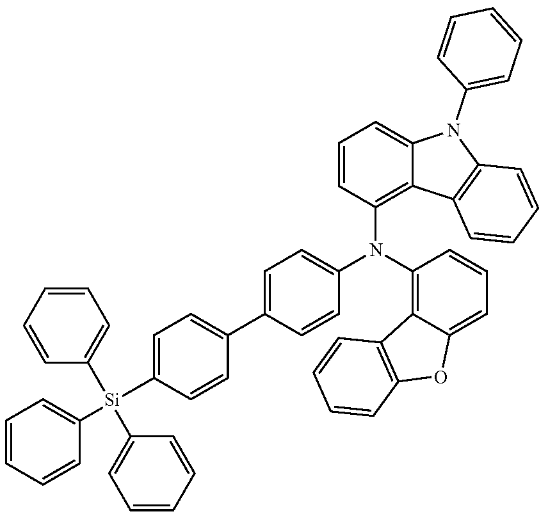
A140
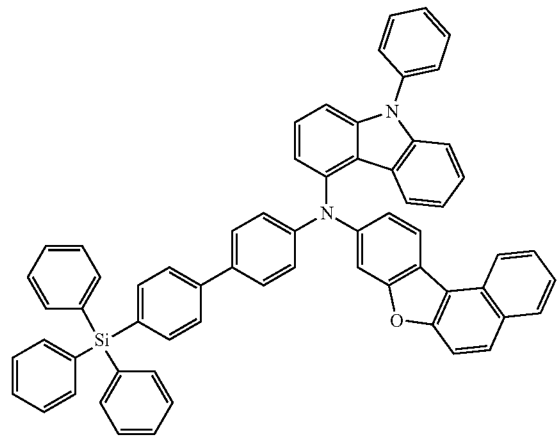
A141
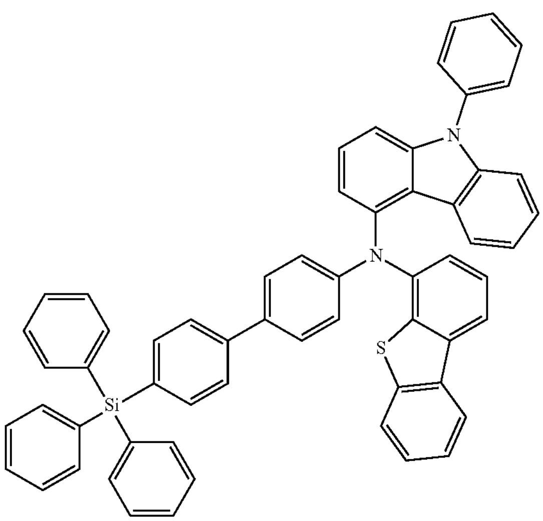
A142
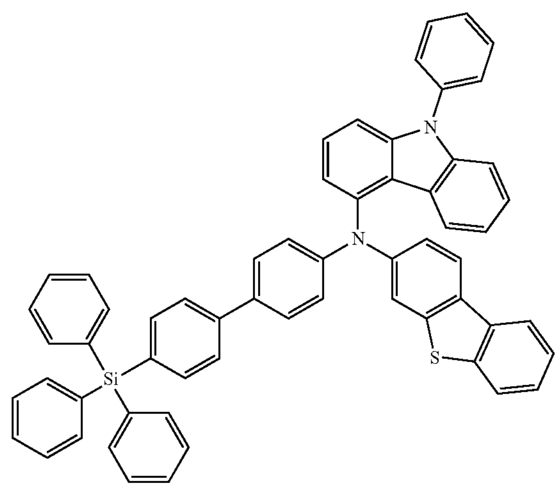
A143
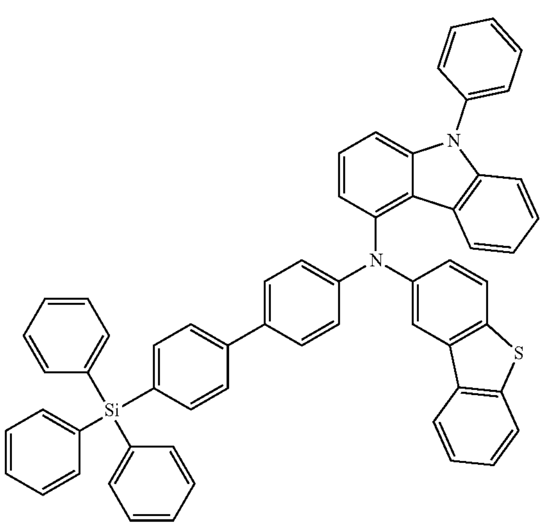
A144
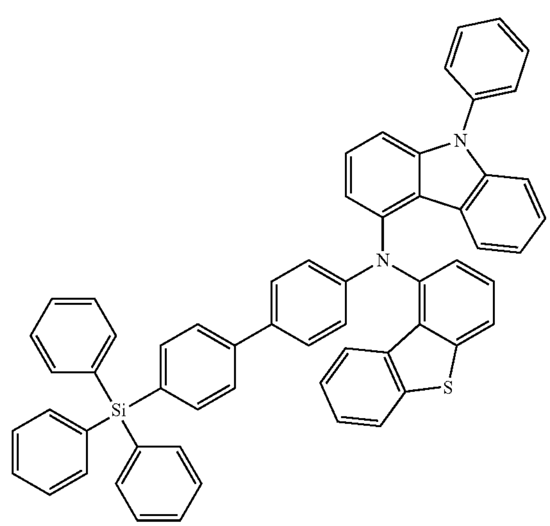

-continued
A145
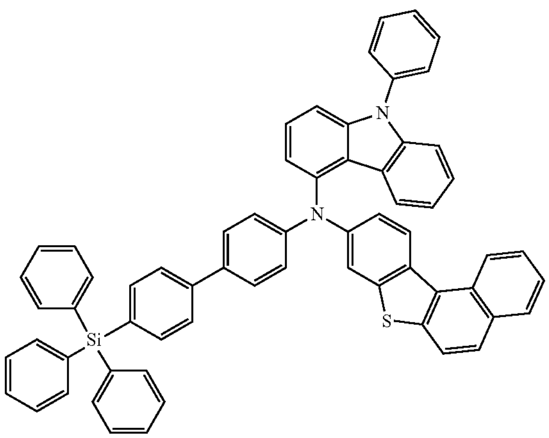
A146
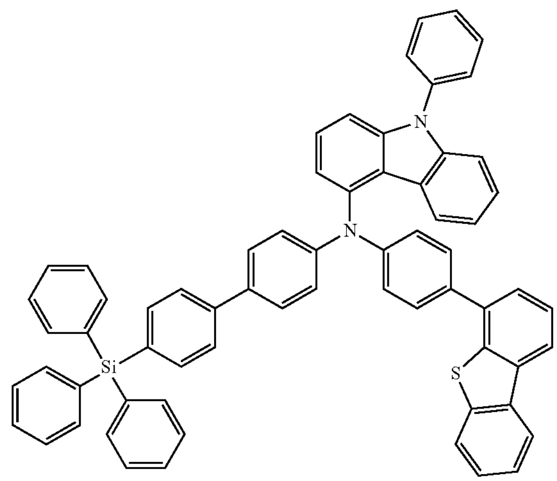
A147
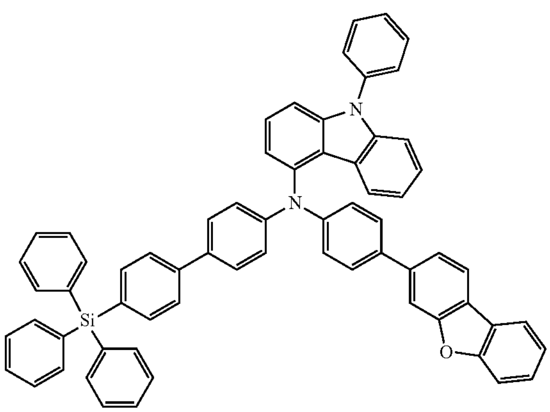
A148
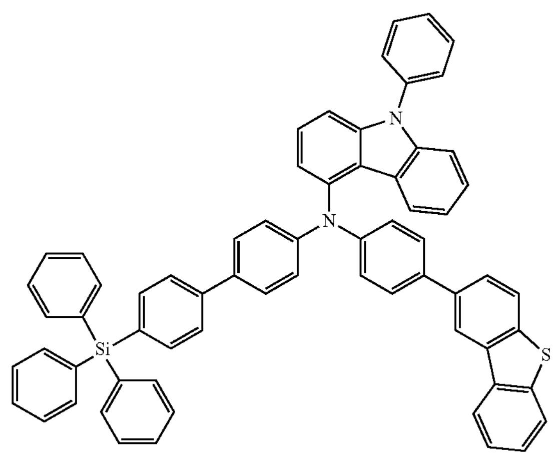
A149
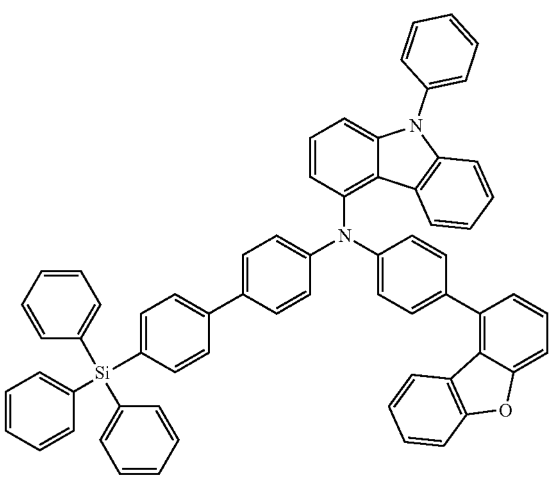
A150
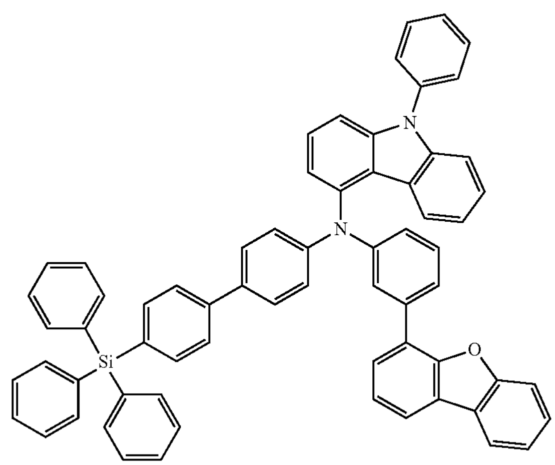

-continued
A151
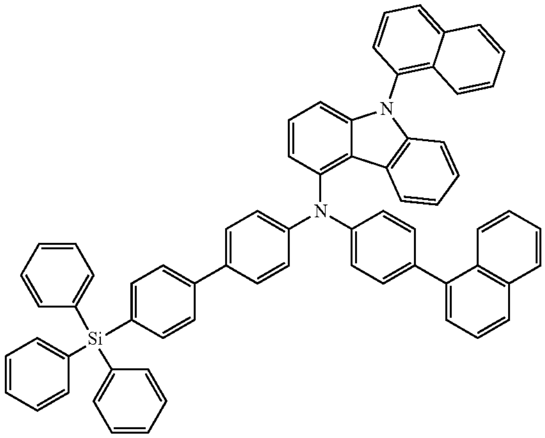
A152
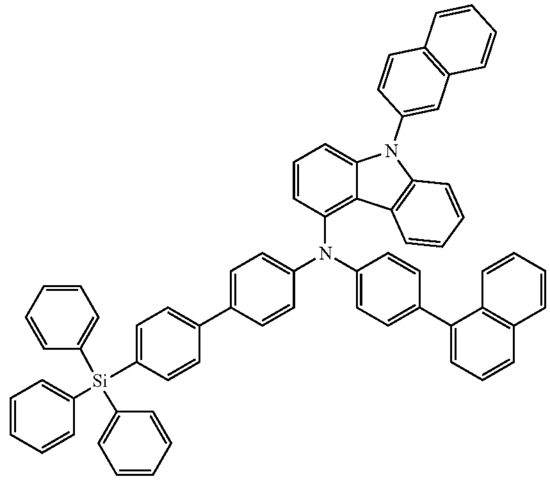
A153
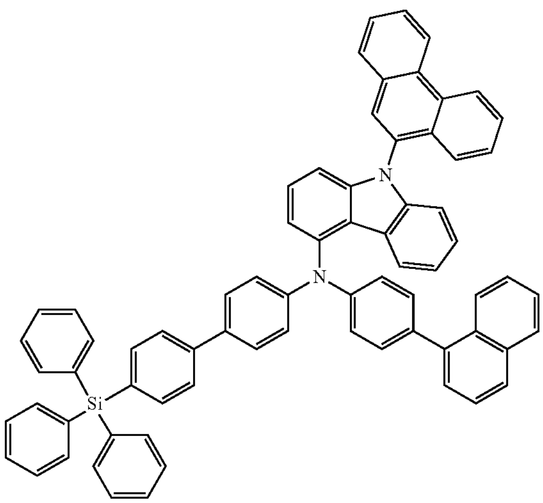
A154
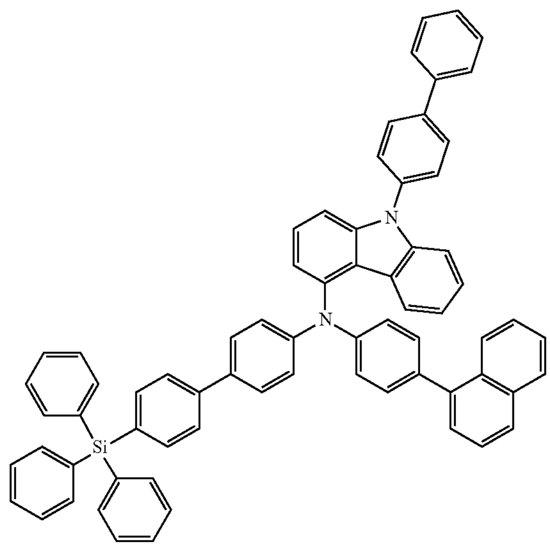
A155
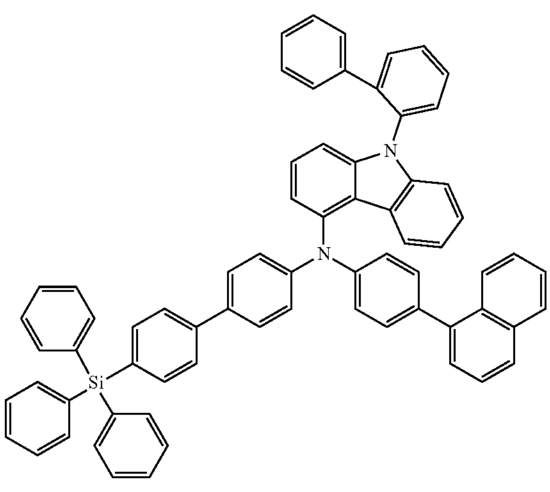
A156
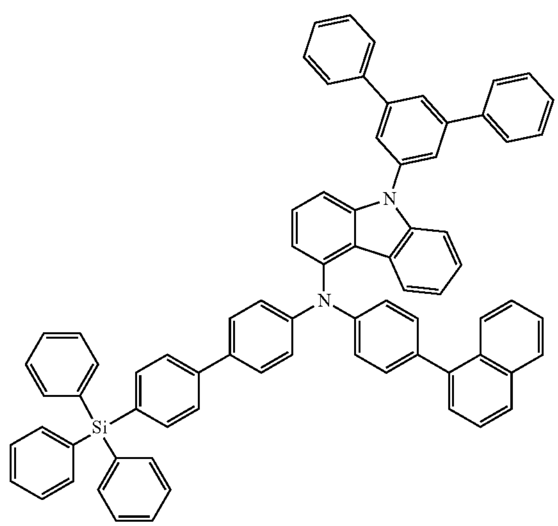

-continued
A157
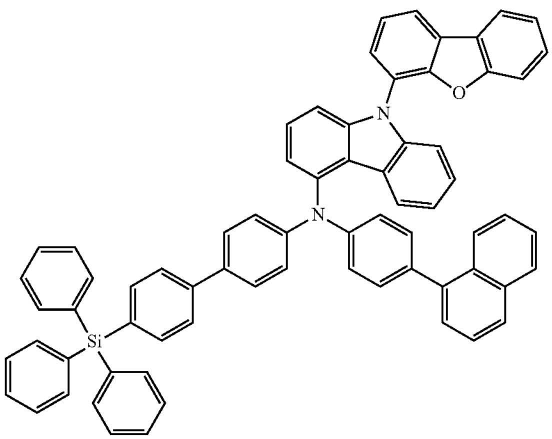
A158
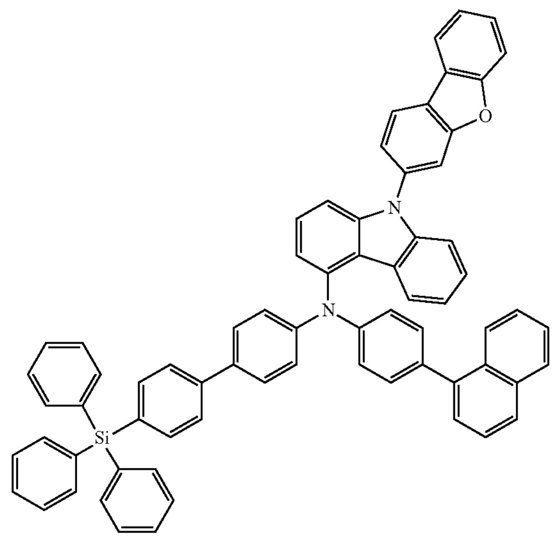
A159
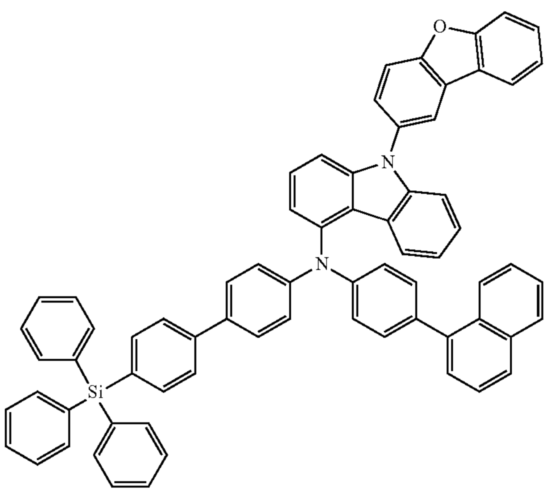
A160
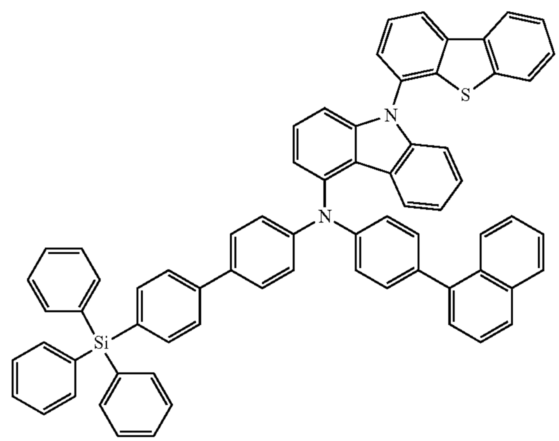
A161
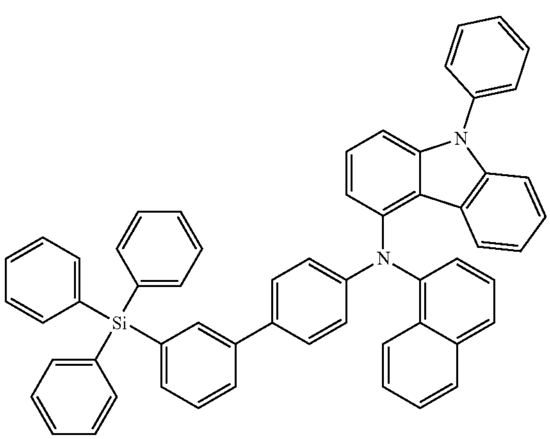
A162
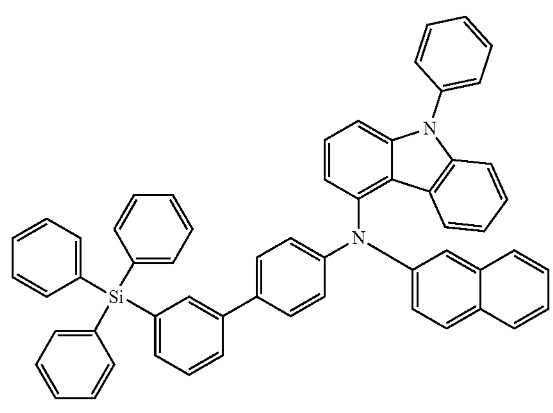

-continued
A163
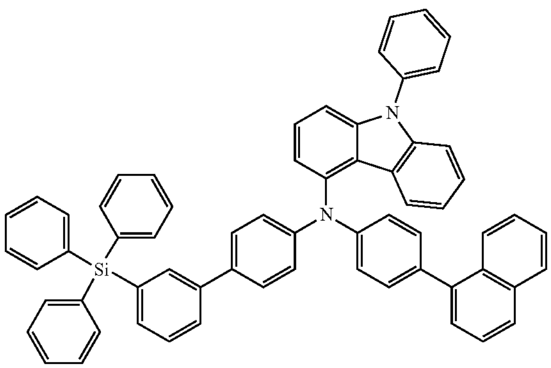
A164
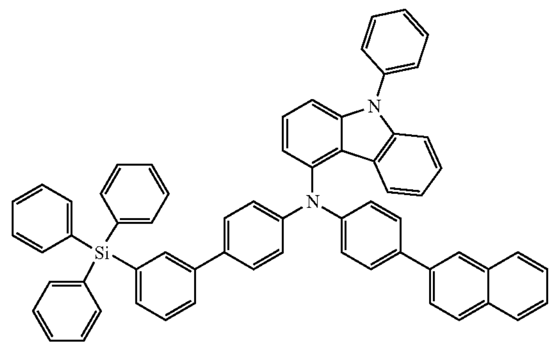
A165
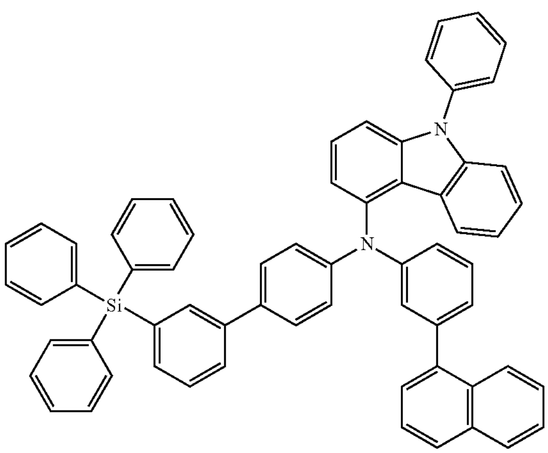
A166
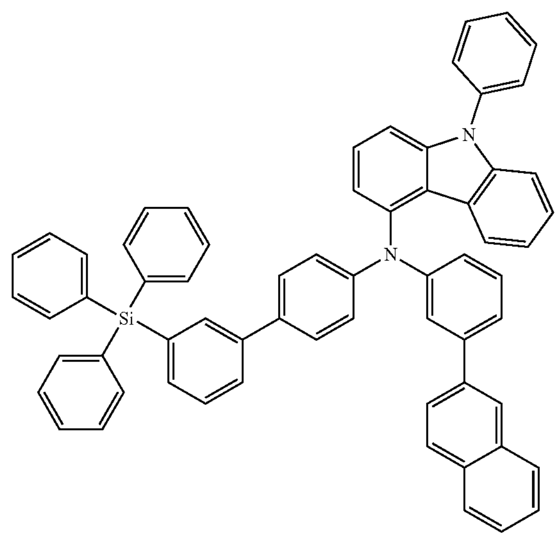
A167
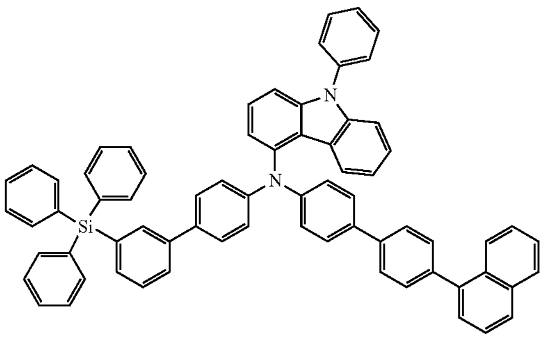
A168
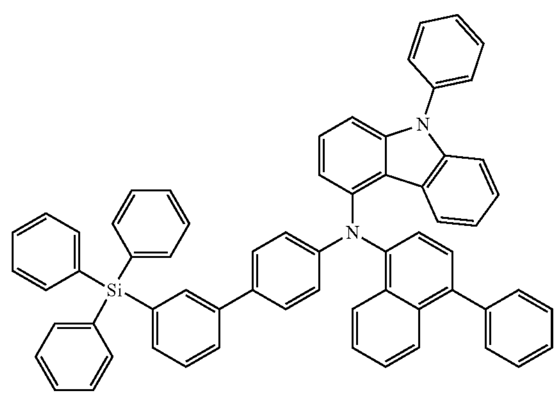

-continued
A169
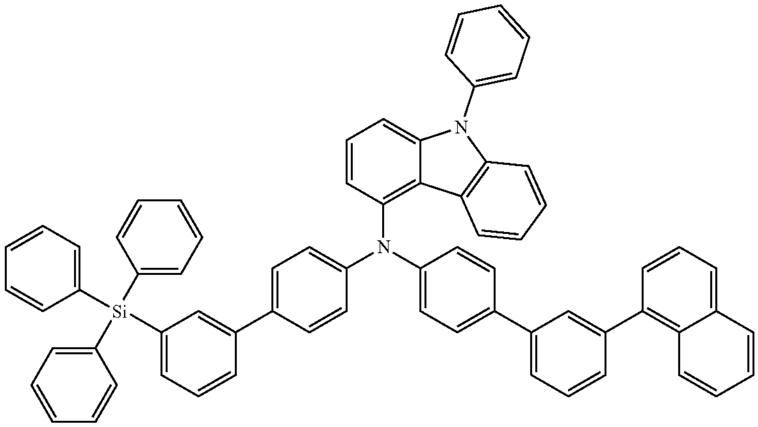
A170
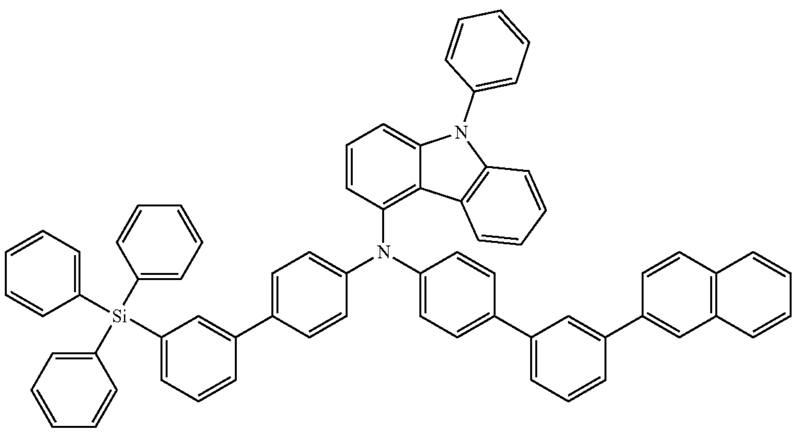
A171
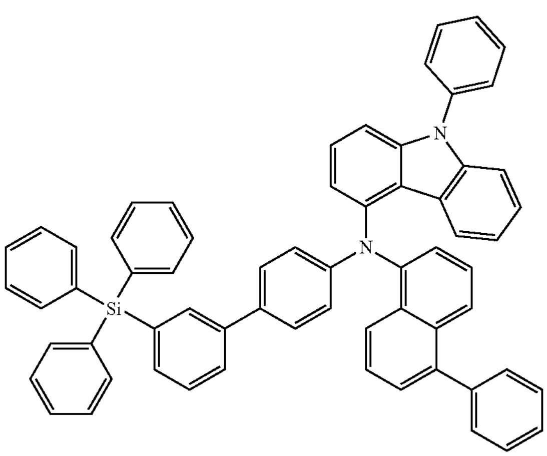
A172
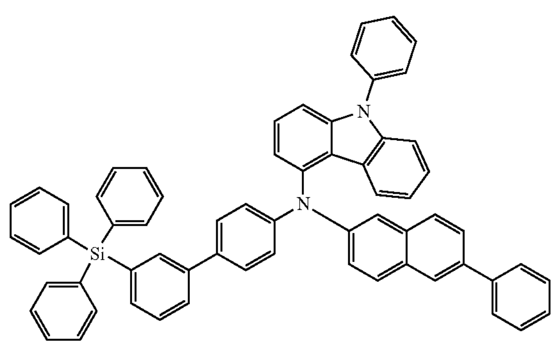

-continued
A173
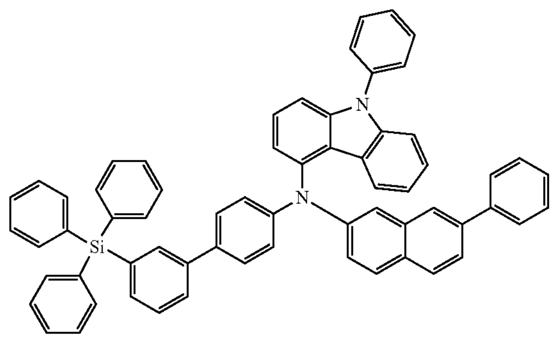
A174
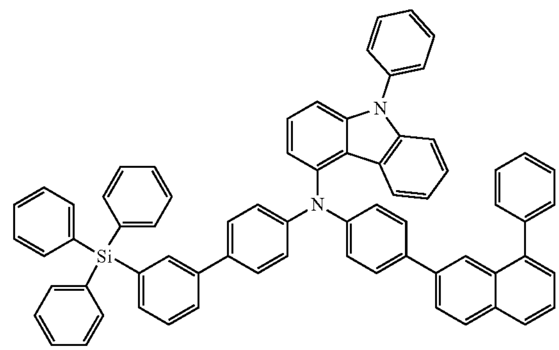
A175
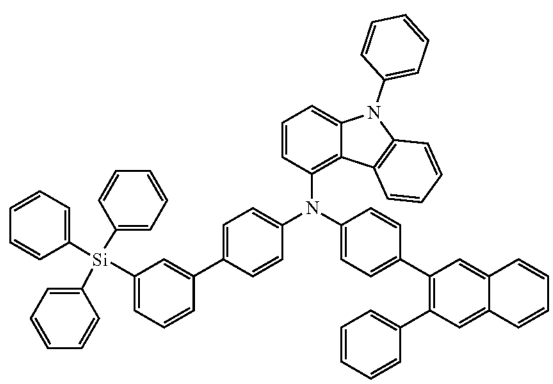
A176
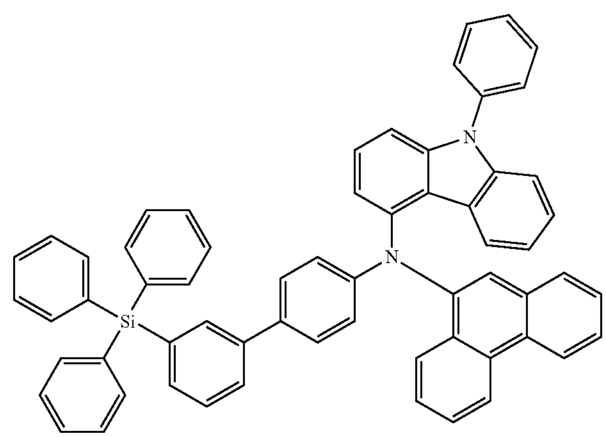
A177
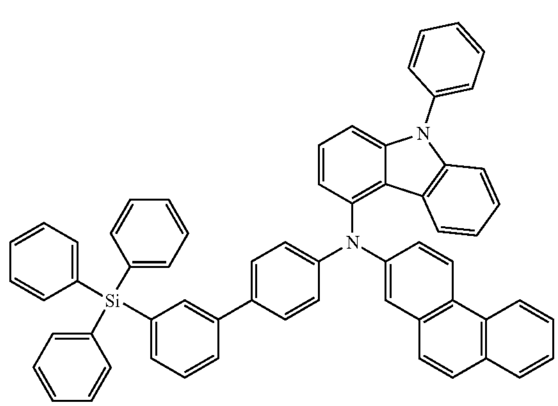
A178
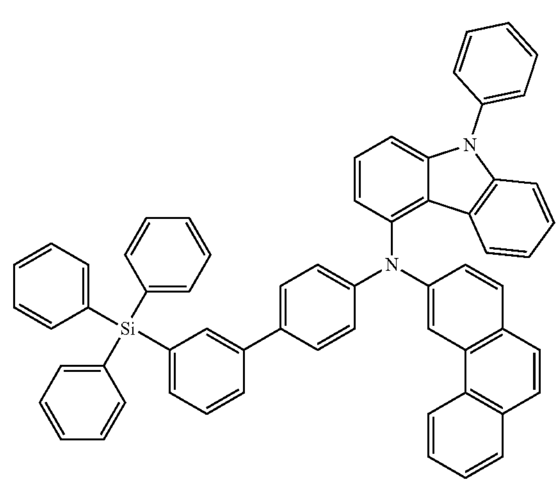

-continued
A179
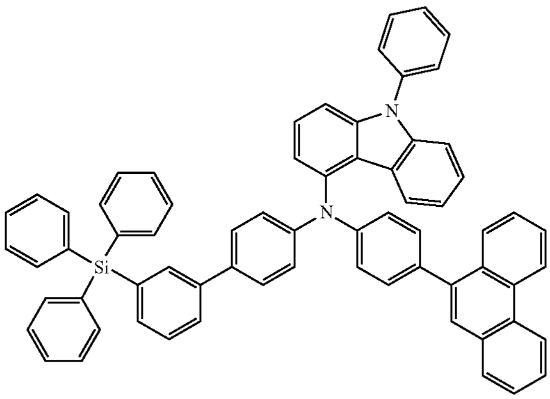
A180
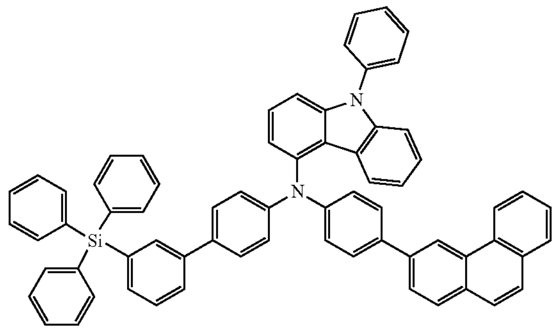
A181
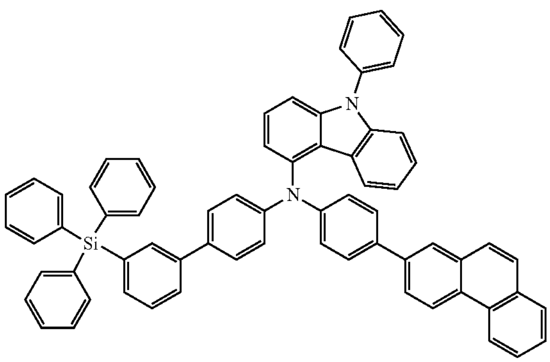
A182
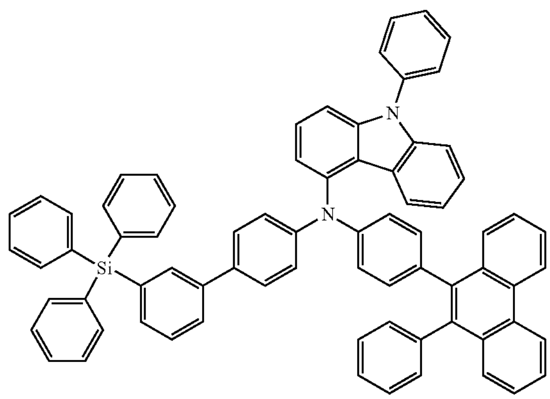
A183
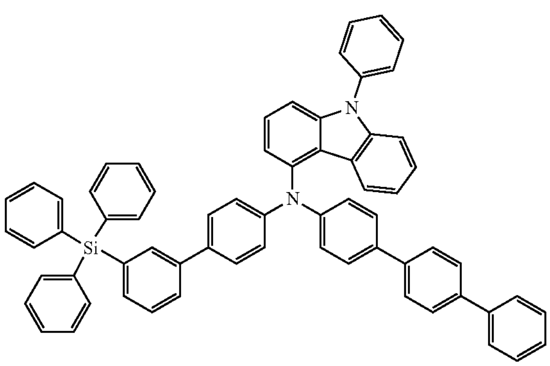
A184
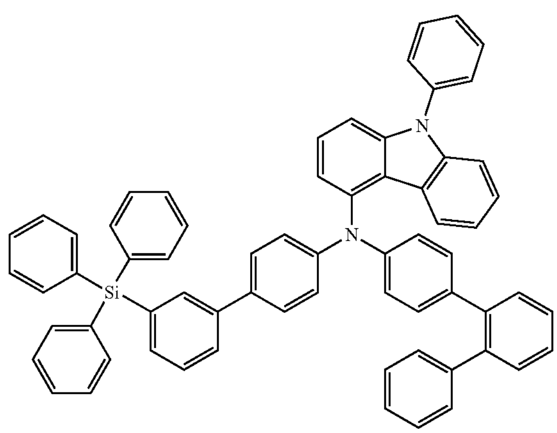

-continued
A185
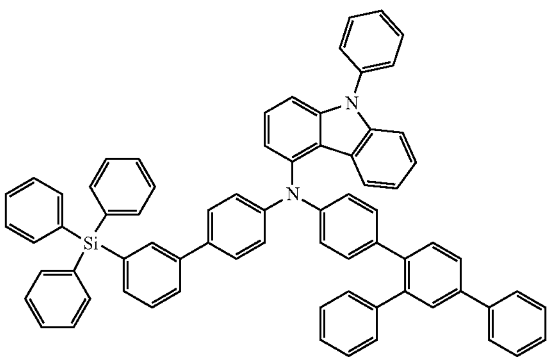
A186
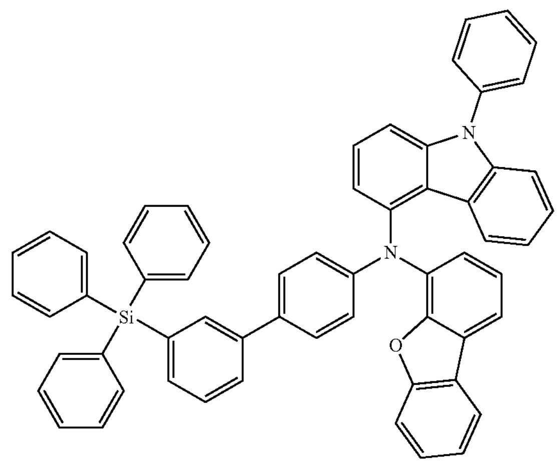
A187
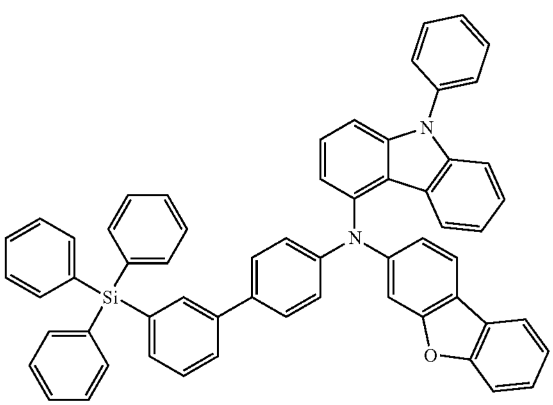
A188
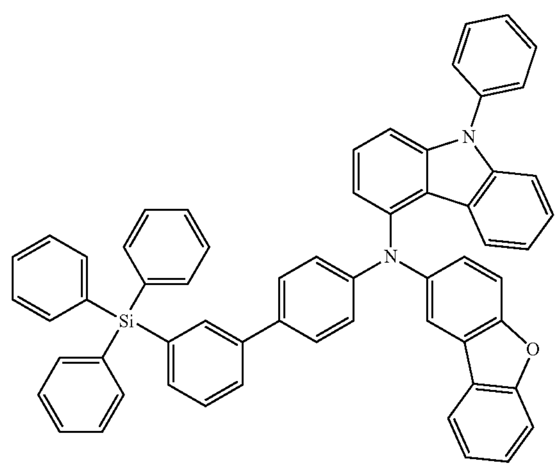
A189
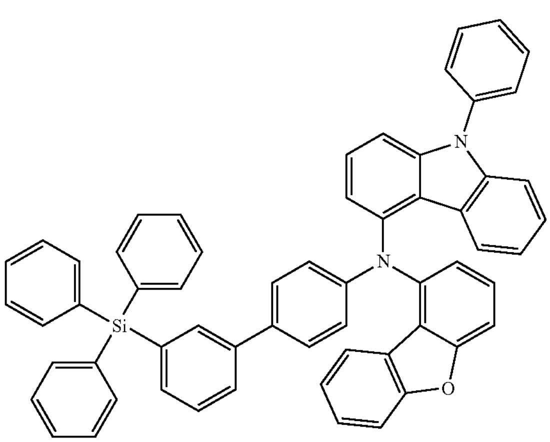
A190
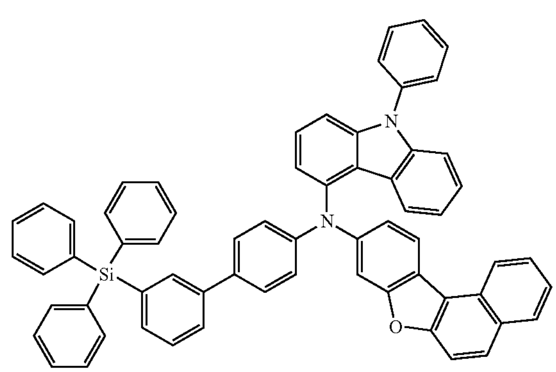

-continued
A191
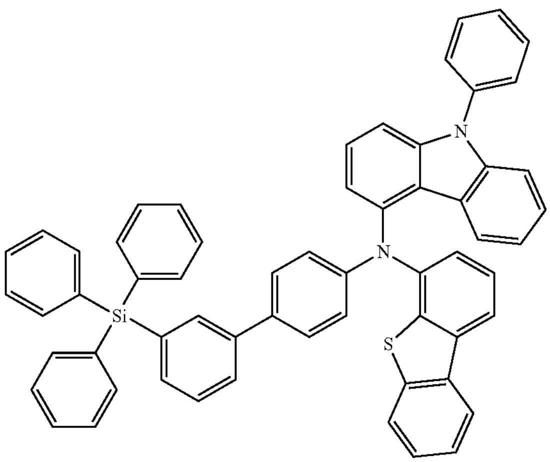
A192
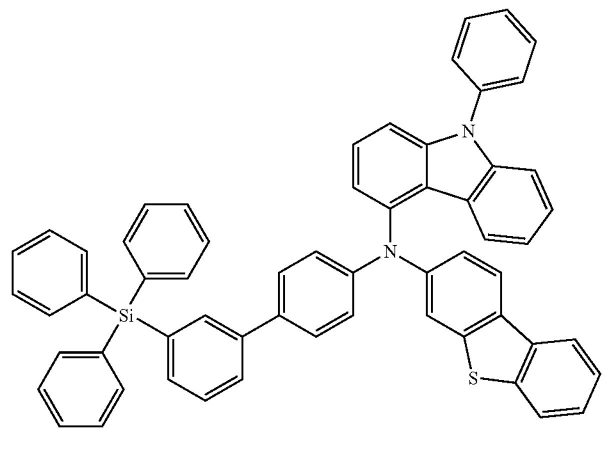
A193
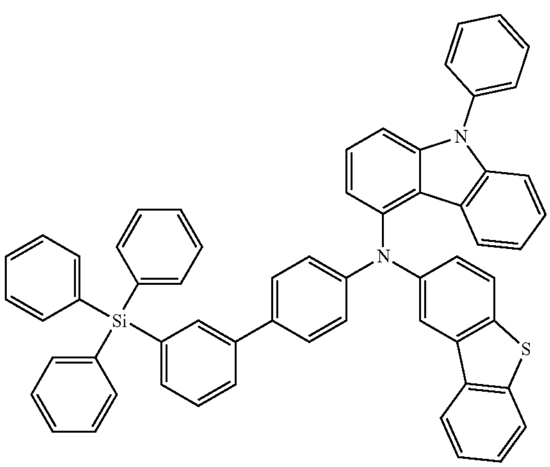
A194
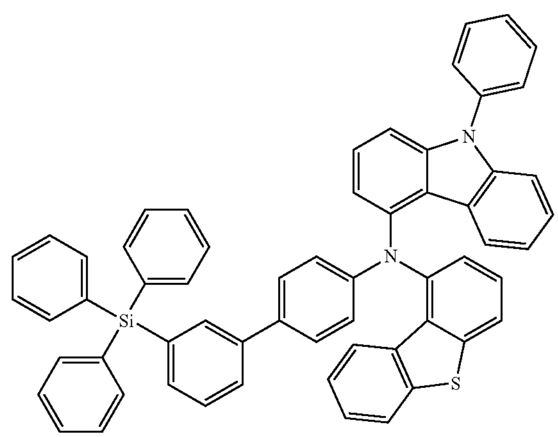
A195
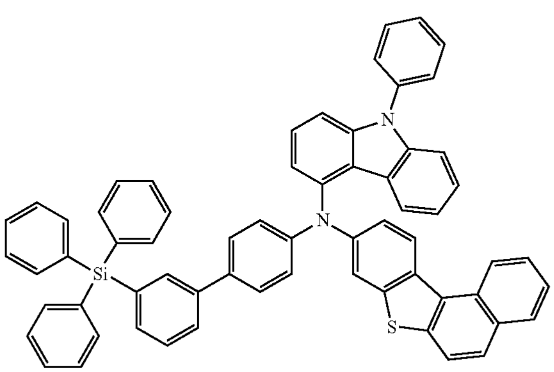
A196
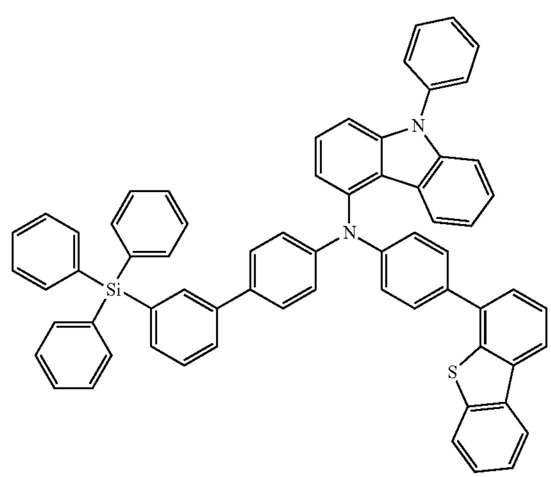

-continued
A197
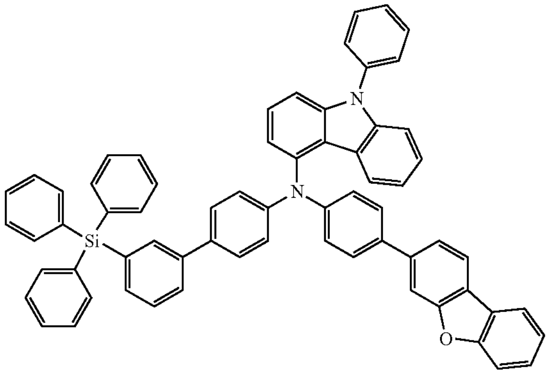
A198
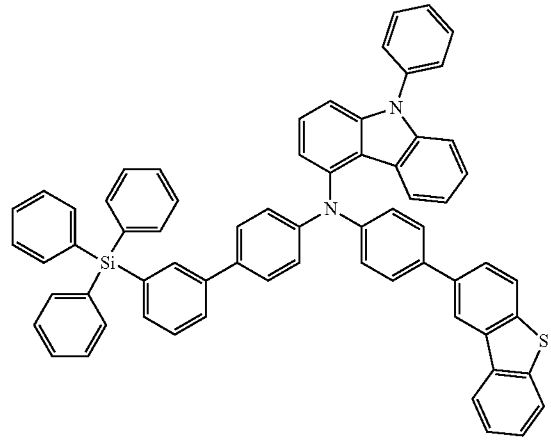
A199
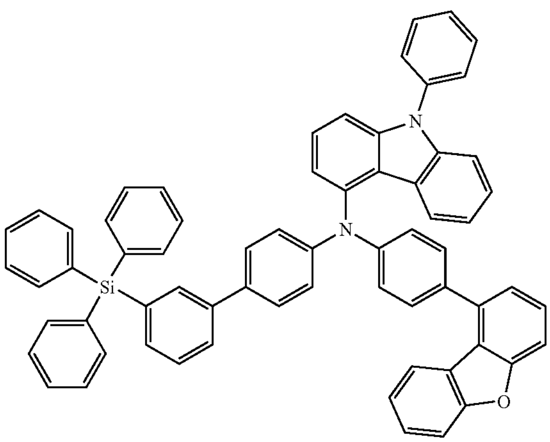
A200
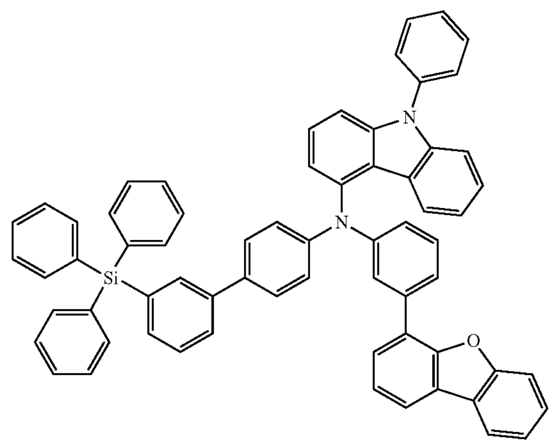
A201
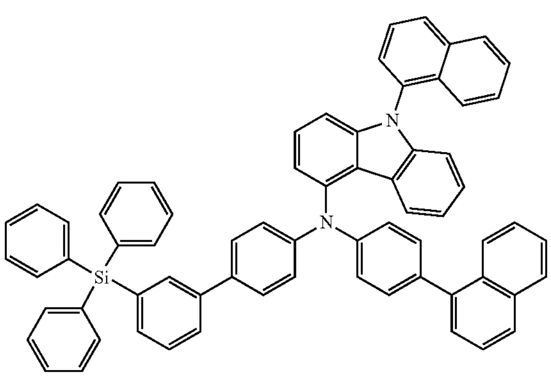
A202
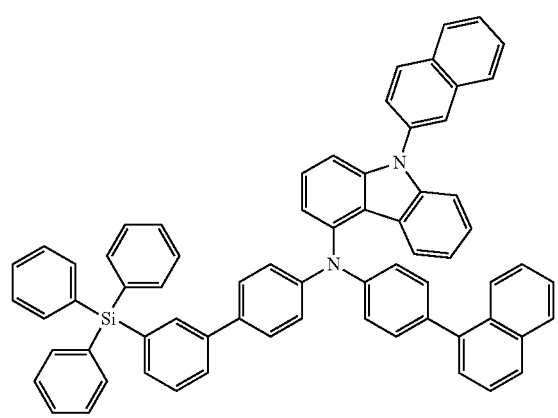

-continued
A203
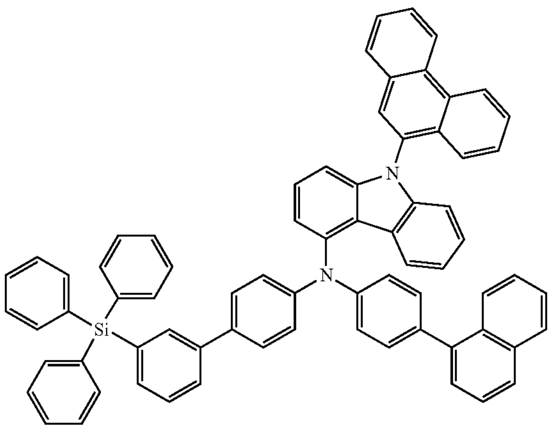
A204
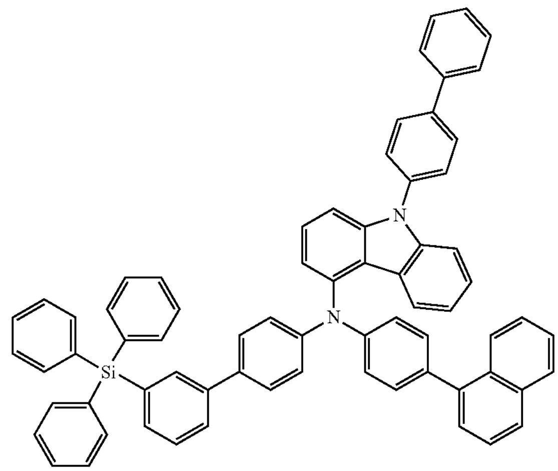
A205
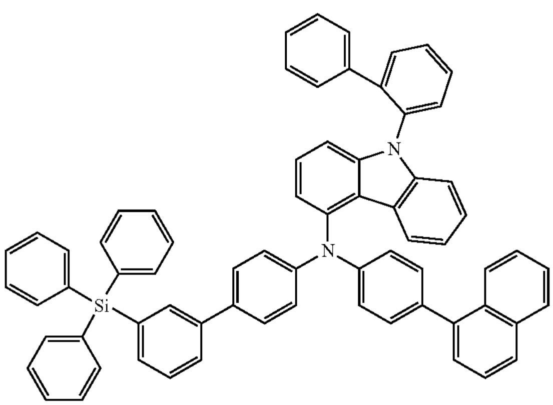
A206
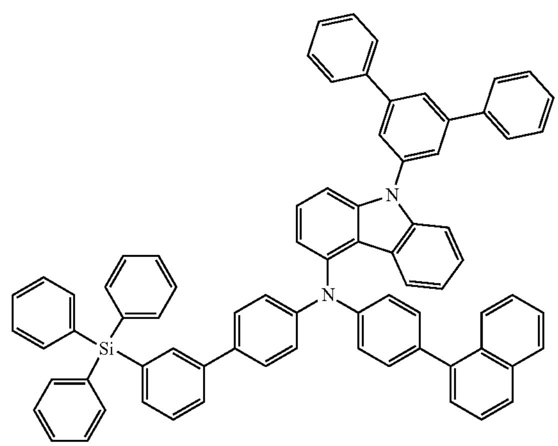
A207
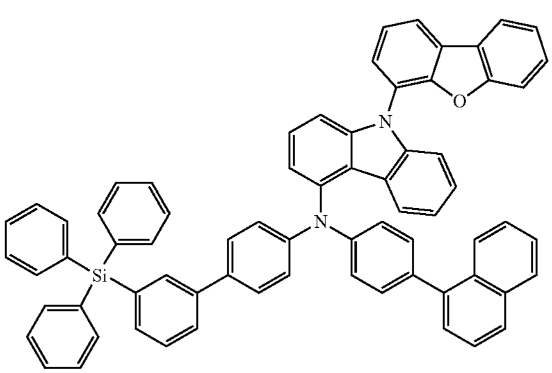
A208
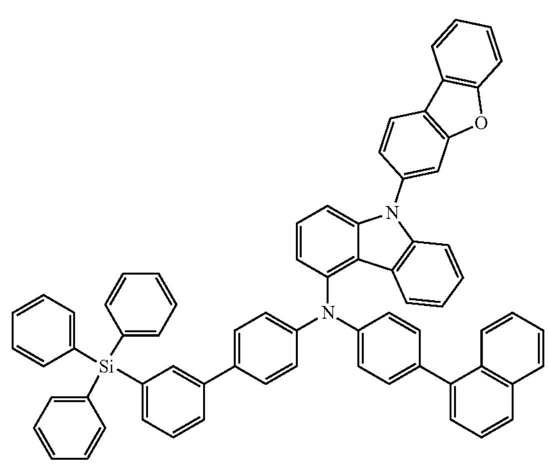

-continued
A209
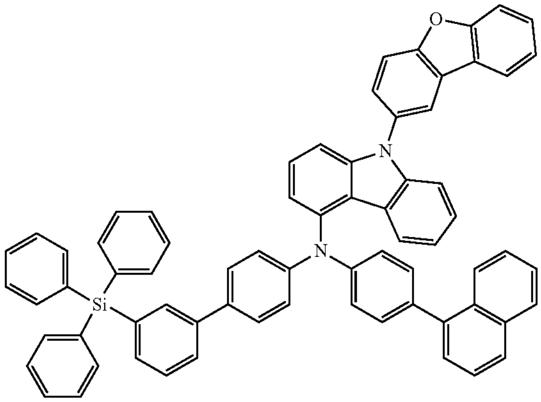
A210
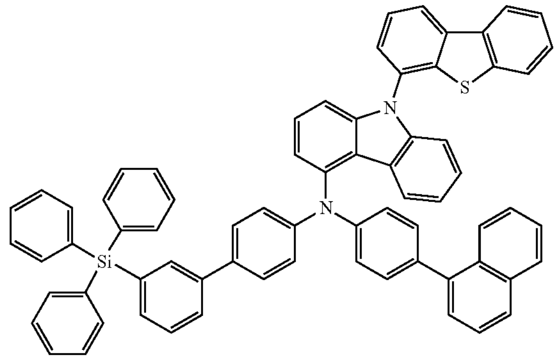
A211
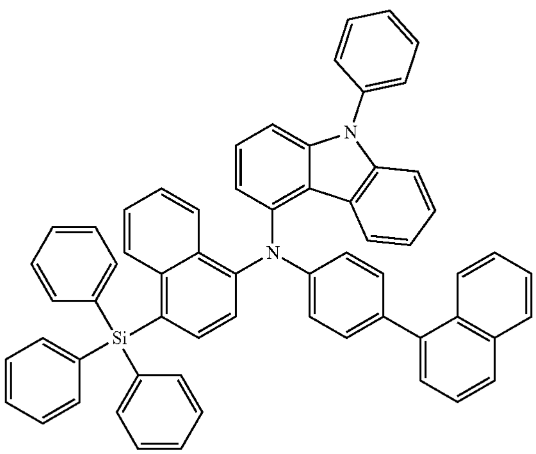
A212
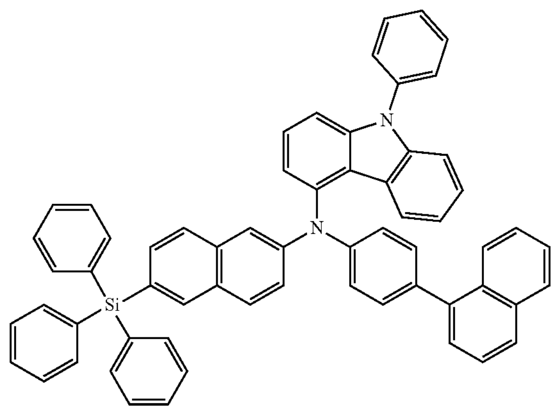
A213
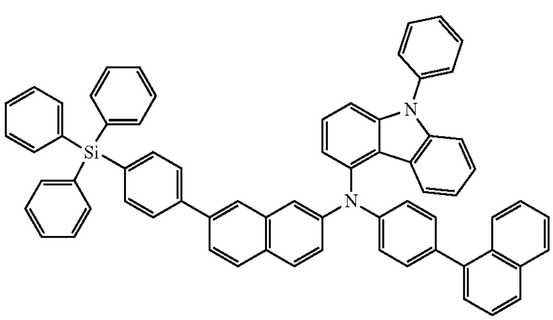
A214
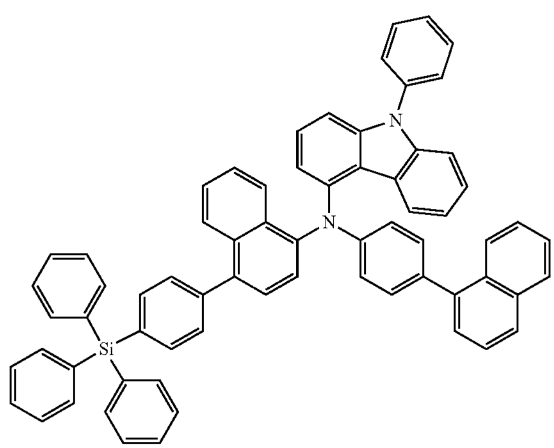

-continued
A215
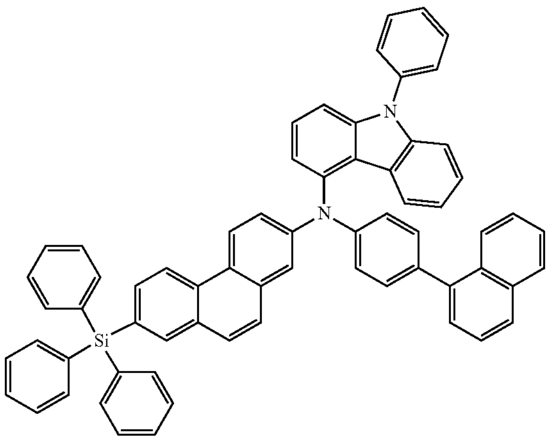
A216
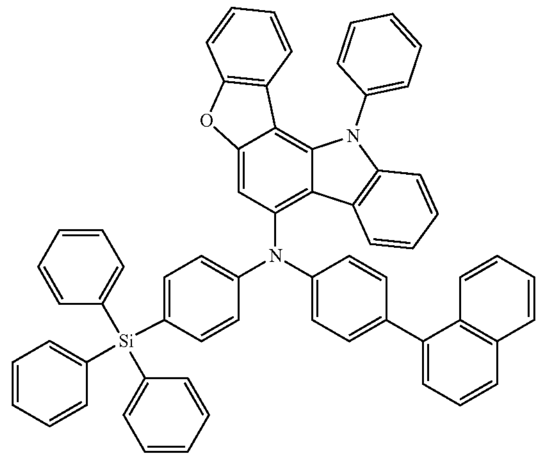
A217
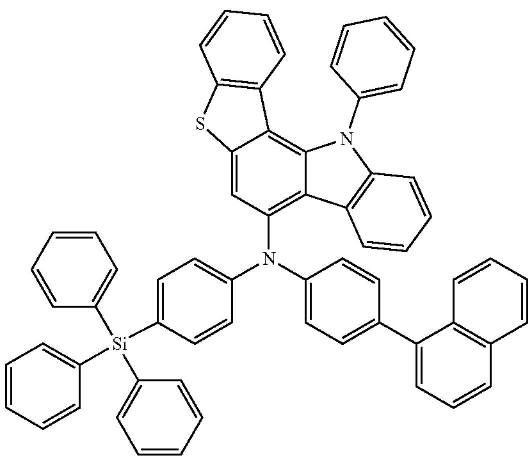
A218
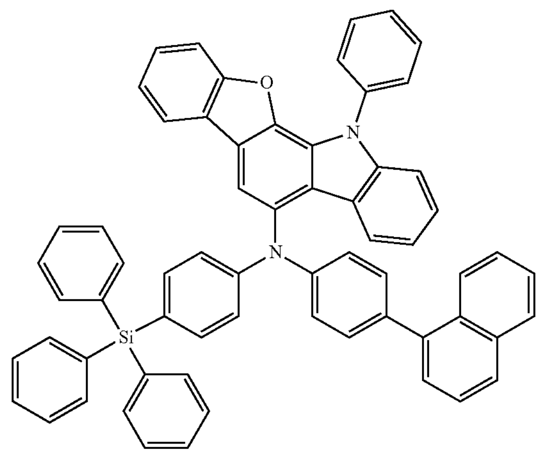
A219
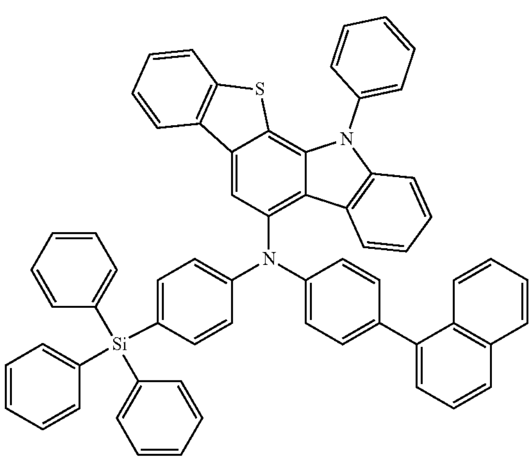
A220
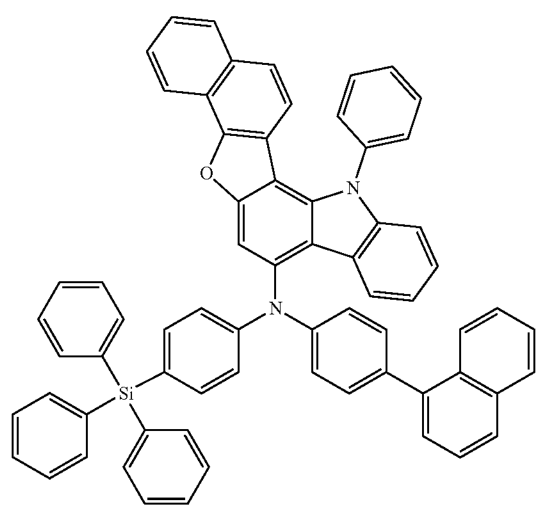

-continued
[Compound Group 1B]
B1
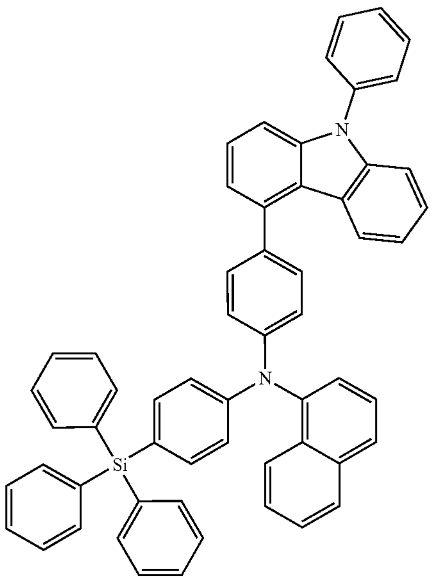
B3
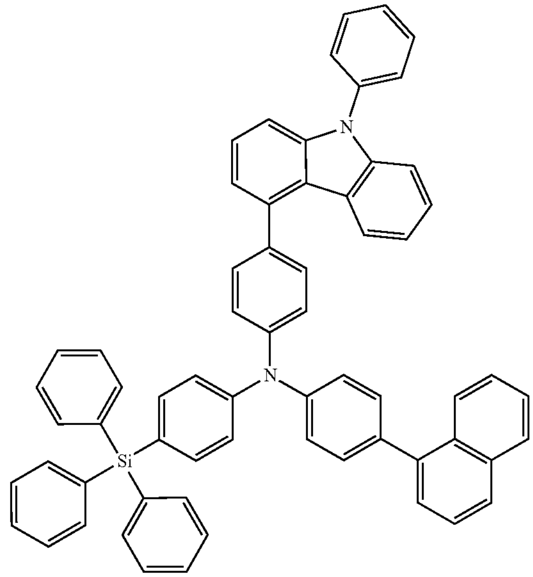
B2
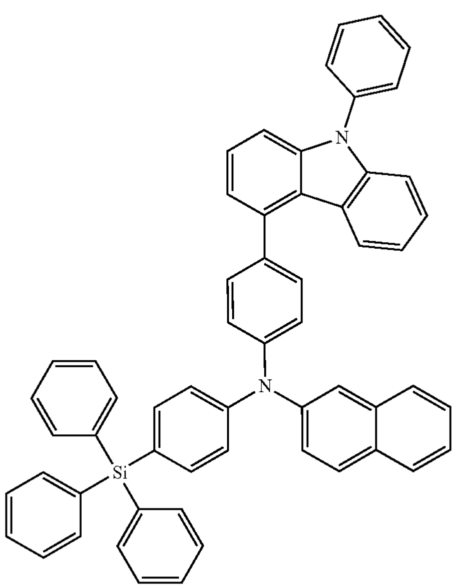
B4
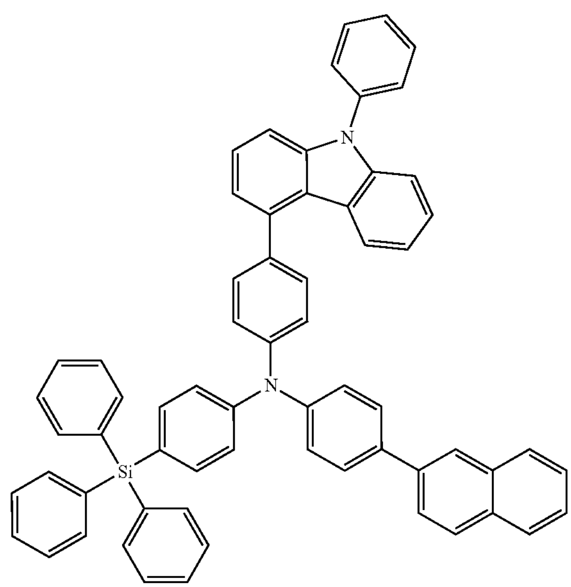

-continued
B5
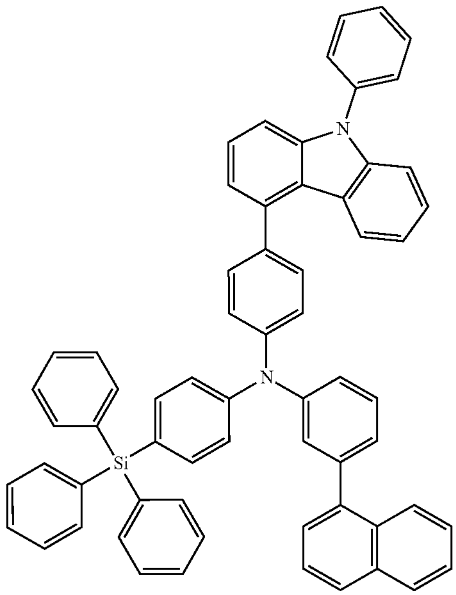
B6
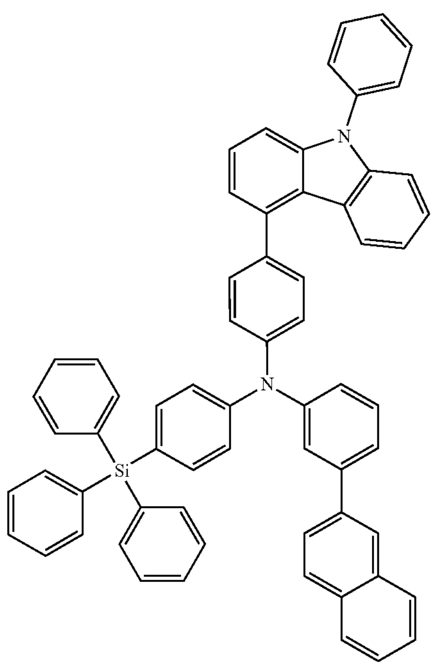
-continued
B7
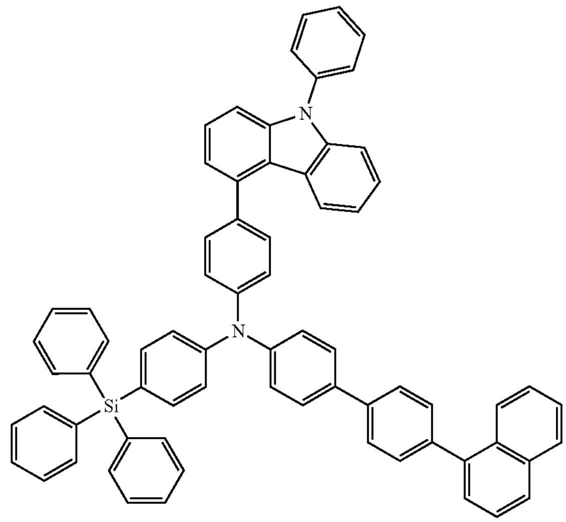
B8
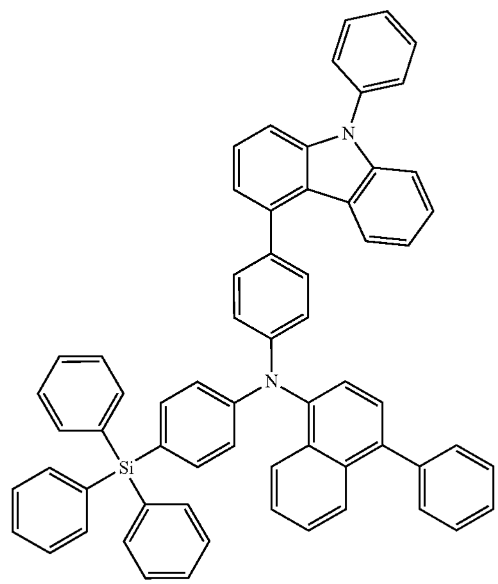
B9
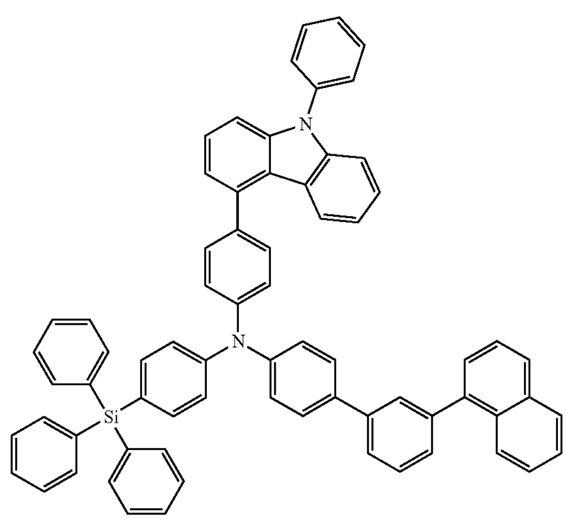

B10
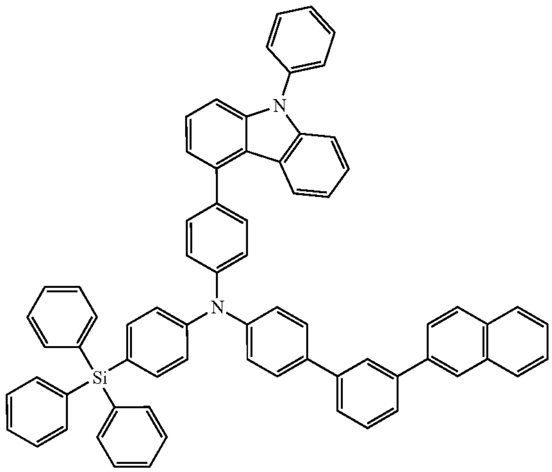
B11
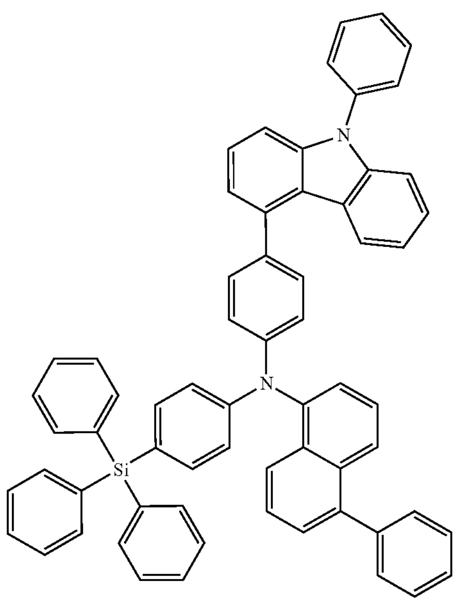
B12
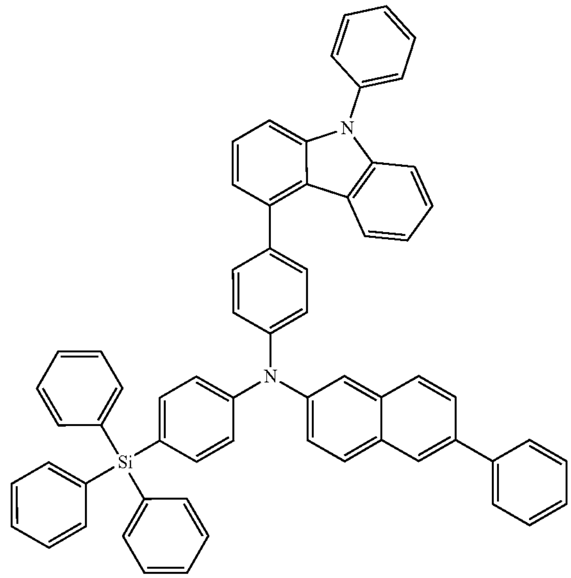
B13
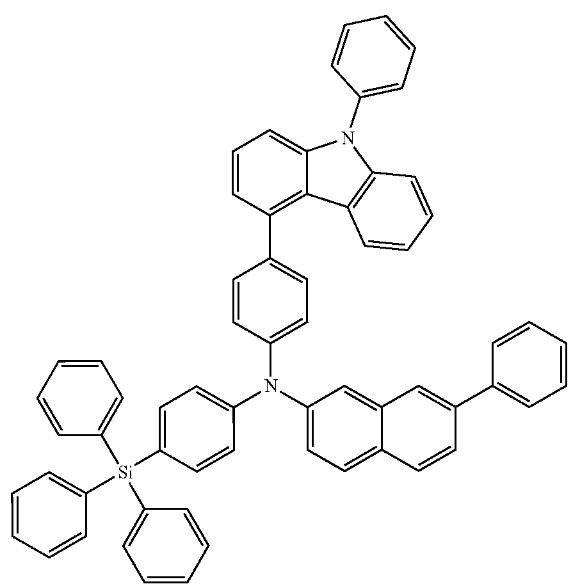

-continued
B14
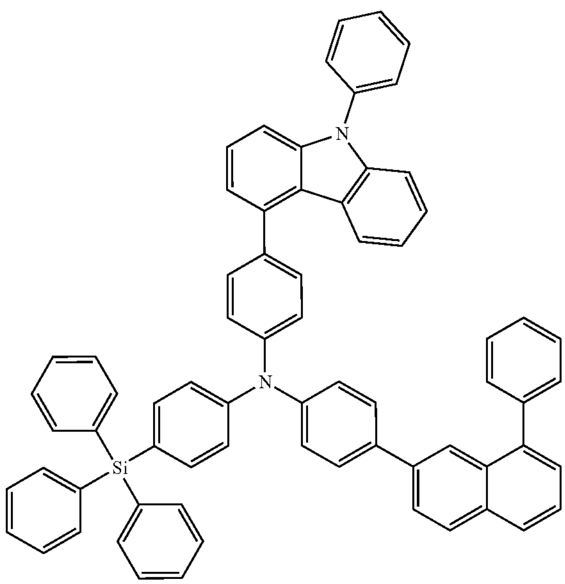
B15
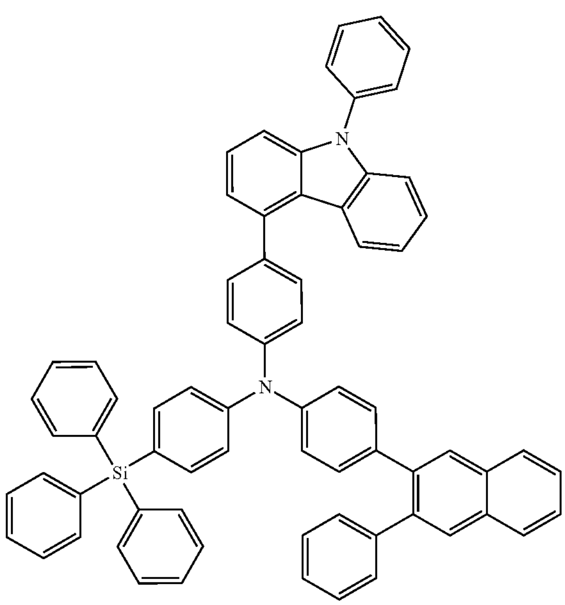
-continued
B16
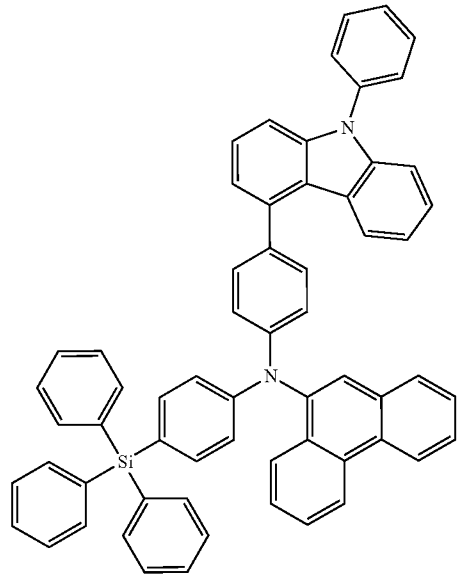
B17
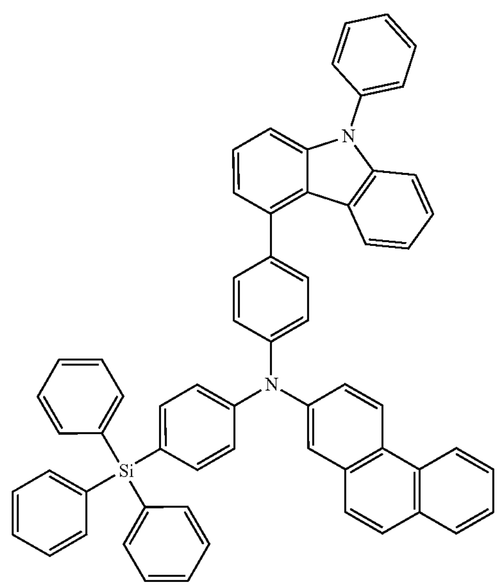

-continued
B18
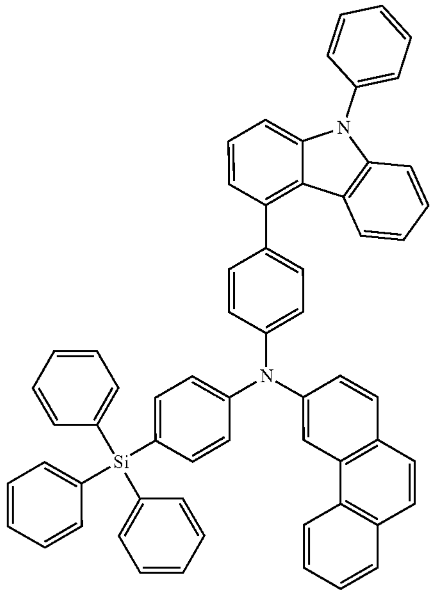
B19
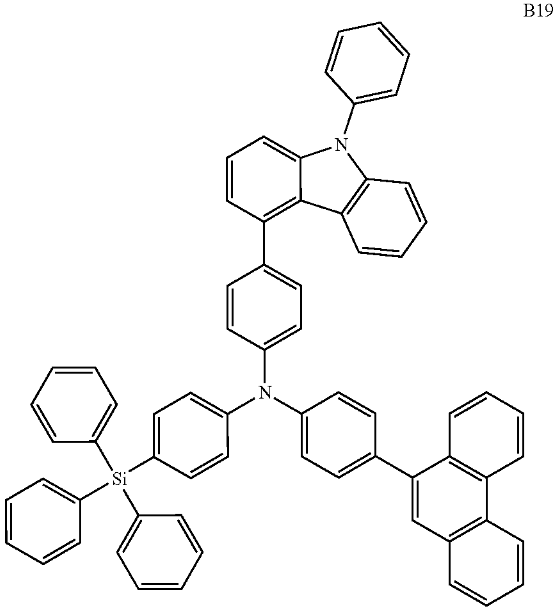
-continued
B20
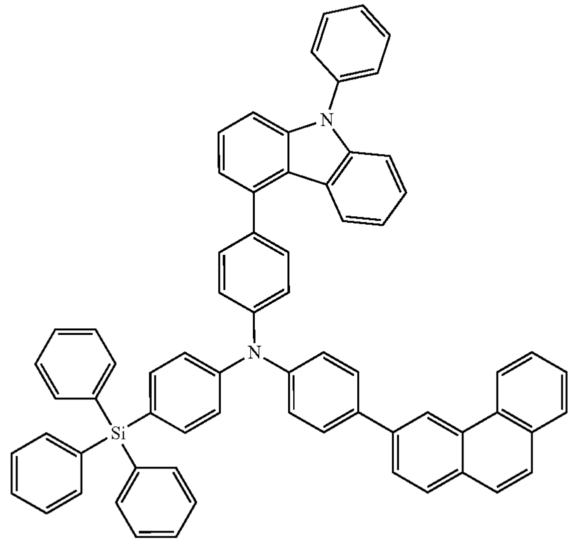
B21
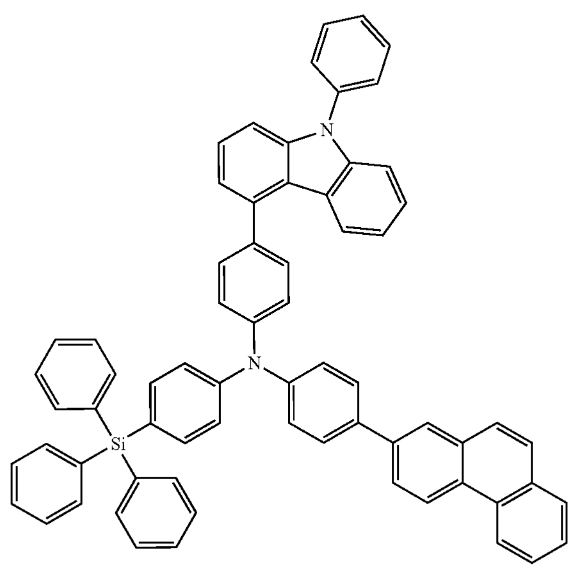

-continued
B22
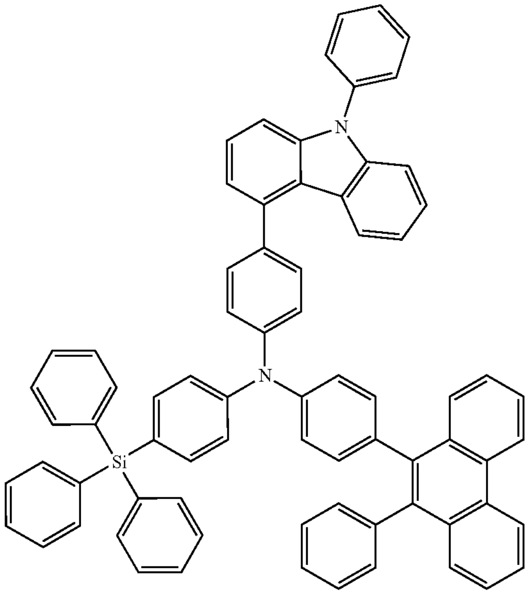
B23
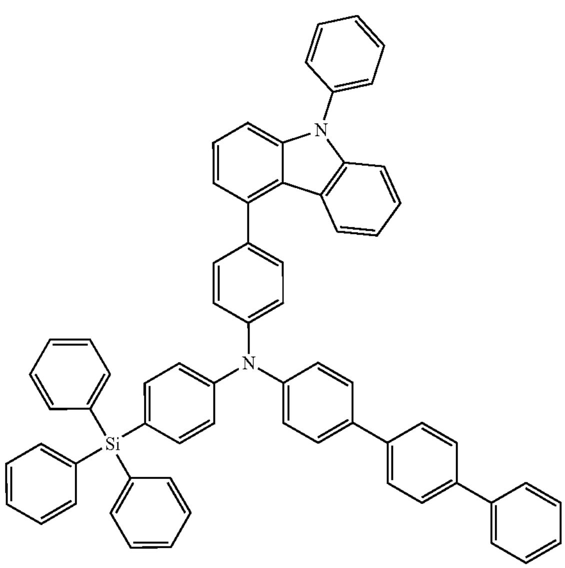
-continued
B24
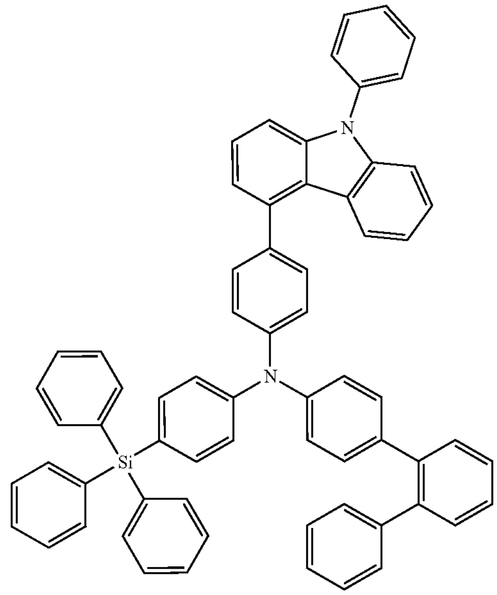
B25
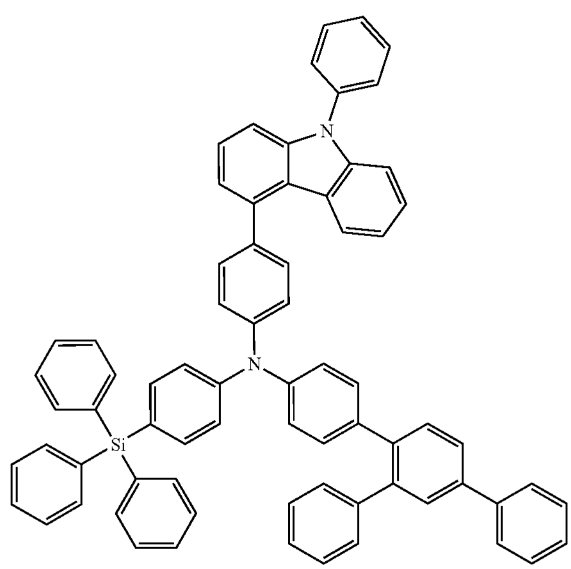

-continued
B26
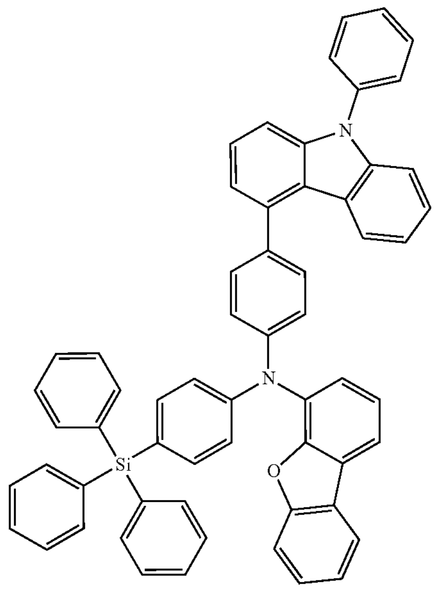
B27
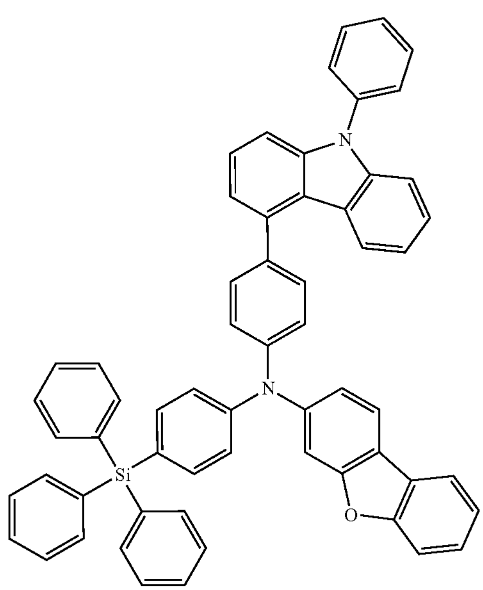
-continued
B28
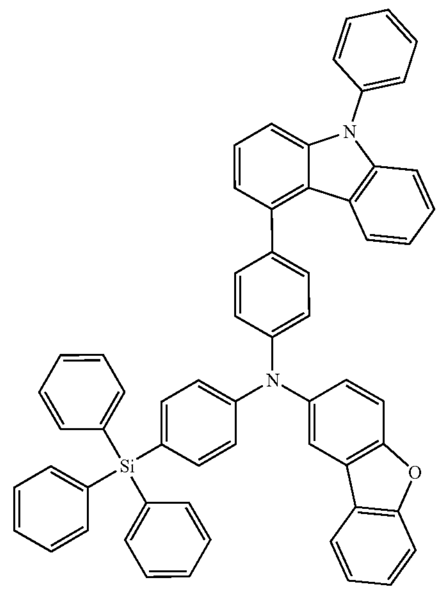
B29
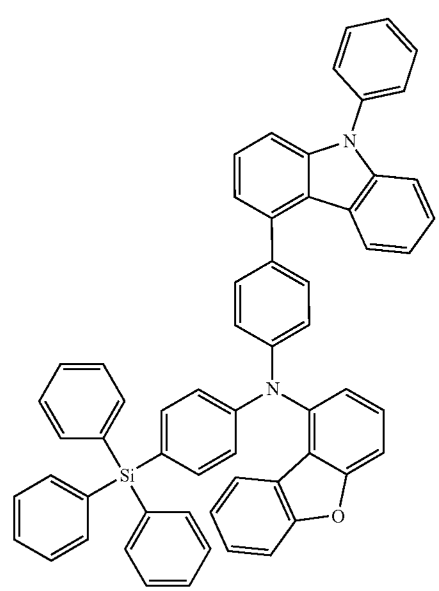

-continued
B30
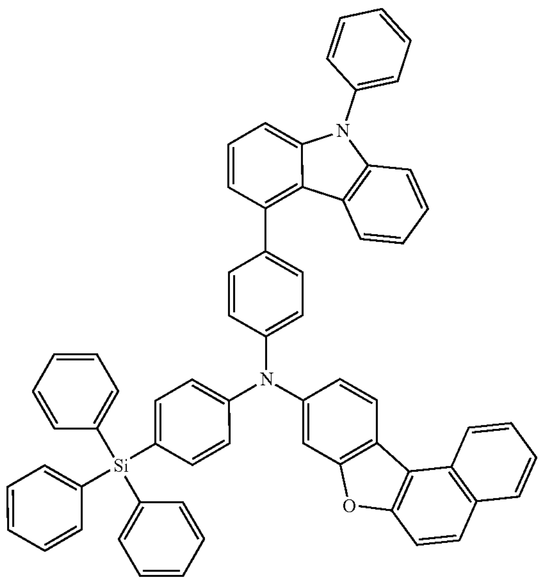
B31
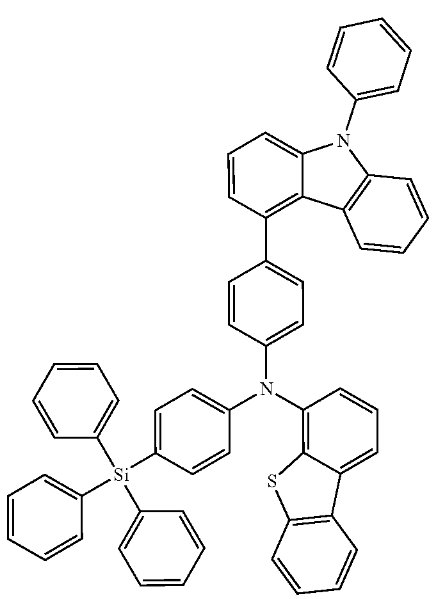
-continued
B32
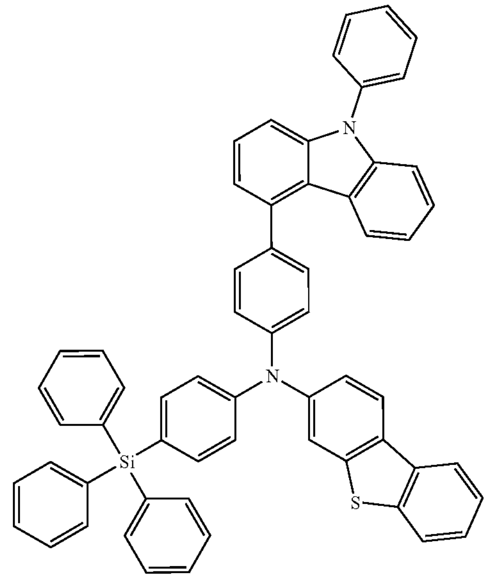
B33
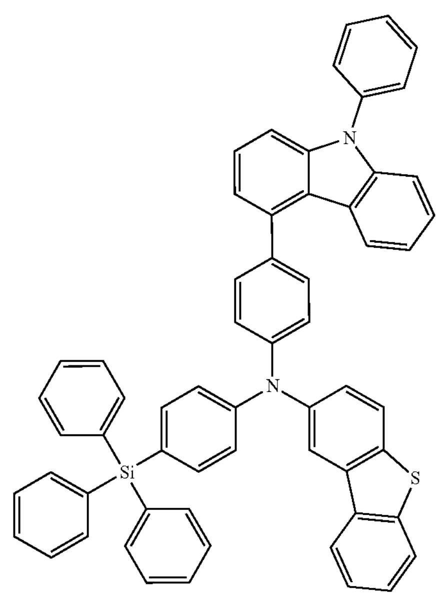

-continued
B34
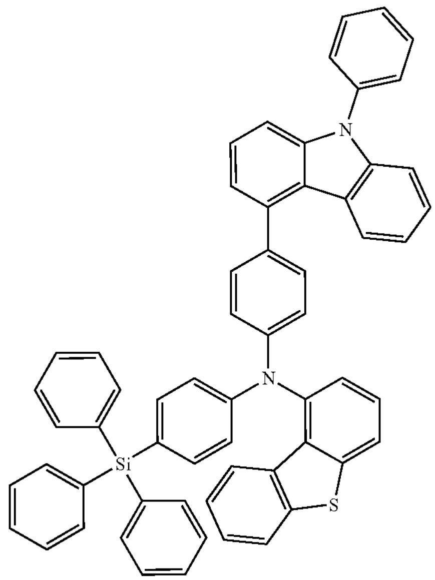
B35
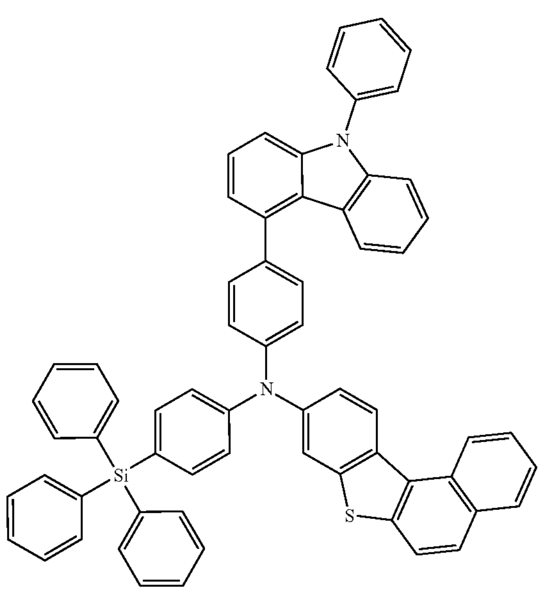
-continued
B36
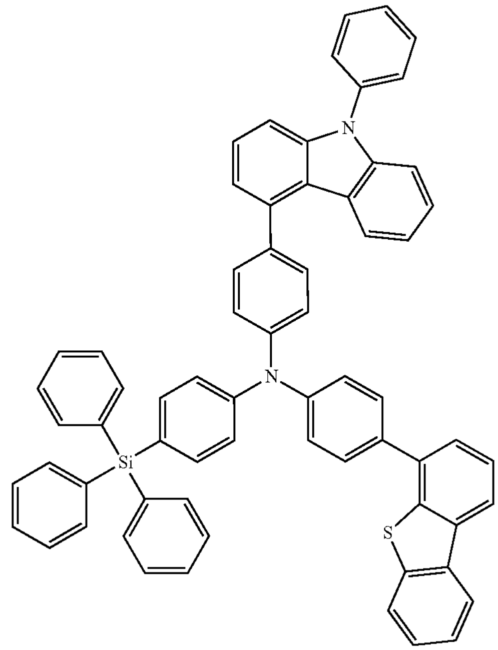
B37
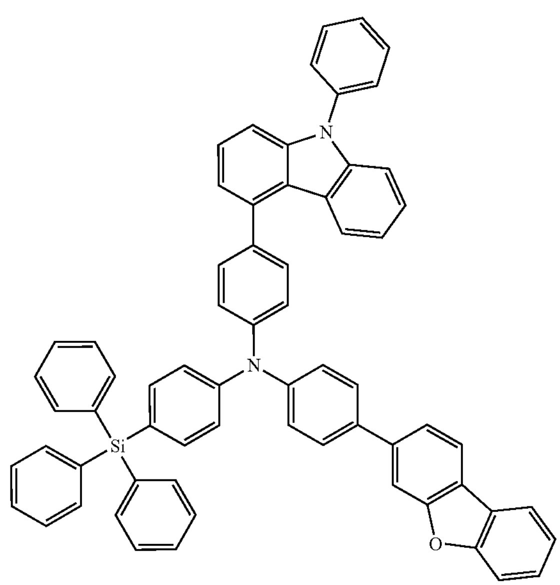

-continued
B38
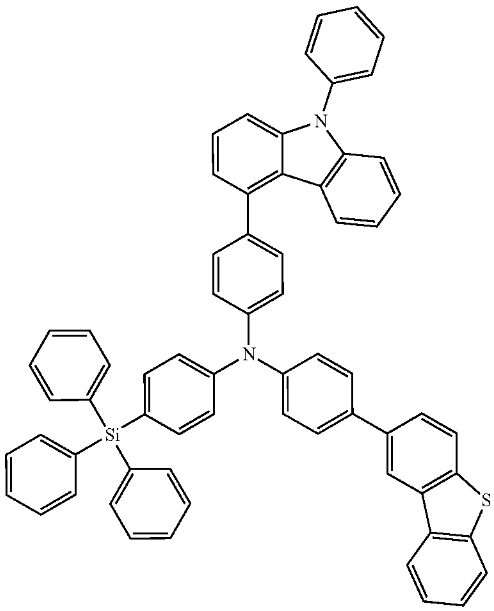
B39
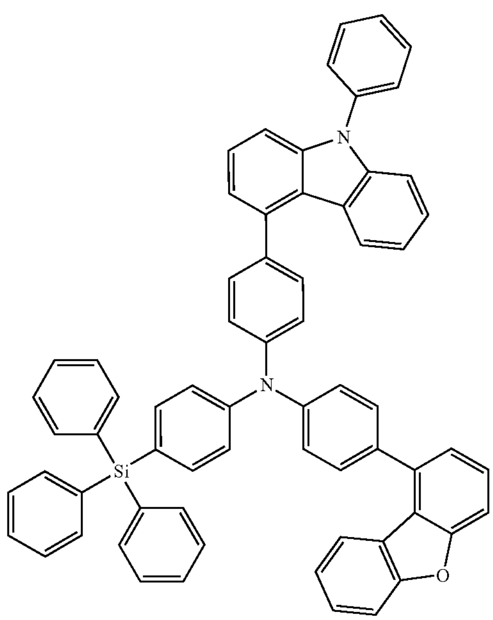
-continued
B40
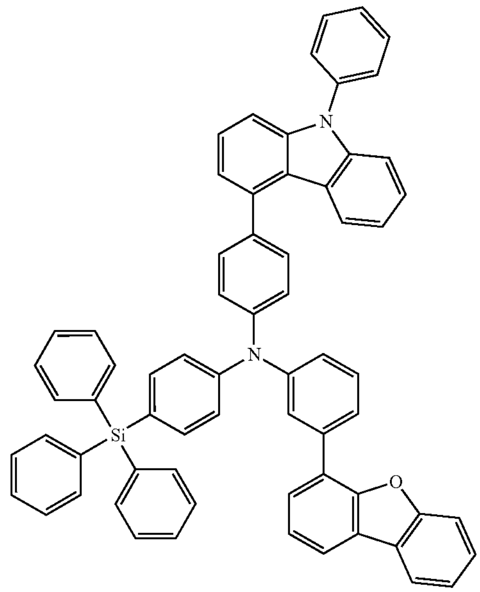
B41
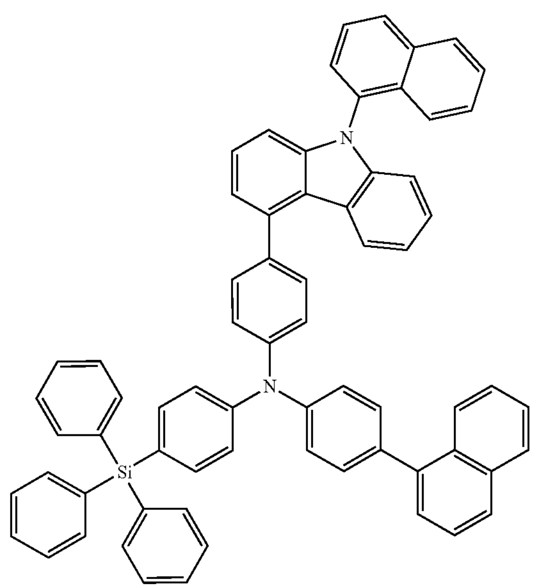

-continued
B42
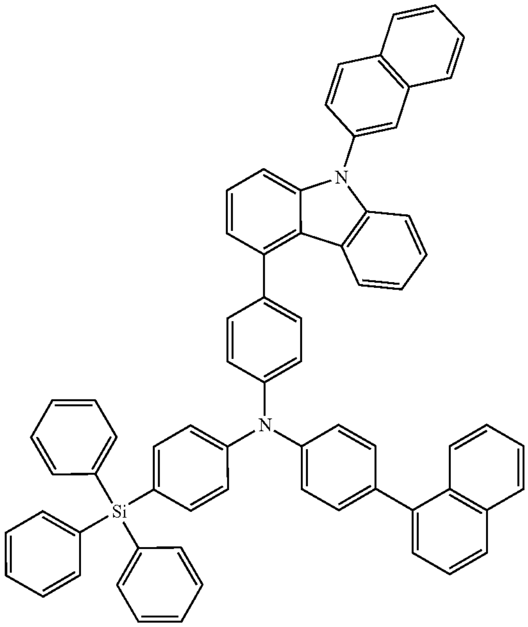
B43
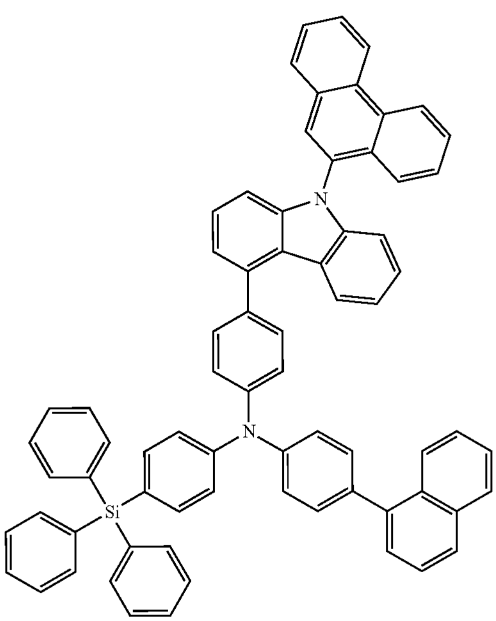
-continued
B44
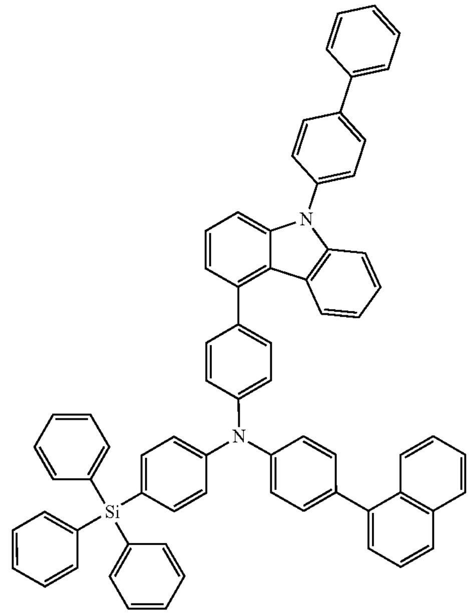
B45
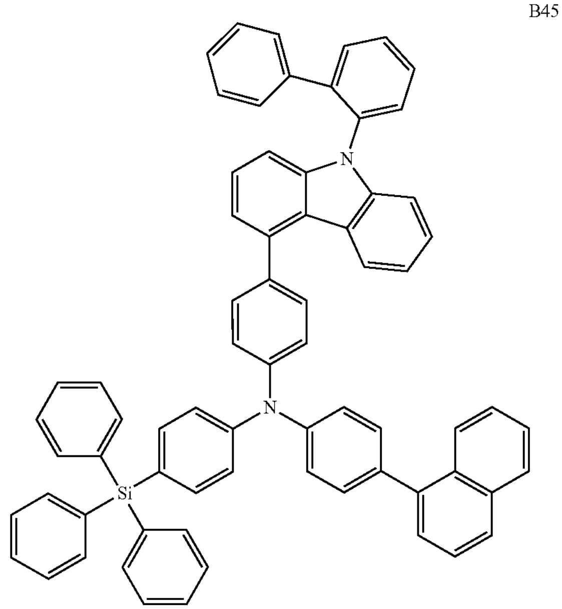

-continued
B46
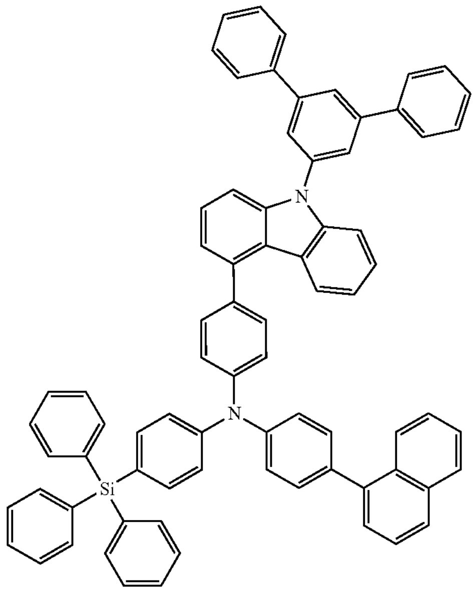
B47
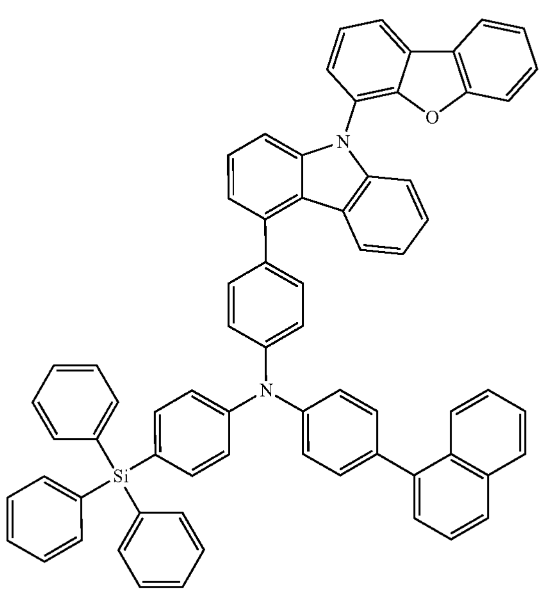
-continued
B48
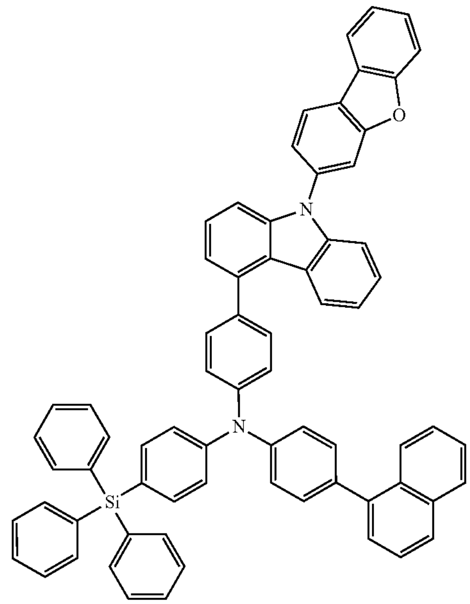
B49
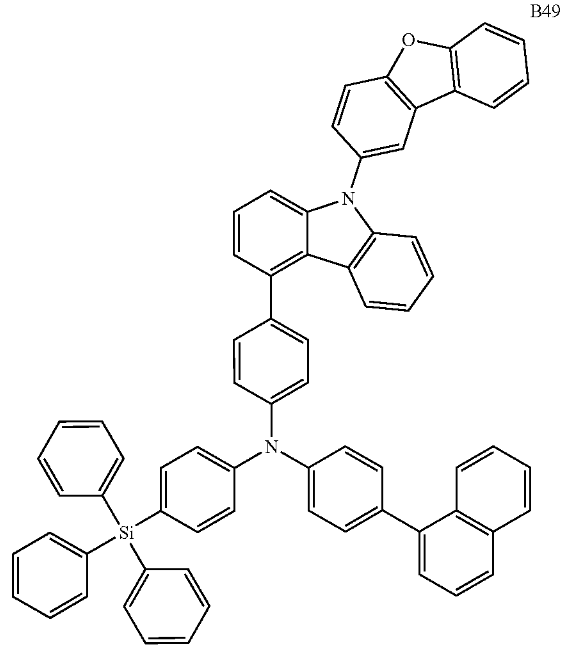

-continued
B50
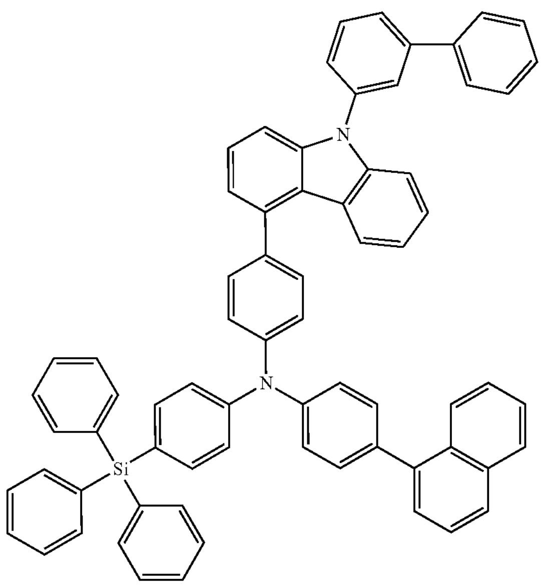
B51
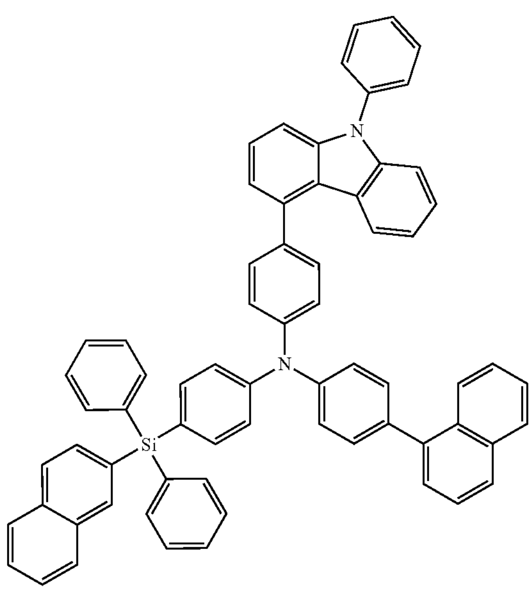
-continued
B52
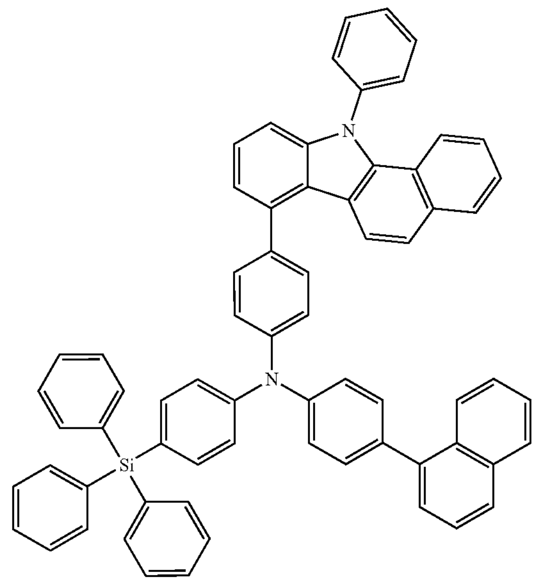
B53
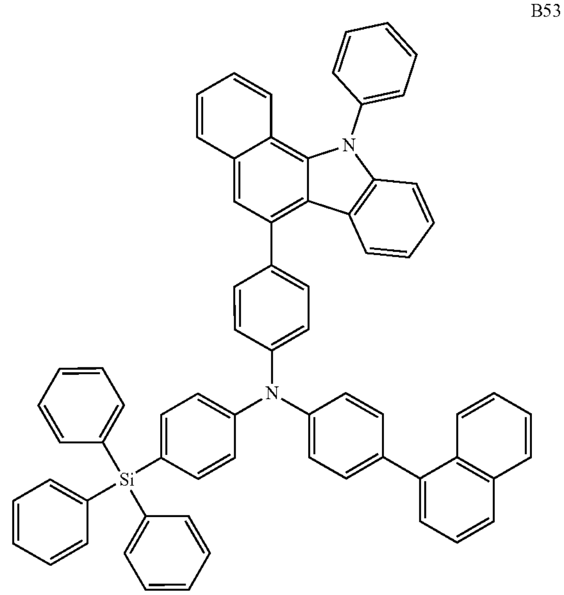

-continued
B54
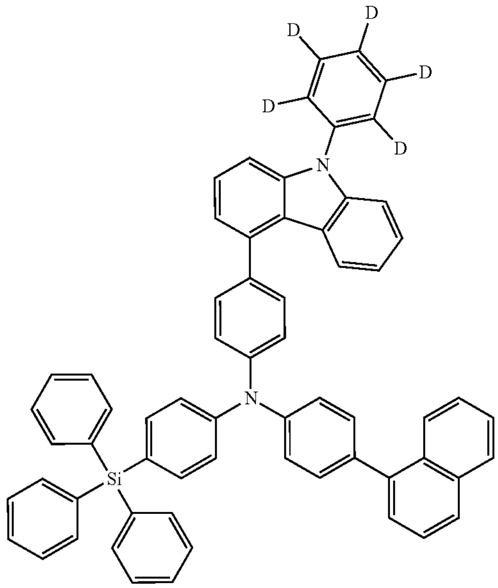
B55
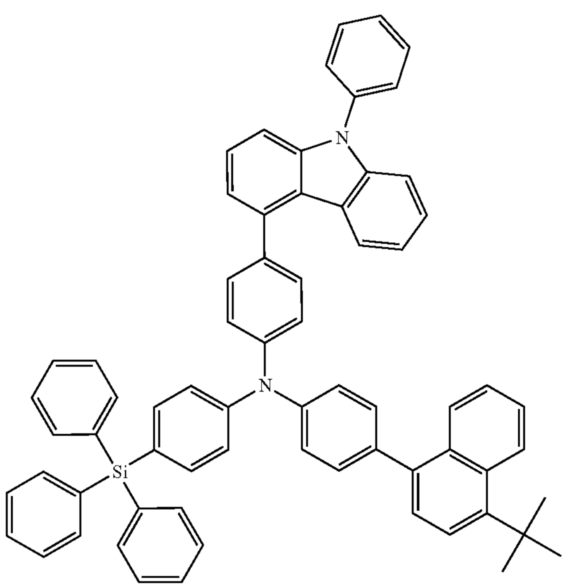
-continued
B56
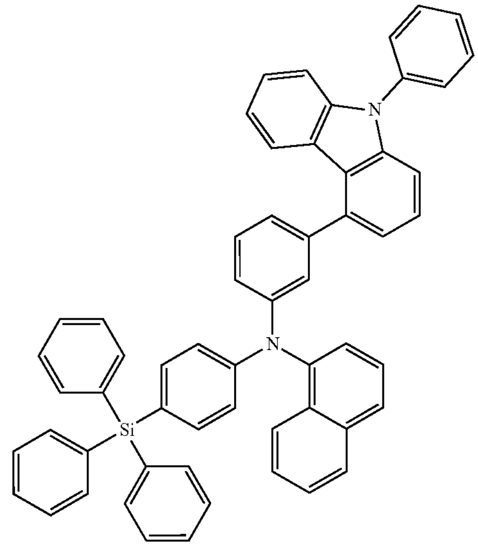
B57
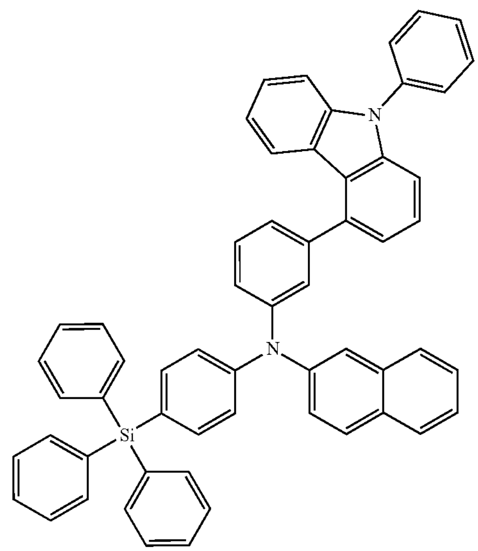
B58
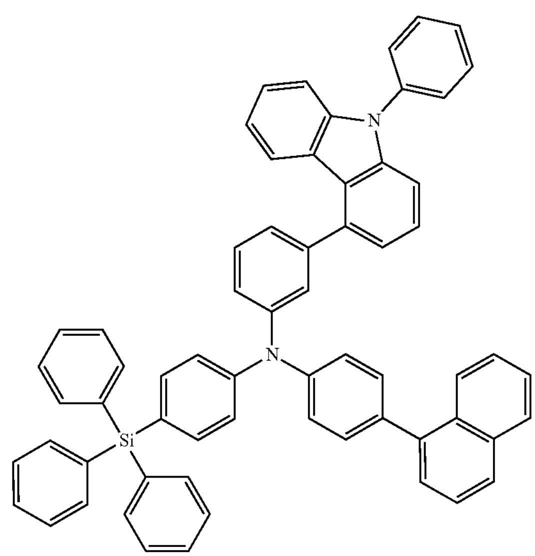

-continued
B59
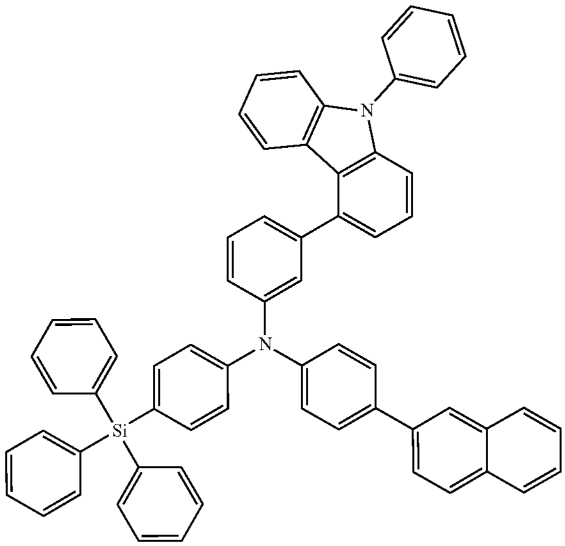
B60
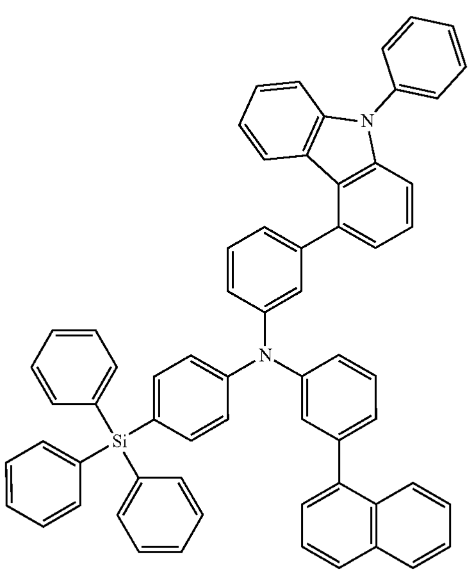
-continued
B61
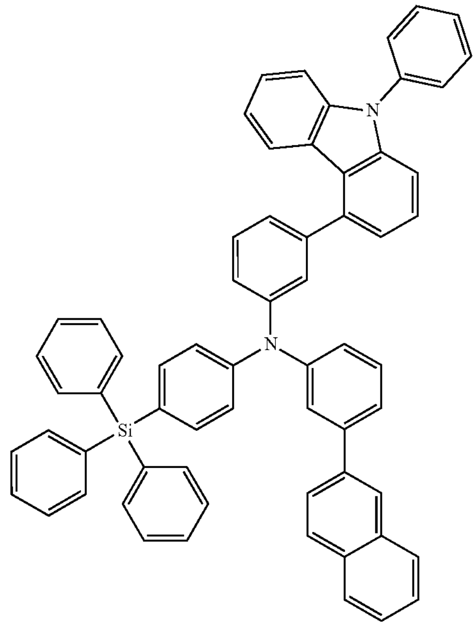
B62
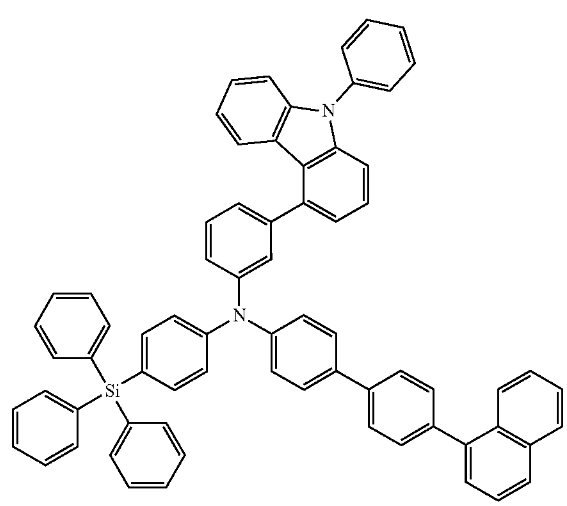

-continued
B63
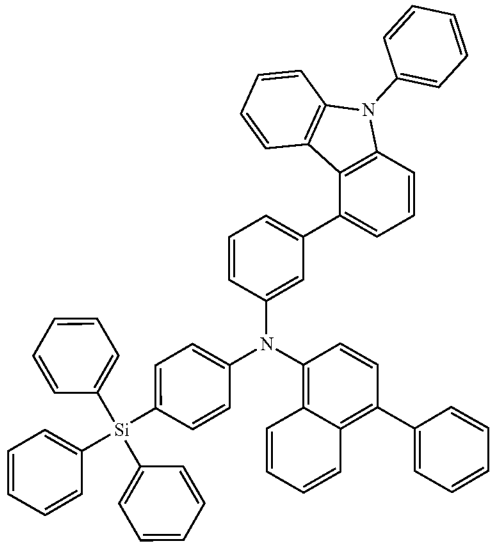
B64
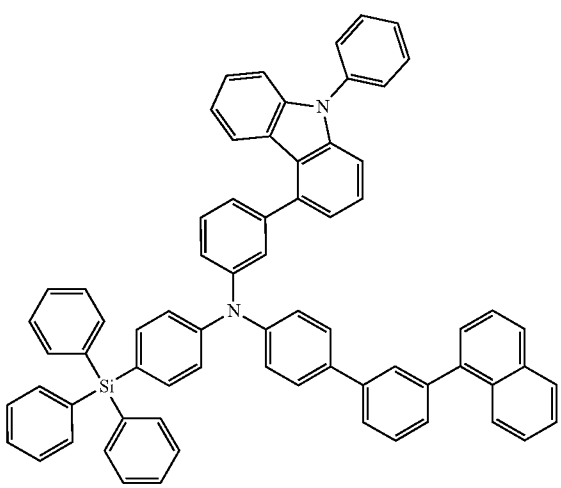
B65
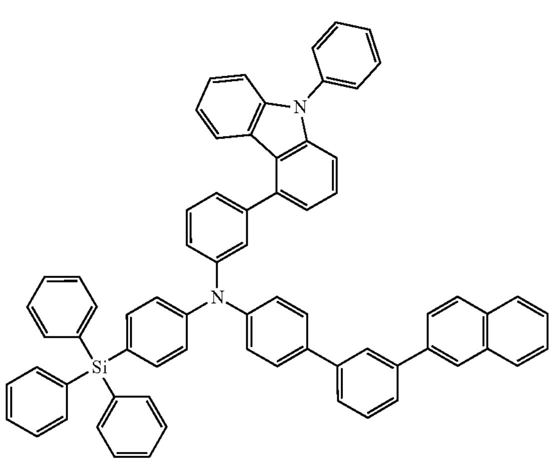
-continued
B66
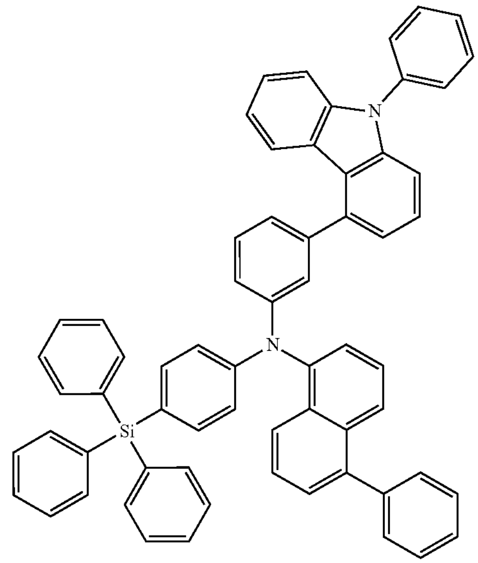
B67
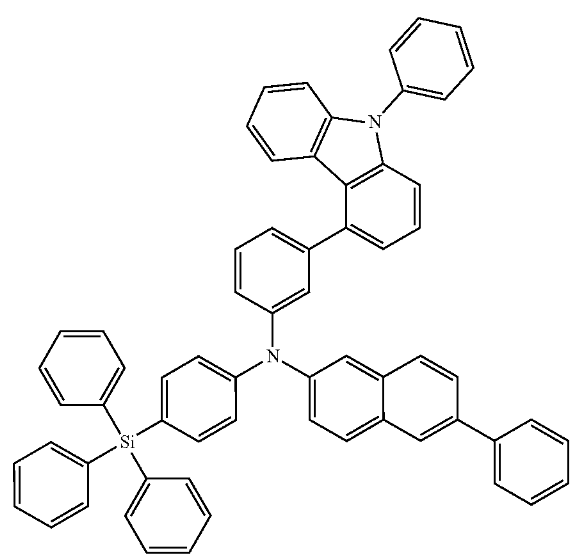

-continued
B68
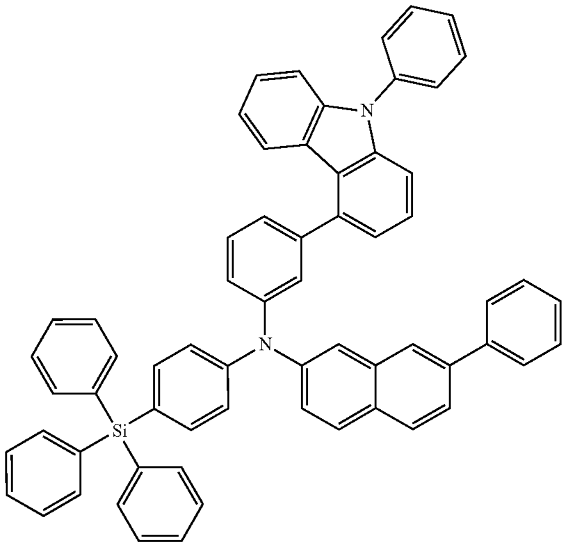
-continued
B70
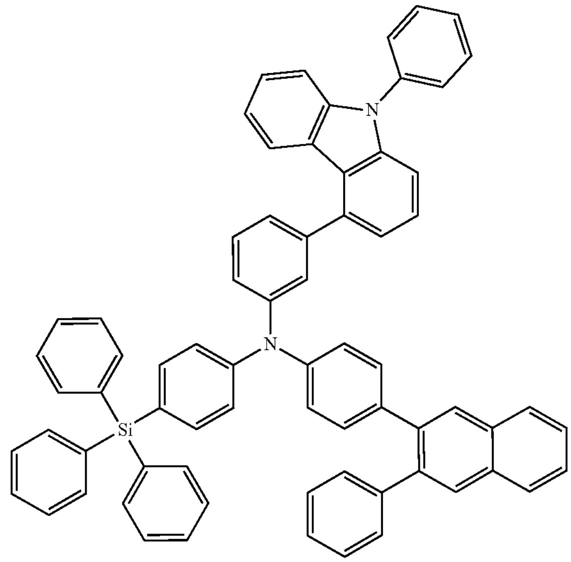
B69
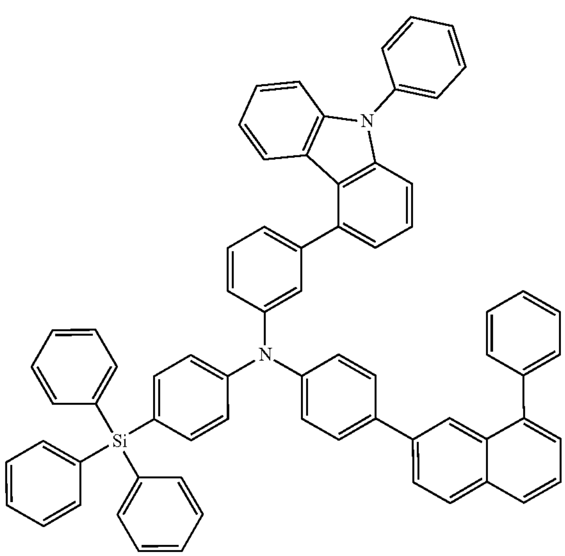
B71
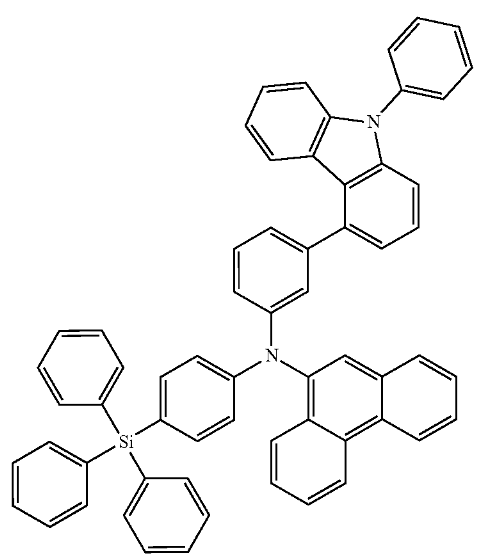

-continued
B72
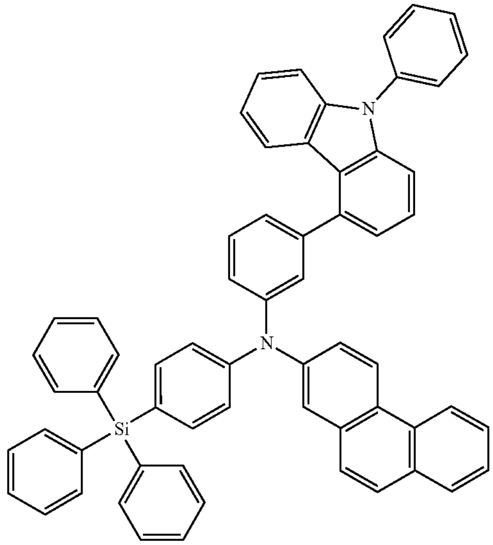
B73
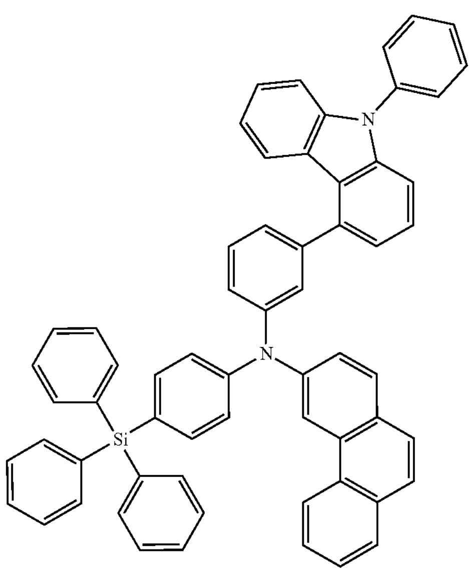
-continued
B74
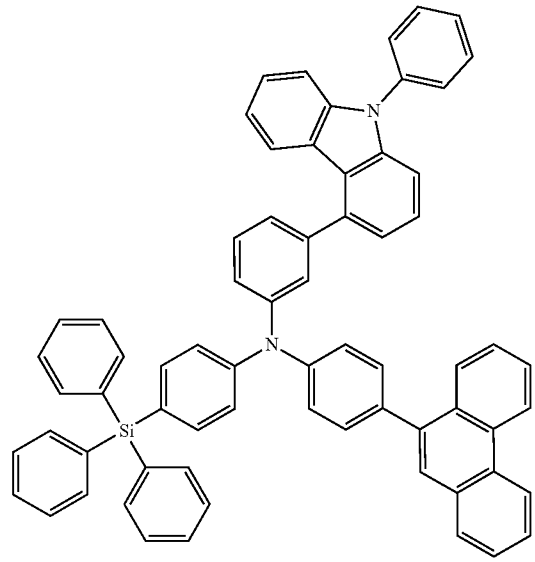
B75
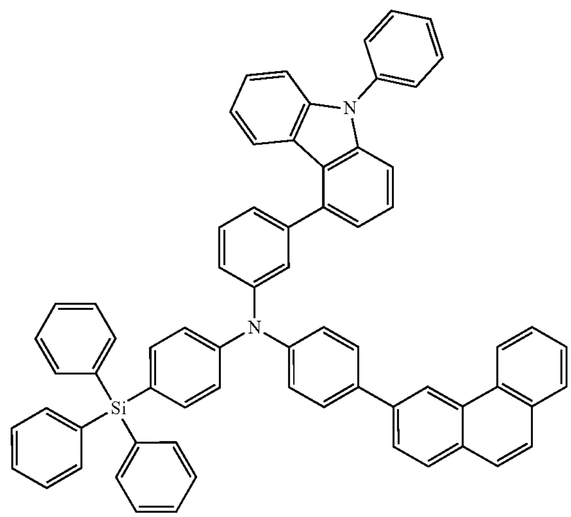
B76
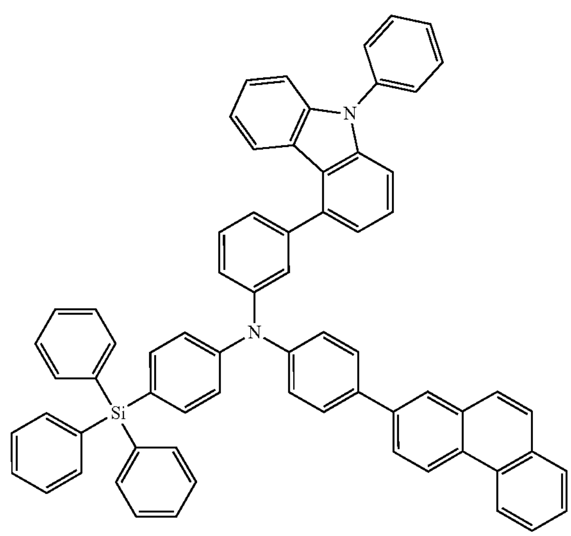

-continued
B77
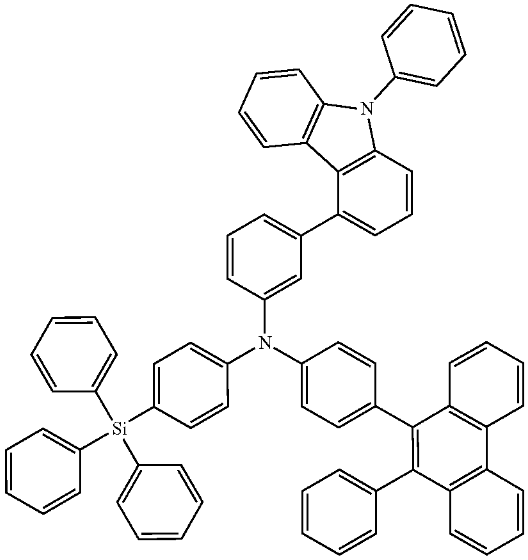
B78
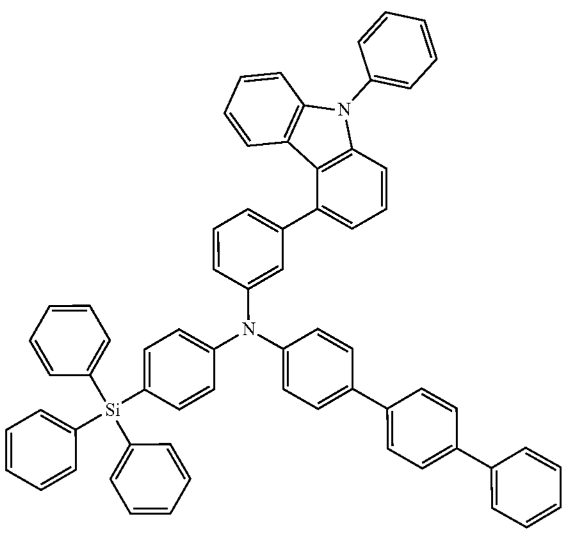
B79
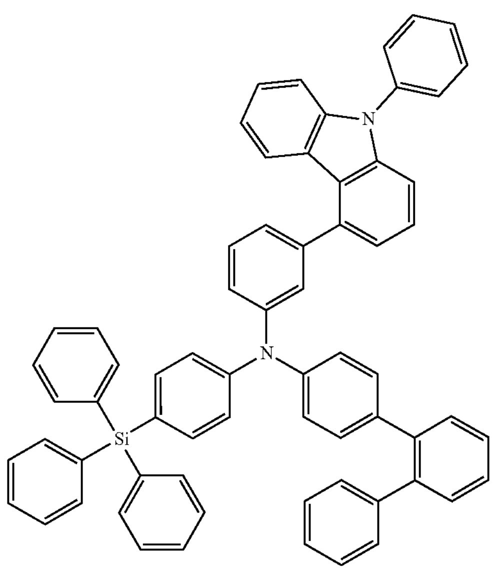
-continued
B80
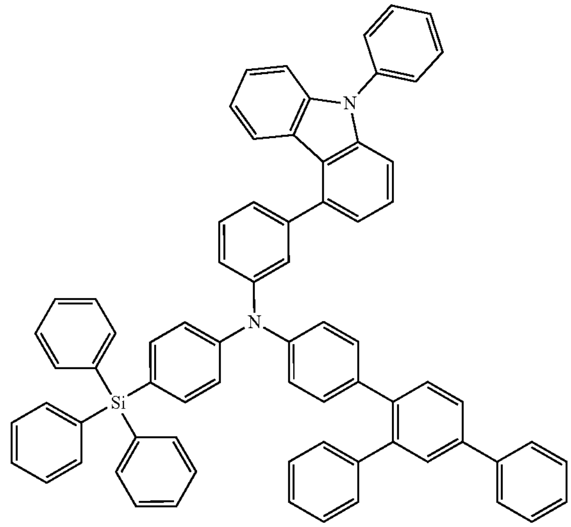
B81
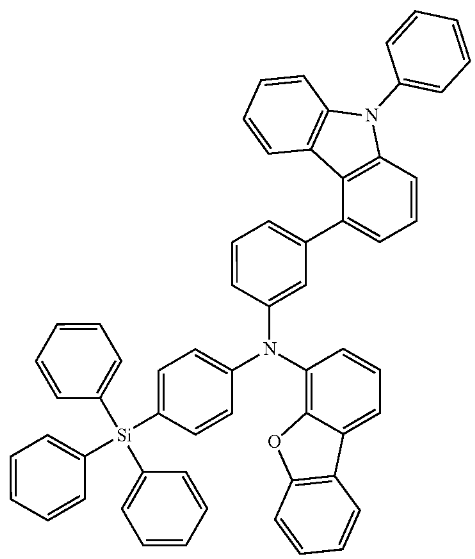
B82
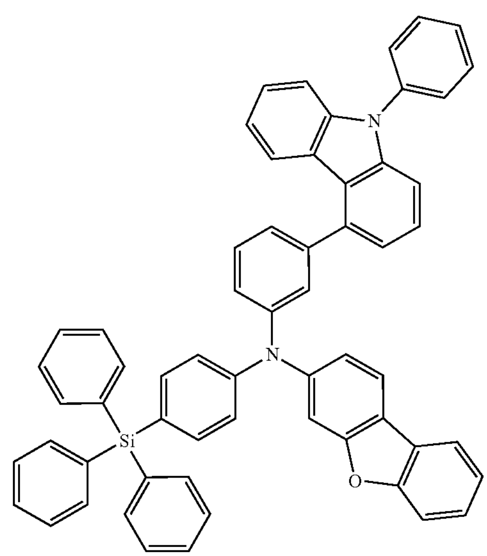

B83
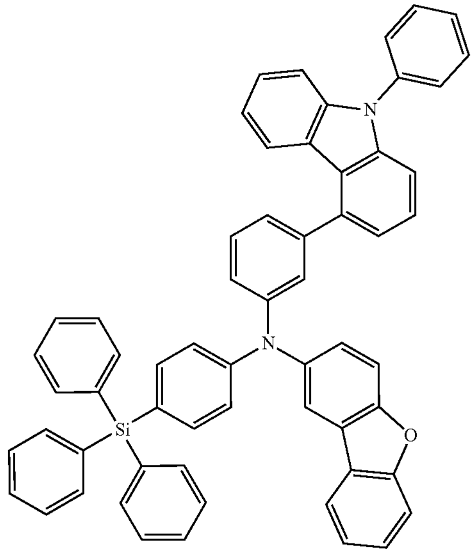
B84
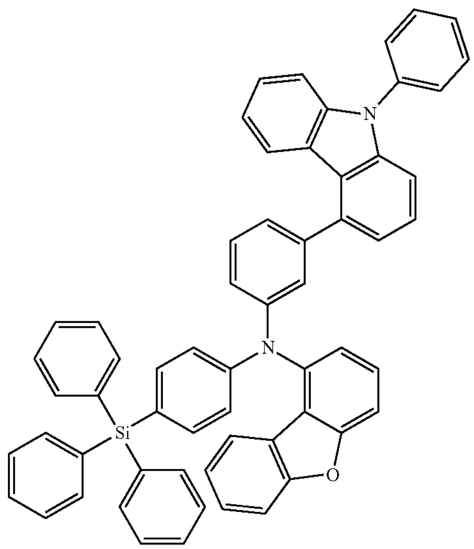
B85
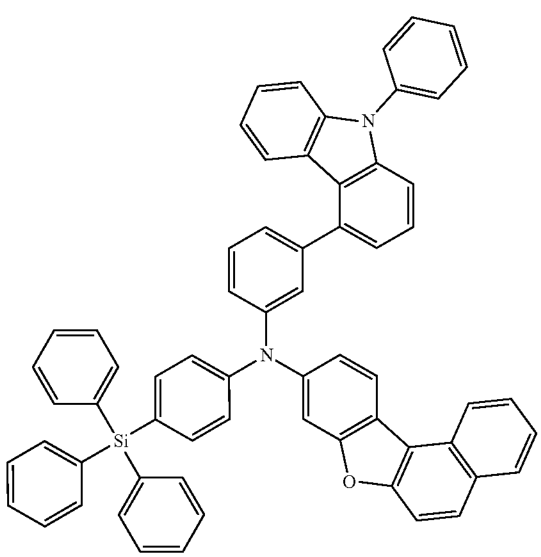
B86
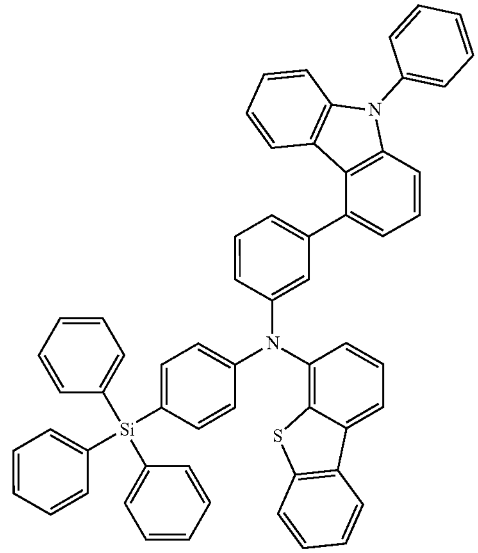
B87
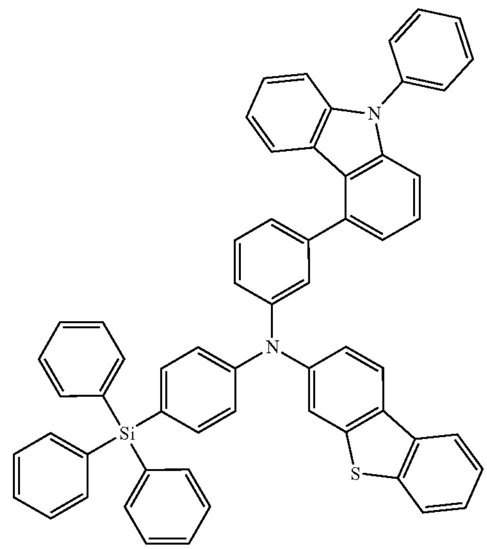
B88
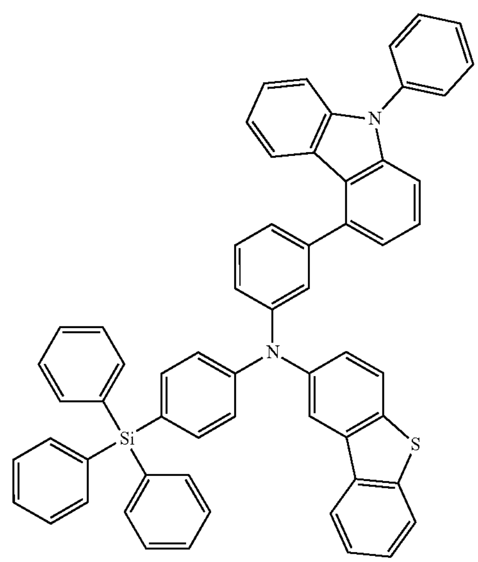

-continued
B89
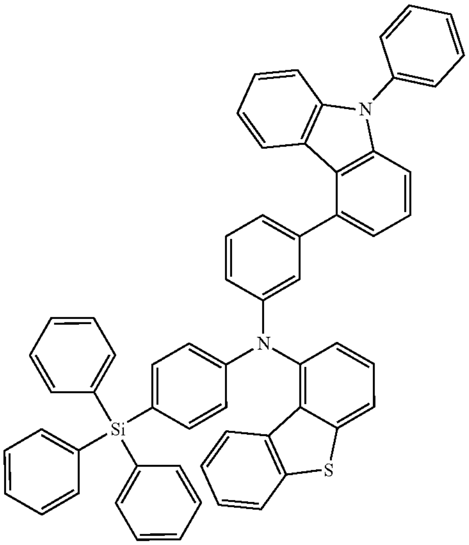
B90
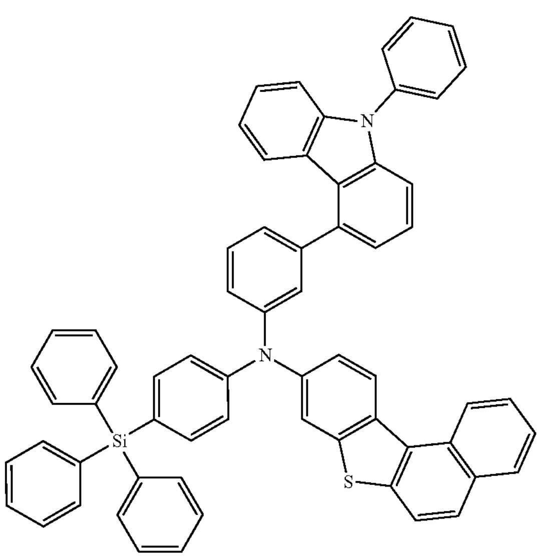
-continued
B91
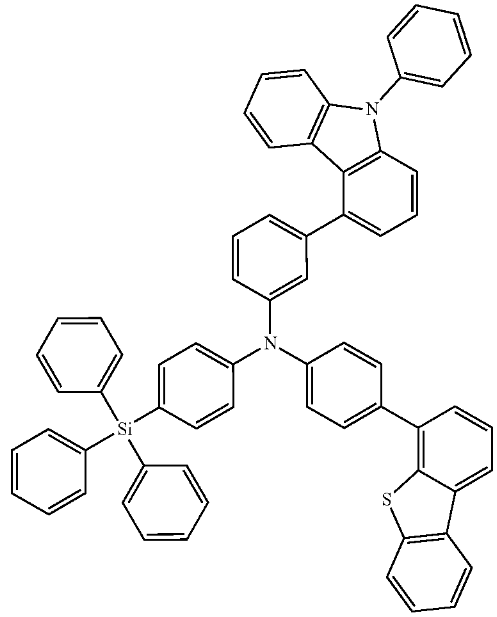
B92
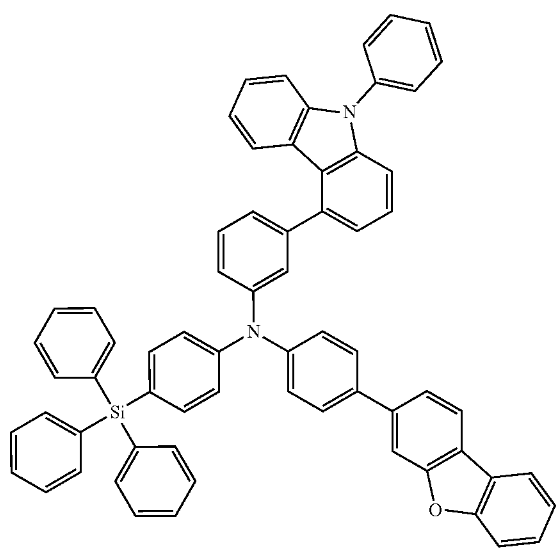

-continued
B93
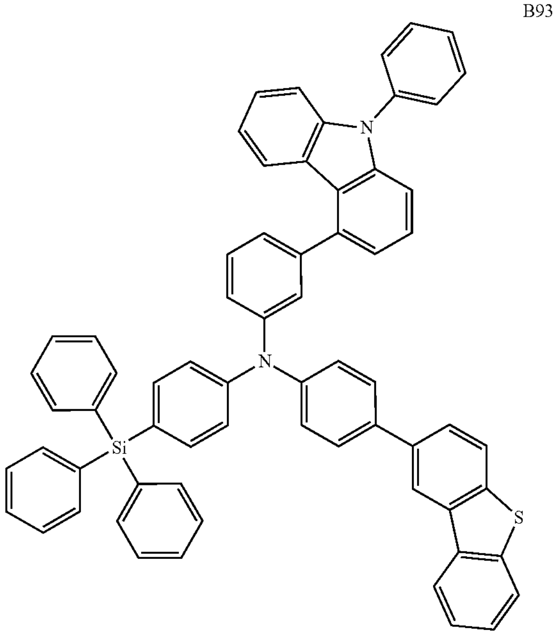
B94
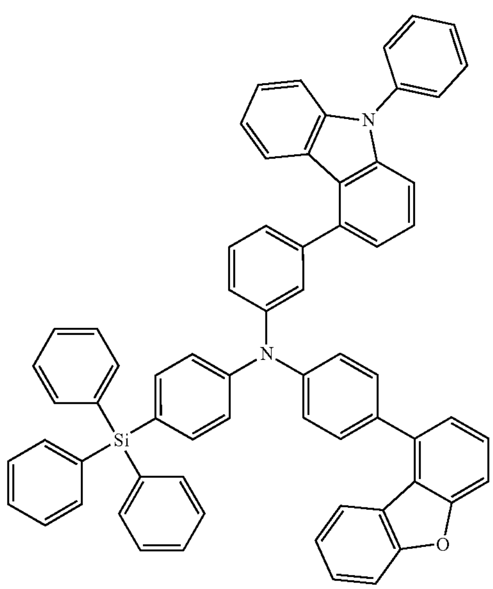
-continued
B95
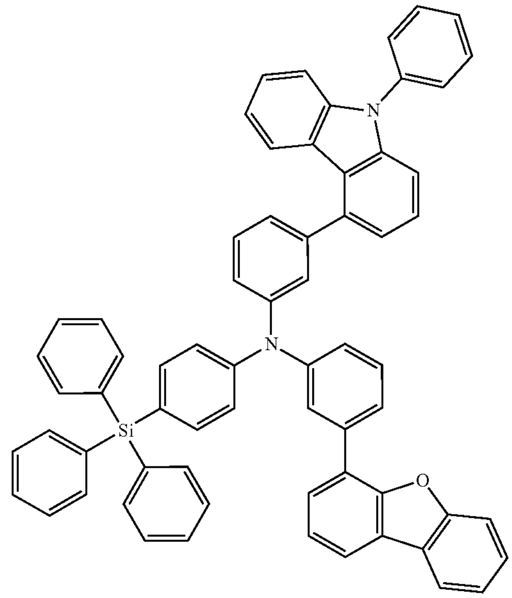
B96
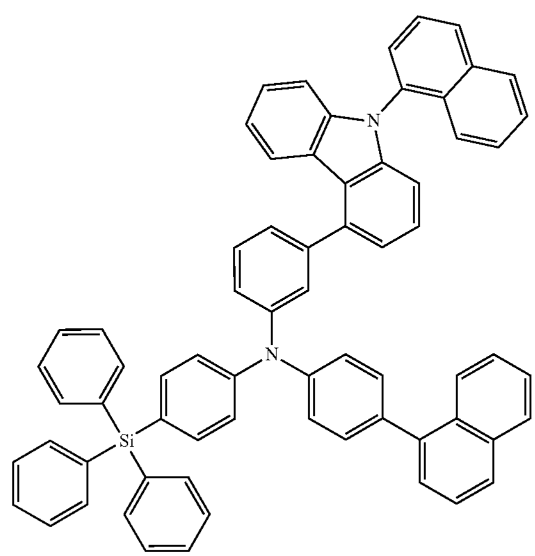

-continued
B97
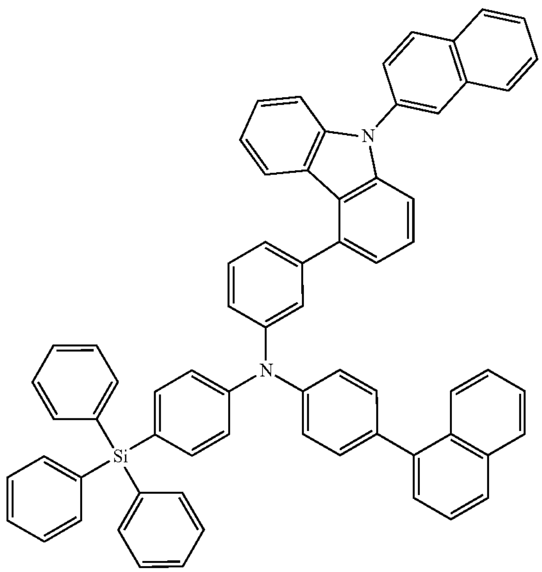
B98
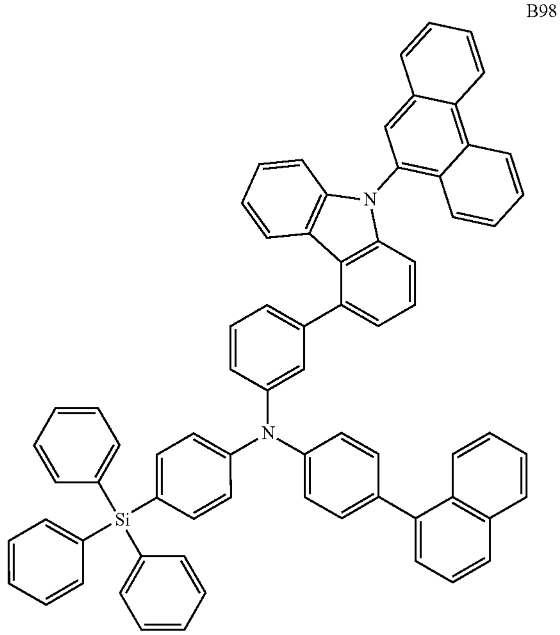
-continued
B99
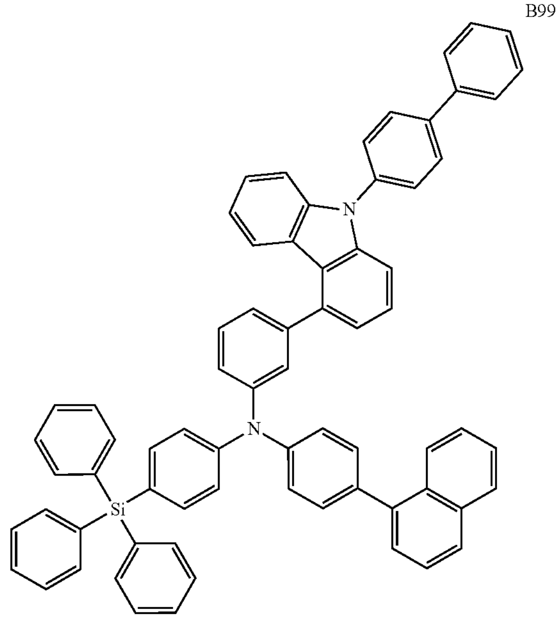
B100
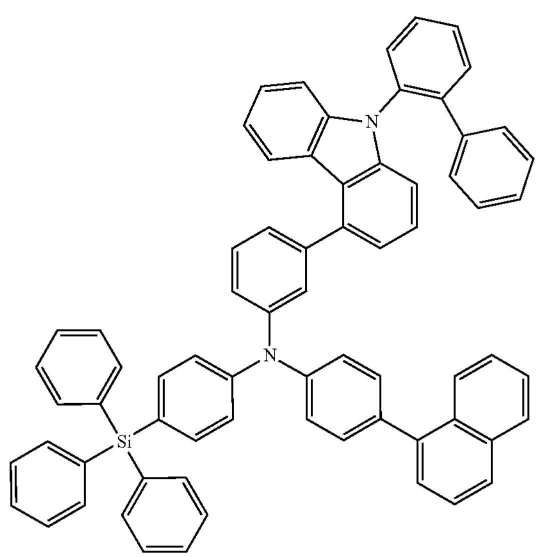

-continued
B101
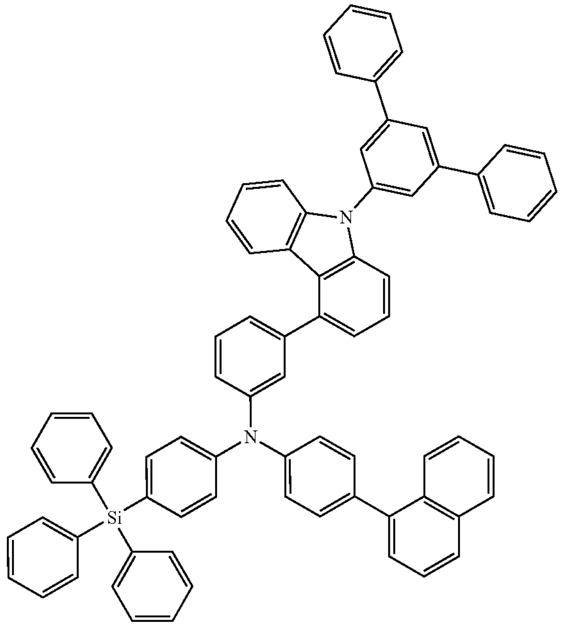
B102
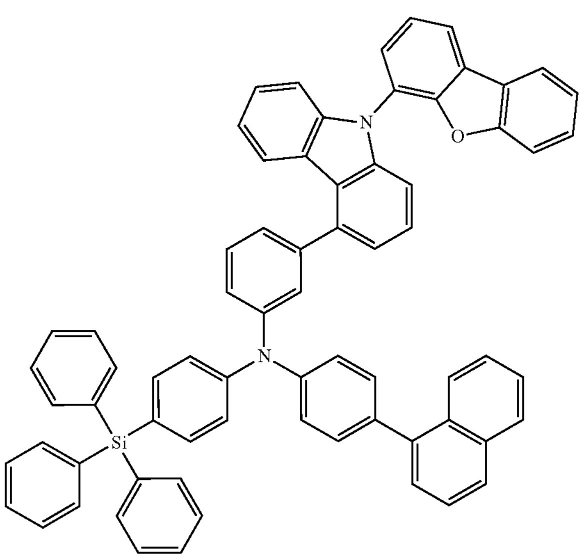
-continued
B103
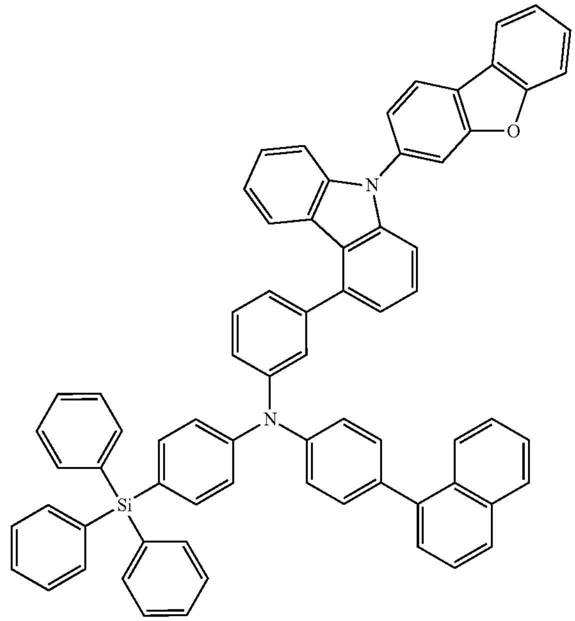
B104
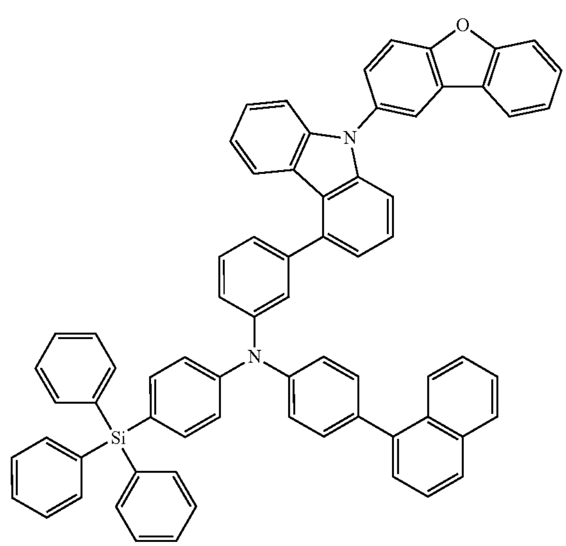

-continued
B105
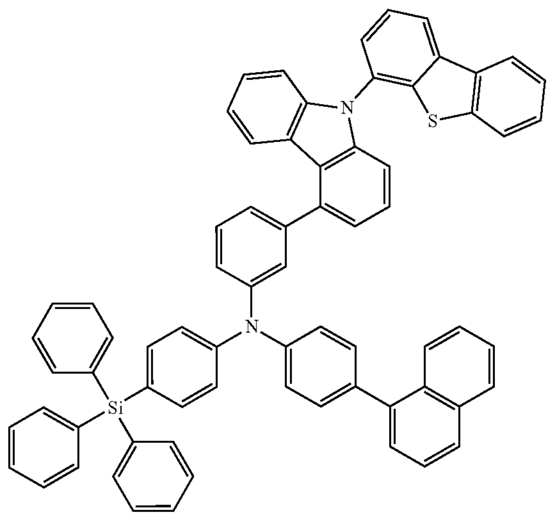
B106
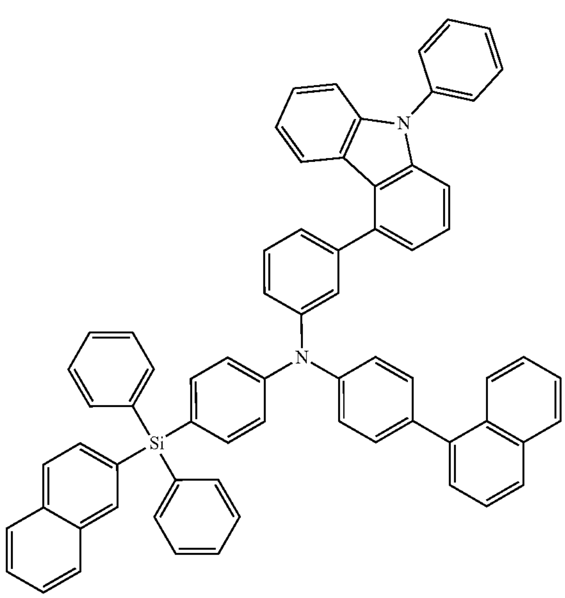
-continued
B107
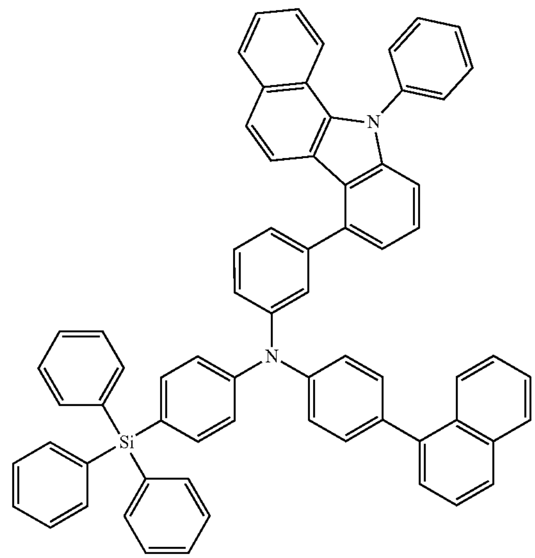
B108
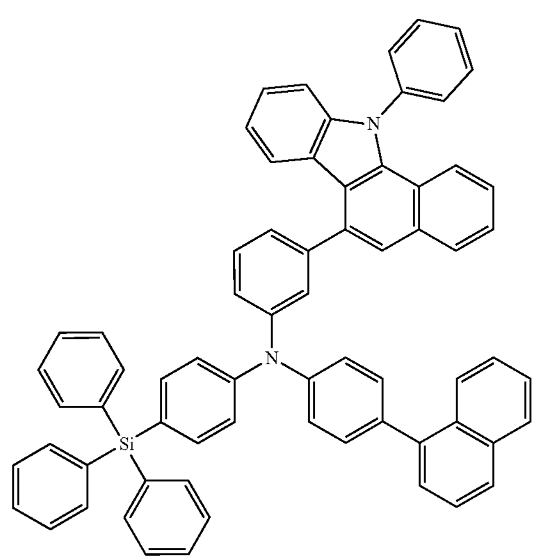

B109
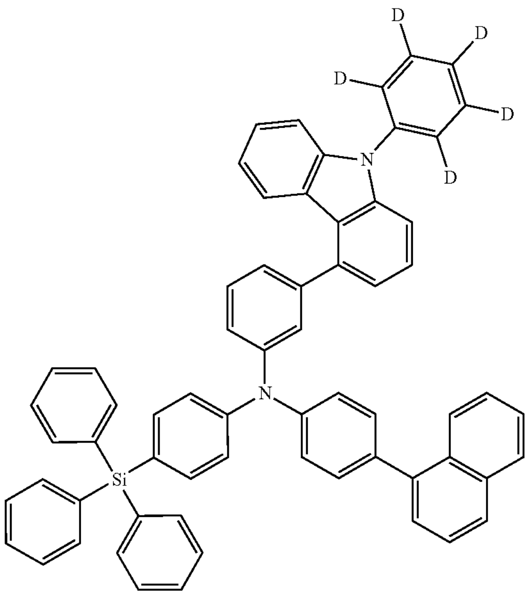
B110
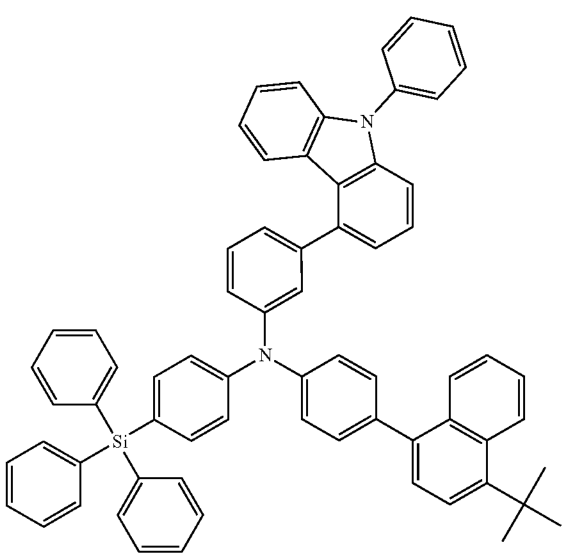
B111
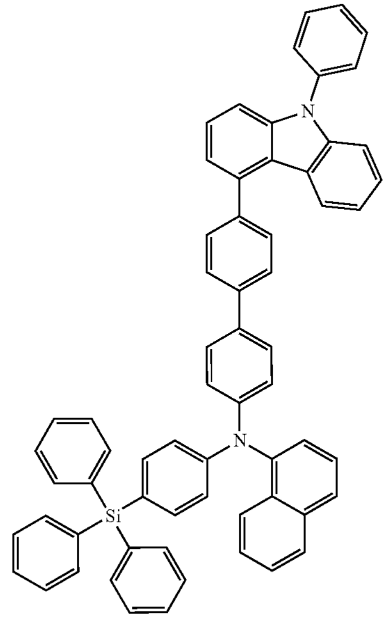
B112
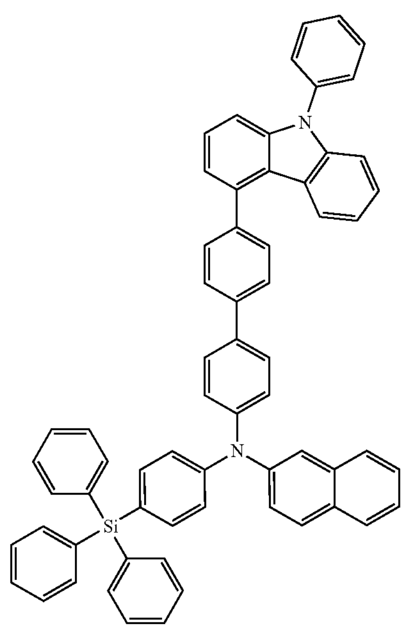

B113
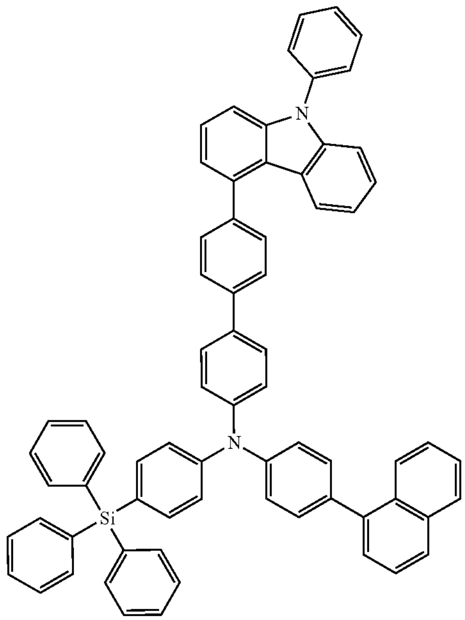
B114
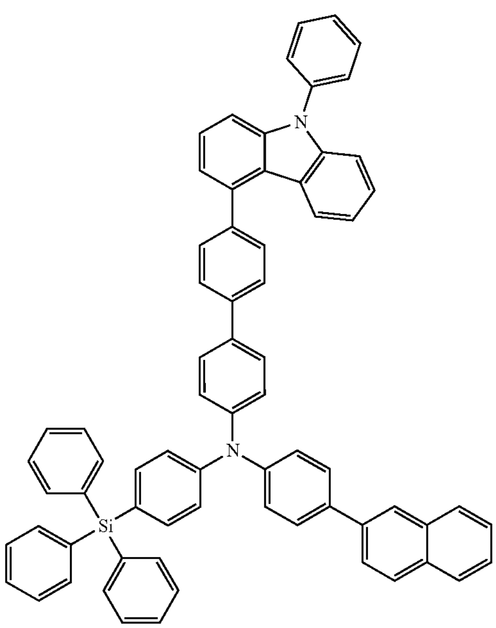
B115
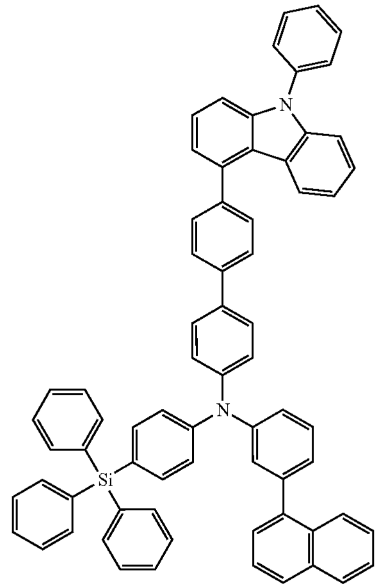
B116
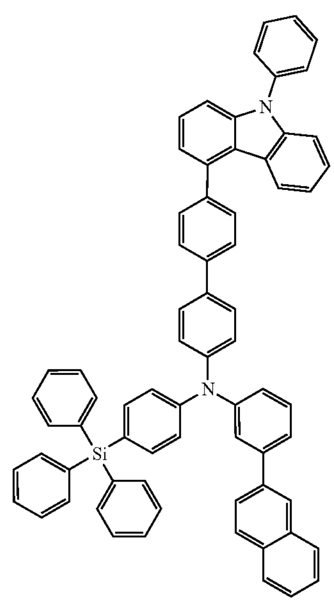

-continued
B117
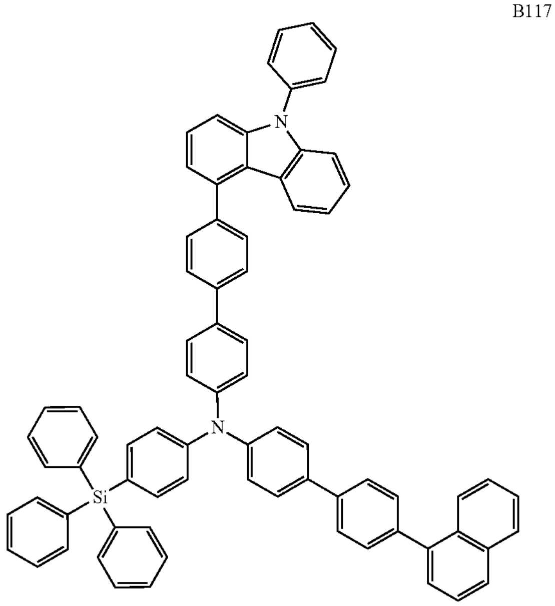
B118
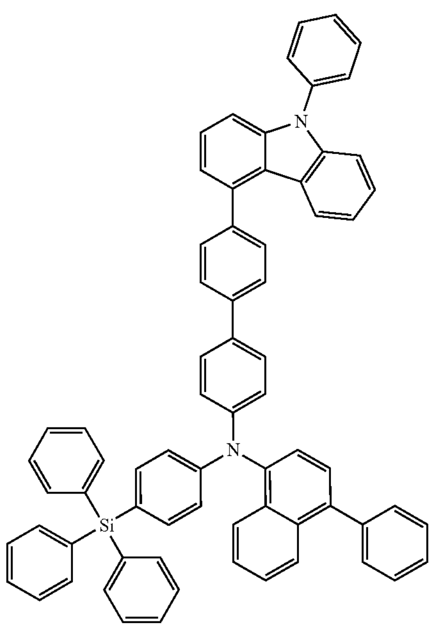
-continued
B119
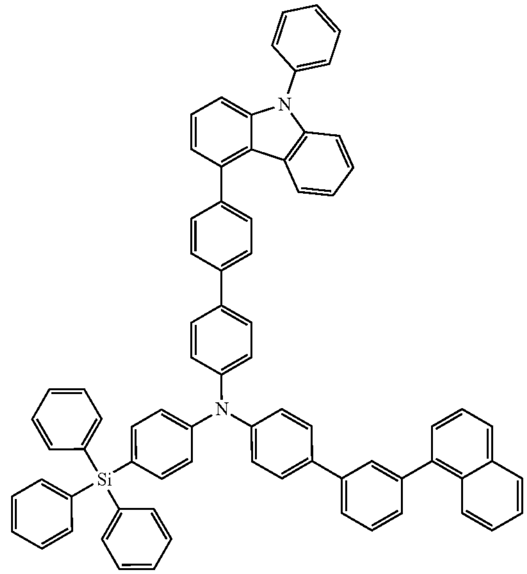
B120
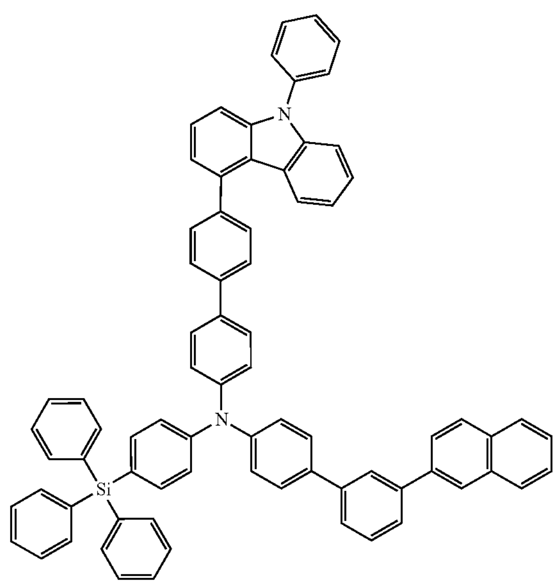

-continued
B121
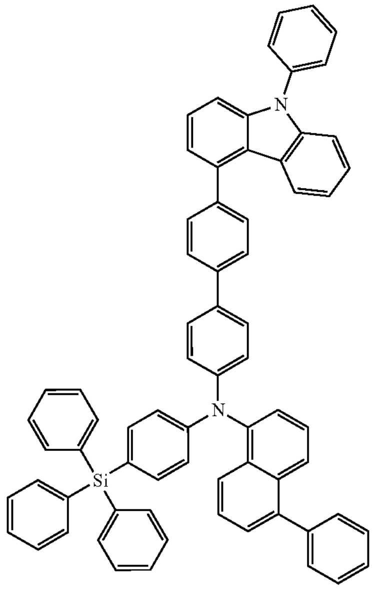
B122
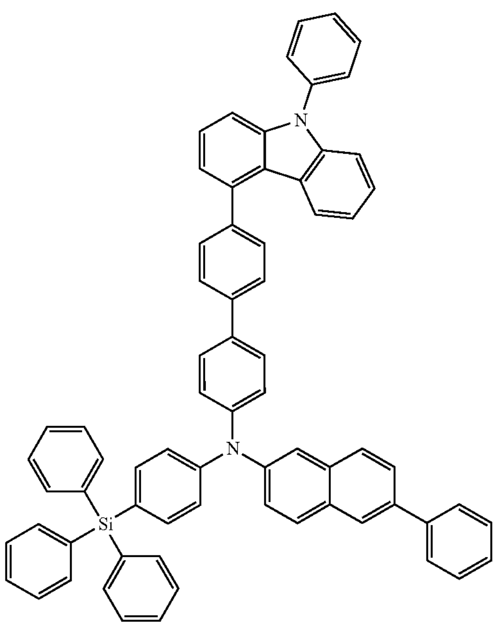
-continued
B123
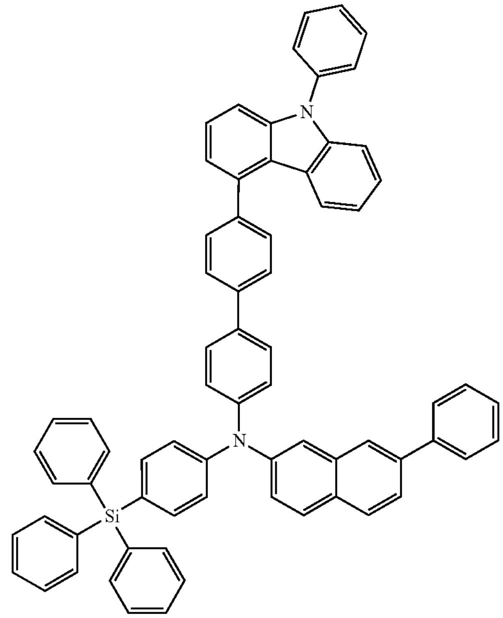
B124
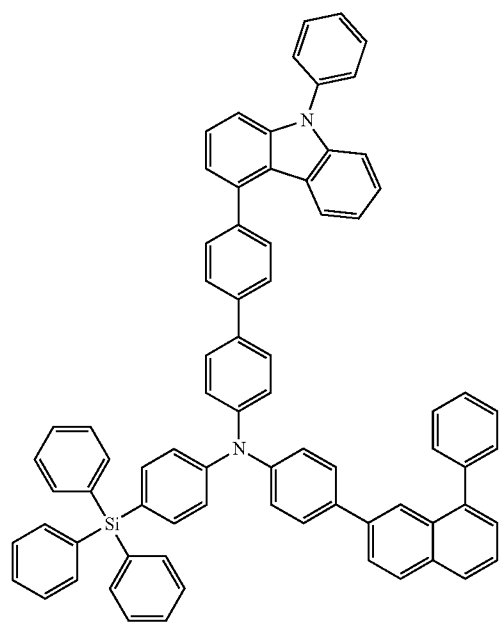

-continued
B125
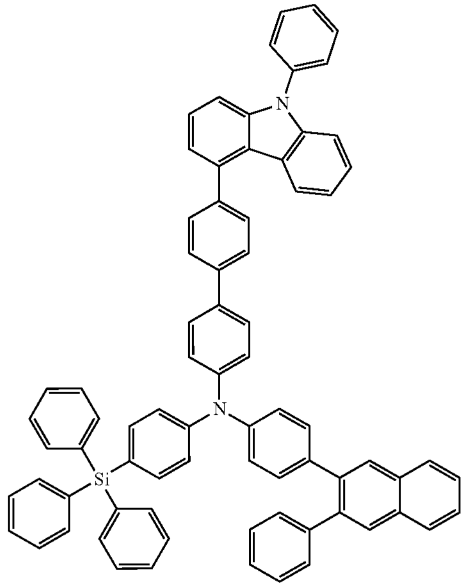
B126
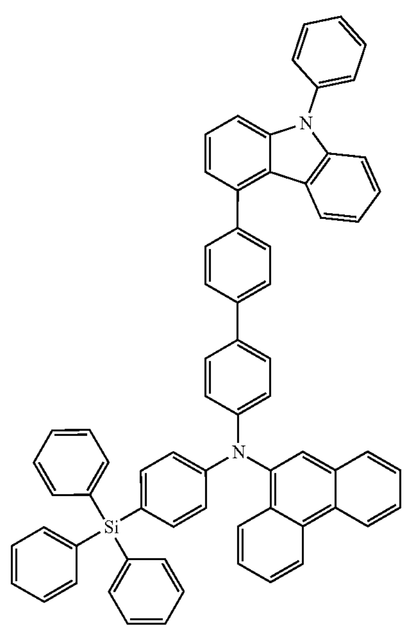
-continued
B127
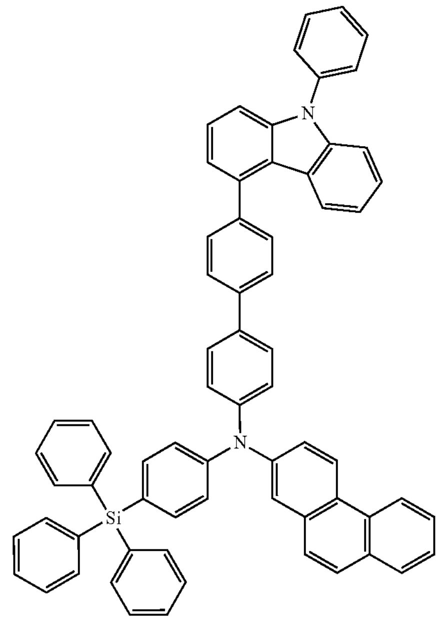
B128
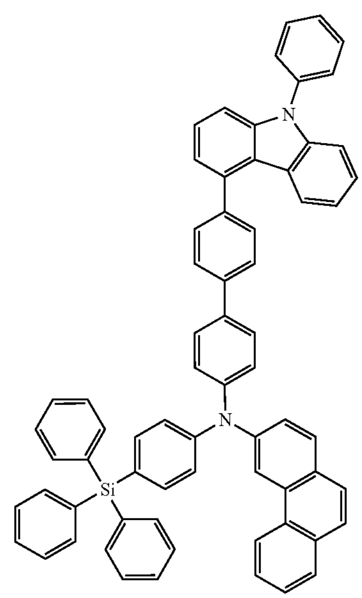

-continued
B129
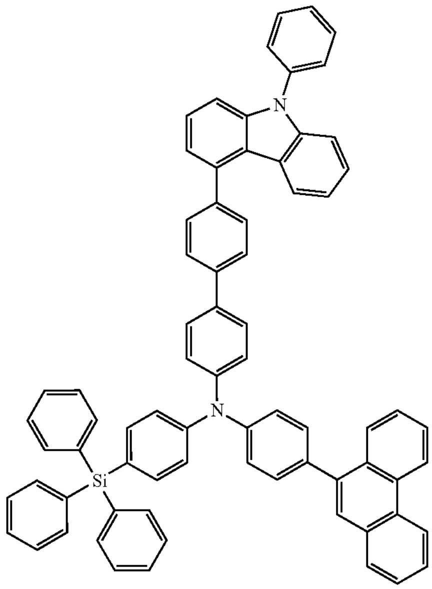
B130
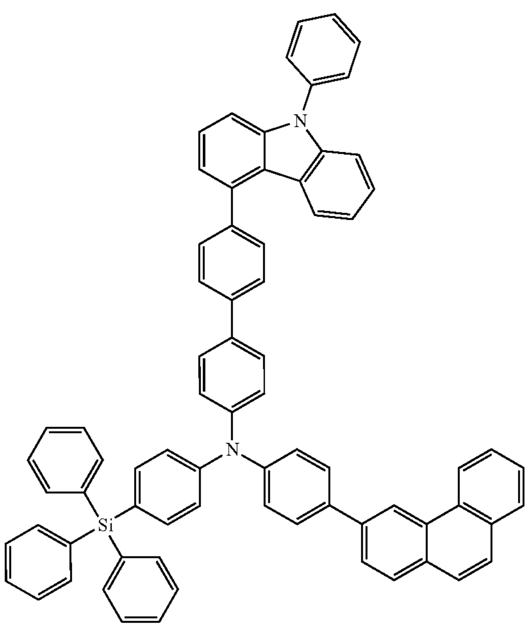
-continued
B131
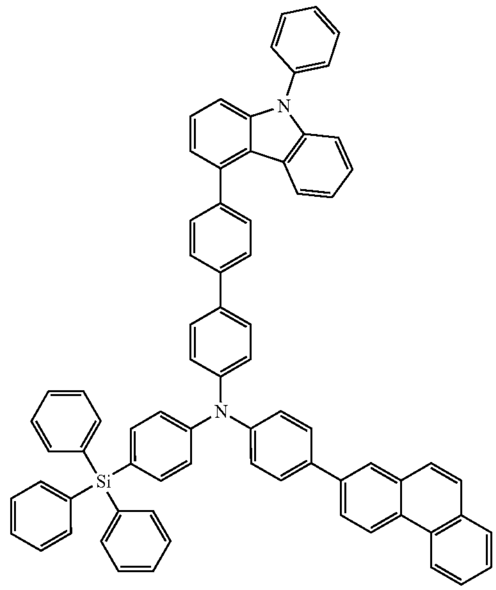
B132
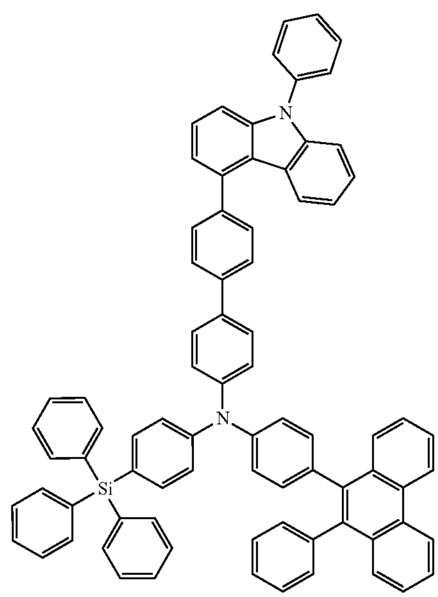

B133
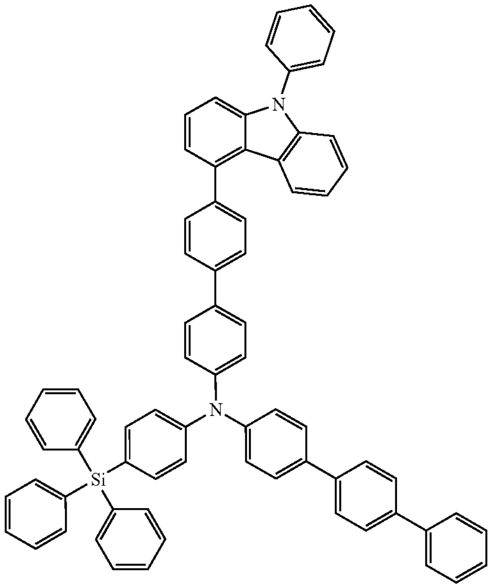
B134
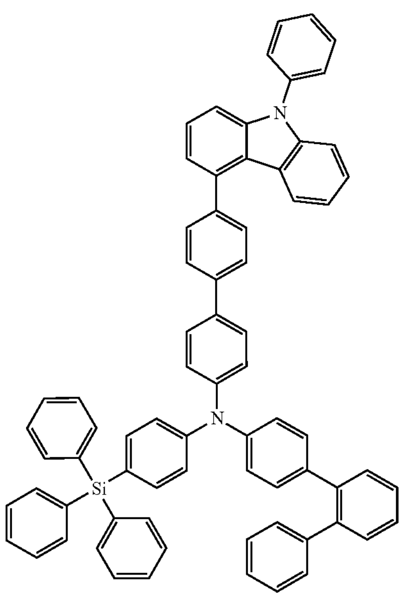
B135
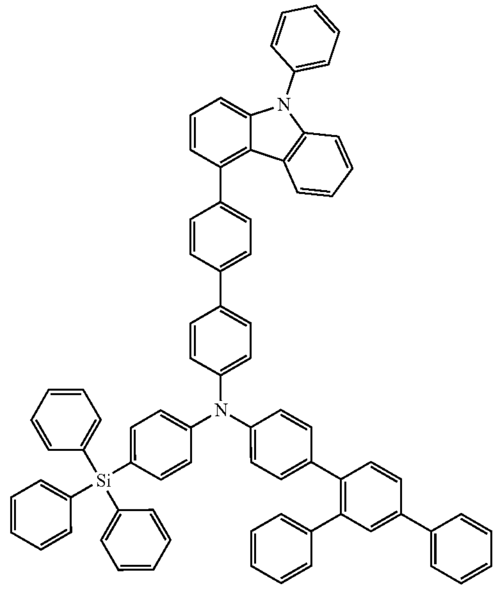
B136
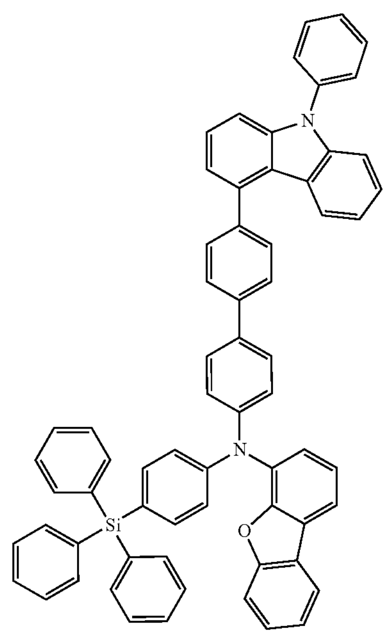

-continued
B137
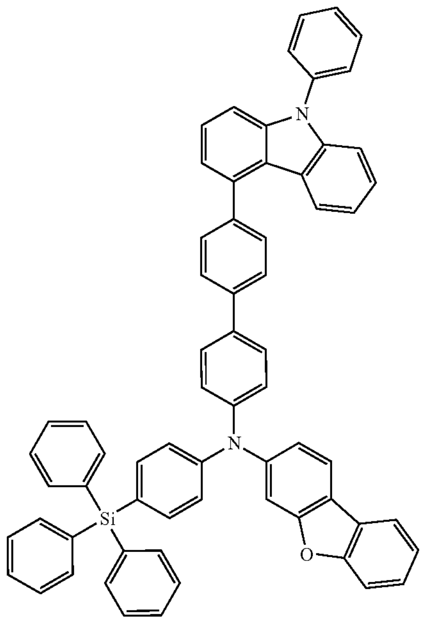
B138
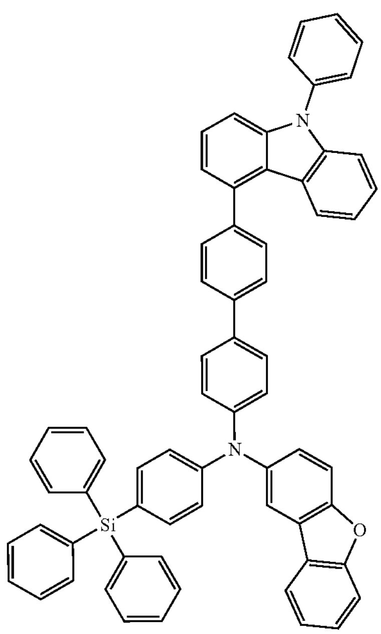
-continued
B139
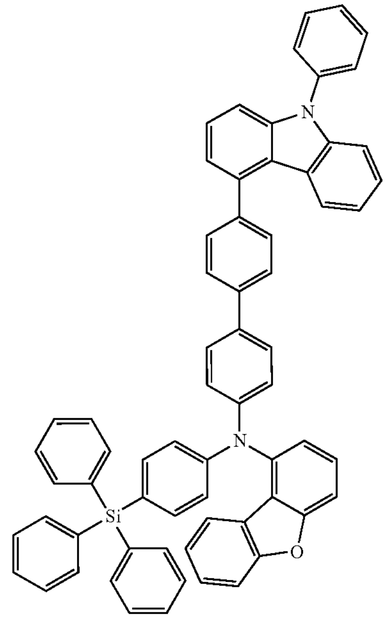
B140
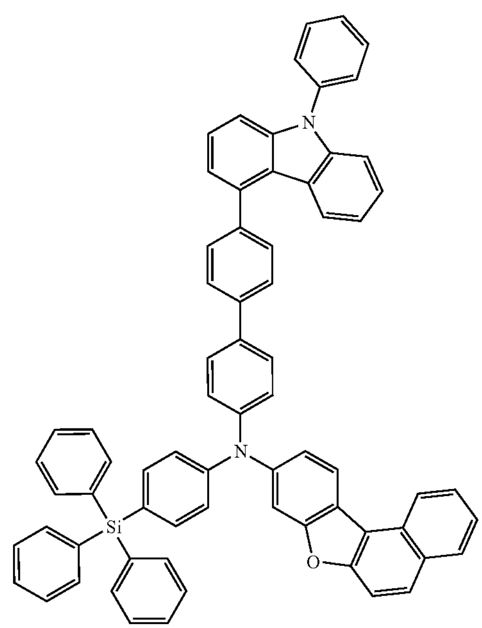

-continued
B141
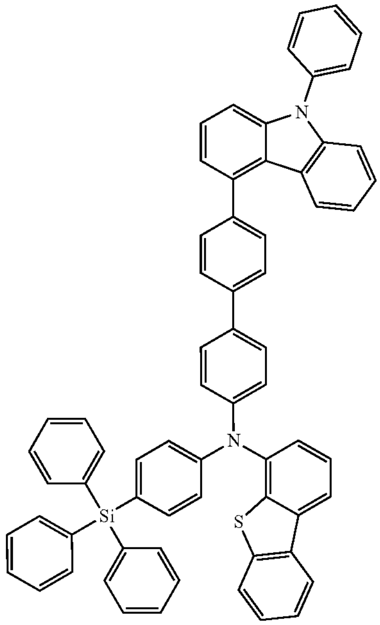
B142
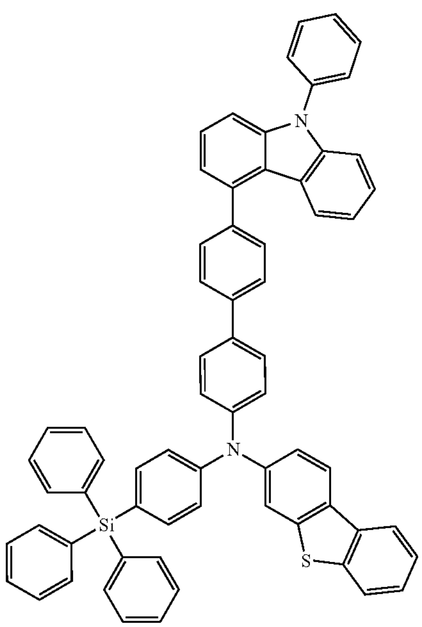
-continued
B143
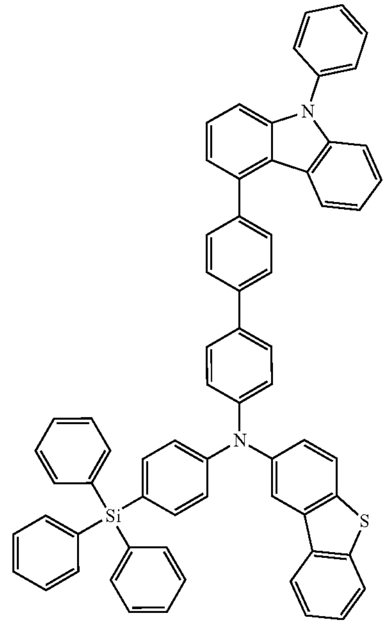
B144
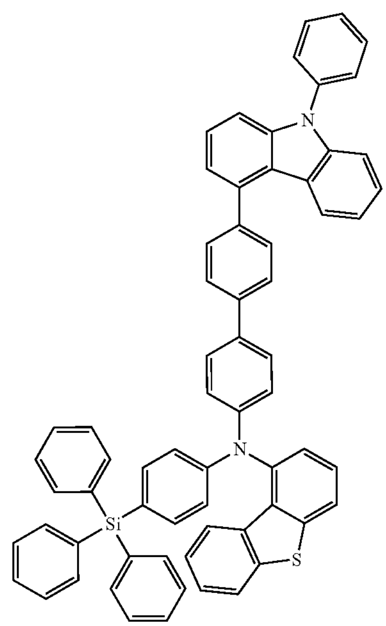

-continued
B145
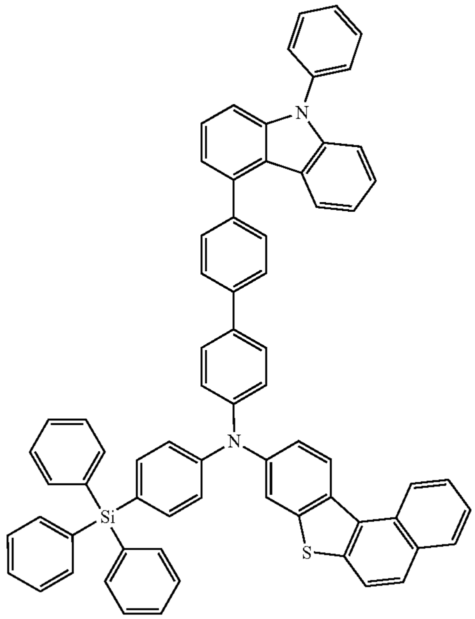
B146
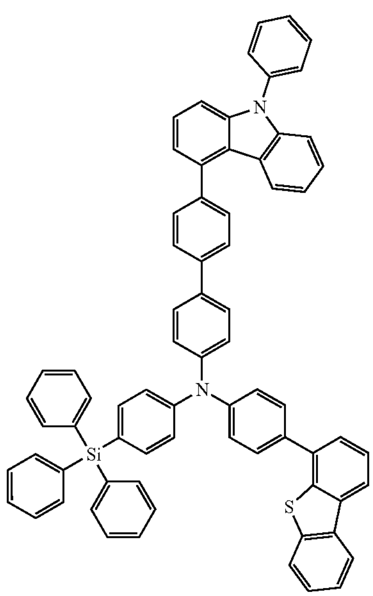
-continued
B147
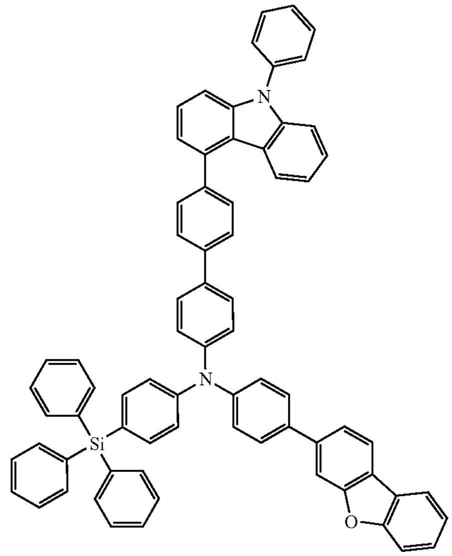
B148
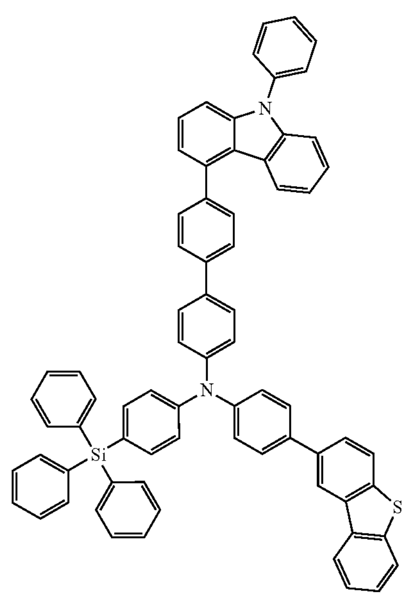

-continued
B149
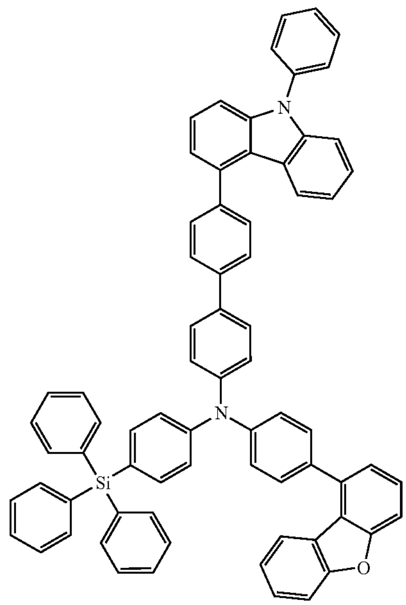
B150
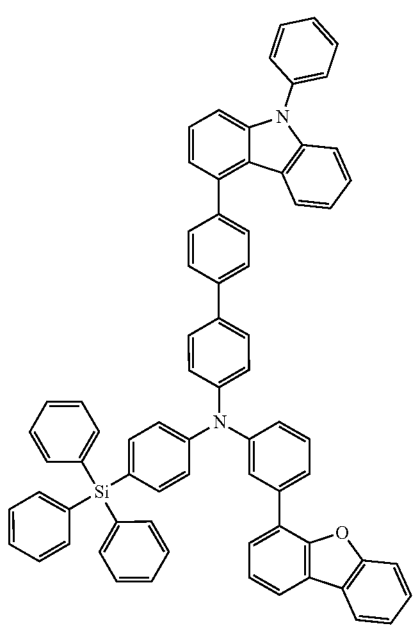
-continued
B151
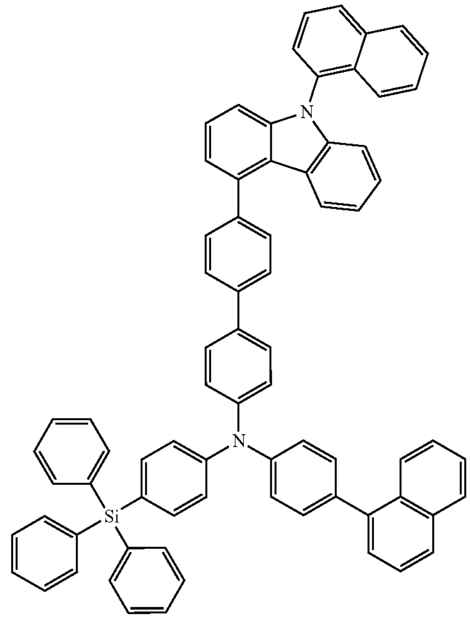
B152
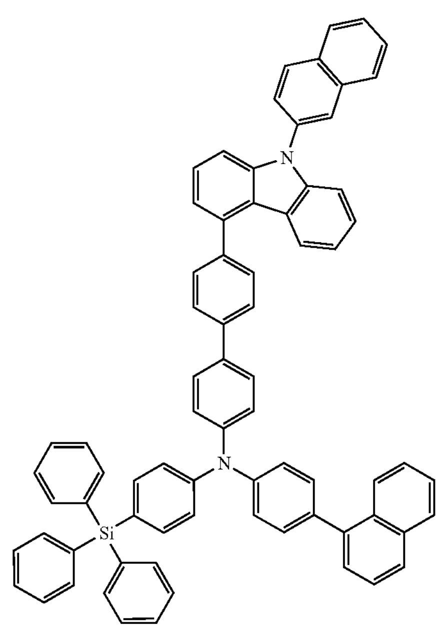

B153
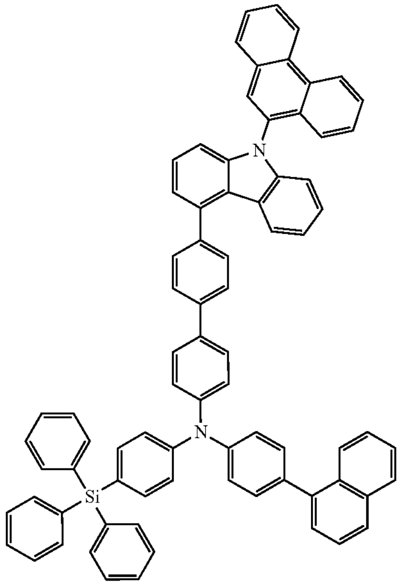
B154
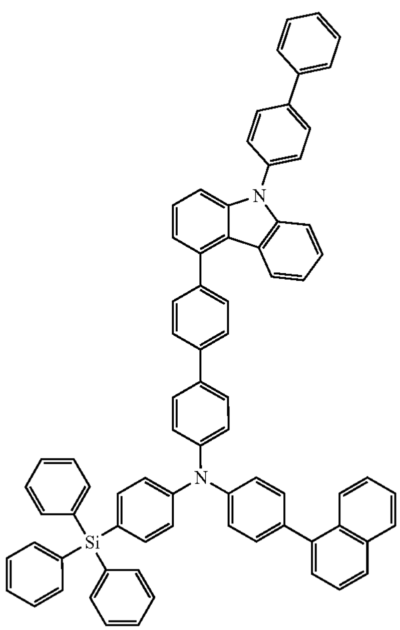
B155
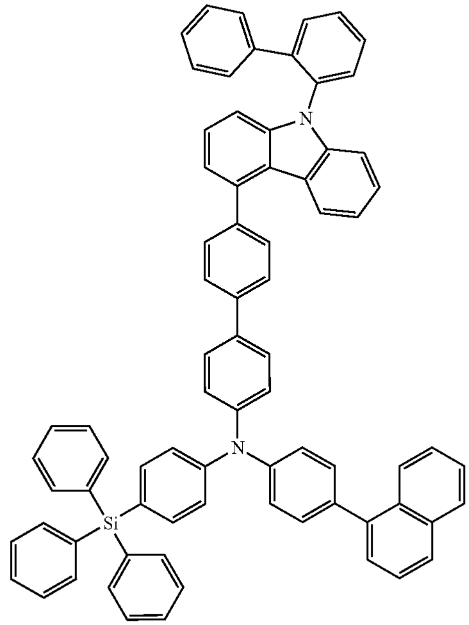
B156
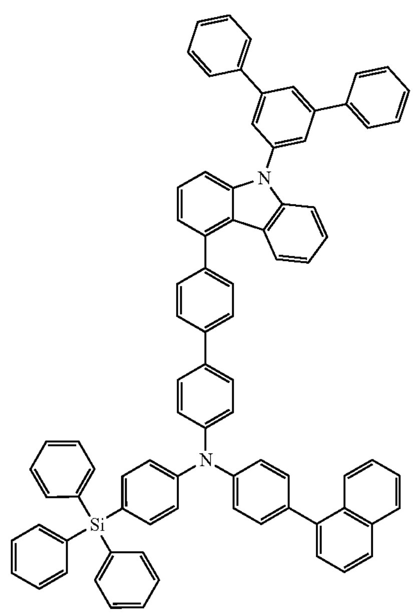

B157
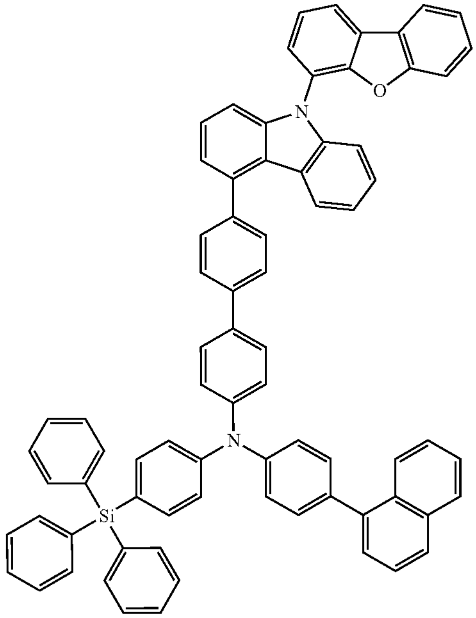
B158
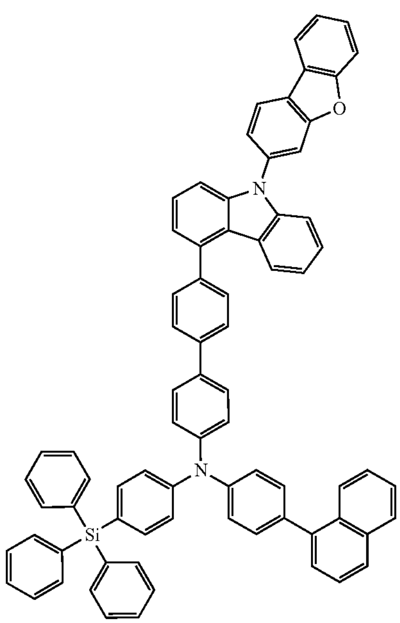
B159
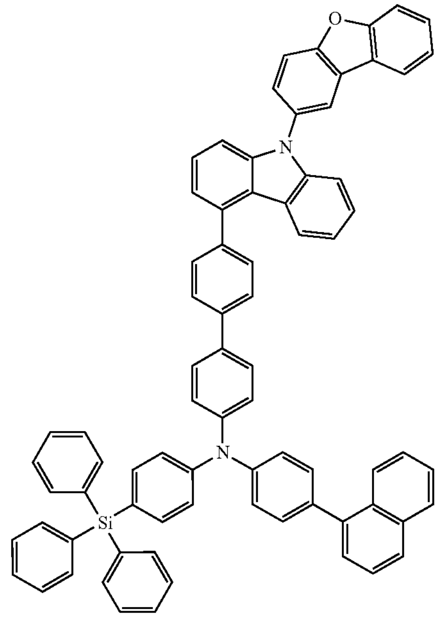
B160
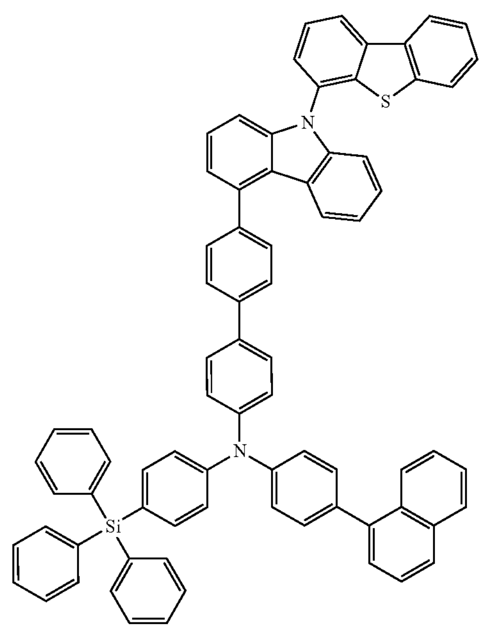

-continued
B161
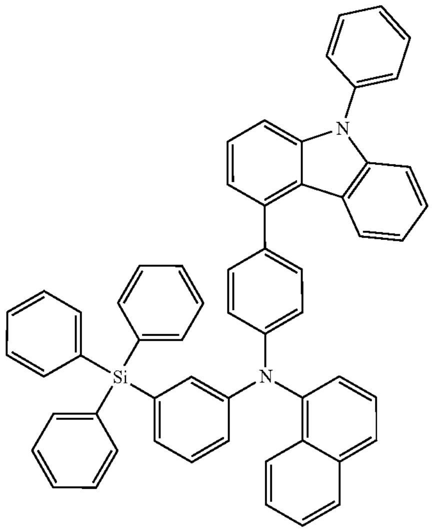
B162
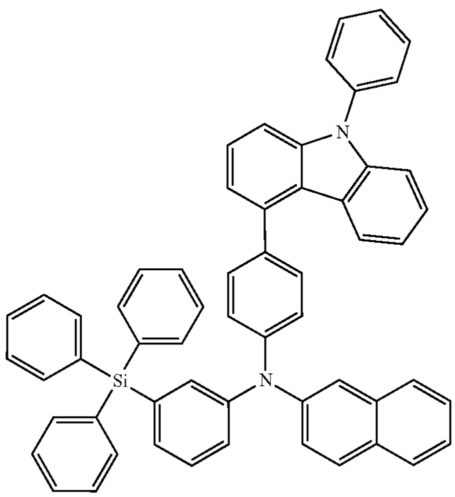
B163
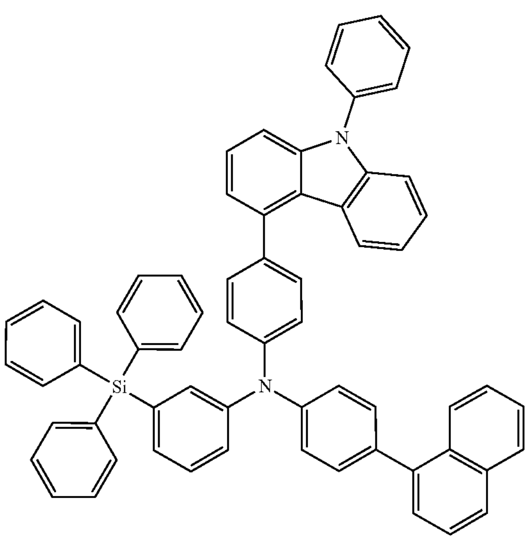
-continued
B164
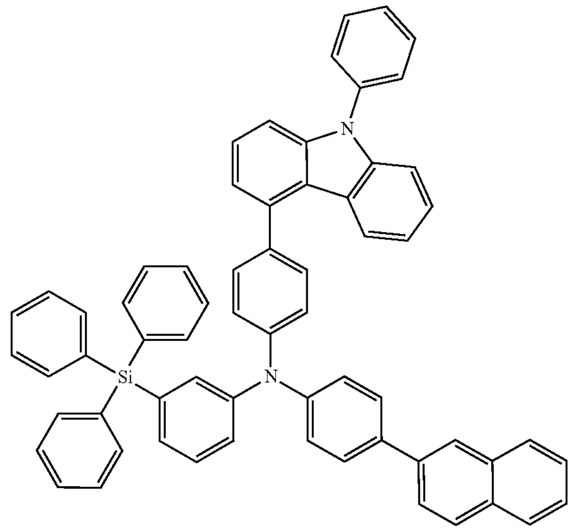
B165
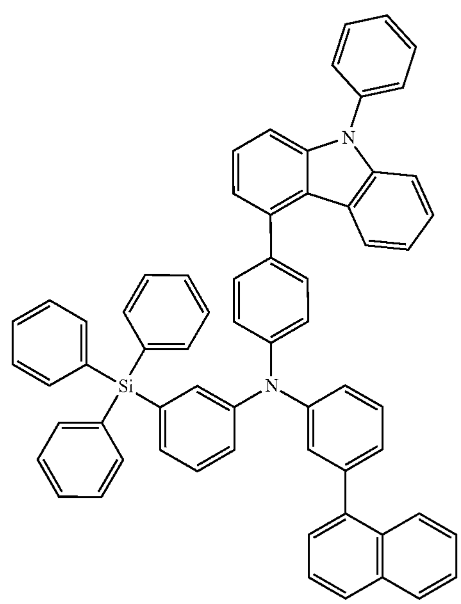

-continued
B166
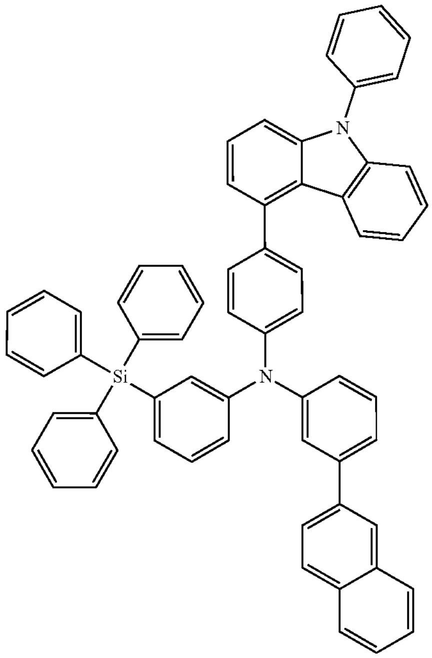
B167
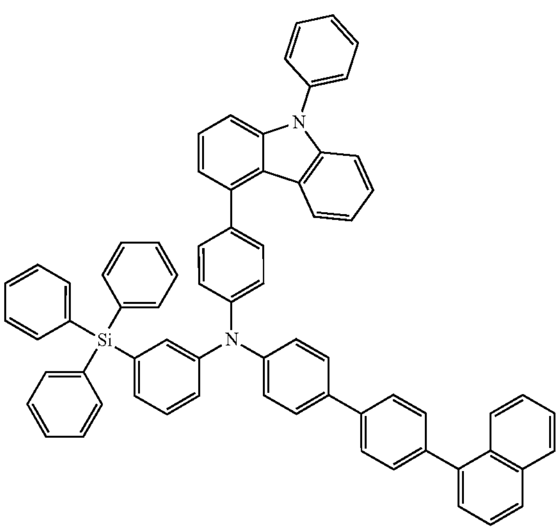
-continued
B168
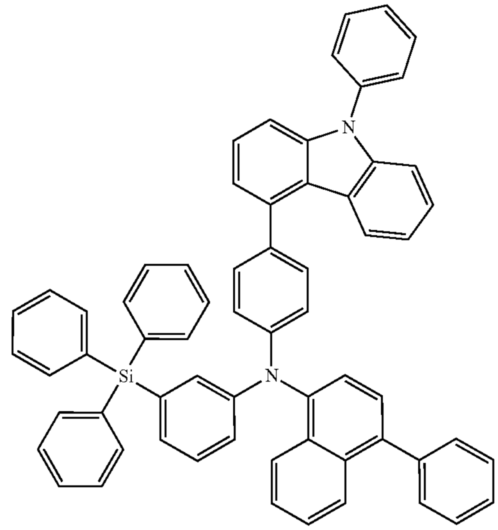
B169
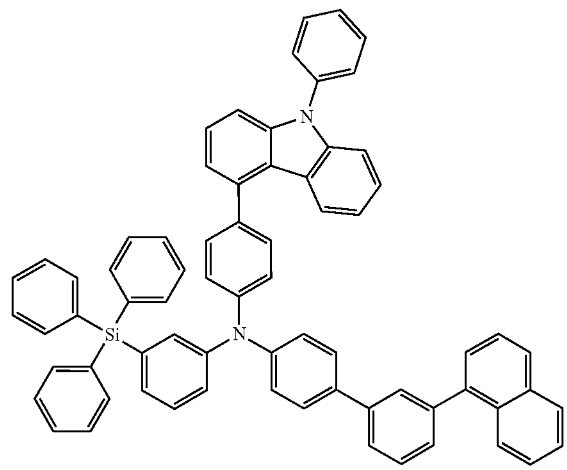
B170
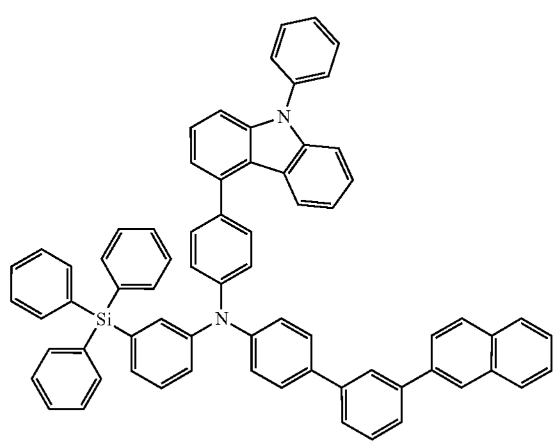

-continued
B171
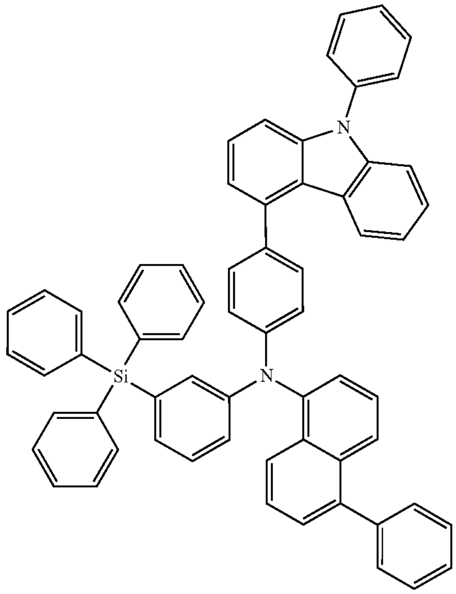
B172
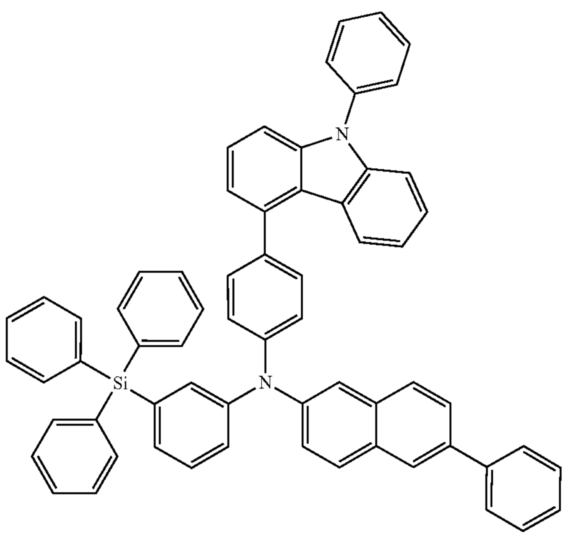
B173
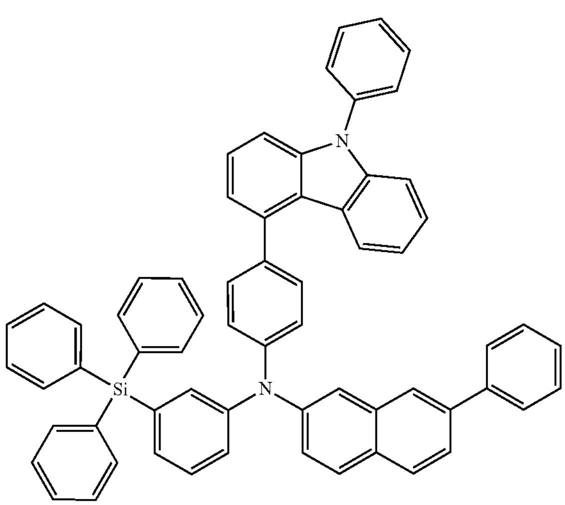
-continued
B174
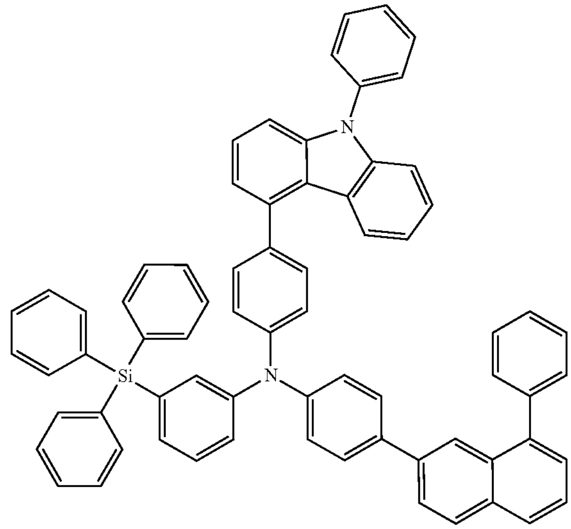
B175
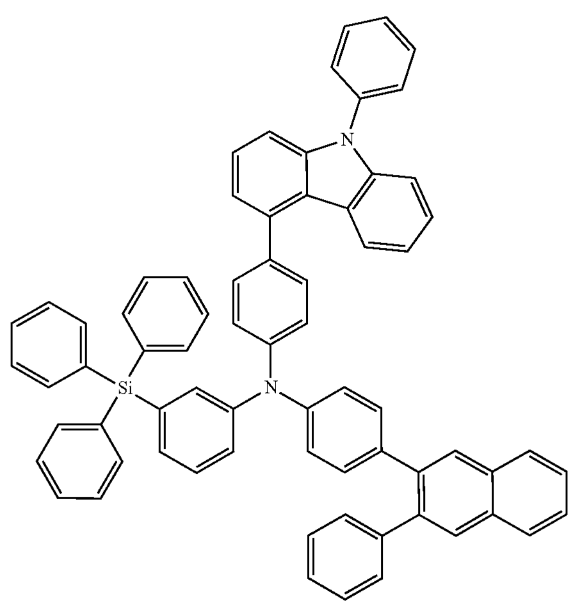

-continued
B176
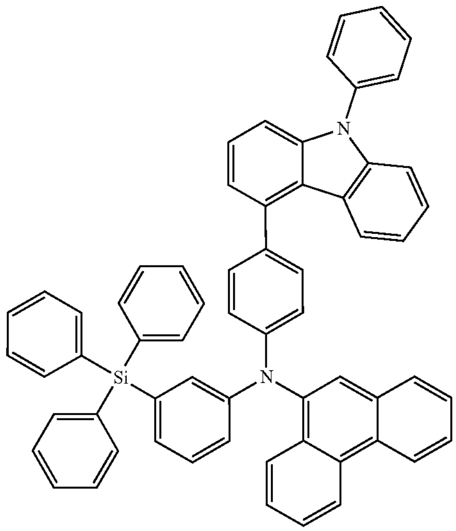
B177
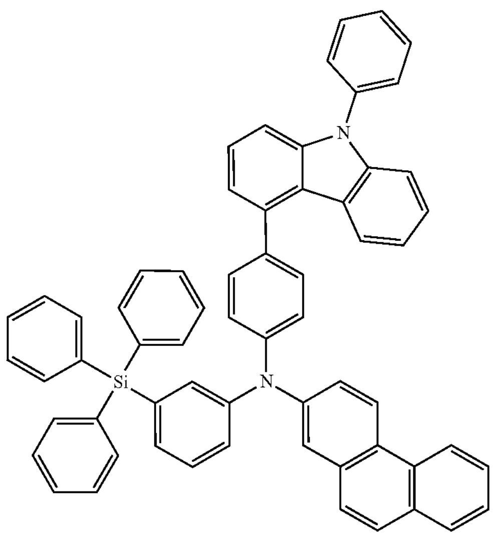
B178
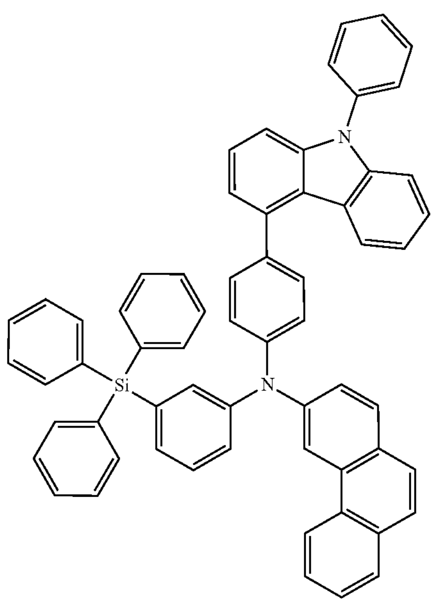
-continued
B179
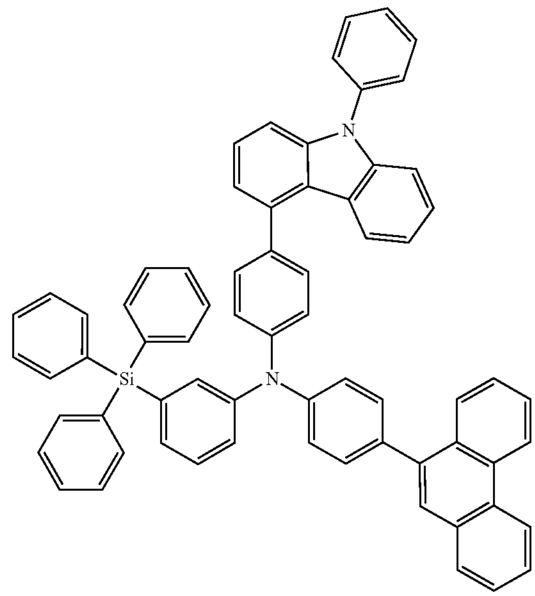
B180
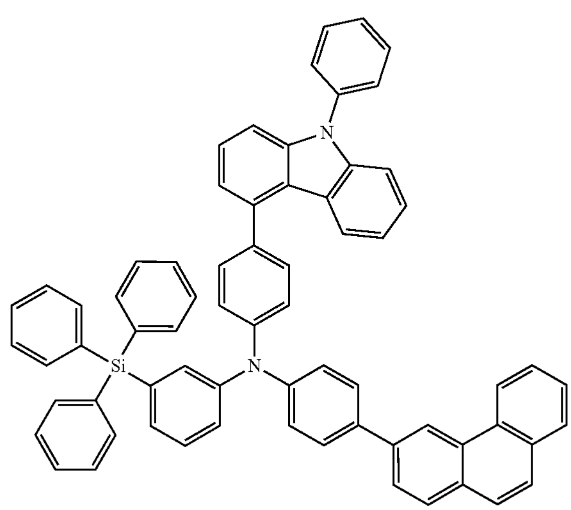

-continued
B181
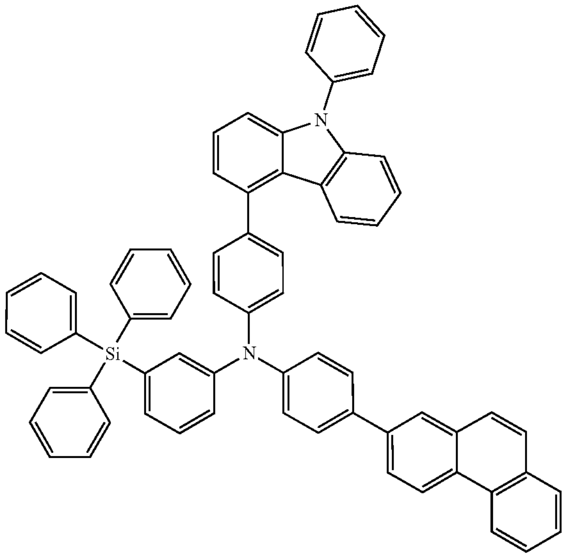
B182
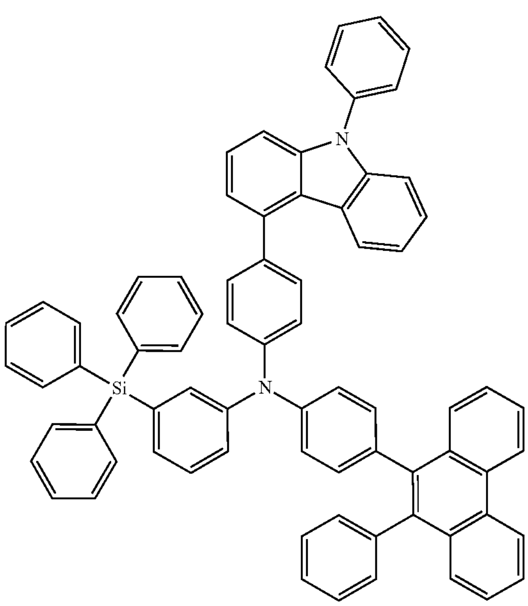
-continued
B183
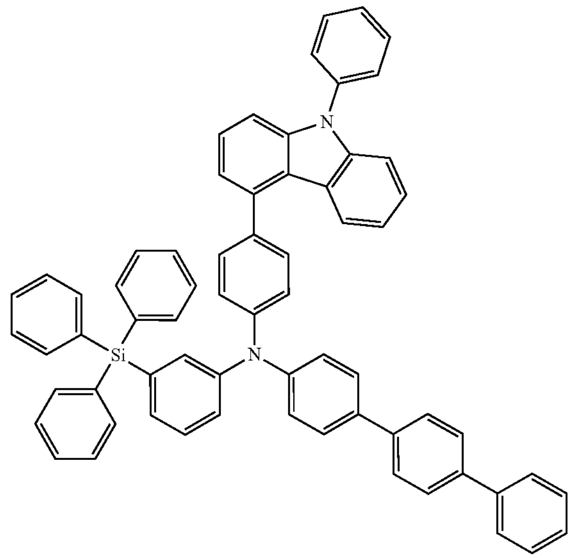
B184
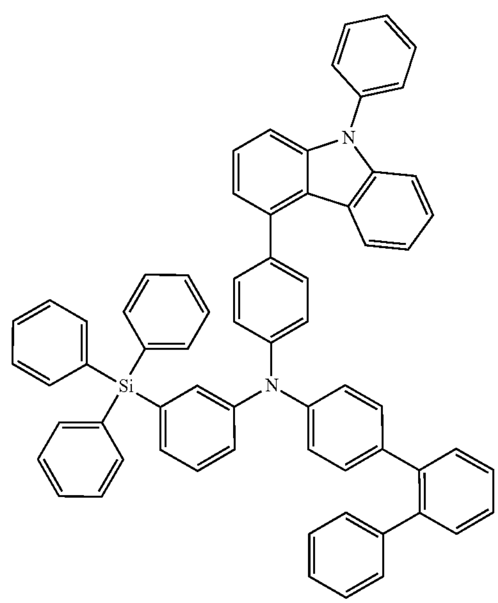

-continued
B185
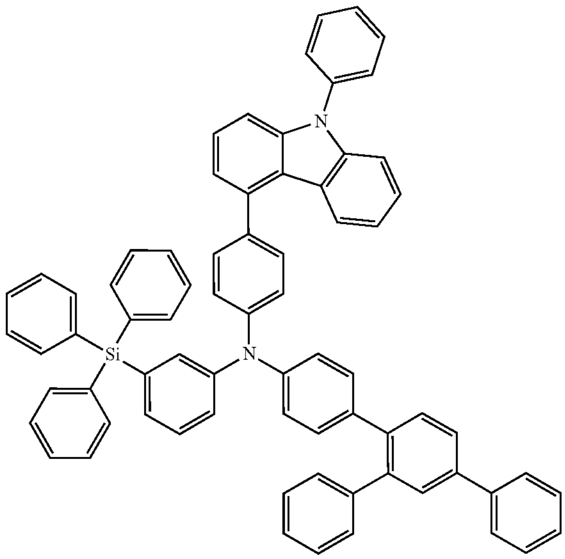
B186
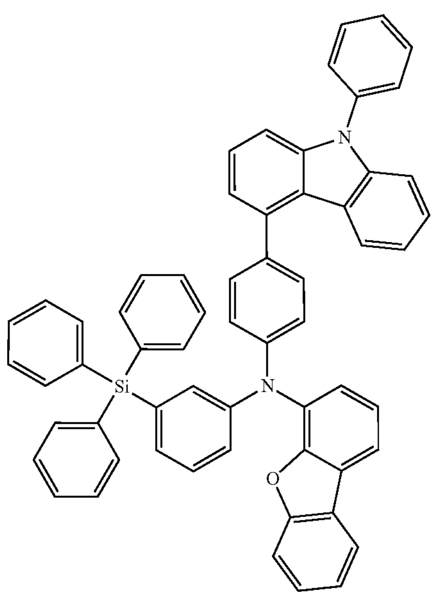
-continued
B187
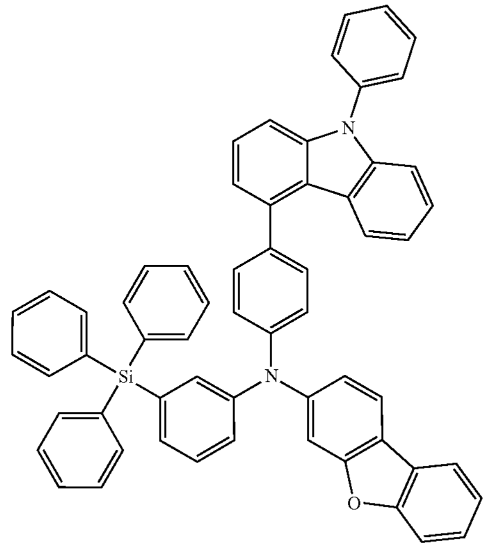
B188
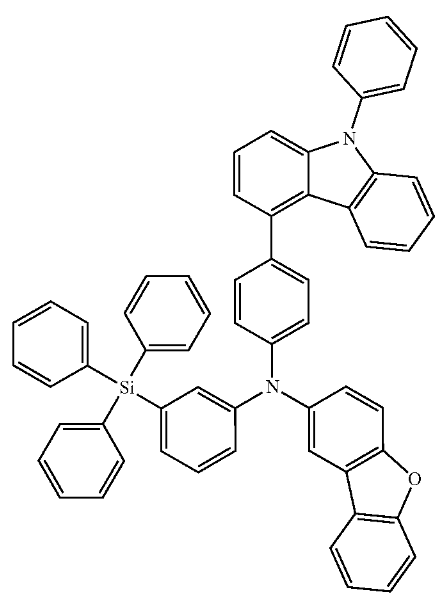

-continued
B189
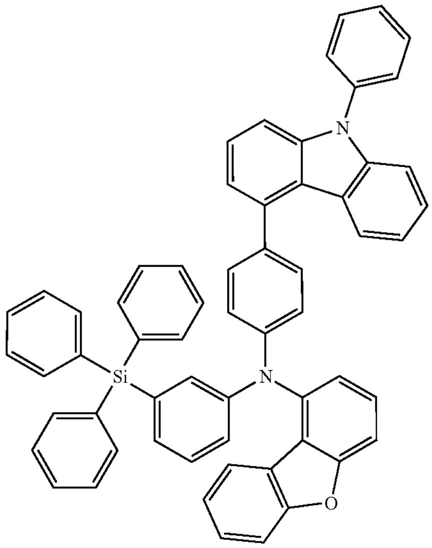
B190
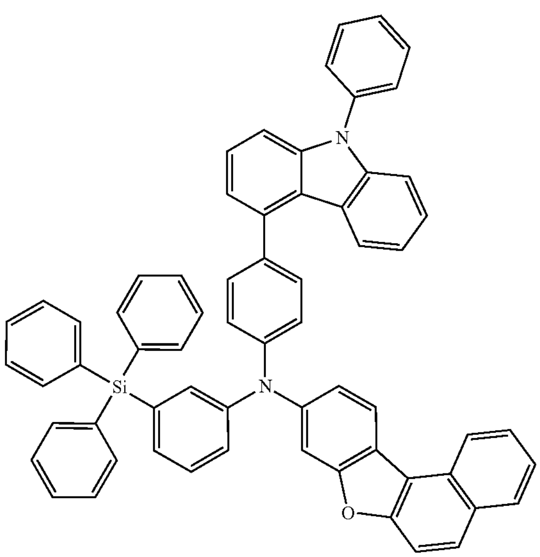
-continued
B191
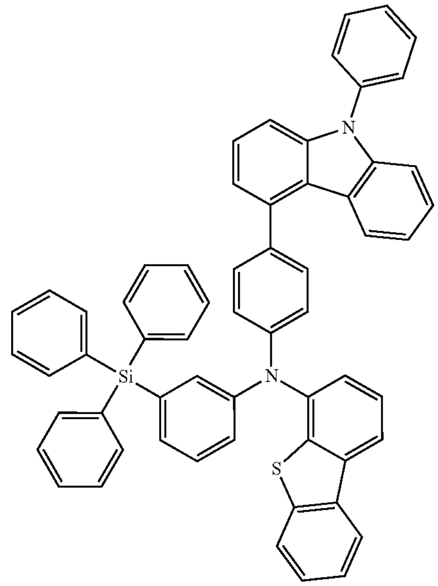
B192
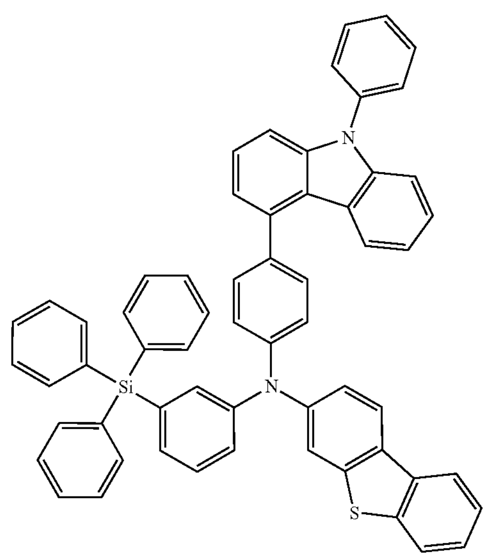

-continued
B193
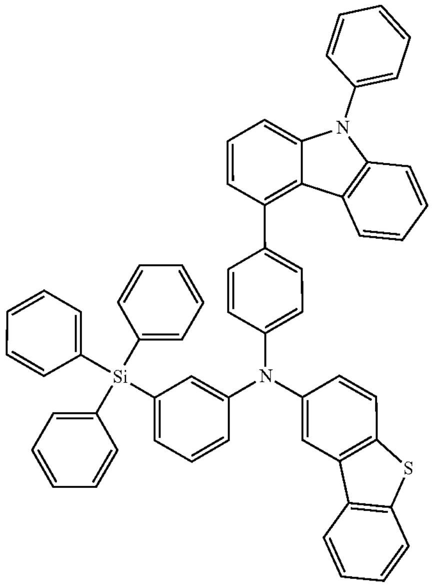
B194
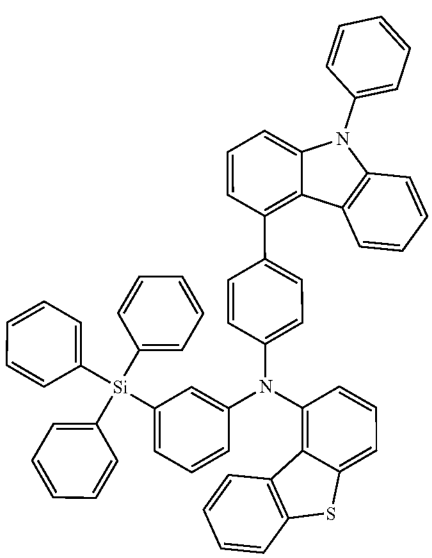
-continued
B195
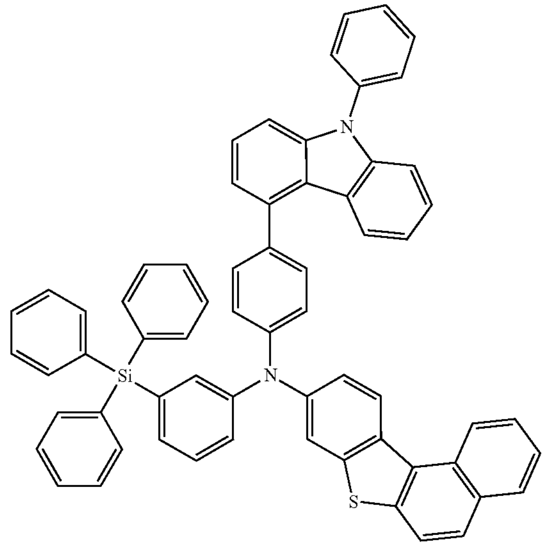
B196
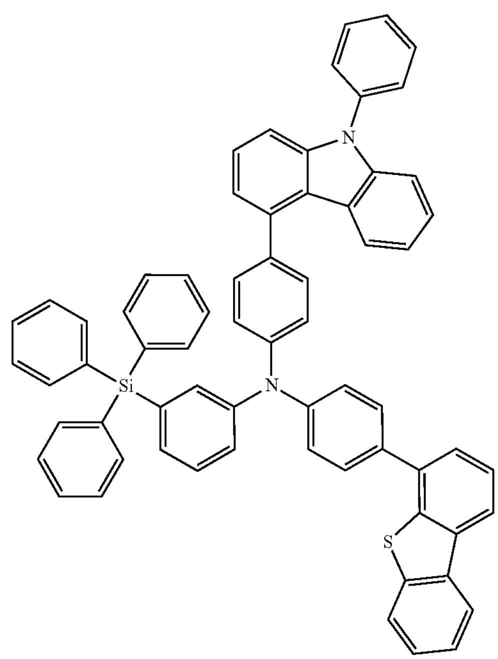

-continued
B197
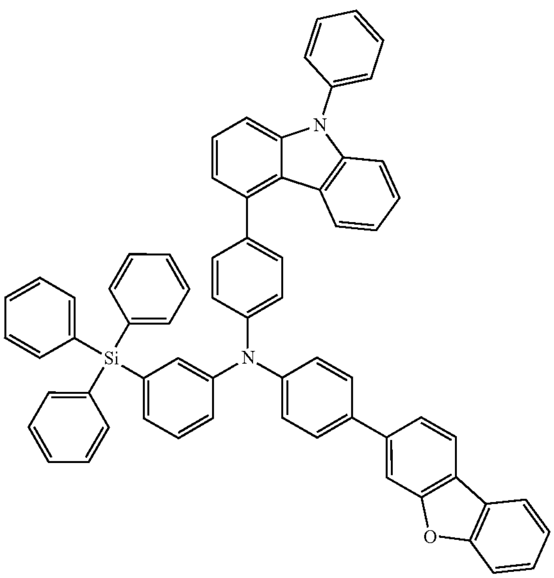
B198
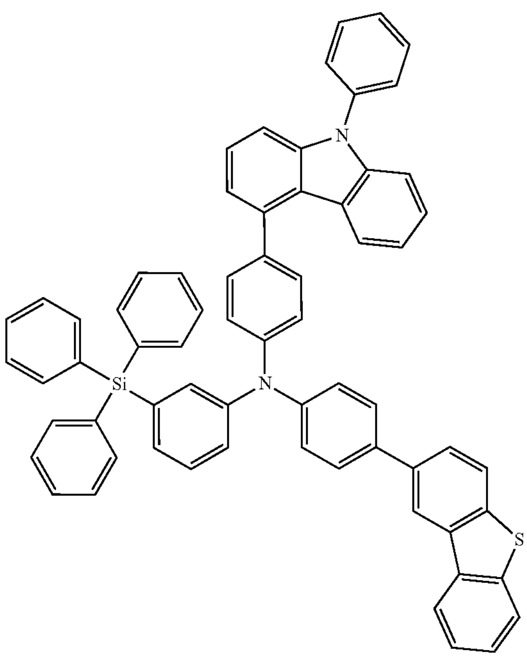
-continued
B199
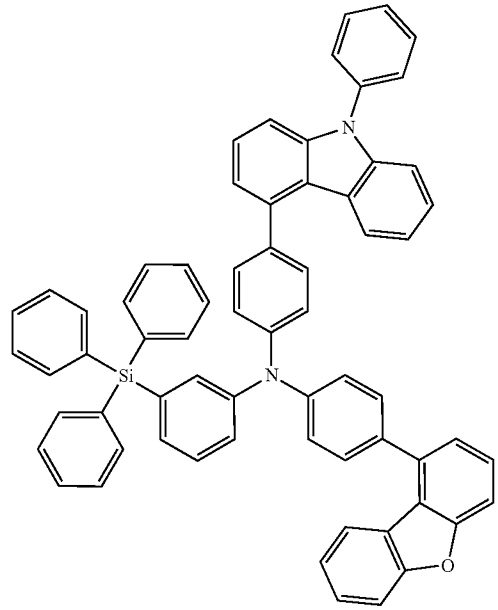
B200
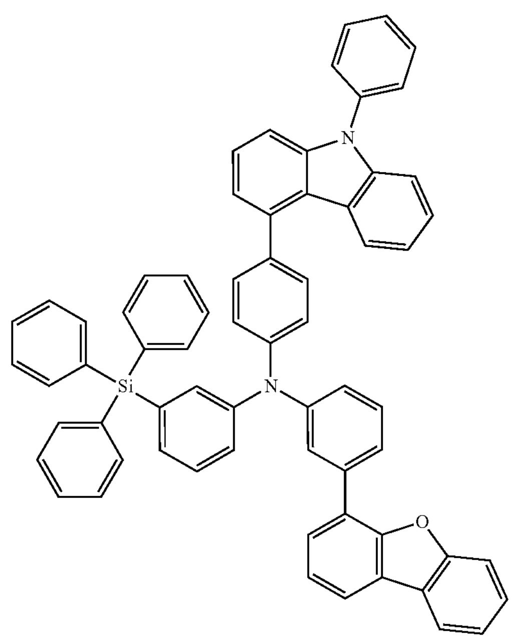

-continued
B201
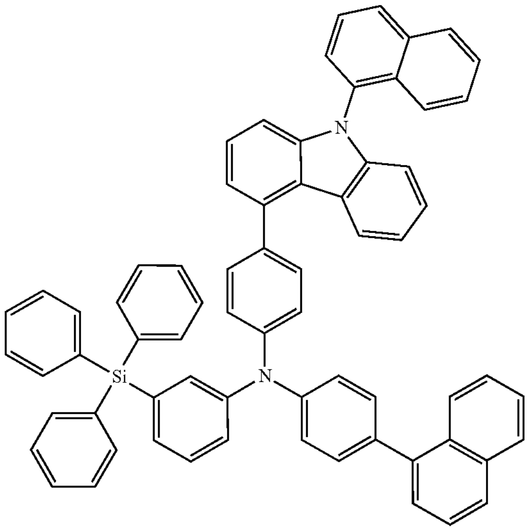
B202
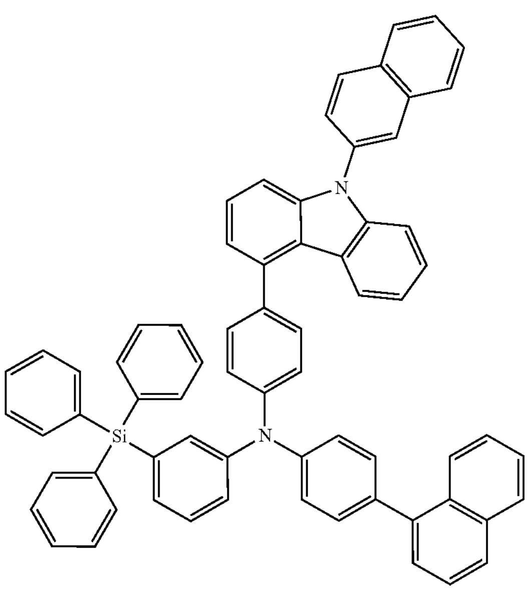
-continued
B203
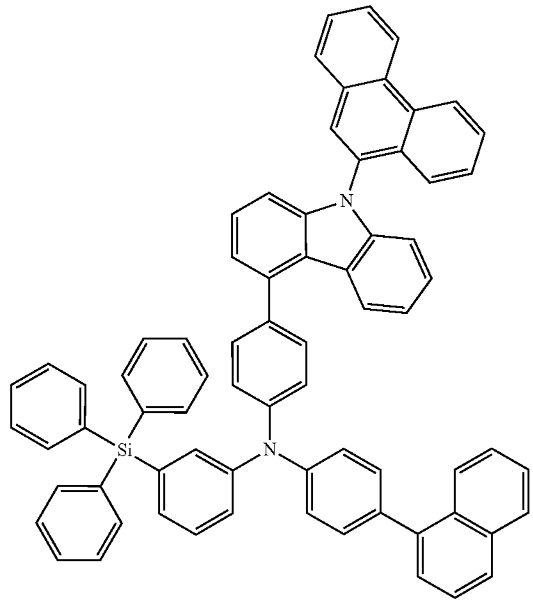
B204
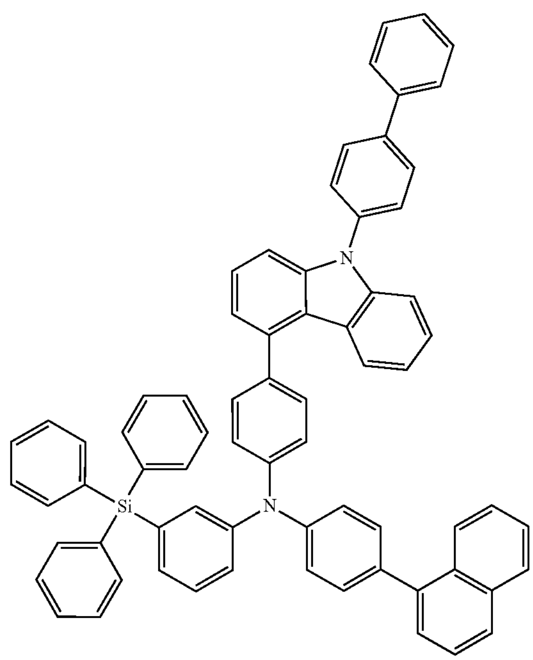

-continued
B205
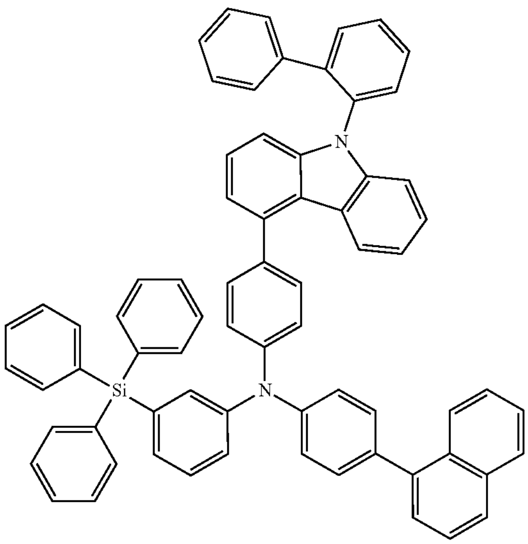
B206
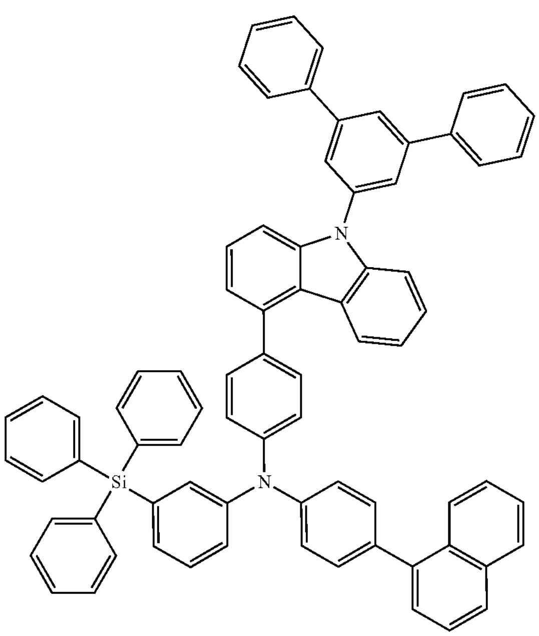
-continued
B207
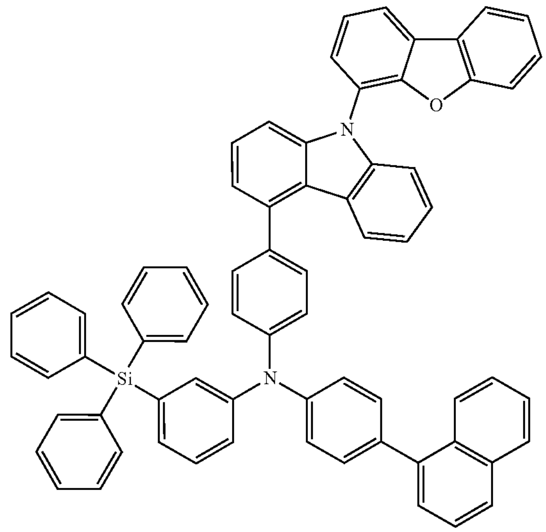
B208
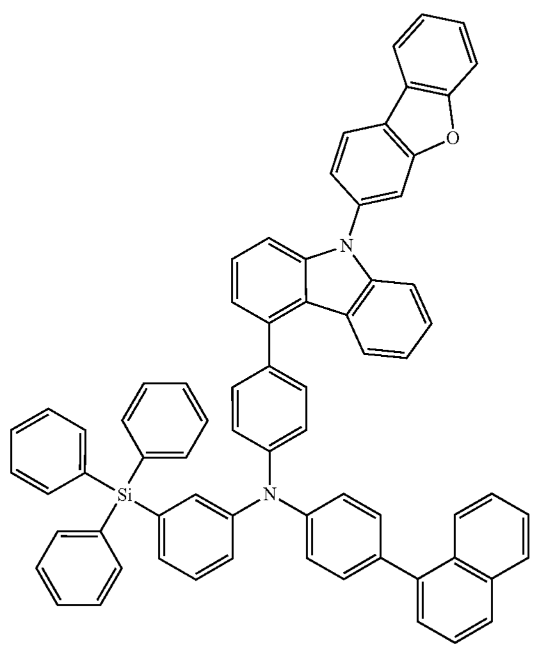

-continued
B209
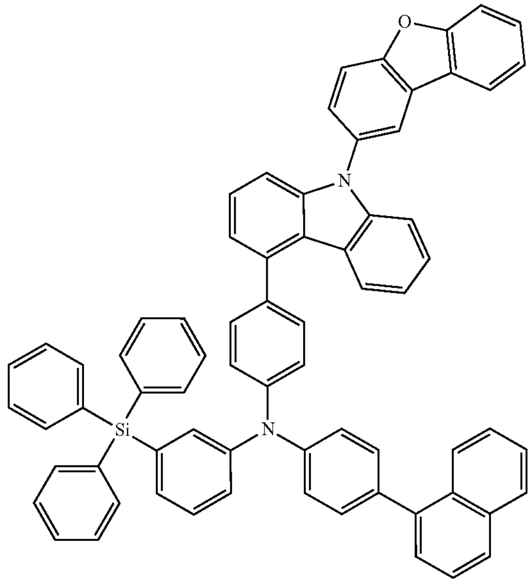
B210
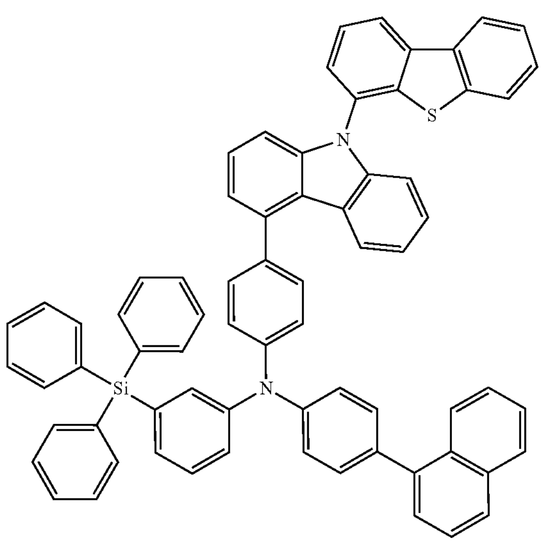
-continued
B211
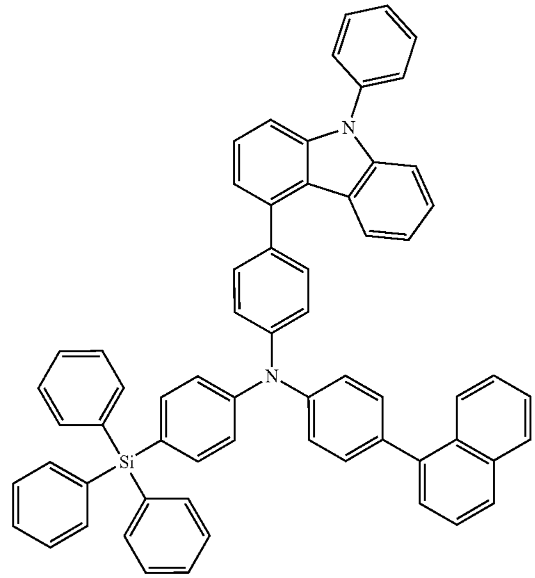
B212
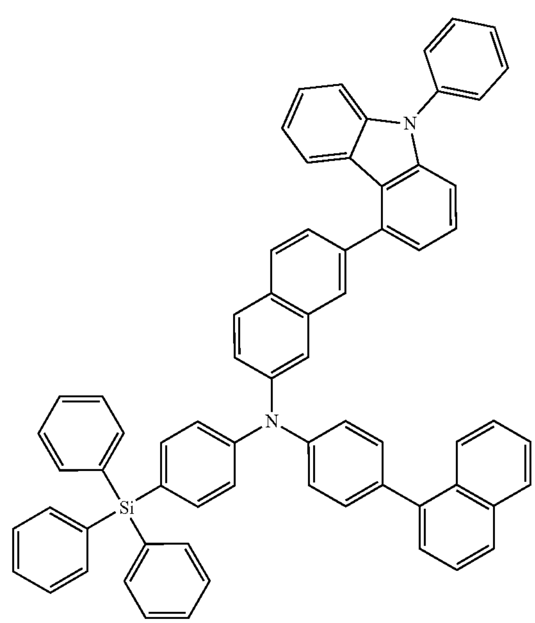

-continued
B213
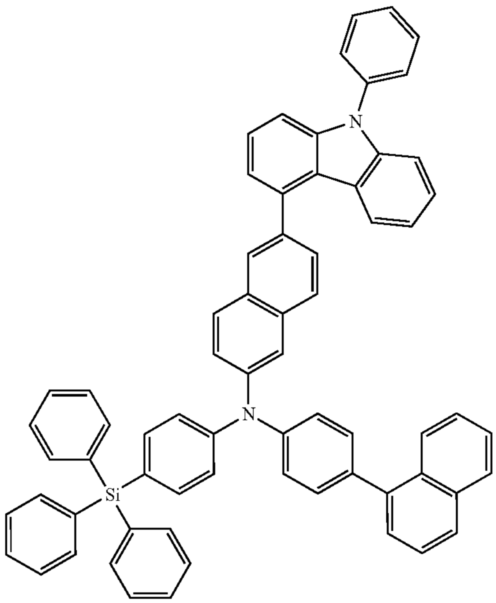
B214
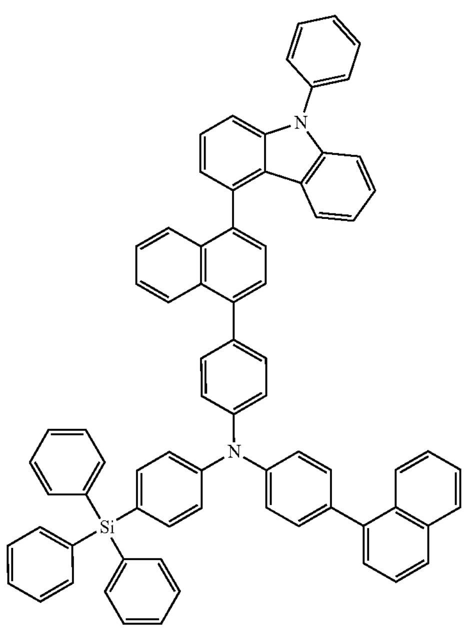
-continued
B215
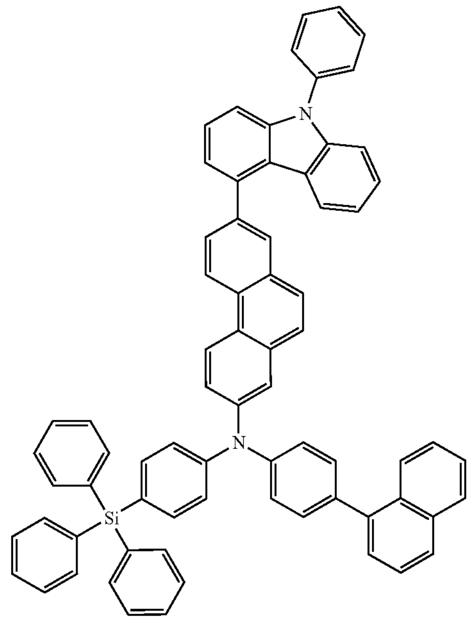
B216
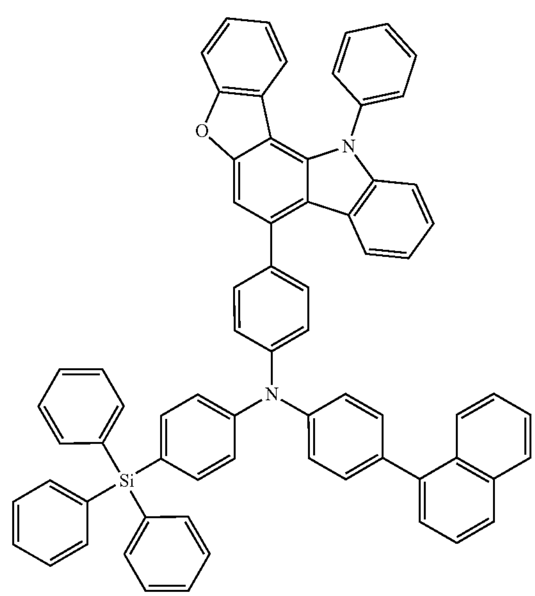

-continued
B217
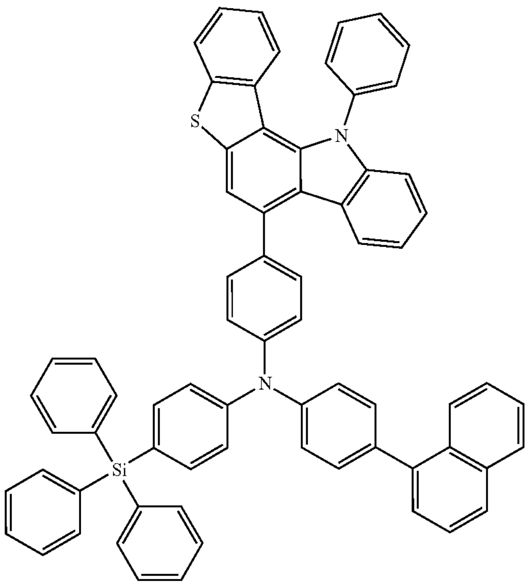
B218
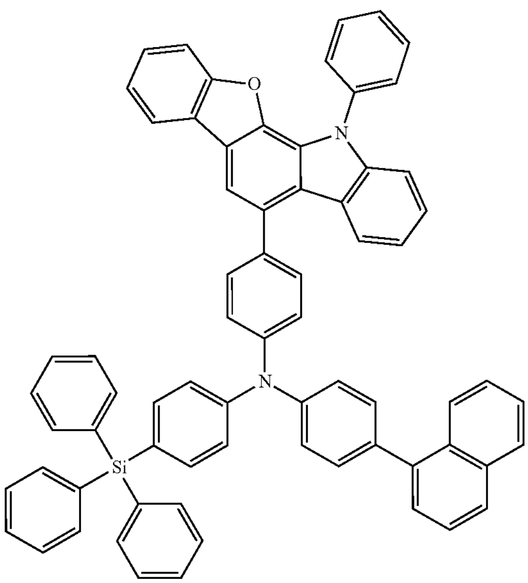
-continued
B219
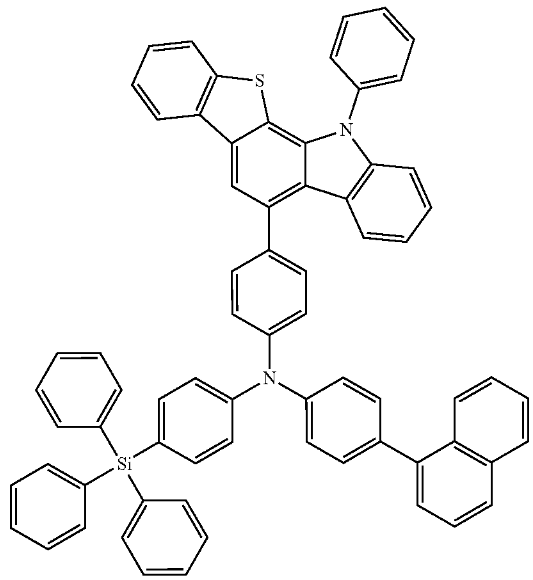
B220
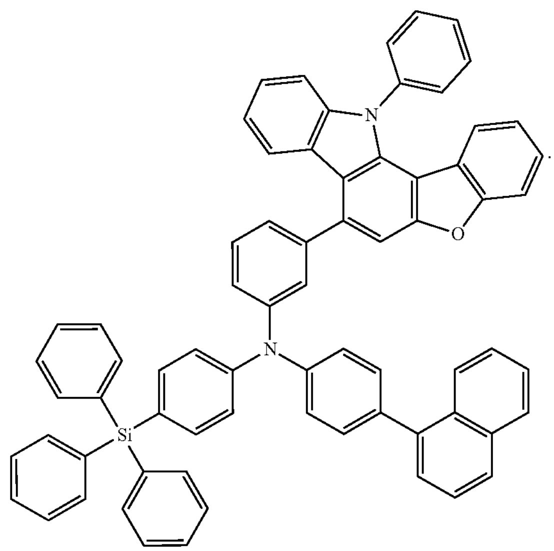
* * * * *